US008654878B2

(12) United States Patent
Choi et al.

(10) Patent No.: US 8,654,878 B2
(45) Date of Patent: Feb. 18, 2014

(54) CODEBOOK FOR EIGHT TRANSMIT ANTENNAS AND MULTIPLE INPUT MULTIPLE OUTPUT COMMUNICATION SYSTEM USING THE CODEBOOK

(75) Inventors: Jun Il Choi, Seoul (KR); Bruno Clerckx, Seoul (KR); Ki Il Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 205 days.

(21) Appl. No.: 13/210,775

(22) Filed: Aug. 16, 2011

(65) Prior Publication Data

US 2012/0039369 A1 Feb. 16, 2012

Related U.S. Application Data

(60) Provisional application No. 61/373,942, filed on Aug. 16, 2010, provisional application No. 61/388,736, filed on Oct. 1, 2010, provisional application No. 61/428,348, filed on Dec. 30, 2010.

(30) Foreign Application Priority Data

Mar. 16, 2011 (KR) ........................ 10-2011-0023690

(51) Int. Cl.
*H04L 1/02* (2006.01)

(52) U.S. Cl.
USPC ............................ 375/267; 375/260; 375/285

(58) Field of Classification Search
USPC ........................................ 375/267, 220, 285
See application file for complete search history.

(56) References Cited

U.S. PATENT DOCUMENTS

2009/0034636 A1* 2/2009 Kotecha et al. ............... 375/260

FOREIGN PATENT DOCUMENTS

KR 10-2010-0010893 A 2/2010
KR 10-2010-0066298 A 6/2010
KR 10-2010-0082894 A 7/2010

* cited by examiner

*Primary Examiner* — Sam K Ahn
*Assistant Examiner* — Janice Tieu
(74) *Attorney, Agent, or Firm* — Jefferson IP Law, LLP

(57) ABSTRACT

A transmitter and a receiver of a multiple input multiple output (MIMO) communication system may use two codebooks to share channel information. When the transmitter uses eight transmit antennas, two codebooks may be defined. When the receiver generates two precoding matrix indicators from two codebooks, a combination of the two precoding matrix indicators may indicate a single precoding matrix. Precoding matrix candidates may also be defined.

25 Claims, 5 Drawing Sheets

CODEBOOK FOR EIGHT TRANSMIT ANTENNAS AND MULTIPLE INPUT MULTIPLE OUTPUT COMMUNICATION SYSTEM USING THE CODEBOOK

CROSS-REFERENCE TO RELATED APPLICATIONS

This application claims the benefit under 35 U.S.C. §119 (e) of U.S. Provisional Application No. 61/373,942, filed on Aug. 16, 2010, U.S. Provisional Application No. 61/388,736, filed on Oct. 1, 2010, and U.S. Provisional Application No. 61/428,348, filed on Dec. 30, 2010, all of which were filed in the United States Patent and Trademark Office, and claims the benefit under 35 U.S.C. §119(a) of Korean Patent Application No. 10-2011-0023690, filed on Mar. 16, 2011, in the Korean Intellectual Property Office, the entire disclosures of which are incorporated herein by reference for all purposes.

BACKGROUND

1. Field of the Invention

The following description relates to a codebook used in a multiple input multiple output (MIMO) communication system, and more particularly, to a codebook used for a transmitter and a receiver when a transmitter of a MIMO communication system includes eight transmit antennas.

2. Description of the Related Art

In a multiple input multiple output (MIMO) communication system, a transmitter and a receiver may use a codebook to share channel information. The channel information may include channel direction information and channel quality information.

The codebook may include a plurality of codewords. The receiver may select a single codeword from the plurality of codewords, and may feed back, to the transmitter, a precoding matrix indicator indicating an index of the selected codeword. The precoding matrix indicator may be an example of channel direction information.

The transmitter may identify the codeword selected by the receiver, based on the precoding matrix indicator, and may generate or determine a precoding matrix based on the selected codeword. The transmitter may precode data based on the precoding matrix, and may transmit the precoded data via a plurality of transmit antennas. The number of transmit antennas may be variously determined, for example, two, four, and eight.

SUMMARY OF THE INVENTION

In one general aspect, there is provided a communication method of a receiver of a multiple input multiple output (MIMO) communication system, including extracting a first precoding matrix indicator corresponding to a first codeword included in a first codebook, and a second precoding matrix indicator corresponding to a second codeword included in a second codebook, and transmitting, to a transmitter, the first precoding matrix indicator and the second precoding matrix indicator.

The receiver may measure a channel formed from the transmitter to the receiver, and may extract the first precoding matrix indicator and the second precoding matrix indicator to indicate a state of the channel.

The receiver may extract the first precoding matrix indicator and the second precoding matrix indicator to recommend a precoding matrix indicator suitable for the state of the channel formed from the transmitter to the receiver.

In another general aspect, there is provided a communication method of a transmitter of a MIMO communication system, including receiving a first precoding matrix indicator corresponding to a first codeword included in a first codebook, and a second precoding matrix indicator corresponding to a second codeword included in a second codebook, and generating or determining a precoding matrix based on the first precoding matrix indicator and the second precoding matrix indicator.

The determining may include determining the precoding matrix by extracting the first codeword from the first codebook and extracting the second codeword from the second codebook.

The transmitter may transmit a well-known signal, for example, a pilot signal to a receiver so that the receiver may measure a channel formed from the transmitter to the receiver.

Other features and aspects may be apparent from the following detailed description, the drawings, and the claims.

Figure 1:
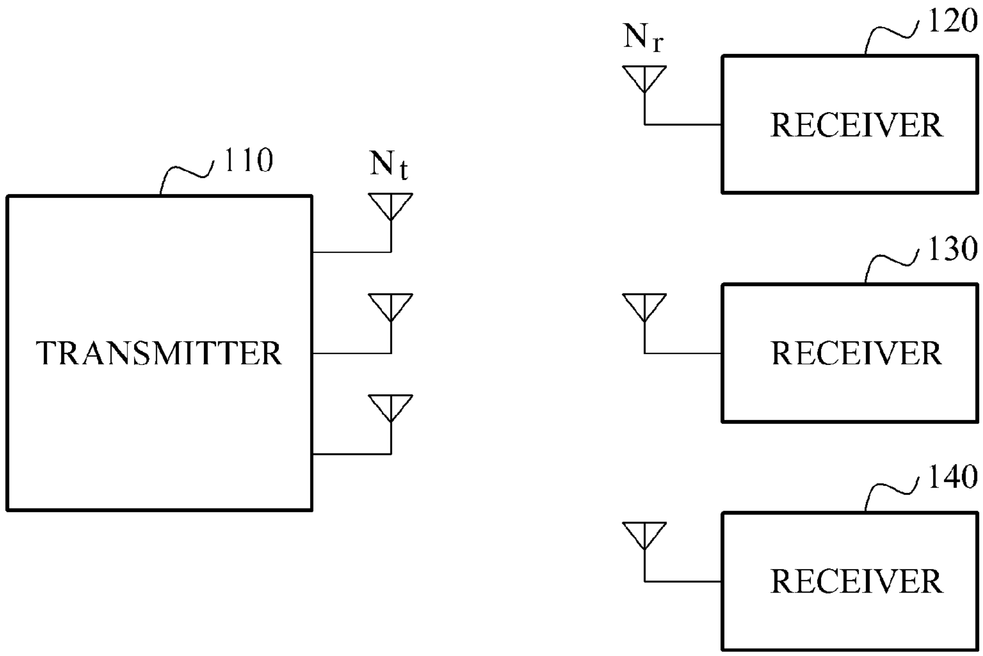
FIG. 1 is a diagram illustrating an example of a multiple input multiple output (MIMO) communication system.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION OF EXEMPLARY EMBODIMENTS

The following detailed description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, description of well-known functions and constructions may be omitted for increased clarity and conciseness.

Hereinafter, embodiments will be described in detail with reference to the accompanying drawings.

FIG. 1 illustrates an example of a multiple input multiple output (MIMO) communication system.

Referring to FIG. 1, the MIMO communication system may include a transmitter 110 and a plurality of receivers 120, 130, and 140.

$N_t$ transmit antennas may be installed in the transmitter 110. The transmitter 110 may function as a base station in a downlink, and may function as a terminal in an uplink. $N_r$ receive antennas may be installed in the receivers 120, 130, and 140. Each of the receivers 120, 130, and 140 may function as a terminal in the downlink, and may function as a base station in the uplink. Hereinafter, embodiments will be described based on an operation of the transmitter 110 and the receivers 120, 130, and 140 in the downlink. The embodiments may be applicable to the uplink.

Channels may be formed between the transmitter 110 and the receivers 120, 130, and 140. Data may be transmitted from the transmitter 110 to the receivers 120, 130, and 140 via the channels. The transmitter 110 may precode at least one data stream using a precoding matrix, enhancing a performance of the MIMO communication system. A data stream may also be referred to as data.

The transmitter 110 may generate or determine a more accurate precoding matrix by verifying information associated with channel direction and information associated with channel quality. Information associated with the channel direction and information associated with the channel quality may be one example of channel information. Information associated with the channel direction may include a precoding matrix indicator.

For example, the transmitter 110 and the receivers 120, 130, and 140 may share the precoding matrix indicator using a codebook. The codebook may include a plurality of codewords. Each of the plurality of codewords may correspond to a vector or a matrix. A size of the codebook may correspond to a number of codewords. For example, a 3-bit codebook may include eight codewords, and a 4-bit codebook may include 16 codewords.

Each of the receivers 120, 130, and 140 may select a single codeword from the plurality of codewords, and may generate an indicator of the selected codeword as a precoding matrix indicator. The precoding matrix indicator may be fed back to the transmitter 110. The transmitter 110 may verify a codeword indicated by the precoding matrix indicator, using the codebook. The transmitter 110 may generate or determine an optimal precoding matrix based on the codeword corresponding to the precoding matrix indicator.

A dimension of a precoding matrix may be dependent on a rank of the transmitter 110. The rank of the transmitter 110 may correspond to a number of data streams desired to be transmitted or a number of layers of the transmitter 110.

Figure 2:
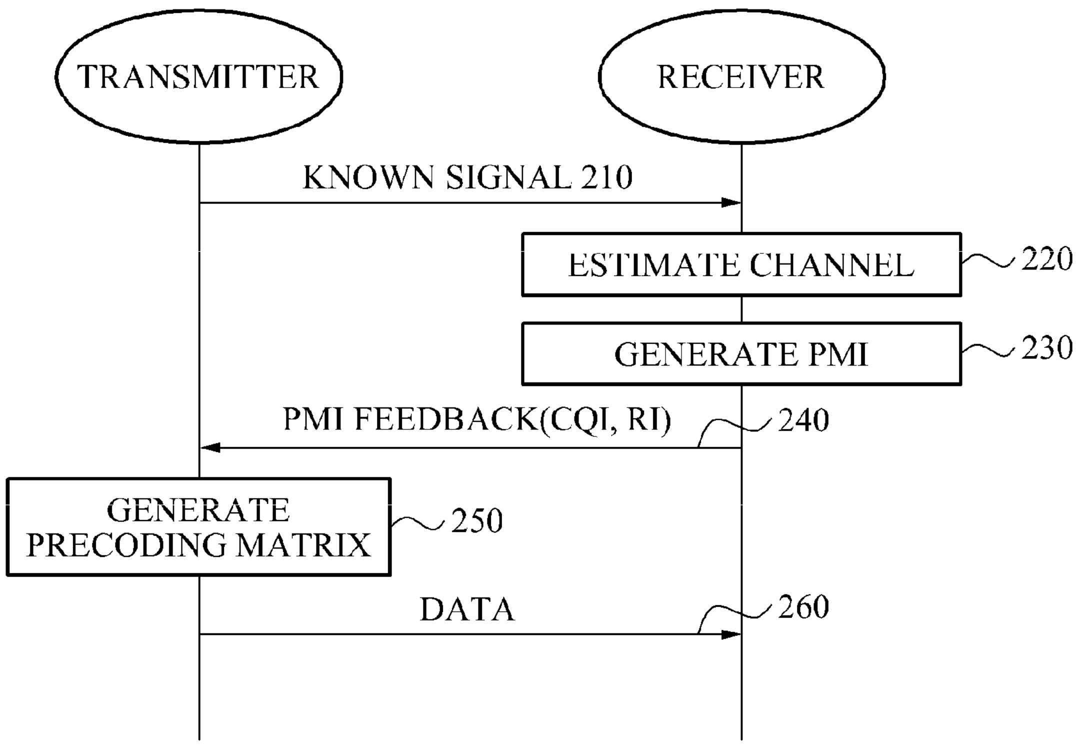
FIG. 2 is a diagram illustrating an example of a communication method of a receiver and a transmitter that share channel information using a single codebook.

FIG. 2 illustrates an example of a communication method of a receiver and a transmitter that share channel information using a single codebook.

Referring to FIG. 2, at 210, the transmitter may transmit a well-known signal to the receiver. The well-known signal may be a pilot signal.

At 220, the receiver may estimate a channel formed from the transmitter to the receiver based on the well-known signal.

At 230, the receiver may select, from a codebook, a codeword suitable for the estimated channel and generate a precoding matrix indicator including an index of the selected codeword. In this example, the same codebook may be stored in both the transmitter and the receiver.

At 240, the receiver may feed back a precoding matrix indicator to the transmitter. The receiver may also feed back channel quality information and a rank indicator.

At 250, the transmitter may generate or determine an optimal precoding matrix based on the fed back precoding matrix indicator. At 260, the transmitter may transmit data using the precoding matrix.

The communication method of the transmitter and the receiver when the transmitter and the receiver use the same single codebook is described above with reference to FIG. 2. According to embodiments, two codebooks may be used for the receiver and the transmitter to share two precoding matrix indicators.

Hereinafter, it is assumed that a first codebook $C_1$ and a second codebook $C_2$ are present, and two codebooks are stored in the receiver and the transmitter, respectively. It is also assumed that a precoding matrix W is finally recommended by the receiver and is used by the transmitter.

Figure 3:
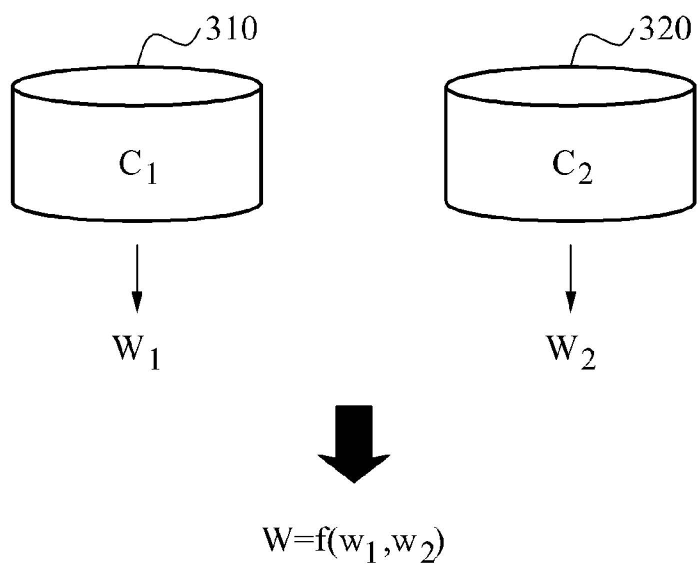
FIG. 3 is a diagram illustrating an example of a relationship between two codebooks and a precoding matrix.

FIG. 3 illustrates an example of a relationship between two codebooks and a precoding matrix.

Referring to FIG. 3, both a transmitter and a receiver may store a first codebook $C_1$ 310 and a second codebook $C_2$ 320. The receiver may select a preferred first codeword $W_1$ from the first codebook $C_1$ 310, and may select a preferred second codeword $W_2$ from the second codebook $C_2$ 320. A first precoding matrix indicator may be fed back to the transmitter as an index of the preferred first codeword $W_1$, and a second precoding matrix indicator may be fed back to the transmitter as an index of the preferred second codeword $W_2$.

Based on the first precoding matrix indicator and the second precoding matrix indicator, the transmitter may find the preferred first codeword $W_1$ from the first codebook $C_1$ 310, and may find the preferred second codeword $W_2$ from the second codebook $C_2$ 320. The transmitter may determine a precoding matrix $W=f(W_1, W_2)$ based on the preferred first codeword $W_1$ and the preferred second codeword $W_2$.

In $W=f(W_1, W_2)$, a function f may be variously defined. For example, $W=f(W_1, W_2)=W_2W_1$ or $W=f(W_1, W_2)=W_1W_2$ may be defined.

$W_1$ corresponds to the preferred first codeword of the receiver corresponding to the first precoding matrix indicator selected by the receiver from the first codebook $C_1$. $W_2$ corresponds to the preferred second codeword of the receiver corresponding to the second precoding matrix indicator of the receiver selected from the second codebook $C_2$. The first codebook $C_1$ or the first precoding matrix indicator may be used to indicate a property of a channel in a wideband including a plurality of subbands, or to indicate a long-term property of the channel. The second codebook $C_2$ or the second precoding matrix indicator may be used to indicate a property of a channel in a subband or to indicate a short-term property of the channel.

In $W=f(W_1, W_2)=W_2W_1$, W may have a dimension of $N_t \times R$ and $W_1$ may have a dimension of $N_t \times R$. W2 may have a dimension of $N_t \times N_t$. In $W=f(W_1, W_2)=W_1W_2$, W may have a dimension of $N_t \times R$ and $W_1$ and $W_2$ may have a variety of dimensions based on R. Here, R corresponds to a rank and indicates a number of data streams or a number of layers.

Hereinafter, the first codebook $C_1$ including candidates of $W_1$ and the second codebook $C_2$ including candidates of $W_2$ when the transmitter includes eight transmit antennas will be defined with respect to each of various ranks. Since $W_1$ is indicated by a combination of $W_1$ and $W_2$, to define the candidates of $W_1$ and the candidates of $W_2$ may be equivalent to define candidates of W. In addition to the first codebook $C_1$ and the second codebook $C_2$, the candidates of W may also be defined.

Design of Rank 1 Codebook when the Transmitter Includes Eight Transmit Antennas:

In dual polarized channels, a precoding matrix in one subband may be expressed by, $$W = \frac{\sqrt{2}}{2}\begin{bmatrix} \sqrt{2-|\alpha|^2}\,A \\ \alpha B \end{bmatrix}$$

A and B may correspond to unit norm vectors having a dimension of $N_t/2\times 1$ and may independently perform beamforming in each polarization. Each polarization may appear as an effectively single antenna after beamforming is performed in each polarization using A and B. To design codebooks with respect to A and B may be dependent on statistical properties of a channel in each polarization. Without further assumption with respect to properties, A and B may account for subband/short-term information and wideband/long-term information.

Beamforming of polarizations may be performed by vector $$\begin{bmatrix} \sqrt{2-|\alpha|^2} \\ \alpha \end{bmatrix}.$$

Here, α corresponds to a complex scalar and may account for a phase difference and a magnitude difference. The phase difference between the polarizations may typically correspond to a short-term property and the magnitude difference may correspond to a function of the subband/short-term property and wideband/long-term property. A cross-polarization discrimination factor is generally referred to as XPD of a channel. XPD indicates a wideband/long-term property of a dual polarization channel and a mean value with respect to α may vary.

In general, A and B may be selected to be different from each other. However, when an interval between antennas is relatively close and each angle spread is relatively low, a beamforming vector with respect to a first polarization and a beamforming vector with respect to a second polarization may be regarded to be identical to each other. Since beamforming is invariant over a phase shift, $B=e^{j\Phi}A$ may be established. Here, a selection of ϕ may not affect the performance of the dual polarization channel. When the interval between antennas is close, A, B, and ϕ may be associated with wideband/long-term properties of a channel. Accordingly, a precoding matrix in a subband may be expressed by, $$W = \frac{\sqrt{2}}{2}\begin{bmatrix} \sqrt{2-|\alpha|^2}\,A \\ \alpha e^{j\phi}A \end{bmatrix} = \frac{\sqrt{2}}{2}\begin{bmatrix} \sqrt{2-|\alpha|^2}\,I_{n_t/2} & \\ & \alpha I_{n_t/2} \end{bmatrix}\begin{bmatrix} A \\ e^{j\phi}A \end{bmatrix}$$

For an appropriate design of A, discrete Fourier transformation (DFT) vectors may be used. In the above equation, a last equal mark may remind a structure of $W_2W_1$. A subband/short-term matrix may be expressed by $$W_2 = \begin{bmatrix} \sqrt{2-|\alpha|^2}\,I_{n_t/2} & \\ & \alpha I_{n_t/2} \end{bmatrix}$$

A wideband/long-term matrix may be expressed by $$W_1 = \frac{\sqrt{2}}{2}\begin{bmatrix} A \\ e^{j\phi}A \end{bmatrix}$$

In a special case where $e^{j\Phi}=1$.

$$W \overset{(a)}{=} \frac{\sqrt{2}}{2}\begin{bmatrix} \sqrt{2-|\alpha|^2}\,I_{n_t/2} & \\ & \alpha I_{n_t/2} \end{bmatrix}\begin{bmatrix} A \\ A \end{bmatrix}$$

-continued $$\overset{(b)}{=} \frac{\sqrt{2}}{2}\begin{bmatrix} \sqrt{2-|\alpha|^2} \\ \alpha \end{bmatrix} \otimes A$$

$$\overset{(c)}{=} \frac{\sqrt{2}}{2}\begin{bmatrix} A & \\ & A \end{bmatrix}\begin{bmatrix} \sqrt{2-|\alpha|^2} \\ \alpha \end{bmatrix}$$

As shown in the above equation, in the special case where $e^{j\Phi}=1$, many equivalent methods may be used to express the same precoding matrix. For example, in the above equation, (a) corresponds to a method of using the structure of $W_2W_1$, (b) corresponds to a method of using Kronecker product, and (c) corresponds to a method of using a structure of $W_1W_2$.

When the interval between antennas is close, the precoding matrix may be expressed using the aforementioned equations in a single polarization channel. In this example, α=1, a value of ϕ may be A-dependent and be selected to obtain DFT vectors for eight transmit antennas. For example, $W_2$ may correspond to an identity matrix and $W_1$ may provide a wideband precoding matrix of DFT vectors. Contrast to dual polarization channels, the selection of ϕ may affect the performance of single polarization channels.

According to the structure of $W_2W_1$ shown in $$W = \frac{\sqrt{2}}{2}\begin{bmatrix} \sqrt{2-|\alpha|^2}\,A \\ \alpha e^{j\phi}A \end{bmatrix} = \frac{\sqrt{2}}{2}\begin{bmatrix} \sqrt{2-|\alpha|^2}\,I_{n_t/2} & \\ & \alpha I_{n_t/2} \end{bmatrix}\begin{bmatrix} A \\ e^{j\phi}A \end{bmatrix},$$

the wideband/long-term matrix $$\begin{bmatrix} A \\ e^{j\phi}A \end{bmatrix}$$

may have a significantly robust physical meaning. That is, in its given $N_t\times1$ dimension, the wideband/long-term matrix may be equivalent to a rank and thus, may provide a direct insight to a rank 1 wideband PMI structure. Also, in the aforementioned $W_2W_1$ structure, a structure $$\begin{bmatrix} A & \\ & A \end{bmatrix}$$

may not be associated with the rank and may not provide any information associated with a wideband PMI structure.

A full utilization of power amplifiers may be used as an important design criterion. When only a phase shift keying (PSK) is used to decrease the complexity of PMI search, there is a need to constrain a precoding matrix. It may be assumed that the precoding matrix becomes constant modulus and |α|=1. In this scenario, α may use a subband/long-term property with respect to a phase shift between polarizations.

Design of Rank 2 Codebook when the Transmitter Includes Eight Transmit Antennas:

A rank 2 precoding matrix may include two orthogonal columns, which may be expressed by $$W^{(1)} = \frac{\sqrt{2}}{2}\begin{bmatrix}\sqrt{2-|\alpha_1|^2}\, I_{n_t/2} & \\ & \alpha_1 I_{n_t/2}\end{bmatrix}\begin{bmatrix}A_1\\ B_1\end{bmatrix}$$

$$W^{(2)} = \frac{\sqrt{2}}{2}\begin{bmatrix}\sqrt{2-|\alpha_2|^2}\, I_{n_t/2} & \\ & \alpha_2 I_{n_t/2}\end{bmatrix}\begin{bmatrix}A_2\\ B_2\end{bmatrix}$$

The full utilization of power in each antenna may force $|\alpha_1|^2+|\alpha_2|^2=2$ establish $$\alpha_2 = \sqrt{2-|\alpha|^2}\, e^{j\delta}$$

with $\alpha_1=\alpha$. In this example, the following equations may be expressed.

$$W^{(1)} = \frac{\sqrt{2}}{2}\begin{bmatrix}\sqrt{2-|\alpha|^2}\, I_{n_t/2} & \\ & \alpha I_{n_t/2}\end{bmatrix}\begin{bmatrix}A_1\\ B_1\end{bmatrix}$$

$$W^{(2)} = \frac{\sqrt{2}}{2}\begin{bmatrix}|\alpha| I_{n_t/2} & \\ & \sqrt{2-|\alpha|^2}\, e^{j\delta} I_{n_t/2}\end{bmatrix}\begin{bmatrix}A_2\\ B_2\end{bmatrix}$$

To obtain mutually orthogonal columns, $A_1^H A_2=0$ and $B_1^H B_2=0$ may be sufficient. $A_1$, $A_2$, $B_1$, and $B_2$ may be approximated by two dominant eigenvectors of $N_1 \times N_t$ covariance matrix. Many combinations may be used for design of the precoding matrix, which may cause great overheard. In a scenario with a narrow interval between antennas, $A_1=A$, $A2=A$, $B_1=e^{j\phi_1}A$, and $B_2=e^{j\phi_2}A$. A cross-polarized setup may help achievement of rank 2 transmission in a configuration where the interval between antennas is narrow.

Parameters $\phi_1$ and $\phi_2$ may be selected to guarantee so that $W^{(1)}$ and $W^{(2)}$ may be orthogonal with respect to each other. In this example, $\phi_1=\phi$, and $\phi_2=\phi+\pi$ The rank 2 precoding matrix may be expressed by $$W = \frac{1}{\sqrt{2}}[\,W^{(1)} \quad W^{(2)}\,] = \frac{1}{2}\begin{bmatrix}\sqrt{2-|\alpha|^2}\, A & |\alpha| A\\ \alpha e^{j\phi} A & -\sqrt{2-|\alpha|^2}\, e^{j\delta} e^{j\phi} A\end{bmatrix}$$

The precoding matrix may be expressed using the $W_2W_1$ structure, as follows:

$$\begin{aligned}W &= \frac{1}{\sqrt{2}}[\,W^{(1)} \quad W^{(2)}\,]\\ &= \frac{1}{2}\begin{bmatrix}\sqrt{2-|\alpha|^2}\, A & |\alpha| A\\ \alpha e^{j\phi} A & -\sqrt{2-|\alpha|^2}\, e^{j\delta} e^{j\phi} A\end{bmatrix}\\ &= \frac{1}{2}\begin{bmatrix}A & \\ & e^{j\phi} A\end{bmatrix}\begin{bmatrix}\sqrt{2-|\alpha|^2} & |\alpha|\\ \alpha & -\sqrt{2-|\alpha|^2}\, e^{j\delta}\end{bmatrix}\end{aligned}$$

In this equation, $$W_1 = \begin{bmatrix}A & \\ & e^{j\phi} A\end{bmatrix} \text{ and}$$

$$W_2 = \frac{1}{2}\begin{bmatrix}\sqrt{2-|\alpha|^2} & |\alpha|\\ \alpha & -\sqrt{2-|\alpha|^2}\, e^{j\delta}\end{bmatrix}.$$

The precoding matrix may be expressed using a variety of methods. For example, the precoding matrix may be expressed by $$\begin{aligned}W &= \frac{1}{\sqrt{2}}[\,W^{(1)} \quad W^{(2)}\,]\\ &= \frac{1}{2}\begin{bmatrix}\sqrt{2-|\alpha|^2}\, A & |\alpha| A\\ \alpha e^{j\phi} A & -\sqrt{2-|\alpha|^2}\, e^{j\delta} e^{j\phi} A\end{bmatrix}\\ &= \begin{bmatrix}\sqrt{2-|\alpha|^2} & |\alpha|\\ \alpha & -\sqrt{2-|\alpha|^2}\, e^{j\delta}\end{bmatrix} \circ \left[\frac{1}{2}\begin{bmatrix}A & A\\ e^{j\phi} A & -e^{j\phi} A\end{bmatrix}\right]\end{aligned}$$

In this equation, corresponds to Hardmard product, and $$W_1 = \frac{1}{2}\begin{bmatrix}A & A\\ e^{j\phi} A & -e^{j\phi} A\end{bmatrix}, \text{ and}$$

$$W_2 = \begin{bmatrix}\sqrt{2-|\alpha|^2} & |\alpha|\\ \alpha & -\sqrt{2-|\alpha|^2}\, e^{j\delta}\end{bmatrix}.$$

When $|\alpha|=1$ is assumed to maintain the precoding matrix as constant modulus, and to maintain a PSK alphabet, the rank 2 precoding matrix may include two orthogonal columns $W^{(1)}$ and $W^{(2)}$. Each column may satisfy the structure of the rank 1 precoding matrix, for example, as follows:

$$W^{(1)} = \frac{\sqrt{2}}{2}\begin{bmatrix}\sqrt{2-|\alpha|^2}\, I_{n_t/2} & \\ & \alpha I_{n_t/2}\end{bmatrix}\begin{bmatrix}A\\ e^{j\phi_1} A\end{bmatrix}$$

$$W^{(2)} = \frac{\sqrt{2}}{2}\begin{bmatrix}\sqrt{2-|\alpha|^2}\, I_{n_t/2} & \\ & \alpha I_{n_t/2}\end{bmatrix}\begin{bmatrix}A\\ e^{j\phi_2} A\end{bmatrix}$$

Two rank 1 precoding matrices may be differentiated using only the parameter $\phi$.

The parameters $\phi_1$ and $\phi_2$ may be selected to guarantee that $W^{(1)}$ and $W^{(2)}$ are orthogonal to each other. When $\phi_1=\phi$ and $\phi_2=\phi+\pi$, the rank 2 precoding matrix may be expressed by $$\begin{aligned}W &= \frac{1}{\sqrt{2}}[\,W^{(1)} \quad W^{(2)}\,]\\ &= \frac{1}{2}\begin{bmatrix}\sqrt{2-|\alpha|^2}\, I_{n_t/2} & \\ & \alpha I_{n_t/2}\end{bmatrix}\begin{bmatrix}A & A\\ e^{j\phi} A & -e^{j\phi} A\end{bmatrix}.\end{aligned}$$

Wideband/long-term matrix $W_1$ may correspond to a wideband precoding matrix and may be given as $$W_1 = \frac{1}{2}\begin{bmatrix} A & A \\ e^{j\phi}A & -e^{j\phi}A \end{bmatrix}.$$

A subband matrix $W_2$ may be expressed by $$W_2 = \begin{bmatrix} \sqrt{2-|\alpha|^2}\, I_{n_t/2} & \\ & \alpha I_{n_t/2} \end{bmatrix}.$$

The selection of $\phi$ may not affect the performance of the wideband precoding matrix $W_1$ in dual polarization channels, however, may have a strong influence in single polarization channels. The parameter $\phi$ may be selected so that $W_1$ may have excellent performance even in single polarization channels.

In a special case where $e^{j\Phi}=1$.

$$\begin{aligned} W &\overset{(a)}{=} \frac{1}{2}\begin{bmatrix} \sqrt{2-|\alpha|^2}\, I_{n_t/2} & \\ & \alpha I_{n_t/2} \end{bmatrix}\begin{bmatrix} A & A \\ A & -A \end{bmatrix} \\ &\overset{(b)}{=} \frac{\sqrt{2}}{2}\begin{bmatrix} \sqrt{2-|\alpha|^2}\, I_{n_t/2} & \\ & \alpha I_{n_t/2} \end{bmatrix} U_{rot}\begin{bmatrix} A & 0 \\ 0 & A \end{bmatrix} \\ &\overset{(c)}{=} \frac{1}{2}\begin{bmatrix} \sqrt{2-|\alpha|^2} & \sqrt{2-|\alpha|^2} \\ \alpha & -\alpha \end{bmatrix} \otimes A \\ &\overset{(d)}{=} \frac{1}{2}\begin{bmatrix} A & \\ & A \end{bmatrix}\begin{bmatrix} \sqrt{2-|\alpha|^2} & \sqrt{2-|\alpha|^2} \\ \alpha & -\alpha \end{bmatrix}. \end{aligned}$$

In the special case where $e^{j\Phi}=1$, many equivalent methods may be used to express the same precoding matrix. For example, in the above equation, (a) corresponds to a method of using the structure of $W_2W_1$, (b) corresponds to a method of using a rotated block diagonal structure, (c) corresponds to a method of using Kronecker product, and (d) corresponds to a method of using the structure of $W_1W_2$.

Design of Rank 3 Codebook when the Transmitter Includes Eight Transmit Antennas:

A rank 3 precoding matrix may be obtained by simply extending a structure induced with respect to the rank 1 precoding matrix and the rank 2 precoding matrix. By adding, to the rank 2 precoding matrix, a column orthogonal to the rank 2 precoding matrix, the rank 3 precoding matrix may be obtained as follows:

$$\begin{aligned} W &= \frac{1}{\sqrt{3}}[\, W^{(1)} \;\; W^{(2)} \;\; W^{(3)} \,] \\ &= \frac{1}{\sqrt{3}\sqrt{2}}\begin{bmatrix} \sqrt{2-|\alpha|^2}\, I_{n_t/2} & \\ & \alpha I_{n_t/2} \end{bmatrix}\begin{bmatrix} A & A & B \\ e^{j\varphi}A & -e^{j\varphi}A & e^{j\varphi}B \end{bmatrix} \end{aligned}$$

or $$\begin{aligned} W &= \frac{1}{\sqrt{3}}[\, W^{(1)} \;\; W^{(2)} \;\; W^{(3)} \,] \\ &= \frac{1}{\sqrt{3}\sqrt{2}}\begin{bmatrix} \sqrt{2-|\alpha|^2}\, I_{n_t/2} & \\ & \alpha I_{n_t/2} \end{bmatrix}\begin{bmatrix} A & A & B \\ e^{j\varphi}A & -e^{j\varphi}A & -e^{j\varphi}B \end{bmatrix} \end{aligned}$$

In this example, A and B may be orthogonal to each other.

Design of Rank 4 Codebook when the Transmitter Includes Eight Transmit Antennas:

Similarly with respect to rank 4, a rank 4 precoding matrix may be expressed using two rank 2 precoding matrices as follows:

$$\begin{aligned} W &= \frac{1}{\sqrt{4}}[\, W^{(1)} \;\; W^{(2)} \;\; W^{(3)} \;\; W^{(4)} \,] \\ &= \frac{1}{\sqrt{4}\sqrt{2}}\begin{bmatrix} \sqrt{2-|\alpha|^2}\, I_{n_t/2} & \\ & \alpha I_{n_t/2} \end{bmatrix} \\ &\quad \begin{bmatrix} A & A & B & B \\ e^{j\varphi}A & -e^{j\varphi}A & e^{j\varphi}B & -e^{j\varphi}B \end{bmatrix} \end{aligned}$$

In this example, A and B may be orthogonal to each other.

Design of Rank R Codebook when the Transmitter Includes Eight Transmit Antennas:

With respect to rank r codebook, the precoding matrix may be expressed as follows:

When r is an odd number, $$\begin{aligned} W &= \frac{1}{\sqrt{r}}[\, W^{(1)} \;\; W^{(2)} \;\; \ldots \;\; W^{(r)} \,] \\ &= \frac{1}{\sqrt{r}\sqrt{2}}\begin{bmatrix} \sqrt{2-|\alpha|^2}\, I_{n_t/2} & \\ & \alpha I_{n_t/2} \end{bmatrix}\begin{bmatrix} A & A & \ldots & C \\ e^{j\varphi}A & -e^{j\varphi}A & \ldots & e^{j\varphi}C \end{bmatrix} \end{aligned}$$

or $$\begin{aligned} W &= \frac{1}{\sqrt{r}}[\, W^{(1)} \;\; W^{(2)} \;\; \ldots \;\; W^{(r)} \,] \\ &= \frac{1}{\sqrt{r}\sqrt{2}}\begin{bmatrix} \sqrt{2-|\alpha|^2}\, I_{n_t/2} & \\ & \alpha I_{n_t/2} \end{bmatrix}\begin{bmatrix} A & A & \ldots & C \\ e^{j\varphi}A & -e^{j\varphi}A & \ldots & -e^{j\varphi}C \end{bmatrix} \end{aligned}$$

When r is an even number, $$\begin{aligned} W &= \frac{1}{\sqrt{r}}[\, W^{(1)} \;\; W^{(2)} \;\; \ldots \;\; W^{(r-1)} \;\; W^{(r)} \,] \\ &= \frac{1}{\sqrt{r}\sqrt{2}}\begin{bmatrix} \sqrt{2-|\alpha|^2}\, I_{n_t/2} & \\ & \alpha I_{n_t/2} \end{bmatrix}\begin{bmatrix} A & A & \ldots & C & C \\ e^{j\varphi}A & -e^{j\varphi}A & \ldots & e^{j\varphi}C & -e^{j\varphi}C \end{bmatrix} \end{aligned}$$

In this example, A, B, . . . , C may be orthogonal to each other.

Observation

The following collusion may be made. That is, the minimum requirement for achieving the excellent performance of a recommended precoding matrix may follow as:

$$W=W_2W_1$$

Here, an outer matrix $W_1$ corresponds to a unitary precoding matrix that is an element of a first codebook $C_1$ and has a dimension of $N_t \times R$. For each rank, $W_1$ may be expressed as follows:

$$\text{Rank 1: } W_1 = \frac{\sqrt{2}}{2}\begin{bmatrix} A \\ e^{j\phi}A \end{bmatrix}$$

-continued $$\text{Rank 2: } W_1 = \frac{1}{2}\begin{bmatrix} A & A \\ e^{j\phi}A & -e^{j\phi}A \end{bmatrix}$$

Rank r:

when r is an odd number:

$$W_1 = \frac{1}{\sqrt{r}\sqrt{2}}\begin{bmatrix} A & A & \dots & C \\ e^{j\phi}A & -e^{j\phi}A & \dots & e^{j\phi}C \end{bmatrix}$$

or $$W_1 = \frac{1}{\sqrt{r}\sqrt{2}}\begin{bmatrix} A & A & \dots & C \\ e^{j\phi}A & -e^{j\phi}A & \dots & -e^{j\phi}C \end{bmatrix}$$

when r is an even number:

$$W_1 = \frac{1}{\sqrt{r}\sqrt{2}}\begin{bmatrix} A & A & \dots & C & C \\ e^{j\phi}A & -e^{j\phi}A & \dots & e^{j\phi}C & -e^{j\phi}C \end{bmatrix}$$

A, B, . . . , C may be orthogonal to each other, or may be DFT vectors.

An inner matrix $W_2$ may correspond to a diagonal matrix that is an element of a second codebook $C_2$ and has a dimension of $N_t \times N_t$. For example, $$W_2 = \begin{bmatrix} \sqrt{2-|\alpha|^2}\, I_{n_t/2} & \\ & \alpha I_{n_t/2} \end{bmatrix} \text{ with } |\alpha| = 1.$$

Extension

In the aforementioned observation, highly correlated channels may be assumed. Feedback overhead required for reporting $W_2$ and $W_1$ with a sufficient accuracy may not be used. To provide some design flexibilities, and to provide balanced feedback overheard and high feedback accuracy with respect to $W_2$ and $W_1$, a previous observation may be extended as follows:

$$W = W_2 W_1$$

In this example, an outer matrix $W_1$ corresponds to a unitary precoding matrix that is an element of a first codebook $C_1$ and has a dimension of $N_t \times R$. For each rank, $W_1$ may be expressed as follows:

$$\text{Rank 1: } W_1 = \frac{\sqrt{2}}{2}\begin{bmatrix} A \\ e^{j\phi}A \end{bmatrix}$$

$$\text{Rank 2: } W_1 = \frac{1}{2}\begin{bmatrix} A & A \\ e^{j\phi}A & -e^{j\phi}A \end{bmatrix}$$

Rank r:

when r is an odd number:

$$W_1 = \frac{1}{\sqrt{r}\sqrt{2}}\begin{bmatrix} A & A & \dots & C \\ e^{j\phi}A & -e^{j\phi}A & \dots & e^{j\phi}C \end{bmatrix}$$

or $$W_1 = \frac{1}{\sqrt{r}\sqrt{2}}\begin{bmatrix} A & A & \dots & C \\ e^{j\phi}A & -e^{j\phi}A & \dots & -e^{j\phi}C \end{bmatrix}$$

when r is an even number:

$$W_1 = \frac{1}{\sqrt{r}\sqrt{2}}\begin{bmatrix} A & A & \dots & C & C \\ e^{j\phi}A & -e^{j\phi}A & \dots & e^{j\phi}C & -e^{j\phi}C \end{bmatrix}$$

A, B, . . . , C may be orthogonal to each other, or may be DFT vectors.

An inner matrix $W_2$ may correspond to a diagonal matrix that is an element of a second codebook $C_2$ and has a dimension of $N_t \times N_t$. For example, $$W_2 = \begin{bmatrix} \sqrt{2-|\alpha|^2}\,\Theta & 0_{4\times 4} \\ 0_{4\times 4} & \alpha\Theta \end{bmatrix} \text{ with } |\alpha| = 1.$$

In $W_2$, $\Theta$ corresponds to a 4×4 matrix, and may be defined as $\Theta=\mathrm{diag}\{1, e^{j\pi\theta}, e^{j2\pi\theta}, e^{j3\pi\theta}\}$. diag(a, b, c, d) corresponds to a diagonal matrix that includes a, b, c, and d as diagonal elements. $\Theta$ enables tracking of a spatial correlation structure, for example, a DFT structure in a subband level above antennas 0 through 3, and above antennas 4 through 7. In this example, in a dual polarization case, the antennas 0 through 3 may generate one polarization, and the antennas 4 through 7 may generate another polarization. In a single polarization case, all the antennas may generate the same polarization.

$\alpha$ corresponds to a complex scalar and may process dual polarization or single polarization based on a small antennal interval. $\alpha$ may be selected within a subband level, for example, within a set of 1, j, $e^{j4\pi\theta}$. For example, in a single polarization case, $W_2$ may have a structure of $W_2=\mathrm{diag}\{1, e^{j\pi\theta}, e^{j2\pi\theta}, e^{j3\pi\theta}, e^{j4\pi\theta}, e^{j5\pi\theta}, e^{j6\pi\theta}, e^{j7\pi\theta}\}$. In a dual polarization case, $\alpha$ may be selected as 1 or j.

Codebook Suggestions

Prior to suggesting codebooks, 4×4 DFT matrices may be defined as follows:

$$DFT_1 = \frac{1}{2}\begin{bmatrix} 1 & 1 & 1 & 1 \\ 1 & j & -1 & -j \\ 1 & -1 & 1 & -1 \\ 1 & -j & -1 & j \end{bmatrix},$$

$$DFT_2 = \mathrm{diag}\{1, e^{j\pi/4}, j, e^{j3\pi/4}\} DFT_1,$$

$$DFT_3 = \mathrm{diag}\{1, e^{j\pi/8}, e^{j2\pi/8}, e^{j3\pi/8}\} DFT_1,$$

$$DFT_4 = \mathrm{diag}\{1, e^{j3\pi/8}, e^{j6\pi/8}, e^{j9\pi/8}\} DFT_1,$$

Suggestion 1: 4-Bit Codebook for Each Rank for $W_1$

In suggestion 1, the first codebook $C_1$ for rank r where r=1, . . . , 6 may include 16 4-bit elements or codewords. The first codebook $C_r$ for rank r where r=7, 8 may include four elements.

Codebook $C_1$

The first codebook $C_1$ for rank r may be expressed as $C_{1,r}$.

A first codebook $C_{1,1}$ for rank 1 may be obtained by employing columns 1 through 16 of the following matrix:

$$V_1 = \frac{\sqrt{2}}{2}\begin{bmatrix} DFT_1 & DFT_2 & DFT_3 & DFT_4 \\ DFT_1 & -DFT_2 & jDFT_3 & -jDFT_4 \end{bmatrix}$$

The 16 column vectors may correspond to DFT vectors for eight transmit antennas.

A first codebook $C_{1,2}$ for rank 2 may include the following 16 matrices:

$$C_{1,2} = \left\{ \begin{array}{l} \frac{1}{2}\begin{bmatrix} D_{1,k} & D_{1,k} \\ D_{1,k} & -D_{1,k} \end{bmatrix}, \frac{1}{2}\begin{bmatrix} D_{2,k} & D_{2,k} \\ D_{2,k} & -D_{2,k} \end{bmatrix}, \frac{1}{2}\begin{bmatrix} D_{3,k} & D_{3,k} \\ jD_{3,k} & -jD_{3,k} \end{bmatrix}, \frac{1}{2}\begin{bmatrix} D_{4,k} & D_{4,k} \\ jD_{4,k} & -jD_{4,k} \end{bmatrix}, \\ k = 1, \ldots, 4 \end{array} \right\}$$

In this example, $D_{m,k}$ corresponds to a $k^{th}$ column of $DFT_m$. For example, $D_{1,k}$ corresponds to a $k^{th}$ column of $DFT_1$, $D_{2,k}$ corresponds to a $k^{th}$ column of $DFT_2$, $D_{3,k}$ corresponds to a $k^{th}$ column of $DFT_3$, and $D_{4,k}$ corresponds to a $k^{th}$ column of $DFT_4$.

The first codebook $C_{1,2}$ may be obtained by using a first codebook for rank 1 and by adding up orthogonal columns based on $$W_1 = \frac{1}{2}\begin{bmatrix} A & A \\ e^{j\phi}A & -e^{j\phi}A \end{bmatrix}.$$

A first codebook $C_{1,3}$ for rank 3 may include the following 16 matrices:

Example 1)

$$C_{1,3} = \left\{ \begin{array}{l} \frac{1}{\sqrt{3}\sqrt{2}}\begin{bmatrix} D_{1,k} & D_{1,k} & D_{1,m} \\ D_{1,k} & -D_{1,k} & D_{1,m} \end{bmatrix}, \frac{1}{\sqrt{3}\sqrt{2}}\begin{bmatrix} D_{2,k} & D_{2,k} & D_{2,m} \\ D_{2,k} & -D_{2,k} & D_{2,m} \end{bmatrix}, \\ \frac{1}{\sqrt{3}\sqrt{2}}\begin{bmatrix} D_{3,k} & D_{3,k} & D_{3,m} \\ jD_{3,k} & -jD_{3,k} & jD_{3,m} \end{bmatrix}, \frac{1}{\sqrt{3}\sqrt{2}}\begin{bmatrix} D_{4,k} & D_{4,k} & D_{4,m} \\ jD_{4,k} & -jD_{4,k} & jD_{4,m} \end{bmatrix} \end{array} \right\}$$

In this example, k=1, . . . 4 and m=k mod 4+1.

Example 2)

$$C_{1,3} = \left\{ \begin{array}{l} \frac{1}{\sqrt{3}\sqrt{2}}\begin{bmatrix} D_{1,k} & D_{1,k} & D_{1,m} \\ D_{1,k} & -D_{1,k} & -D_{1,m} \end{bmatrix}, \frac{1}{\sqrt{3}\sqrt{2}}\begin{bmatrix} D_{2,k} & D_{2,k} & D_{2,m} \\ D_{2,k} & -D_{2,k} & -D_{2,m} \end{bmatrix}, \\ \frac{1}{\sqrt{3}\sqrt{2}}\begin{bmatrix} D_{3,k} & D_{3,k} & D_{3,m} \\ jD_{3,k} & -jD_{3,k} & -jD_{3,m} \end{bmatrix}, \frac{1}{\sqrt{3}\sqrt{2}}\begin{bmatrix} D_{4,k} & D_{4,k} & D_{4,m} \\ jD_{4,k} & -jD_{4,k} & -jD_{4,m} \end{bmatrix} \end{array} \right\}$$

In this example, k=1, . . . 4 and m=k mod 4+1.

Other examples may also be used. For example, m may be given to be different from above, and k may also be given to be different from above. For example, various combinations of k and m may be given as (k,m)={(1,2),(1,3),(1,4),(2,3)}.

A first codebook $C_{1,4}$ for rank 4 may include the following 16 matrices:

Example 1)

$$C_{1,4}=\left\{\begin{array}{l}\frac{1}{\sqrt{4}\sqrt{2}}\begin{bmatrix}D_{1,k} & D_{1,k} & D_{1,m} & D_{1,m}\\ D_{1,k} & -D_{1,k} & D_{1,m} & -D_{1,m}\end{bmatrix},\ \frac{1}{\sqrt{4}\sqrt{2}}\begin{bmatrix}D_{2,k} & D_{2,k} & D_{2,m} & D_{2,m}\\ D_{2,k} & -D_{2,k} & D_{2,m} & -D_{2,m}\end{bmatrix},\\ \frac{1}{\sqrt{4}\sqrt{2}}\begin{bmatrix}D_{3,k} & D_{3,k} & D_{3,m} & D_{3,m}\\ jD_{3,k} & -jD_{3,k} & jD_{3,m} & -jD_{3,m}\end{bmatrix},\ \frac{1}{\sqrt{4}\sqrt{2}}\begin{bmatrix}D_{4,k} & D_{4,k} & D_{4,m} & D_{4,m}\\ jD_{4,k} & -jD_{4,k} & jD_{4,m} & -jD_{4,m}\end{bmatrix}\end{array}\right\}$$

In this example, k=1, . . . 4 and m=k mod 4+1.

Example 2) m may be given to be different from above, and k may also be given to be different from above. For example, various combinations of k and m may be given as (k,m)={(1, 2),(1,3),(1,4),(2,3)}. Other examples may also be used.

A first codebook $C_{1,5}$ for rank 5 may include the following 16 matrices:

Example 1)

$$C_{1,5}=\left\{\begin{array}{l}\frac{1}{\sqrt{5}\sqrt{2}}\begin{bmatrix}D_{1,k} & D_{1,k} & D_{1,m} & D_{1,m} & D_{1,n}\\ D_{1,k} & -D_{1,k} & D_{1,m} & -D_{1,m} & D_{1,n}\end{bmatrix},\\ \frac{1}{\sqrt{5}\sqrt{2}}\begin{bmatrix}D_{2,k} & D_{2,k} & D_{2,m} & D_{2,m} & D_{2,n}\\ D_{2,k} & -D_{2,k} & D_{2,m} & -D_{2,m} & D_{2,n}\end{bmatrix},\\ \frac{1}{\sqrt{5}\sqrt{2}}\begin{bmatrix}D_{3,k} & D_{3,k} & D_{3,m} & D_{3,m} & D_{3,n}\\ jD_{3,k} & -jD_{3,k} & jD_{3,m} & -jD_{3,m} & jD_{3,n}\end{bmatrix},\\ \frac{1}{\sqrt{5}\sqrt{2}}\begin{bmatrix}D_{4,k} & D_{4,k} & D_{4,m} & D_{4,m} & D_{4,n}\\ jD_{4,k} & -jD_{4,k} & jD_{4,m} & -jD_{4m} & jD_{4,n}\end{bmatrix}\end{array}\right\}$$

A combination of k,m, and n may be selected from {(1,2, 3),(1,2,4),(1,3,4),(2,3,4)}.

Example 2)

$$C_{1,5}=\left\{\begin{array}{l}\frac{1}{\sqrt{5}\sqrt{2}}\begin{bmatrix}D_{1,k} & D_{1,k} & D_{1,m} & D_{1,m} & D_{1,n}\\ D_{1,k} & -D_{1,k} & D_{1,m} & -D_{1,m} & -D_{1,n}\end{bmatrix},\\ \frac{1}{\sqrt{5}\sqrt{2}}\begin{bmatrix}D_{2,k} & D_{2,k} & D_{2,m} & D_{2,m} & D_{2,n}\\ D_{2,k} & -D_{2,k} & D_{2,m} & -D_{2,m} & -D_{2,n}\end{bmatrix},\\ \frac{1}{\sqrt{5}\sqrt{2}}\begin{bmatrix}D_{3,k} & D_{3,k} & D_{3,m} & D_{3,m} & D_{3,n}\\ jD_{3,k} & -jD_{3,k} & jD_{3,m} & -jD_{3,m} & -jD_{3,n}\end{bmatrix},\\ \frac{1}{\sqrt{5}\sqrt{2}}\begin{bmatrix}D_{4,k} & D_{4,k} & D_{4,m} & D_{4,m} & D_{4,n}\\ jD_{4,k} & -jD_{4,k} & jD_{4,m} & -jD_{4m} & -jD_{4,n}\end{bmatrix}\end{array}\right\}$$

A combination of k,m, and n may be selected from {(1,2, 3),(1,2,4),(1,3,4),(2,3,4)}.

A first codebook $C_{1,6}$ for rank 6 may include the following 16 matrices:

$$C_{1,6}=\left\{\begin{array}{l}\frac{1}{\sqrt{6}\sqrt{2}}\begin{bmatrix}D_{1,k} & D_{1,k} & D_{1,m} & D_{1,m} & D_{1,n} & D_{1,n}\\ D_{1,k} & -D_{1,k} & D_{1,m} & -D_{1,m} & D_{1,n} & -D_{1,n}\end{bmatrix},\\ \frac{1}{\sqrt{6}\sqrt{2}}\begin{bmatrix}D_{2,k} & D_{2,k} & D_{2,m} & D_{2,m} & D_{2,n} & D_{2,n}\\ D_{2,k} & -D_{2,k} & D_{2,m} & -D_{2,m} & D_{2,n} & -D_{2,n}\end{bmatrix},\\ \frac{1}{\sqrt{6}\sqrt{2}}\begin{bmatrix}D_{3,k} & D_{3,k} & D_{3,m} & D_{3,m} & D_{3,n} & D_{3,n}\\ jD_{3,k} & -jD_{3,k} & jD_{3,m} & -jD_{3,m} & jD_{3,n} & -jD_{3,n}\end{bmatrix},\\ \frac{1}{\sqrt{6}\sqrt{2}}\begin{bmatrix}D_{4,k} & D_{4,k} & D_{4,m} & D_{4,m} & D_{4,n} & D_{4,n}\\ jD_{4,k} & -jD_{4,k} & jD_{4,m} & -jD_{4,m} & jD_{4,n} & -jD_{4,n}\end{bmatrix}\end{array}\right\}$$

A combination of k,m, and n may be selected from {(1,2, 3),(1,2,4),(1,3,4),(2,3,4)}.

A first codebook $C_{1,7}$ for rank 7 may include the following four matrices:

Example 1)

$$C_{1,7}=\left\{\begin{array}{l}\frac{1}{\sqrt{7}\sqrt{2}}\begin{bmatrix}D_{1,k} & D_{1,k} & D_{1,m} & D_{1,m} & D_{1,n} & D_{1,n} & D_{1,p}\\ D_{1,k} & -D_{1,k} & D_{1,m} & -D_{1,m} & D_{1,n} & -D_{1,n} & D_{1,p}\end{bmatrix},\\ \frac{1}{\sqrt{7}\sqrt{2}}\begin{bmatrix}D_{2,k} & D_{2,k} & D_{2,m} & D_{2,m} & D_{2,n} & D_{2,n} & D_{2,p}\\ D_{2,k} & -D_{2,k} & D_{2,m} & -D_{2,m} & D_{2,n} & -D_{2,n} & D_{2,p}\end{bmatrix},\\ \frac{1}{\sqrt{7}\sqrt{2}}\begin{bmatrix}D_{3,k} & D_{3,k} & D_{3,m} & D_{3,m} & D_{3,n} & D_{3,n} & D_{3,p}\\ jD_{3,k} & -jD_{3,k} & jD_{3,m} & -jD_{3,m} & jD_{3,n} & -jD_{3,n} & jD_{3,p}\end{bmatrix},\\ \frac{1}{\sqrt{7}\sqrt{2}}\begin{bmatrix}D_{4,k} & D_{4,k} & D_{4,m} & D_{4,m} & D_{4,n} & D_{4,n} & D_{4,p}\\ jD_{4,k} & -jD_{4,k} & jD_{4,m} & -jD_{4,m} & jD_{4,n} & -jD_{4,n} & jD_{4,p}\end{bmatrix}\end{array}\right\}$$

(k,m,n,p)=(1,2,3,4).

Example 2)

$$C_{1,7}=\left\{\begin{array}{l}\frac{1}{\sqrt{7}\sqrt{2}}\begin{bmatrix}D_{1,k} & D_{1,k} & D_{1,m} & D_{1,m} & D_{1,n} & D_{1,n} & D_{1,p}\\ D_{1,k} & -D_{1,k} & D_{1,m} & -D_{1,m} & D_{1,n} & -D_{1,n} & -D_{1,p}\end{bmatrix},\\ \frac{1}{\sqrt{7}\sqrt{2}}\begin{bmatrix}D_{2,k} & D_{2,k} & D_{2,m} & D_{2,m} & D_{2,n} & D_{2,n} & D_{2,p}\\ D_{2,k} & -D_{2,k} & D_{2,m} & -D_{2,m} & D_{2,n} & -D_{2,n} & -D_{2,p}\end{bmatrix},\\ \frac{1}{\sqrt{7}\sqrt{2}}\begin{bmatrix}D_{3,k} & D_{3,k} & D_{3,m} & D_{3,m} & D_{3,n} & D_{3,n} & D_{3,p}\\ jD_{3,k} & -jD_{3,k} & jD_{3,m} & -jD_{3,m} & jD_{3,n} & -jD_{3,n} & -jD_{3,p}\end{bmatrix},\\ \frac{1}{\sqrt{7}\sqrt{2}}\begin{bmatrix}D_{4,k} & D_{4,k} & D_{4,m} & D_{4,m} & D_{4,n} & D_{4,n} & D_{4,p}\\ jD_{4,k} & -jD_{4,k} & jD_{4,m} & -jD_{4,m} & jD_{4,n} & -jD_{4,n} & -jD_{4,p}\end{bmatrix}\end{array}\right\}$$

(k,m,n,p)=(1,2,3,4).

A first codebook $C_{1,8}$ for rank 8 may include the following four matrices:

$$C_{1,8}=\left\{\frac{1}{\sqrt{8}\sqrt{2}}\begin{bmatrix}D_1 & D_1\\ D_1 & -D_1\end{bmatrix},\ \frac{1}{\sqrt{8}\sqrt{2}}\begin{bmatrix}D_2 & D_2\\ D_2 & -D_2\end{bmatrix},\ \frac{1}{\sqrt{8}\sqrt{2}}\begin{bmatrix}D_3 & D_3\\ jD_3 & -jD_3\end{bmatrix},\ \frac{1}{\sqrt{8}\sqrt{2}}\begin{bmatrix}D_4 & D_4\\ jD_4 & -jD_4\end{bmatrix}\right\}$$

Codebook $C_2$

A number of codewords to be assigned to Θ and α may need to be carefully investigated.

Example 1) For example, when a single bit is assigned to Θ and α, the second codebook $C_2$ may be expressed as follows:

For rank 1:

With respect to and $\alpha\in\{e^{j4\pi\Theta_i}\}$ and $\Theta_i$ where i=1,2, when a second codebook for rank 1 including a first codeword and a second codeword is assumed as $C_{2,1\ldots 2}$, $$C_{2,1\ldots2}=\left\{\begin{bmatrix}\Theta_1 & 0_{4\times4}\\ 0_{4\times4} & e^{j4\pi\theta_1}\Theta_1\end{bmatrix},\begin{bmatrix}\Theta_2 & 0_{4\times4}\\ 0_{4\times4} & e^{j4\pi\theta_2}\Theta_2\end{bmatrix}\right\}.$$

In this example, $$\theta_1=\frac{1}{16},\ \theta_2=\frac{-1}{16}.$$

With respect to $$\alpha\in\{1,-1\}\text{ and }\Theta=I,$$

when the second codebook for rank 1 including a third codeword and a fourth codeword is assumed as $C_{2,3\ldots4}$, $$C_{2,3\ldots4}=\left\{\begin{bmatrix}I_4 & 0_{4\times4}\\ 0_{4\times4} & I_4\end{bmatrix},\begin{bmatrix}I_4 & 0_{4\times4}\\ 0_{4\times4} & -I_4\end{bmatrix}\right\}.$$

For ranks 2, 3, and 4:

With respect to $\alpha\in\{1\}$ and $\Theta_i$ where i=1, 2, when a second codebook for ranks 2, 3, and 4 including a first codeword and a second codeword is assumed as $C_{2,1\ldots2}$, $$C_{2,1\ldots2}=\left\{\begin{bmatrix}\Theta_1 & 0_{4\times4}\\ 0_{4\times4} & \Theta_1\end{bmatrix},\begin{bmatrix}\Theta_2 & 0_{4\times4}\\ 0_{4\times4} & \Theta_2\end{bmatrix}\right\}.$$

Example 2) A size of the second codebook may be extended to three bits by extending the aforementioned example 1).

For rank 1:

With respect to $\alpha\in\{1, e^{j4\pi\Theta_i}\}$ and $\Theta_i$ where i=1, 2, when the second codebook for rank 1 including four codewords is assumed as $$C_{2,1\ldots4}=\left\{\begin{bmatrix}\Theta_1 & 0_{4\times4}\\ 0_{4\times4} & e^{j4\pi\theta_1}\Theta_1\end{bmatrix},\begin{bmatrix}\Theta_2 & 0_{4\times4}\\ 0_{4\times4} & e^{j4\pi\theta_2}\Theta_2\end{bmatrix},\begin{bmatrix}\Theta_1 & 0_{4\times4}\\ 0_{4\times4} & \Theta_1\end{bmatrix},\begin{bmatrix}\Theta_2 & 0_{4\times4}\\ 0_{4\times4} & \Theta_2\end{bmatrix}\right\}$$

For ranks 2, 3, and 4:

With respect to $\alpha\in\{1\}$ and $\Theta_i$ where i=1,2, when the second codebook for ranks 2, 3, and 4 including first through fourth codewords is assumed as $$C_{2,1\ldots4}=\left\{\begin{bmatrix}\Theta_1 & 0_{4\times4}\\ 0_{4\times4} & \Theta_1\end{bmatrix},\begin{bmatrix}\Theta_2 & 0_{4\times4}\\ 0_{4\times4} & \Theta_2\end{bmatrix},\begin{bmatrix}\Theta_3 & 0_{4\times4}\\ 0_{4\times4} & \Theta_3\end{bmatrix},\begin{bmatrix}\Theta_4 & 0_{4\times4}\\ 0_{4\times4} & \Theta_4\end{bmatrix}\right\}.$$

In this example, $$\theta_1=\frac{1}{16},\ \theta_2=\frac{-1}{16},\ \theta_3=\frac{1}{8},\ \theta_4=\frac{-1}{8}.$$

With respect to and $\alpha\in\{1,j\}$ and $\Theta=I$, when the second codebook for ranks 2, 3, and 4 including fifth through sixth codewords is assumed as $C_{2,5\ldots6}$, $$C_{2,5\ldots6}\left\{\begin{bmatrix}I & 0_{4\times4}\\ 0_{4\times4} & I\end{bmatrix},\begin{bmatrix}I & 0_{4\times4}\\ 0_{4\times4} & jI\end{bmatrix}\right\}.$$

With respect to $$\theta_3=\frac{1}{8},\ \theta_4=\frac{-1}{8}\text{ with }\alpha\in\{j\},$$

when the second codebook for ranks 2, 3, and 4 including seventh through eighth codewords is assumed as $$C_{2,7\ldots8}=\left\{\begin{bmatrix}\Theta_3 & 0_{4\times4}\\ 0_{4\times4} & j\Theta_3\end{bmatrix},\begin{bmatrix}\Theta_4 & 0_{4\times4}\\ 0_{4\times4} & j\Theta_4\end{bmatrix}\right\}.$$

Suggestion 2: Maximum 4-Bit Codebook for Each Rank for $W_1$

In suggestion 2, the first codebook for rank r where r=1, . . . 2 may include 16 elements, the first codebook for rank r where r=3, 4 may include eight elements, and the first codebook for rank r where r=5, 6, 7, 8 may include four elements.

The above 64 entries may be divided into four subsets each including 16 entries. To indicate one of the subsets, two bits may be used. The two bits may indicate a rank corresponding to the selected subset among rank 1, rank 2, rank 3-4, and rank 5-8.

Codebook $C_1$

A first codebook $C_1$ for rank r may be indicated as $C_{1,r}$.

A rank 1 first codebook $C_{1,1}$ may be obtained by employing columns 1 through 16 of the following matrix:

$$V_1=\frac{\sqrt{2}}{2}\begin{bmatrix}DFT_1 & DFT_2 & DFT_3 & DFT_4\\ DFT_1 & -DFT_2 & jDFT_3 & -jDFT_4\end{bmatrix}$$

The column vectors 1 through 16 may correspond to DFT vectors for eight transmit antennas.

A rank 2 first codebook $C_{1,2}$ may include the following 16 matrices:

$$C_{1,2}=\left\{\begin{array}{l}\frac{1}{2}\begin{bmatrix}D_{1,k} & D_{1,k}\\ D_{1,k} & -D_{1,k}\end{bmatrix},\frac{1}{2}\begin{bmatrix}D_{2,k} & D_{2,k}\\ D_{2,k} & -D_{2,k}\end{bmatrix},\frac{1}{2}\begin{bmatrix}D_{3,k} & D_{3,k}\\ jD_{3,k} & -jD_{3,k}\end{bmatrix},\frac{1}{2}\begin{bmatrix}D_{4,k} & D_{4,k}\\ jD_{4,k} & -jD_{4,k}\end{bmatrix},\\ k=1,\ldots,4\end{array}\right\}$$

In this example, $D_{m,k}$ corresponds to a $k^{th}$ column of $DFT_m$. For example, $D_{1,k}$ corresponds to a $k^{th}$ column of $DFT_1$, $D_{2,k}$ corresponds to a $k^{th}$ column of $DFT_2$, $D_{3,k}$ corresponds to a $k^{th}$ column of $DFT_3$, and $D_{4,k}$ corresponds to a $k^{th}$ column of $DFT_4$.

The rank 2 first codebook $C_{1,2}$ may be obtained by using the rank 1 first codebook and adding orthogonal columns based on $$W_1 = \frac{1}{2}\begin{bmatrix} A & A \\ e^{j\phi}A & -e^{j\phi}A \end{bmatrix}.$$

A rank 3 first codebook $C_{1,3}$ may include the following eight matrices:

Example 1)

$$C_{1,3} = \left\{ \begin{array}{l} \frac{1}{\sqrt{3}\sqrt{2}}\begin{bmatrix} D_{1,k} & D_{1,k} & D_{1,m} \\ D_{1,k} & -D_{1,k} & D_{1,m} \end{bmatrix}, \\ \frac{1}{\sqrt{3}\sqrt{2}}\begin{bmatrix} D_{2,k} & D_{2,k} & D_{2,m} \\ D_{2,k} & -D_{2,k} & D_{2,m} \end{bmatrix}, \\ \frac{1}{\sqrt{3}\sqrt{2}}\begin{bmatrix} D_{3,k} & D_{3,k} & D_{3,m} \\ jD_{3,k} & -jD_{3,k} & jD_{3,m} \end{bmatrix}, \\ \frac{1}{\sqrt{3}\sqrt{2}}\begin{bmatrix} D_{4,k} & D_{4,k} & D_{4,m} \\ jD_{4,k} & -jD_{4,k} & jD_{4,m} \end{bmatrix} \end{array} \right\}$$

In this example, k=1, 2 and m=k+2.

Example 2)

$$C_{1,3} = \left\{ \begin{array}{l} \frac{1}{\sqrt{3}\sqrt{2}}\begin{bmatrix} D_{1,k} & D_{1,k} & D_{1,m} \\ D_{1,k} & -D_{1,k} & -D_{1,m} \end{bmatrix}, \\ \frac{1}{\sqrt{3}\sqrt{2}}\begin{bmatrix} D_{2,k} & D_{2,k} & D_{2,m} \\ D_{2,k} & -D_{2,k} & -D_{2,m} \end{bmatrix}, \\ \frac{1}{\sqrt{3}\sqrt{2}}\begin{bmatrix} D_{3,k} & D_{3,k} & D_{3,m} \\ jD_{3,k} & -jD_{3,k} & -jD_{3,m} \end{bmatrix}, \\ \frac{1}{\sqrt{3}\sqrt{2}}\begin{bmatrix} D_{4,k} & D_{4,k} & D_{4,m} \\ jD_{4,k} & -jD_{4,k} & -jD_{4,m} \end{bmatrix} \end{array} \right\}$$

In this example, k=1, 2 and m=k+2.

Example 3)

$$C_{1,3} = \left\{ \frac{1}{\sqrt{3}\sqrt{2}}\begin{bmatrix} D_{1,k} & D_{1,k} & D_{1,m} \\ D_{1,k} & -D_{1,k} & D_{1,m} \end{bmatrix}, \frac{1}{\sqrt{3}\sqrt{2}}\begin{bmatrix} D_{2,k} & D_{2,k} & D_{2,m} \\ D_{2,k} & -D_{2,k} & D_{2,m} \end{bmatrix} \right\} \text{ or}$$

$$C_{1,3} = \left\{ \frac{1}{\sqrt{3}\sqrt{2}}\begin{bmatrix} D_{1,k} & D_{1,k} & D_{1,m} \\ D_{1,k} & -D_{1,k} & -D_{1,m} \end{bmatrix}, \frac{1}{\sqrt{3}\sqrt{2}}\begin{bmatrix} D_{2,k} & D_{2,k} & D_{2,m} \\ D_{2,k} & -D_{2,k} & -D_{2,m} \end{bmatrix} \right\}$$

or

In this example, k=1, . . . , 4 and m=k mod 4+1.

Example 4)

$$C_{1,3} = \left\{ \frac{1}{\sqrt{3}\sqrt{2}}\begin{bmatrix} D_{1,k} & D_{1,k} & D_{1,m} \\ D_{1,k} & -D_{1,k} & D_{1,m} \end{bmatrix}, \frac{1}{\sqrt{3}\sqrt{2}}\begin{bmatrix} D_{2,k} & D_{2,k} & D_{2,m} \\ D_{2,k} & -D_{2,k} & D_{2,m} \end{bmatrix} \right\} \text{ or}$$

$$C_{1,3} = \left\{ \frac{1}{\sqrt{3}\sqrt{2}}\begin{bmatrix} D_{1,k} & D_{1,k} & D_{1,m} \\ D_{1,k} & -D_{1,k} & -D_{1,m} \end{bmatrix}, \frac{1}{\sqrt{3}\sqrt{2}}\begin{bmatrix} D_{2,k} & D_{2,k} & D_{2,m} \\ D_{2,k} & -D_{2,k} & -D_{2,m} \end{bmatrix} \right\}$$

In this example, (k,m)={(1,2),(1,3),(1,4),(2,3)}.

In addition to examples 1) through 4), other examples may also be employed.

A rank 4 first codebook $C_{1,4}$ may include the following eight matrices:

Example 1)

$$C_{1,4} = \left\{ \begin{array}{l} \frac{1}{\sqrt{4}\sqrt{2}}\begin{bmatrix} D_{1,k} & D_{1,k} & D_{1,m} & D_{1,m} \\ D_{1,k} & -D_{1,k} & D_{1,m} & -D_{1,m} \end{bmatrix}, \\ \frac{1}{\sqrt{4}\sqrt{2}}\begin{bmatrix} D_{2,k} & D_{2,k} & D_{2,m} & D_{2,m} \\ D_{2,k} & -D_{2,k} & D_{2,m} & -D_{2,m} \end{bmatrix}, \\ \frac{1}{\sqrt{4}\sqrt{2}}\begin{bmatrix} D_{3,k} & D_{3,k} & D_{3,m} & D_{3,m} \\ jD_{3,k} & -jD_{3,k} & jD_{3,m} & -jD_{3,m} \end{bmatrix}, \\ \frac{1}{\sqrt{4}\sqrt{2}}\begin{bmatrix} D_{4,k} & D_{4,k} & D_{4,m} & D_{4,m} \\ jD_{4,k} & -jD_{4k} & jD_{4,m} & -jD_{4,m} \end{bmatrix} \end{array} \right\}$$

In this example, k=1, 2 and m=k+2.

Example 2)

$$C_{1,4} = \left\{ \begin{array}{l} \frac{1}{\sqrt{4}\sqrt{2}}\begin{bmatrix} D_{1,k} & D_{1,k} & D_{1,m} & D_{1,m} \\ D_{1,k} & -D_{1,k} & D_{1,m} & -D_{1,m} \end{bmatrix}, \\ \frac{1}{\sqrt{4}\sqrt{2}}\begin{bmatrix} D_{2,k} & D_{2,k} & D_{2,m} & D_{2,m} \\ D_{2,k} & -D_{2,k} & D_{2,m} & -D_{2,m} \end{bmatrix}, \\ \frac{1}{\sqrt{4}\sqrt{2}}\begin{bmatrix} D_{3,k} & D_{3,k} & D_{3,m} & D_{3,m} \\ jD_{3,k} & -jD_{3,k} & jD_{3,m} & -jD_{3,m} \end{bmatrix}, \\ \frac{1}{\sqrt{4}\sqrt{2}}\begin{bmatrix} D_{4,k} & D_{4,k} & D_{4,m} & D_{4,m} \\ jD_{4,k} & -jD_{4k} & jD_{4,m} & -jD_{4,m} \end{bmatrix} \end{array} \right\}$$

In this example, (k,m)={(1,2),(1,3)}.

Example 3)

$$C_{1,4} = \left\{ \begin{array}{l} \frac{1}{\sqrt{4}\sqrt{2}}\begin{bmatrix} D_{1,k} & D_{1,k} & D_{1,m} & D_{1,m} \\ D_{1,k} & -D_{1,k} & D_{1,m} & -D_{1,m} \end{bmatrix}, \\ \frac{1}{\sqrt{4}\sqrt{2}}\begin{bmatrix} D_{2,k} & D_{2,k} & D_{2,m} & D_{2,m} \\ D_{2,k} & -D_{2,k} & D_{2,m} & -D_{2,m} \end{bmatrix} \end{array} \right\}$$

In this example, (k,m)={(1,2),(1,3),(1,4),(2,3)}.

In addition to examples 1) through 4), other examples may also be employed.

The rank 5 first codebook $C_{1,5}$ may include the following four matrices:

Example 1)

$$C_{1,5} = \left\{ \frac{1}{\sqrt{5}\sqrt{2}}\begin{bmatrix} D_{1,k} & D_{1,k} & D_{1,m} & D_{1,m} & D_{1,n} \\ D_{1,k} & -D_{1,k} & D_{1,m} & -D_{1,m} & D_{1,n} \end{bmatrix} \right\}$$

In this example, (k,m,n)={(1,2,3),(1,2,4),(1,3,4),(2,3,4)}.

Example 2)

$$C_{1,5} = \left\{ \frac{1}{\sqrt{5}\sqrt{2}}\begin{bmatrix} D_{1,k} & D_{1,k} & D_{1,m} & D_{1,m} & D_{1,n} \\ D_{1,k} & -D_{1,k} & D_{1,m} & -D_{1,m} & -D_{1,n} \end{bmatrix} \right\}$$

In this example, (k,m,n)={(1,2,3),(1,2,4),(1,3,4),(2,3,4)}.

Example 3)

$$C_{1,5}=\left\{\begin{array}{l}\frac{1}{\sqrt{5}\sqrt{2}}\begin{bmatrix}D_{1,k}&D_{1,k}&D_{1,m}&D_{1,m}&D_{1,n}\\D_{1,k}&-D_{1,k}&D_{1,m}&-D_{1,m}&D_{1,n}\end{bmatrix},\\\frac{1}{\sqrt{5}\sqrt{2}}\begin{bmatrix}D_{2,k}&D_{2,k}&D_{2,m}&D_{2,m}&D_{2,n}\\D_{2,k}&-D_{2,k}&D_{2,m}&-D_{2,m}&D_{2,n}\end{bmatrix}\end{array}\right\}$$

In this example, (k,m,n)={(1,2,3),(1,2,4)}.

Example 4)

$$C_{1,5}=\left\{\begin{array}{l}\frac{1}{\sqrt{5}\sqrt{2}}\begin{bmatrix}D_{1,k}&D_{1,k}&D_{1,m}&D_{1,m}&D_{1,n}\\D_{1,k}&-D_{1,k}&D_{1,m}&-D_{1,m}&D_{1,n}\end{bmatrix},\\\frac{1}{\sqrt{5}\sqrt{2}}\begin{bmatrix}D_{2,k}&D_{2,k}&D_{2,m}&D_{2,m}&D_{2,n}\\D_{2,k}&-D_{2,k}&D_{2,m}&-D_{2,m}&D_{2,n}\end{bmatrix},\\\frac{1}{\sqrt{5}\sqrt{2}}\begin{bmatrix}D_{3,k}&D_{3,k}&D_{3,m}&D_{3,m}&D_{3,n}\\jD_{3,k}&-jD_{3,k}&jD_{3,m}&-jD_{3,m}&jD_{3,n}\end{bmatrix},\\\frac{1}{\sqrt{5}\sqrt{2}}\begin{bmatrix}D_{4,k}&D_{4,k}&D_{4,m}&D_{4,m}&D_{4,n}\\jD_{4,k}&-jD_{4,k}&jD_{4,m}&-jD_{4,m}&jD_{4,n}\end{bmatrix}\end{array}\right\}$$

In this example, (k,m,n)={(1,2,3)}.

A rank 6 first codebook $C_{1,6}$ may include the following four matrices:

Example 1)

$$C_{1,6}=\left\{\frac{1}{\sqrt{6}\sqrt{2}}\begin{bmatrix}D_{1,k}&D_{1,k}&D_{1,m}&D_{1,m}&D_{1,n}&D_{1,n}\\D_{1,k}&-D_{1,k}&D_{1,m}&-D_{1,m}&D_{1,n}&-D_{1,n}\end{bmatrix}\right\}$$

In this example, (k,m,n)={(1,2,3),(1,2,4),(1,3,4),(2,3,4)}.

Example 2)

$$C_{1,6}=\left\{\begin{array}{l}\frac{1}{\sqrt{6}\sqrt{2}}\begin{bmatrix}D_{1,k}&D_{1,k}&D_{1,m}&D_{1,m}&D_{1,n}&D_{1,n}\\D_{1,k}&-D_{1,k}&D_{1,m}&-D_{1,m}&D_{1,n}&-D_{1,n}\end{bmatrix},\\\frac{1}{\sqrt{6}\sqrt{2}}\begin{bmatrix}D_{2,k}&D_{2,k}&D_{2,m}&D_{2,m}&D_{2,n}&D_{2,n}\\D_{2,k}&-D_{2,k}&D_{2,m}&-D_{2,m}&D_{2,n}&-D_{2,n}\end{bmatrix}\end{array}\right\}$$

In this example, (k,m,n)={(1,2,3),(1,2,4)}.

Example 3)

$$C_{1,6}=\left\{\begin{array}{l}\frac{1}{\sqrt{6}\sqrt{2}}\begin{bmatrix}D_{1,k}&D_{1,k}&D_{1,m}&D_{1,m}&D_{1,n}&D_{1,n}\\D_{1,k}&-D_{1,k}&D_{1,m}&-D_{1,m}&D_{1,n}&-D_{1,n}\end{bmatrix},\\\frac{1}{\sqrt{6}\sqrt{2}}\begin{bmatrix}D_{2,k}&D_{2,k}&D_{2,m}&D_{2,m}&D_{2,n}&D_{2,n}\\D_{2,k}&-D_{2,k}&D_{2,m}&-D_{2,m}&D_{2,n}&-D_{2,n}\end{bmatrix},\\\frac{1}{\sqrt{6}\sqrt{2}}\begin{bmatrix}D_{3,k}&D_{3,k}&D_{3,m}&D_{3,m}&D_{3,n}&D_{3,n}\\jD_{3,k}&-jD_{3,k}&jD_{3,m}&-jD_{3,m}&jD_{3,n}&-jD_{3,n}\end{bmatrix},\\\frac{1}{\sqrt{6}\sqrt{2}}\begin{bmatrix}D_{4,k}&D_{4,k}&D_{4,m}&D_{4,m}&D_{4,n}&D_{4,n}\\jD_{4,k}&-jD_{4,k}&jD_{4,m}&-jD_{4,m}&jD_{4,n}&-jD_{4,n}\end{bmatrix}\end{array}\right\}$$

In this example, (k,m,n)={(1,2,3)}.

A rank 7 first codebook $C_{1,7}$ may include the following four matrices:

Example 1)

$$C_{1,7}=\left\{\begin{array}{l}\frac{1}{\sqrt{7}\sqrt{2}}\begin{bmatrix}D_{1,k}&D_{1,k}&D_{1,m}&D_{1,m}&D_{1,n}&D_{1,n}&D_{1,p}\\D_{1,k}&-D_{1,k}&D_{1,m}&-D_{1,m}&D_{1,n}&-D_{1,n}&D_{1,p}\end{bmatrix},\\\frac{1}{\sqrt{7}\sqrt{2}}\begin{bmatrix}D_{2,k}&D_{2,k}&D_{2,m}&D_{2,m}&D_{2,n}&D_{2,n}&D_{2,p}\\D_{2,k}&-D_{2,k}&D_{2,m}&-D_{2,m}&D_{2,n}&-D_{2,n}&D_{2,p}\end{bmatrix},\\\frac{1}{\sqrt{7}\sqrt{2}}\begin{bmatrix}D_{3,k}&D_{3,k}&D_{3,m}&D_{3,m}&D_{3,n}&D_{3,n}&D_{3,p}\\jD_{3,k}&-jD_{3,k}&jD_{3,m}&-jD_{3,m}&jD_{3,n}&-jD_{3,n}&jD_{3,p}\end{bmatrix},\\\frac{1}{\sqrt{7}\sqrt{2}}\begin{bmatrix}D_{4,k}&D_{4,k}&D_{4,m}&D_{4,m}&D_{4,n}&D_{4,n}&D_{4,p}\\jD_{4,k}&-jD_{4,k}&jD_{4,m}&-jD_{4,m}&jD_{4,n}&-jD_{4,n}&jD_{4,p}\end{bmatrix}\end{array}\right\}$$

In this example, (k,m,n, p)={(1,2,3,4)}.

Example 2)

$$C_{1,7}=\left\{\begin{array}{l}\frac{1}{\sqrt{7}\sqrt{2}}\begin{bmatrix}D_{1,k}&D_{1,k}&D_{1,m}&D_{1,m}&D_{1,n}&D_{1,n}&D_{1,p}\\D_{1,k}&-D_{1,k}&D_{1,m}&-D_{1,m}&D_{1,n}&-D_{1,n}&-D_{1,p}\end{bmatrix},\\\frac{1}{\sqrt{7}\sqrt{2}}\begin{bmatrix}D_{2,k}&D_{2,k}&D_{2,m}&D_{2,m}&D_{2,n}&D_{2,n}&D_{2,p}\\D_{2,k}&-D_{2,k}&D_{2,m}&-D_{2,m}&D_{2,n}&-D_{2,n}&-D_{2,p}\end{bmatrix},\\\frac{1}{\sqrt{7}\sqrt{2}}\begin{bmatrix}D_{3,k}&D_{3,k}&D_{3,m}&D_{3,m}&D_{3,n}&D_{3,n}&D_{3,p}\\jD_{3,k}&-jD_{3,k}&jD_{3,m}&-jD_{3,m}&jD_{3,n}&-jD_{3,n}&-jD_{3,p}\end{bmatrix},\\\frac{1}{\sqrt{7}\sqrt{2}}\begin{bmatrix}D_{4,k}&D_{4,k}&D_{4,m}&D_{4,m}&D_{4,n}&D_{4,n}&D_{4,p}\\jD_{4,k}&-jD_{4,k}&jD_{4,m}&-jD_{4,m}&jD_{4,n}&-jD_{4,n}&-jD_{4,p}\end{bmatrix}\end{array}\right\}$$

In this example, (k,m,n,p)=(1,2,3,4).

A rank 8 first codebook $C_{1,8}$ may include the following four matrices:

$$C_{1,8}=\left\{\begin{array}{l}\frac{1}{\sqrt{8}\sqrt{2}}\begin{bmatrix}D_1&D_1\\D_1&-D_1\end{bmatrix},\frac{1}{\sqrt{8}\sqrt{2}}\begin{bmatrix}D_2&D_2\\D_2&-D_2\end{bmatrix},\\\frac{1}{\sqrt{8}\sqrt{2}}\begin{bmatrix}D_3&D_3\\jD_3&-jD_3\end{bmatrix},\frac{1}{\sqrt{8}\sqrt{2}}\begin{bmatrix}D_4&D_4\\jD_4&-jD_4\end{bmatrix}\end{array}\right\}$$

Codebook $C_2$

The second codebook $C_2$ may be the same as in suggestion 1.

Suggestion 3: Maximum 4-Bit Codebook for Each Rank for $W_1$

Suggestion 3 relates to the structure of $W_1W_2$. In suggestion 3, the first codebook $C_1$ for rank r where r=1, 2 may include 16 elements, the first codebook $C_1$ for rank r where r=3, 4 may include eight elements, and the first codebook $C_1$ for rank r where r=5, 6, 7, 8 may include four elements.

The above 64 entries may be divided into four subsets each including 16 entries. To indicate one of the subsets, two bits may be used. The two bits may indicate a rank corresponding to the selected subset among rank 1, rank 2, rank 3-4, and rank 5-8.

Codebook $C_1$

The first codebook $C_1$ for rank r may be indicated as $C_{1,r}$.

A first codebook $C_{1(1,2)}$ for ranks 1 and 2 may be obtained by the following matrices:

$$B = [\, b_0 \;\; b_1 \;\; \ldots \;\; b_{31} \,],$$

$$[B]_{1+m,1+n} = e^{\frac{j2\pi mn}{32}},$$

$$m = 0, 1, 2, 3, n = 0, 1, \ldots 31$$

$$X^{(k)} \in \left\{ \begin{matrix} \frac{1}{2}[b_{2k \bmod 32} \;\; b_{(2k+1) \bmod 32} \;\; b_{(2k+2) \bmod 32} \;\; b_{(2k+3) \bmod 32}] \\ : k = 0, 1, \ldots, 15 \end{matrix} \right\}$$

$$W_1^{(k)} = \begin{bmatrix} X^{(k)} & 0 \\ 0 & X^{(k)} \end{bmatrix}$$

$$C_{1,(1,2)} = \{W_1^{(0)}, W_1^{(1)}, W_1^{(2)}, \ldots, W_1^{(15)}\}$$

In this example, $[B]_{1+m,1+n}$ indicates an element present in an $(1+m)^{th}$ row and an $(1+n)^{th}$ column among elements belonging to B, and $b_z$(z=0, 1, 2, . . . , 31) corresponds to a $z^{th}$ column vector of the matrix B, and a mod b denotes a remainder when a is divided by b.

A first codebook $C_{1(3,4)}$ for ranks 3 and 4 may be obtained by the following matrices:

$$B = [\, b_0 \;\; b_1 \;\; \ldots \;\; b_{31} \,],$$

$$[B]_{1+m,1+n} = e^{j\frac{2\pi mn}{32}},$$

$$m = 0, 1, 2, 3, n = 0, 1, \ldots 31$$

$$X^{(k)} \in \left\{ \begin{matrix} \frac{1}{2}[b_{4k \bmod 32} \;\; b_{(4k+1) \bmod 32} \;\; \ldots \;\; b_{(4k+7) \bmod 32}] \\ : k = 0, 1, 2, 3, 4, 5, 6, 7 \end{matrix} \right\}$$

$$W_1^{(k)} = \begin{bmatrix} X^{(k)} & 0 \\ 0 & X^{(k)} \end{bmatrix}$$

$$C_{1,(3,4)} = \{W_1^{(0)}, W_1^{(1)}, W_1^{(2)}, \ldots, W_1^{(7)}\}$$

A first codebook $C_{1(5,6,7,8)}$ for ranks 5, 6,7, and 8 may be obtained by the following matrices:

$$X^{(0)} = \frac{1}{2} \times \begin{bmatrix} 1 & 1 & 1 & 1 \\ 1 & j & -1 & -j \\ 1 & -1 & 1 & -1 \\ 1 & -j & -1 & j \end{bmatrix},$$

$$X^{(1)} = \text{diag}\{1, e^{j\pi/4}, j, e^{j3\pi/4}\}X^{(0)},$$

$$X^{(2)} = \text{diag}\{1, e^{j\pi/8}, e^{j2\pi/8}, e^{j3\pi/8}\}X^{(0)},$$

$$X^{(3)} = \text{diag}\{1, e^{j3\pi/8}, e^{j6\pi/8}, e^{j9\pi/8}\}X^{(0)}$$

$$W_1^{(k)} = \left\{ \begin{bmatrix} X^{(k)} & 0 \\ 0 & X^{(k)} \end{bmatrix} \right\}, k = 0, 1, 2, 3$$

$$C_{1,(5,6,7,8)} = \{W_1^{(0)}, W_1^{(1)}, W_1^{(2)}, W_1^{(3)}\}$$

Codebook $C_2$

The second codebook $C_2$ for rank r may be indicated as $C_{2,r}$.

A second codebook $C_{2,1}$ for rank 1 may be expressed by:

$$C_{2,1} = \left\{ \frac{1}{\sqrt{2}}\begin{bmatrix} Y \\ Y \end{bmatrix}, \frac{1}{\sqrt{2}}\begin{bmatrix} Y \\ jY \end{bmatrix}, \frac{1}{\sqrt{2}}\begin{bmatrix} Y \\ -Y \end{bmatrix}, \frac{1}{\sqrt{2}}\begin{bmatrix} Y \\ -jY \end{bmatrix} \right\}$$

-continued $$Y \in \{\tilde{e}_1, \tilde{e}_2, \tilde{e}_3, \tilde{e}_4\}$$

A second codebook $C_{2,2}$ for rank 2 may be expressed by:

$$C_{2,2} = \left\{ \frac{1}{\sqrt{2}\sqrt{2}}\begin{bmatrix} Y_1 & Y_2 \\ Y_1 & -Y_2 \end{bmatrix}, \frac{1}{\sqrt{2}\sqrt{2}}\begin{bmatrix} Y_1 & Y_2 \\ jY_1 & -jY_2 \end{bmatrix} \right\}$$

$$(Y_1, Y_2) \in \left\{ \begin{matrix} (\tilde{e}_1, \tilde{e}_1), (\tilde{e}_2, \tilde{e}_2), (\tilde{e}_3, \tilde{e}_3), (\tilde{e}_4, \tilde{e}_4), \\ (\tilde{e}_1, \tilde{e}_2), (\tilde{e}_2, \tilde{e}_3), (\tilde{e}_1, \tilde{e}_4), (\tilde{e}_2, \tilde{e}_4) \end{matrix} \right\}$$

In this example, $\tilde{e}_n$ corresponds to a 4×1 selection vector. An $n^{th}$ element of $\tilde{e}_n$ may have a value of 1 with respect to ranks 1 and 2 and all of remaining elements may have a value of zero.

A second codebook $C_{2,3}$ for rank 3 may be expressed by $$C_{2,3} = \left\{ \frac{1}{\sqrt{3}\sqrt{2}}\begin{bmatrix} Y_1 & Y_2 \\ Y_1 & -Y_2 \end{bmatrix}, \frac{1}{\sqrt{3}\sqrt{2}}\begin{bmatrix} Y_1 & Y_2 \\ jY_1 & -jY_2 \end{bmatrix} \right\}$$

$$(Y_1, Y_2) \in \left\{ \begin{matrix} (e_1, [e_1 \; e_5]), (e_2, [e_2 \; e_6]), \\ (e_3, [e_3 \; e_7]), (e_4, [e_4 \; e_8]), \\ (e_5, [e_1 \; e_5]), (e_6, [e_2 \; e_6]), \\ (e_7, [e_3 \; e_7]), (e_8, [e_4 \; e_8]) \end{matrix} \right\}$$

A second codebook $C_{2,4}$ for rank 4 may be expressed by $$C_{2,4} = \left\{ \frac{1}{\sqrt{4}\sqrt{2}}\begin{bmatrix} Y & Y \\ Y & -Y \end{bmatrix}, \frac{1}{\sqrt{4}\sqrt{2}}\begin{bmatrix} Y & Y \\ jY & -jY \end{bmatrix} \right\}$$

$$Y \in \{[e_1 \; e_5], [e_2 \; e_6], [e_3 \; e_7], [e_4 \; e_8]\}$$

In this example, $e_n$ corresponds to a 8×1 selection vector. An $n^{th}$ element of $e_n$ may have a value of 1 with respect to ranks 3 and 4, and all of remaining elements may have a value of zero.

A second codebook $C_{2,(5,6,7,8)}$ for ranks 5,6,7, and 8 may be obtained by the following matrices:

$$C_{2,5} = \frac{1}{\sqrt{5}\sqrt{2}}\begin{bmatrix} \tilde{e}_1 & \tilde{e}_1 & \tilde{e}_2 & \tilde{e}_2 & \tilde{e}_3 \\ \tilde{e}_1 & -\tilde{e}_1 & \tilde{e}_2 & -\tilde{e}_2 & -\tilde{e}_3 \end{bmatrix}$$

$$C_{2,6} = \frac{1}{\sqrt{6}\sqrt{2}}\begin{bmatrix} \tilde{e}_1 & \tilde{e}_1 & \tilde{e}_2 & \tilde{e}_2 & \tilde{e}_3 & \tilde{e}_3 \\ \tilde{e}_1 & -\tilde{e}_1 & \tilde{e}_2 & -\tilde{e}_2 & \tilde{e}_3 & -\tilde{e}_3 \end{bmatrix}$$

$$C_{2,7} = \frac{1}{\sqrt{7}\sqrt{2}}\begin{bmatrix} \tilde{e}_1 & \tilde{e}_1 & \tilde{e}_2 & \tilde{e}_2 & \tilde{e}_3 & \tilde{e}_3 & \tilde{e}_4 \\ \tilde{e}_1 & -\tilde{e}_1 & \tilde{e}_2 & -\tilde{e}_2 & \tilde{e}_3 & -\tilde{e}_3 & \tilde{e}_4 \end{bmatrix}$$

$$C_{2,8} = \frac{1}{\sqrt{8}\sqrt{2}}\begin{bmatrix} \tilde{e}_1 & \tilde{e}_1 & \tilde{e}_2 & \tilde{e}_2 & \tilde{e}_3 & \tilde{e}_3 & \tilde{e}_4 & \tilde{e}_4 \\ \tilde{e}_1 & -\tilde{e}_1 & \tilde{e}_2 & -\tilde{e}_2 & \tilde{e}_3 & -\tilde{e}_3 & \tilde{e}_4 & -\tilde{e}_4 \end{bmatrix}$$

In this example, $\tilde{e}_n$ corresponds to a 4×1 selection vector. An $n^{th}$ element of $\tilde{e}_n$ may have a value of 1 with respect to rank 5-8 nd all of remaining elements may have a value of zero.

Hereinafter, digits of the first codebook $C_1$ for $W_1$ and the second codebook $C_2$ for $W_2$ will be described in detail. The overall codebook C for W that is defined by performing inner product between each of codewords of $C_1$ and each of codewords of $C_2$ will be described. That is, one of codewords belonging to the overall codebook C may be a precoding matrix W that is finally used by the transmitter.

Detailed Digits of First Codebook $C_1$

Hereinafter, ans(;,;,n) corresponds to an $n^{th}$ codeword in a first codebook corresponding to a corresponding transmission rank. Each of codewords may include a plurality of column vectors. For example, a first codeword ans(;,;,1) in the first codebook for ranks 1 and 2 may include eight column vectors.

| Rank 1 and 2 | | | |
|---|---|---|---|
| ans(:, :, 1) = | | | |
| columns 1-4 | | | |
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |
| 0 | 0 | 0 | 0 |
| 0 | 0 | 0 | 0 |
| 0 | 0 | 0 | 0 |
| 0 | 0 | 0 | 0 |
| columns 5-8 | | | |
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |
| ans(:, :, 2) = | | | |
| columns 1-4 | | | |
| 0.5000 | 0.5000 | 0.5000 | 0.5000 |
| 0.4619 + 0.1913i | 0.4157 + 0.2778i | 0.3536 + 0.3536i | 0.2778 + 0.4157i |
| 0.3536 + 0.3536i | 0.1913 + 0.4619i | 0.0000 + 0.5000i | −0.1913 + 0.4619i |
| 0.1913 + 0.4619i | −0.0975 + 0.4904i | −0.3536 + 0.3536i | −0.4904 + 0.0975i |
| 0 | 0 | 0 | 0 |
| 0 | 0 | 0 | 0 |
| 0 | 0 | 0 | 0 |
| 0 | 0 | 0 | 0x |
| columns 5-8 | | | |
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.4619 + 0.1913i | 0.4157 + 0.2778i | 0.3536 + 0.3536i | 0.2778 + 0.4157i |
| 0.3536 + 0.3536i | 0.1913 + 0.4619i | 0.0000 + 0.5000i | −0.1913 + 0.4619i |
| 0.3536 + 0.3536i | 0.1913 + 0.4619i | 0.0000 + 0.5000i | −0.1913 + 0.4619i |
| ans(:, :, 3) = | | | |
| columns 1-4 | | | |
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i |
| 0 | 0 | 0 | 0 |
| 0 | 0 | 0 | 0 |
| 0 | 0 | 0 | 0 |
| 0 | 0 | 0 | 0 |
| columns 5-8 | | | |
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i |
| ans(:, :, 4) = | | | |
| columns 1-4 | | | |
| 0.5000 | 0.5000 | 0.5000 | 0.5000 |
| 0.1913 + 0.4619i | 0.0975 + 0.4904i | 0.0000 + 0.5000i | −0.0975 + 0.4904i |
| −0.3536 + 0.3536i | −0.4619 + 0.1913i | −0.5000 + 0.0000i | −0.4619 − 0.1913i |
| −0.4619 − 0.1913i | −0.2778 − 0.4157i | −0.0000 − 0.5000i | 0.2778 − 0.4157i |
| 0 | 0 | 0 | 0 |
| 0 | 0 | 0 | 0 |

-continued

| | | | |
|---|---|---|---|
| 0 | 0 | 0 | 0 |
| 0 | 0 | 0 | 0 |
| columns 5-8 | | | |
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.1913 + 0.4619i | 0.0975 + 0.4904i | 0.0000 + 0.5000i | −0.0975 + 0.4904i |
| −0.3536 + 0.3536i | −0.4619 + 0.1913i | −0.5000 + 0.0000i | −0.4619 − 0.1913i |
| −0.4619 − 0.1913i | −0.2778 − 0.4157i | −0.0000 − 0.5000i | 0.2778 − 0.4157i |
| ans(:, :, 5) = | | | |
| columns 1-4 | | | |
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i |
| 0 | 0 | 0 | 0 |
| 0 | 0 | 0 | 0 |
| 0 | 0 | 0 | 0 |
| 0 | 0 | 0 | 0 |
| columns 5-8 | | | |
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i |
| ans(:, :, 6) = | | | |
| columns 1-4 | | | |
| 0.5000 | 0.5000 | 0.5000 | 0.5000 |
| −0.1913 + 0.4619i | −0.2778 + 0.4157i | −0.3536 + 0.3536i | −0.4157 + 0.2778i |
| −0.3536 − 0.3536i | −0.1913 − 0.4619i | −0.0000 − 0.5000i | 0.1913 − 0.4619i |
| 0.4619 − 0.1913i | 0.4904 + 0.0975i | 0.3536 + 0.3536i | 0.0975 + 0.4904i |
| 0 | 0 | 0 | 0 |
| 0 | 0 | 0 | 0 |
| 0 | 0 | 0 | 0 |
| 0 | 0 | 0 | 0 |
| columns 5-8 | | | |
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.1913 + 0.4619i | −0.2778 + 0.4157i | −0.3536 + 0.3536i | −0.4157 + 0.2778i |
| −0.3536 − 0.3536i | −0.1913 − 0.4619i | −0.0000 − 0.5000i | 0.1913 − 0.4619i |
| 0.4619 − 0.1913i | 0.4904 + 0.0975i | 0.3536 + 0.3536i | 0.0975 + 0.4904i |
| ans(:, :, 7) = | | | |
| columns 1-4 | | | |
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i |
| 0 | 0 | 0 | 0 |
| 0 | 0 | 0 | 0 |
| 0 | 0 | 0 | 0 |
| 0 | 0 | 0 | 0 |
| columns 5-8 | | | |
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i |
| ans(:, :, 8) = | | | |
| columns 1-4 | | | |
| 0.5000 | 0.5000 | 0.5000 | 0.5000 |
| −0.4619 + 0.1913i | −0.4904 + 0.0975i | −0.5000 + 0.0000i | −0.4904 − 0.0975i |

-continued

| | | | |
|---|---|---|---|
| 0.3536 − 0.3536i | 0.4619 − 0.1913i | 0.5000 − 0.0000i | 0.4619 + 0.1913i |
| −0.1913 + 0.4619i | −0.4157 + 0.2778i | −0.5000 + 0.0000i | −0.4157 − 0.2778i |
| 0 | 0 | 0 | 0 |
| 0 | 0 | 0 | 0 |
| 0 | 0 | 0 | 0 |
| 0 | 0 | 0 | 0 |

columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.4619 + 0.1913i | −0.4904 + 0.0975i | −0.5000 + 0.0000i | −0.4904 − 0.0975i |
| 0.3536 − 0.3536i | 0.4619 − 0.1913i | 0.5000 − 0.0000i | 0.4619 + 0.1913i |
| −0.1913 + 0.4619i | −0.4157 + 0.2778i | −0.5000 + 0.0000i | −0.4157 − 0.2778i |

ans(:, :, 9) =
columns 1-4

| | | | |
|---|---|---|---|
| 0.5000 | 0.5000 | 0.5000 | 0.5000 |
| −0.5000 + 0.0000i | −0.4904 − 0.0975i | −0.4619 − 0.1913i | −0.4157 − 0.2778i |
| 0.5000 − 0.0000i | 0.4619 + 0.1913i | 0.3536 + 0.3536i | 0.1913 + 0.4619i |
| −0.5000 + 0.0000i | −0.4157 − 0.2778i | −0.1913 − 0.4619i | 0.0975 − 0.4904i |
| 0 | 0 | 0 | 0 |
| 0 | 0 | 0 | 0 |
| 0 | 0 | 0 | 0 |
| 0 | 0 | 0 | 0 |

columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.5000 + 0.0000i | −0.4904 − 0.0975i | −0.4619 − 0.1913i | −0.4157 − 0.2778i |
| 0.5000 − 0.0000i | 0.4619 + 0.1913i | 0.3536 + 0.3536i | 0.1913 + 0.4619i |
| −0.5000 + 0.0000i | −0.4157 − 0.2778i | −0.1913 − 0.4619i | 0.0975 − 0.4904i |

ans(:, :, 10) =
columns 1-4

| | | | |
|---|---|---|---|
| 0.5000 | 0.5000 | 0.5000 | 0.5000 |
| −0.4619 − 0.1913i | −0.4157 − 0.2778i | −0.3536 − 0.3536i | −0.2778 − 0.4157i |
| 0.3536 + 0.3536i | 0.1913 + 0.4619i | 0.0000 + 0.5000i | −0.1913 + 0.4619i |
| −0.1913 − 0.4619i | 0.0975 − 0.4904i | 0.3536 − 0.3536i | 0.4904 − 0.0975i |
| 0 | 0 | 0 | 0 |
| 0 | 0 | 0 | 0 |
| 0 | 0 | 0 | 0 |
| 0 | 0 | 0 | 0 |

columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.4619 − 0.1913i | −0.4157 − 0.2778i | −0.3536 − 0.3536i | −0.2778 − 0.4157i |
| 0.3536 + 0.3536i | 0.1913 + 0.4619i | 0.0000 + 0.5000i | −0.1913 + 0.4619i |
| −0.1913 − 0.4619i | 0.0975 − 0.4904i | 0.3536 − 0.3536i | 0.4904 − 0.0975i |

ans(:, :, 11) =
columns 1-4

| | | | |
|---|---|---|---|
| 0.5000 | 0.5000 | 0.5000 | 0.5000 |
| −0.3536 − 0.3536i | −0.2778 − 0.4157i | −0.1913 − 0.4619i | −0.0975 − 0.4904i |
| 0.0000 + 0.5000i | −0.1913 + 0.4619i | −0.3536 + 0.3536i | −0.4619 + 0.1913i |
| 0.3536 − 0.3536i | 0.4904 − 0.0975i | 0.4619 + 0.1913i | 0.2778 + 0.4157i |
| 0 | 0 | 0 | 0 |
| 0 | 0 | 0 | 0 |
| 0 | 0 | 0 | 0 |
| 0 | 0 | 0 | 0 |

columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.3536 − 0.3536i | −0.2778 − 0.4157i | −0.1913 − 0.4619i | −0.0975 − 0.4904i |
| 0.0000 + 0.5000i | −0.1913 + 0.4619i | −0.3536 + 0.3536i | −0.4619 + 0.1913i |
| 0.3536 − 0.3536i | 0.4904 − 0.0975i | 0.4619 + 0.1913i | 0.2778 + 0.4157i |

-continued ans(:, :, 12) =
columns 1-4

| | | | |
|---|---|---|---|
| 0.5000 | 0.5000 | 0.5000 | 0.5000 |
| −0.1913 − 0.4619i | −0.0975 − 0.4904i | −0.0000 − 0.5000i | 0.0975 − 0.4904i |
| −0.3536 + 0.3536i | −0.4619 + 0.1913i | −0.5000 + 0.0000i | −0.4619 − 0.1913i |
| 0.4619 + 0.1913i | 0.2778 + 0.4157i | 0.0000 + 0.5000i | −0.2778 + 0.4157i |
| 0 | 0 | 0 | 0 |
| 0 | 0 | 0 | 0 |
| 0 | 0 | 0 | 0 |
| 0 | 0 | 0 | 0 |

columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.1913 − 0.4619i | −0.0975 − 0.4904i | −0.0000 − 0.5000i | 0.0975 − 0.4904i |
| −0.3536 + 0.3536i | −0.4619 + 0.1913i | −0.5000 + 0.0000i | −0.4619 − 0.1913i |
| 0.4619 + 0.1913i | 0.2778 + 0.4157i | 0.0000 + 0.5000i | −0.2778 + 0.4157i |

ans(:, :, 13) =
columns 1-4

| | | | |
|---|---|---|---|
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i |
| 0 | 0 | 0 | 0 |
| 0 | 0 | 0 | 0 |
| 0 | 0 | 0 | 0 |
| 0 | 0 | 0 | 0 |

columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i |

ans(:, :, 14) =
columns 1-4

| | | | |
|---|---|---|---|
| 0.5000 | 0.5000 | 0.5000 | 0.5000 |
| 0.1913 − 0.4619i | 0.2778 − 0.4157i | 0.3536 − 0.3536i | 0.4157 − 0.2778i |
| −0.3536 − 0.3536i | −0.1913 − 0.4619i | −0.0000 − 0.5000i | 0.1913 − 0.4619i |
| −0.4619 + 0.1913i | −0.4904 − 0.0975i | −0.3536 − 0.3536i | −0.0975 − 0.4904i |
| 0 | 0 | 0 | 0 |
| 0 | 0 | 0 | 0 |
| 0 | 0 | 0 | 0 |
| 0 | 0 | 0 | 0 |

columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.1913 − 0.4619i | 0.2778 − 0.4157i | 0.3536 − 0.3536i | 0.4157 − 0.2778i |
| −0.3536 − 0.3536i | −0.1913 − 0.4619i | −0.0000 − 0.5000i | 0.1913 − 0.4619i |
| −0.4619 + 0.1913i | −0.4904 − 0.0975i | −0.3536 − 0.3536i | −0.0975 − 0.4904i |

ans(:, :, 15) =
columns 1-4

| | | | |
|---|---|---|---|
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i |
| 0 | 0 | 0 | 0 |
| 0 | 0 | 0 | 0 |
| 0 | 0 | 0 | 0 |
| 0 | 0 | 0 | 0 |

columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |

-continued

| | | | |
|---|---|---|---|
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i |

ans(:, :, 16) = columns 1-4

| | | | |
|---|---|---|---|
| 0.5000 | 0.5000 | 0.5000 | 0.5000 |
| 0.4619 − 0.1913i | 0.4904 − 0.0975i | 0.5000 | 0.4904 + 0.0975i |
| 0.3536 − 0.3536i | 0.4619 − 0.1913i | 0.5000 | 0.4619 + 0.1913i |
| 0.1913 − 0.4619i | 0.4157 − 0.2778i | 0.5000 | 0.4157 + 0.2778i |
| 0 | 0 | 0 | 0 |
| 0 | 0 | 0 | 0 |
| 0 | 0 | 0 | 0 |
| 0 | 0 | 0 | 0 |

columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.4619 − 0.1913i | 0.4904 − 0.0975i | 0.5000 | 0.4904 + 0.0975i |
| 0.3536 − 0.3536i | 0.4619 − 0.1913i | 0.5000 | 0.4619 + 0.1913i |
| 0.1913 − 0.4619i | 0.4157 − 0.2778i | 0.5000 | 0.4157 + 0.2778i |

Rank 3 and 4 ans(:, :, 1) =

Columns 1 through 4

| | | | |
|---|---|---|---|
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i |

ans(:, :, 2) =

Columns 1 through 4

| | | | |
|---|---|---|---|
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i |
| 0 | 0 | 0 | 0 |
| 0 | 0 | 0 | 0 |
| 0 | 0 | 0 | 0 |
| 0 | 0 | 0 | 0 |

-continued

Columns 5 through 8

| | | | |
|---|---|---|---|
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i |

ans(:, :, 3) =

Columns 1 through 4

| | | | |
|---|---|---|---|
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i |

ans(:, :, 4) =

Columns 1 through 4

| | | | |
|---|---|---|---|
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i |
| 0 | 0 | 0 | 0 |
| 0 | 0 | 0 | 0 |

-continued

| | | | |
|---|---|---|---|
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| −0.5000 + 0.0000i | −0.4904 − 0.0975i | −0.4619 − 0.1913i | −0.4157 − 0.2778i |
| 0.5000 − 0.0000i | 0.4619 + 0.1913i | 0.3536 + 0.3536i | 0.1913 + 0.4619i |
| −0.5000 + 0.0000i | −0.4157 − 0.2778i | −0.1913 − 0.4619i | 0.0975 − 0.4904i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.5000 + 0.0000i | −0.4904 − 0.0975i | −0.4619 − 0.1913i | −0.4157 − 0.2778i |
| 0.5000 − 0.0000i | 0.4619 + 0.1913i | 0.3536 + 0.3536i | 0.1913 + 0.4619i |
| −0.5000 + 0.0000i | −0.4157 − 0.2778i | −0.1913 − 0.4619i | 0.0975 − 0.4904i |

ans(:, :, 5) =

Columns 1 through 4

| | | | |
|---|---|---|---|
| 0.5000 | 0.5000 | 0.5000 | 0.5000 |
| −0.5000 + 0.0000i | −0.4904 − 0.0975i | −0.4619 − 0.1913i | −0.4157 − 0.2778i |
| 0.5000 − 0.0000i | 0.4619 + 0.1913i | 0.3536 + 0.3536i | 0.1913 + 0.4619i |
| −0.5000 + 0.0000i | −0.4157 − 0.2778i | −0.1913 − 0.4619i | 0.0975 − 0.4904i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| −0.3536 − 0.3536i | −0.2778 − 0.4157i | −0.1913 − 0.4619i | −0.0975 − 0.4904i |
| 0.0000 + 0.5000i | −0.1913 + 0.4619i | −0.3536 + 0.3536i | −0.4619 + 0.1913i |
| 0.3536 − 0.3536i | 0.4904 − 0.0975i | 0.4619 + 0.1913i | 0.2778 + 0.4157i |
| 0 | 0 | 0 | 0 |
| 0 | 0 | 0 | 0 |
| 0 | 0 | 0 | 0 |
| 0 | 0 | 0 | 0 |

Columns 9 through 12

| | | |
|---|---|---|
| 0 | 0 | 0 |
| 0 | 0 | 0 |
| 0 | 0 | 0 |
| 0 | 0 | 0 |
| 0.5000 | 0.5000 | 0.5000 |
| −0.5000 + 0.0000i | −0.4904 − 0.0975i | −0.4619 − 0.1913i |
| 0.5000 − 0.0000i | 0.4619 + 0.1913i | 0.3536 + 0.3536i |
| −0.5000 + 0.0000i | −0.4157 − 0.2778i | −0.1913 − 0.4619i |

Columns 13 through 16

| | | | | |
|---|---|---|---|---|
| 0 | 0 | 0 | 0 | |
| 0 | 0 | 0 | 0 | |
| 0 | 0 | 0 | 0 | |
| 0 | 0 | 0 | 0 | |
| 0.5000 | 0.5000 | 0.5000 | 0.5000 | 0.5000 |
| −0.4157 − 0.2778i | −0.3536 − 0.3536i | −0.2778 − 0.4157i | −0.1913 − 0.4619i | −0.0975 − 0.4904i |
| 0.1913 + 0.4619i | 0.0000 + 0.5000i | −0.1913 + 0.4619i | −0.3536 + 0.3536i | −0.4619 + 0.1913i |
| 0.0975 − 0.4904i | 0.3536 − 0.3536i | 0.4904 − 0.0975i | 0.4619 + 0.1913i | 0.2778 + 0.4157i |

ans(:, :, 6) =

Columns 1 through 4

| | | | |
|---|---|---|---|
| 0.5000 | 0.5000 | 0.5000 | 0.5000 |
| −0.3536 − 0.3536i | −0.2778 − 0.4157i | −0.1913 − 0.4619i | −0.0975 − 0.4904i |
| 0.0000 + 0.5000i | −0.1913 + 0.4619i | −0.3536 + 0.3536i | −0.4619 + 0.1913i |
| 0.3536 − 0.3536i | 0.4904 − 0.0975i | 0.4619 + 0.1913i | 0.2778 + 0.4157i |

-continued

| | | | |
|---|---|---|---|
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.3536 − 0.3536i | −0.2778 − 0.4157i | −0.1913 − 0.4619i | −0.0975 − 0.4904i |
| 0.0000 + 0.5000i | −0.1913 + 0.4619i | −0.3536 + 0.3536i | −0.4619 + 0.1913i |
| 0.3536 − 0.3536i | 0.4904 − 0.0975i | 0.4619 + 0.1913i | 0.2778 + 0.4157i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i |

ans(:, :, 7) =

Columns 1 through 4

| | | | |
|---|---|---|---|
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i |

ans(:, :, 8) =

Columns 1 through 4

| | | | |
|---|---|---|---|
| 0.5000 | 0.5000 | 0.5000 | 0.5000 |
| 0.3536 − 0.3536i | 0.4157 − 0.2778i | 0.4619 − 0.1913i | 0.4904 − 0.0975i |

-continued

| | | | |
|---|---|---|---|
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |

Rank 5 and 6 and 7 and 8 ans(:, :, 1) =

Columns 1 through 4

| | | | |
|---|---|---|---|
| 0.5000 | 0.5000 | 0.5000 | 0.5000 |
| 0.5000 | 0 + 0.5000i | −0.5000 | 0 − 0.5000i |
| 0.5000 | −0.5000 | 0.5000 | −0.5000 |
| 0.5000 | 0 − 0.5000i | −0.5000 | 0 + 0.5000i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.5000 | 0 + 0.5000i | −0.5000 | 0 − 0.5000i |
| 0.5000 | −0.5000 | 0.5000 | −0.5000 |
| 0.5000 | 0 − 0.5000i | −0.5000 | 0 + 0.5000i |

ans(:, :, 2) =

Columns 1 through 4

| | | | |
|---|---|---|---|
| 0.5000 | 0.5000 | 0.5000 | 0.5000 |
| 0.3536 + 0.3536i | −0.3536 + 0.3536i | −0.3536 − 0.3536i | 0.3536 − 0.3536i |
| 0.0000 + 0.5000i | −0.0000 − 0.5000i | 0.0000 + 0.5000i | −0.0000 − 0.5000i |
| −0.3536 + 0.3536i | 0.3536 + 0.3536i | 0.3536 − 0.3536i | −0.3536 − 0.3536i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 + 0.3536i | −0.3536 + 0.3536i | −0.3536 − 0.3536i | 0.3536 − 0.3536i |

-continued

| | | | |
|---|---|---|---|
| 0.0000 + 0.5000i | −0.0000 − 0.5000i | 0.0000 + 0.5000i | −0.0000 − 0.5000i |
| −0.3536 + 0.3536i | 0.3536 + 0.3536i | 0.3536 − 0.3536i | −0.3536 − 0.3536i |

ans(:, :, 3) =

Columns 1 through 4

| | | | |
|---|---|---|---|
| 0.5000 | 0.5000 | 0.5000 | 0.5000 |
| 0.4619 + 0.1913i | −0.1913 + 0.4619i | −0.4619 − 0.1913i | 0.1913 − 0.4619i |
| 0.3536 + 0.3536i | −0.3536 − 0.3536i | 0.3536 + 0.3536i | −0.3536 − 0.3536i |
| 0.1913 + 0.4619i | 0.4619 − 0.1913i | −0.1913 − 0.4619i | −0.4619 + 0.1913i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.4619 + 0.1913i | −0.1913 + 0.4619i | −0.4619 − 0.1913i | 0.1913 − 0.4619i |
| 0.3536 + 0.3536i | −0.3536 − 0.3536i | 0.3536 + 0.3536i | −0.3536 − 0.3536i |
| 0.1913 + 0.4619i | 0.4619 − 0.1913i | −0.1913 − 0.4619i | −0.4619 + 0.1913i |

ans(:, :, 4) =

Columns 1 through 4

| | | | |
|---|---|---|---|
| 0.5000 | 0.5000 | 0.5000 | 0.5000 |
| 0.1913 + 0.4619i | −0.4619 + 0.1913i | −0.1913 − 0.4619i | 0.4619 − 0.1913i |
| −0.3536 + 0.3536i | 0.3536 − 0.3536i | −0.3536 + 0.3536i | 0.3536 − 0.3536i |
| −0.4619 − 0.1913i | −0.1913 + 0.4619i | 0.4619 + 0.1913i | 0.1913 − 0.4619i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.1913 + 0.4619i | −0.4619 + 0.1913i | −0.1913 − 0.4619i | 0.4619 − 0.1913i |
| −0.3536 + 0.3536i | 0.3536 − 0.3536i | −0.3536 + 0.3536i | 0.3536 − 0.3536i |
| −0.4619 − 0.1913i | −0.1913 + 0.4619i | 0.4619 + 0.1913i | 0.1913 − 0.4619i |

Detailed Digits of Second Codebook $C_2$

Hereinafter, digits of codewords belonging to the second codebook $C_2$ for a variety of ranks will be described in detail. (;,;,n) corresponds to an $n^{th}$ codeword in a second codebook corresponding to a corresponding transmission rank. Each of codewords may include at least one column vector.

| Rank 1 |
|---|
| (:, :, 1) = |
| 0.7071 |
| 0 |
| 0 |
| 0 |
| 0.7071 |
| 0 |
| 0 |
| 0 |
| (:, :, 2) = |
| 0.7071 |
| 0 |
| 0 |
| 0 |
| 0 + 0.7071i |
| 0 |
| 0 |
| 0 |

-continued

| Rank 1 |
|---|
| (:, :, 3) = |
| 0.7071 |
| 0 |
| 0 |
| 0 |
| −0.7071 |
| 0 |
| 0 |
| 0 |
| (:, :, 4) = |
| 0.7071 |
| 0 |
| 0 |
| 0 |
| 0 − 0.7071i |
| 0 |
| 0 |
| 0 |
| (:, :, 5) = |
| 0 |
| 0.7071 |
| 0 |
| 0 |
| 0 |
| 0.7071 |

-continued

| Rank 1 |
| --- |
| 0<br>0<br>(:, :, 6) = |
| 0<br>0.7071<br>0<br>0<br>0<br>0 + 0.7071i<br>0<br>0<br>(:, :, 7) = |
| 0<br>0.7071<br>0<br>0<br>0<br>−0.7071<br>0<br>0<br>(:, :, 8) = |
| 0<br>0.7071<br>0<br>0<br>0<br>0 − 0.7071i<br>0<br>0<br>(:, :, 9) = |
| 0<br>0<br>0.7071<br>0<br>0<br>0<br>0.7071<br>0<br>(:, :, 10) = |
| 0<br>0<br>0.7071<br>0<br>0<br>0<br>0 + 0.7071i<br>0<br>(:, :, 11) = |
| 0<br>0<br>0.7071<br>0<br>0<br>0<br>−0.7071<br>0<br>(:, :, 12) = |
| 0<br>0<br>0.7071<br>0<br>0<br>0<br>0 − 0.7071i<br>0<br>(:, :, 13) = |
| 0<br>0<br>0<br>0.7071 |

-continued

| Rank 1 |
| --- |
| 0<br>0<br>0<br>0.7071<br>(:, :, 14) = |
| 0<br>0<br>0<br>0.7071<br>0<br>0<br>0<br>0 + 0.7071i<br>(:, :, 15) = |
| 0<br>0<br>0<br>0.7071<br>0<br>0<br>0<br>−0.7071<br>(:, :, 16) = |
| 0<br>0<br>0<br>0.7071<br>0<br>0<br>0<br>0 − 0.7071i |

| Rank 2 | |
| --- | --- |
| (:, :, 1) = | |
| 0.5000 | 0.5000 |
| 0 | 0 |
| 0 | 0 |
| 0 | 0 |
| 0.5000 | −0.5000 |
| 0 | 0 |
| 0 | 0 |
| 0 | 0 |
| (:, :, 2) = | |
| 0.5000 | 0.5000 |
| 0 | 0 |
| 0 | 0 |
| 0 | 0 |
| 0 + 0.5000i | 0 − 0.5000i |
| 0 | 0 |
| 0 | 0 |
| 0 | 0 |
| (:, :, 3) = | |
| 0 | 0 |
| 0.5000 | 0.5000 |
| 0 | 0 |
| 0 | 0 |
| 0 | 0 |
| 0.5000 | −0.5000 |
| 0 | 0 |
| 0 | 0 |
| (:, :, 4) = | |
| 0 | 0 |
| 0.5000 | 0.5000 |
| 0 | 0 |
| 0 | 0 |

-continued

| Rank 2 | |
|---|---|
| 0 | 0 |
| 0 + 0.5000i | 0 − 0.5000i |
| 0 | 0 |
| 0 | 0 |
| (:, :, 5) = | |
| 0 | 0 |
| 0 | 0 |
| 0.5000 | 0.5000 |
| 0 | 0 |
| 0 | 0 |
| 0 | 0 |
| 0.5000 | −0.5000 |
| 0 | 0 |
| (:, :, 6) = | |
| 0 | 0 |
| 0 | 0 |
| 0.5000 | 0.5000 |
| 0 | 0 |
| 0 | 0 |
| 0 | 0 |
| 0 + 0.5000i | 0 − 0.5000i |
| 0 | 0 |
| (:, :, 7) = | |
| 0 | 0 |
| 0 | 0 |
| 0 | 0 |
| 0.5000 | 0.5000 |
| 0 | 0 |
| 0 | 0 |
| 0 | 0 |
| 0.5000 | −0.5000 |
| (:, :, 8) = | |
| 0 | 0 |
| 0 | 0 |
| 0 | 0 |
| 0.5000 | 0.5000 |
| 0 | 0 |
| 0 | 0 |
| 0 | 0 |
| 0 + 0.5000i | 0 − 0.5000i |
| (:, :, 9) = | |
| 0.5000 | 0 |
| 0 | 0.5000 |
| 0 | 0 |
| 0 | 0 |
| 0.5000 | 0 |
| 0 | −0.5000 |
| 0 | 0 |
| 0 | 0 |
| (:, :, 10) = | |
| 0.5000 | 0 |
| 0 | 0.5000 |
| 0 | 0 |
| 0 | 0 |
| 0 + 0.5000i | 0 |
| 0 | 0 − 0.5000i |
| 0 | 0 |
| 0 | 0 |
| (:, :, 11) = | |
| 0 | 0 |
| 0.5000 | 0 |
| 0 | 0.5000 |
| 0 | 0 |
| 0 | 0 |
| 0.5000 | 0 |
| 0 | −0.5000 |
| 0 | 0 |
| (:, :, 12) = | |
| 0 | 0 |
| 0.5000 | 0 |

-continued

| Rank 2 | |
|---|---|
| 0 | 0.5000 |
| 0 | 0 |
| 0 | 0 |
| 0 + 0.5000i | 0 |
| 0 | 0 − 0.5000i |
| 0 | 0 |
| (:, :, 13) = | |
| 0.5000 | 0 |
| 0 | 0 |
| 0 | 0 |
| 0 | 0.5000 |
| 0.5000 | 0 |
| 0 | 0 |
| 0 | 0 |
| 0 | −0.5000 |
| (:, :, 14) = | |
| 0.5000 | 0 |
| 0 | 0 |
| 0 | 0 |
| 0 | 0.5000 |
| 0 + 0.5000i | 0 |
| 0 | 0 |
| 0 | 0 |
| 0 | 0 − 0.5000i |
| (:, :, 15) = | |
| 0 | 0 |
| 0.5000 | 0 |
| 0 | 0 |
| 0 | 0.5000 |
| 0 | 0 |
| 0.5000 | 0 |
| 0 | 0 |
| 0 | −0.5000 |
| (:, :, 16) = | |
| 0 | 0 |
| 0.5000 | 0 |
| 0 | 0 |
| 0 | 0.5000 |
| 0 | 0 |
| 0 + 0.5000i | 0 |
| 0 | 0 |
| 0 | 0 − 0.5000i |

| Rank 3 | | |
|---|---|---|
| (:, :, 1) = | | |
| 0.4082 | 0.4082 | 0 |
| 0 | 0 | 0 |
| 0 | 0 | 0 |
| 0 | 0 | 0 |
| 0 | 0 | 0.4082 |
| 0 | 0 | 0 |
| 0 | 0 | 0 |
| 0 | 0 | 0 |
| 0.4082 | −0.4082 | 0 |
| 0 | 0 | 0 |
| 0 | 0 | 0 |
| 0 | 0 | 0 |
| 0 | 0 | −0.4082 |
| 0 | 0 | 0 |
| 0 | 0 | 0 |
| 0 | 0 | 0 |
| (:, :, 2) = | | |
| 0 | 0 | 0 |
| 0 | 0 | 0 |
| 0 | 0 | 0 |
| 0 | 0 | 0 |

-continued

| Rank 3 | | |
|---|---|---|
| 0.4082 | 0 | 0.4082 |
| 0 | 0 | 0 |
| 0 | 0 | 0 |
| 0 | 0 | 0 |
| 0 | −0.4082 | 0 |
| 0 | 0 | 0 |
| 0 | 0 | 0 |
| 0 | 0 | 0 |
| 0.4082 | 0 | −0.4082 |
| 0 | 0 | 0 |
| 0 | 0 | 0 |
| 0 | 0 | 0 |
| | (:, :, 3) = | |
| 0 | 0 | 0 |
| 0 | 0 | 0 |
| 0 | 0 | 0 |
| 0 | 0 | 0 |
| 0 | 0.4082 | 0.4082 |
| 0 | 0 | 0 |
| 0 | 0 | 0 |
| 0 | 0 | 0 |
| 0.4082 | 0 | 0 |
| 0 | 0 | 0 |
| 0 | 0 | 0 |
| 0 | 0 | 0 |
| 0 | 0.4082 | −0.4082 |
| 0 | 0 | 0 |
| 0 | 0 | 0 |
| 0 | 0 | 0 |
| | (:, :, 4) = | |
| 0 | 0.4082 | 0.4082 |
| 0 | 0 | 0 |
| 0 | 0 | 0 |
| 0 | 0 | 0 |
| 0.4082 | 0 | 0 |
| 0 | 0 | 0 |
| 0 | 0 | 0 |
| 0 | 0 | 0 |
| 0 | 0.4082 | −0.4082 |
| 0 | 0 | 0 |
| 0 | 0 | 0 |
| 0 | 0 | 0 |
| 0.4082 | 0 | 0 |
| 0 | 0 | 0 |
| 0 | 0 | 0 |
| 0 | 0 | 0 |
| | (:, :, 5) = | |
| 0 | 0 | 0 |
| 0.4082 | 0.4082 | 0 |
| 0 | 0 | 0 |
| 0 | 0 | 0 |
| 0 | 0 | 0 |
| 0 | 0 | 0.4082 |
| 0 | 0 | 0 |
| 0 | 0 | 0 |
| 0 | 0 | 0 |
| 0.4082 | −0.4082 | 0 |
| 0 | 0 | 0 |
| 0 | 0 | 0 |
| 0 | 0 | 0 |
| 0 | 0 | −0.4082 |
| 0 | 0 | 0 |
| 0 | 0 | 0 |
| | (:, :, 6) = | |
| 0 | 0 | 0 |
| 0 | 0.4082 | 0 |
| 0 | 0 | 0 |
| 0 | 0 | 0 |
| 0 | 0 | 0 |
| 0.4082 | 0 | 0.4082 |
| 0 | 0 | 0 |
| 0 | 0 | 0 |
| 0 | 0 | 0 |
| 0 | −0.4082 | 0 |

-continued

| Rank 3 | | |
|---|---|---|
| 0 | 0 | 0 |
| 0 | 0 | 0 |
| 0 | 0 | 0 |
| 0.4082 | 0 | −0.4082 |
| 0 | 0 | 0 |
| 0 | 0 | 0 |
| | (:, :, 7) = | |
| 0 | 0 | 0 |
| 0.4082 | 0 | 0 |
| 0 | 0 | 0 |
| 0 | 0 | 0 |
| 0 | 0 | 0 |
| 0 | 0.4082 | 0.4082 |
| 0 | 0 | 0 |
| 0 | 0 | 0 |
| 0 | 0 | 0 |
| 0.4082 | 0 | 0 |
| 0 | 0 | 0 |
| 0 | 0 | 0 |
| 0 | 0 | 0 |
| 0 | 0.4082 | −0.4082 |
| 0 | 0 | 0 |
| 0 | 0 | 0 |
| | (:, :, 8) = | |
| 0 | 0 | 0 |
| 0 | 0.4082 | 0.4082 |
| 0 | 0 | 0 |
| 0 | 0 | 0 |
| 0 | 0 | 0 |
| 0.4082 | 0 | 0 |
| 0 | 0 | 0 |
| 0 | 0 | 0 |
| 0 | 0 | 0 |
| 0 | 0.4082 | −0.4082 |
| 0 | 0 | 0 |
| 0 | 0 | 0 |
| 0 | 0 | 0 |
| 0.4082 | 0 | 0 |
| 0 | 0 | 0 |
| 0 | 0 | 0 |
| | (:, :, 9) = | |
| 0 | 0 | 0 |
| 0 | 0 | 0 |
| 0.4082 | 0.4082 | 0 |
| 0 | 0 | 0 |
| 0 | 0 | 0 |
| 0 | 0 | 0 |
| 0 | 0 | 0.4082 |
| 0 | 0 | 0 |
| 0 | 0 | 0 |
| 0 | 0 | 0 |
| 0.4082 | −0.4082 | 0 |
| 0 | 0 | 0 |
| 0 | 0 | 0 |
| 0 | 0 | 0 |
| 0 | 0 | −0.4082 |
| 0 | 0 | 0 |
| | (:, :, 10) = | |
| 0 | 0 | 0 |
| 0 | 0 | 0 |
| 0 | 0.4082 | 0 |
| 0 | 0 | 0 |
| 0 | 0 | 0 |
| 0 | 0 | 0 |
| 0.4082 | 0 | 0.4082 |
| 0 | 0 | 0 |
| 0 | 0 | 0 |
| 0 | 0 | 0 |
| 0 | −0.4082 | 0 |
| 0 | 0 | 0 |
| 0 | 0 | 0 |
| 0 | 0 | 0 |
| 0.4082 | 0 | −0.4082 |
| 0 | 0 | 0 |

-continued

Rank 3

(:, :, 11) =

| | | |
|---|---|---|
| 0 | 0 | 0 |
| 0 | 0 | 0 |
| 0.4082 | 0 | 0 |
| 0 | 0 | 0 |
| 0 | 0 | 0 |
| 0 | 0 | 0 |
| 0 | 0.4082 | 0.4082 |
| 0 | 0 | 0 |
| 0 | 0 | 0 |
| 0 | 0 | 0 |
| 0.4082 | 0 | 0 |
| 0 | 0 | 0 |
| 0 | 0 | 0 |
| 0 | 0 | 0 |
| 0 | 0.4082 | −0.4082 |
| 0 | 0 | 0 |

(:, :, 12) =

| | | |
|---|---|---|
| 0 | 0 | 0 |
| 0 | 0 | 0 |
| 0 | 0.4082 | 0.4082 |
| 0 | 0 | 0 |
| 0 | 0 | 0 |
| 0 | 0 | 0 |
| 0.4082 | 0 | 0 |
| 0 | 0 | 0 |
| 0 | 0 | 0 |
| 0 | 0 | 0 |
| 0 | 0.4082 | −0.4082 |
| 0 | 0 | 0 |
| 0 | 0 | 0 |
| 0 | 0 | 0 |
| 0.4082 | 0 | 0 |
| 0 | 0 | 0 |

(:, :, 13) =

| | | |
|---|---|---|
| 0 | 0 | 0 |
| 0 | 0 | 0 |
| 0 | 0 | 0 |
| 0.4082 | 0.4082 | 0 |
| 0 | 0 | 0 |
| 0 | 0 | 0 |
| 0 | 0 | 0 |
| 0 | 0 | 0.4082 |
| 0 | 0 | 0 |
| 0 | 0 | 0 |
| 0.4082 | −0.4082 | 0 |
| 0 | 0 | 0 |
| 0 | 0 | 0 |
| 0 | 0 | 0 |
| 0 | 0 | −0.4082 |

(:, :, 14) =

| | | |
|---|---|---|
| 0 | 0 | 0 |
| 0 | 0 | 0 |
| 0 | 0 | 0 |
| 0 | 0.4082 | 0 |
| 0 | 0 | 0 |
| 0 | 0 | 0 |
| 0 | 0 | 0 |
| 0.4082 | 0 | 0.4082 |
| 0 | 0 | 0 |
| 0 | 0 | 0 |
| 0 | 0 | 0 |
| 0 | −0.4082 | 0 |
| 0 | 0 | 0 |
| 0 | 0 | 0 |
| 0 | 0 | 0 |
| 0.4082 | 0 | −0.4082 |

(:, :, 15) =

| | | |
|---|---|---|
| 0 | 0 | 0 |
| 0 | 0 | 0 |
| 0 | 0 | 0 |
| 0.4082 | 0 | 0 |

-continued

Rank 3

| | | |
|---|---|---|
| 0 | 0 | 0 |
| 0 | 0 | 0 |
| 0 | 0 | 0 |
| 0 | 0.4082 | 0.4082 |
| 0 | 0 | 0 |
| 0 | 0 | 0 |
| 0 | 0 | 0 |
| 0.4082 | 0 | 0 |
| 0 | 0 | 0 |
| 0 | 0 | 0 |
| 0 | 0 | 0 |
| 0 | 0.4082 | −0.4082 |

(:, :, 16) =

| | | |
|---|---|---|
| 0 | 0 | 0 |
| 0 | 0 | 0 |
| 0 | 0 | 0 |
| 0 | 0.4082 | 0.4082 |
| 0 | 0 | 0 |
| 0 | 0 | 0 |
| 0 | 0 | 0 |
| 0.4082 | 0 | 0 |
| 0 | 0 | 0 |
| 0 | 0 | 0 |
| 0 | 0 | 0 |
| 0 | 0.4082 | −0.4082 |
| 0 | 0 | 0 |
| 0 | 0 | 0 |
| 0 | 0 | 0 |
| 0.4082 | 0 | 0 |

Rank 4

(:, :, 1) =

| | | | |
|---|---|---|---|
| 0.3536 | 0 | 0.3536 | 0 |
| 0 | 0 | 0 | 0 |
| 0 | 0 | 0 | 0 |
| 0 | 0 | 0 | 0 |
| 0 | 0.3536 | 0 | 0.3536 |
| 0 | 0 | 0 | 0 |
| 0 | 0 | 0 | 0 |
| 0 | 0 | 0 | 0 |
| 0.3536 | 0 | −0.3536 | 0 |
| 0 | 0 | 0 | 0 |
| 0 | 0 | 0 | 0 |
| 0 | 0 | 0 | 0 |
| 0 | 0.3536 | 0 | −0.3536 |
| 0 | 0 | 0 | 0 |
| 0 | 0 | 0 | 0 |
| 0 | 0 | 0 | 0 |

(:, :, 2) =

| | | | |
|---|---|---|---|
| 0.3536 | 0 | 0.3536 | 0 |
| 0 | 0 | 0 | 0 |
| 0 | 0 | 0 | 0 |
| 0 | 0 | 0 | 0 |
| 0 | 0.3536 | 0 | 0.3536 |
| 0 | 0 | 0 | 0 |
| 0 | 0 | 0 | 0 |
| 0 | 0 | 0 | 0 |
| 0 + 0.3536i | 0 | 0 − 0.3536i | 0 |
| 0 | 0 | 0 | 0 |
| 0 | 0 | 0 | 0 |
| 0 | 0 | 0 | 0 |
| 0 | 0 + 0.3536i | 0 | 0 − 0.3536i |
| 0 | 0 | 0 | 0 |
| 0 | 0 | 0 | 0 |
| 0 | 0 | 0 | 0 |

(:, :, 3) =

| | | | |
|---|---|---|---|
| 0 | 0 | 0 | 0 |
| 0.3536 | 0 | 0.3536 | 0 |

-continued

Rank 4

| | | | |
|---|---|---|---|
| 0 | 0 | 0 | 0 |
| 0 | 0 | 0 | 0 |
| 0 | 0 | 0 | 0 |
| 0 | 0.3536 | 0 | 0.3536 |
| 0 | 0 | 0 | 0 |
| 0 | 0 | 0 | 0 |
| 0 | 0 | 0 | 0 |
| 0.3536 | 0 | −0.3536 | 0 |
| 0 | 0 | 0 | 0 |
| 0 | 0 | 0 | 0 |
| 0 | 0 | 0 | 0 |
| 0 | 0.3536 | 0 | −0.3536 |
| 0 | 0 | 0 | 0 |
| 0 | 0 | 0 | 0 |

(:, :, 4) =

| | | | |
|---|---|---|---|
| 0 | 0 | 0 | 0 |
| 0.3536 | 0 | 0.3536 | 0 |
| 0 | 0 | 0 | 0 |
| 0 | 0 | 0 | 0 |
| 0 | 0 | 0 | 0 |
| 0 | 0.3536 | 0 | 0.3536 |
| 0 | 0 | 0 | 0 |
| 0 | 0 | 0 | 0 |
| 0 | 0 | 0 | 0 |
| 0 + 0.3536i | 0 | 0 − 0.3536i | 0 |
| 0 | 0 | 0 | 0 |
| 0 | 0 | 0 | 0 |
| 0 | 0 | 0 | 0 |
| 0 | 0 + 0.3536i | 0 | 0 − 0.3536i |
| 0 | 0 | 0 | 0 |
| 0 | 0 | 0 | 0 |

(:, :, 5) =

| | | | |
|---|---|---|---|
| 0 | 0 | 0 | 0 |
| 0 | 0 | 0 | 0 |
| 0.3536 | 0 | 0.3536 | 0 |
| 0 | 0 | 0 | 0 |
| 0 | 0 | 0 | 0 |
| 0 | 0 | 0 | 0 |
| 0 | 0.3536 | 0 | 0.3536 |
| 0 | 0 | 0 | 0 |
| 0 | 0 | 0 | 0 |
| 0 | 0 | 0 | 0 |
| 0.3536 | 0 | −0.3536 | 0 |
| 0 | 0 | 0 | 0 |
| 0 | 0 | 0 | 0 |
| 0 | 0 | 0 | 0 |
| 0 | 0.3536 | 0 | −0.3536 |
| 0 | 0 | 0 | 0 |

(:, :, 6) =

| | | | |
|---|---|---|---|
| 0 | 0 | 0 | 0 |
| 0 | 0 | 0 | 0 |
| 0.3536 | 0 | 0.3536 | 0 |
| 0 | 0 | 0 | 0 |
| 0 | 0 | 0 | 0 |
| 0 | 0 | 0 | 0 |
| 0 | 0.3536 | 0 | 0.3536 |
| 0 | 0 | 0 | 0 |
| 0 | 0 | 0 | 0 |
| 0 | 0 | 0 | 0 |
| 0 + 0.3536i | 0 | 0 − 0.3536i | 0 |
| 0 | 0 | 0 | 0 |
| 0 | 0 | 0 | 0 |
| 0 | 0 | 0 | 0 |
| 0 | 0 + 0.3536i | 0 | 0 − 0.3536i |
| 0 | 0 | 0 | 0 |

(:, :, 7) =

| | | | |
|---|---|---|---|
| 0 | 0 | 0 | 0 |
| 0 | 0 | 0 | 0 |
| 0 | 0 | 0 | 0 |
| 0.3536 | 0 | 0.3536 | 0 |
| 0 | 0 | 0 | 0 |
| 0 | 0 | 0 | 0 |
| 0 | 0 | 0 | 0 |
| 0 | 0.3536 | 0 | 0.3536 |
| 0 | 0 | 0 | 0 |
| 0 | 0 | 0 | 0 |
| 0 | 0 | 0 | 0 |
| 0.3536 | 0 | −0.3536 | 0 |
| 0 | 0 | 0 | 0 |
| 0 | 0 | 0 | 0 |
| 0 | 0 | 0 | 0 |
| 0 | 0.3536 | 0 | −0.3536 |

(:, :, 8) =

| | | | |
|---|---|---|---|
| 0 | 0 | 0 | 0 |
| 0 | 0 | 0 | 0 |
| 0 | 0 | 0 | 0 |
| 0.3536 | 0 | 0.3536 | 0 |
| 0 | 0 | 0 | 0 |
| 0 | 0 | 0 | 0 |
| 0 | 0 | 0 | 0 |
| 0 | 0.3536 | 0 | 0.3536 |
| 0 | 0 | 0 | 0 |
| 0 | 0 | 0 | 0 |
| 0 | 0 | 0 | 0 |
| 0 + 0.3536i | 0 | 0 − 0.3536i | 0 |
| 0 | 0 | 0 | 0 |
| 0 | 0 | 0 | 0 |
| 0 | 0 | 0 | 0 |
| 0 | 0 + 0.3536i | 0 | 0 − 0.3536i |

Rank 5
(:, :, 1) =

| | | | | |
|---|---|---|---|---|
| 0.3162 | 0.3162 | 0 | 0 | 0 |
| 0 | 0 | 0.3162 | 0.3162 | 0 |
| 0 | 0 | 0 | 0 | 0.3162 |
| 0 | 0 | 0 | 0 | 0 |
| 0.3162 | −0.3162 | 0 | 0 | 0 |
| 0 | 0 | 0.3162 | −0.3162 | 0 |
| 0 | 0 | 0 | 0 | 0.3162 |
| 0 | 0 | 0 | 0 | 0 |

Rank 6
(:, :, 1) =

| | | | | | |
|---|---|---|---|---|---|
| 0.2887 | 0.2887 | 0 | 0 | 0 | 0 |
| 0 | 0 | 0.2887 | 0.2887 | 0 | 0 |
| 0 | 0 | 0 | 0 | 0.2887 | 0.2887 |
| 0 | 0 | 0 | 0 | 0 | 0 |
| 0.2887 | −0.2887 | 0 | 0 | 0 | 0 |
| 0 | 0 | 0.2887 | −0.2887 | 0 | 0 |
| 0 | 0 | 0 | 0 | 0.2887 | −0.2887 |
| 0 | 0 | 0 | 0 | 0 | 0 |

Rank 7
(:, :, 1) = columns 1-4

| | | | |
|---|---|---|---|
| 0.2673 | 0.2673 | 0 | 0 |
| 0 | 0 | 0.2673 | 0.2673 |
| 0 | 0 | 0 | 0 |
| 0 | 0 | 0 | 0 |
| 0.2673 | −0.2673 | 0 | 0 |
| 0 | 0 | 0.2673 | −0.2673 |
| 0 | 0 | 0 | 0 |
| 0 | 0 | 0 | 0 |

-continued

| Rank 7 (:, :, 1) = | | |
|---|---|---|
| columns 5-7 | | |
| 0 | 0 | 0 |
| 0 | 0 | 0 |
| 0.2673 | 0.2673 | 0 |
| 0 | 0 | 0.2673 |
| 0 | 0 | 0 |
| 0 | 0 | 0 |
| 0.2673 | −0.2673 | 0 |
| 0 | 0 | 0.2673 |

| Rank 8 (:, :, 1) = | | | |
|---|---|---|---|
| columns 1-4 | | | |
| 0.2500 | 0.2500 | 0 | 0 |
| 0 | 0 | 0.2500 | 0.2500 |
| 0 | 0 | 0 | 0 |
| 0 | 0 | 0 | 0 |
| 0.2500 | −0.2500 | 0 | 0 |
| 0 | 0 | 0.2500 | −0.2500 |
| 0 | 0 | 0 | 0 |
| 0 | 0 | 0 | 0 |
| columns 5-8 | | | |
| 0 | 0 | 0 | 0 |
| 0 | 0 | 0 | 0 |
| 0.2500 | 0.2500 | 0 | 0 |
| 0 | 0 | 0.2500 | 0.2500 |
| 0 | 0 | 0 | 0 |
| 0 | 0 | 0 | 0 |
| 0.2500 | −0.2500 | 0 | 0 |
| 0 | 0 | 0.2500 | −0.2500 |

Detailed Digits of Overall Codebook C

A final precoding matrix candidate may be induced by performing inner product with respect to one of codewords belonging to the first codebook $C_1$ and one of codewords belonging to the second codebook $C_2$. That is, the receiver may select a single codeword from the codewords belonging to the first codebook $C_1$ and may select a single codeword from the codewords belonging to the second codebook $C_2$. A combination of the selected two codewords may indicate one of codewords belonging to the overall codebook C, which is described below.

Hereinafter, ans(;,;m,n) for rank r may indicate an inter product between ans(;,;m) in the first codebook $C_1$ for rank r and (;,;,n) in the second codebook $C_2$ for rank r. That is, ans(;,;m,n)=ans(;,;m) (;,;,n).

For a variety of ranks, the detailed digits of the overall codebook C may be expressed as follows:

| Rank 1 |
|---|
| ans(:, :, 1, 1) = |
| 0.3536 |
| 0.3536 |
| 0.3536 |
| 0.3536 |
| 0.3536 |
| 0.3536 |
| 0.3536 |
| 0.3536 |

-continued

| Rank 1 |
|---|
| ans(:, :, 2, 1) = |
| 0.3536 |
| 0.3266 + 0.1353i |
| 0.2500 + 0.2500i |
| 0.1353 + 0.3266i |
| 0.3536 |
| 0.3266 + 0.1353i |
| 0.2500 + 0.2500i |
| 0.1353 + 0.3266i |
| ans(:, :, 3, 1) = |
| 0.3536 |
| 0.2500 + 0.2500i |
| 0.0000 + 0.3536i |
| −0.2500 + 0.2500i |
| 0.3536 |
| 0.2500 + 0.2500i |
| 0.0000 + 0.3536i |
| −0.2500 + 0.2500i |
| ans(:, :, 4, 1) = |
| 0.3536 |
| 0.1353 + 0.3266i |
| −0.2500 + 0.2500i |
| −0.3266 − 0.1353i |
| 0.3536 |
| 0.1353 + 0.3266i |
| −0.2500 + 0.2500i |
| −0.3266 − 0.1353i |
| ans(:, :, 5, 1) = |
| 0.3536 |
| 0.0000 + 0.3536i |
| −0.3536 + 0.0000i |
| −0.0000 − 0.3536i |
| 0.3536 |
| 0.0000 + 0.3536i |
| −0.3536 + 0.0000i |
| −0.0000 − 0.3536i |
| ans(:, :, 6, 1) = |
| 0.3536 |
| −0.1353 + 0.3266i |
| −0.2500 − 0.2500i |
| 0.3266 − 0.1353i |
| 0.3536 |
| −0.1353 + 0.3266i |
| −0.2500 − 0.2500i |
| 0.3266 − 0.1353i |
| ans(:, :, 7, 1) = |
| 0.3536 |
| −0.2500 + 0.2500i |
| −0.0000 − 0.3536i |
| 0.2500 + 0.2500i |
| 0.3536 |
| −0.2500 + 0.2500i |
| −0.0000 − 0.3536i |
| 0.2500 + 0.2500i |
| ans(:, :, 8, 1) = |
| 0.3536 |
| −0.3266 + 0.1353i |
| 0.2500 − 0.2500i |
| −0.1353 + 0.3266i |
| 0.3536 |
| −0.3266 + 0.1353i |
| 0.2500 − 0.2500i |
| −0.1353 + 0.3266i |
| ans(:, :, 9, 1) = |
| 0.3536 |
| −0.3536 + 0.0000i |
| 0.3536 − 0.0000i |
| −0.3536 + 0.0000i |
| 0.3536 |
| −0.3536 + 0.0000i |

-continued

| Rank 1 |
|---|
| 0.3536 − 0.0000i<br>−0.3536 + 0.0000i<br>ans(:, :, 10, 1) = |
| 0.3536<br>−0.3266 − 0.1353i<br>0.2500 + 0.2500i<br>−0.1353 − 0.3266i<br>0.3536<br>−0.3266 − 0.1353i<br>0.2500 + 0.2500i<br>−0.1353 − 0.3266i<br>ans(:, :, 11, 1) = |
| 0.3536<br>−0.2500 − 0.2500i<br>0.0000 + 0.3536i<br>0.2500 − 0.2500i<br>0.3536<br>−0.2500 − 0.2500i<br>0.0000 + 0.3536i<br>0.2500 − 0.2500i<br>ans(:, :, 12, 1) = |
| 0.3536<br>−0.1353 − 0.3266i<br>−0.2500 + 0.2500i<br>0.3266 + 0.1353i<br>0.3536<br>−0.1353 − 0.3266i<br>−0.2500 + 0.2500i<br>0.3266 + 0.1353i<br>ans(:, :, 13, 1) = |
| 0.3536<br>−0.0000 − 0.3536i<br>−0.3536 + 0.0000i<br>0.0000 + 0.3536i<br>0.3536<br>−0.0000 − 0.3536i<br>−0.3536 + 0.0000i<br>0.0000 + 0.3536i<br>ans(:, :, 14, 1) = |
| 0.3536<br>0.1353 − 0.3266i<br>−0.2500 − 0.2500i<br>−0.3266 + 0.1353i<br>0.3536<br>0.1353 − 0.3266i<br>−0.2500 − 0.2500i<br>−0.3266 + 0.1353i<br>ans(:, :, 15, 1) = |
| 0.3536<br>0.2500 − 0.2500i<br>−0.0000 − 0.3536i<br>−0.2500 − 0.2500i<br>0.3536<br>0.2500 − 0.2500i<br>−0.0000 − 0.3536i<br>−0.2500 − 0.2500i<br>ans(:, :, 16, 1) = |
| 0.3536<br>0.3266 − 0.1353i<br>0.2500 − 0.2500i<br>0.1353 − 0.3266i<br>0.3536<br>0.3266 − 0.1353i<br>0.2500 − 0.2500i<br>0.1353 − 0.3266i<br>ans(:, :, 1, 2) = |
| 0.3536<br>0.3536<br>0.3536<br>0.3536 |

-continued

| Rank 1 |
|---|
| 0 + 0.3536i<br>0 + 0.3536i<br>0 + 0.3536i<br>0 + 0.3536i<br>ans(:, :, 2, 2) = |
| 0.3536<br>0.3266 + 0.1353i<br>0.2500 + 0.2500i<br>0.1353 + 0.3266i<br>0 + 0.3536i<br>−0.1353 + 0.3266i<br>−0.2500 + 0.2500i<br>−0.3266 + 0.1353i<br>ans(:, :, 3, 2) = |
| 0.3536<br>0.2500 + 0.2500i<br>0.0000 + 0.3536i<br>−0.2500 + 0.2500i<br>0 + 0.3536i<br>−0.2500 + 0.2500i<br>−0.3536 + 0.0000i<br>−0.2500 − 0.2500i<br>ans(:, :, 4, 2) = |
| 0.3536<br>0.1353 + 0.3266i<br>−0.2500 + 0.2500i<br>−0.3266 − 0.1353i<br>0 + 0.3536i<br>−0.3266 + 0.1353i<br>−0.2500 − 0.2500i<br>0.1353 − 0.3266i<br>ans(:, :, 5, 2) = |
| 0.3536<br>0.0000 + 0.3536i<br>−0.3536 + 0.0000i<br>−0.0000 − 0.3536i<br>0 + 0.3536i<br>−0.3536 + 0.0000i<br>−0.0000 − 0.3536i<br>0.3536 − 0.0000i<br>ans(:, :, 6, 2) = |
| 0.3536<br>−0.1353 + 0.3266i<br>−0.2500 − 0.2500i<br>0.3266 − 0.1353i<br>0 + 0.3536i<br>−0.3266 − 0.1353i<br>0.2500 − 0.2500i<br>0.1353 + 0.3266i<br>ans(:, :, 7, 2) = |
| 0.3536<br>−0.2500 + 0.2500i<br>−0.0000 − 0.3536i<br>0.2500 + 0.2500i<br>0 + 0.3536i<br>−0.2500 − 0.2500i<br>0.3536 − 0.0000i<br>−0.2500 + 0.2500i<br>ans(:, :, 8, 2) = |
| 0.3536<br>−0.3266 + 0.1353i<br>0.2500 − 0.2500i<br>−0.1353 + 0.3266i<br>0 + 0.3536i<br>−0.1353 − 0.3266i<br>0.2500 + 0.2500i<br>−0.3266 − 0.1353i<br>ans(:, :, 9, 2) = |
| 0.3536<br>−0.3536 + 0.0000i |

-continued

| Rank 1 |
|---|
| 0.3536 − 0.0000i |
| −0.3536 + 0.0000i |
| 0 + 0.3536i |
| −0.0000 − 0.3536i |
| 0.0000 + 0.3536i |
| −0.0000 − 0.3536i |
| ans(:, :, 10, 2) = |
| 0.3536 |
| −0.3266 − 0.1353i |
| 0.2500 + 0.2500i |
| −0.1353 − 0.3266i |
| 0 + 0.3536i |
| 0.1353 − 0.3266i |
| −0.2500 + 0.2500i |
| 0.3266 − 0.1353i |
| ans(:, :, 11, 2) = |
| 0.3536 |
| −0.2500 − 0.2500i |
| 0.0000 + 0.3536i |
| 0.2500 − 0.2500i |
| 0 + 0.3536i |
| 0.2500 − 0.2500i |
| −0.3536 + 0.0000i |
| 0.2500 + 0.2500i |
| ans(:, :, 12, 2) = |
| 0.3536 |
| −0.1353 − 0.3266i |
| −0.2500 + 0.2500i |
| 0.3266 + 0.1353i |
| 0 + 0.3536i |
| 0.3266 − 0.1353i |
| −0.2500 − 0.2500i |
| −0.1353 + 0.3266i |
| ans(:, :, 13, 2) = |
| 0.3536 |
| −0.0000 − 0.3536i |
| −0.3536 + 0.0000i |
| 0.0000 + 0.3536i |
| 0 + 0.3536i |
| 0.3536 − 0.0000i |
| −0.0000 − 0.3536i |
| −0.3536 + 0.0000i |
| ans(:, :, 14, 2) = |
| 0.3536 |
| 0.1353 − 0.3266i |
| −0.2500 − 0.2500i |
| −0.3266 + 0.1353i |
| 0 + 0.3536i |
| 0.3266 + 0.1353i |
| 0.2500 − 0.2500i |
| −0.1353 − 0.3266i |
| ans(:, :, 15, 2) = |
| 0.3536 |
| 0.2500 − 0.2500i |
| −0.0000 − 0.3536i |
| −0.2500 − 0.2500i |
| 0 + 0.3536i |
| 0.2500 + 0.2500i |
| 0.3536 − 0.0000i |
| 0.2500 − 0.2500i |
| ans(:, :, 16, 2) = |
| 0.3536 |
| 0.3266 − 0.1353i |
| 0.2500 − 0.2500i |
| 0.1353 − 0.3266i |
| 0 + 0.3536i |
| 0.1353 + 0.3266i |
| 0.2500 + 0.2500i |
| 0.3266 + 0.1353i |

-continued

| Rank 1 |
|---|
| ans(:, :, 1, 3) = |
| 0.3536 |
| 0.3536 |
| 0.3536 |
| 0.3536 |
| −0.3536 |
| −0.3536 |
| −0.3536 |
| −0.3536 |
| ans(:, :, 2, 3) = |
| 0.3536 |
| 0.3266 + 0.1353i |
| 0.2500 + 0.2500i |
| 0.1353 + 0.3266i |
| −0.3536 |
| −0.3266 − 0.1353i |
| −0.2500 − 0.2500i |
| −0.1353 − 0.3266i |
| ans(:, :, 3, 3) = |
| 0.3536 |
| 0.2500 + 0.2500i |
| 0.0000 + 0.3536i |
| −0.2500 + 0.2500i |
| −0.3536 |
| −0.2500 − 0.2500i |
| −0.0000 − 0.3536i |
| 0.2500 − 0.2500i |
| ans(:, :, 4, 3) = |
| 0.3536 |
| 0.1353 + 0.3266i |
| −0.2500 + 0.2500i |
| −0.3266 − 0.1353i |
| −0.3536 |
| −0.1353 − 0.3266i |
| 0.2500 − 0.2500i |
| 0.3266 + 0.1353i |
| ans(:, :, 5, 3) = |
| 0.3536 |
| 0.0000 + 0.3536i |
| −0.3536 + 0.0000i |
| −0.0000 − 0.3536i |
| −0.3536 |
| −0.0000 − 0.3536i |
| 0.3536 − 0.0000i |
| 0.0000 + 0.3536i |
| ans(:, :, 6, 3) = |
| 0.3536 |
| −0.1353 + 0.3266i |
| −0.2500 − 0.2500i |
| 0.3266 − 0.1353i |
| −0.3536 |
| 0.1353 − 0.3266i |
| 0.2500 + 0.2500i |
| −0.3266 + 0.1353i |
| ans(:, :, 7, 3) = |
| 0.3536 |
| −0.2500 + 0.2500i |
| −0.0000 − 0.3536i |
| 0.2500 + 0.2500i |
| −0.3536 |
| 0.2500 − 0.2500i |
| 0.0000 + 0.3536i |
| −0.2500 − 0.2500i |
| ans(:, :, 8, 3) = |
| 0.3536 |
| −0.3266 + 0.1353i |
| 0.2500 − 0.2500i |
| −0.1353 + 0.3266i |
| −0.3536 |
| 0.3266 − 0.1353i |

-continued

| Rank 1 |
|---|
| −0.2500 + 0.2500i |
| 0.1353 − 0.3266i |
| ans(:, :, 9, 3) = |
| 0.3536 |
| −0.3536 + 0.0000i |
| 0.3536 − 0.0000i |
| −0.3536 + 0.0000i |
| −0.3536 |
| 0.3536 − 0.0000i |
| −0.3536 + 0.0000i |
| 0.3536 − 0.0000i |
| ans(:, :, 10, 3) = |
| 0.3536 |
| −0.3266 − 0.1353i |
| 0.2500 + 0.2500i |
| −0.1353 − 0.3266i |
| −0.3536 |
| 0.3266 + 0.1353i |
| −0.2500 − 0.2500i |
| 0.1353 + 0.3266i |
| ans(:, :, 11, 3) = |
| 0.3536 |
| −0.2500 − 0.2500i |
| 0.0000 + 0.3536i |
| 0.2500 − 0.2500i |
| −0.3536 |
| 0.2500 + 0.2500i |
| −0.0000 − 0.3536i |
| −0.2500 + 0.2500i |
| ans(:, :, 12, 3) = |
| 0.3536 |
| −0.1353 − 0.3266i |
| −0.2500 + 0.2500i |
| 0.3266 + 0.1353i |
| −0.3536 |
| 0.1353 + 0.3266i |
| 0.2500 − 0.2500i |
| −0.3266 − 0.1353i |
| ans(:, :, 13, 3) = |
| 0.3536 |
| −0.0000 − 0.3536i |
| −0.3536 + 0.0000i |
| 0.0000 + 0.3536i |
| −0.3536 |
| 0.0000 + 0.3536i |
| 0.3536 − 0.0000i |
| −0.0000 − 0.3536i |
| ans(:, :, 14, 3) = |
| 0.3536 |
| 0.1353 − 0.3266i |
| −0.2500 − 0.2500i |
| −0.3266 + 0.1353i |
| −0.3536 |
| −0.1353 + 0.3266i |
| 0.2500 + 0.2500i |
| 0.3266 − 0.1353i |
| ans(:, :, 15, 3) = |
| 0.3536 |
| 0.2500 − 0.2500i |
| −0.0000 − 0.3536i |
| −0.2500 − 0.2500i |
| −0.3536 |
| −0.2500 + 0.2500i |
| 0.0000 + 0.3536i |
| 0.2500 + 0.2500i |
| ans(:, :, 16, 3) = |
| 0.3536 |
| 0.3266 − 0.1353i |
| 0.2500 − 0.2500i |
| 0.1353 − 0.3266i |

-continued

| Rank 1 |
|---|
| −0.3536 |
| −0.3266 + 0.1353i |
| −0.2500 + 0.2500i |
| −0.1353 + 0.3266i |
| ans(:, :, 1, 4) = |
| 0.3536 |
| 0.3536 |
| 0.3536 |
| 0.3536 |
| 0 − 0.3536i |
| 0 − 0.3536i |
| 0 − 0.3536i |
| 0 − 0.3536i |
| ans(:, :, 2, 4) = |
| 0.3536 |
| 0.3266 + 0.1353i |
| 0.2500 + 0.2500i |
| 0.1353 + 0.3266i |
| 0 − 0.3536i |
| 0.1353 − 0.3266i |
| 0.2500 − 0.2500i |
| 0.3266 − 0.1353i |
| ans(:, :, 3, 4) = |
| 0.3536 |
| 0.2500 + 0.2500i |
| 0.0000 + 0.3536i |
| −0.2500 + 0.2500i |
| 0 − 0.3536i |
| 0.2500 − 0.2500i |
| 0.3536 − 0.0000i |
| 0.2500 + 0.2500i |
| ans(:, :, 4, 4) = |
| 0.3536 |
| 0.1353 + 0.3266i |
| −0.2500 + 0.2500i |
| −0.3266 − 0.1353i |
| 0 − 0.3536i |
| 0.3266 − 0.1353i |
| 0.2500 + 0.2500i |
| −0.1353 + 0.3266i |
| ans(:, :, 5, 4) = |
| 0.3536 |
| 0.0000 + 0.3536i |
| −0.3536 + 0.0000i |
| −0.0000 − 0.3536i |
| 0 − 0.3536i |
| 0.3536 − 0.0000i |
| 0.0000 + 0.3536i |
| −0.3536 + 0.0000i |
| ans(:, :, 6, 4) = |
| 0.3536 |
| −0.1353 + 0.3266i |
| −0.2500 − 0.2500i |
| 0.3266 − 0.1353i |
| 0 − 0.3536i |
| 0.3266 + 0.1353i |
| −0.2500 + 0.2500i |
| −0.1353 − 0.3266i |
| ans(:, :, 7, 4) = |
| 0.3536 |
| −0.2500 + 0.2500i |
| −0.0000 − 0.3536i |
| 0.2500 + 0.2500i |
| 0 − 0.3536i |
| 0.2500 + 0.2500i |
| −0.3536 + 0.0000i |
| 0.2500 − 0.2500i |
| ans(:, :, 8, 4) = |
| 0.3536 |
| −0.3266 + 0.1353i |

-continued

| Rank 1 |
|---|
| 0.2500 − 0.2500i |
| −0.1353 + 0.3266i |
| 0 − 0.3536i |
| 0.1353 + 0.3266i |
| −0.2500 − 0.2500i |
| 0.3266 + 0.1353i |
| ans(:, :, 9, 4) = |
| 0.3536 |
| −0.3536 + 0.0000i |
| 0.3536 − 0.0000i |
| −0.3536 + 0.0000i |
| 0 − 0.3536i |
| 0.0000 + 0.3536i |
| −0.0000 − 0.3536i |
| 0.0000 + 0.3536i |
| ans(:, :, 10, 4) = |
| 0.3536 |
| −0.3266 − 0.1353i |
| 0.2500 + 0.2500i |
| −0.1353 − 0.3266i |
| 0 − 0.3536i |
| −0.1353 + 0.3266i |
| 0.2500 − 0.2500i |
| −0.3266 + 0.1353i |
| ans(:, :, 11, 4) = |
| 0.3536 |
| −0.2500 − 0.2500i |
| 0.0000 + 0.3536i |
| 0.2500 − 0.2500i |
| 0 − 0.3536i |
| −0.2500 + 0.2500i |
| 0.3536 − 0.0000i |
| −0.2500 − 0.2500i |
| ans(:, :, 12, 4) = |
| 0.3536 |
| −0.1353 − 0.3266i |
| −0.2500 + 0.2500i |
| 0.3266 + 0.1353i |
| 0 − 0.3536i |
| −0.3266 + 0.1353i |
| 0.2500 + 0.2500i |
| 0.1353 − 0.3266i |
| ans(:, :, 13, 4) = |
| 0.3536 |
| −0.0000 − 0.3536i |
| −0.3536 + 0.0000i |
| 0.0000 + 0.3536i |
| 0 − 0.3536i |
| −0.3536 + 0.0000i |
| 0.0000 + 0.3536i |
| 0.3536 − 0.0000i |
| ans(:, :, 14, 4) = |
| 0.3536 |
| 0.1353 − 0.3266i |
| −0.2500 − 0.2500i |
| −0.3266 + 0.1353i |
| 0 − 0.3536i |
| −0.3266 − 0.1353i |
| −0.2500 + 0.2500i |
| 0.1353 + 0.3266i |
| ans(:, :, 15, 4) = |
| 0.3536 |
| 0.2500 − 0.2500i |
| −0.0000 − 0.3536i |
| −0.2500 − 0.2500i |
| 0 − 0.3536i |
| −0.2500 − 0.2500i |
| −0.3536 + 0.0000i |
| −0.2500 + 0.2500i |

-continued

| Rank 1 |
|---|
| ans(:, :, 16, 4) = |
| 0.3536 |
| 0.3266 − 0.1353i |
| 0.2500 − 0.2500i |
| 0.1353 − 0.3266i |
| 0 − 0.3536i |
| −0.1353 − 0.3266i |
| −0.2500 − 0.2500i |
| −0.3266 − 0.1353i |
| ans(:, :, 1, 5) = |
| 0.3536 |
| 0.3468 + 0.0690i |
| 0.3266 + 0.1353i |
| 0.2940 + 0.1964i |
| 0.3536 |
| 0.3468 + 0.0690i |
| 0.3266 + 0.1353i |
| 0.2940 + 0.1964i |
| ans(:, :, 2, 5) = |
| 0.3536 |
| 0.2940 + 0.1964i |
| 0.1353 + 0.3266i |
| −0.0690 + 0.3468i |
| 0.3536 |
| 0.2940 + 0.1964i |
| 0.1353 + 0.3266i |
| −0.0690 + 0.3468i |
| ans(:, :, 3, 5) = |
| 0.3536 |
| 0.1964 + 0.2940i |
| −0.1353 + 0.3266i |
| −0.3468 + 0.0690i |
| 0.3536 |
| 0.1964 + 0.2940i |
| −0.1353 + 0.3266i |
| −0.3468 + 0.0690i |
| ans(:, :, 4, 5) = |
| 0.3536 |
| 0.0690 + 0.3468i |
| −0.3266 + 0.1353i |
| −0.1964 − 0.2940i |
| 0.3536 |
| 0.0690 + 0.3468i |
| −0.3266 + 0.1353i |
| −0.1964 − 0.2940i |
| ans(:, :, 5, 5) = |
| 0.3536 |
| −0.0690 + 0.3468i |
| −0.3266 − 0.1353i |
| 0.1964 − 0.2940i |
| 0.3536 |
| −0.0690 + 0.3468i |
| −0.3266 − 0.1353i |
| 0.1964 − 0.2940i |
| ans(:, :, 6, 5) = |
| 0.3536 |
| −0.1964 + 0.2940i |
| −0.1353 − 0.3266i |
| 0.3468 + 0.0690i |
| 0.3536 |
| −0.1964 + 0.2940i |
| −0.1353 − 0.3266i |
| 0.3468 + 0.0690i |
| ans(:, :, 7, 5) = |
| 0.3536 |
| −0.2940 + 0.1964i |
| 0.1353 − 0.3266i |
| 0.0690 + 0.3468i |
| 0.3536 |
| −0.2940 + 0.1964i |

-continued

| Rank 1 |
|---|
| 0.1353 − 0.3266i<br>0.0690 + 0.3468i<br>ans(:, :, 8, 5) = |
| 0.3536<br>−0.3468 + 0.0690i<br>0.3266 − 0.1353i<br>−0.2940 + 0.1964i<br>0.3536<br>−0.3468 + 0.0690i<br>0.3266 − 0.1353i<br>−0.2940 + 0.1964i<br>ans(:, :, 9, 5) = |
| 0.3536<br>−0.3468 − 0.0690i<br>0.3266 + 0.1353i<br>−0.2940 − 0.1964i<br>0.3536<br>−0.3468 − 0.0690i<br>0.3266 + 0.1353i<br>−0.2940 − 0.1964i<br>ans(:, :, 10, 5) = |
| 0.3536<br>−0.2940 − 0.1964i<br>0.1353 + 0.3266i<br>0.0690 − 0.3468i<br>0.3536<br>−0.2940 − 0.1964i<br>0.1353 + 0.3266i<br>0.0690 − 0.3468i<br>ans(:, :, 11, 5) = |
| 0.3536<br>−0.1964 − 0.2940i<br>−0.1353 + 0.3266i<br>0.3468 − 0.0690i<br>0.3536<br>−0.1964 − 0.2940i<br>−0.1353 + 0.3266i<br>0.3468 − 0.0690i<br>ans(:, :, 12, 5) = |
| 0.3536<br>−0.0690 − 0.3468i<br>−0.3266 + 0.1353i<br>0.1964 + 0.2940i<br>0.3536<br>−0.0690 − 0.3468i<br>−0.3266 + 0.1353i<br>0.1964 + 0.2940i<br>ans(:, :, 13, 5) = |
| 0.3536<br>0.0690 − 0.3468i<br>−0.3266 − 0.1353i<br>−0.1964 + 0.2940i<br>0.3536<br>0.0690 − 0.3468i<br>−0.3266 − 0.1353i<br>−0.1964 + 0.2940i<br>ans(:, :, 14, 5) = |
| 0.3536<br>0.1964 − 0.2940i<br>−0.1353 − 0.3266i<br>−0.3468 − 0.0690i<br>0.3536<br>0.1964 − 0.2940i<br>−0.1353 − 0.3266i<br>−0.3468 − 0.0690i<br>ans(:, :, 15, 5) = |
| 0.3536<br>0.2940 − 0.1964i<br>0.1353 − 0.3266i<br>−0.0690 − 0.3468i |

-continued

| Rank 1 |
|---|
| 0.3536<br>0.2940 − 0.1964i<br>0.1353 − 0.3266i<br>−0.0690 − 0.3468i<br>ans(:, :, 16, 5) = |
| 0.3536<br>0.3468 − 0.0690i<br>0.3266 − 0.1353i<br>0.2940 − 0.1964i<br>0.3536<br>0.3468 − 0.0690i<br>0.3266 − 0.1353i<br>0.2940 − 0.1964i<br>ans(:, :, 1, 6) = |
| 0.3536<br>0.3468 + 0.0690i<br>0.3266 + 0.1353i<br>0.2940 + 0.1964i<br>0 + 0.3536i<br>−0.0690 + 0.3468i<br>−0.1353 + 0.3266i<br>−0.1964 + 0.2940i<br>ans(:, :, 2, 6) = |
| 0.3536<br>0.2940 + 0.1964i<br>0.1353 + 0.3266i<br>−0.0690 + 0.3468i<br>0 + 0.3536i<br>−0.1964 + 0.2940i<br>−0.3266 + 0.1353i<br>−0.3468 − 0.0690i<br>ans(:, :, 3, 6) = |
| 0.3536<br>0.1964 + 0.2940i<br>−0.1353 + 0.3266i<br>−0.3468 + 0.0690i<br>0 + 0.3536i<br>−0.2940 + 0.1964i<br>−0.3266 − 0.1353i<br>−0.0690 − 0.3468i<br>ans(:, :, 4, 6) = |
| 0.3536<br>0.0690 + 0.3468i<br>−0.3266 + 0.1353i<br>−0.1964 − 0.2940i<br>0 + 0.3536i<br>−0.3468 + 0.0690i<br>−0.1353 − 0.3266i<br>0.2940 − 0.1964i<br>ans(:, :, 5, 6) = |
| 0.3536<br>−0.0690 + 0.3468i<br>−0.3266 − 0.1353i<br>0.1964 − 0.2940i<br>0 + 0.3536i<br>−0.3468 − 0.0690i<br>0.1353 − 0.3266i<br>0.2940 + 0.1964i<br>ans(:, :, 6, 6) = |
| 0.3536<br>−0.1964 + 0.2940i<br>−0.1353 − 0.3266i<br>0.3468 + 0.0690i<br>0 + 0.3536i<br>−0.2940 − 0.1964i<br>0.3266 − 0.1353i<br>−0.0690 + 0.3468i<br>ans(:, :, 7, 6) = |
| 0.3536<br>−0.2940 + 0.1964i |

-continued

| Rank 1 |
|---|
| 0.1353 − 0.3266i<br>0.0690 + 0.3468i<br>0 + 0.3536i<br>−0.1964 − 0.2940i<br>0.3266 + 0.1353i<br>−0.3468 + 0.0690i<br>ans(:, :, 8, 6) = |
| 0.3536<br>−0.3468 + 0.0690i<br>0.3266 − 0.1353i<br>−0.2940 + 0.1964i<br>0 + 0.3536i<br>−0.0690 − 0.3468i<br>0.1353 + 0.3266i<br>−0.1964 − 0.2940i<br>ans(:, :, 9, 6) = |
| 0.3536<br>−0.3468 − 0.0690i<br>0.3266 + 0.1353i<br>−0.2940 − 0.1964i<br>0 + 0.3536i<br>0.0690 − 0.3468i<br>−0.1353 + 0.3266i<br>0.1964 − 0.2940i<br>ans(:, :, 10, 6) = |
| 0.3536<br>−0.2940 − 0.1964i<br>0.1353 + 0.3266i<br>0.0690 − 0.3468i<br>0 + 0.3536i<br>0.1964 − 0.2940i<br>−0.3266 + 0.1353i<br>0.3468 + 0.0690i<br>ans(:, :, 11, 6) = |
| 0.3536<br>−0.1964 − 0.2940i<br>−0.1353 + 0.3266i<br>0.3468 − 0.0690i<br>0 + 0.3536i<br>0.2940 − 0.1964i<br>−0.3266 − 0.1353i<br>0.0690 + 0.3468i<br>ans(:, :, 12, 6) = |
| 0.3536<br>−0.0690 − 0.3468i<br>−0.3266 + 0.1353i<br>0.1964 + 0.2940i<br>0 + 0.3536i<br>0.3468 − 0.0690i<br>−0.1353 − 0.3266i<br>−0.2940 + 0.1964i<br>ans(:, :, 13, 6) = |
| 0.3536<br>0.0690 − 0.3468i<br>−0.3266 − 0.1353i<br>−0.1964 + 0.2940i<br>0 + 0.3536i<br>0.3468 + 0.0690i<br>0.1353 − 0.3266i<br>−0.2940 − 0.1964i<br>ans(:, :, 14, 6) = |
| 0.3536<br>0.1964 − 0.2940i<br>−0.1353 − 0.3266i<br>−0.3468 − 0.0690i<br>0 + 0.3536i<br>0.2940 + 0.1964i<br>0.3266 − 0.1353i<br>0.0690 − 0.3468i |

-continued

| Rank 1 |
|---|
| ans(:, :, 15, 6) = |
| 0.3536<br>0.2940 − 0.1964i<br>0.1353 − 0.3266i<br>−0.0690 − 0.3468i<br>0 + 0.3536i<br>0.1964 + 0.2940i<br>0.3266 + 0.1353i<br>0.3468 − 0.0690i<br>ans(:, :, 16, 6) = |
| 0.3536<br>0.3468 − 0.0690i<br>0.3266 − 0.1353i<br>0.2940 − 0.1964i<br>0 + 0.3536i<br>0.0690 + 0.3468i<br>0.1353 + 0.3266i<br>0.1964 + 0.2940i<br>ans(:, :, 1, 7) = |
| 0.3536<br>0.3468 + 0.0690i<br>0.3266 + 0.1353i<br>0.2940 + 0.1964i<br>−0.3536<br>−0.3468 − 0.0690i<br>−0.3266 − 0.1353i<br>−0.2940 − 0.1964i<br>ans(:, :, 2, 7) = |
| 0.3536<br>0.2940 + 0.1964i<br>0.1353 + 0.3266i<br>−0.0690 + 0.3468i<br>−0.3536<br>−0.2940 − 0.1964i<br>−0.1353 − 0.3266i<br>0.0690 − 0.3468i<br>ans(:, :, 3, 7) = |
| 0.3536<br>0.1964 + 0.2940i<br>−0.1353 + 0.3266i<br>−0.3468 + 0.0690i<br>−0.3536<br>−0.1964 − 0.2940i<br>0.1353 − 0.3266i<br>0.3468 − 0.0690i<br>ans(:, :, 4, 7) = |
| 0.3536<br>0.0690 + 0.3468i<br>−0.3266 + 0.1353i<br>−0.1964 − 0.2940i<br>−0.3536<br>−0.0690 − 0.3468i<br>0.3266 − 0.1353i<br>0.1964 + 0.2940i<br>ans(:, :, 5, 7) = |
| 0.3536<br>−0.0690 + 0.3468i<br>−0.3266 − 0.1353i<br>0.1964 − 0.2940i<br>−0.3536<br>0.0690 − 0.3468i<br>0.3266 + 0.1353i<br>−0.1964 + 0.2940i<br>ans(:, :, 6, 7) = |
| 0.3536<br>−0.1964 + 0.2940i<br>−0.1353 − 0.3266i<br>0.3468 + 0.0690i<br>−0.3536<br>0.1964 − 0.2940i |

-continued

| Rank 1 |
|---|
| 0.1353 + 0.3266i<br>−0.3468 − 0.0690i<br>ans(:, :, 7, 7) = |
| 0.3536<br>−0.2940 + 0.1964i<br>0.1353 − 0.3266i<br>0.0690 + 0.3468i<br>−0.3536<br>0.2940 − 0.1964i<br>−0.1353 + 0.3266i<br>−0.0690 − 0.3468i<br>ans(:, :, 8, 7) = |
| 0.3536<br>−0.3468 + 0.0690i<br>0.3266 − 0.1353i<br>−0.2940 + 0.1964i<br>−0.3536<br>0.3468 − 0.0690i<br>−0.3266 + 0.1353i<br>0.2940 − 0.1964i<br>ans(:, :, 9, 7) = |
| 0.3536<br>−0.3468 − 0.0690i<br>0.3266 + 0.1353i<br>−0.2940 − 0.1964i<br>−0.3536<br>0.3468 + 0.0690i<br>−0.3266 − 0.1353i<br>0.2940 + 0.1964i<br>ans(:, :, 10, 7) = |
| 0.3536<br>−0.2940 − 0.1964i<br>0.1353 + 0.3266i<br>0.0690 − 0.3468i<br>−0.3536<br>0.2940 + 0.1964i<br>−0.1353 − 0.3266i<br>−0.0690 + 0.3468i<br>ans(:, :, 11, 7) = |
| 0.3536<br>−0.1964 − 0.2940i<br>−0.1353 + 0.3266i<br>0.3468 − 0.0690i<br>−0.3536<br>0.1964 + 0.2940i<br>0.1353 − 0.3266i<br>−0.3468 + 0.0690i<br>ans(:, :, 12, 7) = |
| 0.3536<br>−0.0690 − 0.3468i<br>−0.3266 + 0.1353i<br>0.1964 + 0.2940i<br>−0.3536<br>0.0690 + 0.3468i<br>0.3266 − 0.1353i<br>−0.1964 − 0.2940i<br>ans(:, :, 13, 7) = |
| 0.3536<br>0.0690 − 0.3468i<br>−0.3266 − 0.1353i<br>−0.1964 + 0.2940i<br>−0.3536<br>−0.0690 + 0.3468i<br>0.3266 + 0.1353i<br>0.1964 − 0.2940i<br>ans(:, :, 14, 7) = |
| 0.3536<br>0.1964 − 0.2940i<br>−0.1353 − 0.3266i<br>−0.3468 − 0.0690i |

-continued

| Rank 1 |
|---|
| −0.3536<br>−0.1964 + 0.2940i<br>0.1353 + 0.3266i<br>0.3468 + 0.0690i<br>ans(:, :, 15, 7) = |
| 0.3536<br>0.2940 − 0.1964i<br>0.1353 − 0.3266i<br>−0.0690 − 0.3468i<br>−0.3536<br>−0.2940 + 0.1964i<br>−0.1353 + 0.3266i<br>0.0690 + 0.3468i<br>ans(:, :, 16, 7) = |
| 0.3536<br>0.3468 − 0.0690i<br>0.3266 − 0.1353i<br>0.2940 − 0.1964i<br>−0.3536<br>−0.3468 + 0.0690i<br>−0.3266 + 0.1353i<br>−0.2940 + 0.1964i<br>ans(:, :, 1, 8) = |
| 0.3536<br>0.3468 + 0.0690i<br>0.3266 + 0.1353i<br>0.2940 + 0.1964i<br>0 − 0.3536i<br>0.0690 − 0.3468i<br>0.1353 − 0.3266i<br>0.1964 − 0.2940i<br>ans(:, :, 2, 8) = |
| 0.3536<br>0.2940 + 0.1964i<br>0.1353 + 0.3266i<br>−0.0690 + 0.3468i<br>0 − 0.3536i<br>0.1964 − 0.2940i<br>0.3266 − 0.1353i<br>0.3468 + 0.0690i<br>ans(:, :, 3, 8) = |
| 0.3536<br>0.1964 + 0.2940i<br>−0.1353 + 0.3266i<br>−0.3468 + 0.0690i<br>0 − 0.3536i<br>0.2940 − 0.1964i<br>0.3266 + 0.1353i<br>0.0690 + 0.3468i<br>ans(:, :, 4, 8) = |
| 0.3536<br>0.0690 + 0.3468i<br>−0.3266 + 0.1353i<br>−0.1964 − 0.2940i<br>0 − 0.3536i<br>0.3468 − 0.0690i<br>0.1353 + 0.3266i<br>−0.2940 + 0.1964i<br>ans(:, :, 5, 8) = |
| 0.3536<br>−0.0690 + 0.3468i<br>−0.3266 − 0.1353i<br>0.1964 − 0.2940i<br>0 − 0.3536i<br>0.3468 + 0.0690i<br>−0.1353 + 0.3266i<br>−0.2940 − 0.1964i<br>ans(:, :, 6, 8) = |
| 0.3536<br>−0.1964 + 0.2940i |

-continued

| Rank 1 |
|---|
| −0.1353 − 0.3266i |
| 0.3468 + 0.0690i |
| 0 − 0.3536i |
| 0.2940 + 0.1964i |
| −0.3266 + 0.1353i |
| 0.0690 − 0.3468i |
| ans(:, :, 7, 8) = |
| 0.3536 |
| −0.2940 + 0.1964i |
| 0.1353 − 0.3266i |
| 0.0690 + 0.3468i |
| 0 − 0.3536i |
| 0.1964 + 0.2940i |
| −0.3266 − 0.1353i |
| 0.3468 − 0.0690i |
| ans(:, :, 8, 8) = |
| 0.3536 |
| −0.3468 + 0.0690i |
| 0.3266 − 0.1353i |
| −0.2940 + 0.1964i |
| 0 − 0.3536i |
| 0.0690 + 0.3468i |
| −0.1353 − 0.3266i |
| 0.1964 + 0.2940i |
| ans(:, :, 9, 8) = |
| 0.3536 |
| −0.3468 − 0.0690i |
| 0.3266 + 0.1353i |
| −0.2940 − 0.1964i |
| 0 − 0.3536i |
| −0.0690 + 0.3468i |
| 0.1353 − 0.3266i |
| −0.1964 + 0.2940i |
| ans(:, :, 10, 8) = |
| 0.3536 |
| −0.2940 − 0.1964i |
| 0.1353 + 0.3266i |
| 0.0690 − 0.3468i |
| 0 − 0.3536i |
| −0.1964 + 0.2940i |
| 0.3266 − 0.1353i |
| −0.3468 − 0.0690i |
| ans(:, :, 11, 8) = |
| 0.3536 |
| −0.1964 − 0.2940i |
| −0.1353 + 0.3266i |
| 0.3468 − 0.0690i |
| 0 − 0.3536i |
| −0.2940 + 0.1964i |
| 0.3266 + 0.1353i |
| −0.0690 − 0.3468i |
| ans(:, :, 12, 8) = |
| 0.3536 |
| −0.0690 − 0.3468i |
| −0.3266 + 0.1353i |
| 0.1964 + 0.2940i |
| 0 − 0.3536i |
| −0.3468 + 0.0690i |
| 0.1353 + 0.3266i |
| 0.2940 − 0.1964i |
| ans(:, :, 13, 8) = |
| 0.3536 |
| 0.0690 − 0.3468i |
| −0.3266 − 0.1353i |
| −0.1964 + 0.2940i |
| 0 − 0.3536i |
| −0.3468 − 0.0690i |
| −0.1353 + 0.3266i |
| 0.2940 + 0.1964i |

-continued

| Rank 1 |
|---|
| ans(:, :, 14, 8) = |
| 0.3536 |
| 0.1964 − 0.2940i |
| −0.1353 − 0.3266i |
| −0.3468 − 0.0690i |
| 0 − 0.3536i |
| −0.2940 − 0.1964i |
| −0.3266 + 0.1353i |
| −0.0690 + 0.3468i |
| ans(:, :, 15, 8) = |
| 0.3536 |
| 0.2940 − 0.1964i |
| 0.1353 − 0.3266i |
| −0.0690 − 0.3468i |
| 0 − 0.3536i |
| −0.1964 − 0.2940i |
| −0.3266 − 0.1353i |
| −0.3468 + 0.0690i |
| ans(:, :, 16, 8) = |
| 0.3536 |
| 0.3468 − 0.0690i |
| 0.3266 − 0.1353i |
| 0.2940 − 0.1964i |
| 0 − 0.3536i |
| −0.0690 − 0.3468i |
| −0.1353 − 0.3266i |
| −0.1964 − 0.2940i |
| ans(:, :, 1, 9) = |
| 0.3536 |
| 0.3266 + 0.1353i |
| 0.2500 + 0.2500i |
| 0.1353 + 0.3266i |
| 0.3536 |
| 0.3266 + 0.1353i |
| 0.2500 + 0.2500i |
| 0.1353 + 0.3266i |
| ans(:, :, 2, 9) = |
| 0.3536 |
| 0.2500 + 0.2500i |
| 0.0000 + 0.3536i |
| −0.2500 + 0.2500i |
| 0.3536 |
| 0.2500 + 0.2500i |
| 0.0000 + 0.3536i |
| −0.2500 + 0.2500i |
| ans(:, :, 3, 9) = |
| 0.3536 |
| 0.1353 + 0.3266i |
| −0.2500 + 0.2500i |
| −0.3266 − 0.1353i |
| 0.3536 |
| 0.1353 + 0.3266i |
| −0.2500 + 0.2500i |
| −0.3266 − 0.1353i |
| ans(:, :, 4, 9) = |
| 0.3536 |
| 0.0000 + 0.3536i |
| −0.3536 + 0.0000i |
| −0.0000 − 0.3536i |
| 0.3536 |
| 0.0000 + 0.3536i |
| −0.3536 + 0.0000i |
| −0.0000 − 0.3536i |
| ans(:, :, 5, 9) = |
| 0.3536 |
| −0.1353 + 0.3266i |
| −0.2500 − 0.2500i |
| 0.3266 − 0.1353i |
| 0.3536 |
| −0.1353 + 0.3266i |

-continued

| Rank 1 |
| --- |
| −0.2500 − 0.2500i |
| 0.3266 − 0.1353i |
| ans(:, :, 6, 9) = |
| 0.3536 |
| −0.2500 + 0.2500i |
| −0.0000 − 0.3536i |
| 0.2500 + 0.2500i |
| 0.3536 |
| −0.2500 + 0.2500i |
| −0.0000 − 0.3536i |
| 0.2500 + 0.2500i |
| ans(:, :, 7, 9) = |
| 0.3536 |
| −0.3266 + 0.1353i |
| 0.2500 − 0.2500i |
| −0.1353 + 0.3266i |
| 0.3536 |
| −0.3266 + 0.1353i |
| 0.2500 − 0.2500i |
| −0.1353 + 0.3266i |
| ans(:, :, 8, 9) = |
| 0.3536 |
| −0.3536 + 0.0000i |
| 0.3536 − 0.0000i |
| −0.3536 + 0.0000i |
| 0.3536 |
| −0.3536 + 0.0000i |
| 0.3536 − 0.0000i |
| −0.3536 + 0.0000i |
| ans(:, :, 9, 9) = |
| 0.3536 |
| −0.3266 − 0.1353i |
| 0.2500 + 0.2500i |
| −0.1353 − 0.3266i |
| 0.3536 |
| −0.3266 − 0.1353i |
| 0.2500 + 0.2500i |
| −0.1353 − 0.3266i |
| ans(:, :, 10, 9) = |
| 0.3536 |
| −0.2500 − 0.2500i |
| 0.0000 + 0.3536i |
| 0.2500 − 0.2500i |
| 0.3536 |
| −0.2500 − 0.2500i |
| 0.0000 + 0.3536i |
| 0.2500 − 0.2500i |
| ans(:, :, 11, 9) = |
| 0.3536 |
| −0.1353 − 0.3266i |
| −0.2500 + 0.2500i |
| 0.3266 + 0.1353i |
| 0.3536 |
| −0.1353 − 0.3266i |
| −0.2500 + 0.2500i |
| 0.3266 + 0.1353i |
| ans(:, :, 12, 9) = |
| 0.3536 |
| −0.0000 − 0.3536i |
| −0.3536 + 0.0000i |
| 0.0000 + 0.3536i |
| 0.3536 |
| −0.0000 − 0.3536i |
| −0.3536 + 0.0000i |
| 0.0000 + 0.3536i |
| ans(:, :, 13, 9) = |
| 0.3536 |
| 0.1353 − 0.3266i |
| −0.2500 − 0.2500i |
| −0.3266 + 0.1353i |

-continued

| Rank 1 |
| --- |
| 0.3536 |
| 0.1353 − 0.3266i |
| −0.2500 − 0.2500i |
| −0.3266 + 0.1353i |
| ans(:, :, 14, 9) = |
| 0.3536 |
| 0.2500 − 0.2500i |
| −0.0000 − 0.3536i |
| −0.2500 − 0.2500i |
| 0.3536 |
| 0.2500 − 0.2500i |
| −0.0000 − 0.3536i |
| −0.2500 − 0.2500i |
| ans(:, :, 15, 9) = |
| 0.3536 |
| 0.3266 − 0.1353i |
| 0.2500 − 0.2500i |
| 0.1353 − 0.3266i |
| 0.3536 |
| 0.3266 − 0.1353i |
| 0.2500 − 0.2500i |
| 0.1353 − 0.3266i |
| ans(:, :, 16, 9) = |
| 0.3536 |
| 0.3536 |
| 0.3536 |
| 0.3536 |
| 0.3536 |
| 0.3536 |
| 0.3536 |
| 0.3536 |
| ans(:, :, 1, 10) = |
| 0.3536 |
| 0.3266 + 0.1353i |
| 0.2500 + 0.2500i |
| 0.1353 + 0.3266i |
| 0 + 0.3536i |
| −0.1353 + 0.3266i |
| −0.2500 + 0.2500i |
| −0.3266 + 0.1353i |
| ans(:, :, 2, 10) = |
| 0.3536 |
| 0.2500 + 0.2500i |
| 0.0000 + 0.3536i |
| −0.2500 + 0.2500i |
| 0 + 0.3536i |
| −0.2500 + 0.2500i |
| −0.3536 + 0.0000i |
| −0.2500 − 0.2500i |
| ans(:, :, 3, 10) = |
| 0.3536 |
| 0.1353 + 0.3266i |
| −0.2500 + 0.2500i |
| −0.3266 − 0.1353i |
| 0 + 0.3536i |
| −0.3266 + 0.1353i |
| −0.2500 − 0.2500i |
| 0.1353 − 0.3266i |
| ans(:, :, 4, 10) = |
| 0.3536 |
| 0.0000 + 0.3536i |
| −0.3536 + 0.0000i |
| −0.0000 − 0.3536i |
| 0 + 0.3536i |
| −0.3536 + 0.0000i |
| −0.0000 − 0.3536i |
| 0.3536 − 0.0000i |
| ans(:, :, 5, 10) = |
| 0.3536 |
| −0.1353 + 0.3266i |

-continued

| Rank 1 |
|---|
| −0.2500 − 0.2500i |
| 0.3266 − 0.1353i |
| 0 + 0.3536i |
| −0.3266 − 0.1353i |
| 0.2500 − 0.2500i |
| 0.1353 + 0.3266i |
| ans(:, :, 6, 10) = |
| 0.3536 |
| −0.2500 + 0.2500i |
| −0.0000 − 0.3536i |
| 0.2500 + 0.2500i |
| 0 + 0.3536i |
| −0.2500 − 0.2500i |
| 0.3536 − 0.0000i |
| −0.2500 + 0.2500i |
| ans(:, :, 7, 10) = |
| 0.3536 |
| −0.3266 + 0.1353i |
| 0.2500 − 0.2500i |
| −0.1353 + 0.3266i |
| 0 + 0.3536i |
| −0.1353 − 0.3266i |
| 0.2500 + 0.2500i |
| −0.3266 − 0.1353i |
| ans(:, :, 8, 10) = |
| 0.3536 |
| −0.3536 + 0.0000i |
| 0.3536 − 0.0000i |
| −0.3536 + 0.0000i |
| 0 + 0.3536i |
| −0.0000 − 0.3536i |
| 0.0000 + 0.3536i |
| −0.0000 − 0.3536i |
| ans(:, :, 9, 10) = |
| 0.3536 |
| −0.3266 − 0.1353i |
| 0.2500 + 0.2500i |
| −0.1353 − 0.3266i |
| 0 + 0.3536i |
| 0.1353 − 0.3266i |
| −0.2500 + 0.2500i |
| 0.3266 − 0.1353i |
| ans(:, :, 10, 10) = |
| 0.3536 |
| −0.2500 − 0.2500i |
| 0.0000 + 0.3536i |
| 0.2500 − 0.2500i |
| 0 + 0.3536i |
| 0.2500 − 0.2500i |
| −0.3536 + 0.0000i |
| 0.2500 + 0.2500i |
| ans(:, :, 11, 10) = |
| 0.3536 |
| −0.1353 − 0.3266i |
| −0.2500 + 0.2500i |
| 0.3266 + 0.1353i |
| 0 + 0.3536i |
| 0.3266 − 0.1353i |
| −0.2500 − 0.2500i |
| −0.1353 + 0.3266i |
| ans(:, :, 12, 10) = |
| 0.3536 |
| −0.0000 − 0.3536i |
| −0.3536 + 0.0000i |
| 0.0000 + 0.3536i |
| 0 + 0.3536i |
| 0.3536 − 0.0000i |
| −0.0000 − 0.3536i |
| −0.3536 + 0.0000i |

-continued

| Rank 1 |
|---|
| ans(:, :, 13, 10) = |
| 0.3536 |
| 0.1353 − 0.3266i |
| −0.2500 − 0.2500i |
| −0.3266 + 0.1353i |
| 0 + 0.3536i |
| 0.3266 + 0.1353i |
| 0.2500 − 0.2500i |
| −0.1353 − 0.3266i |
| ans(:, :, 14, 10) = |
| 0.3536 |
| 0.2500 − 0.2500i |
| −0.0000 − 0.3536i |
| −0.2500 − 0.2500i |
| 0 + 0.3536i |
| 0.2500 + 0.2500i |
| 0.3536 − 0.0000i |
| 0.2500 − 0.2500i |
| ans(:, :, 15, 10) = |
| 0.3536 |
| 0.3266 − 0.1353i |
| 0.2500 − 0.2500i |
| 0.1353 − 0.3266i |
| 0 + 0.3536i |
| 0.1353 + 0.3266i |
| 0.2500 + 0.2500i |
| 0.3266 + 0.1353i |
| ans(:, :, 16, 10) = |
| 0.3536 |
| 0.3536 |
| 0.3536 |
| 0.3536 |
| 0 + 0.3536i |
| 0 + 0.3536i |
| 0 + 0.3536i |
| 0 + 0.3536i |
| ans(:, :, 1, 11) = |
| 0.3536 |
| 0.3266 + 0.1353i |
| 0.2500 + 0.2500i |
| 0.1353 + 0.3266i |
| −0.3536 |
| −0.3266 − 0.1353i |
| −0.2500 − 0.2500i |
| −0.1353 − 0.3266i |
| ans(:, :, 2, 11) = |
| 0.3536 |
| 0.2500 + 0.2500i |
| 0.0000 + 0.3536i |
| −0.2500 + 0.2500i |
| −0.3536 |
| −0.2500 − 0.2500i |
| −0.0000 − 0.3536i |
| 0.2500 − 0.2500i |
| ans(:, :, 3, 11) = |
| 0.3536 |
| 0.1353 + 0.3266i |
| −0.2500 + 0.2500i |
| −0.3266 − 0.1353i |
| −0.3536 |
| −0.1353 − 0.3266i |
| 0.2500 − 0.2500i |
| 0.3266 + 0.1353i |
| ans(:, :, 4, 11) = |
| 0.3536 |
| 0.0000 + 0.3536i |
| −0.3536 + 0.0000i |
| −0.0000 − 0.3536i |
| −0.3536 |
| −0.0000 − 0.3536i |

-continued

| Rank 1 |
| --- |
| 0.3536 − 0.0000i |
| 0.0000 + 0.3536i |
| ans(:, :, 5, 11) = |
| 0.3536 |
| −0.1353 + 0.3266i |
| −0.2500 − 0.2500i |
| 0.3266 − 0.1353i |
| −0.3536 |
| 0.1353 − 0.3266i |
| 0.2500 + 0.2500i |
| −0.3266 + 0.1353i |
| ans(:, :, 6, 11) = |
| 0.3536 |
| −0.2500 + 0.2500i |
| −0.0000 − 0.3536i |
| 0.2500 + 0.2500i |
| −0.3536 |
| 0.2500 − 0.2500i |
| 0.0000 + 0.3536i |
| −0.2500 − 0.2500i |
| ans(:, :, 7, 11) = |
| 0.3536 |
| −0.3266 + 0.1353i |
| 0.2500 − 0.2500i |
| −0.1353 + 0.3266i |
| −0.3536 |
| 0.3266 − 0.1353i |
| −0.2500 + 0.2500i |
| 0.1353 − 0.3266i |
| ans(:, :, 8, 11) = |
| 0.3536 |
| −0.3536 + 0.0000i |
| 0.3536 − 0.0000i |
| −0.3536 + 0.0000i |
| −0.3536 |
| 0.3536 − 0.0000i |
| −0.3536 + 0.0000i |
| 0.3536 − 0.0000i |
| ans(:, :, 9, 11) = |
| 0.3536 |
| −0.3266 − 0.1353i |
| 0.2500 + 0.2500i |
| −0.1353 − 0.3266i |
| −0.3536 |
| 0.3266 + 0.1353i |
| −0.2500 − 0.2500i |
| 0.1353 + 0.3266i |
| ans(:, :, 10, 11) = |
| 0.3536 |
| −0.2500 − 0.2500i |
| 0.0000 + 0.3536i |
| 0.2500 − 0.2500i |
| −0.3536 |
| 0.2500 + 0.2500i |
| −0.0000 − 0.3536i |
| −0.2500 + 0.2500i |
| ans(:, :, 11, 11) = |
| 0.3536 |
| −0.1353 − 0.3266i |
| −0.2500 + 0.2500i |
| 0.3266 + 0.1353i |
| −0.3536 |
| 0.1353 + 0.3266i |
| 0.2500 − 0.2500i |
| −0.3266 − 0.1353i |
| ans(:, :, 12, 11) = |
| 0.3536 |
| −0.0000 − 0.3536i |
| −0.3536 + 0.0000i |
| 0.0000 + 0.3536i |

-continued

| Rank 1 |
| --- |
| −0.3536 |
| 0.0000 + 0.3536i |
| 0.3536 − 0.0000i |
| −0.0000 − 0.3536i |
| ans(:, :, 13, 11) = |
| 0.3536 |
| 0.1353 − 0.3266i |
| −0.2500 − 0.2500i |
| −0.3266 + 0.1353i |
| −0.3536 |
| −0.1353 + 0.3266i |
| 0.2500 + 0.2500i |
| 0.3266 − 0.1353i |
| ans(:, :, 14, 11) = |
| 0.3536 |
| 0.2500 − 0.2500i |
| −0.0000 − 0.3536i |
| −0.2500 − 0.2500i |
| −0.3536 |
| −0.2500 + 0.2500i |
| 0.0000 + 0.3536i |
| 0.2500 + 0.2500i |
| ans(:, :, 15, 11) = |
| 0.3536 |
| 0.3266 − 0.1353i |
| 0.2500 − 0.2500i |
| 0.1353 − 0.3266i |
| −0.3536 |
| −0.3266 + 0.1353i |
| −0.2500 + 0.2500i |
| −0.1353 + 0.3266i |
| ans(:, :, 16, 11) = |
| 0.3536 |
| 0.3536 |
| 0.3536 |
| 0.3536 |
| −0.3536 |
| −0.3536 |
| −0.3536 |
| −0.3536 |
| ans(:, :, 1, 12) = |
| 0.3536 |
| 0.3266 + 0.1353i |
| 0.2500 + 0.2500i |
| 0.1353 + 0.3266i |
| 0 − 0.3536i |
| 0.1353 − 0.3266i |
| 0.2500 − 0.2500i |
| 0.3266 − 0.1353i |
| ans(:, :, 2, 12) = |
| 0.3536 |
| 0.2500 + 0.2500i |
| 0.0000 + 0.3536i |
| −0.2500 + 0.2500i |
| 0 − 0.3536i |
| 0.2500 − 0.2500i |
| 0.3536 − 0.0000i |
| 0.2500 + 0.2500i |
| ans(:, :, 3, 12) = |
| 0.3536 |
| 0.1353 + 0.3266i |
| −0.2500 + 0.2500i |
| −0.3266 − 0.1353i |
| 0 − 0.3536i |
| 0.3266 − 0.1353i |
| 0.2500 + 0.2500i |
| −0.1353 + 0.3266i |
| ans(:, :, 4, 12) = |
| 0.3536 |
| 0.0000 + 0.3536i |

-continued

| Rank 1 |
| --- |
| −0.3536 + 0.0000i |
| −0.0000 − 0.3536i |
| 0 − 0.3536i |
| 0.3536 − 0.0000i |
| 0.0000 + 0.3536i |
| −0.3536 + 0.0000i |
| ans(:, :, 5, 12) = |
| 0.3536 |
| −0.1353 + 0.3266i |
| −0.2500 − 0.2500i |
| 0.3266 − 0.1353i |
| 0 − 0.3536i |
| 0.3266 + 0.1353i |
| −0.2500 + 0.2500i |
| −0.1353 − 0.3266i |
| ans(:, :, 6, 12) = |
| 0.3536 |
| −0.2500 + 0.2500i |
| −0.0000 − 0.3536i |
| 0.2500 + 0.2500i |
| 0 − 0.3536i |
| 0.2500 + 0.2500i |
| −0.3536 + 0.0000i |
| 0.2500 − 0.2500i |
| ans(:, :, 7, 12) = |
| 0.3536 |
| −0.3266 + 0.1353i |
| 0.2500 − 0.2500i |
| −0.1353 + 0.3266i |
| 0 − 0.3536i |
| 0.1353 + 0.3266i |
| −0.2500 − 0.2500i |
| 0.3266 + 0.1353i |
| ans(:, :, 8, 12) = |
| 0.3536 |
| −0.3536 + 0.0000i |
| 0.3536 − 0.0000i |
| −0.3536 + 0.0000i |
| 0 − 0.3536i |
| 0.0000 + 0.3536i |
| −0.0000 − 0.3536i |
| 0.0000 + 0.3536i |
| ans(:, :, 9, 12) = |
| 0.3536 |
| −0.3266 − 0.1353i |
| 0.2500 + 0.2500i |
| −0.1353 − 0.3266i |
| 0 − 0.3536i |
| −0.1353 + 0.3266i |
| 0.2500 − 0.2500i |
| −0.3266 + 0.1353i |
| ans(:, :, 10, 12) = |
| 0.3536 |
| −0.2500 − 0.2500i |
| 0.0000 + 0.3536i |
| 0.2500 − 0.2500i |
| 0 − 0.3536i |
| −0.2500 + 0.2500i |
| 0.3536 − 0.0000i |
| −0.2500 − 0.2500i |
| ans(:, :, 11, 12) = |
| 0.3536 |
| −0.1353 − 0.3266i |
| −0.2500 + 0.2500i |
| 0.3266 + 0.1353i |
| 0 − 0.3536i |
| −0.3266 + 0.1353i |
| 0.2500 + 0.2500i |
| 0.1353 − 0.3266i |

-continued

| Rank 1 |
| --- |
| ans(:, :, 12, 12) = |
| 0.3536 |
| −0.0000 − 0.3536i |
| −0.3536 + 0.0000i |
| 0.0000 + 0.3536i |
| 0 − 0.3536i |
| −0.3536 + 0.0000i |
| 0.0000 + 0.3536i |
| 0.3536 − 0.0000i |
| ans(:, :, 13, 12) = |
| 0.3536 |
| 0.1353 − 0.3266i |
| −0.2500 − 0.2500i |
| −0.3266 + 0.1353i |
| 0 − 0.3536i |
| −0.3266 − 0.1353i |
| −0.2500 + 0.2500i |
| 0.1353 + 0.3266i |
| ans(:, :, 14, 12) = |
| 0.3536 |
| 0.2500 − 0.2500i |
| −0.0000 − 0.3536i |
| −0.2500 − 0.2500i |
| 0 − 0.3536i |
| −0.2500 − 0.2500i |
| −0.3536 + 0.0000i |
| −0.2500 + 0.2500i |
| ans(:, :, 15, 12) = |
| 0.3536 |
| 0.3266 − 0.1353i |
| 0.2500 − 0.2500i |
| 0.1353 − 0.3266i |
| 0 − 0.3536i |
| −0.1353 − 0.3266i |
| −0.2500 − 0.2500i |
| −0.3266 − 0.1353i |
| ans(:, :, 16, 12) = |
| 0.3536 |
| 0.3536 |
| 0.3536 |
| 0.3536 |
| 0 − 0.3536i |
| 0 − 0.3536i |
| 0 − 0.3536i |
| 0 − 0.3536i |
| ans(:, :, 1, 13) = |
| 0.3536 |
| 0.2940 + 0.1964i |
| 0.1353 + 0.3266i |
| −0.0690 + 0.3468i |
| 0.3536 |
| 0.2940 + 0.1964i |
| 0.1353 + 0.3266i |
| −0.0690 + 0.3468i |
| ans(:, :, 2, 13) = |
| 0.3536 |
| 0.1964 + 0.2940i |
| −0.1353 + 0.3266i |
| −0.3468 + 0.0690i |
| 0.3536 |
| 0.1964 + 0.2940i |
| −0.1353 + 0.3266i |
| −0.3468 + 0.0690i |
| ans(:, :, 3, 13) = |
| 0.3536 |
| 0.0690 + 0.3468i |
| −0.3266 + 0.1353i |
| −0.1964 − 0.2940i |
| 0.3536 |
| 0.0690 + 0.3468i |

-continued

| Rank 1 |
| --- |
| −0.3266 + 0.1353i |
| −0.1964 − 0.2940i |
| ans(:, :, 4, 13) = |
| 0.3536 |
| −0.0690 + 0.3468i |
| −0.3266 − 0.1353i |
| 0.1964 − 0.2940i |
| 0.3536 |
| −0.0690 + 0.3468i |
| −0.3266 − 0.1353i |
| 0.1964 − 0.2940i |
| ans(:, :, 5, 13) = |
| 0.3536 |
| −0.1964 + 0.2940i |
| −0.1353 − 0.3266i |
| 0.3468 + 0.0690i |
| 0.3536 |
| −0.1964 + 0.2940i |
| −0.1353 − 0.3266i |
| 0.3468 + 0.0690i |
| ans(:, :, 6, 13) = |
| 0.3536 |
| −0.2940 + 0.1964i |
| 0.1353 − 0.3266i |
| 0.0690 + 0.3468i |
| 0.3536 |
| −0.2940 + 0.1964i |
| 0.1353 − 0.3266i |
| 0.0690 + 0.3468i |
| ans(:, :, 7, 13) = |
| 0.3536 |
| −0.3468 + 0.0690i |
| 0.3266 − 0.1353i |
| −0.2940 + 0.1964i |
| 0.3536 |
| −0.3468 + 0.0690i |
| 0.3266 − 0.1353i |
| −0.2940 + 0.1964i |
| ans(:, :, 8, 13) = |
| 0.3536 |
| −0.3468 − 0.0690i |
| 0.3266 + 0.1353i |
| −0.2940 − 0.1964i |
| 0.3536 |
| −0.3468 − 0.0690i |
| 0.3266 + 0.1353i |
| −0.2940 − 0.1964i |
| ans(:, :, 9, 13) = |
| 0.3536 |
| −0.2940 − 0.1964i |
| 0.1353 + 0.3266i |
| 0.0690 − 0.3468i |
| 0.3536 |
| −0.2940 − 0.1964i |
| 0.1353 + 0.3266i |
| 0.0690 − 0.3468i |
| ans(:, :, 10, 13) = |
| 0.3536 |
| −0.1964 − 0.2940i |
| −0.1353 + 0.3266i |
| 0.3468 − 0.0690i |
| 0.3536 |
| −0.1964 − 0.2940i |
| −0.1353 + 0.3266i |
| 0.3468 − 0.0690i |
| ans(:, :, 11, 13) = |
| 0.3536 |
| −0.0690 − 0.3468i |
| −0.3266 + 0.1353i |
| 0.1964 + 0.2940i |

-continued

| Rank 1 |
| --- |
| 0.3536 |
| −0.0690 − 0.3468i |
| −0.3266 + 0.1353i |
| 0.1964 + 0.2940i |
| ans(:, :, 12, 13) = |
| 0.3536 |
| 0.0690−0.3468i |
| −0.3266 − 0.1353i |
| −0.1964 + 0.2940i |
| 0.3536 |
| 0.0690 − 0.3468i |
| −0.3266 − 0.1353i |
| −0.1964 + 0.2940i |
| ans(:, :, 13, 13) = |
| 0.3536 |
| 0.1964 − 0.2940i |
| −0.1353 − 0.3266i |
| −0.3468 − 0.0690i |
| 0.3536 |
| 0.1964 − 0.2940i |
| −0.1353 − 0.3266i |
| −0.3468 − 0.0690i |
| ans(:, :, 14, 13) = |
| 0.3536 |
| 0.2940 − 0.1964i |
| 0.1353 − 0.3266i |
| −0.0690 − 0.3468i |
| 0.3536 |
| 0.2940 − 0.1964i |
| 0.1353 − 0.3266i |
| −0.0690 − 0.3468i |
| ans(:, :, 15, 13) = |
| 0.3536 |
| 0.3468 − 0.0690i |
| 0.3266 − 0.1353i |
| 0.2940 − 0.1964i |
| 0.3536 |
| 0.3468 − 0.0690i |
| 0.3266 − 0.1353i |
| 0.2940 − 0.1964i |
| ans(:, :, 16, 13) = |
| 0.3536 |
| 0.3468 + 0.0690i |
| 0.3266 + 0.1353i |
| 0.2940 + 0.1964i |
| 0.3536 |
| 0.3468 + 0.0690i |
| 0.3266 + 0.1353i |
| 0.2940 + 0.1964i |
| ans(:, :, 1, 14) = |
| 0.3536 |
| 0.2940 + 0.1964i |
| 0.1353 + 0.3266i |
| −0.0690 + 0.3468i |
| 0 + 0.3536i |
| −0.1964 + 0.2940i |
| −0.3266 + 0.1353i |
| −0.3468 − 0.0690i |
| ans(:, :, 2, 14) = |
| 0.3536 |
| 0.1964 + 0.2940i |
| −0.1353 + 0.3266i |
| −0.3468 + 0.0690i |
| 0 + 0.3536i |
| −0.2940 + 0.1964i |
| −0.3266 − 0.1353i |
| −0.0690 − 0.3468i |
| ans(:, :, 3, 14) = |
| 0.3536 |
| 0.0690 + 0.3468i |

-continued

| Rank 1 |
|---|
| −0.3266 + 0.1353i |
| −0.1964 − 0.2940i |
| 0 + 0.3536i |
| −0.3468 + 0.0690i |
| −0.1353 − 0.3266i |
| 0.2940 − 0.1964i |
| ans(:, :, 4, 14) = |
| 0.3536 |
| −0.0690 + 0.3468i |
| −0.3266 − 0.1353i |
| 0.1964 − 0.2940i |
| 0 + 0.3536i |
| −0.3468 − 0.0690i |
| 0.1353 − 0.3266i |
| 0.2940 + 0.1964i |
| ans(:, :, 5, 14) = |
| 0.3536 |
| −0.1964 + 0.2940i |
| −0.1353 − 0.3266i |
| 0.3468 + 0.0690i |
| 0 + 0.3536i |
| −0.2940 − 0.1964i |
| 0.3266 − 0.1353i |
| −0.0690 + 0.3468i |
| ans(:, :, 6, 14) = |
| 0.3536 |
| −0.2940 + 0.1964i |
| 0.1353 − 0.3266i |
| 0.0690 + 0.3468i |
| 0 + 0.3536i |
| −0.1964 − 0.2940i |
| 0.3266 + 0.1353i |
| −0.3468 + 0.0690i |
| ans(:, :, 7, 14) = |
| 0.3536 |
| −0.3468 + 0.0690i |
| 0.3266 − 0.1353i |
| −0.2940 + 0.1964i |
| 0 + 0.3536i |
| −0.0690 − 0.3468i |
| 0.1353 + 0.3266i |
| −0.1964 − 0.2940i |
| ans(:, :, 8, 14) = |
| 0.3536 |
| −0.3468 − 0.0690i |
| 0.3266 + 0.1353i |
| −0.2940 − 0.1964i |
| 0 + 0.3536i |
| 0.0690 − 0.3468i |
| −0.1353 + 0.3266i |
| 0.1964 − 0.2940i |
| ans(:, :, 9, 14) = |
| 0.3536 |
| −0.2940 − 0.1964i |
| 0.1353 + 0.3266i |
| 0.0690 − 0.3468i |
| 0 + 0.3536i |
| 0.1964 − 0.2940i |
| −0.3266 + 0.1353i |
| 0.3468 + 0.0690i |
| ans(:, :, 10, 14) = |
| 0.3536 |
| −0.1964 − 0.2940i |
| −0.1353 + 0.3266i |
| 0.3468 − 0.0690i |
| 0 + 0.3536i |
| 0.2940 − 0.1964i |
| −0.3266 − 0.1353i |
| 0.0690 + 0.3468i |

-continued

| Rank 1 |
|---|
| ans(:, :, 11, 14) = |
| 0.3536 |
| −0.0690 − 0.3468i |
| −0.3266 + 0.1353i |
| 0.1964 + 0.2940i |
| 0 + 0.3536i |
| 0.3468 − 0.0690i |
| −0.1353 − 0.3266i |
| −0.2940 + 0.1964i |
| ans(:, :, 12, 14) = |
| 0.3536 |
| 0.0690 − 0.3468i |
| −0.3266 − 0.1353i |
| −0.1964 + 0.2940i |
| 0 + 0.3536i |
| 0.3468 + 0.0690i |
| 0.1353 − 0.3266i |
| −0.2940 − 0.1964i |
| ans(:, :, 13, 14) = |
| 0.3536 |
| 0.1964 − 0.2940i |
| −0.1353 − 0.3266i |
| −0.3468 − 0.0690i |
| 0 + 0.3536i |
| 0.2940 + 0.1964i |
| 0.3266 − 0.1353i |
| 0.0690 − 0.3468i |
| ans(:, :, 14, 14) = |
| 0.3536 |
| 0.2940 − 0.1964i |
| 0.1353 − 0.3266i |
| −0.0690 − 0.3468i |
| 0 + 0.3536i |
| 0.1964 + 0.2940i |
| 0.3266 + 0.1353i |
| 0.3468 − 0.0690i |
| ans(:, :, 15, 14) = |
| 0.3536 |
| 0.3468 − 0.0690i |
| 0.3266 − 0.1353i |
| 0.2940 − 0.1964i |
| 0 + 0.3536i |
| 0.0690 + 0.3468i |
| 0.1353 + 0.3266i |
| 0.1964 + 0.2940i |
| ans(:, :, 16, 14) = |
| 0.3536 |
| 0.3468 + 0.0690i |
| 0.3266 + 0.1353i |
| 0.2940 + 0.1964i |
| 0 + 0.3536i |
| −0.0690 + 0.3468i |
| −0.1353 + 0.3266i |
| −0.1964 + 0.2940i |
| ans(:, :, 1, 15) = |
| 0.3536 |
| 0.2940 + 0.1964i |
| 0.1353 + 0.3266i |
| −0.0690 + 0.3468i |
| −0.3536 |
| −0.2940 − 0.1964i |
| −0.1353 − 0.3266i |
| 0.0690 − 0.3468i |
| ans(:, :, 2, 15) = |
| 0.3536 |
| 0.1964 + 0.2940i |
| −0.1353 + 0.3266i |
| −0.3468 + 0.0690i |
| −0.3536 |
| −0.1964 − 0.2940i |

-continued

| Rank 1 |
|---|
| 0.1353 − 0.3266i |
| 0.3468 − 0.0690i |
| ans(:, :, 3, 15) = |
| 0.3536 |
| 0.0690 + 0.3468i |
| −0.3266 + 0.1353i |
| −0.1964 − 0.2940i |
| −0.3536 |
| −0.0690 − 0.3468i |
| 0.3266 − 0.1353i |
| 0.1964 + 0.2940i |
| ans(:, :, 4, 15) = |
| 0.3536 |
| −0.0690 + 0.3468i |
| −0.3266 − 0.1353i |
| 0.1964 − 0.2940i |
| −0.3536 |
| 0.0690 − 0.3468i |
| 0.3266 + 0.1353i |
| −0.1964 + 0.2940i |
| ans(:, :, 5, 15) = |
| 0.3536 |
| −0.1964 + 0.2940i |
| −0.1353 − 0.3266i |
| 0.3468 + 0.0690i |
| −0.3536 |
| 0.1964 − 0.2940i |
| 0.1353 + 0.3266i |
| −0.3468 − 0.0690i |
| ans(:, :, 6, 15) = |
| 0.3536 |
| −0.2940 + 0.1964i |
| 0.1353 − 0.3266i |
| 0.0690 + 0.3468i |
| −0.3536 |
| 0.2940 − 0.1964i |
| −0.1353 + 0.3266i |
| −0.0690 − 0.3468i |
| ans(:, :, 7, 15) = |
| 0.3536 |
| −0.3468 + 0.0690i |
| 0.3266 − 0.1353i |
| −0.2940 + 0.1964i |
| −0.3536 |
| 0.3468 − 0.0690i |
| −0.3266 + 0.1353i |
| 0.2940 − 0.1964i |
| ans(:, :, 8, 15) = |
| 0.3536 |
| −0.3468 − 0.0690i |
| 0.3266 + 0.1353i |
| −0.2940 − 0.1964i |
| −0.3536 |
| 0.3468 + 0.0690i |
| −0.3266 − 0.1353i |
| 0.2940 + 0.1964i |
| ans(:, :, 9, 15) = |
| 0.3536 |
| −0.2940 − 0.1964i |
| 0.1353 + 0.3266i |
| 0.0690 − 0.3468i |
| −0.3536 |
| 0.2940 + 0.1964i |
| −0.1353 − 0.3266i |
| −0.0690 + 0.3468i |
| ans(:, :, 10, 15) = |
| 0.3536 |
| −0.1964 − 0.2940i |
| −0.1353 + 0.3266i |
| 0.3468 − 0.0690i |

-continued

| Rank 1 |
|---|
| −0.3536 |
| 0.1964 + 0.2940i |
| 0.1353 − 0.3266i |
| −0.3468 + 0.0690i |
| ans(:, :, 11, 15) = |
| 0.3536 |
| −0.0690 − 0.3468i |
| −0.3266 + 0.1353i |
| 0.1964 + 0.2940i |
| −0.3536 |
| 0.0690 + 0.3468i |
| 0.3266 − 0.1353i |
| −0.1964 − 0.2940i |
| ans(:, :, 12, 15) = |
| 0.3536 |
| 0.0690 − 0.3468i |
| −0.3266 − 0.1353i |
| −0.1964 + 0.2940i |
| −0.3536 |
| −0.0690 + 0.3468i |
| 0.3266 + 0.1353i |
| 0.1964 − 0.2940i |
| ans(:, :, 13, 15) = |
| 0.3536 |
| 0.1964 − 0.2940i |
| −0.1353 − 0.3266i |
| −0.3468 − 0.0690i |
| −0.3536 |
| −0.1964 + 0.2940i |
| 0.1353 + 0.3266i |
| 0.3468 + 0.0690i |
| ans(:, :, 14, 15) = |
| 0.3536 |
| 0.2940 − 0.1964i |
| 0.1353 − 0.3266i |
| −0.0690 − 0.3468i |
| −0.3536 |
| −0.2940 + 0.1964i |
| −0.1353 + 0.3266i |
| 0.0690 + 0.3468i |
| ans(:, :, 15, 15) = |
| 0.3536 |
| 0.3468 − 0.0690i |
| 0.3266 − 0.1353i |
| 0.2940 − 0.1964i |
| −0.3536 |
| −0.3468 + 0.0690i |
| −0.3266 + 0.1353i |
| −0.2940 + 0.1964i |
| ans(:, :, 16, 15) = |
| 0.3536 |
| 0.3468 + 0.0690i |
| 0.3266 + 0.1353i |
| 0.2940 + 0.1964i |
| −0.3536 |
| −0.3468 − 0.0690i |
| −0.3266 − 0.1353i |
| −0.2940 − 0.1964i |
| ans(:, :, 1, 16) = |
| 0.3536 |
| 0.2940 + 0.1964i |
| 0.1353 + 0.3266i |
| −0.0690 + 0.3468i |
| 0 − 0.3536i |
| 0.1964 − 0.2940i |
| 0.3266 − 0.1353i |
| 0.3468 + 0.0690i |
| ans(:, :, 2, 16) = |
| 0.3536 |
| 0.1964 + 0.2940i |

-continued

| Rank 1 |
|---|
| −0.1353 + 0.3266i |
| −0.3468 + 0.0690i |
| 0 − 0.3536i |
| 0.2940 − 0.1964i |
| 0.3266 + 0.1353i |
| 0.0690 + 0.3468i |
| ans(:, :, 3, 16) = |
| 0.3536 |
| 0.0690 + 0.3468i |
| −0.3266 + 0.1353i |
| −0.1964 − 0.2940i |
| 0 − 0.3536i |
| 0.3468 − 0.0690i |
| 0.1353 + 0.3266i |
| −0.2940 + 0.1964i |
| ans(:, :, 4, 16) = |
| 0.3536 |
| −0.0690 + 0.3468i |
| −0.3266 − 0.1353i |
| 0.1964 − 0.2940i |
| 0 − 0.3536i |
| 0.3468 + 0.0690i |
| −0.1353 + 0.3266i |
| −0.2940 − 0.1964i |
| ans(:, :, 5, 16) = |
| 0.3536 |
| −0.1964 + 0.2940i |
| −0.1353 − 0.3266i |
| 0.3468 + 0.0690i |
| 0 − 0.3536i |
| 0.2940 + 0.1964i |
| −0.3266 + 0.1353i |
| 0.0690 − 0.3468i |
| ans(:, :, 6, 16) = |
| 0.3536 |
| −0.2940 + 0.1964i |
| 0.1353 − 0.3266i |
| 0.0690 + 0.3468i |
| 0 − 0.3536i |
| 0.1964 + 0.2940i |
| −0.3266 − 0.1353i |
| 0.3468 − 0.0690i |
| ans(:, :, 7, 16) = |
| 0.3536 |
| −0.3468 + 0.0690i |
| 0.3266 − 0.1353i |
| −0.2940 + 0.1964i |
| 0 − 0.3536i |
| 0.0690 + 0.3468i |
| −0.1353 − 0.3266i |
| 0.1964 + 0.2940i |
| ans(:, :, 8, 16) = |
| 0.3536 |
| −0.3468 − 0.0690i |
| 0.3266 + 0.1353i |
| −0.2940 − 0.1964i |
| 0 − 0.3536i |
| −0.0690 + 0.3468i |
| 0.1353 − 0.3266i |
| −0.1964 + 0.2940i |
| ans(:, :, 9, 16) = |
| 0.3536 |
| −0.2940 − 0.1964i |
| 0.1353 + 0.3266i |
| 0.0690 − 0.3468i |
| 0 − 0.3536i |
| −0.1964 + 0.2940i |
| 0.3266 − 0.1353i |
| −0.3468 − 0.0690i |

-continued

| Rank 1 |
|---|
| ans(:, :, 10, 16) = |
| 0.3536 |
| −0.1964 − 0.2940i |
| −0.1353 + 0.3266i |
| 0.3468 − 0.0690i |
| 0 − 0.3536i |
| −0.2940 + 0.1964i |
| 0.3266 + 0.1353i |
| −0.0690 − 0.3468i |
| ans(:, :, 11, 16) = |
| 0.3536 |
| −0.0690 − 0.3468i |
| −0.3266 + 0.1353i |
| 0.1964 + 0.2940i |
| 0 − 0.3536i |
| −0.3468 + 0.0690i |
| 0.1353 + 0.3266i |
| 0.2940 − 0.1964i |
| ans(:, :, 12, 16) = |
| 0.3536 |
| 0.0690 − 0.3468i |
| −0.3266 − 0.1353i |
| −0.1964 + 0.2940i |
| 0 − 0.3536i |
| −0.3468 − 0.0690i |
| −0.1353 + 0.3266i |
| 0.2940 + 0.1964i |
| ans(:, :, 13, 16) = |
| 0.3536 |
| 0.1964 − 0.2940i |
| −0.1353 − 0.3266i |
| −0.3468 − 0.0690i |
| 0 − 0.3536i |
| −0.2940 − 0.1964i |
| −0.3266 + 0.1353i |
| −0.0690 + 0.3468i |
| ans(:, :, 14, 16) = |
| 0.3536 |
| 0.2940 − 0.1964i |
| 0.1353 − 0.3266i |
| −0.0690 − 0.3468i |
| 0 − 0.3536i |
| −0.1964 − 0.2940i |
| −0.3266 − 0.1353i |
| −0.3468 + 0.0690i |
| ans(:, :, 15, 16) = |
| 0.3536 |
| 0.3468 − 0.0690i |
| 0.3266 − 0.1353i |
| 0.2940 − 0.1964i |
| 0 − 0.3536i |
| −0.0690 − 0.3468i |
| −0.1353 − 0.3266i |
| −0.1964 − 0.2940i |
| ans(:, :, 16, 16) = |
| 0.3536 |
| 0.3468 + 0.0690i |
| 0.3266 + 0.1353i |
| 0.2940 + 0.1964i |
| 0 − 0.3536i |
| 0.0690 − 0.3468i |
| 0.1353 − 0.3266i |
| 0.1964 − 0.2940i |

| Rank 2 | |
|---|---|
| ans(:, :, 1, 1) = | |
| 0.2500 | 0.2500 |
| 0.2500 | 0.2500 |
| 0.2500 | 0.2500 |
| 0.2500 | 0.2500 |
| 0.2500 | −0.2500 |
| 0.2500 | −0.2500 |
| 0.2500 | −0.2500 |
| 0.2500 | −0.2500 |
| ans(:, :, 2, 1) = | |
| 0.2500 | 0.2500 |
| 0.2310 + 0.0957i | 0.2310 + 0.0957i |
| 0.1768 + 0.1768i | 0.1768 + 0.1768i |
| 0.0957 + 0.2310i | 0.0957 + 0.2310i |
| 0.2500 | −0.2500 |
| 0.2310 + 0.0957i | −0.2310 − 0.0957i |
| 0.1768 + 0.1768i | −0.1768 − 0.1768i |
| 0.0957 + 0.2310i | −0.0957 − 0.2310i |
| ans(:, :, 3, 1) = | |
| 0.2500 | 0.2500 |
| 0.1768 + 0.1768i | 0.1768 + 0.1768i |
| 0.0000 + 0.2500i | 0.0000 + 0.2500i |
| −0.1768 + 0.1768i | −0.1768 + 0.1768i |
| 0.2500 | −0.2500 |
| 0.1768 + 0.1768i | −0.1768 − 0.1768i |
| 0.0000 + 0.2500i | −0.0000 − 0.2500i |
| −0.1768 + 0.1768i | 0.1768 − 0.1768i |
| ans(:, :, 4, 1) = | |
| 0.2500 | 0.2500 |
| 0.0957 + 0.2310i | 0.0957 + 0.2310i |
| −0.1768 + 0.1768i | −0.1768 + 0.1768i |
| −0.2310 − 0.0957i | −0.2310 − 0.0957i |
| 0.2500 | −0.2500 |
| 0.0957 + 0.2310i | −0.0957 − 0.2310i |
| −0.1768 + 0.1768i | 0.1768 − 0.1768i |
| −0.2310 − 0.0957i | 0.2310 + 0.0957i |
| ans(:, :, 5, 1) = | |
| 0.2500 | 0.2500 |
| 0.0000 + 0.2500i | 0.0000 + 0.2500i |
| −0.2500 + 0.0000i | −0.2500 + 0.0000i |
| −0.0000 − 0.2500i | −0.0000 − 0.2500i |
| 0.2500 | −0.2500 |
| 0.0000 + 0.2500i | −0.0000 − 0.2500i |
| −0.2500 + 0.0000i | 0.2500 − 0.0000i |
| −0.0000 − 0.2500i | 0.0000 + 0.2500i |
| ans(:, :, 6, 1) = | |
| 0.2500 | 0.2500 |
| −0.0957 + 0.2310i | −0.0957 + 0.2310i |
| −0.1768 − 0.1768i | −0.1768 − 0.1768i |
| 0.2310 − 0.0957i | 0.2310 − 0.0957i |
| 0.2500 | −0.2500 |
| −0.0957 + 0.2310i | 0.0957 − 0.2310i |
| −0.1768 − 0.1768i | 0.1768 + 0.1768i |
| 0.2310 − 0.0957i | −0.2310 + 0.0957i |
| ans(:, :, 7, 1) = | |
| 0.2500 | 0.2500 |
| −0.1768 + 0.1768i | −0.1768 + 0.1768i |
| −0.0000 − 0.2500i | −0.0000 − 0.2500i |
| 0.1768 + 0.1768i | 0.1768 + 0.1768i |
| 0.2500 | −0.2500 |
| −0.1768 + 0.1768i | 0.1768 − 0.1768i |
| −0.0000 − 0.2500i | 0.0000 + 0.2500i |
| 0.1768 + 0.1768i | −0.1768 − 0.1768i |
| ans(:, :, 8, 1) = | |
| 0.2500 | 0.2500 |
| −0.2310 + 0.0957i | −0.2310 + 0.0957i |
| 0.1768 − 0.1768i | 0.1768 − 0.1768i |
| −0.0957 + 0.2310i | −0.0957 + 0.2310i |
| 0.2500 | −0.2500 |
| −0.2310 + 0.0957i | 0.2310 − 0.0957i |

-continued

| Rank 2 | |
|---|---|
| 0.1768 − 0.1768i | −0.1768 + 0.1768i |
| −0.0957 + 0.2310i | 0.0957 − 0.2310i |
| ans(:, :, 9, 1) = | |
| 0.2500 | 0.2500 |
| −0.2500 + 0.0000i | −0.2500 + 0.0000i |
| 0.2500 − 0.0000i | 0.2500 − 0.0000i |
| −0.2500 + 0.0000i | −0.2500 + 0.0000i |
| 0.2500 | −0.2500 |
| −0.2500 + 0.0000i | 0.2500 − 0.0000i |
| 0.2500 − 0.0000i | −0.2500 + 0.0000i |
| −0.2500 + 0.0000i | 0.2500 − 0.0000i |
| ans(:, :, 10, 1) = | |
| 0.2500 | 0.2500 |
| −0.2310 − 0.0957i | −0.2310 − 0.0957i |
| 0.1768 + 0.1768i | 0.1768 + 0.1768i |
| −0.0957 − 0.2310i | −0.0957 − 0.2310i |
| 0.2500 | −0.2500 |
| −0.2310 − 0.0957i | 0.2310 + 0.0957i |
| 0.1768 + 0.1768i | −0.1768 − 0.1768i |
| −0.0957 − 0.2310i | 0.0957 + 0.2310i |
| ans(:, :, 11, 1) = | |
| 0.2500 | 0.2500 |
| −0.1768 − 0.1768i | −0.1768 − 0.1768i |
| 0.0000 + 0.2500i | 0.0000 + 0.2500i |
| 0.1768 − 0.1768i | 0.1768 − 0.1768i |
| 0.2500 | −0.2500 |
| −0.1768 − 0.1768i | 0.1768 + 0.1768i |
| 0.0000 + 0.2500i | −0.0000 − 0.2500i |
| 0.1768 − 0.1768i | −0.1768 + 0.1768i |
| ans(:, :, 12, 1) = | |
| 0.2500 | 0.2500 |
| −0.0957 − 0.2310i | −0.0957 − 0.2310i |
| −0.1768 + 0.1768i | −0.1768 + 0.1768i |
| 0.2310 + 0.0957i | 0.2310 + 0.0957i |
| 0.2500 | −0.2500 |
| −0.0957 − 0.2310i | 0.0957 + 0.2310i |
| −0.1768 + 0.1768i | 0.1768 − 0.1768i |
| 0.2310 + 0.0957i | −0.2310 − 0.0957i |
| ans(:, :, 13, 1) = | |
| 0.2500 | 0.2500 |
| −0.0000 − 0.2500i | −0.0000 − 0.2500i |
| −0.2500 + 0.0000i | −0.2500 + 0.0000i |
| 0.0000 + 0.2500i | 0.0000 + 0.2500i |
| 0.2500 | −0.2500 |
| −0.0000 − 0.2500i | 0.0000 + 0.2500i |
| −0.2500 + 0.0000i | 0.2500 − 0.0000i |
| 0.0000 + 0.2500i | −0.0000 − 0.2500i |
| ans(:, :, 14, 1) = | |
| 0.2500 | 0.2500 |
| 0.0957 − 0.2310i | 0.0957 − 0.2310i |
| −0.1768 − 0.1768i | −0.1768 − 0.1768i |
| −0.2310 + 0.0957i | −0.2310 + 0.0957i |
| 0.2500 | −0.2500 |
| 0.0957 − 0.2310i | −0.0957 + 0.2310i |
| −0.1768 − 0.1768i | 0.1768 + 0.1768i |
| −0.2310 + 0.0957i | 0.2310 − 0.0957i |
| ans(:, :, 15, 1) = | |
| 0.2500 | 0.2500 |
| 0.1768 − 0.1768i | 0.1768 − 0.1768i |
| −0.0000 − 0.2500i | −0.0000 − 0.2500i |
| −0.1768 − 0.1768i | −0.1768 − 0.1768i |
| 0.2500 | −0.2500 |
| 0.1768 − 0.1768i | −0.1768 + 0.1768i |
| −0.0000 − 0.2500i | 0.0000 + 0.2500i |
| −0.1768 − 0.1768i | 0.1768 + 0.1768i |
| ans(:, :, 16, 1) = | |
| 0.2500 | 0.2500 |
| 0.2310 − 0.0957i | 0.2310 − 0.0957i |
| 0.1768 − 0.1768i | 0.1768 − 0.1768i |
| 0.0957 − 0.2310i | 0.0957 − 0.2310i |

-continued

| Rank 2 | |
|---|---|
| 0.2500 | −0.2500 |
| 0.2310 − 0.0957i | −0.2310 + 0.0957i |
| 0.1768 − 0.1768i | −0.1768 + 0.1768i |
| 0.0957 − 0.2310i | −0.0957 + 0.2310i |
| ans(:, :, 1, 2) = | |
| 0.2500 | 0.2500 |
| 0.2500 | 0.2500 |
| 0.2500 | 0.2500 |
| 0.2500 | 0.2500 |
| 0 + 0.2500i | 0 − 0.2500i |
| 0 + 0.2500i | 0 − 0.2500i |
| 0 + 0.2500i | 0 − 0.2500i |
| 0 + 0.2500i | 0 − 0.2500i |
| ans(:, :, 2, 2) = | |
| 0.2500 | 0.2500 |
| 0.2310 + 0.0957i | 0.2310 + 0.0957i |
| 0.1768 + 0.1768i | 0.1768 + 0.1768i |
| 0.0957 + 0.2310i | 0.0957 + 0.2310i |
| 0 + 0.2500i | 0 − 0.2500i |
| −0.0957 + 0.2310i | 0.0957 − 0.2310i |
| −0.1768 + 0.1768i | 0.1768 − 0.1768i |
| −0.2310 + 0.0957i | 0.2310 − 0.0957i |
| ans(:, :, 3, 2) = | |
| 0.2500 | 0.2500 |
| 0.1768 + 0.1768i | 0.1768 + 0.1768i |
| 0.0000 + 0.2500i | 0.0000 + 0.2500i |
| −0.1768 + 0.1768i | −0.1768 + 0.1768i |
| 0 + 0.2500i | 0 − 0.2500i |
| −0.1768 + 0.1768i | 0.1768 − 0.1768i |
| −0.2500 + 0.0000i | 0.2500 − 0.0000i |
| −0.1768 − 0.1768i | 0.1768 + 0.1768i |
| ans(:, :, 4, 2) = | |
| 0.2500 | 0.2500 |
| 0.0957 + 0.2310i | 0.0957 + 0.2310i |
| −0.1768 + 0.1768i | −0.1768 + 0.1768i |
| −0.2310 − 0.0957i | −0.2310 − 0.0957i |
| 0 + 0.2500i | 0 − 0.2500i |
| −0.2310 + 0.0957i | 0.2310 − 0.0957i |
| −0.1768 − 0.1768i | 0.1768 + 0.1768i |
| 0.0957 − 0.2310i | −0.0957 + 0.2310i |
| ans(:, :, 5, 2) = | |
| 0.2500 | 0.2500 |
| 0.0000 + 0.2500i | 0.0000 + 0.2500i |
| −0.2500 + 0.0000i | −0.2500 + 0.0000i |
| −0.0000 − 0.2500i | −0.0000 − 0.2500i |
| 0 + 0.2500i | 0 − 0.2500i |
| −0.2500 + 0.0000i | 0.2500 − 0.0000i |
| −0.0000 − 0.2500i | 0.0000 + 0.2500i |
| 0.2500 − 0.0000i | −0.2500 + 0.0000i |
| ans(:, :, 6, 2) = | |
| 0.2500 | 0.2500 |
| −0.0957 + 0.2310i | −0.0957 + 0.2310i |
| −0.1768 − 0.1768i | −0.1768 − 0.1768i |
| 0.2310 − 0.0957i | 0.2310 − 0.0957i |
| 0 + 0.2500i | 0 − 0.2500i |
| −0.2310 − 0.0957i | 0.2310 + 0.0957i |
| 0.1768 − 0.1768i | −0.1768 + 0.1768i |
| 0.0957 + 0.2310i | −0.0957 − 0.2310i |
| ans(:, :, 7, 2) = | |
| 0.2500 | 0.2500 |
| −0.1768 + 0.1768i | −0.1768 + 0.1768i |
| −0.0000 − 0.2500i | −0.0000 − 0.2500i |
| 0.1768 + 0.1768i | 0.1768 + 0.1768i |
| 0 + 0.2500i | 0 − 0.2500i |
| −0.1768 − 0.1768i | 0.1768 + 0.1768i |
| 0.2500 − 0.0000i | −0.2500 + 0.0000i |
| −0.1768 + 0.1768i | 0.1768 − 0.1768i |
| ans(:, :, 8, 2) = | |
| 0.2500 | 0.2500 |
| −0.2310 + 0.0957i | −0.2310 + 0.0957i |

-continued

| Rank 2 | |
|---|---|
| 0.1768 − 0.1768i | 0.1768 − 0.1768i |
| −0.0957 + 0.2310i | −0.0957 + 0.2310i |
| 0 + 0.2500i | 0 − 0.2500i |
| −0.0957 − 0.2310i | 0.0957 + 0.2310i |
| 0.1768 + 0.1768i | −0.1768 − 0.1768i |
| −0.2310 − 0.0957i | 0.2310 + 0.0957i |
| ans(:, :, 9, 2) = | |
| 0.2500 | 0.2500 |
| −0.2500 + 0.0000i | −0.2500 + 0.0000i |
| 0.2500 − 0.0000i | 0.2500 − 0.0000i |
| −0.2500 + 0.0000i | −0.2500 + 0.0000i |
| 0 + 0.2500i | 0 − 0.2500i |
| −0.0000 − 0.2500i | 0.0000 + 0.2500i |
| 0.0000 + 0.2500i | −0.0000 − 0.2500i |
| −0.0000 − 0.2500i | 0.0000 + 0.2500i |
| ans(:, :, 10, 2) = | |
| 0.2500 | 0.2500 |
| −0.2310 − 0.0957i | −0.2310 − 0.0957i |
| 0.1768 + 0.1768i | 0.1768 + 0.1768i |
| −0.0957 − 0.2310i | −0.0957 − 0.2310i |
| 0 + 0.2500i | 0 − 0.2500i |
| 0.0957 − 0.2310i | −0.0957 + 0.2310i |
| −0.1768 + 0.1768i | 0.1768 − 0.1768i |
| 0.2310 − 0.0957i | −0.2310 + 0.0957i |
| ans(:, :, 11, 2) = | |
| 0.2500 | 0.2500 |
| −0.1768 − 0.1768i | −0.1768 − 0.1768i |
| 0.0000 + 0.2500i | 0.0000 + 0.2500i |
| 0.1768 − 0.1768i | 0.1768 − 0.1768i |
| 0 + 0.2500i | 0 − 0.2500i |
| 0.1768 − 0.1768i | −0.1768 + 0.1768i |
| −0.2500 + 0.0000i | 0.2500 − 0.0000i |
| 0.1768 + 0.1768i | −0.1768 − 0.1768i |
| ans(:, :, 12, 2) = | |
| 0.2500 | 0.2500 |
| −0.0957 − 0.2310i | −0.0957 − 0.2310i |
| −0.1768 + 0.1768i | −0.1768 + 0.1768i |
| 0.2310 + 0.0957i | 0.2310 + 0.0957i |
| 0 + 0.2500i | 0 − 0.2500i |
| 0.2310 − 0.0957i | −0.2310 + 0.0957i |
| −0.1768 − 0.1768i | 0.1768 + 0.1768i |
| −0.0957 + 0.2310i | 0.0957 − 0.2310i |
| ans(:, :, 13, 2) = | |
| 0.2500 | 0.2500 |
| −0.0000 − 0.2500i | −0.0000 − 0.2500i |
| −0.2500 + 0.0000i | −0.2500 + 0.0000i |
| 0.0000 + 0.2500i | 0.0000 + 0.2500i |
| 0 + 0.2500i | 0 − 0.2500i |
| 0.2500 − 0.0000i | −0.2500 + 0.0000i |
| −0.0000 − 0.2500i | 0.0000 + 0.2500i |
| −0.2500 + 0.0000i | 0.2500 − 0.0000i |
| ans(:, :, 14, 2) = | |
| 0.2500 | 0.2500 |
| 0.0957 − 0.2310i | 0.0957 − 0.2310i |
| −0.1768 − 0.1768i | −0.1768 − 0.1768i |
| −0.2310 + 0.0957i | −0.2310 + 0.0957i |
| 0 + 0.2500i | 0 − 0.2500i |
| 0.2310 + 0.0957i | −0.2310 − 0.0957i |
| 0.1768 − 0.1768i | −0.1768 + 0.1768i |
| −0.0957 − 0.2310i | 0.0957 + 0.2310i |
| ans(:, :, 15, 2) = | |
| 0.2500 | 0.2500 |
| 0.1768 − 0.1768i | 0.1768 − 0.1768i |
| −0.0000 − 0.2500i | −0.0000 − 0.2500i |
| −0.1768 − 0.1768i | −0.1768 − 0.1768i |
| 0 + 0.2500i | 0 − 0.2500i |
| 0.1768 + 0.1768i | −0.1768 − 0.1768i |
| 0.2500 − 0.0000i | −0.2500 + 0.0000i |
| 0.1768 − 0.1768i | −0.1768 + 0.1768i |

-continued

| Rank 2 | |
|---|---|
| ans(:, :, 16, 2) = | |
| 0.2500 | 0.2500 |
| 0.2310 − 0.0957i | 0.2310 − 0.0957i |
| 0.1768 − 0.1768i | 0.1768 − 0.1768i |
| 0.0957 − 0.2310i | 0.0957 − 0.2310i |
| 0 + 0.2500i | 0 − 0.2500i |
| 0.0957 + 0.2310i | −0.0957 − 0.2310i |
| 0.1768 + 0.1768i | −0.1768 − 0.1768i |
| 0.2310 + 0.0957i | −0.2310 − 0.0957i |
| ans(:, :, 1, 3) = | |
| 0.2500 | 0.2500 |
| 0.2452 + 0.0488i | 0.2452 + 0.0488i |
| 0.2310 + 0.0957i | 0.2310 + 0.0957i |
| 0.2079 + 0.1389i | 0.2079 + 0.1389i |
| 0.2500 | −0.2500 |
| 0.2452 + 0.0488i | −0.2452 − 0.0488i |
| 0.2310 + 0.0957i | −0.2310 − 0.0957i |
| 0.2079 + 0.1389i | −0.2079 − 0.1389i |
| ans(:, :, 2, 3) = | |
| 0.2500 | 0.2500 |
| 0.2079 + 0.1389i | 0.2079 + 0.1389i |
| 0.0957 + 0.2310i | 0.0957 + 0.2310i |
| −0.0488 + 0.2452i | −0.0488 + 0.2452i |
| 0.2500 | −0.2500 |
| 0.2079 + 0.1389i | −0.2079 − 0.1389i |
| 0.0957 + 0.2310i | −0.0957 − 0.2310i |
| −0.0488 + 0.2452i | 0.0488 − 0.2452i |
| ans(:, :, 3, 3) = | |
| 0.2500 | 0.2500 |
| 0.1389 + 0.2079i | 0.1389 + 0.2079i |
| −0.0957 + 0.2310i | −0.0957 + 0.2310i |
| −0.2452 + 0.0488i | −0.2452 + 0.0488i |
| 0.2500 | −0.2500 |
| 0.1389 + 0.2079i | −0.1389 − 0.2079i |
| −0.0957 + 0.2310i | 0.0957 − 0.2310i |
| −0.2452 + 0.0488i | 0.2452 − 0.0488i |
| ans(:, :, 4, 3) = | |
| 0.2500 | 0.2500 |
| 0.0488 + 0.2452i | 0.0488 + 0.2452i |
| −0.2310 + 0.0957i | −0.2310 + 0.0957i |
| −0.1389 − 0.2079i | −0.1389 − 0.2079i |
| 0.2500 | −0.2500 |
| 0.0488 + 0.2452i | −0.0488 − 0.2452i |
| −0.2310 + 0.0957i | 0.2310 − 0.0957i |
| −0.1389 − 0.2079i | 0.1389 + 0.2079i |
| ans(:, :, 5, 3) = | |
| 0.2500 | 0.2500 |
| −0.0488 + 0.2452i | −0.0488 + 0.2452i |
| −0.2310 − 0.0957i | −0.2310 − 0.0957i |
| 0.1389 − 0.2079i | 0.1389 − 0.2079i |
| 0.2500 | −0.2500 |
| −0.0488 + 0.2452i | 0.0488 − 0.2452i |
| −0.2310 − 0.0957i | 0.2310 + 0.0957i |
| 0.1389 − 0.2079i | −0.1389 + 0.2079i |
| ans(:, :, 6, 3) = | |
| 0.2500 | 0.2500 |
| −0.1389 + 0.2079i | −0.1389 + 0.2079i |
| −0.0957 − 0.2310i | −0.0957 − 0.2310i |
| 0.2452 + 0.0488i | 0.2452 + 0.0488i |
| 0.2500 | −0.2500 |
| −0.1389 + 0.2079i | 0.1389 − 0.2079i |
| −0.0957 − 0.2310i | 0.0957 + 0.2310i |
| 0.2452 + 0.0488i | −0.2452 − 0.0488i |
| ans(:, :, 7, 3) = | |
| 0.2500 | 0.2500 |
| −0.2079 + 0.1389i | −0.2079 + 0.1389i |
| 0.0957 − 0.2310i | 0.0957 − 0.2310i |
| 0.0488 + 0.2452i | 0.0488 + 0.2452i |
| 0.2500 | −0.2500 |
| −0.2079 + 0.1389i | 0.2079 − 0.1389i |

-continued

| Rank 2 | |
|---|---|
| 0.0957 − 0.2310i | −0.0957 + 0.2310i |
| 0.0488 + 0.2452i | −0.0488 − 0.2452i |
| ans(:, :, 8, 3) = | |
| 0.2500 | 0.2500 |
| −0.2452 + 0.0488i | −0.2452 + 0.0488i |
| 0.2310 − 0.0957i | 0.2310 − 0.0957i |
| −0.2079 + 0.1389i | −0.2079 + 0.1389i |
| 0.2500 | −0.2500 |
| −0.2452 + 0.0488i | 0.2452 − 0.0488i |
| 0.2310 − 0.0957i | −0.2310 + 0.0957i |
| −0.2079 + 0.1389i | 0.2079 − 0.1389i |
| ans(:, :, 9, 3) = | |
| 0.2500 | 0.2500 |
| −0.2452 − 0.0488i | −0.2452 − 0.0488i |
| 0.2310 + 0.0957i | 0.2310 + 0.0957i |
| −0.2079 − 0.1389i | −0.2079 − 0.1389i |
| 0.2500 | −0.2500 |
| −0.2452 − 0.0488i | 0.2452 + 0.0488i |
| 0.2310 + 0.0957i | −0.2310 − 0.0957i |
| −0.2079 − 0.1389i | 0.2079 + 0.1389i |
| ans(:, :, 10, 3) = | |
| 0.2500 | 0.2500 |
| −0.2079 − 0.1389i | −0.2079 − 0.1389i |
| 0.0957 + 0.2310i | 0.0957 + 0.2310i |
| 0.0488 − 0.2452i | 0.0488 − 0.2452i |
| 0.2500 | −0.2500 |
| −0.2079 − 0.1389i | 0.2079 + 0.1389i |
| 0.0957 + 0.2310i | −0.0957 − 0.2310i |
| 0.0488 − 0.2452i | −0.0488 + 0.2452i |
| ans(:, :, 11, 3) = | |
| 0.2500 | 0.2500 |
| −0.1389 − 0.2079i | −0.1389 − 0.2079i |
| −0.0957 + 0.2310i | −0.0957 + 0.2310i |
| 0.2452 − 0.0488i | 0.2452 − 0.0488i |
| 0.2500 | −0.2500 |
| −0.1389 − 0.2079i | 0.1389 + 0.2079i |
| −0.0957 + 0.2310i | 0.0957 − 0.2310i |
| 0.2452 − 0.0488i | −0.2452 + 0.0488i |
| ans(:, :, 12, 3) = | |
| 0.2500 | 0.2500 |
| −0.0488 − 0.2452i | −0.0488 − 0.2452i |
| −0.2310 + 0.0957i | −0.2310 + 0.0957i |
| 0.1389 + 0.2079i | 0.1389 + 0.2079i |
| 0.2500 | −0.2500 |
| −0.0488 − 0.2452i | 0.0488 + 0.2452i |
| −0.2310 + 0.0957i | 0.2310 − 0.0957i |
| 0.1389 + 0.2079i | −0.1389 − 0.2079i |
| ans(:, :, 13, 3) = | |
| 0.2500 | 0.2500 |
| 0.0488 − 0.2452i | 0.0488 − 0.2452i |
| −0.2310 − 0.0957i | −0.2310 − 0.0957i |
| −0.1389 + 0.2079i | −0.1389 + 0.2079i |
| 0.2500 | −0.2500 |
| 0.0488 − 0.2452i | −0.0488 + 0.2452i |
| −0.2310 − 0.0957i | 0.2310 + 0.0957i |
| −0.1389 + 0.2079i | 0.1389 − 0.2079i |
| ans(:, :, 14, 3) = | |
| 0.2500 | 0.2500 |
| 0.1389 − 0.2079i | 0.1389 − 0.2079i |
| −0.0957 − 0.2310i | −0.0957 − 0.2310i |
| −0.2452 − 0.0488i | −0.2452 − 0.0488i |
| 0.2500 | −0.2500 |
| 0.1389 − 0.2079i | −0.1389 + 0.2079i |
| −0.0957 − 0.2310i | 0.0957 + 0.2310i |
| −0.2452 − 0.0488i | 0.2452 + 0.0488i |
| ans(:, :, 15, 3) = | |
| 0.2500 | 0.2500 |
| 0.2079 − 0.1389i | 0.2079 − 0.1389i |
| 0.0957 − 0.2310i | 0.0957 − 0.2310i |
| −0.0488 − 0.2452i | −0.0488 − 0.2452i |

-continued

| Rank 2 | |
|---|---|
| 0.2500 | −0.2500 |
| 0.2079 − 0.1389i | −0.2079 + 0.1389i |
| 0.0957 − 0.2310i | −0.0957 + 0.2310i |
| −0.0488 − 0.2452i | 0.0488 + 0.2452i |
| ans(:, :, 16, 3) = | |
| 0.2500 | 0.2500 |
| 0.2452 − 0.0488i | 0.2452 − 0.0488i |
| 0.2310 − 0.0957i | 0.2310 − 0.0957i |
| 0.2079 − 0.1389i | 0.2079 − 0.1389i |
| 0.2500 | −0.2500 |
| 0.2452 − 0.0488i | −0.2452 + 0.0488i |
| 0.2310 − 0.0957i | −0.2310 + 0.0957i |
| 0.2079 − 0.1389i | −0.2079 + 0.1389i |
| ans(:, :, 1, 4) = | |
| 0.2500 | 0.2500 |
| 0.2452 + 0.0488i | 0.2452 + 0.0488i |
| 0.2310 + 0.0957i | 0.2310 + 0.0957i |
| 0.2079 + 0.1389i | 0.2079 + 0.1389i |
| 0 + 0.2500i | 0 − 0.2500i |
| −0.0488 + 0.2452i | 0.0488 − 0.2452i |
| −0.0957 + 0.2310i | 0.0957 − 0.2310i |
| −0.1389 + 0.2079i | 0.1389 − 0.2079i |
| ans(:, :, 2, 4) = | |
| 0.2500 | 0.2500 |
| 0.2079 + 0.1389i | 0.2079 + 0.1389i |
| 0.0957 + 0.2310i | 0.0957 + 0.2310i |
| −0.0488 + 0.2452i | −0.0488 + 0.2452i |
| 0 + 0.2500i | 0 − 0.2500i |
| −0.1389 + 0.2079i | 0.1389 − 0.2079i |
| −0.2310 + 0.0957i | 0.2310 − 0.0957i |
| −0.2452 − 0.0488i | 0.2452 + 0.0488i |
| ans(:, :, 3, 4) = | |
| 0.2500 | 0.2500 |
| 0.1389 + 0.2079i | 0.1389 + 0.2079i |
| −0.0957 + 0.2310i | −0.0957 + 0.2310i |
| −0.2452 + 0.0488i | −0.2452 + 0.0488i |
| 0 + 0.2500i | 0 − 0.2500i |
| −0.2079 + 0.1389i | 0.2079 − 0.1389i |
| −0.2310 − 0.0957i | 0.2310 + 0.0957i |
| −0.0488 − 0.2452i | 0.0488 + 0.2452i |
| ans(:, :, 4, 4) = | |
| 0.2500 | 0.2500 |
| 0.0488 + 0.2452i | 0.0488 + 0.2452i |
| −0.2310 + 0.0957i | −0.2310 + 0.0957i |
| −0.1389 − 0.2079i | −0.1389 − 0.2079i |
| 0 + 0.2500i | 0 − 0.2500i |
| −0.2452 + 0.0488i | 0.2452 − 0.0488i |
| −0.0957 − 0.2310i | 0.0957 + 0.2310i |
| 0.2079 − 0.1389i | −0.2079 + 0.1389i |
| ans(:, :, 5, 4) = | |
| 0.2500 | 0.2500 |
| −0.0488 + 0.2452i | −0.0488 + 0.2452i |
| −0.2310 − 0.0957i | −0.2310 − 0.0957i |
| 0.1389 − 0.2079i | 0.1389 − 0.2079i |
| 0 + 0.2500i | 0 − 0.2500i |
| −0.2452 − 0.0488i | 0.2452 + 0.0488i |
| 0.0957 − 0.2310i | −0.0957 + 0.2310i |
| 0.2079 + 0.1389i | −0.2079 − 0.1389i |
| ans(:, :, 6, 4) = | |
| 0.2500 | 0.2500 |
| −0.1389 + 0.2079i | −0.1389 + 0.2079i |
| −0.0957 − 0.2310i | −0.0957 − 0.2310i |
| 0.2452 + 0.0488i | 0.2452 + 0.0488i |
| 0 + 0.2500i | 0 − 0.2500i |
| −0.2079 − 0.1389i | 0.2079 + 0.1389i |
| 0.2310 − 0.0957i | −0.2310 + 0.0957i |
| −0.0488 + 0.2452i | 0.0488 − 0.2452i |
| ans(:, :, 7, 4) = | |
| 0.2500 | 0.2500 |
| −0.2079 + 0.1389i | −0.2079 + 0.1389i |

-continued

| Rank 2 | |
|---|---|
| 0.0957 − 0.2310i | 0.0957 − 0.2310i |
| 0.0488 + 0.2452i | 0.0488 + 0.2452i |
| 0 + 0.2500i | 0 − 0.2500i |
| −0.1389 − 0.2079i | 0.1389 + 0.2079i |
| 0.2310 + 0.0957i | −0.2310 − 0.0957i |
| −0.2452 + 0.0488i | 0.2452 − 0.0488i |
| ans(:, :, 8, 4) = | |
| 0.2500 | 0.2500 |
| −0.2452 + 0.0488i | −0.2452 + 0.0488i |
| 0.2310 − 0.0957i | 0.2310 − 0.0957i |
| −0.2079 + 0.1389i | −0.2079 + 0.1389i |
| 0 + 0.2500i | 0 − 0.2500i |
| −0.0488 − 0.2452i | 0.0488 + 0.2452i |
| 0.0957 + 0.2310i | −0.0957 − 0.2310i |
| −0.1389 − 0.2079i | 0.1389 + 0.2079i |
| ans(:, :, 9, 4) = | |
| 0.2500 | 0.2500 |
| −0.2452 − 0.0488i | −0.2452 − 0.0488i |
| 0.2310 + 0.0957i | 0.2310 + 0.0957i |
| −0.2079 − 0.1389i | −0.2079 − 0.1389i |
| 0 + 0.2500i | 0 − 0.2500i |
| 0.0488 − 0.2452i | −0.0488 + 0.2452i |
| −0.0957 + 0.2310i | 0.0957 − 0.2310i |
| 0.1389 − 0.2079i | −0.1389 + 0.2079i |
| ans(:, :, 10, 4) = | |
| 0.2500 | 0.2500 |
| −0.2079 − 0.1389i | −0.2079 − 0.1389i |
| 0.0957 + 0.2310i | 0.0957 + 0.2310i |
| 0.0488 − 0.2452i | 0.0488 − 0.2452i |
| 0 + 0.2500i | 0 − 0.2500i |
| 0.1389 − 0.2079i | −0.1389 + 0.2079i |
| −0.2310 + 0.0957i | 0.2310 − 0.0957i |
| 0.2452 + 0.0488i | −0.2452 − 0.0488i |
| ans(:, :, 11, 4) = | |
| 0.2500 | 0.2500 |
| −0.1389 − 0.2079i | −0.1389 − 0.2079i |
| −0.0957 + 0.2310i | −0.0957 + 0.2310i |
| 0.2452 − 0.0488i | 0.2452 − 0.0488i |
| 0 + 0.2500i | 0 − 0.2500i |
| 0.2079 − 0.1389i | −0.2079 + 0.1389i |
| −0.2310 − 0.0957i | 0.2310 + 0.0957i |
| 0.0488 + 0.2452i | −0.0488 − 0.2452i |
| ans(:, :, 12, 4) = | |
| 0.2500 | 0.2500 |
| −0.0488 − 0.2452i | −0.0488 − 0.2452i |
| −0.2310 + 0.0957i | −0.2310 + 0.0957i |
| 0.1389 + 0.2079i | 0.1389 + 0.2079i |
| 0 + 0.2500i | 0 − 0.2500i |
| 0.2452 − 0.0488i | −0.2452 + 0.0488i |
| −0.0957 − 0.2310i | 0.0957 + 0.2310i |
| −0.2079 + 0.1389i | 0.2079 − 0.1389i |
| ans(:, :, 13, 4) = | |
| 0.2500 | 0.2500 |
| 0.0488 − 0.2452i | 0.0488 − 0.2452i |
| −0.2310 − 0.0957i | −0.2310 − 0.0957i |
| −0.1389 + 0.2079i | −0.1389 + 0.2079i |
| 0 + 0.2500i | 0 − 0.2500i |
| 0.2452 + 0.0488i | −0.2452 − 0.0488i |
| 0.0957 − 0.2310i | −0.0957 + 0.2310i |
| −0.2079 − 0.1389i | 0.2079 + 0.1389i |
| ans(:, :, 14, 4) = | |
| 0.2500 | 0.2500 |
| 0.1389 − 0.2079i | 0.1389 − 0.2079i |
| −0.0957 − 0.2310i | −0.0957 − 0.2310i |
| −0.2452 − 0.0488i | −0.2452 − 0.0488i |
| 0 + 0.2500i | 0 − 0.2500i |
| 0.2079 + 0.1389i | −0.2079 − 0.1389i |
| 0.2310 − 0.0957i | −0.2310 + 0.0957i |
| 0.0488 − 0.2452i | −0.0488 + 0.2452i |

-continued

| Rank 2 | |
|---|---|
| ans(:, :, 15, 4) = | |
| 0.2500 | 0.2500 |
| 0.2079 − 0.1389i | 0.2079 − 0.1389i |
| 0.0957 − 0.2310i | 0.0957 − 0.2310i |
| −0.0488 − 0.2452i | −0.0488 − 0.2452i |
| 0 + 0.2500i | 0 − 0.2500i |
| 0.1389 + 0.2079i | −0.1389 − 0.2079i |
| 0.2310 + 0.0957i | −0.2310 − 0.0957i |
| 0.2452 − 0.0488i | −0.2452 + 0.0488i |
| ans(:, :, 16, 4) = | |
| 0.2500 | 0.2500 |
| 0.2452 − 0.0488i | 0.2452 − 0.0488i |
| 0.2310 − 0.0957i | 0.2310 − 0.0957i |
| 0.2079 − 0.1389i | 0.2079 − 0.1389i |
| 0 + 0.2500i | 0 − 0.2500i |
| 0.0488 + 0.2452i | −0.0488 − 0.2452i |
| 0.0957 + 0.2310i | −0.0957 − 0.2310i |
| 0.1389 + 0.2079i | −0.1389 − 0.2079i |
| ans(:, :, 1, 5) = | |
| 0.2500 | 0.2500 |
| 0.2310 + 0.0957i | 0.2310 + 0.0957i |
| 0.1768 + 0.1768i | 0.1768 + 0.1768i |
| 0.0957 + 0.2310i | 0.0957 + 0.2310i |
| 0.2500 | −0.2500 |
| 0.2310 + 0.0957i | −0.2310 − 0.0957i |
| 0.1768 + 0.1768i | −0.1768 − 0.1768i |
| 0.0957 + 0.2310i | −0.0957 − 0.2310i |
| ans(:, :, 2, 5) = | |
| 0.2500 | 0.2500 |
| 0.1768 + 0.1768i | 0.1768 + 0.1768i |
| 0.0000 + 0.2500i | 0.0000 + 0.2500i |
| −0.1768 + 0.1768i | −0.1768 + 0.1768i |
| 0.2500 | −0.2500 |
| 0.1768 + 0.1768i | −0.1768 − 0.1768i |
| 0.0000 + 0.2500i | −0.0000 − 0.2500i |
| −0.1768 + 0.1768i | 0.1768 − 0.1768i |
| ans(:, :, 3, 5) = | |
| 0.2500 | 0.2500 |
| 0.0957 + 0.2310i | 0.0957 + 0.2310i |
| −0.1768 + 0.1768i | −0.1768 + 0.1768i |
| −0.2310 − 0.0957i | −0.2310 − 0.0957i |
| 0.2500 | −0.2500 |
| 0.0957 + 0.2310i | −0.0957 − 0.2310i |
| −0.1768 + 0.1768i | 0.1768 − 0.1768i |
| −0.2310 − 0.0957i | 0.2310 + 0.0957i |
| ans(:, :, 4, 5) = | |
| 0.2500 | 0.2500 |
| 0.0000 + 0.2500i | 0.0000 + 0.2500i |
| −0.2500 + 0.0000i | −0.2500 + 0.0000i |
| −0.0000 − 0.2500i | −0.0000 − 0.2500i |
| 0.2500 | −0.2500 |
| 0.0000 + 0.2500i | −0.0000 − 0.2500i |
| −0.2500 + 0.0000i | 0.2500 − 0.0000i |
| −0.0000 − 0.2500i | 0.0000 + 0.2500i |
| ans(:, :, 5, 5) = | |
| 0.2500 | 0.2500 |
| −0.0957 + 0.2310i | −0.0957 + 0.2310i |
| −0.1768 − 0.1768i | −0.1768 − 0.1768i |
| 0.2310 − 0.0957i | 0.2310 − 0.0957i |
| 0.2500 | −0.2500 |
| −0.0957 + 0.2310i | 0.0957 − 0.2310i |
| −0.1768 − 0.1768i | 0.1768 + 0.1768i |
| 0.2310 − 0.0957i | −0.2310 + 0.0957i |
| ans(:, :, 6, 5) = | |
| 0.2500 | 0.2500 |
| −0.1768 + 0.1768i | −0.1768 + 0.1768i |
| −0.0000 − 0.2500i | −0.0000 − 0.2500i |
| 0.1768 + 0.1768i | 0.1768 + 0.1768i |
| 0.2500 | −0.2500 |
| −0.1768 + 0.1768i | 0.1768 − 0.1768i |

-continued

| Rank 2 | |
|---|---|
| −0.0000 − 0.2500i | 0.0000 + 0.2500i |
| 0.1768 + 0.1768i | −0.1768 − 0.1768i |
| ans(:, :, 7, 5) = | |
| 0.2500 | 0.2500 |
| −0.2310 + 0.0957i | −0.2310 + 0.0957i |
| 0.1768 − 0.1768i | 0.1768 − 0.1768i |
| −0.0957 + 0.2310i | −0.0957 + 0.2310i |
| 0.2500 | −0.2500 |
| −0.2310 + 0.0957i | 0.2310 − 0.0957i |
| 0.1768 − 0.1768i | −0.1768 + 0.1768i |
| −0.0957 + 0.2310i | 0.0957 − 0.2310i |
| ans(:, :, 8, 5) = | |
| 0.2500 | 0.2500 |
| −0.2500 + 0.0000i | −0.2500 + 0.0000i |
| 0.2500 − 0.0000i | 0.2500 − 0.0000i |
| −0.2500 + 0.0000i | −0.2500 + 0.0000i |
| 0.2500 | −0.2500 |
| −0.2500 + 0.0000i | 0.2500 − 0.0000i |
| 0.2500 − 0.0000i | −0.2500 + 0.0000i |
| −0.2500 + 0.0000i | 0.2500 − 0.0000i |
| ans(:, :, 9, 5) = | |
| 0.2500 | 0.2500 |
| −0.2310 − 0.0957i | −0.2310 − 0.0957i |
| 0.1768 + 0.1768i | 0.1768 + 0.1768i |
| −0.0957 − 0.2310i | −0.0957 − 0.2310i |
| 0.2500 | −0.2500 |
| −0.2310 − 0.0957i | 0.2310 + 0.0957i |
| 0.1768 + 0.1768i | −0.1768 − 0.1768i |
| −0.0957 − 0.2310i | 0.0957 + 0.2310i |
| ans(:, :, 10, 5) = | |
| 0.2500 | 0.2500 |
| −0.1768 − 0.1768i | −0.1768 − 0.1768i |
| 0.0000 + 0.2500i | 0.0000 + 0.2500i |
| 0.1768 − 0.1768i | 0.1768 − 0.1768i |
| 0.2500 | −0.2500 |
| −0.1768 − 0.1768i | 0.1768 + 0.1768i |
| 0.0000 + 0.2500i | −0.0000 − 0.2500i |
| 0.1768 − 0.1768i | −0.1768 + 0.1768i |
| ans(:, :, 11, 5) = | |
| 0.2500 | 0.2500 |
| −0.0957 − 0.2310i | −0.0957 − 0.2310i |
| −0.1768 + 0.1768i | −0.1768 + 0.1768i |
| 0.2310 + 0.0957i | 0.2310 + 0.0957i |
| 0.2500 | −0.2500 |
| −0.0957 − 0.2310i | 0.0957 + 0.2310i |
| −0.1768 + 0.1768i | 0.1768 − 0.1768i |
| 0.2310 + 0.0957i | −0.2310 − 0.0957i |
| ans(:, :, 12, 5) = | |
| 0.2500 | 0.2500 |
| −0.0000 − 0.2500i | −0.0000 − 0.2500i |
| −0.2500 + 0.0000i | −0.2500 + 0.0000i |
| 0.0000 + 0.2500i | 0.0000 + 0.2500i |
| 0.2500 | −0.2500 |
| −0.0000 − 0.2500i | 0.0000 + 0.2500i |
| −0.2500 + 0.0000i | 0.2500 − 0.0000i |
| 0.0000 + 0.2500i | −0.0000 − 0.2500i |
| ans(:, :, 13, 5) = | |
| 0.2500 | 0.2500 |
| 0.0957 − 0.2310i | 0.0957 − 0.2310i |
| −0.1768 − 0.1768i | −0.1768 − 0.1768i |
| −0.2310 + 0.0957i | −0.2310 + 0.0957i |
| 0.2500 | −0.2500 |
| 0.0957 − 0.2310i | −0.0957 + 0.2310i |
| −0.1768 − 0.1768i | 0.1768 + 0.1768i |
| −0.2310 + 0.0957i | 0.2310 − 0.0957i |
| ans(:, :, 14, 5) = | |
| 0.2500 | 0.2500 |
| 0.1768 − 0.1768i | 0.1768 − 0.1768i |
| −0.0000 − 0.2500i | −0.0000 − 0.2500i |
| −0.1768 − 0.1768i | −0.1768 − 0.1768i |

-continued

| Rank 2 | |
|---|---|
| 0.2500 | −0.2500 |
| 0.1768 − 0.1768i | −0.1768 + 0.1768i |
| −0.0000 − 0.2500i | 0.0000 + 0.2500i |
| −0.1768 − 0.1768i | 0.1768 + 0.1768i |
| ans(:, :, 15, 5) = | |
| 0.2500 | 0.2500 |
| 0.2310 − 0.0957i | 0.2310 − 0.0957i |
| 0.1768 − 0.1768i | 0.1768 − 0.1768i |
| 0.0957 − 0.2310i | 0.0957 − 0.2310i |
| 0.2500 | −0.2500 |
| 0.2310 − 0.0957i | −0.2310 + 0.0957i |
| 0.1768 − 0.1768i | −0.1768 + 0.1768i |
| 0.0957 − 0.2310i | −0.0957 + 0.2310i |
| ans(:, :, 16, 5) = | |
| 0.2500 | 0.2500 |
| 0.2500 | 0.2500 |
| 0.2500 | 0.2500 |
| 0.2500 | 0.2500 |
| 0.2500 | −0.2500 |
| 0.2500 | −0.2500 |
| 0.2500 | −0.2500 |
| 0.2500 | −0.2500 |
| ans(:, :, 1, 6) = | |
| 0.2500 | 0.2500 |
| 0.2310 + 0.0957i | 0.2310 + 0.0957i |
| 0.1768 + 0.1768i | 0.1768 + 0.1768i |
| 0.0957 + 0.2310i | 0.0957 + 0.2310i |
| 0 + 0.2500i | 0 − 0.2500i |
| −0.0957 + 0.2310i | 0.0957 − 0.2310i |
| −0.1768 + 0.1768i | 0.1768 − 0.1768i |
| −0.2310 + 0.0957i | 0.2310 − 0.0957i |
| ans(:, :, 2, 6) = | |
| 0.2500 | 0.2500 |
| 0.1768 + 0.1768i | 0.1768 + 0.1768i |
| 0.0000 + 0.2500i | 0.0000 + 0.2500i |
| −0.1768 + 0.1768i | −0.1768 + 0.1768i |
| 0 + 0.2500i | 0 − 0.2500i |
| −0.1768 + 0.1768i | 0.1768 − 0.1768i |
| −0.2500 + 0.0000i | 0.2500 − 0.0000i |
| −0.1768 − 0.1768i | 0.1768 + 0.1768i |
| ans(:, :, 3, 6) = | |
| 0.2500 | 0.2500 |
| 0.0957 + 0.2310i | 0.0957 + 0.2310i |
| −0.1768 + 0.1768i | −0.1768 + 0.1768i |
| −0.2310 − 0.0957i | −0.2310 − 0.0957i |
| 0 + 0.2500i | 0 − 0.2500i |
| −0.2310 + 0.0957i | 0.2310 − 0.0957i |
| −0.1768 − 0.1768i | 0.1768 + 0.1768i |
| 0.0957 − 0.2310i | −0.0957 + 0.2310i |
| ans(:, :, 4, 6) = | |
| 0.2500 | 0.2500 |
| 0.0000 + 0.2500i | 0.0000 + 0.2500i |
| −0.2500 + 0.0000i | −0.2500 + 0.0000i |
| −0.0000 − 0.2500i | −0.0000 − 0.2500i |
| 0 + 0.2500i | 0 − 0.2500i |
| −0.2500 + 0.0000i | 0.2500 − 0.0000i |
| −0.0000 − 0.2500i | 0.0000 + 0.2500i |
| 0.2500 − 0.0000i | −0.2500 + 0.0000i |
| ans(:, :, 5, 6) = | |
| 0.2500 | 0.2500 |
| −0.0957 + 0.2310i | −0.0957 + 0.2310i |
| −0.1768 − 0.1768i | −0.1768 − 0.1768i |
| 0.2310 − 0.0957i | 0.2310 − 0.0957i |
| 0 + 0.2500i | 0 − 0.2500i |
| −0.2310 − 0.0957i | 0.2310 + 0.0957i |
| 0.1768 − 0.1768i | −0.1768 + 0.1768i |
| 0.0957 + 0.2310i | −0.0957 − 0.2310i |
| ans(:, :, 6, 6) = | |
| 0.2500 | 0.2500 |
| −0.1768 + 0.1768i | −0.1768 + 0.1768i |

-continued

| Rank 2 | |
|---|---|
| −0.0000 − 0.2500i | −0.0000 − 0.2500i |
| 0.1768 + 0.1768i | 0.1768 + 0.1768i |
| 0 + 0.2500i | 0 − 0.2500i |
| −0.1768 − 0.1768i | 0.1768 + 0.1768i |
| 0.2500 − 0.0000i | −0.2500 + 0.0000i |
| −0.1768 + 0.1768i | 0.1768 − 0.1768i |
| ans(:, :, 7, 6) = | |
| 0.2500 | 0.2500 |
| −0.2310 + 0.0957i | −0.2310 + 0.0957i |
| 0.1768 − 0.1768i | 0.1768 − 0.1768i |
| −0.0957 + 0.2310i | −0.0957 + 0.2310i |
| 0 + 0.2500i | 0 − 0.2500i |
| −0.0957 − 0.2310i | 0.0957 + 0.2310i |
| 0.1768 + 0.1768i | −0.1768 − 0.1768i |
| −0.2310 − 0.0957i | 0.2310 + 0.0957i |
| ans(:, :, 8, 6) = | |
| 0.2500 | 0.2500 |
| −0.2500 + 0.0000i | −0.2500 + 0.0000i |
| 0.2500 − 0.0000i | 0.2500 − 0.0000i |
| −0.2500 + 0.0000i | −0.2500 + 0.0000i |
| 0 + 0.2500i | 0 − 0.2500i |
| −0.0000 − 0.2500i | 0.0000 + 0.2500i |
| 0.0000 + 0.2500i | −0.0000 − 0.2500i |
| −0.0000 − 0.2500i | 0.0000 + 0.2500i |
| ans(:, :, 9, 6) = | |
| 0.2500 | 0.2500 |
| −0.2310 − 0.0957i | −0.2310 − 0.0957i |
| 0.1768 + 0.1768i | 0.1768 + 0.1768i |
| −0.0957 − 0.2310i | −0.0957 − 0.2310i |
| 0 + 0.2500i | 0 − 0.2500i |
| 0.0957 − 0.2310i | −0.0957 + 0.2310i |
| −0.1768 + 0.1768i | 0.1768 − 0.1768i |
| 0.2310 − 0.0957i | −0.2310 + 0.0957i |
| ans(:, :, 10, 6) = | |
| 0.2500 | 0.2500 |
| −0.1768 − 0.1768i | −0.1768 − 0.1768i |
| 0.0000 + 0.2500i | 0.0000 + 0.2500i |
| 0.1768 − 0.1768i | 0.1768 − 0.1768i |
| 0 + 0.2500i | 0 − 0.2500i |
| 0.1768 − 0.1768i | −0.1768 + 0.1768i |
| −0.2500 + 0.0000i | 0.2500 − 0.0000i |
| 0.1768 + 0.1768i | −0.1768 − 0.1768i |
| ans(:, :, 11, 6) = | |
| 0.2500 | 0.2500 |
| −0.0957 − 0.2310i | −0.0957 − 0.2310i |
| −0.1768 + 0.1768i | −0.1768 + 0.1768i |
| 0.2310 + 0.0957i | 0.2310 + 0.0957i |
| 0 + 0.2500i | 0 − 0.2500i |
| 0.2310 − 0.0957i | −0.2310 + 0.0957i |
| −0.1768 − 0.1768i | 0.1768 + 0.1768i |
| −0.0957 + 0.2310i | 0.0957 − 0.2310i |
| ans(:, :, 12, 6) = | |
| 0.2500 | 0.2500 |
| −0.0000 − 0.2500i | −0.0000 − 0.2500i |
| −0.2500 + 0.0000i | −0.2500 + 0.0000i |
| 0.0000 + 0.2500i | 0.0000 + 0.2500i |
| 0 + 0.2500i | 0 − 0.2500i |
| 0.2500 − 0.0000i | −0.2500 + 0.0000i |
| −0.0000 − 0.2500i | 0.0000 + 0.2500i |
| −0.2500 + 0.0000i | 0.2500 − 0.0000i |
| ans(:, :, 13, 6) = | |
| 0.2500 | 0.2500 |
| 0.0957 − 0.2310i | 0.0957 − 0.2310i |
| −0.1768 − 0.1768i | −0.1768 − 0.1768i |
| −0.2310 + 0.0957i | −0.2310 + 0.0957i |
| 0 + 0.2500i | 0 − 0.2500i |
| 0.2310 + 0.0957i | −0.2310 − 0.0957i |
| 0.1768 − 0.1768i | −0.1768 + 0.1768i |
| −0.0957 − 0.2310i | 0.0957 + 0.2310i |

-continued

| Rank 2 | |
|---|---|
| ans(:, :, 14, 6) = | |
| 0.2500 | 0.2500 |
| 0.1768 − 0.1768i | 0.1768 − 0.1768i |
| −0.0000 − 0.2500i | −0.0000 − 0.2500i |
| −0.1768 − 0.1768i | −0.1768 − 0.1768i |
| 0 + 0.2500i | 0 − 0.2500i |
| 0.1768 + 0.1768i | −0.1768 − 0.1768i |
| 0.2500 − 0.0000i | −0.2500 + 0.0000i |
| 0.1768 − 0.1768i | −0.1768 + 0.1768i |
| ans(:, :, 15, 6) = | |
| 0.2500 | 0.2500 |
| 0.2310 − 0.0957i | 0.2310 − 0.0957i |
| 0.1768 − 0.1768i | 0.1768 − 0.1768i |
| 0.0957 − 0.2310i | 0.0957 − 0.2310i |
| 0 + 0.2500i | 0 − 0.2500i |
| 0.0957 + 0.2310i | −0.0957 − 0.2310i |
| 0.1768 + 0.1768i | −0.1768 − 0.1768i |
| 0.2310 + 0.0957i | −0.2310 − 0.0957i |
| ans(:, :, 16, 6) = | |
| 0.2500 | 0.2500 |
| 0.2500 | 0.2500 |
| 0.2500 | 0.2500 |
| 0.2500 | 0.2500 |
| 0 + 0.2500i | 0 − 0.2500i |
| 0 + 0.2500i | 0 − 0.2500i |
| 0 + 0.2500i | 0 − 0.2500i |
| 0 + 0.2500i | 0 − 0.2500i |
| ans(:, :, 1, 7) = | |
| 0.2500 | 0.2500 |
| 0.2079 + 0.1389i | 0.2079 + 0.1389i |
| 0.0957 + 0.2310i | 0.0957 + 0.2310i |
| −0.0488 + 0.2452i | −0.0488 + 0.2452i |
| 0.2500 | −0.2500 |
| 0.2079 + 0.1389i | −0.2079 − 0.1389i |
| 0.0957 + 0.2310i | −0.0957 − 0.2310i |
| −0.0488 + 0.2452i | 0.0488 − 0.2452i |
| ans(:, :, 2, 7) = | |
| 0.2500 | 0.2500 |
| 0.1389 + 0.2079i | 0.1389 + 0.2079i |
| −0.0957 + 0.2310i | −0.0957 + 0.2310i |
| −0.2452 + 0.0488i | −0.2452 + 0.0488i |
| 0.2500 | −0.2500 |
| 0.1389 + 0.2079i | −0.1389 − 0.2079i |
| −0.0957 + 0.2310i | 0.0957 − 0.2310i |
| −0.2452 + 0.0488i | 0.2452 − 0.0488i |
| ans(:, :, 3, 7) = | |
| 0.2500 | 0.2500 |
| 0.0488 + 0.2452i | 0.0488 + 0.2452i |
| −0.2310 + 0.0957i | −0.2310 + 0.0957i |
| −0.1389 − 0.2079i | −0.1389 − 0.2079i |
| 0.2500 | −0.2500 |
| 0.0488 + 0.2452i | −0.0488 − 0.2452i |
| −0.2310 + 0.0957i | 0.2310 − 0.0957i |
| −0.1389 − 0.2079i | 0.1389 + 0.2079i |
| ans(:, :, 4, 7) = | |
| 0.2500 | 0.2500 |
| −0.0488 + 0.2452i | −0.0488 + 0.2452i |
| −0.2310 − 0.0957i | −0.2310 − 0.0957i |
| 0.1389 − 0.2079i | 0.1389 − 0.2079i |
| 0.2500 | −0.2500 |
| −0.0488 + 0.2452i | 0.0488 − 0.2452i |
| −0.2310 − 0.0957i | 0.2310 + 0.0957i |
| 0.1389 − 0.2079i | −0.1389 + 0.2079i |
| ans(:, :, 5, 7) = | |
| 0.2500 | 0.2500 |
| −0.1389 + 0.2079i | −0.1389 + 0.2079i |
| −0.0957 − 0.2310i | −0.0957 − 0.2310i |
| 0.2452 + 0.0488i | 0.2452 + 0.0488i |
| 0.2500 | −0.2500 |
| −0.1389 + 0.2079i | 0.1389 − 0.2079i |

-continued

| Rank 2 | |
|---|---|
| −0.0957 − 0.2310i | 0.0957 + 0.2310i |
| 0.2452 + 0.0488i | −0.2452 − 0.0488i |
| ans(:, :, 6, 7) = | |
| 0.2500 | 0.2500 |
| −0.2079 + 0.1389i | −0.2079 + 0.1389i |
| 0.0957 − 0.2310i | 0.0957 − 0.2310i |
| 0.0488 + 0.2452i | 0.0488 + 0.2452i |
| 0.2500 | −0.2500 |
| −0.2079 + 0.1389i | 0.2079 − 0.1389i |
| 0.0957 − 0.2310i | −0.0957 + 0.2310i |
| 0.0488 + 0.2452i | −0.0488 − 0.2452i |
| ans(:, :, 7, 7) = | |
| 0.2500 | 0.2500 |
| −0.2452 + 0.0488i | −0.2452 + 0.0488i |
| 0.2310 − 0.0957i | 0.2310 − 0.0957i |
| −0.2079 + 0.1389i | −0.2079 + 0.1389i |
| 0.2500 | −0.2500 |
| −0.2452 + 0.0488i | 0.2452 − 0.0488i |
| 0.2310 − 0.0957i | −0.2310 + 0.0957i |
| −0.2079 + 0.1389i | 0.2079 − 0.1389i |
| ans(:, :, 8, 7) = | |
| 0.2500 | 0.2500 |
| −0.2452 − 0.0488i | −0.2452 − 0.0488i |
| 0.2310 + 0.0957i | 0.2310 + 0.0957i |
| −0.2079 − 0.1389i | −0.2079 − 0.1389i |
| 0.2500 | −0.2500 |
| −0.2452 − 0.0488i | 0.2452 + 0.0488i |
| 0.2310 + 0.0957i | −0.2310 − 0.0957i |
| −0.2079 − 0.1389i | 0.2079 + 0.1389i |
| ans(:, :, 9, 7) = | |
| 0.2500 | 0.2500 |
| −0.2079 − 0.1389i | −0.2079 − 0.1389i |
| 0.0957 + 0.2310i | 0.0957 + 0.2310i |
| 0.0488 − 0.2452i | 0.0488 − 0.2452i |
| 0.2500 | −0.2500 |
| −0.2079 − 0.1389i | 0.2079 + 0.1389i |
| 0.0957 + 0.2310i | −0.0957 − 0.2310i |
| 0.0488 − 0.2452i | −0.0488 + 0.2452i |
| ans(:, :, 10, 7) = | |
| 0.2500 | 0.2500 |
| −0.1389 − 0.2079i | −0.1389 − 0.2079i |
| −0.0957 + 0.2310i | −0.0957 + 0.2310i |
| 0.2452 − 0.0488i | 0.2452 − 0.0488i |
| 0.2500 | −0.2500 |
| −0.1389 − 0.2079i | 0.1389 + 0.2079i |
| −0.0957 + 0.2310i | 0.0957 − 0.2310i |
| 0.2452 − 0.0488i | −0.2452 + 0.0488i |
| ans(:, :, 11, 7) = | |
| 0.2500 | 0.2500 |
| −0.0488 − 0.2452i | −0.0488 − 0.2452i |
| −0.2310 + 0.0957i | −0.2310 + 0.0957i |
| 0.1389 + 0.2079i | 0.1389 + 0.2079i |
| 0.2500 | −0.2500 |
| −0.0488 − 0.2452i | 0.0488 + 0.2452i |
| −0.2310 + 0.0957i | 0.2310 − 0.0957i |
| 0.1389 + 0.2079i | −0.1389 − 0.2079i |
| ans(:, :, 12, 7) = | |
| 0.2500 | 0.2500 |
| 0.0488 − 0.2452i | 0.0488 − 0.2452i |
| −0.2310 − 0.0957i | −0.2310 − 0.0957i |
| −0.1389 + 0.2079i | −0.1389 + 0.2079i |
| 0.2500 | −0.2500 |
| 0.0488 − 0.2452i | −0.0488 + 0.2452i |
| −0.2310 − 0.0957i | 0.2310 + 0.0957i |
| −0.1389 + 0.2079i | 0.1389 − 0.2079i |
| ans(:, :, 13, 7) = | |
| 0.2500 | 0.2500 |
| 0.1389 − 0.2079i | 0.1389 − 0.2079i |
| −0.0957 − 0.2310i | −0.0957 − 0.2310i |
| −0.2452 − 0.0488i | −0.2452 − 0.0488i |

-continued

| Rank 2 | |
|---|---|
| 0.2500 | −0.2500 |
| 0.1389 − 0.2079i | −0.1389 + 0.2079i |
| −0.0957 − 0.2310i | 0.0957 + 0.2310i |
| −0.2452 − 0.0488i | 0.2452 + 0.0488i |
| ans(:, :, 14, 7) = | |
| 0.2500 | 0.2500 |
| 0.2079 − 0.1389i | 0.2079 − 0.1389i |
| 0.0957 − 0.2310i | 0.0957 − 0.2310i |
| −0.0488 − 0.2452i | −0.0488 − 0.2452i |
| 0.2500 | −0.2500 |
| 0.2079 − 0.1389i | −0.2079 + 0.1389i |
| 0.0957 − 0.2310i | −0.0957 + 0.2310i |
| −0.0488 − 0.2452i | 0.0488 + 0.2452i |
| ans(:, :, 15, 7) = | |
| 0.2500 | 0.2500 |
| 0.2452 − 0.0488i | 0.2452 − 0.0488i |
| 0.2310 − 0.0957i | 0.2310 − 0.0957i |
| 0.2079 − 0.1389i | 0.2079 − 0.1389i |
| 0.2500 | −0.2500 |
| 0.2452 − 0.0488i | −0.2452 + 0.0488i |
| 0.2310 − 0.0957i | −0.2310 + 0.0957i |
| 0.2079 − 0.1389i | −0.2079 + 0.1389i |
| ans(:, :, 16, 7) = | |
| 0.2500 | 0.2500 |
| 0.2452 + 0.0488i | 0.2452 + 0.0488i |
| 0.2310 + 0.0957i | 0.2310 + 0.0957i |
| 0.2079 + 0.1389i | 0.2079 + 0.1389i |
| 0.2500 | −0.2500 |
| 0.2452 + 0.0488i | −0.2452 − 0.0488i |
| 0.2310 + 0.0957i | −0.2310 − 0.0957i |
| 0.2079 + 0.1389i | −0.2079 − 0.1389i |
| ans(:, :, 1, 8) = | |
| 0.2500 | 0.2500 |
| 0.2079 + 0.1389i | 0.2079 + 0.1389i |
| 0.0957 + 0.2310i | 0.0957 + 0.2310i |
| −0.0488 + 0.2452i | −0.0488 + 0.2452i |
| 0 + 0.2500i | 0 − 0.2500i |
| −0.1389 + 0.2079i | 0.1389 − 0.2079i |
| −0.2310 + 0.0957i | 0.2310 − 0.0957i |
| −0.2452 − 0.0488i | 0.2452 + 0.0488i |
| ans(:, :, 2, 8) = | |
| 0.2500 | 0.2500 |
| 0.1389 + 0.2079i | 0.1389 + 0.2079i |
| −0.0957 + 0.2310i | −0.0957 + 0.2310i |
| −0.2452 + 0.0488i | −0.2452 + 0.0488i |
| 0 + 0.2500i | 0 − 0.2500i |
| −0.2079 + 0.1389i | 0.2079 − 0.1389i |
| −0.2310 − 0.0957i | 0.2310 + 0.0957i |
| −0.0488 − 0.2452i | 0.0488 + 0.2452i |
| ans(:, :, 3, 8) = | |
| 0.2500 | 0.2500 |
| 0.0488 + 0.2452i | 0.0488 + 0.2452i |
| −0.2310 + 0.0957i | −0.2310 + 0.0957i |
| −0.1389 − 0.2079i | −0.1389 − 0.2079i |
| 0 + 0.2500i | 0 − 0.2500i |
| −0.2452 + 0.0488i | 0.2452 − 0.0488i |
| −0.0957 − 0.2310i | 0.0957 + 0.2310i |
| 0.2079 − 0.1389i | −0.2079 + 0.1389i |
| ans(:, :, 4, 8) = | |
| 0.2500 | 0.2500 |
| −0.0488 + 0.2452i | −0.0488 + 0.2452i |
| −0.2310 − 0.0957i | −0.2310 − 0.0957i |
| 0.1389 − 0.2079i | 0.1389 − 0.2079i |
| 0 + 0.2500i | 0 − 0.2500i |
| −0.2452 − 0.0488i | 0.2452 + 0.0488i |
| 0.0957 − 0.2310i | −0.0957 + 0.2310i |
| 0.2079 + 0.1389i | −0.2079 − 0.1389i |
| ans(:, :, 5, 8) = | |
| 0.2500 | 0.2500 |
| −0.1389 + 0.2079i | −0.1389 + 0.2079i |

-continued

| Rank 2 | |
|---|---|
| −0.0957 − 0.2310i | −0.0957 − 0.2310i |
| 0.2452 + 0.0488i | 0.2452 + 0.0488i |
| 0 + 0.2500i | 0 − 0.2500i |
| −0.2079 − 0.1389i | 0.2079 + 0.1389i |
| 0.2310 − 0.0957i | −0.2310 + 0.0957i |
| −0.0488 + 0.2452i | 0.0488 − 0.2452i |
| ans(:, :, 6, 8) = | |
| 0.2500 | 0.2500 |
| −0.2079 + 0.1389i | −0.2079 + 0.1389i |
| 0.0957 − 0.2310i | 0.0957 − 0.2310i |
| 0.0488 + 0.2452i | 0.0488 + 0.2452i |
| 0 + 0.2500i | 0 − 0.2500i |
| −0.1389 − 0.2079i | 0.1389 + 0.2079i |
| 0.2310 + 0.0957i | −0.2310 − 0.0957i |
| −0.2452 + 0.0488i | 0.2452 − 0.0488i |
| ans(:, :, 7, 8) = | |
| 0.2500 | 0.2500 |
| −0.2452 + 0.0488i | −0.2452 + 0.0488i |
| 0.2310 − 0.0957i | 0.2310 − 0.0957i |
| −0.2079 + 0.1389i | −0.2079 + 0.1389i |
| 0 + 0.2500i | 0 − 0.2500i |
| −0.0488 − 0.2452i | 0.0488 + 0.2452i |
| 0.0957 + 0.2310i | −0.0957 − 0.2310i |
| −0.1389 − 0.2079i | 0.1389 + 0.2079i |
| ans(:, :, 8, 8) = | |
| 0.2500 | 0.2500 |
| −0.2452 − 0.0488i | −0.2452 − 0.0488i |
| 0.2310 + 0.0957i | 0.2310 + 0.0957i |
| −0.2079 − 0.1389i | −0.2079 − 0.1389i |
| 0 + 0.2500i | 0 − 0.2500i |
| 0.0488 − 0.2452i | −0.0488 + 0.2452i |
| −0.0957 + 0.2310i | 0.0957 − 0.2310i |
| 0.1389 − 0.2079i | −0.1389 + 0.2079i |
| ans(:, :, 9, 8) = | |
| 0.2500 | 0.2500 |
| −0.2079 − 0.1389i | −0.2079 − 0.1389i |
| 0.0957 + 0.2310i | 0.0957 + 0.2310i |
| 0.0488 − 0.2452i | 0.0488 − 0.2452i |
| 0 + 0.2500i | 0 − 0.2500i |
| 0.1389 − 0.2079i | −0.1389 + 0.2079i |
| −0.2310 + 0.0957i | 0.2310 − 0.0957i |
| 0.2452 + 0.0488i | −0.2452 − 0.0488i |
| ans(:, :, 10, 8) = | |
| 0.2500 | 0.2500 |
| −0.1389 − 0.2079i | −0.1389 − 0.2079i |
| −0.0957 + 0.2310i | −0.0957 + 0.2310i |
| 0.2452 − 0.0488i | 0.2452 − 0.0488i |
| 0 + 0.2500i | 0 − 0.2500i |
| 0.2079 − 0.1389i | −0.2079 + 0.1389i |
| −0.2310 − 0.0957i | 0.2310 + 0.0957i |
| 0.0488 + 0.2452i | −0.0488 − 0.2452i |
| ans(:, :, 11, 8) = | |
| 0.2500 | 0.2500 |
| −0.0488 − 0.2452i | −0.0488 − 0.2452i |
| −0.2310 + 0.0957i | −0.2310 + 0.0957i |
| 0.1389 + 0.2079i | 0.1389 + 0.2079i |
| 0 + 0.2500i | 0 − 0.2500i |
| 0.2452 − 0.0488i | −0.2452 + 0.0488i |
| −0.0957 − 0.2310i | 0.0957 + 0.2310i |
| −0.2079 + 0.1389i | 0.2079 − 0.1389i |
| ans(:, :, 12, 8) = | |
| 0.2500 | 0.2500 |
| 0.0488 − 0.2452i | 0.0488 − 0.2452i |
| −0.2310 − 0.0957i | −0.2310 − 0.0957i |
| −0.1389 + 0.2079i | −0.1389 + 0.2079i |
| 0 + 0.2500i | 0 − 0.2500i |
| 0.2452 + 0.0488i | −0.2452 − 0.0488i |
| 0.0957 − 0.2310i | −0.0957 + 0.2310i |
| −0.2079 − 0.1389i | 0.2079 + 0.1389i |

-continued

| Rank 2 | |
|---|---|
| ans(:, :, 13, 8) = | |
| 0.2500 | 0.2500 |
| 0.1389 − 0.2079i | 0.1389 − 0.2079i |
| −0.0957 − 0.2310i | −0.0957 − 0.2310i |
| −0.2452 − 0.0488i | −0.2452 − 0.0488i |
| 0 + 0.2500i | 0 − 0.2500i |
| 0.2079 + 0.1389i | −0.2079 − 0.1389i |
| 0.2310 − 0.0957i | −0.2310 + 0.0957i |
| 0.0488 − 0.2452i | −0.0488 + 0.2452i |
| ans(:, :, 14, 8) = | |
| 0.2500 | 0.2500 |
| 0.2079 − 0.1389i | 0.2079 − 0.1389i |
| 0.0957 − 0.2310i | 0.0957 − 0.2310i |
| −0.0488 − 0.2452i | −0.0488 − 0.2452i |
| 0 + 0.2500i | 0 − 0.2500i |
| 0.1389 + 0.2079i | −0.1389 − 0.2079i |
| 0.2310 + 0.0957i | −0.2310 − 0.0957i |
| 0.2452 − 0.0488i | −0.2452 + 0.0488i |
| ans(:, :, 15, 8) = | |
| 0.2500 | 0.2500 |
| 0.2452 − 0.0488i | 0.2452 − 0.0488i |
| 0.2310 − 0.0957i | 0.2310 − 0.0957i |
| 0.2079 − 0.1389i | 0.2079 − 0.1389i |
| 0 + 0.2500i | 0 − 0.2500i |
| 0.0488 + 0.2452i | −0.0488 − 0.2452i |
| 0.0957 + 0.2310i | −0.0957 − 0.2310i |
| 0.1389 + 0.2079i | −0.1389 − 0.2079i |
| ans(:, :, 16, 8) = | |
| 0.2500 | 0.2500 |
| 0.2452 + 0.0488i | 0.2452 + 0.0488i |
| 0.2310 + 0.0957i | 0.2310 + 0.0957i |
| 0.2079 + 0.1389i | 0.2079 + 0.1389i |
| 0 + 0.2500i | 0 − 0.2500i |
| −0.0488 + 0.2452i | 0.0488 − 0.2452i |
| −0.0957 + 0.2310i | 0.0957 − 0.2310i |
| −0.1389 + 0.2079i | 0.1389 − 0.2079i |
| ans(:, :, 1, 9) = | |
| 0.2500 | 0.2500 |
| 0.2500 | 0.2452 + 0.0488i |
| 0.2500 | 0.2310 + 0.0957i |
| 0.2500 | 0.2079 + 0.1389i |
| 0.2500 | −0.2500 |
| 0.2500 | −0.2452 − 0.0488i |
| 0.2500 | −0.2310 − 0.0957i |
| 0.2500 | −0.2079 − 0.1389i |
| ans(:, :, 2, 9) = | |
| 0.2500 | 0.2500 |
| 0.2310 + 0.0957i | 0.2079 + 0.1389i |
| 0.1768 + 0.1768i | 0.0957 + 0.2310i |
| 0.0957 + 0.2310i | −0.0488 + 0.2452i |
| 0.2500 | −0.2500 |
| 0.2310 + 0.0957i | −0.2079 − 0.1389i |
| 0.1768 + 0.1768i | −0.0957 − 0.2310i |
| 0.0957 + 0.2310i | 0.0488 − 0.2452i |
| ans(:, :, 3, 9) = | |
| 0.2500 | 0.2500 |
| 0.1768 + 0.1768i | 0.1389 + 0.2079i |
| 0.0000 + 0.2500i | −0.0957 + 0.2310i |
| −0.1768 + 0.1768i | −0.2452 + 0.0488i |
| 0.2500 | −0.2500 |
| 0.1768 + 0.1768i | −0.1389 − 0.2079i |
| 0.0000 + 0.2500i | 0.0957 − 0.2310i |
| −0.1768 + 0.1768i | 0.2452 − 0.0488i |
| ans(:, :, 4, 9) = | |
| 0.2500 | 0.2500 |
| 0.0957 + 0.2310i | 0.0488 + 0.2452i |
| −0.1768 + 0.1768i | −0.2310 + 0.0957i |
| −0.2310 − 0.0957i | −0.1389 − 0.2079i |
| 0.2500 | −0.2500 |
| 0.0957 + 0.2310i | −0.0488 − 0.2452i |

-continued

| Rank 2 | |
|---|---|
| −0.1768 + 0.1768i | 0.2310 − 0.0957i |
| −0.2310 − 0.0957i | 0.1389 + 0.2079i |
| ans(:, :, 5, 9) = | |
| 0.2500 | 0.2500 |
| 0.0000 + 0.2500i | −0.0488 + 0.2452i |
| −0.2500 + 0.0000i | −0.2310 − 0.0957i |
| −0.0000 − 0.2500i | 0.1389 − 0.2079i |
| 0.2500 | −0.2500 |
| 0.0000 + 0.2500i | 0.0488 − 0.2452i |
| −0.2500 + 0.0000i | 0.2310 + 0.0957i |
| −0.0000 − 0.2500i | −0.1389 + 0.2079i |
| ans(:, :, 6, 9) = | |
| 0.2500 | 0.2500 |
| −0.0957 + 0.2310i | −0.1389 + 0.2079i |
| −0.1768 − 0.1768i | −0.0957 − 0.2310i |
| 0.2310 − 0.0957i | 0.2452 + 0.0488i |
| 0.2500 | −0.2500 |
| −0.0957 + 0.2310i | 0.1389 − 0.2079i |
| −0.1768 − 0.1768i | 0.0957 + 0.2310i |
| 0.2310 − 0.0957i | −0.2452 − 0.0488i |
| ans(:, :, 7, 9) = | |
| 0.2500 | 0.2500 |
| −0.1768 + 0.1768i | −0.2079 + 0.1389i |
| −0.0000 − 0.2500i | 0.0957 − 0.2310i |
| 0.1768 + 0.1768i | 0.0488 + 0.2452i |
| 0.2500 | −0.2500 |
| −0.1768 + 0.1768i | 0.2079 − 0.1389i |
| −0.0000 − 0.2500i | −0.0957 + 0.2310i |
| 0.1768 + 0.1768i | −0.0488 − 0.2452i |
| ans(:, :, 8, 9) = | |
| 0.2500 | 0.2500 |
| −0.2310 + 0.0957i | −0.2452 + 0.0488i |
| 0.1768 − 0.1768i | 0.2310 − 0.0957i |
| −0.0957 + 0.2310i | −0.2079 + 0.1389i |
| 0.2500 | −0.2500 |
| −0.2310 + 0.0957i | 0.2452 − 0.0488i |
| 0.1768 − 0.1768i | −0.2310 + 0.0957i |
| −0.0957 + 0.2310i | 0.2079 − 0.1389i |
| ans(:, :, 9, 9) = | |
| 0.2500 | 0.2500 |
| −0.2500 + 0.0000i | −0.2452 − 0.0488i |
| 0.2500 − 0.0000i | 0.2310 + 0.0957i |
| −0.2500 + 0.0000i | −0.2079 − 0.1389i |
| 0.2500 | −0.2500 |
| −0.2500 + 0.0000i | 0.2452 + 0.0488i |
| 0.2500 − 0.0000i | −0.2310 − 0.0957i |
| −0.2500 + 0.0000i | 0.2079 + 0.1389i |
| ans(:, :, 10, 9) = | |
| 0.2500 | 0.2500 |
| −0.2310 − 0.0957i | −0.2079 − 0.1389i |
| 0.1768 + 0.1768i | 0.0957 + 0.2310i |
| −0.0957 − 0.2310i | 0.0488 − 0.2452i |
| 0.2500 | −0.2500 |
| −0.2310 − 0.0957i | 0.2079 + 0.1389i |
| 0.1768 + 0.1768i | −0.0957 − 0.2310i |
| −0.0957 − 0.2310i | −0.0488 + 0.2452i |
| ans(:, :, 11, 9) = | |
| 0.2500 | 0.2500 |
| −0.1768 − 0.1768i | −0.1389 − 0.2079i |
| 0.0000 + 0.2500i | −0.0957 + 0.2310i |
| 0.1768 − 0.1768i | 0.2452 − 0.0488i |
| 0.2500 | −0.2500 |
| −0.1768 − 0.1768i | 0.1389 + 0.2079i |
| 0.0000 + 0.2500i | 0.0957 − 0.2310i |
| 0.1768 − 0.1768i | −0.2452 + 0.0488i |
| ans(:, :, 12, 9) = | |
| 0.2500 | 0.2500 |
| −0.0957 − 0.2310i | −0.0488 − 0.2452i |
| −0.1768 + 0.1768i | −0.2310 + 0.0957i |
| 0.2310 + 0.0957i | 0.1389 + 0.2079i |

-continued

| Rank 2 | |
|---|---|
| 0.2500 | −0.2500 |
| −0.0957 − 0.2310i | 0.0488 + 0.2452i |
| −0.1768 + 0.1768i | 0.2310 − 0.0957i |
| 0.2310 + 0.0957i | −0.1389 − 0.2079i |
| ans(:, :, 13, 9) = | |
| 0.2500 | 0.2500 |
| −0.0000 − 0.2500i | 0.0488 − 0.2452i |
| −0.2500 + 0.0000i | −0.2310 − 0.0957i |
| 0.0000 + 0.2500i | −0.1389 + 0.2079i |
| 0.2500 | −0.2500 |
| −0.0000 − 0.2500i | −0.0488 + 0.2452i |
| −0.2500 + 0.0000i | 0.2310 + 0.0957i |
| 0.0000 + 0.2500i | 0.1389 − 0.2079i |
| ans(:, :, 14, 9) = | |
| 0.2500 | 0.2500 |
| 0.0957 − 0.2310i | 0.1389 − 0.2079i |
| −0.1768 − 0.1768i | −0.0957 − 0.2310i |
| −0.2310 + 0.0957i | −0.2452 − 0.0488i |
| 0.2500 | −0.2500 |
| 0.0957 − 0.2310i | −0.1389 + 0.2079i |
| −0.1768 − 0.1768i | 0.0957 + 0.2310i |
| −0.2310 + 0.0957i | 0.2452 + 0.0488i |
| ans(:, :, 15, 9) = | |
| 0.2500 | 0.2500 |
| 0.1768 − 0.1768i | 0.2079 − 0.1389i |
| −0.0000 − 0.2500i | 0.0957 − 0.2310i |
| −0.1768 − 0.1768i | −0.0488 − 0.2452i |
| 0.2500 | −0.2500 |
| 0.1768 − 0.1768i | −0.2079 + 0.1389i |
| −0.0000 − 0.2500i | −0.0957 + 0.2310i |
| −0.1768 − 0.1768i | 0.0488 + 0.2452i |
| ans(:, :, 16, 9) = | |
| 0.2500 | 0.2500 |
| 0.2310 − 0.0957i | 0.2452 − 0.0488i |
| 0.1768 − 0.1768i | 0.2310 − 0.0957i |
| 0.0957 − 0.2310i | 0.2079 − 0.1389i |
| 0.2500 | −0.2500 |
| 0.2310 − 0.0957i | −0.2452 + 0.0488i |
| 0.1768 − 0.1768i | −0.2310 + 0.0957i |
| 0.0957 − 0.2310i | −0.2079 + 0.1389i |
| ans(:, :, 1, 10) = | |
| 0.2500 | 0.2500 |
| 0.2500 | 0.2452 + 0.0488i |
| 0.2500 | 0.2310 + 0.0957i |
| 0.2500 | 0.2079 + 0.1389i |
| 0 + 0.2500i | 0 − 0.2500i |
| 0 + 0.2500i | 0.0488 − 0.2452i |
| 0 + 0.2500i | 0.0957 − 0.2310i |
| 0 + 0.2500i | 0.1389 − 0.2079i |
| ans(:, :, 2, 10) = | |
| 0.2500 | 0.2500 |
| 0.2310 + 0.0957i | 0.2079 + 0.1389i |
| 0.1768 + 0.1768i | 0.0957 + 0.2310i |
| 0.0957 + 0.2310i | −0.0488 + 0.2452i |
| 0 + 0.2500i | 0 − 0.2500i |
| −0.0957 + 0.2310i | 0.1389 − 0.2079i |
| −0.1768 + 0.1768i | 0.2310 − 0.0957i |
| −0.2310 + 0.0957i | 0.2452 + 0.0488i |
| ans(:, :, 3, 10) = | |
| 0.2500 | 0.2500 |
| 0.1768 + 0.1768i | 0.1389 + 0.2079i |
| 0.0000 + 0.2500i | −0.0957 + 0.2310i |
| −0.1768 + 0.1768i | −0.2452 + 0.0488i |
| 0 + 0.2500i | 0 − 0.2500i |
| −0.1768 + 0.1768i | 0.2079 − 0.1389i |
| −0.2500 + 0.0000i | 0.2310 + 0.0957i |
| −0.1768 − 0.1768i | 0.0488 + 0.2452i |
| ans(:, :, 4, 10) = | |
| 0.2500 | 0.2500 |
| 0.0957 + 0.2310i | 0.0488 + 0.2452i |

-continued

| Rank 2 | |
|---|---|
| −0.1768 + 0.1768i | −0.2310 + 0.0957i |
| −0.2310 − 0.0957i | −0.1389 − 0.2079i |
| 0 + 0.2500i | 0 − 0.2500i |
| −0.2310 + 0.0957i | 0.2452 − 0.0488i |
| −0.1768 − 0.1768i | 0.0957 + 0.2310i |
| 0.0957 − 0.2310i | −0.2079 + 0.1389i |
| ans(:, :, 5, 10) = | |
| 0.2500 | 0.2500 |
| 0.0000 + 0.2500i | −0.0488 + 0.2452i |
| −0.2500 + 0.0000i | −0.2310 − 0.0957i |
| −0.0000 − 0.2500i | 0.1389 − 0.2079i |
| 0 + 0.2500i | 0 − 0.2500i |
| −0.2500 + 0.0000i | 0.2452 + 0.0488i |
| −0.0000 − 0.2500i | −0.0957 + 0.2310i |
| 0.2500 − 0.0000i | −0.2079 − 0.1389i |
| ans(:, :, 6, 10) = | |
| 0.2500 | 0.2500 |
| −0.0957 + 0.2310i | −0.1389 + 0.2079i |
| −0.1768 − 0.1768i | −0.0957 − 0.2310i |
| 0.2310 − 0.0957i | 0.2452 + 0.0488i |
| 0 + 0.2500i | 0 − 0.2500i |
| −0.2310 − 0.0957i | 0.2079 + 0.1389i |
| 0.1768 − 0.1768i | −0.2310 + 0.0957i |
| 0.0957 + 0.2310i | 0.0488 − 0.2452i |
| ans(:, :, 7, 10) = | |
| 0.2500 | 0.2500 |
| −0.1768 + 0.1768i | −0.2079 + 0.1389i |
| −0.0000 − 0.2500i | 0.0957 − 0.2310i |
| 0.1768 + 0.1768i | 0.0488 + 0.2452i |
| 0 + 0.2500i | 0 − 0.2500i |
| −0.1768 − 0.1768i | 0.1389 + 0.2079i |
| 0.2500 − 0.0000i | −0.2310 − 0.0957i |
| −0.1768 + 0.1768i | 0.2452 − 0.0488i |
| ans(:, :, 8, 10) = | |
| 0.2500 | 0.2500 |
| −0.2310 + 0.0957i | −0.2452 + 0.0488i |
| 0.1768 − 0.1768i | 0.2310 − 0.0957i |
| −0.0957 + 0.2310i | −0.2079 + 0.1389i |
| 0 + 0.2500i | 0 − 0.2500i |
| −0.0957 − 0.2310i | 0.0488 + 0.2452i |
| 0.1768 + 0.1768i | −0.0957 − 0.2310i |
| −0.2310 − 0.0957i | 0.1389 + 0.2079i |
| ans(:, :, 9, 10) = | |
| 0.2500 | 0.2500 |
| −0.2500 + 0.0000i | −0.2452 − 0.0488i |
| 0.2500 − 0.0000i | 0.2310 + 0.0957i |
| −0.2500 + 0.0000i | −0.2079 − 0.1389i |
| 0 + 0.2500i | 0 − 0.2500i |
| −0.0000 − 0.2500i | −0.0488 + 0.2452i |
| 0.0000 + 0.2500i | 0.0957 − 0.2310i |
| −0.0000 − 0.2500i | −0.1389 + 0.2079i |
| ans(:, :, 10, 10) = | |
| 0.2500 | 0.2500 |
| −0.2310 − 0.0957i | −0.2079 − 0.1389i |
| 0.1768 + 0.1768i | 0.0957 + 0.2310i |
| −0.0957 − 0.2310i | 0.0488 − 0.2452i |
| 0 + 0.2500i | 0 − 0.2500i |
| 0.0957 − 0.2310i | −0.1389 + 0.2079i |
| −0.1768 + 0.1768i | 0.2310 − 0.0957i |
| 0.2310 − 0.0957i | −0.2452 − 0.0488i |
| ans(:, :, 11, 10) = | |
| 0.2500 | 0.2500 |
| −0.1768 − 0.1768i | −0.1389 − 0.2079i |
| 0.0000 + 0.2500i | −0.0957 + 0.2310i |
| 0.1768 − 0.1768i | 0.2452 − 0.0488i |
| 0 + 0.2500i | 0 − 0.2500i |
| 0.1768 − 0.1768i | −0.2079 + 0.1389i |
| −0.2500 + 0.0000i | 0.2310 + 0.0957i |
| 0.1768 + 0.1768i | −0.0488 − 0.2452i |

-continued

| Rank 2 | |
|---|---|
| ans(:, :, 12, 10) = | |
| 0.2500 | 0.2500 |
| −0.0957 − 0.2310i | −0.0488 − 0.2452i |
| −0.1768 + 0.1768i | −0.2310 + 0.0957i |
| 0.2310 + 0.0957i | 0.1389 + 0.2079i |
| 0 + 0.2500i | 0 − 0.2500i |
| 0.2310 − 0.0957i | −0.2452 + 0.0488i |
| −0.1768 − 0.1768i | 0.0957 + 0.2310i |
| −0.0957 + 0.2310i | 0.2079 − 0.1389i |
| ans(:, :, 13, 10) = | |
| 0.2500 | 0.2500 |
| −0.0000 − 0.2500i | 0.0488 + 0.2452i |
| −0.2500 + 0.0000i | −0.2310 − 0.0957i |
| 0.0000 + 0.2500i | −0.1389 + 0.2079i |
| 0 + 0.2500i | 0 − 0.2500i |
| 0.2500 − 0.0000i | −0.2452 − 0.0488i |
| −0.0000 − 0.2500i | −0.0957 + 0.2310i |
| −0.2500 + 0.0000i | 0.2079 + 0.1389i |
| ans(:, :, 14, 10) = | |
| 0.2500 | 0.2500 |
| 0.0957 − 0.2310i | 0.1389 − 0.2079i |
| −0.1768 − 0.1768i | −0.0957 − 0.2310i |
| −0.2310 + 0.0957i | −0.2452 − 0.0488i |
| 0 + 0.2500i | 0 − 0.2500i |
| 0.2310 + 0.0957i | −0.2079 − 0.1389i |
| 0.1768 − 0.1768i | −0.2310 + 0.0957i |
| −0.0957 − 0.2310i | −0.0488 + 0.2452i |
| ans(:, :, 15, 10) = | |
| 0.2500 | 0.2500 |
| 0.1768 − 0.1768i | 0.2079 − 0.1389i |
| −0.0000 − 0.2500i | 0.0957 − 0.2310i |
| −0.1768 − 0.1768i | −0.0488 − 0.2452i |
| 0 + 0.2500i | 0 − 0.2500i |
| 0.1768 + 0.1768i | −0.1389 − 0.2079i |
| 0.2500 − 0.0000i | −0.2310 − 0.0957i |
| 0.1768 − 0.1768i | −0.2452 + 0.0488i |
| ans(:, :, 16, 10) = | |
| 0.2500 | 0.2500 |
| 0.2310 − 0.0957i | 0.2452 − 0.0488i |
| 0.1768 − 0.1768i | 0.2310 − 0.0957i |
| 0.0957 − 0.2310i | 0.2079 − 0.1389i |
| 0 + 0.2500i | 0 − 0.2500i |
| 0.0957 + 0.2310i | −0.0488 − 0.2452i |
| 0.1768 + 0.1768i | −0.0957 − 0.2310i |
| 0.2310 + 0.0957i | −0.1389 − 0.2079i |
| ans(:, :, 1, 11) = | |
| 0.2500 | 0.2500 |
| 0.2452 + 0.0488i | 0.2310 + 0.0957i |
| 0.2310 + 0.0957i | 0.1768 + 0.1768i |
| 0.2079 + 0.1389i | 0.0957 + 0.2310i |
| 0.2500 | −0.2500 |
| 0.2452 + 0.0488i | −0.2310 − 0.0957i |
| 0.2310 + 0.0957i | −0.1768 − 0.1768i |
| 0.2079 + 0.1389i | −0.0957 − 0.2310i |
| ans(:, :, 2, 11) = | |
| 0.2500 | 0.2500 |
| 0.2079 + 0.1389i | 0.1768 + 0.1768i |
| 0.0957 + 0.2310i | 0.0000 + 0.2500i |
| −0.0488 + 0.2452i | −0.1768 + 0.1768i |
| 0.2500 | −0.2500 |
| 0.2079 + 0.1389i | −0.1768 − 0.1768i |
| 0.0957 + 0.2310i | −0.0000 − 0.2500i |
| −0.0488 + 0.2452i | 0.1768 − 0.1768i |
| ans(:, :, 3, 11) = | |
| 0.2500 | 0.2500 |
| 0.1389 + 0.2079i | 0.0957 + 0.2310i |
| −0.0957 + 0.2310i | −0.1768 + 0.1768i |
| −0.2452 + 0.0488i | −0.2310 − 0.0957i |
| 0.2500 | −0.2500 |
| 0.1389 + 0.2079i | −0.0957 − 0.2310i |

-continued

| Rank 2 | |
|---|---|
| −0.0957 + 0.2310i | 0.1768 − 0.1768i |
| −0.2452 + 0.0488i | 0.2310 + 0.0957i |
| ans(:, :, 4, 11) = | |
| 0.2500 | 0.2500 |
| 0.0488 + 0.2452i | 0.0000 + 0.2500i |
| −0.2310 + 0.0957i | −0.2500 + 0.0000i |
| −0.1389 − 0.2079i | −0.0000 − 0.2500i |
| 0.2500 | −0.2500 |
| 0.0488 + 0.2452i | −0.0000 − 0.2500i |
| −0.2310 + 0.0957i | 0.2500 − 0.0000i |
| −0.1389 − 0.2079i | 0.0000 + 0.2500i |
| ans(:, :, 5, 11) = | |
| 0.2500 | 0.2500 |
| −0.0488 + 0.2452i | −0.0957 + 0.2310i |
| −0.2310 − 0.0957i | −0.1768 − 0.1768i |
| 0.1389 − 0.2079i | 0.2310 − 0.0957i |
| 0.2500 | −0.2500 |
| −0.0488 + 0.2452i | 0.0957 − 0.2310i |
| −0.2310 − 0.0957i | 0.1768 + 0.1768i |
| 0.1389 − 0.2079i | −0.2310 + 0.0957i |
| ans(:, :, 6, 11) = | |
| 0.2500 | 0.2500 |
| −0.1389 + 0.2079i | −0.1768 + 0.1768i |
| −0.0957 − 0.2310i | −0.0000 − 0.2500i |
| 0.2452 + 0.0488i | 0.1768 + 0.1768i |
| 0.2500 | −0.2500 |
| −0.1389 + 0.2079i | 0.1768 − 0.1768i |
| −0.0957 − 0.2310i | 0.0000 + 0.2500i |
| 0.2452 + 0.0488i | −0.1768 − 0.1768i |
| ans(:, :, 7, 11) = | |
| 0.2500 | 0.2500 |
| −0.2079 + 0.1389i | −0.2310 + 0.0957i |
| 0.0957 − 0.2310i | 0.1768 − 0.1768i |
| 0.0488 + 0.2452i | −0.0957 + 0.2310i |
| 0.2500 | −0.2500 |
| −0.2079 + 0.1389i | 0.2310 − 0.0957i |
| 0.0957 − 0.2310i | −0.1768 + 0.1768i |
| 0.0488 + 0.2452i | 0.0957 − 0.2310i |
| ans(:, :, 8, 11) = | |
| 0.2500 | 0.2500 |
| −0.2452 + 0.0488i | −0.2500 + 0.0000i |
| 0.2310 − 0.0957i | 0.2500 − 0.0000i |
| −0.2079 + 0.1389i | −0.2500 + 0.0000i |
| 0.2500 | −0.2500 |
| −0.2452 + 0.0488i | 0.2500 − 0.0000i |
| 0.2310 − 0.0957i | −0.2500 + 0.0000i |
| −0.2079 + 0.1389i | 0.2500 − 0.0000i |
| ans(:, :, 9, 11) = | |
| 0.2500 | 0.2500 |
| −0.2452 − 0.0488i | −0.2310 − 0.0957i |
| 0.2310 + 0.0957i | 0.1768 + 0.1768i |
| −0.2079 − 0.1389i | −0.0957 − 0.2310i |
| 0.2500 | −0.2500 |
| −0.2452 − 0.0488i | 0.2310 + 0.0957i |
| 0.2310 + 0.0957i | −0.1768 − 0.1768i |
| −0.2079 − 0.1389i | 0.0957 + 0.2310i |
| ans(:, :, 10, 11) = | |
| 0.2500 | 0.2500 |
| −0.2079 − 0.1389i | −0.1768 − 0.1768i |
| 0.0957 + 0.2310i | 0.0000 + 0.2500i |
| 0.0488 − 0.2452i | 0.1768 − 0.1768i |
| 0.2500 | −0.2500 |
| −0.2079 − 0.1389i | 0.1768 + 0.1768i |
| 0.0957 + 0.2310i | −0.0000 − 0.2500i |
| 0.0488 − 0.2452i | −0.1768 + 0.1768i |
| ans(:, :, 11, 11) = | |
| 0.2500 | 0.2500 |
| −0.1389 − 0.2079i | −0.0957 − 0.2310i |
| −0.0957 + 0.2310i | −0.1768 + 0.1768i |
| 0.2452 − 0.0488i | 0.2310 + 0.0957i |

-continued

| Rank 2 | |
|---|---|
| 0.2500 | −0.2500 |
| −0.1389 − 0.2079i | 0.0957 + 0.2310i |
| −0.0957 + 0.2310i | 0.1768 − 0.1768i |
| 0.2452 − 0.0488i | −0.2310 − 0.0957i |
| ans(:, :, 12, 11) = | |
| 0.2500 | 0.2500 |
| −0.0488 − 0.2452i | −0.0000 − 0.2500i |
| −0.2310 + 0.0957i | −0.2500 + 0.0000i |
| 0.1389 + 0.2079i | 0.0000 + 0.2500i |
| 0.2500 | −0.2500 |
| −0.0488 − 0.2452i | 0.0000 + 0.2500i |
| −0.2310 + 0.0957i | 0.2500 − 0.0000i |
| 0.1389 + 0.2079i | −0.0000 − 0.2500i |
| ans(:, :, 13, 11) = | |
| 0.2500 | 0.2500 |
| 0.0488 − 0.2452i | 0.0957 − 0.2310i |
| −0.2310 − 0.0957i | −0.1768 − 0.1768i |
| −0.1389 + 0.2079i | −0.2310 + 0.0957i |
| 0.2500 | −0.2500 |
| 0.0488 − 0.2452i | −0.0957 + 0.2310i |
| −0.2310 − 0.0957i | 0.1768 + 0.1768i |
| −0.1389 + 0.2079i | 0.2310 − 0.0957i |
| ans(:, :, 14, 11) = | |
| 0.2500 | 0.2500 |
| 0.1389 − 0.2079i | 0.1768 − 0.1768i |
| −0.0957 − 0.2310i | −0.0000 − 0.2500i |
| −0.2452 − 0.0488i | −0.1768 − 0.1768i |
| 0.2500 | −0.2500 |
| 0.1389 − 0.2079i | −0.1768 + 0.1768i |
| −0.0957 − 0.2310i | 0.0000 + 0.2500i |
| −0.2452 − 0.0488i | 0.1768 + 0.1768i |
| ans(:, :, 15, 11) = | |
| 0.2500 | 0.2500 |
| 0.2079 − 0.1389i | 0.2310 − 0.0957i |
| 0.0957 − 0.2310i | 0.1768 − 0.1768i |
| −0.0488 − 0.2452i | 0.0957 − 0.2310i |
| 0.2500 | −0.2500 |
| 0.2079 − 0.1389i | −0.2310 + 0.0957i |
| 0.0957 − 0.2310i | −0.1768 + 0.1768i |
| −0.0488 − 0.2452i | −0.0957 + 0.2310i |
| ans(:, :, 16, 11) = | |
| 0.2500 | 0.2500 |
| 0.2452 − 0.0488i | 0.2500 |
| 0.2310 − 0.0957i | 0.2500 |
| 0.2079 − 0.1389i | 0.2500 |
| 0.2500 | −0.2500 |
| 0.2452 − 0.0488i | −0.2500 |
| 0.2310 − 0.0957i | −0.2500 |
| 0.2079 − 0.1389i | −0.2500 |
| ans(:, :, 1, 12) = | |
| 0.2500 | 0.2500 |
| 0.2452 + 0.0488i | 0.2310 + 0.0957i |
| 0.2310 + 0.0957i | 0.1768 + 0.1768i |
| 0.2079 + 0.1389i | 0.0957 + 0.2310i |
| 0 + 0.2500i | 0 − 0.2500i |
| −0.0488 + 0.2452i | 0.0957 − 0.2310i |
| −0.0957 + 0.2310i | 0.1768 − 0.1768i |
| −0.1389 + 0.2079i | 0.2310 − 0.0957i |
| ans(:, :, 2, 12) = | |
| 0.2500 | 0.2500 |
| 0.2079 + 0.1389i | 0.1768 + 0.1768i |
| 0.0957 + 0.2310i | 0.0000 + 0.2500i |
| −0.0488 + 0.2452i | −0.1768 + 0.1768i |
| 0 + 0.2500i | 0 − 0.2500i |
| −0.1389 + 0.2079i | 0.1768 − 0.1768i |
| −0.2310 + 0.0957i | 0.2500 − 0.0000i |
| −0.2452 − 0.0488i | 0.1768 + 0.1768i |
| ans(:, :, 3, 12) = | |
| 0.2500 | 0.2500 |
| 0.1389 + 0.2079i | 0.0957 + 0.2310i |

-continued

| Rank 2 | |
|---|---|
| −0.0957 + 0.2310i | −0.1768 + 0.1768i |
| −0.2452 + 0.0488i | −0.2310 − 0.0957i |
| 0 + 0.2500i | 0 − 0.2500i |
| −0.2079 + 0.1389i | 0.2310 − 0.0957i |
| −0.2310 − 0.0957i | 0.1768 + 0.1768i |
| −0.0488 − 0.2452i | −0.0957 + 0.2310i |
| ans(:, :, 4, 12) = | |
| 0.2500 | 0.2500 |
| 0.0488 + 0.2452i | 0.0000 + 0.2500i |
| −0.2310 + 0.0957i | −0.2500 + 0.0000i |
| −0.1389 − 0.2079i | −0.0000 − 0.2500i |
| 0 + 0.2500i | 0 − 0.2500i |
| −0.2452 + 0.0488i | 0.2500 − 0.0000i |
| −0.0957 − 0.2310i | 0.0000 + 0.2500i |
| 0.2079 − 0.1389i | −0.2500 + 0.0000i |
| ans(:, :, 5, 12) = | |
| 0.2500 | 0.2500 |
| −0.0488 + 0.2452i | −0.0957 + 0.2310i |
| −0.2310 − 0.0957i | −0.1768 − 0.1768i |
| 0.1389 − 0.2079i | 0.2310 − 0.0957i |
| 0 + 0.2500i | 0 − 0.2500i |
| −0.2452 − 0.0488i | 0.2310 + 0.0957i |
| 0.0957 − 0.2310i | −0.1768 + 0.1768i |
| 0.2079 + 0.1389i | −0.0957 − 0.2310i |
| ans(:, :, 6, 12) = | |
| 0.2500 | 0.2500 |
| −0.1389 + 0.2079i | −0.1768 + 0.1768i |
| −0.0957 − 0.2310i | −0.0000 − 0.2500i |
| 0.2452 + 0.0488i | 0.1768 + 0.1768i |
| 0 + 0.2500i | 0 − 0.2500i |
| −0.2079 − 0.1389i | 0.1768 + 0.1768i |
| 0.2310 − 0.0957i | −0.2500 + 0.0000i |
| −0.0488 + 0.2452i | 0.1768 − 0.1768i |
| ans(:, :, 7, 12) = | |
| 0.2500 | 0.2500 |
| −0.2079 + 0.1389i | −0.2310 + 0.0957i |
| 0.0957 − 0.2310i | 0.1768 − 0.1768i |
| 0.0488 + 0.2452i | −0.0957 + 0.2310i |
| 0 + 0.2500i | 0 − 0.2500i |
| −0.1389 − 0.2079i | 0.0957 + 0.2310i |
| 0.2310 + 0.0957i | −0.1768 − 0.1768i |
| −0.2452 + 0.0488i | 0.2310 + 0.0957i |
| ans(:, :, 8, 12) = | |
| 0.2500 | 0.2500 |
| −0.2452 + 0.0488i | −0.2500 + 0.0000i |
| 0.2310 − 0.0957i | 0.2500 − 0.0000i |
| −0.2079 + 0.1389i | −0.2500 + 0.0000i |
| 0 + 0.2500i | 0 − 0.2500i |
| −0.0488 − 0.2452i | 0.0000 + 0.2500i |
| 0.0957 + 0.2310i | −0.0000 − 0.2500i |
| −0.1389 − 0.2079i | 0.0000 + 0.2500i |
| ans(:, :, 9, 12) = | |
| 0.2500 | 0.2500 |
| −0.2452 − 0.0488i | −0.2310 − 0.0957i |
| 0.2310 + 0.0957i | 0.1768 + 0.1768i |
| −0.2079 − 0.1389i | −0.0957 − 0.2310i |
| 0 + 0.2500i | 0 − 0.2500i |
| 0.0488 − 0.2452i | −0.0957 + 0.2310i |
| −0.0957 + 0.2310i | 0.1768 − 0.1768i |
| 0.1389 − 0.2079i | −0.2310 + 0.0957i |
| ans(:, :, 10, 12) = | |
| 0.2500 | 0.2500 |
| −0.2079 − 0.1389i | −0.1768 − 0.1768i |
| 0.0957 + 0.2310i | 0.0000 + 0.2500i |
| 0.0488 − 0.2452i | 0.1768 − 0.1768i |
| 0 + 0.2500i | 0 − 0.2500i |
| 0.1389 − 0.2079i | −0.1768 + 0.1768i |
| −0.2310 + 0.0957i | 0.2500 − 0.0000i |
| 0.2452 + 0.0488i | −0.1768 − 0.1768i |

-continued

| Rank 2 | |
|---|---|
| ans(:, :, 11, 12) = | |
| 0.2500 | 0.2500 |
| −0.1389 − 0.2079i | −0.0957 − 0.2310i |
| −0.0957 + 0.2310i | −0.1768 + 0.1768i |
| 0.2452 − 0.0488i | 0.2310 + 0.0957i |
| 0 + 0.2500i | 0 − 0.2500i |
| 0.2079 − 0.1389i | −0.2310 + 0.0957i |
| −0.2310 − 0.0957i | 0.1768 + 0.1768i |
| 0.0488 + 0.2452i | 0.0957 − 0.2310i |
| ans(:, :, 12, 12) = | |
| 0.2500 | 0.2500 |
| −0.0488 − 0.2452i | −0.0000 − 0.2500i |
| −0.2310 + 0.0957i | −0.2500 + 0.0000i |
| 0.1389 + 0.2079i | 0.0000 + 0.2500i |
| 0 + 0.2500i | 0 − 0.2500i |
| 0.2452 − 0.0488i | −0.2500 + 0.0000i |
| −0.0957 − 0.2310i | 0.0000 + 0.2500i |
| −0.2079 + 0.1389i | 0.2500 − 0.0000i |
| ans(:, :, 13, 12) = | |
| 0.2500 | 0.2500 |
| 0.0488 − 0.2452i | 0.0957 − 0.2310i |
| −0.2310 − 0.0957i | −0.1768 − 0.1768i |
| −0.1389 + 0.2079i | −0.2310 + 0.0957i |
| 0 + 0.2500i | 0 − 0.2500i |
| 0.2452 + 0.0488i | −0.2310 − 0.0957i |
| 0.0957 − 0.2310i | −0.1768 + 0.1768i |
| −0.2079 − 0.1389i | 0.0957 + 0.2310i |
| ans(:, :, 14, 12) = | |
| 0.2500 | 0.2500 |
| 0.1389 − 0.2079i | 0.1768 − 0.1768i |
| −0.0957 − 0.2310i | −0.0000 − 0.2500i |
| −0.2452 − 0.0488i | −0.1768 − 0.1768i |
| 0 + 0.2500i | 0 − 0.2500i |
| 0.2079 + 0.1389i | −0.1768 − 0.1768i |
| 0.2310 − 0.0957i | −0.2500 + 0.0000i |
| 0.0488 − 0.2452i | −0.1768 + 0.1768i |
| ans(:, :, 15, 12) = | |
| 0.2500 | 0.2500 |
| 0.2079 − 0.1389i | 0.2310 − 0.0957i |
| 0.0957 − 0.2310i | 0.1768 − 0.1768i |
| −0.0488 − 0.2452i | 0.0957 − 0.2310i |
| 0 + 0.2500i | 0 − 0.2500i |
| 0.1389 + 0.2079i | −0.0957 − 0.2310i |
| 0.2310 + 0.0957i | −0.1768 − 0.1768i |
| 0.2452 − 0.0488i | −0.2310 − 0.0957i |
| ans(:, :, 16, 12) = | |
| 0.2500 | 0.2500 |
| 0.2452 − 0.0488i | 0.2500 |
| 0.2310 − 0.0957i | 0.2500 |
| 0.2079 − 0.1389i | 0.2500 |
| 0 + 0.2500i | 0 − 0.2500i |
| 0.0488 + 0.2452i | 0 − 0.2500i |
| 0.0957 + 0.2310i | 0 − 0.2500i |
| 0.1389 + 0.2079i | 0 − 0.2500i |
| ans(:, :, 1, 13) = | |
| 0.2500 | 0.2500 |
| 0.2500 | 0.2079 + 0.1389i |
| 0.2500 | 0.0957 + 0.2310i |
| 0.2500 | −0.0488 + 0.2452i |
| 0.2500 | −0.2500 |
| 0.2500 | −0.2079 − 0.1389i |
| 0.2500 | −0.0957 − 0.2310i |
| 0.2500 | 0.0488 − 0.2452i |
| ans(:, :, 2, 13) = | |
| 0.2500 | 0.2500 |
| 0.2310 + 0.0957i | 0.1389 + 0.2079i |
| 0.1768 + 0.1768i | −0.0957 + 0.2310i |
| 0.0957 + 0.2310i | −0.2452 + 0.0488i |
| 0.2500 | −0.2500 |
| 0.2310 + 0.0957i | −0.1389 − 0.2079i |
| 0.1768 + 0.1768i | 0.0957 − 0.2310i |
| 0.0957 + 0.2310i | 0.2452 − 0.0488i |
| ans(:, :, 3, 13) = | |
| 0.2500 | 0.2500 |
| 0.1768 + 0.1768i | 0.0488 + 0.2452i |
| 0.0000 + 0.2500i | −0.2310 + 0.0957i |
| −0.1768 + 0.1768i | −0.1389 − 0.2079i |
| 0.2500 | −0.2500 |
| 0.1768 + 0.1768i | −0.0488 − 0.2452i |
| 0.0000 + 0.2500i | 0.2310 − 0.0957i |
| −0.1768 + 0.1768i | 0.1389 + 0.2079i |
| ans(:, :, 4, 13) = | |
| 0.2500 | 0.2500 |
| 0.0957 + 0.2310i | −0.0488 + 0.2452i |
| −0.1768 + 0.1768i | −0.2310 − 0.0957i |
| −0.2310 − 0.0957i | 0.1389 − 0.2079i |
| 0.2500 | −0.2500 |
| 0.0957 + 0.2310i | 0.0488 − 0.2452i |
| −0.1768 + 0.1768i | 0.2310 + 0.0957i |
| −0.2310 − 0.0957i | −0.1389 + 0.2079i |
| ans(:, :, 5, 13) = | |
| 0.2500 | 0.2500 |
| 0.0000 + 0.2500i | −0.1389 + 0.2079i |
| −0.2500 + 0.0000i | −0.0957 − 0.2310i |
| −0.0000 − 0.2500i | 0.2452 + 0.0488i |
| 0.2500 | −0.2500 |
| 0.0000 + 0.2500i | 0.1389 − 0.2079i |
| −0.2500 + 0.0000i | 0.0957 + 0.2310i |
| −0.0000 − 0.2500i | −0.2452 − 0.0488i |
| ans(:, :, 6, 13) = | |
| 0.2500 | 0.2500 |
| −0.0957 + 0.2310i | −0.2079 + 0.1389i |
| −0.1768 − 0.1768i | 0.0957 − 0.2310i |
| 0.2310 − 0.0957i | 0.0488 + 0.2452i |
| 0.2500 | −0.2500 |
| −0.0957 + 0.2310i | 0.2079 − 0.1389i |
| −0.1768 − 0.1768i | −0.0957 + 0.2310i |
| 0.2310 − 0.0957i | −0.0488 − 0.2452i |
| ans(:, :, 7, 13) = | |
| 0.2500 | 0.2500 |
| −0.1768 + 0.1768i | −0.2452 + 0.0488i |
| −0.0000 − 0.2500i | 0.2310 − 0.0957i |
| 0.1768 + 0.1768i | −0.2079 + 0.1389i |
| 0.2500 | −0.2500 |
| −0.1768 + 0.1768i | 0.2452 − 0.0488i |
| −0.0000 − 0.2500i | −0.2310 + 0.0957i |
| 0.1768 + 0.1768i | 0.2079 − 0.1389i |
| ans(:, :, 8, 13) = | |
| 0.2500 | 0.2500 |
| −0.2310 + 0.0957i | −0.2452 − 0.0488i |
| 0.1768 − 0.1768i | 0.2310 + 0.0957i |
| −0.0957 + 0.2310i | −0.2079 − 0.1389i |
| 0.2500 | −0.2500 |
| −0.2310 + 0.0957i | 0.2452 + 0.0488i |
| 0.1768 − 0.1768i | −0.2310 − 0.0957i |
| −0.0957 + 0.2310i | 0.2079 + 0.1389i |
| ans(:, :, 9, 13) = | |
| 0.2500 | 0.2500 |
| −0.2500 + 0.0000i | −0.2079 − 0.1389i |
| 0.2500 − 0.0000i | 0.0957 + 0.2310i |
| −0.2500 + 0.0000i | 0.0488 − 0.2452i |
| 0.2500 | −0.2500 |
| −0.2500 + 0.0000i | 0.2079 + 0.1389i |
| 0.2500 − 0.0000i | −0.0957 − 0.2310i |
| −0.2500 + 0.0000i | −0.0488 + 0.2452i |
| ans(:, :, 10, 13) = | |
| 0.2500 | 0.2500 |
| −0.2310 − 0.0957i | −0.1389 − 0.2079i |
| 0.1768 + 0.1768i | −0.0957 + 0.2310i |
| −0.0957 − 0.2310i | 0.2452 − 0.0488i |

-continued

| Rank 2 | |
|---|---|
| 0.2500 | −0.2500 |
| −0.2310 − 0.0957i | 0.1389 + 0.2079i |
| 0.1768 + 0.1768i | 0.0957 − 0.2310i |
| −0.0957 − 0.2310i | −0.2452 + 0.0488i |
| ans(:, :, 11, 13) = | |
| 0.2500 | 0.2500 |
| −0.1768 − 0.1768i | −0.0488 − 0.2452i |
| 0.0000 + 0.2500i | −0.2310 + 0.0957i |
| 0.1768 − 0.1768i | 0.1389 + 0.2079i |
| 0.2500 | −0.2500 |
| −0.1768 − 0.1768i | 0.0488 + 0.2452i |
| 0.0000 + 0.2500i | 0.2310 − 0.0957i |
| 0.1768 − 0.1768i | −0.1389 − 0.2079i |
| ans(:, :, 12, 13) = | |
| 0.2500 | 0.2500 |
| −0.0957 − 0.2310i | 0.0488 − 0.2452i |
| −0.1768 + 0.1768i | −0.2310 − 0.0957i |
| 0.2310 + 0.0957i | −0.1389 + 0.2079i |
| 0.2500 | −0.2500 |
| −0.0957 − 0.2310i | −0.0488 + 0.2452i |
| −0.1768 + 0.1768i | 0.2310 + 0.0957i |
| 0.2310 + 0.0957i | 0.1389 − 0.2079i |
| ans(:, :, 13, 13) = | |
| 0.2500 | 0.2500 |
| −0.0000 − 0.2500i | 0.1389 − 0.2079i |
| −0.2500 + 0.0000i | −0.0957 − 0.2310i |
| 0.0000 + 0.2500i | −0.2452 − 0.0488i |
| 0.2500 | −0.2500 |
| −0.0000 − 0.2500i | −0.1389 + 0.2079i |
| −0.2500 + 0.0000i | 0.0957 + 0.2310i |
| 0.0000 + 0.2500i | 0.2452 + 0.0488i |
| ans(:, :, 14, 13) = | |
| 0.2500 | 0.2500 |
| 0.0957 − 0.2310i | 0.2079 − 0.1389i |
| −0.1768 − 0.1768i | 0.0957 − 0.2310i |
| −0.2310 + 0.0957i | −0.0488 − 0.2452i |
| 0.2500 | −0.2500 |
| 0.0957 − 0.2310i | −0.2079 + 0.1389i |
| −0.1768 − 0.1768i | −0.0957 + 0.2310i |
| −0.2310 + 0.0957i | 0.0488 + 0.2452i |
| ans(:, :, 15, 13) = | |
| 0.2500 | 0.2500 |
| 0.1768 − 0.1768i | 0.2452 − 0.0488i |
| −0.0000 − 0.2500i | 0.2310 − 0.0957i |
| −0.1768 − 0.1768i | 0.2079 − 0.1389i |
| 0.2500 | −0.2500 |
| 0.1768 − 0.1768i | −0.2452 + 0.0488i |
| −0.0000 − 0.2500i | −0.2310 + 0.0957i |
| −0.1768 − 0.1768i | −0.2079 + 0.1389i |
| ans(:, :, 16, 13) = | |
| 0.2500 | 0.2500 |
| 0.2310 − 0.0957i | 0.2452 + 0.0488i |
| 0.1768 − 0.1768i | 0.2310 + 0.0957i |
| 0.0957 − 0.2310i | 0.2079 + 0.1389i |
| 0.2500 | −0.2500 |
| 0.2310 − 0.0957i | −0.2452 − 0.0488i |
| 0.1768 − 0.1768i | −0.2310 − 0.0957i |
| 0.0957 − 0.2310i | −0.2079 − 0.1389i |
| ans(:, :, 1, 14) = | |
| 0.2500 | 0.2500 |
| 0.2500 | 0.2079 + 0.1389i |
| 0.2500 | 0.0957 + 0.2310i |
| 0.2500 | −0.0488 + 0.2452i |
| 0 + 0.2500i | 0 − 0.2500i |
| 0 + 0.2500i | 0.1389 − 0.2079i |
| 0 + 0.2500i | 0.2310 − 0.0957i |
| 0 + 0.2500i | 0.2452 + 0.0488i |
| ans(:, :, 2, 14) = | |
| 0.2500 | 0.2500 |
| 0.2310 + 0.0957i | 0.1389 + 0.2079i |

-continued

| Rank 2 | |
|---|---|
| 0.1768 + 0.1768i | −0.0957 + 0.2310i |
| 0.0957 + 0.2310i | −0.2452 + 0.0488i |
| 0 + 0.2500i | 0 − 0.2500i |
| −0.0957 + 0.2310i | 0.2079 − 0.1389i |
| −0.1768 + 0.1768i | 0.2310 + 0.0957i |
| −0.2310 + 0.0957i | 0.0488 + 0.2452i |
| ans(:, :, 3, 14) = | |
| 0.2500 | 0.2500 |
| 0.1768 + 0.1768i | 0.0488 + 0.2452i |
| 0.0000 + 0.2500i | −0.2310 + 0.0957i |
| −0.1768 + 0.1768i | −0.1389 − 0.2079i |
| 0 + 0.2500i | 0 − 0.2500i |
| −0.1768 + 0.1768i | 0.2452 − 0.0488i |
| −0.2500 + 0.0000i | 0.0957 + 0.2310i |
| −0.1768 − 0.1768i | −0.2079 + 0.1389i |
| ans(:, :, 4, 14) = | |
| 0.2500 | 0.2500 |
| 0.0957 + 0.2310i | −0.0488 + 0.2452i |
| −0.1768 + 0.1768i | −0.2310 − 0.0957i |
| −0.2310 − 0.0957i | 0.1389 − 0.2079i |
| 0 + 0.2500i | 0 − 0.2500i |
| −0.2310 + 0.0957i | 0.2452 + 0.0488i |
| −0.1768 − 0.1768i | −0.0957 + 0.2310i |
| 0.0957 − 0.2310i | −0.2079 − 0.1389i |
| ans(:, :, 5, 14) = | |
| 0.2500 | 0.2500 |
| 0.0000 + 0.2500i | −0.1389 + 0.2079i |
| −0.2500 + 0.0000i | −0.0957 − 0.2310i |
| −0.0000 − 0.2500i | 0.2452 + 0.0488i |
| 0 + 0.2500i | 0 − 0.2500i |
| −0.2500 + 0.0000i | 0.2079 + 0.1389i |
| −0.0000 − 0.2500i | −0.2310 + 0.0957i |
| 0.2500 − 0.0000i | 0.0488 − 0.2452i |
| ans(:, :, 6, 14) = | |
| 0.2500 | 0.2500 |
| −0.0957 + 0.2310i | −0.2079 + 0.1389i |
| −0.1768 − 0.1768i | 0.0957 − 0.2310i |
| 0.2310 − 0.0957i | 0.0488 + 0.2452i |
| 0 + 0.2500i | 0 − 0.2500i |
| −0.2310 − 0.0957i | 0.1389 + 0.2079i |
| 0.1768 − 0.1768i | −0.2310 − 0.0957i |
| 0.0957 + 0.2310i | 0.2452 − 0.0488i |
| ans(:, :, 7, 14) = | |
| 0.2500 | 0.2500 |
| −0.1768 + 0.1768i | −0.2452 + 0.0488i |
| −0.0000 − 0.2500i | 0.2310 − 0.0957i |
| 0.1768 + 0.1768i | −0.2079 + 0.1389i |
| 0 + 0.2500i | 0 − 0.2500i |
| −0.1768 − 0.1768i | 0.0488 + 0.2452i |
| 0.2500 − 0.0000i | −0.0957 − 0.2310i |
| −0.1768 + 0.1768i | 0.1389 + 0.2079i |
| ans(:, :, 8, 14) = | |
| 0.2500 | 0.2500 |
| −0.2310 + 0.0957i | −0.2452 − 0.0488i |
| 0.1768 − 0.1768i | 0.2310 + 0.0957i |
| −0.0957 + 0.2310i | −0.2079 − 0.1389i |
| 0 + 0.2500i | 0 − 0.2500i |
| −0.0957 − 0.2310i | −0.0488 + 0.2452i |
| 0.1768 + 0.1768i | 0.0957 − 0.2310i |
| −0.2310 − 0.0957i | −0.1389 + 0.2079i |
| ans(:, :, 9, 14) = | |
| 0.2500 | 0.2500 |
| −0.2500 + 0.0000i | −0.2079 − 0.1389i |
| 0.2500 − 0.0000i | 0.0957 + 0.2310i |
| −0.2500 + 0.0000i | 0.0488 − 0.2452i |
| 0 + 0.2500i | 0 − 0.2500i |
| −0.0000 − 0.2500i | −0.1389 + 0.2079i |
| 0.0000 + 0.2500i | 0.2310 − 0.0957i |
| −0.0000 − 0.2500i | −0.2452 − 0.0488i |

-continued

| Rank 2 | |
|---|---|
| ans(:, :, 10, 14) = | |
| 0.2500 | 0.2500 |
| −0.2310 − 0.0957i | −0.1389 − 0.2079i |
| 0.1768 + 0.1768i | −0.0957 + 0.2310i |
| −0.0957 − 0.2310i | 0.2452 − 0.0488i |
| 0 + 0.2500i | 0 − 0.2500i |
| 0.0957 − 0.2310i | −0.2079 + 0.1389i |
| −0.1768 + 0.1768i | 0.2310 + 0.0957i |
| 0.2310 − 0.0957i | −0.0488 − 0.2452i |
| ans(:, :, 11, 14) = | |
| 0.2500 | 0.2500 |
| −0.1768 − 0.1768i | −0.0488 − 0.2452i |
| 0.0000 + 0.2500i | −0.2310 − 0.0957i |
| 0.1768 − 0.1768i | 0.1389 + 0.2079i |
| 0 + 0.2500i | 0 − 0.2500i |
| 0.1768 − 0.1768i | −0.2452 + 0.0488i |
| −0.2500 + 0.0000i | 0.0957 + 0.2310i |
| 0.1768 + 0.1768i | 0.2079 − 0.1389i |
| ans(:, :, 12, 14) = | |
| 0.2500 | 0.2500 |
| −0.0957 − 0.2310i | 0.0488 − 0.2452i |
| −0.1768 + 0.1768i | −0.2310 − 0.0957i |
| 0.2310 + 0.0957i | −0.1389 + 0.2079i |
| 0 + 0.2500i | 0 − 0.2500i |
| 0.2310 − 0.0957i | −0.2452 − 0.0488i |
| −0.1768 − 0.1768i | −0.0957 + 0.2310i |
| −0.0957 + 0.2310i | 0.2079 + 0.1389i |
| ans(:, :, 13, 14) = | |
| 0.2500 | 0.2500 |
| −0.0000 − 0.2500i | 0.1389 − 0.2079i |
| −0.2500 + 0.0000i | −0.0957 − 0.2310i |
| 0.0000 + 0.2500i | −0.2452 − 0.0488i |
| 0 + 0.2500i | 0 − 0.2500i |
| 0.2500 − 0.0000i | −0.2079 − 0.1389i |
| −0.0000 − 0.2500i | −0.2310 + 0.0957i |
| −0.2500 + 0.0000i | −0.0488 + 0.2452i |
| ans(:, :, 14, 14) = | |
| 0.2500 | 0.2500 |
| 0.0957 − 0.2310i | 0.2079 − 0.1389i |
| −0.1768 − 0.1768i | 0.0957 − 0.2310i |
| −0.2310 + 0.0957i | −0.0488 − 0.2452i |
| 0 + 0.2500i | 0 − 0.2500i |
| 0.2310 + 0.0957i | −0.1389 − 0.2079i |
| 0.1768 − 0.1768i | −0.2310 − 0.0957i |
| −0.0957 − 0.2310i | −0.2452 + 0.0488i |
| ans(:, :, 15, 14) = | |
| 0.2500 | 0.2500 |
| 0.1768 − 0.1768i | 0.2452 − 0.0488i |
| −0.0000 − 0.2500i | 0.2310 − 0.0957i |
| −0.1768 − 0.1768i | 0.2079 − 0.1389i |
| 0 + 0.2500i | 0 − 0.2500i |
| 0.1768 + 0.1768i | −0.0488 − 0.2452i |
| 0.2500 − 0.0000i | −0.0957 − 0.2310i |
| 0.1768 − 0.1768i | −0.1389 − 0.2079i |
| ans(:, :, 16, 14) = | |
| 0.2500 | 0.2500 |
| 0.2310 − 0.0957i | 0.2452 + 0.0488i |
| 0.1768 − 0.1768i | 0.2310 + 0.0957i |
| 0.0957 − 0.2310i | 0.2079 + 0.1389i |
| 0 + 0.2500i | 0 − 0.2500i |
| 0.0957 + 0.2310i | 0.0488 − 0.2452i |
| 0.1768 + 0.1768i | 0.0957 − 0.2310i |
| 0.2310 + 0.0957i | 0.1389 − 0.2079i |
| ans(:, :, 1, 15) = | |
| 0.2500 | 0.2500 |
| 0.2452 + 0.0488i | 0.2079 + 0.1389i |
| 0.2310 + 0.0957i | 0.0957 + 0.2310i |
| 0.2079 + 0.1389i | −0.0488 + 0.2452i |
| 0.2500 | −0.2500 |
| 0.2452 + 0.0488i | −0.2079 − 0.1389i |

-continued

| Rank 2 | |
|---|---|
| 0.2310 + 0.0957i | −0.0957 − 0.2310i |
| 0.2079 + 0.1389i | 0.0488 − 0.2452i |
| ans(:, :, 2, 15) = | |
| 0.2500 | 0.2500 |
| 0.2079 + 0.1389i | 0.1389 + 0.2079i |
| 0.0957 + 0.2310i | −0.0957 + 0.2310i |
| −0.0488 + 0.2452i | −0.2452 + 0.0488i |
| 0.2500 | −0.2500 |
| 0.2079 + 0.1389i | −0.1389 − 0.2079i |
| 0.0957 + 0.2310i | 0.0957 − 0.2310i |
| −0.0488 + 0.2452i | 0.2452 − 0.0488i |
| ans(:, :, 3, 15) = | |
| 0.2500 | 0.2500 |
| 0.1389 + 0.2079i | 0.0488 + 0.2452i |
| −0.0957 + 0.2310i | −0.2310 + 0.0957i |
| −0.2452 + 0.0488i | −0.1389 − 0.2079i |
| 0.2500 | −0.2500 |
| 0.1389 + 0.2079i | −0.0488 − 0.2452i |
| −0.0957 + 0.2310i | 0.2310 − 0.0957i |
| −0.2452 + 0.0488i | 0.1389 + 0.2079i |
| ans(:, :, 4, 15) = | |
| 0.2500 | 0.2500 |
| 0.0488 + 0.2452i | −0.0488 + 0.2452i |
| −0.2310 + 0.0957i | −0.2310 − 0.0957i |
| −0.1389 − 0.2079i | 0.1389 − 0.2079i |
| 0.2500 | −0.2500 |
| 0.0488 + 0.2452i | 0.0488 − 0.2452i |
| −0.2310 + 0.0957i | 0.2310 + 0.0957i |
| −0.1389 − 0.2079i | −0.1389 + 0.2079i |
| ans(:, :, 5, 15) = | |
| 0.2500 | 0.2500 |
| −0.0488 + 0.2452i | −0.1389 + 0.2079i |
| −0.2310 − 0.0957i | −0.0957 − 0.2310i |
| 0.1389 − 0.2079i | 0.2452 + 0.0488i |
| 0.2500 | −0.2500 |
| −0.0488 + 0.2452i | 0.1389 − 0.2079i |
| −0.2310 − 0.0957i | 0.0957 + 0.2310i |
| 0.1389 − 0.2079i | −0.2452 − 0.0488i |
| ans(:, :, 6, 15) = | |
| 0.2500 | 0.2500 |
| −0.1389 + 0.2079i | −0.2079 + 0.1389i |
| −0.0957 − 0.2310i | 0.0957 − 0.2310i |
| 0.2452 + 0.0488i | 0.0488 + 0.2452i |
| 0.2500 | −0.2500 |
| −0.1389 + 0.2079i | 0.2079 − 0.1389i |
| −0.0957 − 0.2310i | −0.0957 + 0.2310i |
| 0.2452 + 0.0488i | −0.0488 − 0.2452i |
| ans(:, :, 7, 15) = | |
| 0.2500 | 0.2500 |
| −0.2079 + 0.1389i | −0.2452 + 0.0488i |
| 0.0957 − 0.2310i | 0.2310 − 0.0957i |
| 0.0488 + 0.2452i | −0.2079 + 0.1389i |
| 0.2500 | −0.2500 |
| −0.2079 + 0.1389i | 0.2452 − 0.0488i |
| 0.0957 − 0.2310i | −0.2310 + 0.0957i |
| 0.0488 + 0.2452i | 0.2079 − 0.1389i |
| ans(:, :, 8, 15) = | |
| 0.2500 | 0.2500 |
| −0.2452 + 0.0488i | −0.2452 − 0.0488i |
| 0.2310 − 0.0957i | 0.2310 + 0.0957i |
| −0.2079 + 0.1389i | −0.2079 − 0.1389i |
| 0.2500 | −0.2500 |
| −0.2452 + 0.0488i | 0.2452 + 0.0488i |
| 0.2310 − 0.0957i | −0.2310 − 0.0957i |
| −0.2079 + 0.1389i | 0.2079 + 0.1389i |
| ans(:, :, 9, 15) = | |
| 0.2500 | 0.2500 |
| −0.2452 − 0.0488i | −0.2079 − 0.1389i |
| 0.2310 + 0.0957i | 0.0957 + 0.2310i |
| −0.2079 − 0.1389i | 0.0488 − 0.2452i |

-continued

| Rank 2 | |
|---|---|
| 0.2500 | −0.2500 |
| −0.2452 − 0.0488i | 0.2079 + 0.1389i |
| 0.2310 + 0.0957i | −0.0957 − 0.2310i |
| −0.2079 − 0.1389i | −0.0488 + 0.2452i |
| ans(:, :, 10, 15) = | |
| 0.2500 | 0.2500 |
| −0.2079 − 0.1389i | −0.1389 − 0.2079i |
| 0.0957 + 0.2310i | −0.0957 + 0.2310i |
| 0.0488 − 0.2452i | 0.2452 − 0.0488i |
| 0.2500 | −0.2500 |
| −0.2079 − 0.1389i | 0.1389 + 0.2079i |
| 0.0957 + 0.2310i | 0.0957 − 0.2310i |
| 0.0488 − 0.2452i | −0.2452 + 0.0488i |
| ans(:, :, 11, 15) = | |
| 0.2500 | 0.2500 |
| −0.1389 − 0.2079i | −0.0488 − 0.2452i |
| −0.0957 + 0.2310i | −0.2310 + 0.0957i |
| 0.2452 − 0.0488i | 0.1389 + 0.2079i |
| 0.2500 | −0.2500 |
| −0.1389 − 0.2079i | 0.0488 + 0.2452i |
| −0.0957 + 0.2310i | 0.2310 − 0.0957i |
| 0.2452 − 0.0488i | −0.1389 − 0.2079i |
| ans(:, :, 12, 15) = | |
| 0.2500 | 0.2500 |
| −0.0488 − 0.2452i | 0.0488 − 0.2452i |
| −0.2310 + 0.0957i | −0.2310 − 0.0957i |
| 0.1389 + 0.2079i | −0.1389 + 0.2079i |
| 0.2500 | −0.2500 |
| −0.0488 − 0.2452i | −0.0488 + 0.2452i |
| −0.2310 + 0.0957i | 0.2310 + 0.0957i |
| 0.1389 + 0.2079i | 0.1389 − 0.2079i |
| ans(:, :, 13, 15) = | |
| 0.2500 | 0.2500 |
| 0.0488 − 0.2452i | 0.1389 − 0.2079i |
| −0.2310 − 0.0957i | −0.0957 − 0.2310i |
| −0.1389 + 0.2079i | −0.2452 − 0.0488i |
| 0.2500 | −0.2500 |
| 0.0488 − 0.2452i | −0.1389 + 0.2079i |
| −0.2310 − 0.0957i | 0.0957 + 0.2310i |
| −0.1389 + 0.2079i | 0.2452 + 0.0488i |
| ans(:, :, 14, 15) = | |
| 0.2500 | 0.2500 |
| 0.1389 − 0.2079i | 0.2079 − 0.1389i |
| −0.0957 − 0.2310i | 0.0957 − 0.2310i |
| −0.2452 − 0.0488i | −0.0488 − 0.2452i |
| 0.2500 | −0.2500 |
| 0.1389 − 0.2079i | −0.2079 + 0.1389i |
| −0.0957 − 0.2310i | −0.0957 + 0.2310i |
| −0.2452 − 0.0488i | 0.0488 + 0.2452i |
| ans(:, :, 15, 15) = | |
| 0.2500 | 0.2500 |
| 0.2079 − 0.1389i | 0.2452 − 0.0488i |
| 0.0957 − 0.2310i | 0.2310 − 0.0957i |
| −0.0488 − 0.2452i | 0.2079 − 0.1389i |
| 0.2500 | −0.2500 |
| 0.2079 − 0.1389i | −0.2452 + 0.0488i |
| 0.0957 − 0.2310i | −0.2310 + 0.0957i |
| −0.0488 − 0.2452i | −0.2079 + 0.1389i |
| ans(:, :, 16, 15) = | |
| 0.2500 | 0.2500 |
| 0.2452 − 0.0488i | 0.2452 + 0.0488i |
| 0.2310 − 0.0957i | 0.2310 + 0.0957i |
| 0.2079 − 0.1389i | 0.2079 + 0.1389i |
| 0.2500 | −0.2500 |
| 0.2452 − 0.0488i | −0.2452 − 0.0488i |
| 0.2310 − 0.0957i | −0.2310 − 0.0957i |
| 0.2079 − 0.1389i | −0.2079 − 0.1389i |
| ans(:, :, 1, 16) = | |
| 0.2500 | 0.2500 |
| 0.2452 + 0.0488i | 0.2079 + 0.1389i |

-continued

| Rank 2 | |
|---|---|
| 0.2310 + 0.0957i | 0.0957 + 0.2310i |
| 0.2079 + 0.1389i | −0.0488 + 0.2452i |
| 0 + 0.2500i | 0 − 0.2500i |
| −0.0488 + 0.2452i | 0.1389 − 0.2079i |
| −0.0957 + 0.2310i | 0.2310 − 0.0957i |
| −0.1389 + 0.2079i | 0.2452 + 0.0488i |
| ans(:, :, 2, 16) = | |
| 0.2500 | 0.2500 |
| 0.2079 + 0.1389i | 0.1389 + 0.2079i |
| 0.0957 + 0.2310i | −0.0957 + 0.2310i |
| −0.0488 + 0.2452i | −0.2452 + 0.0488i |
| 0 + 0.2500i | 0 − 0.2500i |
| −0.1389 + 0.2079i | 0.2079 − 0.1389i |
| −0.2310 + 0.0957i | 0.2310 + 0.0957i |
| −0.2452 − 0.0488i | 0.0488 + 0.2452i |
| ans(:, :, 3, 16) = | |
| 0.2500 | 0.2500 |
| 0.1389 + 0.2079i | 0.0488 + 0.2452i |
| −0.0957 + 0.2310i | −0.2310 + 0.0957i |
| −0.2452 + 0.0488i | −0.1389 − 0.2079i |
| 0 + 0.2500i | 0 − 0.2500i |
| −0.2079 + 0.1389i | 0.2452 − 0.0488i |
| −0.2310 − 0.0957i | 0.0957 + 0.2310i |
| −0.0488 − 0.2452i | −0.2079 + 0.1389i |
| ans(:, :, 4, 16) = | |
| 0.2500 | 0.2500 |
| 0.0488 + 0.2452i | −0.0488 + 0.2452i |
| −0.2310 + 0.0957i | −0.2310 − 0.0957i |
| −0.1389 − 0.2079i | 0.1389 − 0.2079i |
| 0 + 0.2500i | 0 − 0.2500i |
| −0.2452 + 0.0488i | 0.2452 + 0.0488i |
| −0.0957 − 0.2310i | −0.0957 + 0.2310i |
| 0.2079 − 0.1389i | −0.2079 − 0.1389i |
| ans(:, :, 5, 16) = | |
| 0.2500 | 0.2500 |
| −0.0488 + 0.2452i | −0.1389 + 0.2079i |
| −0.2310 − 0.0957i | −0.0957 − 0.2310i |
| 0.1389 − 0.2079i | 0.2452 + 0.0488i |
| 0 + 0.2500i | 0 − 0.2500i |
| −0.2452 − 0.0488i | 0.2079 + 0.1389i |
| 0.0957 − 0.2310i | −0.2310 + 0.0957i |
| 0.2079 + 0.1389i | 0.0488 − 0.2452i |
| ans(:, :, 6, 16) = | |
| 0.2500 | 0.2500 |
| −0.1389 + 0.2079i | −0.2079 + 0.1389i |
| −0.0957 − 0.2310i | 0.0957 − 0.2310i |
| 0.2452 + 0.0488i | 0.0488 + 0.2452i |
| 0 + 0.2500i | 0 − 0.2500i |
| −0.2079 − 0.1389i | 0.1389 + 0.2079i |
| 0.2310 − 0.0957i | −0.2310 − 0.0957i |
| −0.0488 + 0.2452i | 0.2452 − 0.0488i |
| ans(:, :, 7, 16) = | |
| 0.2500 | 0.2500 |
| −0.2079 + 0.1389i | −0.2452 + 0.0488i |
| 0.0957 − 0.2310i | 0.2310 − 0.0957i |
| 0.0488 + 0.2452i | −0.2079 + 0.1389i |
| 0 + 0.2500i | 0 − 0.2500i |
| −0.1389 − 0.2079i | 0.0488 + 0.2452i |
| 0.2310 + 0.0957i | −0.0957 − 0.2310i |
| −0.2452 + 0.0488i | 0.1389 + 0.2079i |
| ans(:, :, 8, 16) = | |
| 0.2500 | 0.2500 |
| −0.2452 + 0.0488i | −0.2452 − 0.0488i |
| 0.2310 − 0.0957i | 0.2310 + 0.0957i |
| −0.2079 + 0.1389i | −0.2079 − 0.1389i |
| 0 + 0.2500i | 0 − 0.2500i |
| −0.0488 − 0.2452i | −0.0488 + 0.2452i |
| 0.0957 + 0.2310i | 0.0957 − 0.2310i |
| −0.1389 − 0.2079i | −0.1389 + 0.2079i |

-continued

Rank 2 ans(:, :, 9, 16) =

| | |
|---|---|
| 0.2500 | 0.2500 |
| −0.2452 − 0.0488i | −0.2079 − 0.1389i |
| 0.2310 + 0.0957i | 0.0957 + 0.2310i |
| −0.2079 − 0.1389i | 0.0488 − 0.2452i |
| 0 + 0.2500i | 0 − 0.2500i |
| 0.0488 − 0.2452i | −0.1389 + 0.2079i |
| −0.0957 + 0.2310i | 0.2310 − 0.0957i |
| 0.1389 − 0.2079i | −0.2452 − 0.0488i |

ans(:, :, 10, 16) =

| | |
|---|---|
| 0.2500 | 0.2500 |
| −0.2079 − 0.1389i | −0.1389 − 0.2079i |
| 0.0957 + 0.2310i | −0.0957 + 0.2310i |
| 0.0488 − 0.2452i | 0.2452 − 0.0488i |
| 0 + 0.2500i | 0 − 0.2500i |
| 0.1389 − 0.2079i | −0.2079 + 0.1389i |
| −0.2310 + 0.0957i | 0.2310 + 0.0957i |
| 0.2452 + 0.0488i | −0.0488 − 0.2452i |

ans(:, :, 11, 16) =

| | |
|---|---|
| 0.2500 | 0.2500 |
| −0.1389 − 0.2079i | −0.0488 − 0.2452i |
| −0.0957 + 0.2310i | −0.2310 + 0.0957i |
| 0.2452 − 0.0488i | 0.1389 + 0.2079i |
| 0 + 0.2500i | 0 − 0.2500i |
| 0.2079 − 0.1389i | −0.2452 + 0.0488i |
| −0.2310 − 0.0957i | 0.0957 + 0.2310i |
| 0.0488 + 0.2452i | 0.2079 − 0.1389i |

ans(:, :, 12, 16) =

| | |
|---|---|
| 0.2500 | 0.2500 |
| −0.0488 − 0.2452i | 0.0488 − 0.2452i |
| −0.2310 + 0.0957i | −0.2310 − 0.0957i |
| 0.1389 + 0.2079i | −0.1389 + 0.2079i |
| 0 + 0.2500i | 0 − 0.2500i |
| 0.2452 − 0.0488i | −0.2452 − 0.0488i |
| −0.0957 − 0.2310i | −0.0957 + 0.2310i |
| −0.2079 + 0.1389i | 0.2079 + 0.1389i |

ans(:, :, 13, 16) =

| | |
|---|---|
| 0.2500 | 0.2500 |
| 0.0488 − 0.2452i | 0.1389 − 0.2079i |
| −0.2310 − 0.0957i | −0.0957 − 0.2310i |
| −0.1389 + 0.2079i | −0.2452 − 0.0488i |
| 0 + 0.2500i | 0 − 0.2500i |
| 0.2452 + 0.0488i | −0.2079 − 0.1389i |
| 0.0957 − 0.2310i | −0.2310 + 0.0957i |
| −0.2079 − 0.1389i | −0.0488 + 0.2452i |

ans(:, :, 14, 16) =

| | |
|---|---|
| 0.2500 | 0.2500 |
| 0.1389 − 0.2079i | 0.2079 − 0.1389i |
| −0.0957 − 0.2310i | 0.0957 − 0.2310i |
| −0.2452 − 0.0488i | −0.0488 − 0.2452i |
| 0 + 0.2500i | 0 − 0.2500i |
| 0.2079 + 0.1389i | −0.1389 − 0.2079i |
| 0.2310 − 0.0957i | −0.2310 − 0.0957i |
| 0.0488 − 0.2452i | −0.2452 + 0.0488i |

ans(:, :, 15, 16) =

| | |
|---|---|
| 0.2500 | 0.2500 |
| 0.2079 − 0.1389i | 0.2452 − 0.0488i |
| 0.0957 − 0.2310i | 0.2310 − 0.0957i |
| −0.0488 − 0.2452i | 0.2079 − 0.1389i |
| 0 + 0.2500i | 0 − 0.2500i |
| 0.1389 + 0.2079i | −0.0488 − 0.2452i |
| 0.2310 + 0.0957i | −0.0957 − 0.2310i |
| 0.2452 − 0.0488i | −0.1389 − 0.2079i |

ans(:, :, 16, 16) =

| | |
|---|---|
| 0.2500 | 0.2500 |
| 0.2452 − 0.0488i | 0.2452 + 0.0488i |
| 0.2310 − 0.0957i | 0.2310 + 0.0957i |
| 0.2079 − 0.1389i | 0.2079 + 0.1389i |
| 0 + 0.2500i | 0 − 0.2500i |
| 0.0488 + 0.2452i | 0.0488 − 0.2452i |
| 0.0957 + 0.2310i | 0.0957 − 0.2310i |
| 0.1389 + 0.2079i | 0.1389 − 0.2079i |

-continued

Rank 3 ans(:, :, 1, 1) =

| | | |
|---|---|---|
| 0.2041 | 0.2041 | 0.2041 |
| 0.2041 | 0.2041 | 0.0000 + 0.2041i |
| 0.2041 | 0.2041 | −0.2041 + 0.0000i |
| 0.2041 | 0.2041 | −0.0000 − 0.2041i |
| 0.2041 | −0.2041 | −0.2041 |
| 0.2041 | −0.2041 | −0.0000 − 0.2041i |
| 0.2041 | −0.2041 | 0.2041 − 0.0000i |
| 0.2041 | −0.2041 | 0.0000 + 0.2041i |

ans(:, :, 2, 1) =

| | | |
|---|---|---|
| 0.2041 | 0.2041 | 0.2041 |
| 0 + 0.2041i | 0 + 0.2041i | −0.2041 + 0.0000i |
| −0.2041 | −0.2041 | 0.2041 − 0.0000i |
| 0 − 0.2041i | 0 − 0.2041i | −0.2041 + 0.0000i |
| 0.2041 | −0.2041 | −0.2041 |
| 0 + 0.2041i | 0 − 0.2041i | 0.2041 − 0.0000i |
| −0.2041 | 0.2041 | −0.2041 + 0.0000i |
| 0 − 0.2041i | 0 + 0.2041i | 0.2041 − 0.0000i |

ans(:, :, 3, 1) =

| | | |
|---|---|---|
| 0.2041 | 0.2041 | 0.2041 |
| −0.2041 | −0.2041 | −0.0000 − 0.2041i |
| 0.2041 | 0.2041 | −0.2041 + 0.0000i |
| −0.2041 | −0.2041 | 0.0000 + 0.2041i |
| 0.2041 | −0.2041 | −0.2041 |
| −0.2041 | 0.2041 | 0.0000 + 0.2041i |
| 0.2041 | −0.2041 | 0.2041 − 0.0000i |
| −0.2041 | 0.2041 | −0.0000 − 0.2041i |

ans(:, :, 4, 1) =

| | | |
|---|---|---|
| 0.2041 | 0.2041 | 0.2041 |
| 0 − 0.2041i | 0 − 0.2041i | 0.2041 − 0.0000i |
| −0.2041 | −0.2041 | 0.2041 − 0.0000i |
| 0 + 0.2041i | 0 + 0.2041i | 0.2041 − 0.0000i |
| 0.2041 | −0.2041 | −0.2041 |
| 0 − 0.2041i | 0 + 0.2041i | −0.2041 + 0.0000i |
| −0.2041 | 0.2041 | −0.2041 + 0.0000i |
| 0 + 0.2041i | 0 − 0.2041i | −0.2041 + 0.0000i |

ans(:, :, 1, 2) =

| | | |
|---|---|---|
| 0.2041 | 0.2041 | 0.2041 |
| 0.0000 + 0.2041i | 0.2041 | 0.0000 + 0.2041i |
| −0.2041 + 0.0000i | 0.2041 | −0.2041 + 0.0000i |
| −0.0000 − 0.2041i | 0.2041 | −0.0000 − 0.2041i |
| 0.2041 | −0.2041 | −0.2041 |
| 0.0000 + 0.2041i | −0.2041 | −0.0000 − 0.2041i |
| −0.2041 + 0.0000i | −0.2041 | 0.2041 − 0.0000i |
| −0.0000 − 0.2041i | −0.2041 | 0.0000 + 0.2041i |

ans(:, :, 2, 2) =

| | | |
|---|---|---|
| 0.2041 | 0.2041 | 0.2041 |
| −0.2041 + 0.0000i | 0 + 0.2041i | −0.2041 + 0.0000i |
| 0.2041 − 0.0000i | −0.2041 | 0.2041 − 0.0000i |
| −0.2041 + 0.0000i | 0 − 0.2041i | −0.2041 + 0.0000i |
| 0.2041 | −0.2041 | −0.2041 |
| −0.2041 + 0.0000i | 0 − 0.2041i | 0.2041 − 0.0000i |
| 0.2041 − 0.0000i | 0.2041 | −0.2041 + 0.0000i |
| −0.2041 + 0.0000i | 0 + 0.2041i | 0.2041 − 0.0000i |

ans(:, :, 3, 2) =

| | | |
|---|---|---|
| 0.2041 | 0.2041 | 0.2041 |
| −0.0000 − 0.2041i | −0.2041 | −0.0000 − 0.2041i |
| −0.2041 + 0.0000i | 0.2041 | −0.2041 + 0.0000i |
| 0.0000 + 0.2041i | −0.2041 | 0.0000 + 0.2041i |
| 0.2041 | −0.2041 | −0.2041 |
| −0.0000 − 0.2041i | 0.2041 | 0.0000 + 0.2041i |

-continued

| Rank 3 | | |
|---|---|---|
| −0.2041 + 0.0000i | −0.2041 | 0.2041 − 0.0000i |
| 0.0000 + 0.2041i | 0.2041 | −0.0000 − 0.2041i |
| | ans(:, :, 4, 2) = | |
| 0.2041 | 0.2041 | 0.2041 |
| 0.2041 − 0.0000i | 0 − 0.2041i | 0.2041 − 0.0000i |
| 0.2041 − 0.0000i | −0.2041 | 0.2041 − 0.0000i |
| 0.2041 − 0.0000i | 0 + 0.2041i | 0.2041 − 0.0000i |
| 0.2041 | −0.2041 | −0.2041 |
| 0.2041 − 0.0000i | 0 + 0.2041i | −0.2041 + 0.0000i |
| 0.2041 − 0.0000i | 0.2041 | −0.2041 + 0.0000i |
| 0.2041 − 0.0000i | 0 − 0.2041i | −0.2041 + 0.0000i |
| | ans(:, :, 1, 3) = | |
| 0.2041 | 0.2041 | 0.2041 |
| 0.2041 | 0.0000 + 0.2041i | 0.0000 + 0.2041i |
| 0.2041 | −0.2041 + 0.0000i | −0.2041 + 0.0000i |
| 0.2041 | −0.0000 − 0.2041i | −0.0000 − 0.2041i |
| 0.2041 | 0.2041 | −0.2041 |
| 0.2041 | 0.0000 + 0.2041i | −0.0000 − 0.2041i |
| 0.2041 | −0.2041 + 0.0000i | 0.2041 − 0.0000i |
| 0.2041 | −0.0000 − 0.2041i | 0.0000 + 0.2041i |
| | ans(:, :, 2, 3) = | |
| 0.2041 | 0.2041 | 0.2041 |
| 0 + 0.2041i | −0.2041 + 0.0000i | −0.2041 + 0.0000i |
| −0.2041 | 0.2041 − 0.0000i | 0.2041 − 0.0000i |
| 0 − 0.2041i | −0.2041 + 0.0000i | −0.2041 + 0.0000i |
| 0.2041 | 0.2041 | −0.2041 |
| 0 + 0.2041i | −0.2041 + 0.0000i | 0.2041 − 0.0000i |
| −0.2041 | 0.2041 − 0.0000i | −0.2041 + 0.0000i |
| 0 − 0.2041i | −0.2041 + 0.0000i | 0.2041 − 0.0000i |
| | ans(:, :, 3, 3) = | |
| 0.2041 | 0.2041 | 0.2041 |
| −0.2041 | −0.0000 − 0.2041i | −0.0000 − 0.2041i |
| 0.2041 | −0.2041 + 0.0000i | −0.2041 + 0.0000i |
| −0.2041 | 0.0000 + 0.2041i | 0.0000 + 0.2041i |
| 0.2041 | 0.2041 | −0.2041 |
| −0.2041 | −0.0000 − 0.2041i | 0.0000 + 0.2041i |
| 0.2041 | −0.2041 + 0.0000i | 0.2041 − 0.0000i |
| −0.2041 | 0.0000 + 0.2041i | −0.0000 − 0.2041i |
| | ans(:, :, 4, 3) = | |
| 0.2041 | 0.2041 | 0.2041 |
| 0 − 0.2041i | 0.2041 − 0.0000i | 0.2041 − 0.0000i |
| −0.2041 | 0.2041 − 0.0000i | 0.2041 − 0.0000i |
| 0 + 0.2041i | 0.2041 − 0.0000i | 0.2041 − 0.0000i |
| 0.2041 | 0.2041 | −0.2041 |
| 0 − 0.2041i | 0.2041 − 0.0000i | −0.2041 + 0.0000i |
| −0.2041 | 0.2041 − 0.0000i | −0.2041 + 0.0000i |
| 0 + 0.2041i | 0.2041 − 0.0000i | −0.2041 + 0.0000i |
| | ans(:, :, 1, 4) = | |
| 0.2041 | 0.2041 | 0.2041 |
| 0.0000 + 0.2041i | 0.2041 | 0.2041 |
| −0.2041 + 0.0000i | 0.2041 | 0.2041 |
| −0.0000 − 0.2041i | 0.2041 | 0.2041 |
| 0.2041 | 0.2041 | −0.2041 |
| 0.0000 + 0.2041i | 0.2041 | −0.2041 |
| −0.2041 + 0.0000i | 0.2041 | −0.2041 |
| −0.0000 − 0.2041i | 0.2041 | −0.2041 |
| | ans(:, :, 2, 4) = | |
| 0.2041 | 0.2041 | 0.2041 |
| −0.2041 + 0.0000i | 0 + 0.2041i | 0 + 0.2041i |
| 0.2041 − 0.0000i | −0.2041 | −0.2041 |
| −0.2041 + 0.0000i | 0 − 0.2041i | 0 − 0.2041i |
| 0.2041 | 0.2041 | −0.2041 |
| −0.2041 + 0.0000i | 0 + 0.2041i | 0 − 0.2041i |
| 0.2041 − 0.0000i | −0.2041 | 0.2041 |
| −0.2041 + 0.0000i | 0 − 0.2041i | 0 + 0.2041i |
| | ans(:, :, 3, 4) = | |
| 0.2041 | 0.2041 | 0.2041 |
| −0.0000 − 0.2041i | −0.2041 | −0.2041 |
| −0.2041 + 0.0000i | 0.2041 | 0.2041 |
| 0.0000 + 0.2041i | −0.2041 | −0.2041 |

-continued

| Rank 3 | | |
|---|---|---|
| 0.2041 | 0.2041 | −0.2041 |
| −0.0000 − 0.2041i | −0.2041 | 0.2041 |
| −0.2041 + 0.0000i | 0.2041 | −0.2041 |
| 0.0000 + 0.2041i | −0.2041 | 0.2041 |
| | ans(:, :, 4, 4) = | |
| 0.2041 | 0.2041 | 0.2041 |
| 0.2041 − 0.0000i | 0 − 0.2041i | 0 − 0.2041i |
| 0.2041 − 0.0000i | −0.2041 | −0.2041 |
| 0.2041 − 0.0000i | 0 + 0.2041i | 0 + 0.2041i |
| 0.2041 | 0.2041 | −0.2041 |
| 0.2041 − 0.0000i | 0 − 0.2041i | 0 + 0.2041i |
| 0.2041 − 0.0000i | −0.2041 | 0.2041 |
| 0.2041 − 0.0000i | 0 + 0.2041i | 0 − 0.2041i |
| | ans(:, :, 1, 5) = | |
| 0.2041 | 0.2041 | 0.2041 |
| 0.1886 + 0.0781i | 0.1886 + 0.0781i | −0.0781 + 0.1886i |
| 0.1443 + 0.1443i | 0.1443 + 0.1443i | −0.1443 − 0.1443i |
| 0.0781 + 0.1886i | 0.0781 + 0.1886i | 0.1886 − 0.0781i |
| 0.2041 | −0.2041 | −0.2041 |
| 0.1886 + 0.0781i | −0.1886 − 0.0781i | 0.0781 − 0.1886i |
| 0.1443 + 0.1443i | −0.1443 − 0.1443i | 0.1443 + 0.1443i |
| 0.0781 + 0.1886i | −0.0781 − 0.1886i | −0.1886 + 0.0781i |
| | ans(:, :, 2, 5) = | |
| 0.2041 | 0.2041 | 0.2041 |
| −0.0781 + 0.1886i | −0.0781 + 0.1886i | −0.1886 − 0.0781i |
| −0.1443 − 0.1443i | −0.1443 − 0.1443i | 0.1443 + 0.1443i |
| 0.1886 − 0.0781i | 0.1886 − 0.0781i | −0.0781 − 0.1886i |
| 0.2041 | −0.2041 | −0.2041 |
| −0.0781 + 0.1886i | 0.0781 − 0.1886i | 0.1886 + 0.0781i |
| −0.1443 − 0.1443i | 0.1443 + 0.1443i | −0.1443 − 0.1443i |
| 0.1886 − 0.0781i | −0.1886 + 0.0781i | 0.0781 + 0.1886i |
| | ans(:, :, 3, 5) = | |
| 0.2041 | 0.2041 | 0.2041 |
| −0.1886 − 0.0781i | −0.1886 − 0.0781i | 0.0781 − 0.1886i |
| 0.1443 + 0.1443i | 0.1443 + 0.1443i | −0.1443 − 0.1443i |
| −0.0781 − 0.1886i | −0.0781 − 0.1886i | −0.1886 + 0.0781i |
| 0.2041 | −0.2041 | −0.2041 |
| −0.1886 − 0.0781i | 0.1886 + 0.0781i | −0.0781 + 0.1886i |
| 0.1443 + 0.1443i | −0.1443 − 0.1443i | 0.1443 + 0.1443i |
| −0.0781 − 0.1886i | 0.0781 + 0.1886i | 0.1886 − 0.0781i |
| | ans(:, :, 4, 5) = | |
| 0.2041 | 0.2041 | 0.2041 |
| 0.0781 − 0.1886i | 0.0781 − 0.1886i | 0.1886 + 0.0781i |
| −0.1443 − 0.1443i | −0.1443 − 0.1443i | 0.1443 + 0.1443i |
| −0.1886 + 0.0781i | −0.1886 + 0.0781i | 0.0781 + 0.1886i |
| 0.2041 | −0.2041 | −0.2041 |
| 0.0781 − 0.1886i | −0.0781 + 0.1886i | −0.1886 − 0.0781i |
| −0.1443 − 0.1443i | 0.1443 + 0.1443i | −0.1443 − 0.1443i |
| −0.1886 + 0.0781i | 0.1886 − 0.0781i | −0.0781 − 0.1886i |
| | ans(:, :, 1, 6) = | |
| 0.2041 | 0.2041 | 0.2041 |
| −0.0781 + 0.1886i | 0.1886 + 0.0781i | −0.0781 + 0.1886i |
| −0.1443 − 0.1443i | 0.1443 + 0.1443i | −0.1443 − 0.1443i |
| 0.1886 − 0.0781i | 0.0781 + 0.1886i | 0.1886 − 0.0781i |
| 0.2041 | −0.2041 | −0.2041 |
| −0.0781 + 0.1886i | −0.1886 − 0.0781i | 0.0781 − 0.1886i |
| −0.1443 − 0.1443i | −0.1443 − 0.1443i | 0.1443 + 0.1443i |
| 0.1886 − 0.0781i | −0.0781 − 0.1886i | −0.1886 + 0.0781i |
| | ans(:, :, 2, 6) = | |
| 0.2041 | 0.2041 | 0.2041 |
| −0.1886 − 0.0781i | −0.0781 + 0.1886i | −0.1886 − 0.0781i |
| 0.1443 + 0.1443i | −0.1443 − 0.1443i | 0.1443 + 0.1443i |
| −0.0781 − 0.1886i | 0.1886 − 0.0781i | −0.0781 − 0.1886i |
| 0.2041 | −0.2041 | −0.2041 |
| −0.1886 − 0.0781i | 0.0781 − 0.1886i | 0.1886 + 0.0781i |
| 0.1443 + 0.1443i | 0.1443 + 0.1443i | −0.1443 − 0.1443i |
| −0.0781 − 0.1886i | −0.1886 + 0.0781i | 0.0781 + 0.1886i |
| | ans(:, :, 3, 6) = | |
| 0.2041 | 0.2041 | 0.2041 |
| 0.0781 − 0.1886i | −0.1886 − 0.0781i | 0.0781 − 0.1886i |

-continued

| Rank 3 | | |
|---|---|---|
| −0.1443 − 0.1443i | 0.1443 + 0.1443i | −0.1443 − 0.1443i |
| −0.1886 + 0.0781i | −0.0781 − 0.1886i | −0.1886 + 0.0781i |
| 0.2041 | −0.2041 | −0.2041 |
| 0.0781 − 0.1886i | 0.1886 + 0.0781i | −0.0781 + 0.1886i |
| −0.1443 − 0.1443i | −0.1443 − 0.1443i | 0.1443 + 0.1443i |
| −0.1886 + 0.0781i | 0.0781 + 0.1886i | 0.1886 − 0.0781i |
| | ans(:, :, 4, 6) = | |
| 0.2041 | 0.2041 | 0.2041 |
| 0.1886 + 0.0781i | 0.0781 − 0.1886i | 0.1886 + 0.0781i |
| 0.1443 + 0.1443i | −0.1443 − 0.1443i | 0.1443 + 0.1443i |
| 0.0781 + 0.1886i | −0.1886 + 0.0781i | 0.0781 + 0.1886i |
| 0.2041 | −0.2041 | −0.2041 |
| 0.1886 + 0.0781i | −0.0781 + 0.1886i | −0.1886 − 0.0781i |
| 0.1443 + 0.1443i | 0.1443 + 0.1443i | −0.1443 − 0.1443i |
| 0.0781 + 0.1886i | 0.1886 − 0.0781i | −0.0781 − 0.1886i |
| | ans(:, :, 1, 7) = | |
| 0.2041 | 0.2041 | 0.2041 |
| 0.1886 + 0.0781i | −0.0781 + 0.1886i | −0.0781 + 0.1886i |
| 0.1443 + 0.1443i | −0.1443 − 0.1443i | −0.1443 − 0.1443i |
| 0.0781 + 0.1886i | 0.1886 − 0.0781i | 0.1886 − 0.0781i |
| 0.2041 | 0.2041 | −0.2041 |
| 0.1886 + 0.0781i | −0.0781 + 0.1886i | 0.0781 − 0.1886i |
| 0.1443 + 0.1443i | −0.1443 − 0.1443i | 0.1443 + 0.1443i |
| 0.0781 + 0.1886i | 0.1886 − 0.0781i | −0.1886 + 0.0781i |
| | ans(:, :, 2, 7) = | |
| 0.2041 | 0.2041 | 0.2041 |
| −0.0781 + 0.1886i | −0.1886 − 0.0781i | −0.1886 − 0.0781i |
| −0.1443 − 0.1443i | 0.1443 + 0.1443i | 0.1443 + 0.1443i |
| 0.1886 − 0.0781i | −0.0781 − 0.1886i | −0.0781 − 0.1886i |
| 0.2041 | 0.2041 | −0.2041 |
| −0.0781 + 0.1886i | −0.1886 − 0.0781i | 0.1886 + 0.0781i |
| −0.1443 − 0.1443i | 0.1443 + 0.1443i | −0.1443 − 0.1443i |
| 0.1886 − 0.0781i | −0.0781 − 0.1886i | 0.0781 + 0.1886i |
| | ans(:, :, 3, 7) = | |
| 0.2041 | 0.2041 | 0.2041 |
| −0.1886 − 0.0781i | 0.0781 − 0.1886i | 0.0781 − 0.1886i |
| 0.1443 + 0.1443i | −0.1443 − 0.1443i | −0.1443 − 0.1443i |
| −0.0781 − 0.1886i | −0.1886 + 0.0781i | −0.1886 + 0.0781i |
| 0.2041 | 0.2041 | −0.2041 |
| −0.1886 − 0.0781i | 0.0781 − 0.1886i | −0.0781 + 0.1886i |
| 0.1443 + 0.1443i | −0.1443 − 0.1443i | 0.1443 + 0.1443i |
| −0.0781 − 0.1886i | −0.1886 + 0.0781i | 0.1886 − 0.0781i |
| | ans(:, :, 4, 7) = | |
| 0.2041 | 0.2041 | 0.2041 |
| 0.0781 − 0.1886i | 0.1886 + 0.0781i | 0.1886 + 0.0781i |
| −0.1443 − 0.1443i | 0.1443 + 0.1443i | 0.1443 + 0.1443i |
| −0.1886 + 0.0781i | 0.0781 + 0.1886i | 0.0781 + 0.1886i |
| 0.2041 | 0.2041 | −0.2041 |
| 0.0781 − 0.1886i | 0.1886 + 0.0781i | −0.1886 − 0.0781i |
| −0.1443 − 0.1443i | 0.1443 + 0.1443i | −0.1443 − 0.1443i |
| −0.1886 + 0.0781i | 0.0781 + 0.1886i | −0.0781 − 0.1886i |
| | ans(:, :, 1, 8) = | |
| 0.2041 | 0.2041 | 0.2041 |
| −0.0781 + 0.1886i | 0.1886 + 0.0781i | 0.1886 + 0.0781i |
| −0.1443 − 0.1443i | 0.1443 + 0.1443i | 0.1443 + 0.1443i |
| 0.1886 − 0.0781i | 0.0781 + 0.1886i | 0.0781 + 0.1886i |
| 0.2041 | 0.2041 | −0.2041 |
| −0.0781 + 0.1886i | 0.1886 + 0.0781i | −0.1886 − 0.0781i |
| −0.1443 − 0.1443i | 0.1443 + 0.1443i | −0.1443 − 0.1443i |
| 0.1886 − 0.0781i | 0.0781 + 0.1886i | −0.0781 − 0.1886i |
| | ans(:, :, 2, 8) = | |
| 0.2041 | 0.2041 | 0.2041 |
| −0.1886 − 0.0781i | −0.0781 + 0.1886i | −0.0781 + 0.1886i |
| 0.1443 + 0.1443i | −0.1443 − 0.1443i | −0.1443 − 0.1443i |
| −0.0781 − 0.1886i | 0.1886 − 0.0781i | 0.1886 − 0.0781i |
| 0.2041 | 0.2041 | −0.2041 |
| −0.1886 − 0.0781i | −0.0781 + 0.1886i | 0.0781 − 0.1886i |
| 0.1443 + 0.1443i | −0.1443 − 0.1443i | 0.1443 + 0.1443i |
| −0.0781 − 0.1886i | 0.1886 − 0.0781i | −0.1886 + 0.0781i |

-continued

| Rank 3 | | |
|---|---|---|
| | ans(:, :, 3, 8) = | |
| 0.2041 | 0.2041 | 0.2041 |
| 0.0781 − 0.1886i | −0.1886 − 0.0781i | −0.1886 − 0.0781i |
| −0.1443 − 0.1443i | 0.1443 + 0.1443i | 0.1443 + 0.1443i |
| −0.1886 + 0.0781i | −0.0781 − 0.1886i | −0.0781 − 0.1886i |
| 0.2041 | 0.2041 | −0.2041 |
| 0.0781 − 0.1886i | −0.1886 − 0.0781i | 0.1886 + 0.0781i |
| −0.1443 − 0.1443i | 0.1443 + 0.1443i | −0.1443 − 0.1443i |
| −0.1886 + 0.0781i | −0.0781 − 0.1886i | 0.0781 + 0.1886i |
| | ans(:, :, 4, 8) = | |
| 0.2041 | 0.2041 | 0.2041 |
| 0.1886 + 0.0781i | 0.0781 − 0.1886i | 0.0781 − 0.1886i |
| 0.1443 + 0.1443i | −0.1443 − 0.1443i | −0.1443 − 0.1443i |
| 0.0781 + 0.1886i | −0.1886 + 0.0781i | −0.1886 + 0.0781i |
| 0.2041 | 0.2041 | −0.2041 |
| 0.1886 + 0.0781i | 0.0781 − 0.1886i | −0.0781 + 0.1886i |
| 0.1443 + 0.1443i | −0.1443 − 0.1443i | 0.1443 + 0.1443i |
| 0.0781 + 0.1886i | −0.1886 + 0.0781i | 0.1886 − 0.0781i |
| | ans(:, :, 1, 9) = | |
| 0.2041 | 0.2041 | 0.2041 |
| 0.1443 + 0.1443i | 0.1443 + 0.1443i | −0.1443 + 0.1443i |
| 0.0000 + 0.2041i | 0.0000 + 0.2041i | −0.0000 − 0.2041i |
| −0.1443 + 0.1443i | −0.1443 + 0.1443i | 0.1443 + 0.1443i |
| 0.2041 | −0.2041 | −0.2041 |
| 0.1443 + 0.1443i | −0.1443 − 0.1443i | 0.1443 − 0.1443i |
| 0.0000 + 0.2041i | −0.0000 − 0.2041i | 0.0000 + 0.2041i |
| −0.1443 + 0.1443i | 0.1443 − 0.1443i | −0.1443 − 0.1443i |
| | ans(:, :, 2, 9) = | |
| 0.2041 | 0.2041 | 0.2041 |
| −0.1443 + 0.1443i | −0.1443 + 0.1443i | −0.1443 − 0.1443i |
| −0.0000 − 0.2041i | −0.0000 − 0.2041i | 0.0000 + 0.2041i |
| 0.1443 + 0.1443i | 0.1443 + 0.1443i | 0.1443 − 0.1443i |
| 0.2041 | −0.2041 | −0.2041 |
| −0.1443 + 0.1443i | 0.1443 − 0.1443i | 0.1443 + 0.1443i |
| −0.0000 − 0.2041i | 0.0000 + 0.2041i | −0.0000 − 0.2041i |
| 0.1443 + 0.1443i | −0.1443 − 0.1443i | −0.1443 + 0.1443i |
| | ans(:, :, 3, 9) = | |
| 0.2041 | 0.2041 | 0.2041 |
| −0.1443 − 0.1443i | −0.1443 − 0.1443i | 0.1443 − 0.1443i |
| 0.0000 + 0.2041i | 0.0000 + 0.2041i | −0.0000 − 0.2041i |
| 0.1443 − 0.1443i | 0.1443 − 0.1443i | −0.1443 − 0.1443i |
| 0.2041 | −0.2041 | −0.2041 |
| −0.1443 − 0.1443i | 0.1443 + 0.1443i | −0.1443 + 0.1443i |
| 0.0000 + 0.2041i | −0.0000 − 0.2041i | 0.0000 + 0.2041i |
| 0.1443 − 0.1443i | −0.1443 + 0.1443i | 0.1443 + 0.1443i |
| | ans(:, :, 4, 9) = | |
| 0.2041 | 0.2041 | 0.2041 |
| 0.1443 − 0.1443i | 0.1443 − 0.1443i | 0.1443 + 0.1443i |
| −0.0000 − 0.2041i | −0.0000 − 0.2041i | 0.0000 + 0.2041i |
| −0.1443 − 0.1443i | −0.1443 − 0.1443i | −0.1443 + 0.1443i |
| 0.2041 | −0.2041 | −0.2041 |
| 0.1443 − 0.1443i | −0.1443 + 0.1443i | −0.1443 − 0.1443i |
| −0.0000 − 0.2041i | 0.0000 + 0.2041i | −0.0000 − 0.2041i |
| −0.1443 − 0.1443i | 0.1443 + 0.1443i | 0.1443 − 0.1443i |
| | ans(:, :, 1, 10) = | |
| 0.2041 | 0.2041 | 0.2041 |
| −0.1443 + 0.1443i | 0.1443 + 0.1443i | −0.1443 + 0.1443i |
| −0.0000 − 0.2041i | 0.0000 + 0.2041i | −0.0000 − 0.2041i |
| 0.1443 + 0.1443i | −0.1443 + 0.1443i | 0.1443 + 0.1443i |
| 0.2041 | −0.2041 | −0.2041 |
| −0.1443 + 0.1443i | −0.1443 − 0.1443i | 0.1443 − 0.1443i |
| −0.0000 − 0.2041i | −0.0000 − 0.2041i | 0.0000 + 0.2041i |
| 0.1443 + 0.1443i | 0.1443 − 0.1443i | −0.1443 − 0.1443i |
| | ans(:, :, 2, 10) = | |
| 0.2041 | 0.2041 | 0.2041 |
| −0.1443 − 0.1443i | −0.1443 + 0.1443i | −0.1443 − 0.1443i |
| 0.0000 + 0.2041i | −0.0000 − 0.2041i | 0.0000 + 0.2041i |
| 0.1443 − 0.1443i | 0.1443 + 0.1443i | 0.1443 − 0.1443i |
| 0.2041 | −0.2041 | −0.2041 |
| −0.1443 − 0.1443i | 0.1443 − 0.1443i | 0.1443 + 0.1443i |

-continued

| Rank 3 | | |
|---|---|---|
| 0.0000 + 0.2041i | 0.0000 + 0.2041i | −0.0000 − 0.2041i |
| 0.1443 − 0.1443i | −0.1443 − 0.1443i | −0.1443 + 0.1443i |
| | ans(:, :, 3, 10) = | |
| 0.2041 | 0.2041 | 0.2041 |
| 0.1443 − 0.1443i | −0.1443 − 0.1443i | 0.1443 − 0.1443i |
| −0.0000 − 0.2041i | 0.0000 + 0.2041i | −0.0000 − 0.2041i |
| −0.1443 − 0.1443i | 0.1443 − 0.1443i | −0.1443 − 0.1443i |
| 0.2041 | −0.2041 | −0.2041 |
| 0.1443 − 0.1443i | 0.1443 + 0.1443i | −0.1443 + 0.1443i |
| −0.0000 − 0.2041i | −0.0000 − 0.2041i | 0.0000 + 0.2041i |
| −0.1443 − 0.1443i | −0.1443 + 0.1443i | 0.1443 + 0.1443i |
| | ans(:, :, 4, 10) = | |
| 0.2041 | 0.2041 | 0.2041 |
| 0.1443 + 0.1443i | 0.1443 − 0.1443i | 0.1443 + 0.1443i |
| 0.0000 + 0.2041i | −0.0000 − 0.2041i | 0.0000 + 0.2041i |
| −0.1443 + 0.1443i | −0.1443 − 0.1443i | −0.1443 + 0.1443i |
| 0.2041 | −0.2041 | −0.2041 |
| 0.1443 + 0.1443i | −0.1443 + 0.1443i | −0.1443 − 0.1443i |
| 0.0000 + 0.2041i | 0.0000 + 0.2041i | −0.0000 − 0.2041i |
| −0.1443 + 0.1443i | 0.1443 + 0.1443i | 0.1443 − 0.1443i |
| | ans(:, :, 1, 11) = | |
| 0.2041 | 0.2041 | 0.2041 |
| 0.1443 + 0.1443i | −0.1443 + 0.1443i | −0.1443 + 0.1443i |
| 0.0000 + 0.2041i | −0.0000 − 0.2041i | −0.0000 − 0.2041i |
| −0.1443 + 0.1443i | 0.1443 + 0.1443i | 0.1443 + 0.1443i |
| 0.2041 | 0.2041 | −0.2041 |
| 0.1443 + 0.1443i | −0.1443 + 0.1443i | 0.1443 − 0.1443i |
| 0.0000 + 0.2041i | −0.0000 − 0.2041i | 0.0000 + 0.2041i |
| −0.1443 + 0.1443i | 0.1443 + 0.1443i | −0.1443 − 0.1443i |
| | ans(:, :, 2, 11) = | |
| 0.2041 | 0.2041 | 0.2041 |
| −0.1443 + 0.1443i | −0.1443 − 0.1443i | −0.1443 − 0.1443i |
| −0.0000 − 0.2041i | 0.0000 + 0.2041i | 0.0000 + 0.2041i |
| 0.1443 + 0.1443i | 0.1443 − 0.1443i | 0.1443 − 0.1443i |
| 0.2041 | 0.2041 | −0.2041 |
| −0.1443 + 0.1443i | −0.1443 + 0.1443i | 0.1443 + 0.1443i |
| −0.0000 − 0.2041i | 0.0000 + 0.2041i | −0.0000 − 0.2041i |
| 0.1443 + 0.1443i | 0.1443 − 0.1443i | −0.1443 + 0.1443i |
| | ans(:, :, 3, 11) = | |
| 0.2041 | 0.2041 | 0.2041 |
| −0.1443 − 0.1443i | 0.1443 − 0.1443i | 0.1443 − 0.1443i |
| 0.0000 + 0.2041i | −0.0000 − 0.2041i | −0.0000 − 0.2041i |
| 0.1443 − 0.1443i | −0.1443 − 0.1443i | −0.1443 − 0.1443i |
| 0.2041 | 0.2041 | −0.2041 |
| −0.1443 − 0.1443i | 0.1443 − 0.1443i | −0.1443 + 0.1443i |
| 0.0000 + 0.2041i | −0.0000 − 0.2041i | 0.0000 + 0.2041i |
| 0.1443 − 0.1443i | −0.1443 − 0.1443i | 0.1443 + 0.1443i |
| | ans(:, :, 4, 11) = | |
| 0.2041 | 0.2041 | 0.2041 |
| 0.1443 − 0.1443i | 0.1443 + 0.1443i | 0.1443 + 0.1443i |
| −0.0000 − 0.2041i | 0.0000 + 0.2041i | 0.0000 + 0.2041i |
| −0.1443 − 0.1443i | −0.1443 + 0.1443i | −0.1443 + 0.1443i |
| 0.2041 | 0.2041 | −0.2041 |
| 0.1443 − 0.1443i | 0.1443 + 0.1443i | −0.1443 − 0.1443i |
| −0.0000 − 0.2041i | 0.0000 + 0.2041i | −0.0000 − 0.2041i |
| −0.1443 − 0.1443i | −0.1443 + 0.1443i | 0.1443 − 0.1443i |
| | ans(:, :, 1, 12) = | |
| 0.2041 | 0.2041 | 0.2041 |
| −0.1443 + 0.1443i | 0.1443 + 0.1443i | 0.1443 + 0.1443i |
| −0.0000 − 0.2041i | 0.0000 + 0.2041i | 0.0000 + 0.2041i |
| 0.1443 + 0.1443i | −0.1443 + 0.1443i | −0.1443 + 0.1443i |
| 0.2041 | 0.2041 | −0.2041 |
| −0.1443 + 0.1443i | 0.1443 + 0.1443i | −0.1443 − 0.1443i |
| −0.0000 − 0.2041i | 0.0000 + 0.2041i | −0.0000 − 0.2041i |
| 0.1443 + 0.1443i | −0.1443 + 0.1443i | 0.1443 − 0.1443i |
| | ans(:, :, 2, 12) = | |
| 0.2041 | 0.2041 | 0.2041 |
| −0.1443 − 0.1443i | −0.1443 + 0.1443i | −0.1443 + 0.1443i |
| 0.0000 + 0.2041i | −0.0000 − 0.2041i | −0.0000 − 0.2041i |
| 0.1443 − 0.1443i | 0.1443 + 0.1443i | 0.1443 + 0.1443i |

-continued

| Rank 3 | | |
|---|---|---|
| 0.2041 | 0.2041 | −0.2041 |
| −0.1443 − 0.1443i | −0.1443 + 0.1443i | 0.1443 − 0.1443i |
| 0.0000 + 0.2041i | −0.0000 − 0.2041i | 0.0000 + 0.2041i |
| 0.1443 − 0.1443i | 0.1443 + 0.1443i | −0.1443 − 0.1443i |
| | ans(:, :, 3, 12) = | |
| 0.2041 | 0.2041 | 0.2041 |
| 0.1443 − 0.1443i | −0.1443 − 0.1443i | −0.1443 − 0.1443i |
| −0.0000 − 0.2041i | 0.0000 + 0.2041i | 0.0000 + 0.2041i |
| −0.1443 − 0.1443i | 0.1443 − 0.1443i | 0.1443 − 0.1443i |
| 0.2041 | 0.2041 | −0.2041 |
| 0.1443 − 0.1443i | −0.1443 − 0.1443i | 0.1443 + 0.1443i |
| −0.0000 − 0.2041i | 0.0000 + 0.2041i | −0.0000 − 0.2041i |
| −0.1443 − 0.1443i | 0.1443 − 0.1443i | −0.1443 + 0.1443i |
| | ans(:, :, 4, 12) = | |
| 0.2041 | 0.2041 | 0.2041 |
| 0.1443 + 0.1443i | 0.1443 − 0.1443i | 0.1443 − 0.1443i |
| 0.0000 + 0.2041i | −0.0000 − 0.2041i | −0.0000 − 0.2041i |
| −0.1443 + 0.1443i | −0.1443 − 0.1443i | −0.1443 − 0.1443i |
| 0.2041 | 0.2041 | −0.2041 |
| 0.1443 + 0.1443i | 0.1443 − 0.1443i | −0.1443 + 0.1443i |
| 0.0000 + 0.2041i | −0.0000 − 0.2041i | 0.0000 + 0.2041i |
| −0.1443 + 0.1443i | −0.1443 − 0.1443i | 0.1443 + 0.1443i |
| | ans(:, :, 1, 13) = | |
| 0.2041 | 0.2041 | 0.2041 |
| 0.0781 + 0.1886i | 0.0781 + 0.1886i | −0.1886 + 0.0781i |
| −0.1443 + 0.1443i | −0.1443 + 0.1443i | 0.1443 − 0.1443i |
| −0.1886 − 0.0781i | −0.1886 − 0.0781i | −0.0781 + 0.1886i |
| 0.2041 | −0.2041 | −0.2041 |
| 0.0781 + 0.1886i | −0.0781 − 0.1886i | 0.1886 − 0.0781i |
| −0.1443 + 0.1443i | 0.1443 − 0.1443i | −0.1443 + 0.1443i |
| −0.1886 − 0.0781i | 0.1886 + 0.0781i | 0.0781 − 0.1886i |
| | ans(:, :, 2, 13) = | |
| 0.2041 | 0.2041 | 0.2041 |
| −0.1886 + 0.0781i | −0.1886 + 0.0781i | −0.0781 − 0.1886i |
| 0.1443 − 0.1443i | 0.1443 − 0.1443i | −0.1443 + 0.1443i |
| −0.0781 + 0.1886i | −0.0781 + 0.1886i | 0.1886 + 0.0781i |
| 0.2041 | −0.2041 | −0.2041 |
| −0.1886 + 0.0781i | 0.1886 − 0.0781i | 0.0781 + 0.1886i |
| 0.1443 − 0.1443i | −0.1443 + 0.1443i | 0.1443 − 0.1443i |
| −0.0781 + 0.1886i | 0.0781 − 0.1886i | −0.1886 − 0.0781i |
| | ans(:, :, 3, 13) = | |
| 0.2041 | 0.2041 | 0.2041 |
| −0.0781 − 0.1886i | −0.0781 − 0.1886i | 0.1886 − 0.0781i |
| −0.1443 + 0.1443i | −0.1443 + 0.1443i | 0.1443 − 0.1443i |
| 0.1886 + 0.0781i | 0.1886 + 0.0781i | 0.0781 − 0.1886i |
| 0.2041 | −0.2041 | −0.2041 |
| −0.0781 − 0.1886i | 0.0781 + 0.1886i | −0.1886 + 0.0781i |
| −0.1443 + 0.1443i | 0.1443 − 0.1443i | −0.1443 + 0.1443i |
| 0.1886 + 0.0781i | −0.1886 − 0.0781i | −0.0781 + 0.1886i |
| | ans(:, :, 4, 13) = | |
| 0.2041 | 0.2041 | 0.2041 |
| 0.1886 − 0.0781i | 0.1886 − 0.0781i | 0.0781 + 0.1886i |
| 0.1443 − 0.1443i | 0.1443 − 0.1443i | −0.1443 + 0.1443i |
| 0.0781 − 0.1886i | 0.0781 − 0.1886i | −0.1886 − 0.0781i |
| 0.2041 | −0.2041 | −0.2041 |
| 0.1886 − 0.0781i | −0.1886 + 0.0781i | −0.0781 − 0.1886i |
| 0.1443 − 0.1443i | −0.1443 + 0.1443i | 0.1443 − 0.1443i |
| 0.0781 − 0.1886i | −0.0781 + 0.1886i | 0.1886 + 0.0781i |
| | ans(:, :, 1, 14) = | |
| 0.2041 | 0.2041 | 0.2041 |
| −0.1886 + 0.0781i | 0.0781 + 0.1886i | −0.1886 + 0.0781i |
| 0.1443 − 0.1443i | −0.1443 + 0.1443i | 0.1443 − 0.1443i |
| −0.0781 + 0.1886i | −0.1886 − 0.0781i | −0.0781 + 0.1886i |
| 0.2041 | −0.2041 | −0.2041 |
| −0.1886 + 0.0781i | −0.0781 − 0.1886i | 0.1886 − 0.0781i |
| 0.1443 − 0.1443i | 0.1443 − 0.1443i | −0.1443 + 0.1443i |
| −0.0781 + 0.1886i | 0.1886 + 0.0781i | 0.0781 − 0.1886i |
| | ans(:, :, 2, 14) = | |
| 0.2041 | 0.2041 | 0.2041 |
| −0.0781 − 0.1886i | −0.1886 + 0.0781i | −0.0781 − 0.1886i |

-continued

Rank 3

| | | |
|---|---|---|
| −0.1443 + 0.1443i | 0.1443 − 0.1443i | −0.1443 + 0.1443i |
| 0.1886 + 0.0781i | −0.0781 + 0.1886i | 0.1886 + 0.0781i |
| 0.2041 | −0.2041 | −0.2041 |
| −0.0781 − 0.1886i | 0.1886 − 0.0781i | 0.0781 + 0.1886i |
| −0.1443 + 0.1443i | −0.1443 + 0.1443i | 0.1443 − 0.1443i |
| 0.1886 + 0.0781i | 0.0781 − 0.1886i | −0.1886 − 0.0781i |

ans(:, :, 3, 14) =

| | | |
|---|---|---|
| 0.2041 | 0.2041 | 0.2041 |
| 0.1886 − 0.0781i | −0.0781 − 0.1886i | 0.1886 − 0.0781i |
| 0.1443 − 0.1443i | −0.1443 + 0.1443i | 0.1443 − 0.1443i |
| 0.0781 − 0.1886i | 0.1886 + 0.0781i | 0.0781 − 0.1886i |
| 0.2041 | −0.2041 | −0.2041 |
| 0.1886 − 0.0781i | 0.0781 + 0.1886i | −0.1886 + 0.0781i |
| 0.1443 − 0.1443i | 0.1443 − 0.1443i | −0.1443 + 0.1443i |
| 0.0781 − 0.1886i | −0.1886 − 0.0781i | −0.0781 + 0.1886i |

ans(:, :, 4, 14) =

| | | |
|---|---|---|
| 0.2041 | 0.2041 | 0.2041 |
| 0.0781 + 0.1886i | 0.1886 − 0.0781i | 0.0781 + 0.1886i |
| −0.1443 + 0.1443i | 0.1443 − 0.1443i | −0.1443 + 0.1443i |
| −0.1886 − 0.0781i | 0.0781 − 0.1886i | −0.1886 − 0.0781i |
| 0.2041 | −0.2041 | −0.2041 |
| 0.0781 + 0.1886i | −0.1886 + 0.0781i | −0.0781 − 0.1886i |
| −0.1443 + 0.1443i | −0.1443 + 0.1443i | 0.1443 − 0.1443i |
| −0.1886 − 0.0781i | −0.0781 + 0.1886i | 0.1886 + 0.0781i |

ans(:, :, 1, 15) =

| | | |
|---|---|---|
| 0.2041 | 0.2041 | 0.2041 |
| 0.0781 + 0.1886i | −0.1886 + 0.0781i | −0.1886 + 0.0781i |
| −0.1443 + 0.1443i | 0.1443 − 0.1443i | 0.1443 − 0.1443i |
| −0.1886 − 0.0781i | −0.0781 + 0.1886i | −0.0781 + 0.1886i |
| 0.2041 | 0.2041 | −0.2041 |
| 0.0781 + 0.1886i | −0.1886 + 0.0781i | 0.1886 − 0.0781i |
| −0.1443 + 0.1443i | 0.1443 − 0.1443i | −0.1443 + 0.1443i |
| −0.1886 − 0.0781i | −0.0781 + 0.1886i | 0.0781 − 0.1886i |

ans(:, :, 2, 15) =

| | | |
|---|---|---|
| 0.2041 | 0.2041 | 0.2041 |
| −0.1886 + 0.0781i | −0.0781 − 0.1886i | −0.0781 − 0.1886i |
| 0.1443 − 0.1443i | −0.1443 + 0.1443i | −0.1443 + 0.1443i |
| −0.0781 + 0.1886i | 0.1886 + 0.0781i | 0.1886 + 0.0781i |
| 0.2041 | 0.2041 | −0.2041 |
| −0.1886 + 0.0781i | −0.0781 − 0.1886i | 0.0781 + 0.1886i |
| 0.1443 − 0.1443i | −0.1443 + 0.1443i | 0.1443 − 0.1443i |
| −0.0781 + 0.1886i | 0.1886 + 0.0781i | −0.1886 − 0.0781i |

ans(:, :, 3, 15) =

| | | |
|---|---|---|
| 0.2041 | 0.2041 | 0.2041 |
| −0.0781 − 0.1886i | 0.1886 − 0.0781i | 0.1886 − 0.0781i |
| −0.1443 + 0.1443i | 0.1443 − 0.1443i | 0.1443 − 0.1443i |
| 0.1886 + 0.0781i | 0.0781 − 0.1886i | 0.0781 − 0.1886i |
| 0.2041 | 0.2041 | −0.2041 |
| −0.0781 − 0.1886i | 0.1886 − 0.0781i | −0.1886 + 0.0781i |
| −0.1443 + 0.1443i | 0.1443 − 0.1443i | −0.1443 + 0.1443i |
| 0.1886 + 0.0781i | 0.0781 − 0.1886i | −0.0781 + 0.1886i |

ans(:, :, 4, 15) =

| | | |
|---|---|---|
| 0.2041 | 0.2041 | 0.2041 |
| 0.1886 − 0.0781i | 0.0781 + 0.1886i | 0.0781 + 0.1886i |
| 0.1443 − 0.1443i | −0.1443 + 0.1443i | −0.1443 + 0.1443i |
| 0.0781 − 0.1886i | −0.1886 − 0.0781i | −0.1886 − 0.0781i |
| 0.2041 | 0.2041 | −0.2041 |
| 0.1886 − 0.0781i | 0.0781 + 0.1886i | −0.0781 − 0.1886i |
| 0.1443 − 0.1443i | −0.1443 + 0.1443i | 0.1443 − 0.1443i |
| 0.0781 − 0.1886i | −0.1886 − 0.0781i | 0.1886 + 0.0781i |

ans(:, :, 1, 16) =

| | | |
|---|---|---|
| 0.2041 | 0.2041 | 0.2041 |
| −0.1886 + 0.0781i | 0.0781 + 0.1886i | 0.0781 + 0.1886i |
| 0.1443 − 0.1443i | −0.1443 + 0.1443i | −0.1443 + 0.1443i |
| −0.0781 + 0.1886i | −0.1886 − 0.0781i | −0.1886 − 0.0781i |
| 0.2041 | 0.2041 | −0.2041 |
| −0.1886 + 0.0781i | 0.0781 + 0.1886i | −0.0781 − 0.1886i |
| 0.1443 − 0.1443i | −0.1443 + 0.1443i | 0.1443 − 0.1443i |
| −0.0781 + 0.1886i | −0.1886 − 0.0781i | 0.1886 + 0.0781i |

-continued

Rank 3 ans(:, :, 2, 16) =

| | | |
|---|---|---|
| 0.2041 | 0.2041 | 0.2041 |
| −0.0781 − 0.1886i | −0.1886 + 0.0781i | −0.1886 + 0.0781i |
| −0.1443 + 0.1443i | 0.1443 − 0.1443i | 0.1443 − 0.1443i |
| 0.1886 + 0.0781i | −0.0781 + 0.1886i | −0.0781 + 0.1886i |
| 0.2041 | 0.2041 | −0.2041 |
| −0.0781 − 0.1886i | −0.1886 + 0.0781i | 0.1886 − 0.0781i |
| −0.1443 + 0.1443i | 0.1443 − 0.1443i | −0.1443 + 0.1443i |
| 0.1886 + 0.0781i | −0.0781 + 0.1886i | 0.0781 − 0.1886i |

ans(:, :, 3, 16) =

| | | |
|---|---|---|
| 0.2041 | 0.2041 | 0.2041 |
| 0.1886 − 0.0781i | −0.0781 − 0.1886i | −0.0781 − 0.1886i |
| 0.1443 − 0.1443i | −0.1443 + 0.1443i | −0.1443 + 0.1443i |
| 0.0781 − 0.1886i | 0.1886 + 0.0781i | 0.1886 + 0.0781i |
| 0.2041 | 0.2041 | −0.2041 |
| 0.1886 − 0.0781i | −0.0781 − 0.1886i | 0.0781 + 0.1886i |
| 0.1443 − 0.1443i | −0.1443 + 0.1443i | 0.1443 − 0.1443i |
| 0.0781 − 0.1886i | 0.1886 + 0.0781i | −0.1886 − 0.0781i |

ans(:, :, 4, 16) =

| | | |
|---|---|---|
| 0.2041 | 0.2041 | 0.2041 |
| 0.0781 + 0.1886i | 0.1886 − 0.0781i | 0.1886 − 0.0781i |
| −0.1443 + 0.1443i | 0.1443 − 0.1443i | 0.1443 − 0.1443i |
| −0.1886 − 0.0781i | 0.0781 − 0.1886i | 0.0781 − 0.1886i |
| 0.2041 | 0.2041 | −0.2041 |
| 0.0781 + 0.1886i | 0.1886 − 0.0781i | −0.1886 + 0.0781i |
| −0.1443 + 0.1443i | 0.1443 − 0.1443i | −0.1443 + 0.1443i |
| −0.1886 − 0.0781i | 0.0781 − 0.1886i | −0.0781 + 0.1886i |

Rank 4 ans(:, :, 1, 1) =
columns 1-2

| | |
|---|---|
| 0.1768 | 0.1768 |
| 0.1768 | 0.0000 + 0.1768i |
| 0.1768 | −0.1768 + 0.0000i |
| 0.1768 | −0.0000 − 0.1768i |
| 0.1768 | 0.1768 |
| 0.1768 | 0.0000 + 0.1768i |
| 0.1768 | −0.1768 + 0.0000i |
| 0.1768 | −0.0000 − 0.1768i |

columns 3-4

| | |
|---|---|
| 0.1768 | 0.1768 |
| 0.1768 | 0.0000 + 0.1768i |
| 0.1768 | −0.1768 + 0.0000i |
| −0.1768 | −0.1768 |
| −0.1768 | −0.0000 − 0.1768i |
| −0.1768 | 0.1768 − 0.0000i |
| −0.1768 | 0.0000 + 0.1768i |

ans(:, :, 2, 1) =
columns 1-2

| | |
|---|---|
| 0.1768 | 0.1768 |
| 0 + 0.1768i | −0.1768 + 0.0000i |
| −0.1768 | 0.1768 − 0.0000i |
| 0 − 0.1768i | −0.1768 + 0.0000i |
| 0.1768 | 0.1768 |
| 0 + 0.1768i | −0.1768 + 0.0000i |
| −0.1768 | 0.1768 − 0.0000i |
| 0 − 0.1768i | −0.1768 + 0.0000i |

Columns 3-4

| | |
|---|---|
| 0.1768 | 0.1768 |
| 0 + 0.1768i | −0.1768 + 0.0000i |
| −0.1768 | 0.1768 − 0.0000i |
| 0 − 0.1768i | −0.1768 + 0.0000i |
| −0.1768 | −0.1768 |
| 0 − 0.1768i | 0.1768 − 0.0000i |

-continued

| Rank 4 | |
|---|---|
| 0.1768 | −0.1768 + 0.0000i |
| 0 + 0.1768i | 0.1768 − 0.0000i |
| ans(:, :, 3, 1) = | |
| columns 1-2 | |
| 0.1768 | 0.1768 |
| −0.1768 | −0.0000 − 0.1768i |
| 0.1768 | −0.1768 + 0.0000i |
| −0.1768 | 0.0000 + 0.1768i |
| 0.1768 | 0.1768 |
| −0.1768 | −0.0000 − 0.1768i |
| 0.1768 | −0.1768 + 0.0000i |
| −0.1768 | 0.0000 + 0.1768i |
| Columns 3-4 | |
| 0.1768 | 0.1768 |
| −0.1768 | −0.0000 − 0.1768i |
| 0.1768 | −0.1768 + 0.0000i |
| −0.1768 | 0.0000 + 0.1768i |
| −0.1768 | −0.1768 |
| 0.1768 | 0.0000 + 0.1768i |
| −0.1768 | 0.1768 − 0.0000i |
| 0.1768 | −0.0000 − 0.1768i |
| ans(:, :, 4, 1) = | |
| columns 1-2 | |
| 0.1768 | 0.1768 |
| 0 − 0.1768i | 0.1768 − 0.0000i |
| −0.1768 | 0.1768 − 0.0000i |
| 0 + 0.1768i | 0.1768 − 0.0000i |
| 0.1768 | 0.1768 |
| 0 − 0.1768i | 0.1768 − 0.0000i |
| −0.1768 | 0.1768 − 0.0000i |
| 0 + 0.1768i | 0.1768 − 0.0000i |
| Columns 3-4 | |
| 0.1768 | 0.1768 |
| 0 − 0.1768i | 0.1768 − 0.0000i |
| −0.1768 | 0.1768 − 0.0000i |
| 0 + 0.1768i | 0.1768 − 0.0000i |
| −0.1768 | −0.1768 |
| 0 + 0.1768i | −0.1768 + 0.0000i |
| 0.1768 | −0.1768 + 0.0000i |
| 0 − 0.1768i | −0.1768 + 0.0000i |
| ans(:, :, 1, 2) = | |
| columns 1-2 | |
| 0.1768 | 0.1768 |
| 0.1768 | 0.0000 + 0.1768i |
| 0.1768 | −0.1768 + 0.0000i |
| 0.1768 | −0.0000 − 0.1768i |
| 0 + 0.1768i | 0 + 0.1768i |
| 0 + 0.1768i | −0.1768 + 0.0000i |
| 0 + 0.1768i | −0.0000 − 0.1768i |
| 0 + 0.1768i | 0.1768 − 0.0000i |
| Columns 3-4 | |
| 0.1768 | 0.1768 |
| 0.1768 | 0.0000 + 0.1768i |
| 0.1768 | −0.1768 + 0.0000i |
| 0.1768 | −0.0000 − 0.1768i |
| 0 − 0.1768i | 0 − 0.1768i |
| 0 − 0.1768i | 0.1768 − 0.0000i |
| 0 − 0.1768i | 0.0000 + 0.1768i |
| 0 − 0.1768i | −0.1768 + 0.0000i |
| ans(:, :, 2, 2) = | |
| columns 1-2 | |
| 0.1768 | 0.1768 |
| 0 + 0.1768i | −0.1768 + 0.0000i |
| −0.1768 | 0.1768 − 0.0000i |
| 0 − 0.1768i | −0.1768 + 0.0000i |
| 0 + 0.1768i | 0 + 0.1768i |
| −0.1768 | −0.0000 − 0.1768i |
| 0 − 0.1768i | 0.0000 + 0.1768i |
| 0.1768 | −0.0000 − 0.1768i |

-continued

| Rank 4 | |
|---|---|
| Columns 3-4 | |
| 0.1768 | 0.1768 |
| 0 + 0.1768i | −0.1768 + 0.0000i |
| −0.1768 | 0.1768 − 0.0000i |
| 0 − 0.1768i | −0.1768 + 0.0000i |
| 0 − 0.1768i | 0 − 0.1768i |
| 0.1768 | 0.0000 + 0.1768i |
| 0 + 0.1768i | −0.0000 − 0.1768i |
| −0.1768 | 0.0000 + 0.1768i |
| ans(:, :, 3, 2) = | |
| columns 1-2 | |
| 0.1768 | 0.1768 |
| −0.1768 | −0.0000 − 0.1768i |
| 0.1768 | −0.1768 + 0.0000i |
| −0.1768 | 0.0000 + 0.1768i |
| 0 + 0.1768i | 0 + 0.1768i |
| 0 − 0.1768i | 0.1768 − 0.0000i |
| 0 + 0.1768i | −0.0000 − 0.1768i |
| 0 − 0.1768i | −0.1768 + 0.0000i |
| Columns 3-4 | |
| 0.1768 | 0.1768 |
| −0.1768 | −0.0000 − 0.1768i |
| 0.1768 | −0.1768 + 0.0000i |
| −0.1768 | 0.0000 + 0.1768i |
| 0 − 0.1768i | 0 − 0.1768i |
| 0 + 0.1768i | −0.1768 + 0.0000i |
| 0 − 0.1768i | 0.0000 + 0.1768i |
| 0 + 0.1768i | 0.1768 − 0.0000i |
| ans(:, :, 4, 2) = | |
| columns 1-2 | |
| 0.1768 | 0.1768 |
| 0 − 0.1768i | 0.1768 − 0.0000i |
| −0.1768 | 0.1768 − 0.0000i |
| 0 + 0.1768i | 0.1768 − 0.0000i |
| 0 + 0.1768i | 0 + 0.1768i |
| 0.1768 | 0.0000 + 0.1768i |
| 0 − 0.1768i | 0.0000 + 0.1768i |
| −0.1768 | 0.0000 + 0.1768i |
| Columns 3-4 | |
| 0.1768 | 0.1768 |
| 0 − 0.1768i | 0.1768 − 0.0000i |
| −0.1768 | 0.1768 − 0.0000i |
| 0 + 0.1768i | 0.1768 − 0.0000i |
| 0 − 0.1768i | 0 − 0.1768i |
| −0.1768 | −0.0000 − 0.1768i |
| 0 + 0.1768i | −0.0000 − 0.1768i |
| 0.1768 | −0.0000 − 0.1768i |
| ans(:, :, 1, 3) = | |
| columns 1-2 | |
| 0.1768 | 0.1768 |
| 0.1633 + 0.0676i | −0.0676 + 0.1633i |
| 0.1250 + 0.1250i | −0.1250 − 0.1250i |
| 0.0676 + 0.1633i | 0.1633 − 0.0676i |
| 0.1768 | 0.1768 |
| 0.1633 + 0.0676i | −0.0676 + 0.1633i |
| 0.1250 + 0.1250i | −0.1250 − 0.1250i |
| 0.0676 + 0.1633i | 0.1633 − 0.0676i |
| Columns 3-4 | |
| 0.1768 | 0.1768 |
| 0.1633 + 0.0676i | −0.0676 + 0.1633i |
| 0.1250 + 0.1250i | −0.1250 − 0.1250i |
| 0.0676 + 0.1633i | 0.1633 − 0.0676i |
| −0.1768 | −0.1768 |
| −0.1633 − 0.0676i | 0.0676 − 0.1633i |
| −0.1250 − 0.1250i | 0.1250 + 0.1250i |
| −0.0676 − 0.1633i | −0.1633 + 0.0676i |
| ans(:, :, 2, 3) = | |
| columns 1-2 | |
| 0.1768 | 0.1768 |
| −0.0676 + 0.1633i | −0.1633 − 0.0676i |

-continued

Rank 4

| | |
|---|---|
| −0.1250 − 0.1250i | 0.1250 + 0.1250i |
| 0.1633 − 0.0676i | −0.0676 − 0.1633i |
| 0.1768 | 0.1768 |
| −0.0676 + 0.1633i | −0.1633 − 0.0676i |
| −0.1250 − 0.1250i | 0.1250 + 0.1250i |
| 0.1633 − 0.0676i | −0.0676 − 0.1633i |

Columns 3-4

| | |
|---|---|
| 0.1768 | 0.1768 |
| −0.0676 + 0.1633i | −0.1633 − 0.0676i |
| −0.1250 − 0.1250i | 0.1250 + 0.1250i |
| 0.1633 − 0.0676i | −0.0676 − 0.1633i |
| −0.1768 | −0.1768 |
| 0.0676 − 0.1633i | 0.1633 + 0.0676i |
| 0.1250 + 0.1250i | −0.1250 − 0.1250i |
| −0.1633 + 0.0676i | 0.0676 + 0.1633i |

ans(:, :, 3, 3) =
columns 1-2

| | |
|---|---|
| 0.1768 | 0.1768 |
| −0.1633 − 0.0676i | 0.0676 − 0.1633i |
| 0.1250 + 0.1250i | −0.1250 − 0.1250i |
| −0.0676 − 0.1633i | −0.1633 + 0.0676i |
| 0.1768 | 0.1768 |
| −0.1633 − 0.0676i | 0.0676 − 0.1633i |
| 0.1250 + 0.1250i | −0.1250 − 0.1250i |
| −0.0676 − 0.1633i | −0.1633 + 0.0676i |

Columns 3-4

| | |
|---|---|
| 0.1768 | 0.1768 |
| −0.1633 − 0.0676i | 0.0676 − 0.1633i |
| 0.1250 + 0.1250i | −0.1250 − 0.1250i |
| −0.0676 − 0.1633i | −0.1633 + 0.0676i |
| −0.1768 | −0.1768 |
| 0.1633 + 0.0676i | −0.0676 + 0.1633i |
| −0.1250 − 0.1250i | 0.1250 + 0.1250i |
| 0.0676 + 0.1633i | 0.1633 − 0.0676i |

ans(:, :, 4, 3) =
columns 1-2

| | |
|---|---|
| 0.1768 | 0.1768 |
| 0.0676 − 0.1633i | 0.1633 + 0.0676i |
| −0.1250 − 0.1250i | 0.1250 + 0.1250i |
| −0.1633 + 0.0676i | 0.0676 + 0.1633i |
| 0.1768 | 0.1768 |
| 0.0676 − 0.1633i | 0.1633 + 0.0676i |
| −0.1250 − 0.1250i | 0.1250 + 0.1250i |
| −0.1633 + 0.0676i | 0.0676 + 0.1633i |

Columns 3-4

| | |
|---|---|
| 0.1768 | 0.1768 |
| 0.0676 − 0.1633i | 0.1633 + 0.0676i |
| −0.1250 − 0.1250i | 0.1250 + 0.1250i |
| −0.1633 + 0.0676i | 0.0676 + 0.1633i |
| −0.1768 | −0.1768 |
| −0.0676 + 0.1633i | −0.1633 − 0.0676i |
| 0.1250 + 0.1250i | −0.1250 − 0.1250i |
| 0.1633 − 0.0676i | −0.0676 − 0.1633i |

ans(:, :, 1, 4) =
columns 1-2

| | |
|---|---|
| 0.1768 | 0.1768 |
| 0.1633 + 0.0676i | −0.0676 + 0.1633i |
| 0.1250 + 0.1250i | −0.1250 − 0.1250i |
| 0.0676 + 0.1633i | 0.1633 − 0.0676i |
| 0 + 0.1768i | 0 + 0.1768i |
| −0.0676 + 0.1633i | −0.1633 − 0.0676i |
| −0.1250 + 0.1250i | 0.1250 − 0.1250i |
| −0.1633 + 0.0676i | 0.0676 + 0.1633i |

Columns 3-4

| | |
|---|---|
| 0.1768 | 0.1768 |
| 0.1633 + 0.0676i | −0.0676 + 0.1633i |
| 0.1250 + 0.1250i | −0.1250 − 0.1250i |
| 0.0676 + 0.1633i | 0.1633 − 0.0676i |
| 0 − 0.1768i | 0 − 0.1768i |
| 0.0676 − 0.1633i | 0.1633 + 0.0676i |

-continued

Rank 4

| | |
|---|---|
| 0.1250 − 0.1250i | −0.1250 + 0.1250i |
| 0.1633 − 0.0676i | −0.0676 − 0.1633i |

ans(:, :, 2, 4) =
columns 1-2

| | |
|---|---|
| 0.1768 | 0.1768 |
| −0.0676 + 0.1633i | −0.1633 − 0.0676i |
| −0.1250 − 0.1250i | 0.1250 + 0.1250i |
| 0.1633 − 0.0676i | −0.0676 − 0.1633i |
| 0 + 0.1768i | 0 + 0.1768i |
| −0.1633 − 0.0676i | 0.0676 − 0.1633i |
| 0.1250 − 0.1250i | −0.1250 + 0.1250i |
| 0.0676 + 0.1633i | 0.1633 − 0.0676i |

Columns 3-4

| | |
|---|---|
| 0.1768 | 0.1768 |
| −0.0676 + 0.1633i | −0.1633 − 0.0676i |
| −0.1250 − 0.1250i | 0.1250 + 0.1250i |
| 0.1633 − 0.0676i | −0.0676 − 0.1633i |
| 0 − 0.1768i | 0 − 0.1768i |
| 0.1633 + 0.0676i | −0.0676 + 0.1633i |
| −0.1250 + 0.1250i | 0.1250 − 0.1250i |
| −0.0676 − 0.1633i | −0.1633 + 0.0676i |

ans(:, :, 3, 4) =
columns 1-2

| | |
|---|---|
| 0.1768 | 0.1768 |
| −0.1633 − 0.0676i | 0.0676 − 0.1633i |
| 0.1250 + 0.1250i | −0.1250 − 0.1250i |
| −0.0676 − 0.1633i | −0.1633 + 0.0676i |
| 0 + 0.1768i | 0 + 0.1768i |
| 0.0676 − 0.1633i | 0.1633 + 0.0676i |
| −0.1250 + 0.1250i | 0.1250 − 0.1250i |
| 0.1633 − 0.0676i | −0.0676 − 0.1633i |

Columns 3-4

| | |
|---|---|
| 0.1768 | 0.1768 |
| −0.1633 − 0.0676i | 0.0676 − 0.1633i |
| 0.1250 + 0.1250i | −0.1250 − 0.1250i |
| −0.0676 − 0.1633i | −0.1633 + 0.0676i |
| 0 − 0.1768i | 0 − 0.1768i |
| −0.0676 + 0.1633i | −0.1633 − 0.0676i |
| 0.1250 − 0.1250i | −0.1250 + 0.1250i |
| −0.1633 + 0.0676i | 0.0676 + 0.1633i |

ans(:, :, 4, 4) =
Columns 1-2

| | |
|---|---|
| 0.1768 | 0.1768 |
| 0.0676 − 0.1633i | 0.1633 + 0.0676i |
| −0.1250 − 0.1250i | 0.1250 + 0.1250i |
| −0.1633 + 0.0676i | 0.0676 + 0.1633i |
| 0 + 0.1768i | 0 + 0.1768i |
| 0.1633 + 0.0676i | −0.0676 + 0.1633i |
| 0.1250 − 0.1250i | −0.1250 + 0.1250i |
| −0.0676 − 0.1633i | −0.1633 + 0.0676i |

Columns 3-4

| | |
|---|---|
| 0.1768 | 0.1768 |
| 0.0676 − 0.1633i | 0.1633 + 0.0676i |
| −0.1250 − 0.1250i | 0.1250 + 0.1250i |
| −0.1633 + 0.0676i | 0.0676 + 0.1633i |
| 0 − 0.1768i | 0 − 0.1768i |
| −0.1633 − 0.0676i | 0.0676 − 0.1633i |
| −0.1250 + 0.1250i | 0.1250 − 0.1250i |
| 0.0676 + 0.1633i | 0.1633 − 0.0676i |

ans(:, :, 1, 5) =
Columns 1-2

| | |
|---|---|
| 0.1768 | 0.1768 |
| 0.1250 + 0.1250i | −0.1250 + 0.1250i |
| 0.0000 + 0.1768i | −0.0000 − 0.1768i |
| −0.1250 + 0.1250i | 0.1250 + 0.1250i |
| 0.1768 | 0.1768 |
| 0.1250 + 0.1250i | −0.1250 + 0.1250i |
| 0.0000 + 0.1768i | −0.0000 − 0.1768i |
| −0.1250 + 0.1250i | 0.1250 + 0.1250i |

-continued

| Rank 4 | |
|---|---|
| Columns 3-4 | |
| 0.1768 | 0.1768 |
| 0.1250 + 0.1250i | −0.1250 + 0.1250i |
| 0.0000 + 0.1768i | −0.0000 − 0.1768i |
| −0.1250 + 0.1250i | 0.1250 + 0.1250i |
| −0.1768 | −0.1768 |
| −0.1250 − 0.1250i | 0.1250 − 0.1250i |
| −0.0000 − 0.1768i | 0.0000 + 0.1768i |
| 0.1250 − 0.1250i | −0.1250 − 0.1250i |
| ans(:, :, 2, 5) = | |
| Columns 1-2 | |
| 0.1768 | 0.1768 |
| −0.1250 + 0.1250i | −0.1250 − 0.1250i |
| −0.0000 − 0.1768i | 0.0000 + 0.1768i |
| 0.1250 + 0.1250i | 0.1250 − 0.1250i |
| 0.1768 | 0.1768 |
| −0.1250 + 0.1250i | −0.1250 − 0.1250i |
| −0.0000 − 0.1768i | 0.0000 + 0.1768i |
| 0.1250 + 0.1250i | 0.1250 − 0.1250i |
| Columns 3-4 | |
| 0.1768 | 0.1768 |
| −0.1250 + 0.1250i | −0.1250 − 0.1250i |
| −0.0000 − 0.1768i | 0.0000 + 0.1768i |
| 0.1250 + 0.1250i | 0.1250 − 0.1250i |
| −0.1768 | −0.1768 |
| 0.1250 − 0.1250i | 0.1250 + 0.1250i |
| 0.0000 + 0.1768i | −0.0000 − 0.1768i |
| −0.1250 − 0.1250i | −0.1250 + 0.1250i |
| ans(:, :, 3, 5) = | |
| Columns 1-2 | |
| 0.1768 | 0.1768 |
| −0.1250 − 0.1250i | 0.1250 − 0.1250i |
| 0.0000 + 0.1768i | −0.0000 − 0.1768i |
| 0.1250 − 0.1250i | −0.1250 − 0.1250i |
| 0.1768 | 0.1768 |
| −0.1250 − 0.1250i | 0.1250 − 0.1250i |
| 0.0000 + 0.1768i | −0.0000 − 0.1768i |
| 0.1250 − 0.1250i | −0.1250 − 0.1250i |
| Columns 3-4 | |
| 0.1768 | 0.1768 |
| −0.1250 − 0.1250i | 0.1250 − 0.1250i |
| 0.0000 + 0.1768i | −0.0000 − 0.1768i |
| 0.1250 − 0.1250i | −0.1250 − 0.1250i |
| −0.1768 | −0.1768 |
| 0.1250 + 0.1250i | −0.1250 + 0.1250i |
| −0.0000 − 0.1768i | 0.0000 + 0.1768i |
| −0.1250 + 0.1250i | 0.1250 + 0.1250i |
| ans(:, :, 4, 5) = | |
| Columns 1-2 | |
| 0.1768 | 0.1768 |
| 0.1250 − 0.1250i | 0.1250 + 0.1250i |
| −0.0000 − 0.1768i | 0.0000 + 0.1768i |
| −0.1250 − 0.1250i | −0.1250 + 0.1250i |
| 0.1768 | 0.1768 |
| 0.1250 − 0.1250i | 0.1250 + 0.1250i |
| −0.0000 − 0.1768i | 0.0000 + 0.1768i |
| −0.1250 − 0.1250i | −0.1250 + 0.1250i |
| Columns 3-4 | |
| 0.1768 | 0.1768 |
| 0.1250 − 0.1250i | 0.1250 + 0.1250i |
| −0.0000 − 0.1768i | 0.0000 + 0.1768i |
| −0.1250 − 0.1250i | −0.1250 + 0.1250i |
| −0.1768 | −0.1768 |
| −0.1250 + 0.1250i | −0.1250 − 0.1250i |
| 0.0000 + 0.1768i | −0.0000 − 0.1768i |
| 0.1250 + 0.1250i | 0.1250 − 0.1250i |
| ans(:, :, 1, 6) = | |
| Columns 1-2 | |
| 0.1768 | 0.1768 |
| 0.1250 + 0.1250i | −0.1250 + 0.1250i |

-continued

| Rank 4 | |
|---|---|
| 0.0000 + 0.1768i | −0.0000 − 0.1768i |
| −0.1250 + 0.1250i | 0.1250 + 0.1250i |
| 0 + 0.1768i | 0 + 0.1768i |
| −0.1250 + 0.1250i | −0.1250 − 0.1250i |
| −0.1768 + 0.0000i | 0.1768 − 0.0000i |
| −0.1250 − 0.1250i | −0.1250 + 0.1250i |
| Columns 3-4 | |
| 0.1768 | 0.1768 |
| 0.1250 + 0.1250i | −0.1250 + 0.1250i |
| 0.0000 + 0.1768i | −0.0000 − 0.1768i |
| −0.1250 + 0.1250i | 0.1250 + 0.1250i |
| 0 − 0.1768i | 0 − 0.1768i |
| 0.1250 − 0.1250i | 0.1250 + 0.1250i |
| 0.1768 − 0.0000i | −0.1768 + 0.0000i |
| 0.1250 + 0.1250i | 0.1250 − 0.1250i |
| ans(:, :, 2, 6) = | |
| Columns 1-2 | |
| 0.1768 | 0.1768 |
| −0.1250 + 0.1250i | −0.1250 − 0.1250i |
| −0.0000 − 0.1768i | 0.0000 + 0.1768i |
| 0.1250 + 0.1250i | 0.1250 − 0.1250i |
| 0 + 0.1768i | 0 + 0.1768i |
| −0.1250 − 0.1250i | 0.1250 − 0.1250i |
| 0.1768 − 0.0000i | −0.1768 + 0.0000i |
| −0.1250 + 0.1250i | 0.1250 + 0.1250i |
| Columns 3-4 | |
| 0.1768 | 0.1768 |
| −0.1250 + 0.1250i | −0.1250 − 0.1250i |
| −0.0000 − 0.1768i | 0.0000 + 0.1768i |
| 0.1250 + 0.1250i | 0.1250 − 0.1250i |
| 0 − 0.1768i | 0 − 0.1768i |
| 0.1250 + 0.1250i | −0.1250 + 0.1250i |
| −0.1768 + 0.0000i | 0.1768 − 0.0000i |
| 0.1250 − 0.1250i | −0.1250 − 0.1250i |
| ans(:, :, 3, 6) = | |
| Columns 1-2 | |
| 0.1768 | 0.1768 |
| −0.1250 − 0.1250i | 0.1250 − 0.1250i |
| 0.0000 + 0.1768i | −0.0000 − 0.1768i |
| 0.1250 − 0.1250i | −0.1250 − 0.1250i |
| 0 + 0.1768i | 0 + 0.1768i |
| 0.1250 − 0.1250i | 0.1250 + 0.1250i |
| −0.1768 + 0.0000i | 0.1768 − 0.0000i |
| 0.1250 + 0.1250i | 0.1250 − 0.1250i |
| Columns 3-4 | |
| 0.1768 | 0.1768 |
| −0.1250 − 0.1250i | 0.1250 − 0.1250i |
| 0.0000 + 0.1768i | −0.0000 − 0.1768i |
| 0.1250 − 0.1250i | −0.1250 − 0.1250i |
| 0 − 0.1768i | 0 − 0.1768i |
| −0.1250 + 0.1250i | −0.1250 − 0.1250i |
| 0.1768 − 0.0000i | −0.1768 + 0.0000i |
| −0.1250 − 0.1250i | −0.1250 + 0.1250i |
| ans(:, :, 4, 6) = | |
| Columns 1-2 | |
| 0.1768 | 0.1768 |
| 0.1250 − 0.1250i | 0.1250 + 0.1250i |
| −0.0000 − 0.1768i | 0.0000 + 0.1768i |
| −0.1250 − 0.1250i | −0.1250 + 0.1250i |
| 0 + 0.1768i | 0 + 0.1768i |
| 0.1250 + 0.1250i | −0.1250 + 0.1250i |
| 0.1768 − 0.0000i | −0.1768 + 0.0000i |
| 0.1250 − 0.1250i | −0.1250 − 0.1250i |
| Columns 3-4 | |
| 0.1768 | 0.1768 |
| 0.1250 − 0.1250i | 0.1250 + 0.1250i |
| −0.0000 − 0.1768i | 0.0000 + 0.1768i |
| −0.1250 − 0.1250i | −0.1250 + 0.1250i |
| 0 − 0.1768i | 0 − 0.1768i |
| −0.1250 − 0.1250i | 0.1250 − 0.1250i |

-continued

| Rank 4 | |
|---|---|
| −0.1768 + 0.0000i | 0.1768 − 0.0000i |
| −0.1250 + 0.1250i | 0.1250 + 0.1250i |
| ans(:, :, 1, 7) = | |
| Columns 1-2 | |
| 0.1768 | 0.1768 |
| 0.0676 + 0.1633i | −0.1633 + 0.0676i |
| −0.1250 + 0.1250i | 0.1250 − 0.1250i |
| −0.1633 − 0.0676i | −0.0676 + 0.1633i |
| 0.1768 | 0.1768 |
| 0.0676 + 0.1633i | −0.1633 + 0.0676i |
| −0.1250 + 0.1250i | 0.1250 − 0.1250i |
| −0.1633 − 0.0676i | −0.0676 + 0.1633i |
| Columns 3-4 | |
| 0.1768 | 0.1768 |
| 0.0676 + 0.1633i | −0.1633 + 0.0676i |
| −0.1250 + 0.1250i | 0.1250 − 0.1250i |
| −0.1633 − 0.0676i | −0.0676 + 0.1633i |
| −0.1768 | −0.1768 |
| −0.0676 − 0.1633i | 0.1633 − 0.0676i |
| 0.1250 − 0.1250i | −0.1250 + 0.1250i |
| 0.1633 + 0.0676i | 0.0676 − 0.1633i |
| ans(:, :, 2, 7) = | |
| Columns 1-2 | |
| 0.1768 | 0.1768 |
| −0.1633 + 0.0676i | −0.0676 − 0.1633i |
| 0.1250 − 0.1250i | −0.1250 + 0.1250i |
| −0.0676 + 0.1633i | 0.1633 + 0.0676i |
| 0.1768 | 0.1768 |
| −0.1633 + 0.0676i | −0.0676 − 0.1633i |
| 0.1250 − 0.1250i | −0.1250 + 0.1250i |
| −0.0676 + 0.1633i | 0.1633 + 0.0676i |
| Columns 3-4 | |
| 0.1768 | 0.1768 |
| −0.1633 + 0.0676i | −0.0676 − 0.1633i |
| 0.1250 − 0.1250i | −0.1250 + 0.1250i |
| −0.0676 + 0.1633i | 0.1633 + 0.0676i |
| −0.1768 | −0.1768 |
| 0.1633 − 0.0676i | 0.0676 + 0.1633i |
| −0.1250 + 0.1250i | 0.1250 − 0.1250i |
| 0.0676 − 0.1633i | −0.1633 − 0.0676i |
| ans(:, :, 3, 7) = | |
| Columns 1-2 | |
| 0.1768 | 0.1768 |
| −0.0676 − 0.1633i | 0.1633 − 0.0676i |
| −0.1250 + 0.1250i | 0.1250 − 0.1250i |
| 0.1633 + 0.0676i | 0.0676 − 0.1633i |
| 0.1768 | 0.1768 |
| −0.0676 − 0.1633i | 0.1633 − 0.0676i |
| −0.1250 + 0.1250i | 0.1250 − 0.1250i |
| 0.1633 + 0.0676i | 0.0676 − 0.1633i |
| Columns 3-4 | |
| 0.1768 | 0.1768 |
| −0.0676 − 0.1633i | 0.1633 − 0.0676i |
| −0.0676 − 0.1633i | 0.1633 − 0.0676i |
| 0.1633 + 0.0676i | 0.0676 − 0.1633i |
| −0.1768 | −0.1768 |
| 0.0676 + 0.1633i | −0.1633 + 0.0676i |
| 0.1250 − 0.1250i | −0.1250 + 0.1250i |
| −0.1633 − 0.0676i | −0.0676 + 0.1633i |
| ans(:, :, 4, 7) = | |
| Columns 1-2 | |
| 0.1768 | 0.1768 |
| 0.1633 − 0.0676i | 0.0676 + 0.1633i |
| 0.1250 − 0.1250i | −0.1250 + 0.1250i |
| 0.0676 − 0.1633i | −0.1633 − 0.0676i |
| 0.1768 | 0.1768 |
| 0.1633 − 0.0676i | 0.0676 + 0.1633i |
| 0.1250 − 0.1250i | −0.1250 + 0.1250i |
| 0.0676 − 0.1633i | −0.1633 − 0.0676i |

-continued

| Rank 4 | |
|---|---|
| Columns 3-4 | |
| 0.1768 | 0.1768 |
| 0.1633 − 0.0676i | 0.0676 + 0.1633i |
| 0.1250 − 0.1250i | −0.1250 + 0.1250i |
| 0.0676 − 0.1633i | −0.1633 − 0.0676i |
| −0.1768 | −0.1768 |
| −0.1633 + 0.0676i | −0.0676 − 0.1633i |
| −0.1250 + 0.1250i | 0.1250 − 0.1250i |
| −0.0676 + 0.1633i | 0.1633 + 0.0676i |
| ans(:, :, 1, 8) = | |
| Columns 1-2 | |
| 0.1768 | 0.1768 |
| 0.0676 + 0.1633i | −0.1633 + 0.0676i |
| −0.1250 + 0.1250i | 0.1250 − 0.1250i |
| −0.1633 − 0.0676i | −0.0676 + 0.1633i |
| 0 + 0.1768i | 0 + 0.1768i |
| −0.1633 + 0.0676i | −0.0676 − 0.1633i |
| −0.1250 − 0.1250i | 0.1250 + 0.1250i |
| 0.0676 − 0.1633i | −0.1633 − 0.0676i |
| Columns 3-4 | |
| 0.1768 | 0.1768 |
| 0.0676 + 0.1633i | −0.1633 + 0.0676i |
| −0.1250 + 0.1250i | 0.1250 − 0.1250i |
| −0.1633 − 0.0676i | −0.0676 + 0.1633i |
| 0 − 0.1768i | 0 − 0.1768i |
| 0.1633 − 0.0676i | 0.0676 + 0.1633i |
| 0.1250 + 0.1250i | −0.1250 − 0.1250i |
| −0.0676 + 0.1633i | 0.1633 + 0.0676i |
| ans(:, :, 2, 8) = | |
| Columns 1-2 | |
| 0.1768 | 0.1768 |
| −0.1633 + 0.0676i | −0.0676 − 0.1633i |
| 0.1250 − 0.1250i | −0.1250 + 0.1250i |
| −0.0676 + 0.1633i | 0.1633 + 0.0676i |
| 0 + 0.1768i | 0 + 0.1768i |
| −0.0676 − 0.1633i | 0.1633 − 0.0676i |
| 0.1250 + 0.1250i | −0.1250 − 0.1250i |
| −0.1633 − 0.0676i | −0.0676 + 0.1633i |
| Columns 3-4 | |
| 0.1768 | 0.1768 |
| −0.1633 + 0.0676i | −0.0676 − 0.1633i |
| 0.1250 − 0.1250i | −0.1250 + 0.1250i |
| −0.0676 + 0.1633i | 0.1633 + 0.0676i |
| 0 − 0.1768i | 0 − 0.1768i |
| 0.0676 + 0.1633i | −0.1633 + 0.0676i |
| −0.1250 − 0.1250i | 0.1250 + 0.1250i |
| 0.1633 + 0.0676i | 0.0676 − 0.1633i |
| ans(:, :, 3, 8) = | |
| Columns 1-2 | |
| 0.1768 | 0.1768 |
| −0.0676 − 0.1633i | 0.1633 − 0.0676i |
| −0.1250 + 0.1250i | 0.1250 − 0.1250i |
| 0.1633 + 0.0676i | 0.0676 − 0.1633i |
| 0 + 0.1768i | 0 + 0.1768i |
| 0.1633 − 0.0676i | 0.0676 + 0.1633i |
| −0.1250 − 0.1250i | 0.1250 + 0.1250i |
| −0.0676 + 0.1633i | 0.1633 + 0.0676i |
| Columns 3-4 | |
| 0.1768 | 0.1768 |
| −0.0676 − 0.1633i | 0.1633 − 0.0676i |
| −0.1250 + 0.1250i | 0.1250 − 0.1250i |
| 0.1633 + 0.0676i | 0.0676 − 0.1633i |
| 0 − 0.1768i | 0 − 0.1768i |
| −0.1633 + 0.0676i | −0.0676 − 0.1633i |
| 0.1250 + 0.1250i | −0.1250 − 0.1250i |
| 0.0676 − 0.1633i | −0.1633 − 0.0676i |
| ans(:, :, 4, 8) = | |
| Columns 1-2 | |
| 0.1768 | 0.1768 |
| 0.1633 − 0.0676i | 0.0676 + 0.1633i |

-continued

| Rank 4 | |
|---|---|
| 0.1250 − 0.1250i | −0.1250 + 0.1250i |
| 0.0676 − 0.1633i | −0.1633 − 0.0676i |
| 0 + 0.1768i | 0 + 0.1768i |
| 0.0676 + 0.1633i | −0.1633 + 0.0676i |
| 0.1250 + 0.1250i | −0.1250 − 0.1250i |
| 0.1633 + 0.0676i | 0.0676 − 0.1633i |
| Columns 3-4 | |
| 0.1768 | 0.1768 |
| 0.1633 − 0.0676i | 0.0676 + 0.1633i |

-continued

| Rank 4 | |
|---|---|
| 0.1250 − 0.1250i | −0.1250 + 0.1250i |
| 0.0676 − 0.1633i | −0.1633 − 0.0676i |
| 0 − 0.1768i | 0 − 0.1768i |
| −0.0676 − 0.1633i | 0.1633 − 0.0676i |
| −0.1250 − 0.1250i | 0.1250 + 0.1250i |
| −0.1633 − 0.0676i | −0.0676 + 0.1633i |

| Rank 5 | | |
|---|---|---|
| ans(:, :, 1) = Colums 1-3 | | |
| 0.1581 | 0.1581 | 0.1581 |
| 0.1581 | 0.1581 | 0 + 0.1581i |
| 0.1581 | 0.1581 | −0.1581 |
| 0.1581 | 0.1581 | 0 − 0.1581i |
| 0.1581 | −0.1581 | 0.1581 |
| 0.1581 | −0.1581 | 0 + 0.1581i |
| 0.1581 | −0.1581 | −0.1581 |
| 0.1581 | −0.1581 | 0 − 0.1581i |
| Colums 4-5 | | |
| 0.1581 | 0.1581 | |
| 0 + 0.1581i | −0.1581 | |
| −0.1581 | 0.1581 | |
| 0 − 0.1581i | −0.1581 | |
| −0.1581 | 0.1581 | |
| 0 − 0.1581i | −0.1581 | |
| 0.1581 | 0.1581 | |
| 0 + 0.1581i | −0.1581 | |
| ans(:, :, 2) = Colums 1-3 | | |
| 0.1581 | 0.1581 | 0.1581 |
| 0.1118 + 0.1118i | 0.1118 + 0.1118i | −0.1118 + 0.1118i |
| 0.0000 + 0.1581i | 0.0000 + 0.1581i | −0.0000 − 0.1581i |
| −0.1118 + 0.1118i | −0.1118 + 0.1118i | 0.1118 + 0.1118i |
| 0.1581 | −0.1581 | 0.1581 |
| 0.1118 + 0.1118i | −0.1118 − 0.1118i | −0.1118 + 0.1118i |
| 0.0000 + 0.1581i | −0.0000 − 0.1581i | −0.0000 − 0.1581i |
| −0.1118 + 0.1118i | 0.1118 − 0.1118i | 0.1118 + 0.1118i |
| Colums 4-5 | | |
| 0.1581 | 0.1581 | |
| −0.1118 + 0.1118i | −0.1118 − 0.1118i | |
| −0.0000 − 0.1581i | 0.0000 + 0.1581i | |
| 0.1118 + 0.1118i | 0.1118 − 0.1118i | |
| −0.1581 | 0.1581 | |
| 0.1118 − 0.1118i | −0.1118 − 0.1118i | |
| 0.0000 + 0.1581i | 0.0000 + 0.1581i | |
| −0.1118 − 0.1118i | 0.1118 − 0.1118i | |
| ans(:, :, 3) = Colums 1-3 | | |
| 0.1581 | 0.1581 | 0.1581 |
| 0.1461 + 0.0605i | 0.1461 + 0.0605i | −0.0605 + 0.1461i |
| 0.1118 + 0.1118i | 0.1118 + 0.1118i | −0.1118 + 0.1118i |
| 0.0605 + 0.1461i | 0.0605 + 0.1461i | 0.1461 − 0.0605i |
| 0.1581 | −0.1581 | 0.1581 |
| 0.1461 + 0.0605i | −0.1461 − 0.0605i | −0.0605 + 0.1461i |
| 0.1118 + 0.1118i | −0.1118 − 0.1118i | −0.1118 − 0.1118i |
| 0.0605 + 0.1461i | −0.0605 − 0.1461i | 0.1461 − 0.0605i |
| Colums 4-5 | | |
| 0.1581 | 0.1581 | |
| −0.0605 + 0.1461i | −0.1461 − 0.0605i | |

-continued

Rank 5

| | |
|---|---|
| −0.1118 − 0.1118i | 0.1118 + 0.1118i |
| 0.1461 − 0.0605i | −0.0605 − 0.1461i |
| −0.1581 | 0.1581 |
| 0.0605 − 0.1461i | −0.1461 − 0.0605i |
| 0.1118 + 0.1118i | 0.1118 + 0.1118i |
| −0.1461 + 0.0605i | −0.0605 − 0.1461i |

ans(:, :, 4) =
Colums 1-3

| | | | | |
|---|---|---|---|---|
| 0.1581 | 0.1581 | 0.1581 | 0.1581 | 0.1581 |
| 0.0605 + 0.1461i | 0.0605 + 0.1461i | −0.1461 + 0.0605i | −0.1461 + 0.0605i | −0.0605 − 0.1461i |
| −0.1118 + 0.1118i | −0.1118 + 0.1118i | 0.1118 − 0.1118i | | |
| −0.1461 − 0.0605i | −0.1461 − 0.0605i | −0.0605 + 0.1461i | | |
| 0.1581 | −0.1581 | 0.1581 | | |
| 0.0605 + 0.1461i | −0.0605 − 0.1461i | −0.1461 + 0.0605i | | |
| −0.1118 + 0.1118i | 0.1118 − 0.1118i | 0.1118 − 0.1118i | | |
| −0.1461 − 0.0605i | 0.1461 + 0.0605i | −0.0605 + 0.1461i | | |

Colums 4-5

| | |
|---|---|
| 0.1581 | 0.1581 |
| −0.1461 + 0.0605i | −0.0605 − 0.1461i |
| 0.1118 − 0.1118i | −0.1118 + 0.1118i |
| −0.0605 + 0.1461i | 0.1461 + 0.0605i |
| −0.1581 | 0.1581 |
| 0.1461 − 0.0605i | −0.0605 − 0.1461i |
| −0.1118 + 0.1118i | −0.1118 + 0.1118i |
| 0.0605 − 0.1461i | 0.1461 + 0.0605i |

Rank 6 ans(:, :, 1) =
Columns 1-3

| | | |
|---|---|---|
| 0.1443 | 0.1443 | 0.1443 |
| 0.1443 | 0.1443 | 0 + 0.1443i |
| 0.1443 | 0.1443 | −0.1443 |
| 0.1443 | 0.1443 | 0 − 0.1443i |
| 0.1443 | −0.1443 | 0.1443 |
| 0.1443 | −0.1443 | 0 + 0.1443i |
| 0.1443 | −0.1443 | −0.1443 |
| 0.1443 | −0.1443 | 0 − 0.1443i |

Colums 4-6

| | | |
|---|---|---|
| 0.1443 | 0.1443 | 0.1443 |
| 0 + 0.1443i | −0.1443 | −0.1443 |
| −0.1443 | 0.1443 | 0.1443 |
| 0 − 0.1443i | −0.1443 | −0.1443 |
| −0.1443 | 0.1443 | −0.1443 |
| 0 − 0.1443i | −0.1443 | 0.1443 |
| 0.1443 | 0.1443 | −0.1443 |
| 0 + 0.1443i | −0.1443 | 0.1443 |

ans(:, :, 2) =
Columns 1-3

| | | |
|---|---|---|
| 0.1443 | 0.1443 | 0.1443 |
| 0.1021 + 0.1021i | 0.1021 + 0.1021i | −0.1021 + 0.1021i |
| 0.0000 + 0.1443i | 0.0000 + 0.1443i | −0.0000 − 0.1443i |
| −0.1021 + 0.1021i | −0.1021 + 0.1021i | 0.1021 + 0.1021i |
| 0.1443 | −0.1443 | 0.1443 |
| 0.1021 + 0.1021i | −0.1021 − 0.1021i | −0.1021 + 0.1021i |
| 0.0000 + 0.1443i | −0.0000 − 0.1443i | −0.0000 − 0.1443i |
| −0.1021 + 0.1021i | 0.1021 − 0.1021i | 0.1021 + 0.1021i |

Colums 4-6

| | | |
|---|---|---|
| 0.1443 | 0.1443 | 0.1443 |
| −0.1021 + 0.1021i | −0.1021 − 0.1021i | −0.1021 − 0.1021i |
| −0.0000 − 0.1443i | 0.0000 + 0.1443i | 0.0000 + 0.1443i |
| 0.1021 + 0.1021i | 0.1021 − 0.1021i | 0.1021 − 0.1021i |
| −0.1443 | 0.1443 | −0.1443 |
| 0.1021 − 0.1021i | −0.1021 − 0.1021i | 0.1021 + 0.1021i |
| 0.0000 + 0.1443i | 0.0000 + 0.1443i | −0.0000 − 0.1443i |
| −0.1021 − 0.1021i | 0.1021 − 0.1021i | −0.1021 + 0.1021i |

-continued

Rank 6 ans(:, :, 3) =
Columns 1-3

| | | |
|---|---|---|
| 0.1443 | 0.1443 | 0.1443 |
| 0.1334 + 0.0552i | 0.1334 + 0.0552i | −0.0552 + 0.1334i |
| 0.1021 + 0.1021i | 0.1021 + 0.1021i | −0.1021 − 0.1021i |
| 0.0552 + 0.1334i | 0.0552 + 0.1334i | 0.1334 − 0.0552i |
| 0.1443 | −0.1443 | 0.1443 |
| 0.1334 + 0.0552i | −0.1334 − 0.0552i | −0.0552 + 0.1334i |
| 0.1021 + 0.1021i | −0.1021 − 0.1021i | −0.1021 − 0.1021i |
| 0.0552 + 0.1334i | −0.0552 − 0.1334i | 0.1334 − 0.0552i |

Colums 4-6

| | | |
|---|---|---|
| 0.1443 | 0.1443 | 0.1443 |
| −0.0552 + 0.1334i | −0.1334 − 0.0552i | −0.1334 − 0.0552i |
| −0.1021 − 0.1021i | 0.1021 + 0.1021i | 0.1021 + 0.1021i |
| 0.1334 − 0.0552i | −0.0552 − 0.1334i | −0.0552 − 0.1334i |
| −0.1443 | 0.1443 | −0.1443 |
| 0.0552 − 0.1334i | −0.1334 − 0.0552i | 0.1334 + 0.0552i |
| 0.1021 + 0.1021i | 0.1021 + 0.1021i | −0.1021 − 0.1021i |
| −0.1334 + 0.0552i | −0.0552 − 0.1334i | 0.0552 + 0.1334i |

ans(:, :, 4) =
Columns 1-3

| | | |
|---|---|---|
| 0.1443 | 0.1443 | 0.1443 |
| 0.0552 + 0.1334i | 0.0552 + 0.1334i | −0.1334 + 0.0552i |
| −0.1021 + 0.1021i | −0.1021 + 0.1021i | 0.1021 − 0.1021i |
| −0.1334 − 0.0552i | −0.1334 − 0.0552i | −0.0552 + 0.1334i |
| 0.1443 | −0.1443 | 0.1443 |
| 0.0552 + 0.1334i | −0.0552 − 0.1334i | −0.1334 + 0.0552i |
| −0.1021 + 0.1021i | 0.1021 − 0.1021i | 0.1021 − 0.1021i |
| −0.1334 − 0.0552i | 0.1334 + 0.0552i | −0.0552 + 0.1334i |

Colums 4-6

| | | |
|---|---|---|
| 0.1443 | 0.1443 | 0.1443 |
| −0.1334 + 0.0552i | −0.0552 − 0.1334i | −0.0552 − 0.1334i |
| 0.1021 − 0.1021i | −0.1021 + 0.1021i | −0.1021 + 0.1021i |
| −0.0552 + 0.1334i | 0.1334 + 0.0552i | 0.1334 + 0.0552i |
| −0.1443 | 0.1443 | −0.1443 |

-continued

| Rank 6 | | |
|---|---|---|
| 0.1334 − 0.0552i | −0.0552 − 0.1334i | 0.0552 + 0.1334i |
| −0.1021 + 0.1021i | −0.1021 + 0.1021i | 0.1021 − 0.1021i |
| 0.0552 − 0.1334i | 0.1334 + 0.0552i | −0.1334 − 0.0552i |

Rank 7 ans(:, :, 1) =
Columns 1-3

| | | |
|---|---|---|
| 0.1336 | 0.1336 | 0.1336 |
| 0.1336 | 0.1336 | 0 + 0.1336i |
| 0.1336 | 0.1336 | −0.1336 |
| 0.1336 | 0.1336 | 0 − 0.1336i |
| 0.1336 | −0.1336 | 0.1336 |
| 0.1336 | −0.1336 | 0 + 0.1336i |
| 0.1336 | −0.1336 | −0.1336 |
| 0.1336 | −0.1336 | 0 − 0.1336i |

Colums 4-7

| | | | |
|---|---|---|---|
| 0.1336 | 0.1336 | 0.1336 | 0.1336 |
| 0 + 0.1336i | −0.1336 | −0.1336 | 0 − 0.1336i |
| −0.1336 | 0.1336 | 0.1336 | −0.1336 |
| 0 − 0.1336i | −0.1336 | −0.1336 | 0 + 0.1336i |
| −0.1336 | 0.1336 | −0.1336 | 0.1336 |
| 0 − 0.1336i | −0.1336 | 0.1336 | 0 − 0.1336i |
| 0.1336 | 0.1336 | −0.1336 | −0.1336 |
| 0 + 0.1336i | −0.1336 | 0.1336 | 0 + 0.1336i |

ans(:, :, 2) =
Columns 1-3

| | | |
|---|---|---|
| 0.1336 | 0.1336 | 0.1336 |
| 0.0945 + 0.0945i | 0.0945 + 0.0945i | −0.0945 + 0.0945i |
| 0.0000 + 0.1336i | 0.0000 + 0.1336i | −0.0000 − 0.1336i |
| −0.0945 + 0.0945i | −0.0945 + 0.0945i | 0.0945 + 0.0945i |
| 0.1336 | −0.1336 | 0.1336 |
| 0.0945 + 0.0945i | −0.0945 − 0.0945i | −0.0945 + 0.0945i |
| 0.0000 + 0.1336i | −0.0000 − 0.1336i | −0.0000 − 0.1336i |
| −0.0945 + 0.0945i | 0.0945 − 0.0945i | 0.0945 + 0.0945i |

Colums 4-7

| | | | |
|---|---|---|---|
| 0.1336 | 0.1336 | 0.1336 | 0.1336 |
| −0.0945 + 0.0945i | −0.0945 − 0.0945i | −0.0945 − 0.0945i | 0.0945 − 0.0945i |
| −0.0000 − 0.1336i | 0.0000 + 0.1336i | 0.0000 + 0.1336i | −0.0000 − 0.1336i |
| 0.0945 + 0.0945i | 0.0945 − 0.0945i | 0.0945 − 0.0945i | −0.0945 − 0.0945i |
| −0.1336 | 0.1336 | −0.1336 | 0.1336 |
| 0.0945 − 0.0945i | −0.0945 − 0.0945i | 0.0945 + 0.0945i | 0.0945 − 0.0945i |
| 0.0000 + 0.1336i | 0.0000 + 0.1336i | −0.0000 − 0.1336i | −0.0000 − 0.1336i |
| −0.0945 − 0.0945i | 0.0945 − 0.0945i | −0.0945 + 0.0945i | −0.0945 − 0.0945i |

ans(:, :, 3) =
Columns 1-3

| | | |
|---|---|---|
| 0.1336 | 0.1336 | 0.1336 |
| 0.1235 + 0.0511i | 0.1235 + 0.0511i | −0.0511 + 0.1235i |
| 0.0945 + 0.0945i | 0.0945 + 0.0945i | −0.0945 − 0.0945i |
| 0.0511 + 0.1235i | 0.0511 + 0.1235i | 0.1235 − 0.0511i |
| 0.1336 | −0.1336 | 0.1336 |
| 0.1235 + 0.0511i | −0.1235 − 0.0511i | −0.0511 + 0.1235i |
| 0.0945 + 0.0945i | −0.0945 − 0.0945i | −0.0945 − 0.0945i |
| 0.0511 + 0.1235i | −0.0511 − 0.1235i | 0.1235 − 0.0511i |

Colums 4-7

| | | | |
|---|---|---|---|
| 0.1336 | 0.1336 | 0.1336 | 0.1336 |
| −0.0511 + 0.1235i | −0.1235 − 0.0511i | −0.1235 − 0.0511i | 0.0511 − 0.1235i |
| −0.0945 − 0.0945i | 0.0945 + 0.0945i | 0.0945 + 0.0945i | −0.0945 − 0.0945i |
| 0.1235 − 0.0511i | −0.0511 − 0.1235i | −0.0511 − 0.1235i | −0.1235 + 0.0511i |
| −0.1336 | 0.1336 | −0.1336 | 0.1336 |
| 0.0511 − 0.1235i | −0.1235 − 0.0511i | 0.1235 + 0.0511i | 0.0511 − 0.1235i |

-continued

| Rank 7 | | | |
|---|---|---|---|
| 0.0945 + 0.0945i | 0.0945 + 0.0945i | −0.0945 − 0.0945i | −0.0945 − 0.0945i |
| −0.1235 + 0.0511i | −0.0511 − 0.1235i | 0.0511 + 0.1235i | −0.1235 + 0.0511i |

ans(:, :, 4) =
Columns 1-3

| | | |
|---|---|---|
| 0.1336 | 0.1336 | 0.1336 |
| 0.0511 + 0.1235i | 0.0511 + 0.1235i | −0.1235 + 0.0511i |
| −0.0945 + 0.0945i | −0.0945 + 0.0945i | 0.0945 − 0.0945i |
| −0.1235 − 0.0511i | −0.1235 − 0.0511i | −0.0511 + 0.1235i |
| 0.1336 | −0.1336 | 0.1336 |
| 0.0511 + 0.1235i | −0.0511 − 0.1235i | −0.1235 + 0.0511i |
| −0.0945 + 0.0945i | 0.0945 − 0.0945i | 0.0945 − 0.0945i |
| −0.1235 − 0.0511i | 0.1235 + 0.0511i | −0.0511 + 0.1235i |

Colums 4-7

| | | | |
|---|---|---|---|
| 0.1336 | 0.1336 | 0.1336 | 0.1336 |
| −0.1235 + 0.0511i | −0.0511 − 0.1235i | −0.0511 − 0.1235i | 0.1235 − 0.0511i |
| 0.0945 − 0.0945i | −0.0945 + 0.0945i | −0.0945 + 0.0945i | 0.0945 − 0.0945i |
| −0.0511 + 0.1235i | 0.1235 + 0.0511i | 0.1235 + 0.0511i | 0.0511 − 0.1235i |
| −0.1336 | 0.1336 | −0.1336 | 0.1336 |
| 0.1235 − 0.0511i | −0.0511 − 0.1235i | 0.0511 + 0.1235i | 0.1235 − 0.0511i |
| −0.0945 + 0.0945i | −0.0945 + 0.0945i | 0.0945 − 0.0945i | 0.0945 − 0.0945i |
| 0.0511 − 0.1235i | 0.1235 + 0.0511i | −0.1235 − 0.0511i | 0.0511 − 0.1235i |

Rank 8
ans(:, :, 1) =

Columns 1-4

| | | | |
|---|---|---|---|
| 0.1250 | 0.1250 | 0.1250 | 0.1250 |
| 0.1250 | 0.1250 | 0.1250i | 0.1250i |
| 0.1250 | 0.1250 | −0.1250 | −0.1250 |
| 0.1250 | 0.1250 | −0.1250i | −0.1250i |
| 0.1250 | −0.1250 | 0.1250 | −0.1250 |
| 0.1250 | −0.1250 | 0.1250i | −0.1250i |
| 0.1250 | −0.1250 | −0.1250 | 0.1250 |
| 0.1250 | −0.1250 | −0.1250i | 0.1250i |

Columns 5-8

| | | | |
|---|---|---|---|
| 0.1250 | 0.1250 | 0.1250 | 0.1250 |
| −0.1250 | −0.1250 | −0.1250i | −0.1250i |
| 0.1250 | 0.1250 | −0.1250 | −0.1250 |
| −0.1250 | −0.1250 | 0.1250i | 0.1250i |
| 0.1250 | −0.1250 | 0.1250 | −0.1250 |
| −0.1250 | 0.1250 | −0.1250i | 0.1250i |
| 0.1250 | −0.1250 | −0.1250 | 0.1250 |
| −0.1250 | 0.1250 | 0.1250i | −0.1250i |

Figure 4:
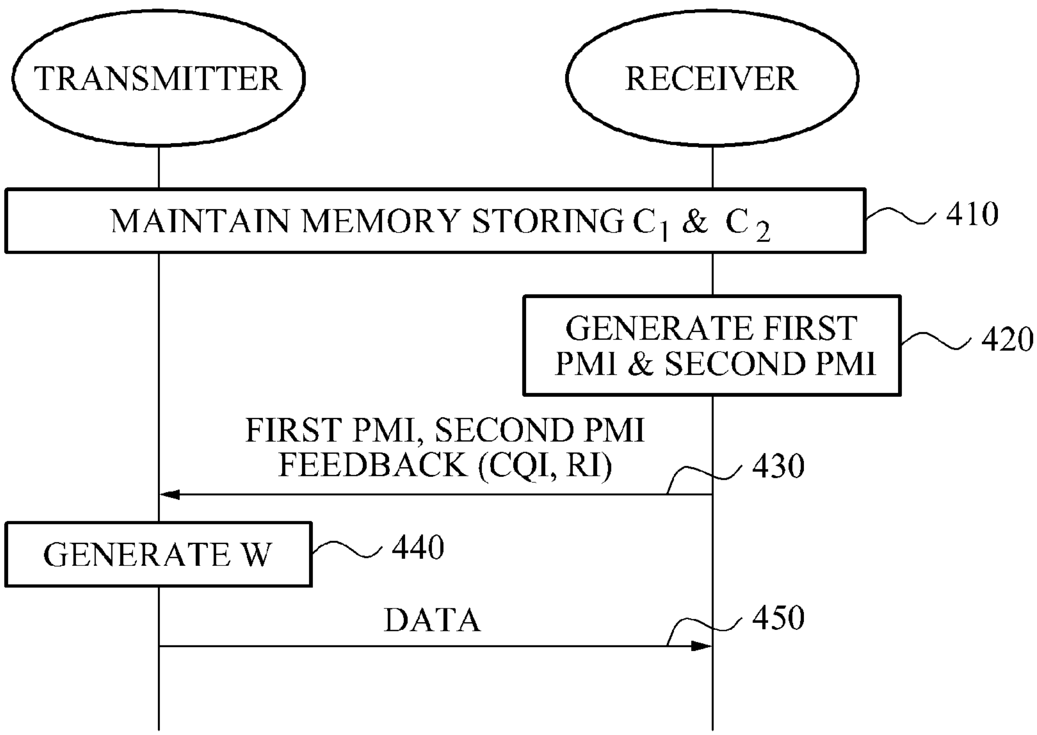
FIG. 4 is a diagram illustrating an example of a communication method of a receiver and a transmitter that share channel information using two codebooks.

FIG. 4 illustrates an example of a communication method of a receiver and a transmitter that share channel information using two codebooks.

Referring to FIG. 4, the transmitter and the receiver may maintain a memory storing a first codebook $C_1$ and a second codebook $C_2$.

At 420, the receiver may generate a first precoding matrix indicator from the first codebook $C_1$, and may generate a second precoding matrix indicator from the second codebook $C_2$ based on a state of a channel formed from the transmitter to the receiver. In this example, the first precoding matrix indicator may indicate one of first codewords included in the first codebook $C_1$, and the second precoding matrix indicator may indicate one of second codewords included in the second codebook $C_2$. A combination of the first precoding matrix indicator and the second precoding matrix indicator may indicate a recommended precoding matrix. For example, when the first precoding matrix indicator indicates $W_1$ and the second precoding matrix indicator indicates $W_2$, the recommended precoding matrix W may be calculated as $W_1W_2$.

At 430, the receiver may transmit the first precoding matrix indicator and the second precoding matrix indicator to the transmitter. The receiver may further transmit channel quality information indicating the quality of the channel and a rank indicator indicating a preferred rank.

At 440, the transmitter may extract $W_1$ from the first codebook $C_1$, and extract $W_2$ from the second codebook $C_2$, based on the first precoding matrix indicator and the second precoding matrix indicator and then generate a precoding matrix W based on $W_1$ and $W_2$. As described above, W may correspond to a function of $W_1$ and $W_2$, for example, $W=W_1W_2$.

At 450, the transmitter may precode at least one data stream based on the precoding matrix W and may transmit data. The transmitter may transmit the data using a plurality of transmit antennas, for example, 2, 4, 8, and the like.

An example in which the first codebook $C_1$ and the second codebook $C_2$ independently exist is described. As described above, the receiver may transmit, to the transmitter, the first precoding matrix indicator indicating the first codeword $W_1$ included in the first codebook $C_1$ and the second precoding matrix indicator indicating the second codeword $W_2$ included in the second codebook $C_2$. The transmitter may extract the first codeword $W_1$ from the first codebook $C_1$, and extract the second codeword $W_2$ from the second codebook $C_2$, based on the first precoding matrix indicator and the second precoding matrix indicator and then calculate the precoding matrix W according to a predetermined function, for example, $W=W_1W_2$. The calculated precoding matrix may be used to precode a data stream.

As another example, the overall codebook C in which the first codebook $C_1$ and the second codebook $C_2$ are integrated may exist. That is, probable candidates of the precoding matrix W may be calculated and thereby be pre-stored as the overall codebook C. In this example, the precoding matrix candidates included in the overall codebook C may be indicated by the first precoding matrix indicator and the second precoding matrix indicator. To indicate one of the candidates included in the overall codebook C, the receiver may transmit the first precoding matrix indicator and the second precoding matrix indicator to the transmitter. The transmitter may extract one of the candidates based on the first precoding matrix indicator and the second precoding matrix. The extracted candidate may be used to precode a data stream as a precoding matrix.

Accordingly, an example in which the first codebook $C_1$ and the second codebook $C_2$ are stored in the transmitter and the receiver may exist. An example in which the overall codebook C instead of the first codebook $C_1$ and the second codebook $C_2$ is stored may exist. In the above examples, only difference lies in that the precoding matrix W is calculated by substantially using $W_1$ and $W_2$. Accordingly, to store the overall codebook C in the transmitter and the receiver may be understood to be substantially equivalent to store the first codebook $C_1$ and the second codebook $C_2$ in the transmitter and the receiver.

Figure 5:
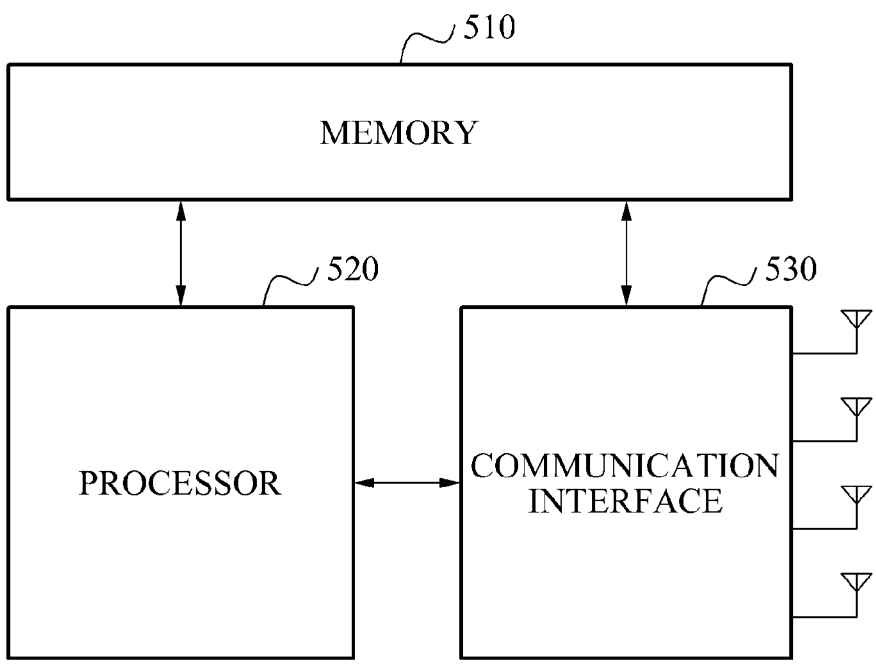
FIG. 5 is a diagram illustrating an example of a communication apparatus.

FIG. 5 illustrates an example of a communication apparatus.

The communication apparatus of FIG. 5 may be installed in any of a transmitter and a receiver.

Initially, an example of the communication apparatus of FIG. 5 installed in the transmitter will be described. A memory 510 may store a first codebook and a second codebook. When the receiver transmits a first precoding matrix indicator and a second precoding matrix indicator using a physical uplink control channel (PUCCH), a physical uplink shared channel (PUSCH), and the like, a communication interface 530 may receive the first precoding matrix indicator and the second precoding matrix indicator. The communication interface 530 may further receive channel quality information, a rank indicator, and the like in addition to the first precoding matrix indicator and the second precoding matrix indicator.

A processor 520 may extract codewords corresponding to the first precoding matrix indicator and the second precoding matrix indicator using a first codebook and a second codebook, and may generate or determine a precoding matrix based on the codewords corresponding to the first precoding matrix indicator and the second precoding matrix indicator.

The processor 520 may precode at least one data stream using the precoding matrix and transmit precoded data to the receiver via a plurality of transmit antenna of the communication apparatus.

Hereinafter, an example of the communication apparatus of FIG. 5 installed in the receiver will be described.

The codebook 510 may store the first codebook and the second codebook. When a well-known signal, for example, a pilot signal is received, the processor 520 may measure a channel formed between the transmitter and the receiver, and may generate the first precoding matrix indicator and the second precoding matrix indicator from the first codebook and the second codebook, respectively, based on the channel.

The communication interface 530 may transmit the first precoding matrix indicator and the second precoding matrix indicator to the transmitter via at least one antenna.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A communication method of a receiver, the communication method comprising:

extracting a first precoding matrix indicator corresponding to a first codeword included in a first codebook, and a second precoding matrix indicator corresponding to a second codeword included in a second codebook; and transmitting, to a transmitter, the first precoding matrix indicator and the second precoding matrix indicator, wherein a combination of the first precoding matrix indicator and the second precoding matrix indicator indicates one of precoding matrix candidates disclosed in the following Table 1, wherein in Table 1, ans(;,;m,n) indicates an inter product between ans(;,;m) in the first codebook and (;,;,n) in the second codebook, ans(;,;,m) corresponds to an $m^{th}$ codeword in the first codebook, ans(;,;,n) corresponds to an $n^{th}$ codeword in the second codebook, and i denotes an imaginary unit:

TABLE 1

| ans(:, :, 1, 1) = | ans(:, :, 1, 6) = | ans(:, :, 1, 11) = |
|---|---|---|
| 0.3536 | 0.3536 | 0.3536 |
| 0.3536 | 0.3468 + 0.0690i | 0.3266 + 0.1353i |
| 0.3536 | 0.3266 + 0.1353i | 0.2500 + 0.2500i |
| 0.3536 | 0.2940 + 0.1964i | 0.1353 + 0.3266i |
| 0.3536 | 0 + 0.3536i | −0.3536 |
| 0.3536 | −0.0690 + 0.3468i | −0.3266 − 0.1353i |
| 0.3536 | −0.1353 + 0.3266i | −0.2500 − 0.2500i |
| 0.3536 | −0.1964 + 0.2940i | −0.1353 − 0.3266i |
| ans(:, :, 2, 1) = | ans(:, :, 2, 6) = | ans(:, :, 2, 11) = |
| 0.3536 | 0.3536 | 0.3536 |
| 0.3266 + 0.1353i | 0.2940 + 0.1964i | 0.2500 + 0.2500i |
| 0.2500 + 0.2500i | 0.1353 + 0.3266i | 0.0000 + 0.3536i |
| 0.1353 + 0.3266i | −0.0690 + 0.3468i | −0.2500 + 0.2500i |
| 0.3536 | 0 + 0.3536i | −0.3536 |
| 0.3266 + 0.1353i | −0.1964 + 0.2940i | −0.2500 − 0.2500i |
| 0.2500 + 0.2500i | −0.3266 + 0.1353i | −0.0000 − 0.3536i |
| 0.1353 + 0.3266i | −0.3468 − 0.0690i | 0.2500 − 0.2500i |
| ans(:, :, 3, 1) = | ans(:, :, 3, 6) = | ans(:, :, 3, 11) = |
| 0.3536 | 0.3536 | 0.3536 |
| 0.2500 + 0.2500i | 0.1964 + 0.2940i | 0.1353 + 0.3266i |
| 0.0000 + 0.3536i | −0.1353 + 0.3266i | −0.2500 + 0.2500i |
| −0.2500 + 0.2500i | −0.3468 + 0.0690i | −0.3266 − 0.1353i |
| 0.3536 | 0 + 0.3536i | −0.3536 |
| 0.2500 + 0.2500i | −0.2940 + 0.1964i | −0.1353 − 0.3266i |
| 0.0000 + 0.3536i | −0.3266 − 0.1353i | 0.2500 − 0.2500i |
| −0.2500 + 0.2500i | −0.0690 − 0.3468i | 0.3266 + 0.1353i |
| ans(:, :, 4, 1) = | ans(:, :, 4, 6) = | ans(:, :, 4, 11) = |
| 0.3536 | 0.3536 | 0.3536 |
| 0.1353 + 0.3266i | 0.0690 + 0.3468i | 0.0000 + 0.3536i |
| −0.2500 + 0.2500i | −0.3266 + 0.1353i | −0.3536 + 0.0000i |
| −0.3266 − 0.1353i | −0.1964 − 0.2940i | −0.0000 − 0.3536i |
| 0.3536 | 0 + 0.3536i | −0.3536 |
| 0.1353 + 0.3266i | −0.3468 + 0.0690i | −0.0000 − 0.3536i |
| −0.2500 + 0.2500i | −0.1353 − 0.3266i | 0.3536 − 0.0000i |
| −0.3266 − 0.1353i | 0.2940 − 0.1964i | 0.0000 + 0.3536i |
| ans(:, :, 5, 1) = | ans(:, :, 5, 6) = | ans(:, :, 5, 11) = |
| 0.3536 | 0.3536 | 0.3536 |
| 0.0000 + 0.3536i | −0.0690 + 0.3468i | −0.1353 + 0.3266i |
| −0.3536 + 0.0000i | −0.3266 − 0.1353i | −0.2500 − 0.2500i |
| −0.0000 − 0.3536i | 0.1964 − 0.2940i | 0.3266 − 0.1353i |
| 0.3536 | 0 + 0.3536i | −0.3536 |
| 0.0000 + 0.3536i | −0.3468 − 0.0690i | 0.1353 − 0.3266i |
| −0.3536 + 0.0000i | 0.1353 − 0.3266i | 0.2500 + 0.2500i |
| −0.0000 − 0.3536i | 0.2940 + 0.1964i | −0.3266 + 0.1353i |
| ans(:, :, 6, 1) = | ans(:, :, 6, 6) = | ans(:, :, 6, 11) = |
| 0.3536 | 0.3536 | 0.3536 |
| −0.1353 + 0.3266i | −0.1964 + 0.2940i | −0.2500 + 0.2500i |
| −0.2500 − 0.2500i | −0.1353 − 0.3266i | −0.0000 − 0.3536i |
| 0.3266 − 0.1353i | 0.3468 + 0.0690i | 0.2500 + 0.2500i |

TABLE 1-continued

| | | |
|---|---|---|
| 0.3536 | 0 + 0.3536i | −0.3536 |
| −0.1353 + 0.3266i | −0.2940 − 0.1964i | 0.2500 − 0.2500i |
| −0.2500 − 0.2500i | 0.3266 − 0.1353i | 0.0000 + 0.3536i |
| 0.3266 − 0.1353i | −0.0690 + 0.3468i | −0.2500 − 0.2500i |
| ans(:, :, 7, 1) = | ans(:, :, 7, 6) = | ans(:, :, 7, 11) = |
| 0.3536 | 0.3536 | 0.3536 |
| −0.2500 + 0.2500i | −0.2940 + 0.1964i | −0.3266 + 0.1353i |
| −0.0000 − 0.3536i | 0.1353 − 0.3266i | 0.2500 − 0.2500i |
| 0.2500 + 0.2500i | 0.0690 + 0.3468i | −0.1353 + 0.3266i |
| 0.3536 | 0 + 0.3536i | −0.3536 |
| −0.2500 + 0.2500i | −0.1964 − 0.2940i | 0.3266 − 0.1353i |
| −0.0000 − 0.3536i | 0.3266 + 0.1353i | −0.2500 + 0.2500i |
| 0.2500 + 0.2500i | −0.3468 + 0.0690i | 0.1353 − 0.3266i |
| ans(:, :, 8, 1) = | ans(:, :, 8, 6) = | ans(:, :, 8, 11) = |
| 0.3536 | 0.3536 | 0.3536 |
| −0.3266 + 0.1353i | −0.3468 + 0.0690i | −0.3536 + 0.0000i |
| 0.2500 − 0.2500i | 0.3266 − 0.1353i | 0.3536 − 0.0000i |
| −0.1353 + 0.3266i | −0.2940 + 0.1964i | −0.3536 + 0.0000i |
| 0.3536 | 0 + 0.3536i | −0.3536 |
| −0.3266 + 0.1353i | −0.0690 − 0.3468i | 0.3536 − 0.0000i |
| 0.2500 − 0.2500i | 0.1353 + 0.3266i | −0.3536 + 0.0000i |
| −0.1353 + 0.3266i | −0.1964 − 0.2940i | 0.3536 − 0.0000i |
| ans(:, :, 9, 1) = | ans(:, :, 9, 6) = | ans(:, :, 9, 11) = |
| 0.3536 | 0.3536 | 0.3536 |
| −0.3536 + 0.0000i | −0.3468 − 0.0690i | −0.3266 − 0.1353i |
| 0.3536 − 0.0000i | 0.3266 + 0.1353i | 0.2500 + 0.2500i |
| −0.3536 + 0.0000i | −0.2940 − 0.1964i | −0.1353 − 0.3266i |
| 0.3536 | 0 + 0.3536i | −0.3536 |
| −0.3536 + 0.0000i | 0.0690 − 0.3468i | 0.3266 + 0.1353i |
| 0.3536 − 0.0000i | −0.1353 + 0.3266i | −0.2500 − 0.2500i |
| −0.3536 + 0.0000i | 0.1964 − 0.2940i | 0.1353 + 0.3266i |
| ans(:, :, 10, 1) = | ans(:, :, 10, 6) = | ans(:, :, 10, 11) = |
| 0.3536 | 0.3536 | 0.3536 |
| −0.3266 − 0.1353i | −0.2940 − 0.1964i | −0.2500 − 0.2500i |
| 0.2500 + 0.2500i | 0.1353 + 0.3266i | 0.0000 + 0.3536i |
| −0.1353 − 0.3266i | 0.0690 − 0.3468i | 0.2500 − 0.2500i |
| 0.3536 | 0 + 0.3536i | −0.3536 |
| −0.3266 − 0.1353i | 0.1964 − 0.2940i | 0.2500 + 0.2500i |
| 0.2500 + 0.2500i | −0.3266 + 0.1353i | −0.0000 − 0.3536i |
| −0.1353 − 0.3266i | 0.3468 + 0.0690i | −0.2500 + 0.2500i |
| ans(:, :, 11, 1) = | ans(:, :, 11, 6) = | ans(:, :, 11, 11) = |
| 0.3536 | 0.3536 | 0.3536 |
| −0.2500 − 0.2500i | −0.1964 − 0.2940i | −0.1353 − 0.3266i |
| 0.0000 + 0.3536i | −0.1353 + 0.3266i | −0.2500 + 0.2500i |
| 0.2500 − 0.2500i | 0.3468 − 0.0690i | 0.3266 + 0.1353i |
| 0.3536 | 0 + 0.3536i | −0.3536 |
| −0.2500 − 0.2500i | 0.2940 − 0.1964i | 0.1353 + 0.3266i |
| 0.0000 + 0.3536i | −0.3266 − 0.1353i | 0.2500 − 0.2500i |
| 0.2500 − 0.2500i | 0.0690 + 0.3468i | −0.3266 − 0.1353i |
| ans(:, :, 12, 1) = | ans(:, :, 12, 6) = | ans(:, :, 12, 11) = |
| 0.3536 | 0.3536 | 0.3536 |
| −0.1353 − 0.3266i | −0.0690 − 0.3468i | −0.0000 − 0.3536i |
| −0.2500 + 0.2500i | −0.3266 + 0.1353i | −0.3536 + 0.0000i |
| 0.3266 + 0.1353i | 0.1964 + 0.2940i | 0.0000 + 0.3536i |
| 0.3536 | 0 + 0.3536i | −0.3536 |
| −0.1353 − 0.3266i | 0.3468 − 0.0690i | 0.0000 + 0.3536i |
| −0.2500 + 0.2500i | −0.1353 − 0.3266i | 0.3536 − 0.0000i |
| 0.3266 + 0.1353i | −0.2940 + 0.1964i | −0.0000 − 0.3536i |
| ans(:, :, 13, 1) = | ans(:, :, 13, 6) = | ans(:, :, 13, 11) = |
| 0.3536 | 0.3536 | 0.3536 |
| −0.0000 − 0.3536i | 0.0690 − 0.3468i | 0.1353 − 0.3266i |
| −0.3536 + 0.0000i | −0.3266 − 0.1353i | −0.2500 − 0.2500i |
| 0.0000 + 0.3536i | −0.1964 + 0.2940i | −0.3266 + 0.1353i |
| 0.3536 | 0 + 0.3536i | −0.3536 |
| −0.0000 − 0.3536i | 0.3468 + 0.0690i | −0.1353 + 0.3266i |

TABLE 1-continued

| | | |
|---|---|---|
| −0.3536 + 0.0000i | 0.1353 − 0.3266i | 0.2500 + 0.2500i |
| 0.0000 + 0.3536i | −0.2940 − 0.1964i | 0.3266 − 0.1353i |
| ans(:, :, 14, 1) = | ans(:, :, 14, 6) = | ans(:, :, 14, 11) = |
| 0.3536 | 0.3536 | 0.3536 |
| 0.1353 − 0.3266i | 0.1964 − 0.2940i | 0.2500 − 0.2500i |
| −0.2500 − 0.2500i | −0.1353 − 0.3266i | −0.0000 − 0.3536i |
| −0.3266 + 0.1353i | −0.3468 − 0.0690i | −0.2500 − 0.2500i |
| 0.3536 | 0 + 0.3536i | −0.3536 |
| 0.1353 − 0.3266i | 0.2940 + 0.1964i | −0.2500 + 0.2500i |
| −0.2500 − 0.2500i | 0.3266 − 0.1353i | 0.0000 + 0.3536i |
| −0.3266 + 0.1353i | 0.0690 − 0.3468i | 0.2500 + 0.2500i |
| ans(:, :, 15, 1) = | ans(:, :, 15, 6) = | ans(:, :, 15, 11) = |
| 0.3536 | 0.3536 | 0.3536 |
| 0.2500 − 0.2500i | 0.2940 − 0.1964i | 0.3266 − 0.1353i |
| −0.0000 − 0.3536i | 0.1353 − 0.3266i | 0.2500 − 0.2500i |
| −0.2500 − 0.2500i | −0.0690 − 0.3468i | 0.1353 − 0.3266i |
| 0.3536 | 0 + 0.3536i | −0.3536 |
| 0.2500 − 0.2500i | 0.1964 + 0.2940i | −0.3266 + 0.1353i |
| −0.0000 − 0.3536i | 0.3266 + 0.1353i | −0.2500 + 0.2500i |
| −0.2500 − 0.2500i | 0.3468 − 0.0690i | −0.1353 + 0.3266i |
| ans(:, :, 16, 1) = | ans(:, :, 16, 6) = | ans(:, :, 16, 11) = |
| 0.3536 | 0.3536 | 0.3536 |
| 0.3266 − 0.1353i | 0.3468 − 0.0690i | 0.3536 |
| 0.2500 − 0.2500i | 0.3266 − 0.1353i | 0.3536 |
| 0.1353 − 0.3266i | 0.2940 − 0.1964i | 0.3536 |
| 0.3536 | 0 + 0.3536i | −0.3536 |
| 0.3266 − 0.1353i | 0.0690 + 0.3468i | −0.3536 |
| 0.2500 − 0.2500i | 0.1353 + 0.3266i | −0.3536 |
| 0.1353 − 0.3266i | 0.1964 + 0.2940i | −0.3536 |
| ans(:, :, 1, 2) = | ans(:, :, 1, 7) = | ans(:, :, 1, 12) = |
| 0.3536 | 0.3536 | 0.3536 |
| 0.3536 | 0.3468 + 0.0690i | 0.3266 + 0.1353i |
| 0.3536 | 0.3266 + 0.1353i | 0.2500 + 0.2500i |
| 0.3536 | 0.2940 + 0.1964i | 0.1353 + 0.3266i |
| 0 + 0.3536i | −0.3536 | 0 − 0.3536i |
| 0 + 0.3536i | −0.3468 − 0.0690i | 0.1353 − 0.3266i |
| 0 + 0.3536i | −0.3266 − 0.1353i | 0.2500 − 0.2500i |
| 0 + 0.3536i | −0.2940 − 0.1964i | 0.3266 − 0.1353i |
| ans(:, :, 2, 2) = | ans(:, :, 2, 7) = | ans(:, :, 2, 12) = |
| 0.3536 | 0.3536 | 0.3536 |
| 0.3266 + 0.1353i | 0.2940 + 0.1964i | 0.2500 + 0.2500i |
| 0.2500 + 0.2500i | 0.1353 + 0.3266i | 0.0000 + 0.3536i |
| 0.1353 + 0.3266i | −0.0690 + 0.3468i | −0.2500 + 0.2500i |
| 0 + 0.3536i | −0.3536 | 0 − 0.3536i |
| −0.1353 + 0.3266i | −0.2940 − 0.1964i | 0.2500 − 0.2500i |
| −0.2500 + 0.2500i | −0.1353 − 0.3266i | 0.3536 − 0.0000i |
| −0.3266 + 0.1353i | 0.0690 − 0.3468i | 0.2500 + 0.2500i |
| ans(:, :, 3, 2) = | ans(:, :, 3, 7) = | ans(:, :, 3, 12) = |
| 0.3536 | 0.3536 | 0.3536 |
| 0.2500 + 0.2500i | 0.1964 + 0.2940i | 0.1353 + 0.3266i |
| 0.0000 + 0.3536i | −0.1353 + 0.3266i | −0.2500 + 0.2500i |
| −0.2500 + 0.2500i | −0.3468 + 0.0690i | −0.3266 − 0.1353i |
| 0 + 0.3536i | −0.3536 | 0 − 0.3536i |
| −0.2500 + 0.2500i | −0.1964 − 0.2940i | 0.3266 − 0.1353i |
| −0.3536 + 0.0000i | 0.1353 − 0.3266i | 0.2500 + 0.2500i |
| −0.2500 − 0.2500i | 0.3468 − 0.0690i | −0.1353 + 0.3266i |
| ans(:, :, 4, 2) = | ans(:, :, 4, 7) = | ans(:, :, 4, 12) = |
| 0.3536 | 0.3536 | 0.3536 |
| 0.1353 + 0.3266i | 0.0690 + 0.3468i | 0.0000 + 0.3536i |
| −0.2500 + 0.2500i | −0.3266 + 0.1353i | −0.3536 + 0.0000i |
| −0.3266 − 0.1353i | −0.1964 − 0.2940i | −0.0000 − 0.3536i |
| 0 + 0.3536i | −0.3536 | 0 − 0.3536i |
| −0.3266 + 0.1353i | −0.0690 − 0.3468i | 0.3536 − 0.0000i |
| −0.2500 − 0.2500i | 0.3266 − 0.1353i | 0.0000 + 0.3536i |
| 0.1353 − 0.3266i | 0.1964 + 0.2940i | −0.3536 + 0.0000i |

TABLE 1-continued

| ans(:, :, 5, 2) = | ans(:, :, 5, 7) = | ans(:, :, 5, 12) = |
|---|---|---|
| 0.3536 | 0.3536 | 0.3536 |
| 0.0000 + 0.3536i | −0.0690 + 0.3468i | −0.1353 + 0.3266i |
| −0.3536 + 0.0000i | −0.3266 − 0.1353i | −0.2500 − 0.2500i |
| −0.0000 − 0.3536i | 0.1964 − 0.2940i | 0.3266 − 0.1353i |
| 0 + 0.3536i | −0.3536 | 0 − 0.3536i |
| −0.3536 + 0.0000i | 0.0690 − 0.3468i | 0.3266 + 0.1353i |
| −0.0000 − 0.3536i | 0.3266 + 0.1353i | −0.2500 + 0.2500i |
| 0.3536 − 0.0000i | −0.1964 + 0.2940i | −0.1353 − 0.3266i |
| ans(:, :, 6, 2) = | ans(:, :, 6, 7) = | ans(:, :, 6, 12) = |
| 0.3536 | 0.3536 | 0.3536 |
| −0.1353 + 0.3266i | −0.1964 + 0.2940i | −0.2500 + 0.2500i |
| −0.2500 − 0.2500i | −0.1353 − 0.3266i | −0.0000 − 0.3536i |
| 0.3266 − 0.1353i | 0.3468 + 0.0690i | 0.2500 + 0.2500i |
| 0 + 0.3536i | −0.3536 | 0 − 0.3536i |
| −0.3266 − 0.1353i | 0.1964 − 0.2940i | 0.2500 + 0.2500i |
| 0.2500 − 0.2500i | 0.1353 + 0.3266i | −0.3536 + 0.0000i |
| 0.1353 + 0.3266i | −0.3468 − 0.0690i | 0.2500 − 0.2500i |
| ans(:, :, 7, 2) = | ans(:, :, 7, 7) = | ans(:, :, 7, 12) = |
| 0.3536 | 0.3536 | 0.3536 |
| −0.2500 + 0.2500i | −0.2940 + 0.1964i | −0.3266 + 0.1353i |
| −0.0000 − 0.3536i | 0.1353 − 0.3266i | 0.2500 − 0.2500i |
| 0.2500 + 0.2500i | 0.0690 + 0.3468i | −0.1353 + 0.3266i |
| 0 + 0.3536i | −0.3536 | 0 − 0.3536i |
| −0.2500 − 0.2500i | 0.2940 − 0.1964i | 0.1353 + 0.3266i |
| 0.3536 − 0.0000i | −0.1353 + 0.3266i | −0.2500 − 0.2500i |
| −0.2500 + 0.2500i | −0.0690 − 0.3468i | 0.3266 + 0.1353i |
| ans(:, :, 8, 2) = | ans(:, :, 8, 7) = | ans(:, :, 8, 12) = |
| 0.3536 | 0.3536 | 0.3536 |
| −0.3266 + 0.1353i | −0.3468 + 0.0690i | −0.3536 + 0.0000i |
| 0.2500 − 0.2500i | 0.3266 − 0.1353i | 0.3536 − 0.0000i |
| −0.1353 + 0.3266i | −0.2940 + 0.1964i | −0.3536 + 0.0000i |
| 0 + 0.3536i | −0.3536 | 0 − 0.3536i |
| −0.1353 − 0.3266i | 0.3468 − 0.0690i | 0.0000 + 0.3536i |
| 0.2500 + 0.2500i | −0.3266 + 0.1353i | −0.0000 − 0.3536i |
| −0.3266 − 0.1353i | 0.2940 − 0.1964i | 0.0000 + 0.3536i |
| ans(:, :, 9, 2) = | ans(:, :, 9, 7) = | ans(:, :, 9, 12) = |
| 0.3536 | 0.3536 | 0.3536 |
| −0.3536 + 0.0000i | −0.3468 − 0.0690i | −0.3266 − 0.1353i |
| 0.3536 − 0.0000i | 0.3266 + 0.1353i | 0.2500 + 0.2500i |
| −0.3536 + 0.0000i | −0.2940 − 0.1964i | −0.1353 − 0.3266i |
| 0 + 0.3536i | −0.3536 | 0 − 0.3536i |
| −0.0000 − 0.3536i | 0.3468 + 0.0690i | −0.1353 + 0.3266i |
| 0.0000 + 0.3536i | −0.3266 − 0.1353i | 0.2500 − 0.2500i |
| −0.0000 − 0.3536i | 0.2940 + 0.1964i | −0.3266 + 0.1353i |
| ans(:, :, 10, 2) = | ans(:, :, 10, 7) = | ans(:, :, 10, 12) = |
| 0.3536 | 0.3536 | 0.3536 |
| −0.3266 − 0.1353i | −0.2940 − 0.1964i | −0.2500 − 0.2500i |
| 0.2500 + 0.2500i | 0.1353 + 0.3266i | 0.0000 + 0.3536i |
| −0.1353 − 0.3266i | 0.0690 − 0.3468i | 0.2500 − 0.2500i |
| 0 + 0.3536i | −0.3536 | 0 − 0.3536i |
| 0.1353 − 0.3266i | 0.2940 + 0.1964i | −0.2500 + 0.2500i |
| −0.2500 + 0.2500i | −0.1353 − 0.3266i | 0.3536 − 0.0000i |
| 0.3266 − 0.1353i | −0.0690 + 0.3468i | −0.2500 − 0.2500i |
| ans(:, :, 11, 2) = | ans(:, :, 11, 7) = | ans(:, :, 11, 12) = |
| 0.3536 | 0.3536 | 0.3536 |
| −0.2500 − 0.2500i | −0.1964 − 0.2940i | −0.1353 − 0.3266i |
| 0.0000 + 0.3536i | −0.1353 + 0.3266i | −0.2500 + 0.2500i |
| 0.2500 − 0.2500i | 0.3468 − 0.0690i | 0.3266 + 0.1353i |
| 0 + 0.3536i | −0.3536 | 0 − 0.3536i |
| 0.2500 − 0.2500i | 0.1964 + 0.2940i | −0.3266 + 0.1353i |
| −0.3536 + 0.0000i | 0.1353 − 0.3266i | 0.2500 + 0.2500i |
| 0.2500 + 0.2500i | −0.3468 + 0.0690i | 0.1353 − 0.3266i |

TABLE 1-continued

| ans(:, :, 12, 2) = | ans(:, :, 12, 7) = | ans(:, :, 12, 12) = |
|---|---|---|
| 0.3536 | 0.3536 | 0.3536 |
| −0.1353 − 0.3266i | −0.0690 − 0.3468i | −0.0000 − 0.3536i |
| −0.2500 + 0.2500i | −0.3266 + 0.1353i | −0.3536 + 0.0000i |
| 0.3266 + 0.1353i | 0.1964 + 0.2940i | 0.0000 + 0.3536i |
| 0 + 0.3536i | −0.3536 | 0 − 0.3536i |
| 0.3266 − 0.1353i | 0.0690 + 0.3468i | −0.3536 + 0.0000i |
| −0.2500 − 0.2500i | 0.3266 − 0.1353i | 0.0000 + 0.3536i |
| −0.1353 + 0.3266i | −0.1964 − 0.2940i | 0.3536 − 0.0000i |
| ans(:, :, 13, 2) = | ans(:, :, 13, 7) = | ans(:, :, 13, 12) = |
| 0.3536 | 0.3536 | 0.3536 |
| −0.0000 − 0.3536i | 0.0690 − 0.3468i | 0.1353 − 0.3266i |
| −0.3536 + 0.0000i | −0.3266 − 0.1353i | −0.2500 − 0.2500i |
| 0.0000 + 0.3536i | −0.1964 + 0.2940i | −0.3266 + 0.1353i |
| 0 + 0.3536i | −0.3536 | 0 − 0.3536i |
| 0.3536 − 0.0000i | −0.0690 + 0.3468i | −0.3266 − 0.1353i |
| −0.0000 − 0.3536i | 0.3266 + 0.1353i | −0.2500 + 0.2500i |
| −0.3536 + 0.0000i | 0.1964 − 0.2940i | 0.1353 + 0.3266i |
| ans(:, :, 14, 2) = | ans(:, :, 14, 7) = | ans(:, :, 14, 12) = |
| 0.3536 | 0.3536 | 0.3536 |
| 0.1353 − 0.3266i | 0.1964 − 0.2940i | 0.2500 − 0.2500i |
| −0.2500 − 0.2500i | −0.1353 − 0.3266i | −0.0000 − 0.3536i |
| −0.3266 + 0.1353i | −0.3468 − 0.0690i | −0.2500 − 0.2500i |
| 0 + 0.3536i | −0.3536 | 0 − 0.3536i |
| 0.3266 + 0.1353i | −0.1964 + 0.2940i | −0.2500 − 0.2500i |
| 0.2500 − 0.2500i | 0.1353 + 0.3266i | −0.3536 + 0.0000i |
| −0.1353 − 0.3266i | 0.3468 + 0.0690i | −0.2500 + 0.2500i |
| ans(:, :, 15, 2) = | ans(:, :, 15, 7) = | ans(:, :, 15, 12) = |
| 0.3536 | 0.3536 | 0.3536 |
| 0.2500 − 0.2500i | 0.2940 − 0.1964i | 0.3266 − 0.1353i |
| −0.0000 − 0.3536i | 0.1353 − 0.3266i | 0.2500 − 0.2500i |
| −0.2500 − 0.2500i | −0.0690 − 0.3468i | 0.1353 − 0.3266i |
| 0 + 0.3536i | −0.3536 | 0 − 0.3536i |
| 0.2500 + 0.2500i | −0.2940 + 0.1964i | −0.1353 − 0.3266i |
| 0.3536 − 0.0000i | −0.1353 + 0.3266i | −0.2500 − 0.2500i |
| 0.2500 − 0.2500i | 0.0690 + 0.3468i | −0.3266 − 0.1353i |
| ans(:, :, 16, 2) = | ans(:, :, 16, 7) = | ans(:, :, 16, 12) = |
| 0.3536 | 0.3536 | 0.3536 |
| 0.3266 − 0.1353i | 0.3468 − 0.0690i | 0.3536 |
| 0.2500 − 0.2500i | 0.3266 − 0.1353i | 0.3536 |
| 0.1353 − 0.3266i | 0.2940 − 0.1964i | 0.3536 |
| 0 + 0.3536i | −0.3536 | 0 − 0.3536i |
| 0.1353 + 0.3266i | −0.3468 + 0.0690i | 0 − 0.3536i |
| 0.2500 + 0.2500i | −0.3266 + 0.1353i | 0 − 0.3536i |
| 0.3266 + 0.1353i | −0.2940 + 0.1964i | 0 − 0.3536i |
| ans(:, :, 1, 3) = | ans(:, :, 1, 8) = | ans(:, :, 1, 13) = |
| 0.3536 | 0.3536 | 0.3536 |
| 0.3536 | 0.3468 + 0.0690i | 0.2940 + 0.1964i |
| 0.3536 | 0.3266 + 0.1353i | 0.1353 + 0.3266i |
| 0.3536 | 0.2940 + 0.1964i | −0.0690 + 0.3468i |
| −0.3536 | 0 − 0.3536i | 0.3536 |
| −0.3536 | 0.0690 − 0.3468i | 0.2940 + 0.1964i |
| −0.3536 | 0.1353 − 0.3266i | 0.1353 + 0.3266i |
| −0.3536 | 0.1964 − 0.2940i | −0.0690 + 0.3468i |
| ans(:, :, 2, 3) = | ans(:, :, 2, 8) = | ans(:, :, 2, 13) = |
| 0.3536 | 0.3536 | 0.3536 |
| 0.3266 + 0.1353i | 0.2940 + 0.1964i | 0.1964 + 0.2940i |
| 0.2500 + 0.2500i | 0.1353 + 0.3266i | −0.1353 + 0.3266i |
| 0.1353 + 0.3266i | −0.0690 + 0.3468i | −0.3468 + 0.0690i |
| −0.3536 | 0 − 0.3536i | 0.3536 |
| −0.3266 − 0.1353i | 0.1964 − 0.2940i | 0.1964 + 0.2940i |
| −0.2500 − 0.2500i | 0.3266 − 0.1353i | −0.1353 + 0.3266i |
| −0.1353 − 0.3266i | 0.3468 + 0.0690i | −0.3468 + 0.0690i |

TABLE 1-continued

| ans(:, :, 3, 3) = | ans(:, :, 3, 8) = | ans(:, :, 3, 13) = |
|---|---|---|
| 0.3536 | 0.3536 | 0.3536 |
| 0.2500 + 0.2500i | 0.1964 + 0.2940i | 0.0690 + 0.3468i |
| 0.0000 + 0.3536i | −0.1353 + 0.3266i | −0.3266 + 0.1353i |
| −0.2500 + 0.2500i | −0.3468 + 0.0690i | −0.1964 − 0.2940i |
| −0.3536 | 0 − 0.3536i | 0.3536 |
| −0.2500 − 0.2500i | 0.2940 − 0.1964i | 0.0690 + 0.3468i |
| −0.0000 − 0.3536i | 0.3266 + 0.1353i | −0.3266 + 0.1353i |
| 0.2500 − 0.2500i | 0.0690 + 0.3468i | −0.1964 − 0.2940i |

| ans(:, :, 4, 3) = | ans(:, :, 4, 8) = | ans(:, :, 4, 13) = |
|---|---|---|
| 0.3536 | 0.3536 | 0.3536 |
| 0.1353 + 0.3266i | 0.0690 + 0.3468i | −0.0690 + 0.3468i |
| −0.2500 + 0.2500i | −0.3266 + 0.1353i | −0.3266 − 0.1353i |
| −0.3266 − 0.1353i | −0.1964 − 0.2940i | 0.1964 − 0.2940i |
| −0.3536 | 0 − 0.3536i | 0.3536 |
| −0.1353 − 0.3266i | 0.3468 − 0.0690i | −0.0690 + 0.3468i |
| 0.2500 − 0.2500i | 0.1353 + 0.3266i | −0.3266 − 0.1353i |
| 0.3266 + 0.1353i | −0.2940 + 0.1964i | 0.1964 − 0.2940i |

| ans(:, :, 5, 3) = | ans(:, :, 5, 8) = | ans(:, :, 5, 13) = |
|---|---|---|
| 0.3536 | 0.3536 | 0.3536 |
| 0.0000 + 0.3536i | −0.0690 + 0.3468i | −0.1964 + 0.2940i |
| −0.3536 + 0.0000i | −0.3266 − 0.1353i | −0.1353 − 0.3266i |
| −0.0000 − 0.3536i | 0.1964 − 0.2940i | 0.3468 + 0.0690i |
| −0.3536 | 0 − 0.3536i | 0.3536 |
| −0.0000 − 0.3536i | 0.3468 + 0.0690i | −0.1964 + 0.2940i |
| 0.3536 − 0.0000i | −0.1353 + 0.3266i | −0.1353 − 0.3266i |
| 0.0000 + 0.3536i | −0.2940 − 0.1964i | 0.3468 + 0.0690i |

| ans(:, :, 6, 3) = | ans(:, :, 6, 8) = | ans(:, :, 6, 13) = |
|---|---|---|
| 0.3536 | 0.3536 | 0.3536 |
| −0.1353 + 0.3266i | −0.1964 + 0.2940i | −0.2940 + 0.1964i |
| −0.2500 − 0.2500i | −0.1353 − 0.3266i | 0.1353 − 0.3266i |
| 0.3266 − 0.1353i | 0.3468 + 0.0690i | 0.0690 + 0.3468i |
| −0.3536 | 0 − 0.3536i | 0.3536 |
| 0.1353 − 0.3266i | 0.2940 + 0.1964i | −0.2940 + 0.1964i |
| 0.2500 + 0.2500i | −0.3266 + 0.1353i | 0.1353 − 0.3266i |
| −0.3266 + 0.1353i | 0.0690 − 0.3468i | 0.0690 + 0.3468i |

| ans(:, :, 7, 3) = | ans(:, :, 7, 8) = | ans(:, :, 7, 13) = |
|---|---|---|
| 0.3536 | 0.3536 | 0.3536 |
| −0.2500 + 0.2500i | −0.2940 + 0.1964i | −0.3468 + 0.0690i |
| −0.0000 − 0.3536i | 0.1353 − 0.3266i | 0.3266 − 0.1353i |
| 0.2500 + 0.2500i | 0.0690 + 0.3468i | −0.2940 + 0.1964i |
| −0.3536 | 0 − 0.3536i | 0.3536 |
| 0.2500 − 0.2500i | 0.1964 + 0.2940i | −0.3468 + 0.0690i |
| 0.0000 + 0.3536i | −0.3266 − 0.1353i | 0.3266 − 0.1353i |
| −0.2500 − 0.2500i | 0.3468 − 0.0690i | −0.2940 + 0.1964i |

| ans(:, :, 8, 3) = | ans(:, :, 8, 8) = | ans(:, :, 8, 13) = |
|---|---|---|
| 0.3536 | 0.3536 | 0.3536 |
| −0.3266 + 0.1353i | −0.3468 + 0.0690i | −0.3468 − 0.0690i |
| 0.2500 − 0.2500i | 0.3266 − 0.1353i | 0.3266 + 0.1353i |
| −0.1353 + 0.3266i | −0.2940 + 0.1964i | −0.2940 − 0.1964i |
| −0.3536 | 0 − 0.3536i | 0.3536 |
| 0.3266 − 0.1353i | 0.0690 + 0.3468i | −0.3468 − 0.0690i |
| −0.2500 + 0.2500i | −0.1353 − 0.3266i | 0.3266 + 0.1353i |
| 0.1353 − 0.3266i | 0.1964 + 0.2940i | −0.2940 − 0.1964i |

| ans(:, :, 9, 3) = | ans(:, :, 9, 8) = | ans(:, :, 9, 13) = |
|---|---|---|
| 0.3536 | 0.3536 | 0.3536 |
| −0.3536 + 0.0000i | −0.3468 − 0.0690i | −0.2940 − 0.1964i |
| 0.3536 − 0.0000i | 0.3266 + 0.1353i | 0.1353 + 0.3266i |
| −0.3536 + 0.0000i | −0.2940 − 0.1964i | 0.0690 − 0.3468i |
| −0.3536 | 0 − 0.3536i | 0.3536 |
| 0.3536 − 0.0000i | −0.0690 + 0.3468i | −0.2940 − 0.1964i |
| −0.3536 + 0.0000i | 0.1353 − 0.3266i | 0.1353 + 0.3266i |
| 0.3536 − 0.0000i | −0.1964 + 0.2940i | 0.0690 − 0.3468i |

TABLE 1-continued

| ans(:, :, 10, 3) = | ans(:, :, 10, 8) = | ans(:, :, 10, 13) = |
|---|---|---|
| 0.3536 | 0.3536 | 0.3536 |
| −0.3266 − 0.1353i | −0.2940 − 0.1964i | −0.1964 − 0.2940i |
| 0.2500 + 0.2500i | 0.1353 + 0.3266i | −0.1353 + 0.3266i |
| −0.1353 − 0.3266i | 0.0690 − 0.3468i | 0.3468 − 0.0690i |
| −0.3536 | 0 − 0.3536i | 0.3536 |
| 0.3266 + 0.1353i | −0.1964 + 0.2940i | −0.1964 − 0.2940i |
| −0.2500 − 0.2500i | 0.3266 − 0.1353i | −0.1353 + 0.3266i |
| 0.1353 + 0.3266i | −0.3468 − 0.0690i | 0.3468 − 0.0690i |

| ans(:, :, 11, 3) = | ans(:, :, 11, 8) = | ans(:, :, 11, 13) = |
|---|---|---|
| 0.3536 | 0.3536 | 0.3536 |
| −0.2500 − 0.2500i | −0.1964 − 0.2940i | −0.0690 − 0.3468i |
| 0.0000 + 0.3536i | −0.1353 + 0.3266i | −0.3266 + 0.1353i |
| 0.2500 − 0.2500i | 0.3468 − 0.0690i | 0.1964 + 0.2940i |
| −0.3536 | 0 − 0.3536i | 0.3536 |
| 0.2500 + 0.2500i | −0.2940 + 0.1964i | −0.0690 − 0.3468i |
| −0.0000 − 0.3536i | 0.3266 + 0.1353i | −0.3266 + 0.1353i |
| −0.2500 + 0.2500i | −0.0690 − 0.3468i | 0.1964 + 0.2940i |

| ans(:, :, 12, 3) = | ans(:, :, 12, 8) = | ans(:, :, 12, 13) = |
|---|---|---|
| 0.3536 | 0.3536 | 0.3536 |
| −0.1353 − 0.3266i | −0.0690 − 0.3468i | 0.0690 − 0.3468i |
| −0.2500 + 0.2500i | −0.3266 + 0.1353i | −0.3266 − 0.1353i |
| 0.3266 + 0.1353i | 0.1964 + 0.2940i | −0.1964 + 0.2940i |
| −0.3536 | 0 − 0.3536i | 0.3536 |
| 0.1353 + 0.3266i | −0.3468 + 0.0690i | 0.0690 − 0.3468i |
| 0.2500 − 0.2500i | 0.1353 + 0.3266i | −0.3266 − 0.1353i |
| −0.3266 − 0.1353i | 0.2940 − 0.1964i | −0.1964 + 0.2940i |

| ans(:, :, 13, 3) = | ans(:, :, 13, 8) = | ans(:, :, 13, 13) = |
|---|---|---|
| 0.3536 | 0.3536 | 0.3536 |
| −0.0000 − 0.3536i | 0.0690 − 0.3468i | 0.1964 − 0.2940i |
| −0.3536 + 0.0000i | −0.3266 − 0.1353i | −0.1353 − 0.3266i |
| 0.0000 + 0.3536i | −0.1964 + 0.2940i | −0.3468 − 0.0690i |
| −0.3536 | 0 − 0.3536i | 0.3536 |
| 0.0000 + 0.3536i | −0.3468 − 0.0690i | 0.1964 − 0.2940i |
| 0.3536 − 0.0000i | −0.1353 + 0.3266i | −0.1353 − 0.3266i |
| −0.0000 − 0.3536i | 0.2940 + 0.1964i | −0.3468 − 0.0690i |

| ans(:, :, 14, 3) = | ans(:, :, 14, 8) = | ans(:, :, 14, 13) = |
|---|---|---|
| 0.3536 | 0.3536 | 0.3536 |
| 0.1353 − 0.3266i | 0.1964 − 0.2940i | 0.2940 − 0.1964i |
| −0.2500 − 0.2500i | −0.1353 − 0.3266i | 0.1353 − 0.3266i |
| −0.3266 + 0.1353i | −0.3468 − 0.0690i | −0.0690 − 0.3468i |
| −0.3536 | 0 − 0.3536i | 0.3536 |
| −0.1353 + 0.3266i | −0.2940 − 0.1964i | 0.2940 − 0.1964i |
| 0.2500 + 0.2500i | −0.3266 + 0.1353i | 0.1353 − 0.3266i |
| 0.3266 − 0.1353i | −0.0690 + 0.3468i | −0.0690 − 0.3468i |

| ans(:, :, 15, 3) = | ans(:, :, 15, 8) = | ans(:, :, 15, 13) = |
|---|---|---|
| 0.3536 | 0.3536 | 0.3536 |
| 0.2500 − 0.2500i | 0.2940 − 0.1964i | 0.3468 − 0.0690i |
| −0.0000 − 0.3536i | 0.1353 − 0.3266i | 0.3266 − 0.1353i |
| −0.2500 − 0.2500i | −0.0690 − 0.3468i | 0.2940 − 0.1964i |
| −0.3536 | 0 − 0.3536i | 0.3536 |
| −0.2500 + 0.2500i | −0.1964 − 0.2940i | 0.3468 − 0.0690i |
| 0.0000 + 0.3536i | −0.3266 − 0.1353i | 0.3266 − 0.1353i |
| 0.2500 + 0.2500i | −0.3468 + 0.0690i | 0.2940 − 0.1964i |

| ans(:, :, 16, 3) = | ans(:, :, 16, 8) = | ans(:, :, 16, 13) = |
|---|---|---|
| 0.3536 | 0.3536 | 0.3536 |
| 0.3266 − 0.1353i | 0.3468 − 0.0690i | 0.3468 + 0.0690i |
| 0.2500 − 0.2500i | 0.3266 − 0.1353i | 0.3266 + 0.1353i |
| 0.1353 − 0.3266i | 0.2940 − 0.1964i | 0.2940 + 0.1964i |
| −0.3536 | 0 − 0.3536i | 0.3536 |
| −0.3266 + 0.1353i | −0.0690 − 0.3468i | 0.3468 + 0.0690i |
| −0.2500 + 0.2500i | −0.1353 − 0.3266i | 0.3266 + 0.1353i |
| −0.1353 + 0.3266i | −0.1964 − 0.2940i | 0.2940 + 0.1964i |

TABLE 1-continued

| ans(:, :, 1, 4) = | ans(:, :, 1, 9) = | ans(:, :, 1, 14) = |
|---|---|---|
| 0.3536 | 0.3536 | 0.3536 |
| 0.3536 | 0.3266 + 0.1353i | 0.2940 + 0.1964i |
| 0.3536 | 0.2500 + 0.2500i | 0.1353 + 0.3266i |
| 0.3536 | 0.1353 + 0.3266i | −0.0690 + 0.3468i |
| 0 − 0.3536i | 0.3536 | 0 + 0.3536i |
| 0 − 0.3536i | 0.3266 + 0.1353i | −0.1964 + 0.2940i |
| 0 − 0.3536i | 0.2500 + 0.2500i | −0.3266 + 0.1353i |
| 0 − 0.3536i | 0.1353 + 0.3266i | −0.3468 − 0.0690i |

| ans(:, :, 2, 4) = | ans(:, :, 2, 9) = | ans(:, :, 2, 14) = |
|---|---|---|
| 0.3536 | 0.3536 | 0.3536 |
| 0.3266 + 0.1353i | 0.2500 + 0.2500i | 0.1964 + 0.2940i |
| 0.2500 + 0.2500i | 0.0000 + 0.3536i | −0.1353 + 0.3266i |
| 0.1353 + 0.3266i | −0.2500 + 0.2500i | −0.3468 + 0.0690i |
| 0 − 0.3536i | 0.3536 | 0 + 0.3536i |
| 0.1353 − 0.3266i | 0.2500 + 0.2500i | −0.2940 + 0.1964i |
| 0.2500 − 0.2500i | 0.0000 + 0.3536i | −0.3266 − 0.1353i |
| 0.3266 − 0.1353i | −0.2500 + 0.2500i | −0.0690 − 0.3468i |

| ans(:, :, 3, 4) = | ans(:, :, 3, 9) = | ans(:, :, 3, 14) = |
|---|---|---|
| 0.3536 | 0.3536 | 0.3536 |
| 0.2500 + 0.2500i | 0.1353 + 0.3266i | 0.0690 + 0.3468i |
| 0.0000 + 0.3536i | −0.2500 + 0.2500i | −0.3266 + 0.1353i |
| −0.2500 + 0.2500i | −0.3266 − 0.1353i | −0.1964 − 0.2940i |
| 0 − 0.3536i | 0.3536 | 0 + 0.3536i |
| 0.2500 − 0.2500i | 0.1353 + 0.3266i | −0.3468 + 0.0690i |
| 0.3536 − 0.0000i | −0.2500 + 0.2500i | −0.1353 − 0.3266i |
| 0.2500 + 0.2500i | −0.3266 − 0.1353i | 0.2940 − 0.1964i |

| ans(:, :, 4, 4) = | ans(:, :, 4, 9) = | ans(:, :, 4, 14) = |
|---|---|---|
| 0.3536 | 0.3536 | 0.3536 |
| 0.1353 + 0.3266i | 0.0000 + 0.3536i | −0.0690 + 0.3468i |
| −0.2500 + 0.2500i | −0.3536 + 0.0000i | −0.3266 − 0.1353i |
| −0.3266 − 0.1353i | −0.0000 − 0.3536i | 0.1964 − 0.2940i |
| 0 − 0.3536i | 0.3536 | 0 + 0.3536i |
| 0.3266 − 0.1353i | 0.0000 + 0.3536i | −0.3468 − 0.0690i |
| 0.2500 + 0.2500i | −0.3536 + 0.0000i | 0.1353 − 0.3266i |
| −0.1353 + 0.3266i | −0.0000 − 0.3536i | 0.2940 + 0.1964i |

| ans(:, :, 5, 4) = | ans(:, :, 5, 9) = | ans(:, :, 5, 14) = |
|---|---|---|
| 0.3536 | 0.3536 | 0.3536 |
| 0.0000 + 0.3536i | −0.1353 + 0.3266i | −0.1964 + 0.2940i |
| −0.3536 + 0.0000i | −0.2500 − 0.2500i | −0.1353 − 0.3266i |
| −0.0000 − 0.3536i | 0.3266 − 0.1353i | 0.3468 + 0.0690i |
| 0 − 0.3536i | 0.3536 | 0 + 0.3536i |
| 0.3536 − 0.0000i | −0.1353 + 0.3266i | −0.2940 − 0.1964i |
| 0.0000 + 0.3536i | −0.2500 − 0.2500i | 0.3266 − 0.1353i |
| −0.3536 + 0.0000i | 0.3266 − 0.1353i | −0.0690 + 0.3468i |

| ans(:, :, 6, 4) = | ans(:, :, 6, 9) = | ans(:, :, 6, 14) = |
|---|---|---|
| 0.3536 | 0.3536 | 0.3536 |
| −0.1353 + 0.3266i | −0.2500 + 0.2500i | −0.2940 + 0.1964i |
| −0.2500 − 0.2500i | −0.0000 − 0.3536i | 0.1353 − 0.3266i |
| 0.3266 − 0.1353i | 0.2500 + 0.2500i | 0.0690 + 0.3468i |
| 0 − 0.3536i | 0.3536 | 0 + 0.3536i |
| 0.3266 + 0.1353i | −0.2500 + 0.2500i | −0.1964 − 0.2940i |
| −0.2500 + 0.2500i | −0.0000 − 0.3536i | 0.3266 + 0.1353i |
| −0.1353 − 0.3266i | 0.2500 + 0.2500i | −0.3468 + 0.0690i |

| ans(:, :, 7, 4) = | ans(:, :, 7, 9) = | ans(:, :, 7, 14) = |
|---|---|---|
| 0.3536 | 0.3536 | 0.3536 |
| −0.2500 + 0.2500i | −0.3266 + 0.1353i | −0.3468 + 0.0690i |
| −0.0000 − 0.3536i | 0.2500 − 0.2500i | 0.3266 − 0.1353i |
| 0.2500 + 0.2500i | −0.1353 + 0.3266i | −0.2940 + 0.1964i |
| 0 − 0.3536i | 0.3536 | 0 + 0.3536i |
| 0.2500 + 0.2500i | −0.3266 + 0.1353i | −0.0690 − 0.3468i |
| −0.3536 + 0.0000i | 0.2500 − 0.2500i | 0.1353 + 0.3266i |
| 0.2500 − 0.2500i | −0.1353 + 0.3266i | −0.1964 − 0.2940i |

TABLE 1-continued

| ans(:, :, 8, 4) = | ans(:, :, 8, 9) = | ans(:, :, 8, 14) = |
|---|---|---|
| 0.3536 | 0.3536 | 0.3536 |
| −0.3266 + 0.1353i | −0.3536 + 0.0000i | −0.3468 − 0.0690i |
| 0.2500 − 0.2500i | 0.3536 − 0.0000i | 0.3266 + 0.1353i |
| −0.1353 + 0.3266i | −0.3536 + 0.0000i | −0.2940 − 0.1964i |
| 0 − 0.3536i | 0.3536 | 0 + 0.3536i |
| 0.1353 + 0.3266i | −0.3536 + 0.0000i | 0.0690 − 0.3468i |
| −0.2500 − 0.2500i | 0.3536 − 0.0000i | −0.1353 + 0.3266i |
| 0.3266 + 0.1353i | −0.3536 + 0.0000i | 0.1964 − 0.2940i |

| ans(:, :, 9, 4) = | ans(:, :, 9, 9) = | ans(:, :, 9, 14) = |
|---|---|---|
| 0.3536 | 0.3536 | 0.3536 |
| −0.3536 + 0.0000i | −0.3266 − 0.1353i | −0.2940 − 0.1964i |
| 0.3536 − 0.0000i | 0.2500 + 0.2500i | 0.1353 + 0.3266i |
| −0.3536 + 0.0000i | −0.1353 − 0.3266i | 0.0690 − 0.3468i |
| 0 − 0.3536i | 0.3536 | 0 + 0.3536i |
| 0.0000 + 0.3536i | −0.3266 − 0.1353i | 0.1964 − 0.2940i |
| −0.0000 − 0.3536i | 0.2500 + 0.2500i | −0.3266 + 0.1353i |
| 0.0000 + 0.3536i | −0.1353 − 0.3266i | 0.3468 + 0.0690i |

| ans(:, :, 10, 4) = | ans(:, :, 10, 9) = | ans(:, :, 10, 14) = |
|---|---|---|
| 0.3536 | 0.3536 | 0.3536 |
| −0.3266 − 0.1353i | −0.2500 − 0.2500i | −0.1964 − 0.2940i |
| 0.2500 + 0.2500i | 0.0000 + 0.3536i | −0.1353 + 0.3266i |
| −0.1353 − 0.3266i | 0.2500 − 0.2500i | 0.3468 − 0.0690i |
| 0 − 0.3536i | 0.3536 | 0 + 0.3536i |
| −0.1353 + 0.3266i | −0.2500 − 0.2500i | 0.2940 − 0.1964i |
| 0.2500 − 0.2500i | 0.0000 + 0.3536i | −0.3266 − 0.1353i |
| −0.3266 + 0.1353i | 0.2500 − 0.2500i | 0.0690 + 0.3468i |

| ans(:, :, 11, 4) = | ans(:, :, 11, 9) = | ans(:, :, 11, 14) = |
|---|---|---|
| 0.3536 | 0.3536 | 0.3536 |
| −0.2500 − 0.2500i | −0.1353 − 0.3266i | −0.0690 − 0.3468i |
| 0.0000 + 0.3536i | −0.2500 + 0.2500i | −0.3266 + 0.1353i |
| 0.2500 − 0.2500i | 0.3266 + 0.1353i | 0.1964 + 0.2940i |
| 0 − 0.3536i | 0.3536 | 0 + 0.3536i |
| −0.2500 + 0.2500i | −0.1353 − 0.3266i | 0.3468 − 0.0690i |
| 0.3536 − 0.0000i | −0.2500 + 0.2500i | −0.1353 − 0.3266i |
| −0.2500 − 0.2500i | 0.3266 + 0.1353i | −0.2940 + 0.1964i |

| ans(:, :, 12, 4) = | ans(:, :, 12, 9) = | ans(:, :, 12, 14) = |
|---|---|---|
| 0.3536 | 0.3536 | 0.3536 |
| −0.1353 − 0.3266i | −0.0000 − 0.3536i | 0.0690 − 0.3468i |
| −0.2500 + 0.2500i | −0.3536 + 0.0000i | −0.3266 − 0.1353i |
| 0.3266 + 0.1353i | 0.0000 + 0.3536i | −0.1964 + 0.2940i |
| 0 − 0.3536i | 0.3536 | 0 + 0.3536i |
| −0.3266 + 0.1353i | −0.0000 − 0.3536i | 0.3468 + 0.0690i |
| 0.2500 + 0.2500i | −0.3536 + 0.0000i | 0.1353 − 0.3266i |
| 0.1353 − 0.3266i | 0.0000 + 0.3536i | −0.2940 − 0.1964i |

| ans(:, :, 13, 4) = | ans(:, :, 13, 9) = | ans(:, :, 13, 14) = |
|---|---|---|
| 0.3536 | 0.3536 | 0.3536 |
| −0.0000 − 0.3536i | 0.1353 − 0.3266i | 0.1964 − 0.2940i |
| −0.3536 + 0.0000i | −0.2500 − 0.2500i | −0.1353 − 0.3266i |
| 0.0000 + 0.3536i | −0.3266 + 0.1353i | −0.3468 − 0.0690i |
| 0 − 0.3536i | 0.3536 | 0 + 0.3536i |
| −0.3536 + 0.0000i | 0.1353 − 0.3266i | 0.2940 + 0.1964i |
| 0.0000 + 0.3536i | −0.2500 − 0.2500i | 0.3266 − 0.1353i |
| 0.3536 − 0.0000i | −0.3266 + 0.1353i | 0.0690 − 0.3468i |

| ans(:, :, 14, 4) = | ans(:, :, 14, 9) = | ans(:, :, 14, 14) = |
|---|---|---|
| 0.3536 | 0.3536 | 0.3536 |
| 0.1353 − 0.3266i | 0.2500 − 0.2500i | 0.2940 − 0.1964i |
| −0.2500 − 0.2500i | −0.0000 − 0.3536i | 0.1353 − 0.3266i |
| −0.3266 + 0.1353i | −0.2500 − 0.2500i | −0.0690 − 0.3468i |
| 0 − 0.3536i | 0.3536 | 0 + 0.3536i |
| −0.3266 − 0.1353i | 0.2500 − 0.2500i | 0.1964 + 0.2940i |
| −0.2500 + 0.2500i | −0.0000 − 0.3536i | 0.3266 + 0.1353i |
| 0.1353 + 0.3266i | −0.2500 − 0.2500i | 0.3468 − 0.0690i |

TABLE 1-continued

| ans(:, :, 15, 4) = | ans(:, :, 15, 9) = | ans(:, :, 15, 14) = |
|---|---|---|
| 0.3536 | 0.3536 | 0.3536 |
| 0.2500 − 0.2500i | 0.3266 − 0.1353i | 0.3468 − 0.0690i |
| −0.0000 − 0.3536i | 0.2500 − 0.2500i | 0.3266 − 0.1353i |
| −0.2500 − 0.2500i | 0.1353 − 0.3266i | 0.2940 − 0.1964i |
| 0 − 0.3536i | 0.3536 | 0 + 0.3536i |
| −0.2500 − 0.2500i | 0.3266 − 0.1353i | 0.0690 + 0.3468i |
| −0.3536 + 0.0000i | 0.2500 − 0.2500i | 0.1353 + 0.3266i |
| −0.2500 + 0.2500i | 0.1353 − 0.3266i | 0.1964 + 0.2940i |

| ans(:, :, 16, 4) = | ans(:, :, 16, 9) = | ans(:, :, 16, 14) = |
|---|---|---|
| 0.3536 | 0.3536 | 0.3536 |
| 0.3266 − 0.1353i | 0.3536 | 0.3468 + 0.0690i |
| 0.2500 − 0.2500i | 0.3536 | 0.3266 + 0.1353i |
| 0.1353 − 0.3266i | 0.3536 | 0.2940 + 0.1964i |
| 0 − 0.3536i | 0.3536 | 0 + 0.3536i |
| −0.1353 − 0.3266i | 0.3536 | −0.0690 + 0.3468i |
| −0.2500 − 0.2500i | 0.3536 | −0.1353 + 0.3266i |
| −0.3266 − 0.1353i | 0.3536 | −0.1964 + 0.2940i |

| ans(:, :, 1, 5) = | ans(:, :, 1, 10) = | ans(:, :, 1, 15) = |
|---|---|---|
| 0.3536 | 0.3536 | 0.3536 |
| 0.3468 + 0.0690i | 0.3266 + 0.1353i | 0.2940 + 0.1964i |
| 0.3266 + 0.1353i | 0.2500 + 0.2500i | 0.1353 + 0.3266i |
| 0.2940 + 0.1964i | 0.1353 + 0.3266i | −0.0690 + 0.3468i |
| 0.3536 | 0 + 0.3536i | −0.3536 |
| 0.3468 + 0.0690i | −0.1353 + 0.3266i | −0.2940 − 0.1964i |
| 0.3266 + 0.1353i | −0.2500 + 0.2500i | −0.1353 − 0.3266i |
| 0.2940 + 0.1964i | −0.3266 + 0.1353i | 0.0690 − 0.3468i |

| ans(:, :, 2, 5) = | ans(:, :, 2, 10) = | ans(:, :, 2, 15) = |
|---|---|---|
| 0.3536 | 0.3536 | 0.3536 |
| 0.2940 + 0.1964i | 0.2500 + 0.2500i | 0.1964 + 0.2940i |
| 0.1353 + 0.3266i | 0.0000 + 0.3536i | −0.1353 + 0.3266i |
| −0.0690 + 0.3468i | −0.2500 + 0.2500i | −0.3468 + 0.0690i |
| 0.3536 | 0 + 0.3536i | −0.3536 |
| 0.2940 + 0.1964i | −0.2500 + 0.2500i | −0.1964 − 0.2940i |
| 0.1353 + 0.3266i | −0.3536 + 0.0000i | 0.1353 − 0.3266i |
| −0.0690 + 0.3468i | −0.2500 − 0.2500i | 0.3468 − 0.0690i |

| ans(:, :, 3, 5) = | ans(:, :, 3, 10) = | ans(:, :, 3, 15) = |
|---|---|---|
| 0.3536 | 0.3536 | 0.3536 |
| 0.1964 + 0.2940i | 0.1353 + 0.3266i | 0.0690 + 0.3468i |
| −0.1353 + 0.3266i | −0.2500 + 0.2500i | −0.3266 + 0.1353i |
| −0.3468 + 0.0690i | −0.3266 − 0.1353i | −0.1964 − 0.2940i |
| 0.3536 | 0 + 0.3536i | −0.3536 |
| 0.1964 + 0.2940i | −0.3266 + 0.1353i | −0.0690 − 0.3468i |
| −0.1353 + 0.3266i | −0.2500 − 0.2500i | 0.3266 − 0.1353i |
| −0.3468 + 0.0690i | 0.1353 − 0.3266i | 0.1964 + 0.2940i |

| ans(:, :, 4, 5) = | ans(:, :, 4, 10) = | ans(:, :, 4, 15) = |
|---|---|---|
| 0.3536 | 0.3536 | 0.3536 |
| 0.0690 + 0.3468i | 0.0000 + 0.3536i | −0.0690 + 0.3468i |
| −0.3266 + 0.1353i | −0.3536 + 0.0000i | −0.3266 − 0.1353i |
| −0.1964 − 0.2940i | −0.0000 − 0.3536i | 0.1964 − 0.2940i |
| 0.3536 | 0 + 0.3536i | −0.3536 |
| 0.0690 + 0.3468i | −0.3536 + 0.0000i | 0.0690 − 0.3468i |
| −0.3266 + 0.1353i | −0.0000 − 0.3536i | 0.3266 + 0.1353i |
| −0.1964 − 0.2940i | 0.3536 − 0.0000i | −0.1964 + 0.2940i |

| ans(:, :, 5, 5) = | ans(:, :, 5, 10) = | ans(:, :, 5, 15) = |
|---|---|---|
| 0.3536 | 0.3536 | 0.3536 |
| −0.0690 + 0.3468i | −0.1353 + 0.3266i | −0.1964 + 0.2940i |
| −0.3266 − 0.1353i | −0.2500 − 0.2500i | −0.1353 − 0.3266i |
| 0.1964 − 0.2940i | 0.3266 − 0.1353i | 0.3468 + 0.0690i |
| 0.3536 | 0 + 0.3536i | −0.3536 |
| −0.0690 + 0.3468i | −0.3266 − 0.1353i | 0.1964 − 0.2940i |
| −0.3266 − 0.1353i | 0.2500 − 0.2500i | 0.1353 + 0.3266i |
| 0.1964 − 0.2940i | 0.1353 + 0.3266i | −0.3468 − 0.0690i |

TABLE 1-continued

| ans(:, :, 6, 5) = | ans(:, :, 6, 10) = | ans(:, :, 6, 15) = |
|---|---|---|
| 0.3536 | 0.3536 | 0.3536 |
| −0.1964 + 0.2940i | −0.2500 + 0.2500i | −0.2940 + 0.1964i |
| −0.1353 − 0.3266i | −0.0000 − 0.3536i | 0.1353 − 0.3266i |
| 0.3468 + 0.0690i | 0.2500 + 0.2500i | 0.0690 + 0.3468i |
| 0.3536 | 0 + 0.3536i | −0.3536 |
| −0.1964 + 0.2940i | −0.2500 − 0.2500i | 0.2940 − 0.1964i |
| −0.1353 − 0.3266i | 0.3536 − 0.0000i | −0.1353 + 0.3266i |
| 0.3468 + 0.0690i | −0.2500 + 0.2500i | −0.0690 − 0.3468i |

| ans(:, :, 7, 5) = | ans(:, :, 7, 10) = | ans(:, :, 7, 15) = |
|---|---|---|
| 0.3536 | 0.3536 | 0.3536 |
| −0.2940 + 0.1964i | −0.3266 + 0.1353i | −0.3468 + 0.0690i |
| 0.1353 − 0.3266i | 0.2500 − 0.2500i | 0.3266 − 0.1353i |
| 0.0690 + 0.3468i | −0.1353 + 0.3266i | −0.2940 + 0.1964i |
| 0.3536 | 0 + 0.3536i | −0.3536 |
| −0.2940 + 0.1964i | −0.1353 − 0.3266i | 0.3468 − 0.0690i |
| 0.1353 − 0.3266i | 0.2500 + 0.2500i | −0.3266 + 0.1353i |
| 0.0690 + 0.3468i | −0.3266 − 0.1353i | 0.2940 − 0.1964i |

| ans(:, :, 8, 5) = | ans(:, :, 8, 10) = | ans(:, :, 8, 15) = |
|---|---|---|
| 0.3536 | 0.3536 | 0.3536 |
| −0.3468 + 0.0690i | −0.3536 + 0.0000i | −0.3468 − 0.0690i |
| 0.3266 − 0.1353i | 0.3536 − 0.0000i | 0.3266 + 0.1353i |
| −0.2940 + 0.1964i | −0.3536 + 0.0000i | −0.2940 − 0.1964i |
| 0.3536 | 0 + 0.3536i | −0.3536 |
| −0.3468 + 0.0690i | −0.0000 − 0.3536i | 0.3468 + 0.0690i |
| 0.3266 − 0.1353i | 0.0000 + 0.3536i | −0.3266 − 0.1353i |
| −0.2940 + 0.1964i | −0.0000 − 0.3536i | 0.2940 + 0.1964i |

| ans(:, :, 9, 5) = | ans(:, :, 9, 10) = | ans(:, :, 9, 15) = |
|---|---|---|
| 0.3536 | 0.3536 | 0.3536 |
| −0.3468 − 0.0690i | −0.3266 − 0.1353i | −0.2940 − 0.1964i |
| 0.3266 + 0.1353i | 0.2500 + 0.2500i | 0.1353 + 0.3266i |
| −0.2940 − 0.1964i | −0.1353 − 0.3266i | 0.0690 − 0.3468i |
| 0.3536 | 0 + 0.3536i | −0.3536 |
| −0.3468 − 0.0690i | 0.1353 − 0.3266i | 0.2940 + 0.1964i |
| 0.3266 + 0.1353i | −0.2500 + 0.2500i | −0.1353 − 0.3266i |
| −0.2940 − 0.1964i | 0.3266 − 0.1353i | −0.0690 + 0.3468i |

| ans(:, :, 10, 5) = | ans(:, :, 10, 10) = | ans(:, :, 10, 15) = |
|---|---|---|
| 0.3536 | 0.3536 | 0.3536 |
| −0.2940 − 0.1964i | −0.2500 − 0.2500i | −0.1964 − 0.2940i |
| 0.1353 + 0.3266i | 0.0000 + 0.3536i | −0.1353 + 0.3266i |
| 0.0690 − 0.3468i | 0.2500 − 0.2500i | 0.3468 − 0.0690i |
| 0.3536 | 0 + 0.3536i | −0.3536 |
| −0.2940 − 0.1964i | 0.2500 − 0.2500i | 0.1964 + 0.2940i |
| 0.1353 + 0.3266i | −0.3536 + 0.0000i | 0.1353 − 0.3266i |
| 0.0690 − 0.3468i | 0.2500 + 0.2500i | −0.3468 + 0.0690i |

| ans(:, :, 11, 5) = | ans(:, :, 11, 10) = | ans(:, :, 11, 15) = |
|---|---|---|
| 0.3536 | 0.3536 | 0.3536 |
| −0.1964 − 0.2940i | −0.1353 − 0.3266i | −0.0690 − 0.3468i |
| −0.1353 + 0.3266i | −0.2500 + 0.2500i | −0.3266 + 0.1353i |
| 0.3468 − 0.0690i | 0.3266 + 0.1353i | 0.1964 + 0.2940i |
| 0.3536 | 0 + 0.3536i | −0.3536 |
| −0.1964 − 0.2940i | 0.3266 − 0.1353i | 0.0690 + 0.3468i |
| −0.1353 + 0.3266i | −0.2500 − 0.2500i | 0.3266 − 0.1353i |
| 0.3468 − 0.0690i | −0.1353 + 0.3266i | −0.1964 − 0.2940i |

| ans(:, :, 12, 5) = | ans(:, :, 12, 10) = | ans(:, :, 12, 15) = |
|---|---|---|
| 0.3536 | 0.3536 | 0.3536 |
| −0.0690 − 0.3468i | −0.0000 − 0.3536i | 0.0690 − 0.3468i |
| −0.3266 + 0.1353i | −0.3536 + 0.0000i | −0.3266 − 0.1353i |
| 0.1964 + 0.2940i | 0.0000 + 0.3536i | −0.1964 + 0.2940i |
| 0.3536 | 0 + 0.3536i | −0.3536 |
| −0.0690 − 0.3468i | 0.3536 − 0.0000i | −0.0690 + 0.3468i |
| −0.3266 + 0.1353i | −0.0000 − 0.3536i | 0.3266 + 0.1353i |
| 0.1964 + 0.2940i | −0.3536 + 0.0000i | 0.1964 − 0.2940i |

TABLE 1-continued

| ans(:, :, 13, 5) = | ans(:, :, 13, 10) = | ans(:, :, 13, 15) = |
|---|---|---|
| 0.3536 | 0.3536 | 0.3536 |
| 0.0690 − 0.3468i | 0.1353 − 0.3266i | 0.1964 − 0.2940i |
| −0.3266 − 0.1353i | −0.2500 − 0.2500i | −0.1353 − 0.3266i |
| −0.1964 + 0.2940i | −0.3266 + 0.1353i | −0.3468 − 0.0690i |
| 0.3536 | 0 + 0.3536i | −0.3536 |
| 0.0690 − 0.3468i | 0.3266 + 0.1353i | −0.1964 + 0.2940i |
| −0.3266 − 0.1353i | 0.2500 − 0.2500i | 0.1353 + 0.3266i |
| −0.1964 + 0.2940i | −0.1353 − 0.3266i | 0.3468 + 0.0690i |

| ans(:, :, 14, 5) = | ans(:, :, 14, 10) = | ans(:, :, 14, 15) = |
|---|---|---|
| 0.3536 | 0.3536 | 0.3536 |
| 0.1964 − 0.2940i | 0.2500 − 0.2500i | 0.2940 − 0.1964i |
| −0.1353 − 0.3266i | −0.0000 − 0.3536i | 0.1353 − 0.3266i |
| −0.3468 − 0.0690i | −0.2500 − 0.2500i | −0.0690 − 0.3468i |
| 0.3536 | 0 + 0.3536i | −0.3536 |
| 0.1964 − 0.2940i | 0.2500 + 0.2500i | −0.2940 + 0.1964i |
| −0.1353 − 0.3266i | 0.3536 − 0.0000i | −0.1353 + 0.3266i |
| −0.3468 − 0.0690i | 0.2500 − 0.2500i | 0.0690 + 0.3468i |

| ans(:, :, 15, 5) = | ans(:, :, 15, 10) = | ans(:, :, 15, 15) = |
|---|---|---|
| 0.3536 | 0.3536 | 0.3536 |
| 0.2940 − 0.1964i | 0.3266 − 0.1353i | 0.3468 − 0.0690i |
| 0.1353 − 0.3266i | 0.2500 − 0.2500i | 0.3266 − 0.1353i |
| −0.0690 − 0.3468i | 0.1353 − 0.3266i | 0.2940 − 0.1964i |
| 0.3536 | 0 + 0.3536i | −0.3536 |
| 0.2940 − 0.1964i | 0.1353 + 0.3266i | −0.3468 + 0.0690i |
| 0.1353 − 0.3266i | 0.2500 + 0.2500i | −0.3266 + 0.1353i |
| −0.0690 − 0.3468i | 0.3266 + 0.1353i | −0.2940 + 0.1964i |

| ans(:, :, 16, 5) = | ans(:, :, 16, 10) = | ans(:, :, 16, 15) = |
|---|---|---|
| 0.3536 | 0.3536 | 0.3536 |
| 0.3468 − 0.0690i | 0.3536 | 0.3468 + 0.0690i |
| 0.3266 − 0.1353i | 0.3536 | 0.3266 + 0.1353i |
| 0.2940 − 0.1964i | 0.3536 | 0.2940 + 0.1964i |
| 0.3536 | 0 + 0.3536i | −0.3536 |
| 0.3468 − 0.0690i | 0 + 0.3536i | −0.3468 − 0.0690i |
| 0.3266 − 0.1353i | 0 + 0.3536i | −0.3266 − 0.1353i |
| 0.2940 − 0.1964i | 0 + 0.3536i | −0.2940 − 0.1964i |

| ans(:, :, 1, 16) = |
|---|
| 0.3536 |
| 0.2940 + 0.1964i |
| 0.1353 + 0.3266i |
| −0.0690 + 0.3468i |
| 0 − 0.3536i |
| 0.1964 − 0.2940i |
| 0.3266 − 0.1353i |
| 0.3468 + 0.0690i |

| ans(:, :, 2, 16) = |
|---|
| 0.3536 |
| 0.1964 + 0.2940i |
| −0.1353 + 0.3266i |
| −0.3468 + 0.0690i |
| 0 − 0.3536i |
| 0.2940 − 0.1964i |
| 0.3266 + 0.1353i |
| 0.0690 + 0.3468i |

| ans(:, :, 3, 16) = |
|---|
| 0.3536 |
| 0.0690 + 0.3468i |
| −0.3266 + 0.1353i |
| −0.1964 − 0.2940i |
| 0 − 0.3536i |
| 0.3468 − 0.0690i |
| 0.1353 + 0.3266i |
| −0.2940 + 0.1964i |

TABLE 1-continued

| ans(:, :, 4, 16) = |
|---|
| 0.3536 |
| −0.0690 + 0.3468i |
| −0.3266 − 0.1353i |
| 0.1964 − 0.2940i |
| 0 − 0.3536i |
| 0.3468 + 0.0690i |
| −0.1353 + 0.3266i |
| −0.2940 − 0.1964i |

| ans(:, :, 5, 16) = |
|---|
| 0.3536 |
| −0.1964 + 0.2940i |
| −0.1353 − 0.3266i |
| 0.3468 + 0.0690i |
| 0 − 0.3536i |
| 0.2940 + 0.1964i |
| −0.3266 + 0.1353i |
| 0.0690 − 0.3468i |

| ans(:, :, 6, 16) = |
|---|
| 0.3536 |
| −0.2940 + 0.1964i |
| 0.1353 − 0.3266i |
| 0.0690 + 0.3468i |
| 0 − 0.3536i |
| 0.1964 + 0.2940i |
| −0.3266 − 0.1353i |
| 0.3468 − 0.0690i |

| ans(:, :, 7, 16) = |
|---|
| 0.3536 |
| −0.3468 + 0.0690i |
| 0.3266 − 0.1353i |
| −0.2940 + 0.1964i |
| 0 − 0.3536i |
| 0.0690 + 0.3468i |
| −0.1353 − 0.3266i |
| 0.1964 + 0.2940i |

| ans(:, :, 8, 16) = |
|---|
| 0.3536 |
| −0.3468 − 0.0690i |
| 0.3266 + 0.1353i |
| −0.2940 − 0.1964i |
| 0 − 0.3536i |
| −0.0690 + 0.3468i |
| 0.1353 − 0.3266i |
| −0.1964 + 0.2940i |

| ans(:, :, 9, 16) = |
|---|
| 0.3536 |
| −0.2940 − 0.1964i |
| 0.1353 + 0.3266i |
| 0.0690 − 0.3468i |
| 0 − 0.3536i |
| −0.1964 + 0.2940i |
| 0.3266 − 0.1353i |
| −0.3468 − 0.0690i |

| ans(:, :, 10, 16) = |
|---|
| 0.3536 |
| −0.1964 − 0.2940i |
| −0.1353 + 0.3266i |
| 0.3468 − 0.0690i |
| 0 − 0.3536i |
| −0.2940 + 0.1964i |
| 0.3266 + 0.1353i |
| −0.0690 − 0.3468i |

TABLE 1-continued

| ans(:, :, 11, 16) = |
|---|
| 0.3536 |
| −0.0690 − 0.3468i |
| −0.3266 + 0.1353i |
| 0.1964 + 0.2940i |
| 0 − 0.3536i |
| −0.3468 + 0.0690i |
| 0.1353 + 0.3266i |
| 0.2940 − 0.1964i |
| **ans(:, :, 12, 16) =** |
| 0.3536 |
| 0.0690 − 0.3468i |
| −0.3266 − 0.1353i |
| −0.1964 + 0.2940i |
| 0 − 0.3536i |
| −0.3468 − 0.0690i |
| −0.1353 + 0.3266i |
| 0.2940 + 0.1964i |
| **ans(:, :, 13, 16) =** |
| 0.3536 |
| 0.1964 − 0.2940i |
| −0.1353 − 0.3266i |
| −0.3468 − 0.0690i |
| 0 − 0.3536i |
| −0.2940 − 0.1964i |
| −0.3266 + 0.1353i |
| −0.0690 + 0.3468i |
| **ans(:, :, 14, 16) =** |
| 0.3536 |
| 0.2940 − 0.1964i |
| 0.1353 − 0.3266i |
| −0.0690 − 0.3468i |
| 0 − 0.3536i |
| −0.1964 − 0.2940i |
| −0.3266 − 0.1353i |
| −0.3468 + 0.0690i |

TABLE 1-continued

| ans(:, :, 15, 16) = |
|---|
| 0.3536 |
| 0.3468 − 0.0690i |
| 0.3266 − 0.1353i |
| 0.2940 − 0.1964i |
| 0 − 0.3536i |
| −0.0690 − 0.3468i |
| −0.1353 − 0.3266i |
| −0.1964 − 0.2940i |
| **ans(:, :, 16, 16) =** |
| 0.3536 |
| 0.3468 + 0.0690i |
| 0.3266 + 0.1353i |
| 0.2940 + 0.1964i |
| 0 − 0.3536i |
| 0.0690 − 0.3468i |
| 0.1353 − 0.3266i |
| 0.1964 − 0.2940i. |

2. A communication method of a receiver, the communication method comprising:

extracting a first precoding matrix indicator corresponding to a first codeword included in a first codebook and a second precoding matrix indicator corresponding to a second codeword included in a second codeword; and transmitting, to a transmitter, the first precoding matrix indicator and the second precoding matrix indicator, wherein a combination of the first precoding matrix indicator and the second precoding matrix indicator indicates one of precoding matrix candidates disclosed in the following Table 2, wherein in Table 2, ans(;,;m,n) indicates an inter product between ans(;,;m) in the first codebook and (;,;,n) in the second codebook, ans(;,;,m) corresponds to an $m^{th}$ codeword in the first codebook, ans(;,;,n) corresponds to an $n^{th}$ codeword in the second codebook, and i denotes an imaginary unit:

TABLE 2

| ans(:, :, 1, 1) = | | ans(:, :, 1, 9) = | |
|---|---|---|---|
| 0.2500 | 0.2500 | 0.2500 | 0.2500 |
| 0.2500 | 0.2500 | 0.2500 | 0.2452 + 0.0488i |
| 0.2500 | 0.2500 | 0.2500 | 0.2310 + 0.0957i |
| 0.2500 | 0.2500 | 0.2500 | 0.2079 + 0.1389i |
| 0.2500 | −0.2500 | 0.2500 | −0.2500 |
| 0.2500 | −0.2500 | 0.2500 | −0.2452 − 0.0488i |
| 0.2500 | −0.2500 | 0.2500 | −0.2310 − 0.0957i |
| 0.2500 | −0.2500 | 0.2500 | −0.2079 − 0.1389i |
| **ans(:, :, 2, 1) =** | | **ans(:, :, 2, 9) =** | |
| 0.2500 | 0.2500 | 0.2500 | 0.2500 |
| 0.2310 + 0.0957i | 0.2310 + 0.0957i | 0.2310 + 0.0957i | 0.2079 + 0.1389i |
| 0.1768 + 0.1768i | 0.1768 + 0.1768i | 0.1768 + 0.1768i | 0.0957 + 0.2310i |
| 0.0957 + 0.2310i | 0.0957 + 0.2310i | 0.0957 + 0.2310i | −0.0488 + 0.2452i |
| 0.2500 | −0.2500 | 0.2500 | −0.2500 |
| 0.2310 + 0.0957i | −0.2310 − 0.0957i | 0.2310 + 0.0957i | −0.2079 − 0.1389i |
| 0.1768 + 0.1768i | −0.1768 − 0.1768i | 0.1768 + 0.1768i | −0.0957 − 0.2310i |
| 0.0957 + 0.2310i | −0.0957 − 0.2310i | 0.0957 + 0.2310i | 0.0488 − 0.2452i |
| **ans(:, :, 3, 1) =** | | **ans(:, :, 3, 9) =** | |
| 0.2500 | 0.2500 | 0.2500 | 0.2500 |
| 0.1768 + 0.1768i | 0.1768 + 0.1768i | 0.1768 + 0.1768i | 0.1389 + 0.2079i |
| 0.0000 + 0.2500i | 0.0000 + 0.2500i | 0.0000 + 0.2500i | −0.0957 + 0.2310i |
| −0.1768 + 0.1768i | −0.1768 + 0.1768i | −0.1768 + 0.1768i | −0.2452 + 0.0488i |
| 0.2500 | −0.2500 | 0.2500 | −0.2500 |
| 0.1768 + 0.1768i | −0.1768 − 0.1768i | 0.1768 + 0.1768i | −0.1389 − 0.2079i |

TABLE 2-continued

| | | | |
|---|---|---|---|
| 0.0000 + 0.2500i | −0.0000 − 0.2500i | 0.0000 + 0.2500i | 0.0957 − 0.2310i |
| −0.1768 + 0.1768i | 0.1768 − 0.1768i | −0.1768 + 0.1768i | 0.2452 − 0.0488i |
| ans(:, :, 4, 1) = | | ans(:, :, 4, 9) = | |
| 0.2500 | 0.2500 | 0.2500 | 0.2500 |
| 0.0957 + 0.2310i | 0.0957 + 0.2310i | 0.0957 + 0.2310i | 0.0488 + 0.2452i |
| −0.1768 + 0.1768i | −0.1768 + 0.1768i | −0.1768 + 0.1768i | −0.2310 + 0.0957i |
| −0.2310 − 0.0957i | −0.2310 − 0.0957i | −0.2310 − 0.0957i | −0.1389 − 0.2079i |
| 0.2500 | −0.2500 | 0.2500 | −0.2500 |
| 0.0957 + 0.2310i | −0.0957 − 0.2310i | 0.0957 + 0.2310i | −0.0488 − 0.2452i |
| −0.1768 + 0.1768i | 0.1768 − 0.1768i | −0.1768 + 0.1768i | 0.2310 − 0.0957i |
| −0.2310 − 0.0957i | 0.2310 + 0.0957i | −0.2310 − 0.0957i | 0.1389 + 0.2079i |
| ans(:, :, 5, 1) = | | ans(:, :, 5, 9) = | |
| 0.2500 | 0.2500 | 0.2500 | 0.2500 |
| 0.0000 + 0.2500i | 0.0000 + 0.2500i | 0.0000 + 0.2500i | −0.0488 + 0.2452i |
| −0.2500 + 0.0000i | −0.2500 + 0.0000i | −0.2500 + 0.0000i | −0.2310 − 0.0957i |
| −0.0000 − 0.2500i | −0.0000 − 0.2500i | −0.0000 − 0.2500i | 0.1389 − 0.2079i |
| 0.2500 | −0.2500 | 0.2500 | −0.2500 |
| 0.0000 + 0.2500i | −0.0000 − 0.2500i | 0.0000 + 0.2500i | 0.0488 − 0.2452i |
| −0.2500 + 0.0000i | 0.2500 − 0.0000i | −0.2500 + 0.0000i | 0.2310 + 0.0957i |
| −0.0000 − 0.2500i | 0.0000 + 0.2500i | −0.0000 − 0.2500i | −0.1389 + 0.2079i |
| ans(:, :, 6, 1) = | | ans(:, :, 6, 9) = | |
| 0.2500 | 0.2500 | 0.2500 | 0.2500 |
| −0.0957 + 0.2310i | −0.0957 + 0.2310i | −0.0957 + 0.2310i | −0.1389 + 0.2079i |
| −0.1768 − 0.1768i | −0.1768 − 0.1768i | −0.1768 − 0.1768i | −0.0957 − 0.2310i |
| 0.2310 − 0.0957i | 0.2310 − 0.0957i | 0.2310 − 0.0957i | 0.2452 + 0.0488i |
| 0.2500 | −0.2500 | 0.2500 | −0.2500 |
| −0.0957 + 0.2310i | 0.0957 − 0.2310i | −0.0957 + 0.2310i | 0.1389 − 0.2079i |
| −0.1768 − 0.1768i | 0.1768 + 0.1768i | −0.1768 − 0.1768i | 0.0957 + 0.2310i |
| 0.2310 − 0.0957i | −0.2310 + 0.0957i | 0.2310 − 0.0957i | −0.2452 − 0.0488i |
| ans(:, :, 7, 1) = | | ans(:, :, 7, 9) = | |
| 0.2500 | 0.2500 | 0.2500 | 0.2500 |
| −0.1768 + 0.1768i | −0.1768 + 0.1768i | −0.1768 + 0.1768i | −0.2079 + 0.1389i |
| −0.0000 − 0.2500i | −0.0000 − 0.2500i | −0.0000 − 0.2500i | 0.0957 − 0.2310i |
| 0.1768 + 0.1768i | 0.1768 + 0.1768i | 0.1768 + 0.1768i | 0.0488 + 0.2452i |
| 0.2500 | −0.2500 | 0.2500 | −0.2500 |
| −0.1768 + 0.1768i | 0.1768 − 0.1768i | −0.1768 + 0.1768i | 0.2079 − 0.1389i |
| −0.0000 − 0.2500i | 0.0000 + 0.2500i | −0.0000 − 0.2500i | −0.0957 + 0.2310i |
| 0.1768 + 0.1768i | −0.1768 − 0.1768i | 0.1768 + 0.1768i | −0.0488 − 0.2452i |
| ans(:, :, 8, 1) = | | ans(:, :, 8, 9) = | |
| 0.2500 | 0.2500 | 0.2500 | 0.2500 |
| −0.2310 + 0.0957i | −0.2310 + 0.0957i | −0.2310 + 0.0957i | −0.2452 + 0.0488i |
| 0.1768 − 0.1768i | 0.1768 − 0.1768i | 0.1768 − 0.1768i | 0.2310 − 0.0957i |
| −0.0957 + 0.2310i | −0.0957 + 0.2310i | −0.0957 + 0.2310i | −0.2079 + 0.1389i |
| 0.2500 | −0.2500 | 0.2500 | −0.2500 |
| −0.2310 + 0.0957i | 0.2310 − 0.0957i | −0.2310 + 0.0957i | 0.2452 − 0.0488i |
| 0.1768 − 0.1768i | −0.1768 + 0.1768i | 0.1768 − 0.1768i | −0.2310 + 0.0957i |
| −0.0957 + 0.2310i | 0.0957 − 0.2310i | −0.0957 + 0.2310i | 0.2079 − 0.1389i |
| ans(:, :, 9, 1) = | | ans(:, :, 9, 9) = | |
| 0.2500 | 0.2500 | 0.2500 | 0.2500 |
| −0.2500 + 0.0000i | −0.2500 + 0.0000i | −0.2500 + 0.0000i | −0.2452 − 0.0488i |
| 0.2500 − 0.0000i | 0.2500 − 0.0000i | 0.2500 − 0.0000i | 0.2310 + 0.0957i |
| −0.2500 + 0.0000i | −0.2500 + 0.0000i | −0.2500 + 0.0000i | −0.2079 − 0.1389i |
| 0.2500 | −0.2500 | 0.2500 | −0.2500 |
| −0.2500 + 0.0000i | 0.2500 − 0.0000i | −0.2500 + 0.0000i | 0.2452 + 0.0488i |
| 0.2500 − 0.0000i | −0.2500 + 0.0000i | 0.2500 − 0.0000i | −0.2310 − 0.0957i |
| −0.2500 + 0.0000i | 0.2500 − 0.0000i | −0.2500 + 0.0000i | 0.2079 + 0.1389i |
| ans(:, :, 10, 1) = | | ans(:, :, 10, 9) = | |
| 0.2500 | 0.2500 | 0.2500 | 0.2500 |
| −0.2310 − 0.0957i | −0.2310 − 0.0957i | −0.2310 − 0.0957i | −0.2079 − 0.1389i |
| 0.1768 + 0.1768i | 0.1768 + 0.1768i | 0.1768 + 0.1768i | 0.0957 + 0.2310i |
| −0.0957 − 0.2310i | −0.0957 − 0.2310i | −0.0957 − 0.2310i | 0.0488 − 0.2452i |
| 0.2500 | −0.2500 | 0.2500 | −0.2500 |
| −0.2310 − 0.0957i | 0.2310 + 0.0957i | −0.2310 − 0.0957i | 0.2079 + 0.1389i |
| 0.1768 + 0.1768i | −0.1768 − 0.1768i | 0.1768 + 0.1768i | −0.0957 − 0.2310i |
| −0.0957 − 0.2310i | 0.0957 + 0.2310i | −0.0957 − 0.2310i | −0.0488 + 0.2452i |

TABLE 2-continued

| ans(:, :, 11, 1) = | | ans(:, :, 11, 9) = | |
|---|---|---|---|
| 0.2500 | 0.2500 | 0.2500 | 0.2500 |
| −0.1768 − 0.1768i | −0.1768 − 0.1768i | −0.1768 − 0.1768i | −0.1389 − 0.2079i |
| 0.0000 + 0.2500i | 0.0000 + 0.2500i | 0.0000 + 0.2500i | −0.0957 + 0.2310i |
| 0.1768 − 0.1768i | 0.1768 − 0.1768i | 0.1768 − 0.1768i | 0.2452 − 0.0488i |
| 0.2500 | −0.2500 | 0.2500 | −0.2500 |
| −0.1768 − 0.1768i | 0.1768 + 0.1768i | −0.1768 − 0.1768i | 0.1389 + 0.2079i |
| 0.0000 + 0.2500i | −0.0000 − 0.2500i | 0.0000 + 0.2500i | 0.0957 − 0.2310i |
| 0.1768 − 0.1768i | −0.1768 + 0.1768i | 0.1768 − 0.1768i | −0.2452 + 0.0488i |

| ans(:, :, 12, 1) = | | ans(:, :, 12, 9) = | |
|---|---|---|---|
| 0.2500 | 0.2500 | 0.2500 | 0.2500 |
| −0.0957 − 0.2310i | −0.0957 − 0.2310i | −0.0957 − 0.2310i | −0.0488 − 0.2452i |
| −0.1768 + 0.1768i | −0.1768 + 0.1768i | −0.1768 + 0.1768i | −0.2310 + 0.0957i |
| 0.2310 + 0.0957i | 0.2310 + 0.0957i | 0.2310 + 0.0957i | 0.1389 + 0.2079i |
| 0.2500 | −0.2500 | 0.2500 | −0.2500 |
| −0.0957 − 0.2310i | 0.0957 + 0.2310i | −0.0957 − 0.2310i | 0.0488 + 0.2452i |
| −0.1768 + 0.1768i | 0.1768 − 0.1768i | −0.1768 + 0.1768i | 0.2310 − 0.0957i |
| 0.2310 + 0.0957i | −0.2310 − 0.0957i | 0.2310 + 0.0957i | −0.1389 − 0.2079i |

| ans(:, :, 13, 1) = | | ans(:, :, 13, 9) = | |
|---|---|---|---|
| 0.2500 | 0.2500 | 0.2500 | 0.2500 |
| −0.0000 − 0.2500i | −0.0000 − 0.2500i | −0.0000 − 0.2500i | 0.0488 − 0.2452i |
| −0.2500 + 0.0000i | −0.2500 + 0.0000i | −0.2500 + 0.0000i | −0.2310 − 0.0957i |
| 0.0000 + 0.2500i | 0.0000 + 0.2500i | 0.0000 + 0.2500i | −0.1389 + 0.2079i |
| 0.2500 | −0.2500 | 0.2500 | −0.2500 |
| −0.0000 − 0.2500i | 0.0000 + 0.2500i | −0.0000 − 0.2500i | −0.0488 + 0.2452i |
| −0.2500 + 0.0000i | 0.2500 − 0.0000i | −0.2500 + 0.0000i | 0.2310 + 0.0957i |
| 0.0000 + 0.2500i | −0.0000 − 0.2500i | 0.0000 + 0.2500i | 0.1389 − 0.2079i |

| ans(:, :, 14, 1) = | | ans(:, :, 14, 9) = | |
|---|---|---|---|
| 0.2500 | 0.2500 | 0.2500 | 0.2500 |
| 0.0957 − 0.2310i | 0.0957 − 0.2310i | 0.0957 − 0.2310i | 0.1389 − 0.2079i |
| −0.1768 − 0.1768i | −0.1768 − 0.1768i | −0.1768 − 0.1768i | −0.0957 − 0.2310i |
| −0.2310 + 0.0957i | −0.2310 + 0.0957i | −0.2310 + 0.0957i | −0.2452 − 0.0488i |
| 0.2500 | −0.2500 | 0.2500 | −0.2500 |
| 0.0957 − 0.2310i | −0.0957 + 0.2310i | 0.0957 − 0.2310i | −0.1389 + 0.2079i |
| −0.1768 − 0.1768i | 0.1768 + 0.1768i | −0.1768 − 0.1768i | 0.0957 + 0.2310i |
| −0.2310 + 0.0957i | 0.2310 − 0.0957i | −0.2310 + 0.0957i | 0.2452 + 0.0488i |

| ans(:, :, 15, 1) = | | ans(:, :, 15, 9) = | |
|---|---|---|---|
| 0.2500 | 0.2500 | 0.2500 | 0.2500 |
| 0.1768 − 0.1768i | 0.1768 − 0.1768i | 0.1768 − 0.1768i | 0.2079 − 0.1389i |
| −0.0000 − 0.2500i | −0.0000 − 0.2500i | −0.0000 − 0.2500i | 0.0957 − 0.2310i |
| −0.1768 − 0.1768i | −0.1768 − 0.1768i | −0.1768 − 0.1768i | −0.0488 − 0.2452i |
| 0.2500 | −0.2500 | 0.2500 | −0.2500 |
| 0.1768 − 0.1768i | −0.1768 + 0.1768i | 0.1768 − 0.1768i | −0.2079 + 0.1389i |
| −0.0000 − 0.2500i | 0.0000 + 0.2500i | −0.0000 − 0.2500i | −0.0957 + 0.2310i |
| −0.1768 − 0.1768i | 0.1768 + 0.1768i | −0.1768 − 0.1768i | 0.0488 + 0.2452i |

| ans(:, :, 16, 1) = | | ans(:, :, 16, 9) = | |
|---|---|---|---|
| 0.2500 | 0.2500 | 0.2500 | 0.2500 |
| 0.2310 − 0.0957i | 0.2310 − 0.0957i | 0.2310 − 0.0957i | 0.2452 − 0.0488i |
| 0.1768 − 0.1768i | 0.1768 − 0.1768i | 0.1768 − 0.1768i | 0.2310 − 0.0957i |
| 0.0957 − 0.2310i | 0.0957 − 0.2310i | 0.0957 − 0.2310i | 0.2079 − 0.1389i |
| 0.2500 | −0.2500 | 0.2500 | −0.2500 |
| 0.2310 − 0.0957i | −0.2310 + 0.0957i | 0.2310 − 0.0957i | −0.2452 + 0.0488i |
| 0.1768 − 0.1768i | −0.1768 + 0.1768i | 0.1768 − 0.1768i | −0.2310 + 0.0957i |
| 0.0957 − 0.2310i | −0.0957 + 0.2310i | 0.0957 − 0.2310i | −0.2079 + 0.1389i |

| ans(:, :, 1, 2) = | | ans(:, :, 1, 10) = | |
|---|---|---|---|
| 0.2500 | 0.2500 | 0.2500 | 0.2500 |
| 0.2500 | 0.2500 | 0.2500 | 0.2452 + 0.0488i |
| 0.2500 | 0.2500 | 0.2500 | 0.2310 + 0.0957i |
| 0.2500 | 0.2500 | 0.2500 | 0.2079 + 0.1389i |
| 0 + 0.2500i | 0 − 0.2500i | 0 + 0.2500i | 0 − 0.2500i |
| 0 + 0.2500i | 0 − 0.2500i | 0 + 0.2500i | 0.0488 − 0.2452i |
| 0 + 0.2500i | 0 − 0.2500i | 0 + 0.2500i | 0.0957 − 0.2310i |
| 0 + 0.2500i | 0 − 0.2500i | 0 + 0.2500i | 0.1389 − 0.2079i |

TABLE 2-continued

| ans(:, :, 2, 2) = | | ans(:, :, 2, 10) = | |
|---|---|---|---|
| 0.2500 | 0.2500 | 0.2500 | 0.2500 |
| 0.2310 + 0.0957i | 0.2310 + 0.0957i | 0.2310 + 0.0957i | 0.2079 + 0.1389i |
| 0.1768 + 0.1768i | 0.1768 + 0.1768i | 0.1768 + 0.1768i | 0.0957 + 0.2310i |
| 0.0957 + 0.2310i | 0.0957 + 0.2310i | 0.0957 + 0.2310i | −0.0488 + 0.2452i |
| 0 + 0.2500i | 0 − 0.2500i | 0 + 0.2500i | 0 − 0.2500i |
| −0.0957 + 0.2310i | 0.0957 − 0.2310i | −0.0957 + 0.2310i | 0.1389 − 0.2079i |
| −0.1768 + 0.1768i | 0.1768 − 0.1768i | −0.1768 + 0.1768i | 0.2310 − 0.0957i |
| −0.2310 + 0.0957i | 0.2310 − 0.0957i | −0.2310 + 0.0957i | 0.2452 + 0.0488i |
| ans(:, :, 3, 2) = | | ans(:, :, 3, 10) = | |
| 0.2500 | 0.2500 | 0.2500 | 0.2500 |
| 0.1768 + 0.1768i | 0.1768 + 0.1768i | 0.1768 + 0.1768i | 0.1389 + 0.2079i |
| 0.0000 + 0.2500i | 0.0000 + 0.2500i | 0.0000 + 0.2500i | −0.0957 + 0.2310i |
| −0.1768 + 0.1768i | −0.1768 + 0.1768i | −0.1768 + 0.1768i | −0.2452 + 0.0488i |
| 0 + 0.2500i | 0 − 0.2500i | 0 + 0.2500i | 0 − 0.2500i |
| −0.1768 + 0.1768i | 0.1768 − 0.1768i | −0.1768 + 0.1768i | 0.2079 − 0.1389i |
| −0.2500 + 0.0000i | 0.2500 − 0.0000i | −0.2500 + 0.0000i | 0.2310 + 0.0957i |
| −0.1768 − 0.1768i | 0.1768 + 0.1768i | −0.1768 − 0.1768i | 0.0488 + 0.2452i |
| ans(:, :, 4, 2) = | | ans(:, :, 4, 10) = | |
| 0.2500 | 0.2500 | 0.2500 | 0.2500 |
| 0.0957 + 0.2310i | 0.0957 + 0.2310i | 0.0957 + 0.2310i | 0.0488 + 0.2452i |
| −0.1768 + 0.1768i | −0.1768 + 0.1768i | −0.1768 + 0.1768i | −0.2310 + 0.0957i |
| −0.2310 − 0.0957i | −0.2310 − 0.0957i | −0.2310 − 0.0957i | −0.1389 − 0.2079i |
| 0 + 0.2500i | 0 − 0.2500i | 0 + 0.2500i | 0 − 0.2500i |
| −0.2310 + 0.0957i | 0.2310 − 0.0957i | −0.2310 + 0.0957i | 0.2452 − 0.0488i |
| −0.1768 − 0.1768i | 0.1768 + 0.1768i | −0.1768 − 0.1768i | 0.0957 + 0.2310i |
| 0.0957 − 0.2310i | −0.0957 + 0.2310i | 0.0957 − 0.2310i | −0.2079 + 0.1389i |
| ans(:, :, 5, 2) = | | ans(:, :, 5, 10) = | |
| 0.2500 | 0.2500 | 0.2500 | 0.2500 |
| 0.0000 + 0.2500i | 0.0000 + 0.2500i | 0.0000 + 0.2500i | −0.0488 + 0.2452i |
| −0.2500 + 0.0000i | −0.2500 + 0.0000i | −0.2500 + 0.0000i | −0.2310 − 0.0957i |
| −0.0000 − 0.2500i | −0.0000 − 0.2500i | −0.0000 − 0.2500i | 0.1389 − 0.2079i |
| 0 + 0.2500i | 0 − 0.2500i | 0 + 0.2500i | 0 − 0.2500i |
| −0.2500 + 0.0000i | 0.2500 − 0.0000i | −0.2500 + 0.0000i | 0.2452 + 0.0488i |
| −0.0000 − 0.2500i | 0.0000 + 0.2500i | −0.0000 − 0.2500i | −0.0957 + 0.2310i |
| 0.2500 − 0.0000i | −0.2500 + 0.0000i | 0.2500 − 0.0000i | −0.2079 − 0.1389i |
| ans(:, :, 6, 2) = | | ans(:, :, 6, 10) = | |
| 0.2500 | 0.2500 | 0.2500 | 0.2500 |
| −0.0957 + 0.2310i | −0.0957 + 0.2310i | −0.0957 + 0.2310i | −0.1389 + 0.2079i |
| −0.1768 − 0.1768i | −0.1768 − 0.1768i | −0.1768 − 0.1768i | −0.0957 − 0.2310i |
| 0.2310 − 0.0957i | 0.2310 − 0.0957i | 0.2310 − 0.0957i | 0.2452 + 0.0488i |
| 0 + 0.2500i | 0 − 0.2500i | 0 + 0.2500i | 0 − 0.2500i |
| −0.2310 − 0.0957i | 0.2310 + 0.0957i | −0.2310 − 0.0957i | 0.2079 + 0.1389i |
| 0.1768 − 0.1768i | −0.1768 + 0.1768i | 0.1768 − 0.1768i | −0.2310 + 0.0957i |
| 0.0957 + 0.2310i | −0.0957 − 0.2310i | 0.0957 + 0.2310i | 0.0488 − 0.2452i |
| ans(:, :, 7, 2) = | | ans(:, :, 7, 10) = | |
| 0.2500 | 0.2500 | 0.2500 | 0.2500 |
| −0.1768 + 0.1768i | −0.1768 + 0.1768i | −0.1768 + 0.1768i | −0.2079 + 0.1389i |
| −0.0000 − 0.2500i | −0.0000 − 0.2500i | −0.0000 − 0.2500i | 0.0957 − 0.2310i |
| 0.1768 + 0.1768i | 0.1768 + 0.1768i | 0.1768 + 0.1768i | 0.0488 + 0.2452i |
| 0 + 0.2500i | 0 − 0.2500i | 0 + 0.2500i | 0 − 0.2500i |
| −0.1768 − 0.1768i | 0.1768 + 0.1768i | −0.1768 − 0.1768i | 0.1389 + 0.2079i |
| 0.2500 − 0.0000i | −0.2500 + 0.0000i | 0.2500 − 0.0000i | −0.2310 − 0.0957i |
| −0.1768 + 0.1768i | 0.1768 − 0.1768i | −0.1768 + 0.1768i | 0.2452 − 0.0488i |
| ans(:, :, 8, 2) = | | ans(:, :, 8, 10) = | |
| 0.2500 | 0.2500 | 0.2500 | 0.2500 |
| −0.2310 + 0.0957i | −0.2310 + 0.0957i | −0.2310 + 0.0957i | −0.2452 + 0.0488i |
| 0.1768 − 0.1768i | 0.1768 − 0.1768i | 0.1768 − 0.1768i | 0.2310 − 0.0957i |
| −0.0957 + 0.2310i | −0.0957 + 0.2310i | −0.0957 + 0.2310i | −0.2079 + 0.1389i |
| 0 + 0.2500i | 0 − 0.2500i | 0 + 0.2500i | 0 − 0.2500i |
| −0.0957 − 0.2310i | 0.0957 + 0.2310i | −0.0957 − 0.2310i | 0.0488 + 0.2452i |
| 0.1768 + 0.1768i | −0.1768 − 0.1768i | 0.1768 + 0.1768i | −0.0957 − 0.2310i |
| −0.2310 − 0.0957i | 0.2310 + 0.0957i | −0.2310 − 0.0957i | 0.1389 + 0.2079i |

TABLE 2-continued

| ans(:, :, 9, 2) = | | ans(:, :, 9, 10) = | |
|---|---|---|---|
| 0.2500 | 0.2500 | 0.2500 | 0.2500 |
| −0.2500 + 0.0000i | −0.2500 + 0.0000i | −0.2500 + 0.0000i | −0.2452 − 0.0488i |
| 0.2500 − 0.0000i | 0.2500 − 0.0000i | 0.2500 − 0.0000i | 0.2310 + 0.0957i |
| −0.2500 + 0.0000i | −0.2500 + 0.0000i | −0.2500 + 0.0000i | −0.2079 − 0.1389i |
| 0 + 0.2500i | 0 − 0.2500i | 0 + 0.2500i | 0 − 0.2500i |
| −0.0000 − 0.2500i | 0.0000 + 0.2500i | −0.0000 − 0.2500i | −0.0488 + 0.2452i |
| 0.0000 + 0.2500i | −0.0000 − 0.2500i | 0.0000 + 0.2500i | 0.0957 − 0.2310i |
| −0.0000 − 0.2500i | 0.0000 + 0.2500i | −0.0000 − 0.2500i | −0.1389 + 0.2079i |
| **ans(:, :, 10, 2) =** | | **ans(:, :, 10, 10) =** | |
| 0.2500 | 0.2500 | 0.2500 | 0.2500 |
| −0.2310 − 0.0957i | −0.2310 − 0.0957i | −0.2310 − 0.0957i | −0.2079 − 0.1389i |
| 0.1768 + 0.1768i | 0.1768 + 0.1768i | 0.1768 + 0.1768i | 0.0957 + 0.2310i |
| −0.0957 − 0.2310i | −0.0957 − 0.2310i | −0.0957 − 0.2310i | 0.0488 − 0.2452i |
| 0 + 0.2500i | 0 − 0.2500i | 0 + 0.2500i | 0 − 0.2500i |
| 0.0957 − 0.2310i | −0.0957 + 0.2310i | 0.0957 − 0.2310i | −0.1389 + 0.2079i |
| −0.1768 + 0.1768i | 0.1768 − 0.1768i | −0.1768 + 0.1768i | 0.2310 − 0.0957i |
| 0.2310 − 0.0957i | −0.2310 + 0.0957i | 0.2310 − 0.0957i | −0.2452 − 0.0488i |
| **ans(:, :, 11, 2) =** | | **ans(:, :, 11, 10) =** | |
| 0.2500 | 0.2500 | 0.2500 | 0.2500 |
| −0.1768 − 0.1768i | −0.1768 − 0.1768i | −0.1768 − 0.1768i | −0.1389 − 0.2079i |
| 0.0000 + 0.2500i | 0.0000 + 0.2500i | 0.0000 + 0.2500i | −0.0957 + 0.2310i |
| 0.1768 − 0.1768i | 0.1768 − 0.1768i | 0.1768 − 0.1768i | 0.2452 − 0.0488i |
| 0 + 0.2500i | 0 − 0.2500i | 0 + 0.2500i | 0 − 0.2500i |
| 0.1768 − 0.1768i | −0.1768 + 0.1768i | 0.1768 − 0.1768i | −0.2079 + 0.1389i |
| −0.2500 + 0.0000i | 0.2500 − 0.0000i | −0.2500 + 0.0000i | 0.2310 + 0.0957i |
| 0.1768 + 0.1768i | −0.1768 − 0.1768i | 0.1768 + 0.1768i | −0.0488 − 0.2452i |
| **ans(:, :, 12, 2) =** | | **ans(:, :, 12, 10) =** | |
| 0.2500 | 0.2500 | 0.2500 | 0.2500 |
| −0.0957 − 0.2310i | −0.0957 − 0.2310i | −0.0957 − 0.2310i | −0.0488 − 0.2452i |
| −0.1768 + 0.1768i | −0.1768 + 0.1768i | −0.1768 + 0.1768i | −0.2310 + 0.0957i |
| 0.2310 + 0.0957i | 0.2310 + 0.0957i | 0.2310 + 0.0957i | 0.1389 + 0.2079i |
| 0 + 0.2500i | 0 − 0.2500i | 0 + 0.2500i | 0 − 0.2500i |
| 0.2310 − 0.0957i | −0.2310 + 0.0957i | 0.2310 − 0.0957i | −0.2452 + 0.0488i |
| −0.1768 − 0.1768i | 0.1768 + 0.1768i | −0.1768 − 0.1768i | 0.0957 + 0.2310i |
| −0.0957 + 0.2310i | 0.0957 − 0.2310i | −0.0957 + 0.2310i | 0.2079 − 0.1389i |
| **ans(:, :, 13, 2) =** | | **ans(:, :, 13, 10) =** | |
| 0.2500 | 0.2500 | 0.2500 | 0.2500 |
| −0.0000 − 0.2500i | −0.0000 − 0.2500i | −0.0000 − 0.2500i | 0.0488 − 0.2452i |
| −0.2500 + 0.0000i | −0.2500 + 0.0000i | −0.2500 + 0.0000i | −0.2310 − 0.0957i |
| 0.0000 + 0.2500i | 0.0000 + 0.2500i | 0.0000 + 0.2500i | −0.1389 + 0.2079i |
| 0 + 0.2500i | 0 − 0.2500i | 0 + 0.2500i | 0 − 0.2500i |
| 0.2500 − 0.0000i | −0.2500 + 0.0000i | 0.2500 − 0.0000i | −0.2452 − 0.0488i |
| −0.0000 − 0.2500i | 0.0000 + 0.2500i | −0.0000 − 0.2500i | −0.0957 + 0.2310i |
| −0.2500 + 0.0000i | 0.2500 − 0.0000i | −0.2500 + 0.0000i | 0.2079 + 0.1389i |
| **ans(:, :, 14, 2) =** | | **ans(:, :, 14, 10) =** | |
| 0.2500 | 0.2500 | 0.2500 | 0.2500 |
| 0.0957 − 0.2310i | 0.0957 − 0.2310i | 0.0957 − 0.2310i | 0.1389 − 0.2079i |
| −0.1768 − 0.1768i | −0.1768 − 0.1768i | −0.1768 − 0.1768i | −0.0957 − 0.2310i |
| −0.2310 + 0.0957i | −0.2310 + 0.0957i | −0.2310 + 0.0957i | −0.2452 − 0.0488i |
| 0 + 0.2500i | 0 − 0.2500i | 0 + 0.2500i | 0 − 0.2500i |
| 0.2310 + 0.0957i | −0.2310 − 0.0957i | 0.2310 + 0.0957i | −0.2079 − 0.1389i |
| 0.1768 − 0.1768i | −0.1768 + 0.1768i | 0.1768 − 0.1768i | −0.2310 + 0.0957i |
| −0.0957 − 0.2310i | 0.0957 + 0.2310i | −0.0957 − 0.2310i | −0.0488 + 0.2452i |
| **ans(:, :, 15, 2) =** | | **ans(:, :, 15, 10) =** | |
| 0.2500 | 0.2500 | 0.2500 | 0.2500 |
| 0.1768 − 0.1768i | 0.1768 − 0.1768i | 0.1768 − 0.1768i | 0.2079 − 0.1389i |
| −0.0000 − 0.2500i | −0.0000 − 0.2500i | −0.0000 − 0.2500i | 0.0957 − 0.2310i |
| −0.1768 − 0.1768i | −0.1768 − 0.1768i | −0.1768 − 0.1768i | −0.0488 − 0.2452i |
| 0 + 0.2500i | 0 − 0.2500i | 0 + 0.2500i | 0 − 0.2500i |
| 0.1768 + 0.1768i | −0.1768 − 0.1768i | 0.1768 + 0.1768i | −0.1389 − 0.2079i |
| 0.2500 − 0.0000i | −0.2500 + 0.0000i | 0.2500 − 0.0000i | −0.2310 − 0.0957i |
| 0.1768 − 0.1768i | −0.1768 + 0.1768i | 0.1768 − 0.1768i | −0.2452 + 0.0488i |

TABLE 2-continued

| ans(:, :, 16, 2) = | | ans(:, :, 16, 10) = | |
|---|---|---|---|
| 0.2500 | 0.2500 | 0.2500 | 0.2500 |
| 0.2310 − 0.0957i | 0.2310 − 0.0957i | 0.2310 − 0.0957i | 0.2452 − 0.0488i |
| 0.1768 − 0.1768i | 0.1768 − 0.1768i | 0.1768 − 0.1768i | 0.2310 − 0.0957i |
| 0.0957 − 0.2310i | 0.0957 − 0.2310i | 0.0957 − 0.2310i | 0.2079 − 0.1389i |
| 0 + 0.2500i | 0 − 0.2500i | 0 + 0.2500i | 0 − 0.2500i |
| 0.0957 + 0.2310i | −0.0957 − 0.2310i | 0.0957 + 0.2310i | −0.0488 − 0.2452i |
| 0.1768 + 0.1768i | −0.1768 − 0.1768i | 0.1768 + 0.1768i | −0.0957 − 0.2310i |
| 0.2310 + 0.0957i | −0.2310 − 0.0957i | 0.2310 + 0.0957i | −0.1389 − 0.2079i |
| ans(:, :, 1, 3) = | | ans(:, :, 1, 11) = | |
| 0.2500 | 0.2500 | 0.2500 | 0.2500 |
| 0.2452 + 0.0488i | 0.2452 + 0.0488i | 0.2452 + 0.0488i | 0.2310 + 0.0957i |
| 0.2310 + 0.0957i | 0.2310 + 0.0957i | 0.2310 + 0.0957i | 0.1768 + 0.1768i |
| 0.2079 + 0.1389i | 0.2079 + 0.1389i | 0.2079 + 0.1389i | 0.0957 + 0.2310i |
| 0.2500 | −0.2500 | 0.2500 | −0.2500 |
| 0.2452 + 0.0488i | −0.2452 − 0.0488i | 0.2452 + 0.0488i | −0.2310 − 0.0957i |
| 0.2310 + 0.0957i | −0.2310 − 0.0957i | 0.2310 + 0.0957i | −0.1768 − 0.1768i |
| 0.2079 + 0.1389i | −0.2079 − 0.1389i | 0.2079 + 0.1389i | −0.0957 − 0.2310i |
| ans(:, :, 2, 3) = | | ans(:, :, 2, 11) = | |
| 0.2500 | 0.2500 | 0.2500 | 0.2500 |
| 0.2079 + 0.1389i | 0.2079 + 0.1389i | 0.2079 + 0.1389i | 0.1768 + 0.1768i |
| 0.0957 + 0.2310i | 0.0957 + 0.2310i | 0.0957 + 0.2310i | 0.0000 + 0.2500i |
| −0.0488 + 0.2452i | −0.0488 + 0.2452i | −0.0488 + 0.2452i | −0.1768 + 0.1768i |
| 0.2500 | −0.2500 | 0.2500 | −0.2500 |
| 0.2079 + 0.1389i | −0.2079 − 0.1389i | 0.2079 + 0.1389i | −0.1768 − 0.1768i |
| 0.0957 + 0.2310i | −0.0957 − 0.2310i | 0.0957 + 0.2310i | −0.0000 − 0.2500i |
| −0.0488 + 0.2452i | 0.0488 − 0.2452i | −0.0488 + 0.2452i | 0.1768 − 0.1768i |
| ans(:, :, 3, 3) = | | ans(:, :, 3, 11) = | |
| 0.2500 | 0.2500 | 0.2500 | 0.2500 |
| 0.1389 + 0.2079i | 0.1389 + 0.2079i | 0.1389 + 0.2079i | 0.0957 + 0.2310i |
| −0.0957 + 0.2310i | −0.0957 + 0.2310i | −0.0957 + 0.2310i | −0.1768 + 0.1768i |
| −0.2452 + 0.0488i | −0.2452 + 0.0488i | −0.2452 + 0.0488i | −0.2310 − 0.0957i |
| 0.2500 | −0.2500 | 0.2500 | −0.2500 |
| 0.1389 + 0.2079i | −0.1389 − 0.2079i | 0.1389 + 0.2079i | −0.0957 − 0.2310i |
| −0.0957 + 0.2310i | 0.0957 − 0.2310i | −0.0957 + 0.2310i | 0.1768 − 0.1768i |
| −0.2452 + 0.0488i | 0.2452 − 0.0488i | −0.2452 + 0.0488i | 0.2310 + 0.0957i |
| ans(:, :, 4, 3) = | | ans(:, :, 4, 11) = | |
| 0.2500 | 0.2500 | 0.2500 | 0.2500 |
| 0.0488 + 0.2452i | 0.0488 + 0.2452i | 0.0488 + 0.2452i | 0.0000 + 0.2500i |
| −0.2310 + 0.0957i | −0.2310 + 0.0957i | −0.2310 + 0.0957i | −0.2500 + 0.0000i |
| −0.1389 − 0.2079i | −0.1389 − 0.2079i | −0.1389 − 0.2079i | −0.0000 − 0.2500i |
| 0.2500 | −0.2500 | 0.2500 | −0.2500 |
| 0.0488 + 0.2452i | −0.0488 − 0.2452i | 0.0488 + 0.2452i | −0.0000 − 0.2500i |
| −0.2310 + 0.0957i | 0.2310 − 0.0957i | −0.2310 + 0.0957i | 0.2500 − 0.0000i |
| −0.1389 − 0.2079i | 0.1389 + 0.2079i | −0.1389 − 0.2079i | 0.0000 + 0.2500i |
| ans(:, :, 5, 3) = | | ans(:, :, 5, 11) = | |
| 0.2500 | 0.2500 | 0.2500 | 0.2500 |
| −0.0488 + 0.2452i | −0.0488 + 0.2452i | −0.0488 + 0.2452i | −0.0957 + 0.2310i |
| −0.2310 − 0.0957i | −0.2310 − 0.0957i | −0.2310 − 0.0957i | −0.1768 − 0.1768i |
| 0.1389 − 0.2079i | 0.1389 − 0.2079i | 0.1389 − 0.2079i | 0.2310 − 0.0957i |
| 0.2500 | −0.2500 | 0.2500 | −0.2500 |
| −0.0488 + 0.2452i | 0.0488 − 0.2452i | −0.0488 + 0.2452i | 0.0957 − 0.2310i |
| −0.2310 − 0.0957i | 0.2310 + 0.0957i | −0.2310 − 0.0957i | 0.1768 + 0.1768i |
| 0.1389 − 0.2079i | −0.1389 + 0.2079i | 0.1389 − 0.2079i | −0.2310 + 0.0957i |
| ans(:, :, 6, 3) = | | ans(:, :, 6, 11) = | |
| 0.2500 | 0.2500 | 0.2500 | 0.2500 |
| −0.1389 + 0.2079i | −0.1389 + 0.2079i | −0.1389 + 0.2079i | −0.1768 + 0.1768i |
| −0.0957 − 0.2310i | −0.0957 − 0.2310i | −0.0957 − 0.2310i | −0.0000 − 0.2500i |
| 0.2452 + 0.0488i | 0.2452 + 0.0488i | 0.2452 + 0.0488i | 0.1768 + 0.1768i |
| 0.2500 | −0.2500 | 0.2500 | −0.2500 |
| −0.1389 + 0.2079i | 0.1389 − 0.2079i | −0.1389 + 0.2079i | 0.1768 − 0.1768i |
| −0.0957 − 0.2310i | 0.0957 + 0.2310i | −0.0957 − 0.2310i | 0.0000 + 0.2500i |
| 0.2452 + 0.0488i | −0.2452 − 0.0488i | 0.2452 + 0.0488i | −0.1768 − 0.1768i |

TABLE 2-continued

| ans(:, :, 7, 3) = | | ans(:, :, 7, 11) = | |
|---|---|---|---|
| 0.2500 | 0.2500 | 0.2500 | 0.2500 |
| −0.2079 + 0.1389i | −0.2079 + 0.1389i | −0.2079 + 0.1389i | −0.2310 + 0.0957i |
| 0.0957 − 0.2310i | 0.0957 − 0.2310i | 0.0957 − 0.2310i | 0.1768 − 0.1768i |
| 0.0488 + 0.2452i | 0.0488 + 0.2452i | 0.0488 + 0.2452i | −0.0957 + 0.2310i |
| 0.2500 | −0.2500 | 0.2500 | −0.2500 |
| −0.2079 + 0.1389i | 0.2079 − 0.1389i | −0.2079 + 0.1389i | 0.2310 − 0.0957i |
| 0.0957 − 0.2310i | −0.0957 + 0.2310i | 0.0957 − 0.2310i | −0.1768 + 0.1768i |
| 0.0488 + 0.2452i | −0.0488 − 0.2452i | 0.0488 + 0.2452i | 0.0957 − 0.2310i |
| ans(:, :, 8, 3) = | | ans(:, :, 8, 11) = | |
| 0.2500 | 0.2500 | 0.2500 | 0.2500 |
| −0.2452 + 0.0488i | −0.2452 + 0.0488i | −0.2452 + 0.0488i | −0.2500 + 0.0000i |
| 0.2310 − 0.0957i | 0.2310 − 0.0957i | 0.2310 − 0.0957i | 0.2500 − 0.0000i |
| −0.2079 + 0.1389i | −0.2079 + 0.1389i | −0.2079 + 0.1389i | −0.2500 + 0.0000i |
| 0.2500 | −0.2500 | 0.2500 | −0.2500 |
| −0.2452 + 0.0488i | 0.2452 − 0.0488i | −0.2452 + 0.0488i | 0.2500 − 0.0000i |
| 0.2310 − 0.0957i | −0.2310 + 0.0957i | 0.2310 − 0.0957i | −0.2500 + 0.0000i |
| −0.2079 + 0.1389i | 0.2079 − 0.1389i | −0.2079 + 0.1389i | 0.2500 − 0.0000i |
| ans(:, :, 9, 3) = | | ans(:, :, 9, 11) = | |
| 0.2500 | 0.2500 | 0.2500 | 0.2500 |
| −0.2452 − 0.0488i | −0.2452 − 0.0488i | −0.2452 − 0.0488i | −0.2310 − 0.0957i |
| 0.2310 + 0.0957i | 0.2310 + 0.0957i | 0.2310 + 0.0957i | 0.1768 + 0.1768i |
| −0.2079 − 0.1389i | −0.2079 − 0.1389i | −0.2079 − 0.1389i | −0.0957 − 0.2310i |
| 0.2500 | −0.2500 | 0.2500 | −0.2500 |
| −0.2452 − 0.0488i | 0.2452 + 0.0488i | −0.2452 − 0.0488i | 0.2310 + 0.0957i |
| 0.2310 + 0.0957i | −0.2310 − 0.0957i | 0.2310 + 0.0957i | −0.1768 − 0.1768i |
| −0.2079 − 0.1389i | 0.2079 + 0.1389i | −0.2079 − 0.1389i | 0.0957 + 0.2310i |
| ans(:, :, 10, 3) = | | ans(:, :, 10, 11) = | |
| 0.2500 | 0.2500 | 0.2500 | 0.2500 |
| −0.2079 − 0.1389i | −0.2079 − 0.1389i | −0.2079 − 0.1389i | −0.1768 − 0.1768i |
| 0.0957 + 0.2310i | 0.0957 + 0.2310i | 0.0957 + 0.2310i | 0.0000 + 0.2500i |
| 0.0488 − 0.2452i | 0.0488 − 0.2452i | 0.0488 − 0.2452i | 0.1768 − 0.1768i |
| 0.2500 | −0.2500 | 0.2500 | −0.2500 |
| −0.2079 − 0.1389i | 0.2079 + 0.1389i | −0.2079 − 0.1389i | 0.1768 + 0.1768i |
| 0.0957 + 0.2310i | −0.0957 − 0.2310i | 0.0957 + 0.2310i | −0.0000 − 0.2500i |
| 0.0488 − 0.2452i | −0.0488 + 0.2452i | 0.0488 − 0.2452i | −0.1768 + 0.1768i |
| ans(:, :, 11, 3) = | | ans(:, :, 11, 11) = | |
| 0.2500 | 0.2500 | 0.2500 | 0.2500 |
| −0.1389 − 0.2079i | −0.1389 − 0.2079i | −0.1389 − 0.2079i | −0.0957 − 0.2310i |
| −0.0957 + 0.2310i | −0.0957 + 0.2310i | −0.0957 + 0.2310i | −0.1768 + 0.1768i |
| 0.2452 − 0.0488i | 0.2452 − 0.0488i | 0.2452 − 0.0488i | 0.2310 + 0.0957i |
| 0.2500 | −0.2500 | 0.2500 | −0.2500 |
| −0.1389 − 0.2079i | 0.1389 + 0.2079i | −0.1389 − 0.2079i | 0.0957 + 0.2310i |
| −0.0957 + 0.2310i | 0.0957 − 0.2310i | −0.0957 + 0.2310i | 0.1768 − 0.1768i |
| 0.2452 − 0.0488i | −0.2452 + 0.0488i | 0.2452 − 0.0488i | −0.2310 − 0.0957i |
| ans(:, :, 12, 3) = | | ans(:, :, 12, 11) = | |
| 0.2500 | 0.2500 | 0.2500 | 0.2500 |
| −0.0488 − 0.2452i | −0.0488 − 0.2452i | −0.0488 − 0.2452i | −0.0000 − 0.2500i |
| −0.2310 + 0.0957i | −0.2310 + 0.0957i | −0.2310 + 0.0957i | −0.2500 + 0.0000i |
| 0.1389 + 0.2079i | 0.1389 + 0.2079i | 0.1389 + 0.2079i | 0.0000 + 0.2500i |
| 0.2500 | −0.2500 | 0.2500 | −0.2500 |
| −0.0488 − 0.2452i | 0.0488 + 0.2452i | −0.0488 − 0.2452i | 0.0000 + 0.2500i |
| −0.2310 + 0.0957i | 0.2310 − 0.0957i | −0.2310 + 0.0957i | 0.2500 − 0.0000i |
| 0.1389 + 0.2079i | −0.1389 − 0.2079i | 0.1389 + 0.2079i | −0.0000 − 0.2500i |
| ans(:, :, 13, 3) = | | ans(:, :, 13, 11) = | |
| 0.2500 | 0.2500 | 0.2500 | 0.2500 |
| 0.0488 − 0.2452i | 0.0488 − 0.2452i | 0.0488 − 0.2452i | 0.0957 − 0.2310i |
| −0.2310 − 0.0957i | −0.2310 − 0.0957i | −0.2310 − 0.0957i | −0.1768 − 0.1768i |
| −0.1389 + 0.2079i | −0.1389 + 0.2079i | −0.1389 + 0.2079i | −0.2310 + 0.0957i |
| 0.2500 | −0.2500 | 0.2500 | −0.2500 |
| 0.0488 − 0.2452i | −0.0488 + 0.2452i | 0.0488 − 0.2452i | −0.0957 + 0.2310i |
| −0.2310 − 0.0957i | 0.2310 + 0.0957i | −0.2310 − 0.0957i | 0.1768 + 0.1768i |
| −0.1389 + 0.2079i | 0.1389 − 0.2079i | −0.1389 + 0.2079i | 0.2310 − 0.0957i |

TABLE 2-continued

| ans(:, :, 14, 3) = | | ans(:, :, 14, 11) = | |
|---|---|---|---|
| 0.2500 | 0.2500 | 0.2500 | 0.2500 |
| 0.1389 − 0.2079i | 0.1389 − 0.2079i | 0.1389 − 0.2079i | 0.1768 − 0.1768i |
| −0.0957 − 0.2310i | −0.0957 − 0.2310i | −0.0957 − 0.2310i | −0.0000 − 0.2500i |
| −0.2452 − 0.0488i | −0.2452 − 0.0488i | −0.2452 − 0.0488i | −0.1768 − 0.1768i |
| 0.2500 | −0.2500 | 0.2500 | −0.2500 |
| 0.1389 − 0.2079i | −0.1389 + 0.2079i | 0.1389 − 0.2079i | −0.1768 + 0.1768i |
| −0.0957 − 0.2310i | 0.0957 + 0.2310i | −0.0957 − 0.2310i | 0.0000 + 0.2500i |
| −0.2452 − 0.0488i | 0.2452 + 0.0488i | −0.2452 − 0.0488i | 0.1768 + 0.1768i |
| ans(:, :, 15, 3) = | | ans(:, :, 15, 11) = | |
| 0.2500 | 0.2500 | 0.2500 | 0.2500 |
| 0.2079 − 0.1389i | 0.2079 − 0.1389i | 0.2079 − 0.1389i | 0.2310 − 0.0957i |
| 0.0957 − 0.2310i | 0.0957 − 0.2310i | 0.0957 − 0.2310i | 0.1768 − 0.1768i |
| −0.0488 − 0.2452i | −0.0488 − 0.2452i | −0.0488 − 0.2452i | 0.0957 − 0.2310i |
| 0.2500 | −0.2500 | 0.2500 | −0.2500 |
| 0.2079 − 0.1389i | −0.2079 + 0.1389i | 0.2079 − 0.1389i | −0.2310 + 0.0957i |
| 0.0957 − 0.2310i | −0.0957 + 0.2310i | 0.0957 − 0.2310i | −0.1768 + 0.1768i |
| −0.0488 − 0.2452i | 0.0488 + 0.2452i | −0.0488 − 0.2452i | −0.0957 + 0.2310i |
| ans(:, :, 16, 3) = | | ans(:, :, 16, 11) = | |
| 0.2500 | 0.2500 | 0.2500 | 0.2500 |
| 0.2452 − 0.0488i | 0.2452 − 0.0488i | 0.2452 − 0.0488i | 0.2500 |
| 0.2310 − 0.0957i | 0.2310 − 0.0957i | 0.2310 − 0.0957i | 0.2500 |
| 0.2079 − 0.1389i | 0.2079 − 0.1389i | 0.2079 − 0.1389i | 0.2500 |
| 0.2500 | −0.2500 | 0.2500 | −0.2500 |
| 0.2452 − 0.0488i | −0.2452 + 0.0488i | 0.2452 − 0.0488i | −0.2500 |
| 0.2310 − 0.0957i | −0.2310 + 0.0957i | 0.2310 − 0.0957i | −0.2500 |
| 0.2079 − 0.1389i | −0.2079 + 0.1389i | 0.2079 − 0.1389i | −0.2500 |
| ans(:, :, 1, 4) = | | ans(:, :, 1, 12) = | |
| 0.2500 | 0.2500 | 0.2500 | 0.2500 |
| 0.2452 + 0.0488i | 0.2452 + 0.0488i | 0.2452 + 0.0488i | 0.2310 + 0.0957i |
| 0.2310 + 0.0957i | 0.2310 + 0.0957i | 0.2310 + 0.0957i | 0.1768 + 0.1768i |
| 0.2079 + 0.1389i | 0.2079 + 0.1389i | 0.2079 + 0.1389i | 0.0957 + 0.2310i |
| 0 + 0.2500i | 0 − 0.2500i | 0 + 0.2500i | 0 − 0.2500i |
| −0.0488 + 0.2452i | 0.0488 − 0.2452i | −0.0488 + 0.2452i | 0.0957 − 0.2310i |
| −0.0957 + 0.2310i | 0.0957 − 0.2310i | −0.0957 + 0.2310i | 0.1768 − 0.1768i |
| −0.1389 + 0.2079i | 0.1389 − 0.2079i | −0.1389 + 0.2079i | 0.2310 − 0.0957i |
| ans(:, :, 2, 4) = | | ans(:, :, 2, 12) = | |
| 0.2500 | 0.2500 | 0.2500 | 0.2500 |
| 0.2079 + 0.1389i | 0.2079 + 0.1389i | 0.2079 + 0.1389i | 0.1768 + 0.1768i |
| 0.0957 + 0.2310i | 0.0957 + 0.2310i | 0.0957 + 0.2310i | 0.0000 + 0.2500i |
| −0.0488 + 0.2452i | −0.0488 + 0.2452i | −0.0488 + 0.2452i | −0.1768 + 0.1768i |
| 0 + 0.2500i | 0 − 0.2500i | 0 + 0.2500i | 0 − 0.2500i |
| −0.1389 + 0.2079i | 0.1389 − 0.2079i | −0.1389 + 0.2079i | 0.1768 − 0.1768i |
| −0.2310 + 0.0957i | 0.2310 − 0.0957i | −0.2310 + 0.0957i | 0.2500 − 0.0000i |
| −0.2452 − 0.0488i | 0.2452 + 0.0488i | −0.2452 − 0.0488i | 0.1768 + 0.1768i |
| ans(:, :, 3, 4) = | | ans(:, :, 3, 12) = | |
| 0.2500 | 0.2500 | 0.2500 | 0.2500 |
| 0.1389 + 0.2079i | 0.1389 + 0.2079i | 0.1389 + 0.2079i | 0.0957 + 0.2310i |
| −0.0957 + 0.2310i | −0.0957 + 0.2310i | −0.0957 + 0.2310i | −0.1768 + 0.1768i |
| −0.2452 + 0.0488i | −0.2452 + 0.0488i | −0.2452 + 0.0488i | −0.2310 − 0.0957i |
| 0 + 0.2500i | 0 − 0.2500i | 0 + 0.2500i | 0 − 0.2500i |
| −0.2079 + 0.1389i | 0.2079 − 0.1389i | −0.2079 + 0.1389i | 0.2310 − 0.0957i |
| −0.2310 − 0.0957i | 0.2310 + 0.0957i | −0.2310 − 0.0957i | 0.1768 + 0.1768i |
| −0.0488 − 0.2452i | 0.0488 + 0.2452i | −0.0488 − 0.2452i | −0.0957 + 0.2310i |
| ans(:, :, 4, 4) = | | ans(:, :, 4, 12) = | |
| 0.2500 | 0.2500 | 0.2500 | 0.2500 |
| 0.0488 + 0.2452i | 0.0488 + 0.2452i | 0.0488 + 0.2452i | 0.0000 + 0.2500i |
| −0.2310 + 0.0957i | −0.2310 + 0.0957i | −0.2310 + 0.0957i | −0.2500 + 0.0000i |
| −0.1389 − 0.2079i | −0.1389 − 0.2079i | −0.1389 − 0.2079i | −0.0000 − 0.2500i |
| 0 + 0.2500i | 0 − 0.2500i | 0 + 0.2500i | 0 − 0.2500i |
| −0.2452 + 0.0488i | 0.2452 − 0.0488i | −0.2452 + 0.0488i | 0.2500 − 0.0000i |
| −0.0957 − 0.2310i | 0.0957 + 0.2310i | −0.0957 − 0.2310i | 0.0000 + 0.2500i |
| 0.2079 − 0.1389i | −0.2079 + 0.1389i | 0.2079 − 0.1389i | −0.2500 + 0.0000i |

TABLE 2-continued

| ans(:, :, 5, 4) = | | ans(:, :, 5, 12) = | |
|---|---|---|---|
| 0.2500 | 0.2500 | 0.2500 | 0.2500 |
| −0.0488 + 0.2452i | −0.0488 + 0.2452i | −0.0488 + 0.2452i | −0.0957 + 0.2310i |
| −0.2310 − 0.0957i | −0.2310 − 0.0957i | −0.2310 − 0.0957i | −0.1768 − 0.1768i |
| 0.1389 − 0.2079i | 0.1389 − 0.2079i | 0.1389 − 0.2079i | 0.2310 − 0.0957i |
| 0 + 0.2500i | 0 − 0.2500i | 0 + 0.2500i | 0 − 0.2500i |
| −0.2452 − 0.0488i | 0.2452 + 0.0488i | −0.2452 − 0.0488i | 0.2310 + 0.0957i |
| 0.0957 − 0.2310i | −0.0957 + 0.2310i | 0.0957 − 0.2310i | −0.1768 + 0.1768i |
| 0.2079 + 0.1389i | −0.2079 − 0.1389i | 0.2079 + 0.1389i | −0.0957 − 0.2310i |
| ans(:, :, 6, 4) = | | ans(:, :, 6, 12) = | |
| 0.2500 | 0.2500 | 0.2500 | 0.2500 |
| −0.1389 + 0.2079i | −0.1389 + 0.2079i | −0.1389 + 0.2079i | −0.1768 + 0.1768i |
| −0.0957 − 0.2310i | −0.0957 − 0.2310i | −0.0957 − 0.2310i | −0.0000 − 0.2500i |
| 0.2452 + 0.0488i | 0.2452 + 0.0488i | 0.2452 + 0.0488i | 0.1768 + 0.1768i |
| 0 + 0.2500i | 0 − 0.2500i | 0 + 0.2500i | 0 − 0.2500i |
| −0.2079 − 0.1389i | 0.2079 + 0.1389i | −0.2079 − 0.1389i | 0.1768 + 0.1768i |
| 0.2310 − 0.0957i | −0.2310 + 0.0957i | 0.2310 − 0.0957i | −0.2500 + 0.0000i |
| −0.0488 + 0.2452i | 0.0488 − 0.2452i | −0.0488 + 0.2452i | 0.1768 − 0.1768i |
| ans(:, :, 7, 4) = | | ans(:, :, 7, 12) = | |
| 0.2500 | 0.2500 | 0.2500 | 0.2500 |
| −0.2079 + 0.1389i | −0.2079 + 0.1389i | −0.2079 + 0.1389i | −0.2310 + 0.0957i |
| 0.0957 − 0.2310i | 0.0957 − 0.2310i | 0.0957 − 0.2310i | 0.1768 − 0.1768i |
| 0.0488 + 0.2452i | 0.0488 + 0.2452i | 0.0488 + 0.2452i | −0.0957 + 0.2310i |
| 0 + 0.2500i | 0 − 0.2500i | 0 + 0.2500i | 0 − 0.2500i |
| −0.1389 − 0.2079i | 0.1389 + 0.2079i | −0.1389 − 0.2079i | 0.0957 + 0.2310i |
| 0.2310 + 0.0957i | −0.2310 − 0.0957i | 0.2310 + 0.0957i | −0.1768 − 0.1768i |
| −0.2452 + 0.0488i | 0.2452 − 0.0488i | −0.2452 + 0.0488i | 0.2310 + 0.0957i |
| ans(:, :, 8, 4) = | | ans(:, :, 8, 12) = | |
| 0.2500 | 0.2500 | 0.2500 | 0.2500 |
| −0.2452 + 0.0488i | −0.2452 + 0.0488i | −0.2452 + 0.0488i | −0.2500 + 0.0000i |
| 0.2310 − 0.0957i | 0.2310 − 0.0957i | 0.2310 − 0.0957i | 0.2500 − 0.0000i |
| −0.2079 + 0.1389i | −0.2079 + 0.1389i | −0.2079 + 0.1389i | −0.2500 + 0.0000i |
| 0 + 0.2500i | 0 − 0.2500i | 0 + 0.2500i | 0 − 0.2500i |
| −0.0488 − 0.2452i | 0.0488 + 0.2452i | −0.0488 − 0.2452i | 0.0000 + 0.2500i |
| 0.0957 + 0.2310i | −0.0957 − 0.2310i | 0.0957 + 0.2310i | −0.0000 − 0.2500i |
| −0.1389 − 0.2079i | 0.1389 + 0.2079i | −0.1389 − 0.2079i | 0.0000 + 0.2500i |
| ans(:, :, 9, 4) = | | ans(:, :, 9, 12) = | |
| 0.2500 | 0.2500 | 0.2500 | 0.2500 |
| −0.2452 − 0.0488i | −0.2452 − 0.0488i | −0.2452 − 0.0488i | −0.2310 − 0.0957i |
| 0.2310 + 0.0957i | 0.2310 + 0.0957i | 0.2310 + 0.0957i | 0.1768 + 0.1768i |
| −0.2079 − 0.1389i | −0.2079 − 0.1389i | −0.2079 − 0.1389i | −0.0957 − 0.2310i |
| 0 + 0.2500i | 0 − 0.2500i | 0 + 0.2500i | 0 − 0.2500i |
| 0.0488 − 0.2452i | −0.0488 + 0.2452i | 0.0488 − 0.2452i | −0.0957 + 0.2310i |
| −0.0957 + 0.2310i | 0.0957 − 0.2310i | −0.0957 + 0.2310i | 0.1768 − 0.1768i |
| 0.1389 − 0.2079i | −0.1389 + 0.2079i | 0.1389 − 0.2079i | −0.2310 + 0.0957i |
| ans(:, :, 10, 4) = | | ans(:, :, 10, 12) = | |
| 0.2500 | 0.2500 | 0.2500 | 0.2500 |
| −0.2079 − 0.1389i | −0.2079 − 0.1389i | −0.2079 − 0.1389i | −0.1768 − 0.1768i |
| 0.0957 + 0.2310i | 0.0957 + 0.2310i | 0.0957 + 0.2310i | 0.0000 + 0.2500i |
| 0.0488 − 0.2452i | 0.0488 − 0.2452i | 0.0488 − 0.2452i | 0.1768 − 0.1768i |
| 0 + 0.2500i | 0 − 0.2500i | 0 + 0.2500i | 0 − 0.2500i |
| 0.1389 − 0.2079i | −0.1389 + 0.2079i | 0.1389 − 0.2079i | −0.1768 + 0.1768i |
| −0.2310 + 0.0957i | 0.2310 − 0.0957i | −0.2310 + 0.0957i | 0.2500 − 0.0000i |
| 0.2452 + 0.0488i | −0.2452 − 0.0488i | 0.2452 + 0.0488i | −0.1768 − 0.1768i |
| ans(:, :, 11, 4) = | | ans(:, :, 11, 12) = | |
| 0.2500 | 0.2500 | 0.2500 | 0.2500 |
| −0.1389 − 0.2079i | −0.1389 − 0.2079i | −0.1389 − 0.2079i | −0.0957 − 0.2310i |
| −0.0957 + 0.2310i | −0.0957 + 0.2310i | −0.0957 + 0.2310i | −0.1768 + 0.1768i |
| 0.2452 − 0.0488i | 0.2452 − 0.0488i | 0.2452 − 0.0488i | 0.2310 + 0.0957i |
| 0 + 0.2500i | 0 − 0.2500i | 0 + 0.2500i | 0 − 0.2500i |
| 0.2079 − 0.1389i | −0.2079 + 0.1389i | 0.2079 − 0.1389i | −0.2310 + 0.0957i |
| −0.2310 − 0.0957i | 0.2310 + 0.0957i | −0.2310 − 0.0957i | 0.1768 + 0.1768i |
| 0.0488 + 0.2452i | −0.0488 − 0.2452i | 0.0488 + 0.2452i | 0.0957 − 0.2310i |

TABLE 2-continued

| ans(:, :, 12, 4) = | | ans(:, :, 12, 12) = | |
|---|---|---|---|
| 0.2500 | 0.2500 | 0.2500 | 0.2500 |
| −0.0488 − 0.2452i | −0.0488 − 0.2452i | −0.0488 − 0.2452i | −0.0000 − 0.2500i |
| −0.2310 + 0.0957i | −0.2310 + 0.0957i | −0.2310 + 0.0957i | −0.2500 + 0.0000i |
| 0.1389 + 0.2079i | 0.1389 + 0.2079i | 0.1389 + 0.2079i | 0.0000 + 0.2500i |
| 0 + 0.2500i | 0 − 0.2500i | 0 + 0.2500i | 0 − 0.2500i |
| 0.2452 − 0.0488i | −0.2452 + 0.0488i | 0.2452 − 0.0488i | −0.2500 + 0.0000i |
| −0.0957 − 0.2310i | 0.0957 + 0.2310i | −0.0957 − 0.2310i | 0.0000 + 0.2500i |
| −0.2079 + 0.1389i | 0.2079 − 0.1389i | −0.2079 + 0.1389i | 0.2500 − 0.0000i |
| **ans(:, :, 13, 4) =** | | **ans(:, :, 13, 12) =** | |
| 0.2500 | 0.2500 | 0.2500 | 0.2500 |
| 0.0488 − 0.2452i | 0.0488 − 0.2452i | 0.0488 − 0.2452i | 0.0957 − 0.2310i |
| −0.2310 − 0.0957i | −0.2310 − 0.0957i | −0.2310 − 0.0957i | −0.1768 − 0.1768i |
| −0.1389 + 0.2079i | −0.1389 + 0.2079i | −0.1389 + 0.2079i | −0.2310 + 0.0957i |
| 0 + 0.2500i | 0 − 0.2500i | 0 + 0.2500i | 0 − 0.2500i |
| 0.2452 + 0.0488i | −0.2452 − 0.0488i | 0.2452 + 0.0488i | −0.2310 − 0.0957i |
| 0.0957 − 0.2310i | −0.0957 + 0.2310i | 0.0957 − 0.2310i | −0.1768 + 0.1768i |
| −0.2079 − 0.1389i | 0.2079 + 0.1389i | −0.2079 − 0.1389i | 0.0957 + 0.2310i |
| **ans(:, :, 14, 4) =** | | **ans(:, :, 14, 12) =** | |
| 0.2500 | 0.2500 | 0.2500 | 0.2500 |
| 0.1389 − 0.2079i | 0.1389 − 0.2079i | 0.1389 − 0.2079i | 0.1768 − 0.1768i |
| −0.0957 − 0.2310i | −0.0957 − 0.2310i | −0.0957 − 0.2310i | −0.0000 − 0.2500i |
| −0.2452 − 0.0488i | −0.2452 − 0.0488i | −0.2452 − 0.0488i | −0.1768 − 0.1768i |
| 0 + 0.2500i | 0 − 0.2500i | 0 + 0.2500i | 0 − 0.2500i |
| 0.2079 + 0.1389i | −0.2079 − 0.1389i | 0.2079 + 0.1389i | −0.1768 − 0.1768i |
| 0.2310 − 0.0957i | −0.2310 + 0.0957i | 0.2310 − 0.0957i | −0.2500 + 0.0000i |
| 0.0488 − 0.2452i | −0.0488 + 0.2452i | 0.0488 − 0.2452i | −0.1768 + 0.1768i |
| **ans(:, :, 15, 4) =** | | **ans(:, :, 15, 12) =** | |
| 0.2500 | 0.2500 | 0.2500 | 0.2500 |
| 0.2079 − 0.1389i | 0.2079 − 0.1389i | 0.2079 − 0.1389i | 0.2310 − 0.0957i |
| 0.0957 − 0.2310i | 0.0957 − 0.2310i | 0.0957 − 0.2310i | 0.1768 − 0.1768i |
| −0.0488 − 0.2452i | −0.0488 − 0.2452i | −0.0488 − 0.2452i | 0.0957 − 0.2310i |
| 0 + 0.2500i | 0 − 0.2500i | 0 + 0.2500i | 0 − 0.2500i |
| 0.1389 + 0.2079i | −0.1389 − 0.2079i | 0.1389 + 0.2079i | −0.0957 − 0.2310i |
| 0.2310 + 0.0957i | −0.2310 − 0.0957i | 0.2310 + 0.0957i | −0.1768 − 0.1768i |
| 0.2452 − 0.0488i | −0.2452 + 0.0488i | 0.2452 − 0.0488i | −0.2310 − 0.0957i |
| **ans(:, :, 16, 4) =** | | **ans(:, :, 16, 12) =** | |
| 0.2500 | 0.2500 | 0.2500 | 0.2500 |
| 0.2452 − 0.0488i | 0.2452 − 0.0488i | 0.2452 − 0.0488i | 0.2500 |
| 0.2310 − 0.0957i | 0.2310 − 0.0957i | 0.2310 − 0.0957i | 0.2500 |
| 0.2079 − 0.1389i | 0.2079 − 0.1389i | 0.2079 − 0.1389i | 0.2500 |
| 0 + 0.2500i | 0 − 0.2500i | 0 + 0.2500i | 0 − 0.2500i |
| 0.0488 + 0.2452i | −0.0488 − 0.2452i | 0.0488 + 0.2452i | 0 − 0.2500i |
| 0.0957 + 0.2310i | −0.0957 − 0.2310i | 0.0957 + 0.2310i | 0 − 0.2500i |
| 0.1389 + 0.2079i | −0.1389 − 0.2079i | 0.1389 + 0.2079i | 0 − 0.2500i |
| **ans(:, :, 1, 5) =** | | **ans(:, :, 1, 13) =** | |
| 0.2500 | 0.2500 | 0.2500 | 0.2500 |
| 0.2310 + 0.0957i | 0.2310 + 0.0957i | 0.2500 | 0.2079 + 0.1389i |
| 0.1768 + 0.1768i | 0.1768 + 0.1768i | 0.2500 | 0.0957 + 0.2310i |
| 0.0957 + 0.2310i | 0.0957 + 0.2310i | 0.2500 | −0.0488 + 0.2452i |
| 0.2500 | −0.2500 | 0.2500 | −0.2500 |
| 0.2310 + 0.0957i | −0.2310 − 0.0957i | 0.2500 | −0.2079 − 0.1389i |
| 0.1768 + 0.1768i | −0.1768 − 0.1768i | 0.2500 | −0.0957 − 0.2310i |
| 0.0957 + 0.2310i | −0.0957 − 0.2310i | 0.2500 | 0.0488 − 0.2452i |
| **ans(:, :, 2, 5) =** | | **ans(:, :, 2, 13) =** | |
| 0.2500 | 0.2500 | 0.2500 | 0.2500 |
| 0.1768 + 0.1768i | 0.1768 + 0.1768i | 0.2310 + 0.0957i | 0.1389 + 0.2079i |
| 0.0000 + 0.2500i | 0.0000 + 0.2500i | 0.1768 + 0.1768i | −0.0957 + 0.2310i |
| −0.1768 + 0.1768i | −0.1768 + 0.1768i | 0.0957 + 0.2310i | −0.2452 + 0.0488i |
| 0.2500 | −0.2500 | 0.2500 | −0.2500 |
| 0.1768 + 0.1768i | −0.1768 − 0.1768i | 0.2310 + 0.0957i | −0.1389 − 0.2079i |
| 0.0000 + 0.2500i | −0.0000 − 0.2500i | 0.1768 + 0.1768i | 0.0957 − 0.2310i |
| −0.1768 + 0.1768i | 0.1768 − 0.1768i | 0.0957 + 0.2310i | 0.2452 − 0.0488i |

TABLE 2-continued

| ans(:, :, 3, 5) = | | ans(:, :, 3, 13) = | |
|---|---|---|---|
| 0.2500 | 0.2500 | 0.2500 | 0.2500 |
| 0.0957 + 0.2310i | 0.0957 + 0.2310i | 0.1768 + 0.1768i | 0.0488 + 0.2452i |
| −0.1768 + 0.1768i | −0.1768 + 0.1768i | 0.0000 + 0.2500i | −0.2310 + 0.0957i |
| −0.2310 − 0.0957i | −0.2310 − 0.0957i | −0.1768 + 0.1768i | −0.1389 − 0.2079i |
| 0.2500 | −0.2500 | 0.2500 | −0.2500 |
| 0.0957 + 0.2310i | −0.0957 − 0.2310i | 0.1768 + 0.1768i | −0.0488 − 0.2452i |
| −0.1768 + 0.1768i | 0.1768 − 0.1768i | 0.0000 + 0.2500i | 0.2310 − 0.0957i |
| −0.2310 − 0.0957i | 0.2310 + 0.0957i | −0.1768 + 0.1768i | 0.1389 + 0.2079i |
| ans(:, :, 4, 5) = | | ans(:, :, 4, 13) = | |
| 0.2500 | 0.2500 | 0.2500 | 0.2500 |
| 0.0000 + 0.2500i | 0.0000 + 0.2500i | 0.0957 + 0.2310i | −0.0488 + 0.2452i |
| −0.2500 + 0.0000i | −0.2500 + 0.0000i | −0.1768 + 0.1768i | −0.2310 − 0.0957i |
| −0.0000 − 0.2500i | −0.0000 − 0.2500i | −0.2310 − 0.0957i | 0.1389 − 0.2079i |
| 0.2500 | −0.2500 | 0.2500 | −0.2500 |
| 0.0000 + 0.2500i | −0.0000 − 0.2500i | 0.0957 + 0.2310i | 0.0488 − 0.2452i |
| −0.2500 + 0.0000i | 0.2500 − 0.0000i | −0.1768 + 0.1768i | 0.2310 + 0.0957i |
| −0.0000 − 0.2500i | 0.0000 + 0.2500i | −0.2310 − 0.0957i | −0.1389 + 0.2079i |
| ans(:, :, 5, 5) = | | ans(:, :, 5, 13) = | |
| 0.2500 | 0.2500 | 0.2500 | 0.2500 |
| −0.0957 + 0.2310i | −0.0957 + 0.2310i | 0.0000 + 0.2500i | −0.1389 + 0.2079i |
| −0.1768 − 0.1768i | −0.1768 − 0.1768i | −0.2500 + 0.0000i | −0.0957 − 0.2310i |
| 0.2310 − 0.0957i | 0.2310 − 0.0957i | −0.0000 − 0.2500i | 0.2452 + 0.0488i |
| 0.2500 | −0.2500 | 0.2500 | −0.2500 |
| −0.0957 + 0.2310i | 0.0957 − 0.2310i | 0.0000 + 0.2500i | 0.1389 − 0.2079i |
| −0.1768 − 0.1768i | 0.1768 + 0.1768i | −0.2500 + 0.0000i | 0.0957 + 0.2310i |
| 0.2310 − 0.0957i | −0.2310 + 0.0957i | −0.0000 − 0.2500i | −0.2452 − 0.0488i |
| ans(:, :, 6, 5) = | | ans(:, :, 6, 13) = | |
| 0.2500 | 0.2500 | 0.2500 | 0.2500 |
| −0.1768 + 0.1768i | −0.1768 + 0.1768i | −0.0957 + 0.2310i | −0.2079 + 0.1389i |
| −0.0000 − 0.2500i | −0.0000 − 0.2500i | −0.1768 − 0.1768i | 0.0957 − 0.2310i |
| 0.1768 + 0.1768i | 0.1768 + 0.1768i | 0.2310 − 0.0957i | 0.0488 + 0.2452i |
| 0.2500 | −0.2500 | 0.2500 | −0.2500 |
| −0.1768 + 0.1768i | 0.1768 − 0.1768i | −0.0957 + 0.2310i | 0.2079 − 0.1389i |
| −0.0000 − 0.2500i | 0.0000 + 0.2500i | −0.1768 − 0.1768i | −0.0957 + 0.2310i |
| 0.1768 + 0.1768i | −0.1768 − 0.1768i | 0.2310 − 0.0957i | −0.0488 − 0.2452i |
| ans(:, :, 7, 5) = | | ans(:, :, 7, 13) = | |
| 0.2500 | 0.2500 | 0.2500 | 0.2500 |
| −0.2310 + 0.0957i | −0.2310 + 0.0957i | −0.1768 + 0.1768i | −0.2452 + 0.0488i |
| 0.1768 − 0.1768i | 0.1768 − 0.1768i | −0.0000 − 0.2500i | 0.2310 − 0.0957i |
| −0.0957 + 0.2310i | −0.0957 + 0.2310i | 0.1768 + 0.1768i | −0.2079 + 0.1389i |
| 0.2500 | −0.2500 | 0.2500 | −0.2500 |
| −0.2310 + 0.0957i | 0.2310 − 0.0957i | −0.1768 + 0.1768i | 0.2452 − 0.0488i |
| 0.1768 − 0.1768i | −0.1768 + 0.1768i | −0.0000 − 0.2500i | −0.2310 + 0.0957i |
| −0.0957 + 0.2310i | 0.0957 − 0.2310i | 0.1768 + 0.1768i | 0.2079 − 0.1389i |
| ans(:, :, 8, 5) = | | ans(:, :, 8, 13) = | |
| 0.2500 | 0.2500 | 0.2500 | 0.2500 |
| −0.2500 + 0.0000i | −0.2500 + 0.0000i | −0.2310 + 0.0957i | −0.2452 − 0.0488i |
| 0.2500 − 0.0000i | 0.2500 − 0.0000i | 0.1768 − 0.1768i | 0.2310 + 0.0957i |
| −0.2500 + 0.0000i | −0.2500 + 0.0000i | −0.0957 + 0.2310i | −0.2079 − 0.1389i |
| 0.2500 | −0.2500 | 0.2500 | −0.2500 |
| −0.2500 + 0.0000i | 0.2500 − 0.0000i | −0.2310 + 0.0957i | 0.2452 + 0.0488i |
| 0.2500 − 0.0000i | −0.2500 + 0.0000i | 0.1768 − 0.1768i | −0.2310 − 0.0957i |
| −0.2500 + 0.0000i | 0.2500 − 0.0000i | −0.0957 + 0.2310i | 0.2079 + 0.1389i |
| ans(:, :, 9, 5) = | | ans(:, :, 9, 13) = | |
| 0.2500 | 0.2500 | 0.2500 | 0.2500 |
| −0.2310 − 0.0957i | −0.2310 − 0.0957i | −0.2500 + 0.0000i | −0.2079 − 0.1389i |
| 0.1768 + 0.1768i | 0.1768 + 0.1768i | 0.2500 − 0.0000i | 0.0957 + 0.2310i |
| −0.0957 − 0.2310i | −0.0957 − 0.2310i | −0.2500 + 0.0000i | 0.0488 − 0.2452i |
| 0.2500 | −0.2500 | 0.2500 | −0.2500 |
| −0.2310 − 0.0957i | 0.2310 + 0.0957i | −0.2500 + 0.0000i | 0.2079 + 0.1389i |
| 0.1768 + 0.1768i | −0.1768 − 0.1768i | 0.2500 − 0.0000i | −0.0957 − 0.2310i |
| −0.0957 − 0.2310i | 0.0957 + 0.2310i | −0.2500 + 0.0000i | −0.0488 + 0.2452i |

TABLE 2-continued

| | | | |
|---|---|---|---|
| ans(:, :, 10, 5) = | | ans(:, :, 10, 13) = | |
| 0.2500 | 0.2500 | 0.2500 | 0.2500 |
| −0.1768 − 0.1768i | −0.1768 − 0.1768i | −0.2310 − 0.0957i | −0.1389 − 0.2079i |
| 0.0000 + 0.2500i | 0.0000 + 0.2500i | 0.1768 + 0.1768i | −0.0957 + 0.2310i |
| 0.1768 − 0.1768i | 0.1768 − 0.1768i | −0.0957 − 0.2310i | 0.2452 − 0.0488i |
| 0.2500 | −0.2500 | 0.2500 | −0.2500 |
| −0.1768 − 0.1768i | 0.1768 + 0.1768i | −0.2310 − 0.0957i | 0.1389 + 0.2079i |
| 0.0000 + 0.2500i | −0.0000 − 0.2500i | 0.1768 + 0.1768i | 0.0957 − 0.2310i |
| 0.1768 − 0.1768i | −0.1768 + 0.1768i | −0.0957 − 0.2310i | −0.2452 + 0.0488i |
| ans(:, :, 11, 5) = | | ans(:, :, 11, 13) = | |
| 0.2500 | 0.2500 | 0.2500 | 0.2500 |
| −0.0957 − 0.2310i | −0.0957 − 0.2310i | −0.1768 − 0.1768i | −0.0488 − 0.2452i |
| −0.1768 + 0.1768i | −0.1768 + 0.1768i | 0.0000 + 0.2500i | −0.2310 + 0.0957i |
| 0.2310 + 0.0957i | 0.2310 + 0.0957i | 0.1768 − 0.1768i | 0.1389 + 0.2079i |
| 0.2500 | −0.2500 | 0.2500 | −0.2500 |
| −0.0957 − 0.2310i | 0.0957 + 0.2310i | −0.1768 − 0.1768i | 0.0488 + 0.2452i |
| −0.1768 + 0.1768i | 0.1768 − 0.1768i | 0.0000 + 0.2500i | 0.2310 − 0.0957i |
| 0.2310 + 0.0957i | −0.2310 − 0.0957i | 0.1768 − 0.1768i | −0.1389 − 0.2079i |
| ans(:, :, 12, 5) = | | ans(:, :, 12, 13) = | |
| 0.2500 | 0.2500 | 0.2500 | 0.2500 |
| −0.0000 − 0.2500i | −0.0000 − 0.2500i | −0.0957 − 0.2310i | 0.0488 − 0.2452i |
| −0.2500 + 0.0000i | −0.2500 + 0.0000i | −0.1768 + 0.1768i | −0.2310 − 0.0957i |
| 0.0000 + 0.2500i | 0.0000 + 0.2500i | 0.2310 + 0.0957i | −0.1389 + 0.2079i |
| 0.2500 | −0.2500 | 0.2500 | −0.2500 |
| −0.0000 − 0.2500i | 0.0000 + 0.2500i | −0.0957 − 0.2310i | −0.0488 + 0.2452i |
| −0.2500 + 0.0000i | 0.2500 − 0.0000i | −0.1768 + 0.1768i | 0.2310 + 0.0957i |
| 0.0000 + 0.2500i | −0.0000 − 0.2500i | 0.2310 + 0.0957i | 0.1389 − 0.2079i |
| ans(:, :, 13, 5) = | | ans(:, :, 13, 13) = | |
| 0.2500 | 0.2500 | 0.2500 | 0.2500 |
| 0.0957 − 0.2310i | 0.0957 − 0.2310i | −0.0000 − 0.2500i | 0.1389 − 0.2079i |
| −0.1768 − 0.1768i | −0.1768 − 0.1768i | −0.2500 + 0.0000i | −0.0957 − 0.2310i |
| −0.2310 + 0.0957i | −0.2310 + 0.0957i | 0.0000 + 0.2500i | −0.2452 − 0.0488i |
| 0.2500 | −0.2500 | 0.2500 | −0.2500 |
| 0.0957 − 0.2310i | −0.0957 + 0.2310i | −0.0000 − 0.2500i | −0.1389 + 0.2079i |
| −0.1768 − 0.1768i | 0.1768 + 0.1768i | −0.2500 + 0.0000i | 0.0957 + 0.2310i |
| −0.2310 + 0.0957i | 0.2310 − 0.0957i | 0.0000 + 0.2500i | 0.2452 + 0.0488i |
| ans(:, :, 14, 5) = | | ans(:, :, 14, 13) = | |
| 0.2500 | 0.2500 | 0.2500 | 0.2500 |
| 0.1768 − 0.1768i | 0.1768 − 0.1768i | 0.0957 − 0.2310i | 0.2079 − 0.1389i |
| −0.0000 − 0.2500i | −0.0000 − 0.2500i | −0.1768 − 0.1768i | 0.0957 − 0.2310i |
| −0.1768 − 0.1768i | −0.1768 − 0.1768i | −0.2310 + 0.0957i | −0.0488 − 0.2452i |
| 0.2500 | −0.2500 | 0.2500 | −0.2500 |
| 0.1768 − 0.1768i | −0.1768 + 0.1768i | 0.0957 − 0.2310i | −0.2079 + 0.1389i |
| −0.0000 − 0.2500i | 0.0000 + 0.2500i | −0.1768 − 0.1768i | −0.0957 + 0.2310i |
| −0.1768 − 0.1768i | 0.1768 + 0.1768i | −0.2310 + 0.0957i | 0.0488 + 0.2452i |
| ans(:, :, 15, 5) = | | ans(:, :, 15, 13) = | |
| 0.2500 | 0.2500 | 0.2500 | 0.2500 |
| 0.2310 − 0.0957i | 0.2310 − 0.0957i | 0.1768 − 0.1768i | 0.2452 − 0.0488i |
| 0.1768 − 0.1768i | 0.1768 − 0.1768i | −0.0000 − 0.2500i | 0.2310 − 0.0957i |
| 0.0957 − 0.2310i | 0.0957 − 0.2310i | −0.1768 − 0.1768i | 0.2079 − 0.1389i |
| 0.2500 | −0.2500 | 0.2500 | −0.2500 |
| 0.2310 − 0.0957i | −0.2310 + 0.0957i | 0.1768 − 0.1768i | −0.2452 + 0.0488i |
| 0.1768 − 0.1768i | −0.1768 + 0.1768i | −0.0000 − 0.2500i | −0.2310 + 0.0957i |
| 0.0957 − 0.2310i | −0.0957 + 0.2310i | −0.1768 − 0.1768i | −0.2079 + 0.1389i |
| ans(:, :, 16, 5) = | | ans(:, :, 16, 13) = | |
| 0.2500 | 0.2500 | 0.2500 | 0.2500 |
| 0.2500 | 0.2500 | 0.2310 − 0.0957i | 0.2452 + 0.0488i |
| 0.2500 | 0.2500 | 0.1768 − 0.1768i | 0.2310 + 0.0957i |
| 0.2500 | 0.2500 | 0.0957 − 0.2310i | 0.2079 + 0.1389i |
| 0.2500 | −0.2500 | 0.2500 | −0.2500 |
| 0.2500 | −0.2500 | 0.2310 − 0.0957i | −0.2452 − 0.0488i |
| 0.2500 | −0.2500 | 0.1768 − 0.1768i | −0.2310 − 0.0957i |
| 0.2500 | −0.2500 | 0.0957 − 0.2310i | −0.2079 − 0.1389i |

TABLE 2-continued

| ans(:, :, 1, 6) = | | ans(:, :, 1, 14) = | |
|---|---|---|---|
| 0.2500 | 0.2500 | 0.2500 | 0.2500 |
| 0.2310 + 0.0957i | 0.2310 + 0.0957i | 0.2500 | 0.2079 + 0.1389i |
| 0.1768 + 0.1768i | 0.1768 + 0.1768i | 0.2500 | 0.0957 + 0.2310i |
| 0.0957 + 0.2310i | 0.0957 + 0.2310i | 0.2500 | −0.0488 + 0.2452i |
| 0 + 0.2500i | 0 − 0.2500i | 0 + 0.2500i | 0 − 0.2500i |
| −0.0957 + 0.2310i | 0.0957 − 0.2310i | 0 + 0.2500i | 0.1389 − 0.2079i |
| −0.1768 + 0.1768i | 0.1768 − 0.1768i | 0 + 0.2500i | 0.2310 − 0.0957i |
| −0.2310 + 0.0957i | 0.2310 − 0.0957i | 0 + 0.2500i | 0.2452 + 0.0488i |
| ans(:, :, 2, 6) = | | ans(:, :, 2, 14) = | |
| 0.2500 | 0.2500 | 0.2500 | 0.2500 |
| 0.1768 + 0.1768i | 0.1768 + 0.1768i | 0.2310 + 0.0957i | 0.1389 + 0.2079i |
| 0.0000 + 0.2500i | 0.0000 + 0.2500i | 0.1768 + 0.1768i | −0.0957 + 0.2310i |
| −0.1768 + 0.1768i | −0.1768 + 0.1768i | 0.0957 + 0.2310i | −0.2452 + 0.0488i |
| 0 + 0.2500i | 0 − 0.2500i | 0 + 0.2500i | 0 − 0.2500i |
| −0.1768 + 0.1768i | 0.1768 − 0.1768i | −0.0957 + 0.2310i | 0.2079 − 0.1389i |
| −0.2500 + 0.0000i | 0.2500 − 0.0000i | −0.1768 + 0.1768i | 0.2310 + 0.0957i |
| −0.1768 − 0.1768i | 0.1768 + 0.1768i | −0.2310 + 0.0957i | 0.0488 + 0.2452i |
| ans(:, :, 3, 6) = | | ans(:, :, 3, 14) = | |
| 0.2500 | 0.2500 | 0.2500 | 0.2500 |
| 0.0957 + 0.2310i | 0.0957 + 0.2310i | 0.1768 + 0.1768i | 0.0488 + 0.2452i |
| −0.1768 + 0.1768i | −0.1768 + 0.1768i | 0.0000 + 0.2500i | −0.2310 + 0.0957i |
| −0.2310 − 0.0957i | −0.2310 − 0.0957i | −0.1768 + 0.1768i | −0.1389 − 0.2079i |
| 0 + 0.2500i | 0 − 0.2500i | 0 + 0.2500i | 0 − 0.2500i |
| −0.2310 + 0.0957i | 0.2310 − 0.0957i | −0.1768 + 0.1768i | 0.2452 − 0.0488i |
| −0.1768 − 0.1768i | 0.1768 + 0.1768i | −0.2500 + 0.0000i | 0.0957 + 0.2310i |
| 0.0957 − 0.2310i | −0.0957 + 0.2310i | −0.1768 − 0.1768i | −0.2079 + 0.1389i |
| ans(:, :, 4, 6) = | | ans(:, :, 4, 14) = | |
| 0.2500 | 0.2500 | 0.2500 | 0.2500 |
| 0.0000 + 0.2500i | 0.0000 + 0.2500i | 0.0957 + 0.2310i | −0.0488 + 0.2452i |
| −0.2500 + 0.0000i | −0.2500 + 0.0000i | −0.1768 + 0.1768i | −0.2310 − 0.0957i |
| −0.0000 − 0.2500i | −0.0000 − 0.2500i | −0.2310 − 0.0957i | 0.1389 − 0.2079i |
| 0 + 0.2500i | 0 − 0.2500i | 0 + 0.2500i | 0 − 0.2500i |
| −0.2500 + 0.0000i | 0.2500 − 0.0000i | −0.2310 + 0.0957i | 0.2452 + 0.0488i |
| −0.0000 − 0.2500i | 0.0000 + 0.2500i | −0.1768 − 0.1768i | −0.0957 + 0.2310i |
| 0.2500 − 0.0000i | −0.2500 + 0.0000i | 0.0957 − 0.2310i | −0.2079 − 0.1389i |
| ans(:, :, 5, 6) = | | ans(:, :, 5, 14) = | |
| 0.2500 | 0.2500 | 0.2500 | 0.2500 |
| −0.0957 + 0.2310i | −0.0957 + 0.2310i | 0.0000 + 0.2500i | −0.1389 + 0.2079i |
| −0.1768 − 0.1768i | −0.1768 − 0.1768i | −0.2500 + 0.0000i | −0.0957 − 0.2310i |
| 0.2310 − 0.0957i | 0.2310 − 0.0957i | −0.0000 − 0.2500i | 0.2452 + 0.0488i |
| 0 + 0.2500i | 0 − 0.2500i | 0 + 0.2500i | 0 − 0.2500i |
| −0.2310 − 0.0957i | 0.2310 + 0.0957i | −0.2500 + 0.0000i | 0.2079 + 0.1389i |
| 0.1768 − 0.1768i | −0.1768 + 0.1768i | −0.0000 − 0.2500i | −0.2310 + 0.0957i |
| 0.0957 + 0.2310i | −0.0957 − 0.2310i | 0.2500 − 0.0000i | 0.0488 − 0.2452i |
| ans(:, :, 6, 6) = | | ans(:, :, 6, 14) = | |
| 0.2500 | 0.2500 | 0.2500 | 0.2500 |
| −0.1768 + 0.1768i | −0.1768 + 0.1768i | −0.0957 + 0.2310i | −0.2079 + 0.1389i |
| −0.0000 − 0.2500i | −0.0000 − 0.2500i | −0.1768 − 0.1768i | 0.0957 − 0.2310i |
| 0.1768 + 0.1768i | 0.1768 + 0.1768i | 0.2310 − 0.0957i | 0.0488 + 0.2452i |
| 0 + 0.2500i | 0 − 0.2500i | 0 + 0.2500i | 0 − 0.2500i |
| −0.1768 − 0.1768i | 0.1768 + 0.1768i | −0.2310 − 0.0957i | 0.1389 + 0.2079i |
| 0.2500 − 0.0000i | −0.2500 + 0.0000i | 0.1768 − 0.1768i | −0.2310 − 0.0957i |
| −0.1768 + 0.1768i | 0.1768 − 0.1768i | 0.0957 + 0.2310i | 0.2452 − 0.0488i |
| ans(:, :, 7, 6) = | | ans(:, :, 7, 14) = | |
| 0.2500 | 0.2500 | 0.2500 | 0.2500 |
| −0.2310 + 0.0957i | −0.2310 + 0.0957i | −0.1768 + 0.1768i | −0.2452 + 0.0488i |
| 0.1768 − 0.1768i | 0.1768 − 0.1768i | −0.0000 − 0.2500i | 0.2310 − 0.0957i |
| −0.0957 + 0.2310i | −0.0957 + 0.2310i | 0.1768 + 0.1768i | −0.2079 + 0.1389i |
| 0 + 0.2500i | 0 − 0.2500i | 0 + 0.2500i | 0 − 0.2500i |
| −0.0957 − 0.2310i | 0.0957 + 0.2310i | −0.1768 − 0.1768i | 0.0488 + 0.2452i |
| 0.1768 + 0.1768i | −0.1768 − 0.1768i | 0.2500 − 0.0000i | −0.0957 − 0.2310i |
| −0.2310 − 0.0957i | 0.2310 + 0.0957i | −0.1768 + 0.1768i | 0.1389 + 0.2079i |

TABLE 2-continued

| | | | |
|---|---|---|---|
| ans(:, :, 8, 6) = | | ans(:, :, 8, 14) = | |
| 0.2500 | 0.2500 | 0.2500 | 0.2500 |
| −0.2500 + 0.0000i | −0.2500 + 0.0000i | −0.2310 + 0.0957i | −0.2452 − 0.0488i |
| 0.2500 − 0.0000i | 0.2500 − 0.0000i | 0.1768 − 0.1768i | 0.2310 + 0.0957i |
| −0.2500 + 0.0000i | −0.2500 + 0.0000i | −0.0957 + 0.2310i | −0.2079 − 0.1389i |
| 0 + 0.2500i | 0 − 0.2500i | 0 + 0.2500i | 0 − 0.2500i |
| −0.0000 − 0.2500i | 0.0000 + 0.2500i | −0.0957 − 0.2310i | −0.0488 + 0.2452i |
| 0.0000 + 0.2500i | −0.0000 − 0.2500i | 0.1768 + 0.1768i | 0.0957 − 0.2310i |
| −0.0000 − 0.2500i | 0.0000 + 0.2500i | −0.2310 − 0.0957i | −0.1389 + 0.2079i |
| ans(:, :, 9, 6) = | | ans(:, :, 9, 14) = | |
| 0.2500 | 0.2500 | 0.2500 | 0.2500 |
| −0.2310 − 0.0957i | −0.2310 − 0.0957i | −0.2500 + 0.0000i | −0.2079 − 0.1389i |
| 0.1768 + 0.1768i | 0.1768 + 0.1768i | 0.2500 − 0.0000i | 0.0957 + 0.2310i |
| −0.0957 − 0.2310i | −0.0957 − 0.2310i | −0.2500 + 0.0000i | 0.0488 − 0.2452i |
| 0 + 0.2500i | 0 − 0.2500i | 0 + 0.2500i | 0 − 0.2500i |
| 0.0957 − 0.2310i | −0.0957 + 0.2310i | −0.0000 − 0.2500i | −0.1389 + 0.2079i |
| −0.1768 + 0.1768i | 0.1768 − 0.1768i | 0.0000 + 0.2500i | 0.2310 − 0.0957i |
| 0.2310 − 0.0957i | −0.2310 + 0.0957i | −0.0000 − 0.2500i | −0.2452 − 0.0488i |
| ans(:, :, 10, 6) = | | ans(:, :, 10, 14) = | |
| 0.2500 | 0.2500 | 0.2500 | 0.2500 |
| −0.1768 − 0.1768i | −0.1768 − 0.1768i | −0.2310 − 0.0957i | −0.1389 − 0.2079i |
| 0.0000 + 0.2500i | 0.0000 + 0.2500i | 0.1768 + 0.1768i | −0.0957 + 0.2310i |
| 0.1768 − 0.1768i | 0.1768 − 0.1768i | −0.0957 − 0.2310i | 0.2452 − 0.0488i |
| 0 + 0.2500i | 0 − 0.2500i | 0 + 0.2500i | 0 − 0.2500i |
| 0.1768 − 0.1768i | −0.1768 + 0.1768i | 0.0957 − 0.2310i | −0.2079 + 0.1389i |
| −0.2500 + 0.0000i | 0.2500 − 0.0000i | −0.1768 + 0.1768i | 0.2310 + 0.0957i |
| 0.1768 + 0.1768i | −0.1768 − 0.1768i | 0.2310 − 0.0957i | −0.0488 − 0.2452i |
| ans(:, :, 11, 6) = | | ans(:, :, 11, 14) = | |
| 0.2500 | 0.2500 | 0.2500 | 0.2500 |
| −0.0957 − 0.2310i | −0.0957 − 0.2310i | −0.1768 − 0.1768i | −0.0488 − 0.2452i |
| −0.1768 + 0.1768i | −0.1768 + 0.1768i | 0.0000 + 0.2500i | −0.2310 + 0.0957i |
| 0.2310 + 0.0957i | 0.2310 + 0.0957i | 0.1768 − 0.1768i | 0.1389 + 0.2079i |
| 0 + 0.2500i | 0 − 0.2500i | 0 + 0.2500i | 0 − 0.2500i |
| 0.2310 − 0.0957i | −0.2310 + 0.0957i | 0.1768 − 0.1768i | −0.2452 + 0.0488i |
| −0.1768 − 0.1768i | 0.1768 + 0.1768i | −0.2500 + 0.0000i | 0.0957 + 0.2310i |
| −0.0957 + 0.2310i | 0.0957 − 0.2310i | 0.1768 + 0.1768i | 0.2079 − 0.1389i |
| ans(:, :, 12, 6) = | | ans(:, :, 12, 14) = | |
| 0.2500 | 0.2500 | 0.2500 | 0.2500 |
| −0.0000 − 0.2500i | −0.0000 − 0.2500i | −0.0957 − 0.2310i | 0.0488 − 0.2452i |
| −0.2500 + 0.0000i | −0.2500 + 0.0000i | −0.1768 + 0.1768i | −0.2310 − 0.0957i |
| 0.0000 + 0.2500i | 0.0000 + 0.2500i | 0.2310 + 0.0957i | −0.1389 + 0.2079i |
| 0 + 0.2500i | 0 − 0.2500i | 0 + 0.2500i | 0 − 0.2500i |
| 0.2500 − 0.0000i | −0.2500 + 0.0000i | 0.2310 − 0.0957i | −0.2452 − 0.0488i |
| −0.0000 − 0.2500i | 0.0000 + 0.2500i | −0.1768 − 0.1768i | −0.0957 + 0.2310i |
| −0.2500 + 0.0000i | 0.2500 − 0.0000i | −0.0957 + 0.2310i | 0.2079 + 0.1389i |
| ans(:, :, 13, 6) = | | ans(:, :, 13, 14) = | |
| 0.2500 | 0.2500 | 0.2500 | 0.2500 |
| 0.0957 − 0.2310i | 0.0957 − 0.2310i | −0.0000 − 0.2500i | 0.1389 − 0.2079i |
| −0.1768 − 0.1768i | −0.1768 − 0.1768i | −0.2500 + 0.0000i | −0.0957 − 0.2310i |
| −0.2310 + 0.0957i | −0.2310 + 0.0957i | 0.0000 + 0.2500i | −0.2452 − 0.0488i |
| 0 + 0.2500i | 0 − 0.2500i | 0 + 0.2500i | 0 − 0.2500i |
| 0.2310 + 0.0957i | −0.2310 − 0.0957i | 0.2500 − 0.0000i | −0.2079 − 0.1389i |
| 0.1768 − 0.1768i | −0.1768 + 0.1768i | −0.0000 − 0.2500i | −0.2310 + 0.0957i |
| −0.0957 − 0.2310i | 0.0957 + 0.2310i | −0.2500 + 0.0000i | −0.0488 + 0.2452i |
| ans(:, :, 14, 6) = | | ans(:, :, 14, 14) = | |
| 0.2500 | 0.2500 | 0.2500 | 0.2500 |
| 0.1768 − 0.1768i | 0.1768 − 0.1768i | 0.0957 − 0.2310i | 0.2079 − 0.1389i |
| −0.0000 − 0.2500i | −0.0000 − 0.2500i | −0.1768 − 0.1768i | 0.0957 − 0.2310i |
| −0.1768 − 0.1768i | −0.1768 − 0.1768i | −0.2310 + 0.0957i | −0.0488 − 0.2452i |
| 0 + 0.2500i | 0 − 0.2500i | 0 + 0.2500i | 0 − 0.2500i |
| 0.1768 + 0.1768i | −0.1768 − 0.1768i | 0.2310 + 0.0957i | −0.1389 − 0.2079i |
| 0.2500 − 0.0000i | −0.2500 + 0.0000i | 0.1768 − 0.1768i | −0.2310 − 0.0957i |
| 0.1768 − 0.1768i | −0.1768 + 0.1768i | −0.0957 − 0.2310i | −0.2452 + 0.0488i |

TABLE 2-continued

| ans(:, :, 15, 6) = | | ans(:, :, 15, 14) = | |
|---|---|---|---|
| 0.2500 | 0.2500 | 0.2500 | 0.2500 |
| 0.2310 − 0.0957i | 0.2310 − 0.0957i | 0.1768 − 0.1768i | 0.2452 − 0.0488i |
| 0.1768 − 0.1768i | 0.1768 − 0.1768i | −0.0000 − 0.2500i | 0.2310 − 0.0957i |
| 0.0957 − 0.2310i | 0.0957 − 0.2310i | −0.1768 − 0.1768i | 0.2079 − 0.1389i |
| 0 + 0.2500i | 0 − 0.2500i | 0 + 0.2500i | 0 − 0.2500i |
| 0.0957 + 0.2310i | −0.0957 − 0.2310i | 0.1768 + 0.1768i | −0.0488 − 0.2452i |
| 0.1768 + 0.1768i | −0.1768 − 0.1768i | 0.2500 − 0.0000i | −0.0957 − 0.2310i |
| 0.2310 + 0.0957i | −0.2310 − 0.0957i | 0.1768 − 0.1768i | −0.1389 − 0.2079i |

| ans(:, :, 16, 6) = | | ans(:, :, 16, 14) = | |
|---|---|---|---|
| 0.2500 | 0.2500 | 0.2500 | 0.2500 |
| 0.2500 | 0.2500 | 0.2310 − 0.0957i | 0.2452 + 0.0488i |
| 0.2500 | 0.2500 | 0.1768 − 0.1768i | 0.2310 + 0.0957i |
| 0.2500 | 0.2500 | 0.0957 − 0.2310i | 0.2079 + 0.1389i |
| 0 + 0.2500i | 0 − 0.2500i | 0 + 0.2500i | 0 − 0.2500i |
| 0 + 0.2500i | 0 − 0.2500i | 0.0957 + 0.2310i | 0.0488 − 0.2452i |
| 0 + 0.2500i | 0 − 0.2500i | 0.1768 + 0.1768i | 0.0957 − 0.2310i |
| 0 + 0.2500i | 0 − 0.2500i | 0.2310 + 0.0957i | 0.1389 − 0.2079i |

| ans(:, :, 1, 7) = | | ans(:, :, 1, 15) = | |
|---|---|---|---|
| 0.2500 | 0.2500 | 0.2500 | 0.2500 |
| 0.2079 + 0.1389i | 0.2079 + 0.1389i | 0.2452 + 0.0488i | 0.2079 + 0.1389i |
| 0.0957 + 0.2310i | 0.0957 + 0.2310i | 0.2310 + 0.0957i | 0.0957 + 0.2310i |
| −0.0488 + 0.2452i | −0.0488 + 0.2452i | 0.2079 + 0.1389i | −0.0488 + 0.2452i |
| 0.2500 | −0.2500 | 0.2500 | −0.2500 |
| 0.2079 + 0.1389i | −0.2079 − 0.1389i | 0.2452 + 0.0488i | −0.2079 − 0.1389i |
| 0.0957 + 0.2310i | −0.0957 − 0.2310i | 0.2310 + 0.0957i | −0.0957 − 0.2310i |
| −0.0488 + 0.2452i | 0.0488 − 0.2452i | 0.2079 + 0.1389i | 0.0488 − 0.2452i |

| ans(:, :, 2, 7) = | | ans(:, :, 2, 15) = | |
|---|---|---|---|
| 0.2500 | 0.2500 | 0.2500 | 0.2500 |
| 0.1389 + 0.2079i | 0.1389 + 0.2079i | 0.2079 + 0.1389i | 0.1389 + 0.2079i |
| −0.0957 + 0.2310i | −0.0957 + 0.2310i | 0.0957 + 0.2310i | −0.0957 + 0.2310i |
| −0.2452 + 0.0488i | −0.2452 + 0.0488i | −0.0488 + 0.2452i | −0.2452 + 0.0488i |
| 0.2500 | −0.2500 | 0.2500 | −0.2500 |
| 0.1389 + 0.2079i | −0.1389 − 0.2079i | 0.2079 + 0.1389i | −0.1389 − 0.2079i |
| −0.0957 + 0.2310i | 0.0957 − 0.2310i | 0.0957 + 0.2310i | 0.0957 − 0.2310i |
| −0.2452 + 0.0488i | 0.2452 − 0.0488i | −0.0488 + 0.2452i | 0.2452 − 0.0488i |

| ans(:, :, 3, 7) = | | ans(:, :, 3, 15) = | |
|---|---|---|---|
| 0.2500 | 0.2500 | 0.2500 | 0.2500 |
| 0.0488 + 0.2452i | 0.0488 + 0.2452i | 0.1389 + 0.2079i | 0.0488 + 0.2452i |
| −0.2310 + 0.0957i | −0.2310 + 0.0957i | −0.0957 + 0.2310i | −0.2310 + 0.0957i |
| −0.1389 − 0.2079i | −0.1389 − 0.2079i | −0.2452 + 0.0488i | −0.1389 − 0.2079i |
| 0.2500 | −0.2500 | 0.2500 | −0.2500 |
| 0.0488 + 0.2452i | −0.0488 − 0.2452i | 0.1389 + 0.2079i | −0.0488 − 0.2452i |
| −0.2310 + 0.0957i | 0.2310 − 0.0957i | −0.0957 + 0.2310i | 0.2310 − 0.0957i |
| −0.1389 − 0.2079i | 0.1389 + 0.2079i | −0.2452 + 0.0488i | 0.1389 + 0.2079i |

| ans(:, :, 4, 7) = | | ans(:, :, 4, 15) = | |
|---|---|---|---|
| 0.2500 | 0.2500 | 0.2500 | 0.2500 |
| −0.0488 + 0.2452i | −0.0488 + 0.2452i | 0.0488 + 0.2452i | −0.0488 + 0.2452i |
| −0.2310 − 0.0957i | −0.2310 − 0.0957i | −0.2310 + 0.0957i | −0.2310 − 0.0957i |
| 0.1389 − 0.2079i | 0.1389 − 0.2079i | −0.1389 − 0.2079i | 0.1389 − 0.2079i |
| 0.2500 | −0.2500 | 0.2500 | −0.2500 |
| −0.0488 + 0.2452i | 0.0488 − 0.2452i | 0.0488 + 0.2452i | 0.0488 − 0.2452i |
| −0.2310 − 0.0957i | 0.2310 + 0.0957i | −0.2310 + 0.0957i | 0.2310 + 0.0957i |
| 0.1389 − 0.2079i | −0.1389 + 0.2079i | −0.1389 − 0.2079i | −0.1389 + 0.2079i |

| ans(:, :, 5, 7) = | | ans(:, :, 5, 15) = | |
|---|---|---|---|
| 0.2500 | 0.2500 | 0.2500 | 0.2500 |
| −0.1389 + 0.2079i | −0.1389 + 0.2079i | −0.0488 + 0.2452i | −0.1389 + 0.2079i |
| −0.0957 − 0.2310i | −0.0957 − 0.2310i | −0.2310 − 0.0957i | −0.0957 − 0.2310i |
| 0.2452 + 0.0488i | 0.2452 + 0.0488i | 0.1389 − 0.2079i | 0.2452 + 0.0488i |
| 0.2500 | −0.2500 | 0.2500 | −0.2500 |
| −0.1389 + 0.2079i | 0.1389 − 0.2079i | −0.0488 + 0.2452i | 0.1389 − 0.2079i |
| −0.0957 − 0.2310i | 0.0957 + 0.2310i | −0.2310 − 0.0957i | 0.0957 + 0.2310i |
| 0.2452 + 0.0488i | −0.2452 − 0.0488i | 0.1389 − 0.2079i | −0.2452 − 0.0488i |

TABLE 2-continued

| ans(:, :, 6, 7) = | | ans(:, :, 6, 15) = | |
|---|---|---|---|
| 0.2500 | 0.2500 | 0.2500 | 0.2500 |
| −0.2079 + 0.1389i | −0.2079 + 0.1389i | −0.1389 + 0.2079i | −0.2079 + 0.1389i |
| 0.0957 − 0.2310i | 0.0957 − 0.2310i | −0.0957 − 0.2310i | 0.0957 − 0.2310i |
| 0.0488 + 0.2452i | 0.0488 + 0.2452i | 0.2452 + 0.0488i | 0.0488 + 0.2452i |
| 0.2500 | −0.2500 | 0.2500 | −0.2500 |
| −0.2079 + 0.1389i | 0.2079 − 0.1389i | −0.1389 + 0.2079i | 0.2079 − 0.1389i |
| 0.0957 − 0.2310i | −0.0957 + 0.2310i | −0.0957 − 0.2310i | −0.0957 + 0.2310i |
| 0.0488 + 0.2452i | −0.0488 − 0.2452i | 0.2452 + 0.0488i | −0.0488 − 0.2452i |
| **ans(:, :, 7, 7) =** | | **ans(:, :, 7, 15) =** | |
| 0.2500 | 0.2500 | 0.2500 | 0.2500 |
| −0.2452 + 0.0488i | −0.2452 + 0.0488i | −0.2079 + 0.1389i | −0.2452 + 0.0488i |
| 0.2310 − 0.0957i | 0.2310 − 0.0957i | 0.0957 − 0.2310i | 0.2310 − 0.0957i |
| −0.2079 + 0.1389i | −0.2079 + 0.1389i | 0.0488 + 0.2452i | −0.2079 + 0.1389i |
| 0.2500 | −0.2500 | 0.2500 | −0.2500 |
| −0.2452 + 0.0488i | 0.2452 − 0.0488i | −0.2079 + 0.1389i | 0.2452 − 0.0488i |
| 0.2310 − 0.0957i | −0.2310 + 0.0957i | 0.0957 − 0.2310i | −0.2310 + 0.0957i |
| −0.2079 + 0.1389i | 0.2079 − 0.1389i | 0.0488 + 0.2452i | 0.2079 − 0.1389i |
| **ans(:, :, 8, 7) =** | | **ans(:, :, 8, 15) =** | |
| 0.2500 | 0.2500 | 0.2500 | 0.2500 |
| −0.2452 − 0.0488i | −0.2452 − 0.0488i | −0.2452 + 0.0488i | −0.2452 − 0.0488i |
| 0.2310 + 0.0957i | 0.2310 + 0.0957i | 0.2310 − 0.0957i | 0.2310 + 0.0957i |
| −0.2079 − 0.1389i | −0.2079 − 0.1389i | −0.2079 + 0.1389i | −0.2079 − 0.1389i |
| 0.2500 | −0.2500 | 0.2500 | −0.2500 |
| −0.2452 − 0.0488i | 0.2452 + 0.0488i | −0.2452 + 0.0488i | 0.2452 + 0.0488i |
| 0.2310 + 0.0957i | −0.2310 − 0.0957i | 0.2310 − 0.0957i | −0.2310 − 0.0957i |
| −0.2079 − 0.1389i | 0.2079 + 0.1389i | −0.2079 + 0.1389i | 0.2079 + 0.1389i |
| **ans(:, :, 9, 7) =** | | **ans(:, :, 9, 15) =** | |
| 0.2500 | 0.2500 | 0.2500 | 0.2500 |
| −0.2079 − 0.1389i | −0.2079 − 0.1389i | −0.2452 − 0.0488i | −0.2079 − 0.1389i |
| 0.0957 + 0.2310i | 0.0957 + 0.2310i | 0.2310 + 0.0957i | 0.0957 + 0.2310i |
| 0.0488 − 0.2452i | 0.0488 − 0.2452i | −0.2079 − 0.1389i | 0.0488 − 0.2452i |
| 0.2500 | −0.2500 | 0.2500 | −0.2500 |
| −0.2079 − 0.1389i | 0.2079 + 0.1389i | −0.2452 − 0.0488i | 0.2079 + 0.1389i |
| 0.0957 + 0.2310i | −0.0957 − 0.2310i | 0.2310 + 0.0957i | −0.0957 − 0.2310i |
| 0.0488 − 0.2452i | −0.0488 + 0.2452i | −0.2079 − 0.1389i | −0.0488 + 0.2452i |
| **ans(:, :, 10, 7) =** | | **ans(:, :, 10, 15) =** | |
| 0.2500 | 0.2500 | 0.2500 | 0.2500 |
| −0.1389 − 0.2079i | −0.1389 − 0.2079i | −0.2079 − 0.1389i | −0.1389 − 0.2079i |
| −0.0957 + 0.2310i | −0.0957 + 0.2310i | 0.0957 + 0.2310i | −0.0957 + 0.2310i |
| 0.2452 − 0.0488i | 0.2452 − 0.0488i | 0.0488 − 0.2452i | 0.2452 − 0.0488i |
| 0.2500 | −0.2500 | 0.2500 | −0.2500 |
| −0.1389 − 0.2079i | 0.1389 + 0.2079i | −0.2079 − 0.1389i | 0.1389 + 0.2079i |
| −0.0957 + 0.2310i | 0.0957 − 0.2310i | 0.0957 + 0.2310i | 0.0957 − 0.2310i |
| 0.2452 − 0.0488i | −0.2452 + 0.0488i | 0.0488 − 0.2452i | −0.2452 + 0.0488i |
| **ans(:, :, 11, 7) =** | | **ans(:, :, 11, 15) =** | |
| 0.2500 | 0.2500 | 0.2500 | 0.2500 |
| −0.0488 − 0.2452i | −0.0488 − 0.2452i | −0.1389 − 0.2079i | −0.0488 − 0.2452i |
| −0.2310 + 0.0957i | −0.2310 + 0.0957i | −0.0957 + 0.2310i | −0.2310 + 0.0957i |
| 0.1389 + 0.2079i | 0.1389 + 0.2079i | 0.2452 − 0.0488i | 0.1389 + 0.2079i |
| 0.2500 | −0.2500 | 0.2500 | −0.2500 |
| −0.0488 − 0.2452i | 0.0488 + 0.2452i | −0.1389 − 0.2079i | 0.0488 + 0.2452i |
| −0.2310 + 0.0957i | 0.2310 − 0.0957i | −0.0957 + 0.2310i | 0.2310 − 0.0957i |
| 0.1389 + 0.2079i | −0.1389 − 0.2079i | 0.2452 − 0.0488i | −0.1389 − 0.2079i |
| **ans(:, :, 12, 7) =** | | **ans(:, :, 12, 15) =** | |
| 0.2500 | 0.2500 | 0.2500 | 0.2500 |
| 0.0488 − 0.2452i | 0.0488 − 0.2452i | −0.0488 − 0.2452i | 0.0488 − 0.2452i |
| −0.2310 − 0.0957i | −0.2310 − 0.0957i | −0.2310 + 0.0957i | −0.2310 − 0.0957i |
| −0.1389 + 0.2079i | −0.1389 + 0.2079i | 0.1389 + 0.2079i | −0.1389 + 0.2079i |
| 0.2500 | −0.2500 | 0.2500 | −0.2500 |
| 0.0488 − 0.2452i | −0.0488 + 0.2452i | −0.0488 − 0.2452i | −0.0488 + 0.2452i |
| −0.2310 − 0.0957i | 0.2310 + 0.0957i | −0.2310 + 0.0957i | 0.2310 + 0.0957i |
| −0.1389 + 0.2079i | 0.1389 − 0.2079i | 0.1389 + 0.2079i | 0.1389 − 0.2079i |

TABLE 2-continued

| ans(:, :, 13, 7) = | | ans(:, :, 13, 15) = | |
|---|---|---|---|
| 0.2500 | 0.2500 | 0.2500 | 0.2500 |
| 0.1389 − 0.2079i | 0.1389 − 0.2079i | 0.0488 − 0.2452i | 0.1389 − 0.2079i |
| −0.0957 − 0.2310i | −0.0957 − 0.2310i | −0.2310 − 0.0957i | −0.0957 − 0.2310i |
| −0.2452 − 0.0488i | −0.2452 − 0.0488i | −0.1389 + 0.2079i | −0.2452 − 0.0488i |
| 0.2500 | −0.2500 | 0.2500 | −0.2500 |
| 0.1389 − 0.2079i | −0.1389 + 0.2079i | 0.0488 − 0.2452i | −0.1389 + 0.2079i |
| −0.0957 − 0.2310i | 0.0957 + 0.2310i | −0.2310 − 0.0957i | 0.0957 + 0.2310i |
| −0.2452 − 0.0488i | 0.2452 + 0.0488i | −0.1389 + 0.2079i | 0.2452 + 0.0488i |
| ans(:, :, 14, 7) = | | ans(:, :, 14, 15) = | |
| 0.2500 | 0.2500 | 0.2500 | 0.2500 |
| 0.2079 − 0.1389i | 0.2079 − 0.1389i | 0.1389 − 0.2079i | 0.2079 − 0.1389i |
| 0.0957 − 0.2310i | 0.0957 − 0.2310i | −0.0957 − 0.2310i | 0.0957 − 0.2310i |
| −0.0488 − 0.2452i | −0.0488 − 0.2452i | −0.2452 − 0.0488i | −0.0488 − 0.2452i |
| 0.2500 | −0.2500 | 0.2500 | −0.2500 |
| 0.2079 − 0.1389i | −0.2079 + 0.1389i | 0.1389 − 0.2079i | −0.2079 + 0.1389i |
| 0.0957 − 0.2310i | −0.0957 + 0.2310i | −0.0957 − 0.2310i | −0.0957 + 0.2310i |
| −0.0488 − 0.2452i | 0.0488 + 0.2452i | −0.2452 − 0.0488i | 0.0488 + 0.2452i |
| ans(:, :, 15, 7) = | | ans(:, :, 15, 15) = | |
| 0.2500 | 0.2500 | 0.2500 | 0.2500 |
| 0.2452 − 0.0488i | 0.2452 − 0.0488i | 0.2079 − 0.1389i | 0.2452 − 0.0488i |
| 0.2310 − 0.0957i | 0.2310 − 0.0957i | 0.0957 − 0.2310i | 0.2310 − 0.0957i |
| 0.2079 − 0.1389i | 0.2079 − 0.1389i | −0.0488 − 0.2452i | 0.2079 − 0.1389i |
| 0.2500 | −0.2500 | 0.2500 | −0.2500 |
| 0.2452 − 0.0488i | −0.2452 + 0.0488i | 0.2079 − 0.1389i | −0.2452 + 0.0488i |
| 0.2310 − 0.0957i | −0.2310 + 0.0957i | 0.0957 − 0.2310i | −0.2310 + 0.0957i |
| 0.2079 − 0.1389i | −0.2079 + 0.1389i | −0.0488 − 0.2452i | −0.2079 + 0.1389i |
| ans(:, :, 16, 7) = | | ans(:, :, 16, 15) = | |
| 0.2500 | 0.2500 | 0.2500 | 0.2500 |
| 0.2452 + 0.0488i | 0.2452 + 0.0488i | 0.2452 − 0.0488i | 0.2452 + 0.0488i |
| 0.2310 + 0.0957i | 0.2310 + 0.0957i | 0.2310 − 0.0957i | 0.2310 + 0.0957i |
| 0.2079 + 0.1389i | 0.2079 + 0.1389i | 0.2079 − 0.1389i | 0.2079 + 0.1389i |
| 0.2500 | −0.2500 | 0.2500 | −0.2500 |
| 0.2452 + 0.0488i | −0.2452 − 0.0488i | 0.2452 − 0.0488i | −0.2452 − 0.0488i |
| 0.2310 + 0.0957i | −0.2310 − 0.0957i | 0.2310 − 0.0957i | −0.2310 − 0.0957i |
| 0.2079 + 0.1389i | −0.2079 − 0.1389i | 0.2079 − 0.1389i | −0.2079 − 0.1389i |
| ans(:, :, 1, 8) = | | ans(:, :, 1, 16) = | |
| 0.2500 | 0.2500 | 0.2500 | 0.2500 |
| 0.2079 + 0.1389i | 0.2079 + 0.1389i | 0.2452 + 0.0488i | 0.2079 + 0.1389i |
| 0.0957 + 0.2310i | 0.0957 + 0.2310i | 0.2310 + 0.0957i | 0.0957 + 0.2310i |
| −0.0488 + 0.2452i | −0.0488 + 0.2452i | 0.2079 + 0.1389i | −0.0488 + 0.2452i |
| 0 + 0.2500i | 0 − 0.2500i | 0 + 0.2500i | 0 − 0.2500i |
| −0.1389 + 0.2079i | 0.1389 − 0.2079i | −0.0488 + 0.2452i | 0.1389 − 0.2079i |
| −0.2310 + 0.0957i | 0.2310 − 0.0957i | −0.0957 + 0.2310i | 0.2310 − 0.0957i |
| −0.2452 − 0.0488i | 0.2452 + 0.0488i | −0.1389 + 0.2079i | 0.2452 + 0.0488i |
| ans(:, :, 2, 8) = | | ans(:, :, 2, 16) = | |
| 0.2500 | 0.2500 | 0.2500 | 0.2500 |
| 0.1389 + 0.2079i | 0.1389 + 0.2079i | 0.2079 + 0.1389i | 0.1389 + 0.2079i |
| −0.0957 + 0.2310i | −0.0957 + 0.2310i | 0.0957 + 0.2310i | −0.0957 + 0.2310i |
| −0.2452 + 0.0488i | −0.2452 + 0.0488i | −0.0488 + 0.2452i | −0.2452 + 0.0488i |
| 0 + 0.2500i | 0 − 0.2500i | 0 + 0.2500i | 0 − 0.2500i |
| −0.2079 + 0.1389i | 0.2079 − 0.1389i | −0.1389 + 0.2079i | 0.2079 − 0.1389i |
| −0.2310 − 0.0957i | 0.2310 + 0.0957i | −0.2310 + 0.0957i | 0.2310 + 0.0957i |
| −0.0488 − 0.2452i | 0.0488 + 0.2452i | −0.2452 − 0.0488i | 0.0488 + 0.2452i |
| ans(:, :, 3, 8) = | | ans(:, :, 3, 16) = | |
| 0.2500 | 0.2500 | 0.2500 | 0.2500 |
| 0.0488 + 0.2452i | 0.0488 + 0.2452i | 0.1389 + 0.2079i | 0.0488 + 0.2452i |
| −0.2310 + 0.0957i | −0.2310 + 0.0957i | −0.0957 + 0.2310i | −0.2310 + 0.0957i |
| −0.1389 − 0.2079i | −0.1389 − 0.2079i | −0.2452 + 0.0488i | −0.1389 − 0.2079i |
| 0 + 0.2500i | 0 − 0.2500i | 0 + 0.2500i | 0 − 0.2500i |
| −0.2452 + 0.0488i | 0.2452 − 0.0488i | −0.2079 + 0.1389i | 0.2452 − 0.0488i |
| −0.0957 − 0.2310i | 0.0957 + 0.2310i | −0.2310 − 0.0957i | 0.0957 + 0.2310i |
| 0.2079 − 0.1389i | −0.2079 + 0.1389i | −0.0488 − 0.2452i | −0.2079 + 0.1389i |

TABLE 2-continued

| ans(:, :, 4, 8) = | | ans(:, :, 4, 16) = | |
|---|---|---|---|
| 0.2500 | 0.2500 | 0.2500 | 0.2500 |
| −0.0488 + 0.2452i | −0.0488 + 0.2452i | 0.0488 + 0.2452i | −0.0488 + 0.2452i |
| −0.2310 − 0.0957i | −0.2310 − 0.0957i | −0.2310 + 0.0957i | −0.2310 − 0.0957i |
| 0.1389 − 0.2079i | 0.1389 − 0.2079i | −0.1389 − 0.2079i | 0.1389 − 0.2079i |
| 0 + 0.2500i | 0 − 0.2500i | 0 + 0.2500i | 0 − 0.2500i |
| −0.2452 − 0.0488i | 0.2452 + 0.0488i | −0.2452 + 0.0488i | 0.2452 + 0.0488i |
| 0.0957 − 0.2310i | −0.0957 + 0.2310i | −0.0957 − 0.2310i | −0.0957 + 0.2310i |
| 0.2079 + 0.1389i | −0.2079 − 0.1389i | 0.2079 − 0.1389i | −0.2079 − 0.1389i |
| ans(:, :, 5, 8) = | | ans(:, :, 5, 16) = | |
| 0.2500 | 0.2500 | 0.2500 | 0.2500 |
| −0.1389 + 0.2079i | −0.1389 + 0.2079i | −0.0488 + 0.2452i | −0.1389 + 0.2079i |
| −0.0957 − 0.2310i | −0.0957 − 0.2310i | −0.2310 − 0.0957i | −0.0957 − 0.2310i |
| 0.2452 + 0.0488i | 0.2452 + 0.0488i | 0.1389 − 0.2079i | 0.2452 + 0.0488i |
| 0 + 0.2500i | 0 − 0.2500i | 0 + 0.2500i | 0 − 0.2500i |
| −0.2079 − 0.1389i | 0.2079 + 0.1389i | −0.2452 − 0.0488i | 0.2079 + 0.1389i |
| 0.2310 − 0.0957i | −0.2310 + 0.0957i | 0.0957 − 0.2310i | −0.2310 + 0.0957i |
| −0.0488 + 0.2452i | 0.0488 − 0.2452i | 0.2079 + 0.1389i | 0.0488 − 0.2452i |
| ans(:, :, 6, 8) = | | ans(:, :, 6, 16) = | |
| 0.2500 | 0.2500 | 0.2500 | 0.2500 |
| −0.2079 + 0.1389i | −0.2079 + 0.1389i | −0.1389 + 0.2079i | −0.2079 + 0.1389i |
| 0.0957 − 0.2310i | 0.0957 − 0.2310i | −0.0957 − 0.2310i | 0.0957 − 0.2310i |
| 0.0488 + 0.2452i | 0.0488 + 0.2452i | 0.2452 + 0.0488i | 0.0488 + 0.2452i |
| 0 + 0.2500i | 0 − 0.2500i | 0 + 0.2500i | 0 − 0.2500i |
| −0.1389 − 0.2079i | 0.1389 + 0.2079i | −0.2079 − 0.1389i | 0.1389 + 0.2079i |
| 0.2310 + 0.0957i | −0.2310 − 0.0957i | 0.2310 − 0.0957i | −0.2310 − 0.0957i |
| −0.2452 + 0.0488i | 0.2452 − 0.0488i | −0.0488 + 0.2452i | 0.2452 − 0.0488i |
| ans(:, :, 7, 8) = | | ans(:, :, 7, 16) = | |
| 0.2500 | 0.2500 | 0.2500 | 0.2500 |
| −0.2452 + 0.0488i | −0.2452 + 0.0488i | −0.2079 + 0.1389i | −0.2452 + 0.0488i |
| 0.2310 − 0.0957i | 0.2310 − 0.0957i | 0.0957 − 0.2310i | 0.2310 − 0.0957i |
| −0.2079 + 0.1389i | −0.2079 + 0.1389i | 0.0488 + 0.2452i | −0.2079 + 0.1389i |
| 0 + 0.2500i | 0 − 0.2500i | 0 + 0.2500i | 0 − 0.2500i |
| −0.0488 − 0.2452i | 0.0488 + 0.2452i | −0.1389 − 0.2079i | 0.0488 + 0.2452i |
| 0.0957 + 0.2310i | −0.0957 − 0.2310i | 0.2310 + 0.0957i | −0.0957 − 0.2310i |
| −0.1389 − 0.2079i | 0.1389 + 0.2079i | −0.2452 + 0.0488i | 0.1389 + 0.2079i |
| ans(:, :, 8, 8) = | | ans(:, :, 8, 16) = | |
| 0.2500 | 0.2500 | 0.2500 | 0.2500 |
| −0.2452 − 0.0488i | −0.2452 − 0.0488i | −0.2452 + 0.0488i | −0.2452 − 0.0488i |
| 0.2310 + 0.0957i | 0.2310 + 0.0957i | 0.2310 − 0.0957i | 0.2310 + 0.0957i |
| −0.2079 − 0.1389i | −0.2079 − 0.1389i | −0.2079 + 0.1389i | −0.2079 − 0.1389i |
| 0 + 0.2500i | 0 − 0.2500i | 0 + 0.2500i | 0 − 0.2500i |
| 0.0488 − 0.2452i | −0.0488 + 0.2452i | −0.0488 − 0.2452i | −0.0488 + 0.2452i |
| −0.0957 + 0.2310i | 0.0957 − 0.2310i | 0.0957 + 0.2310i | 0.0957 − 0.2310i |
| 0.1389 − 0.2079i | −0.1389 + 0.2079i | −0.1389 − 0.2079i | −0.1389 + 0.2079i |
| ans(:, :, 9, 8) = | | ans(:, :, 9, 16) = | |
| 0.2500 | 0.2500 | 0.2500 | 0.2500 |
| −0.2079 − 0.1389i | −0.2079 − 0.1389i | −0.2452 − 0.0488i | −0.2079 − 0.1389i |
| 0.0957 + 0.2310i | 0.0957 + 0.2310i | 0.2310 + 0.0957i | 0.0957 + 0.2310i |
| 0.0488 − 0.2452i | 0.0488 − 0.2452i | −0.2079 − 0.1389i | 0.0488 − 0.2452i |
| 0 + 0.2500i | 0 − 0.2500i | 0 + 0.2500i | 0 − 0.2500i |
| 0.1389 − 0.2079i | −0.1389 + 0.2079i | 0.0488 − 0.2452i | −0.1389 + 0.2079i |
| −0.2310 + 0.0957i | 0.2310 − 0.0957i | −0.0957 + 0.2310i | 0.2310 − 0.0957i |
| 0.2452 + 0.0488i | −0.2452 − 0.0488i | 0.1389 − 0.2079i | −0.2452 − 0.0488i |
| ans(:, :, 10, 8) = | | ans(:, :, 10, 16) = | |
| 0.2500 | 0.2500 | 0.2500 | 0.2500 |
| −0.1389 − 0.2079i | −0.1389 − 0.2079i | −0.2079 − 0.1389i | −0.1389 − 0.2079i |
| −0.0957 + 0.2310i | −0.0957 + 0.2310i | 0.0957 + 0.2310i | −0.0957 + 0.2310i |
| 0.2452 − 0.0488i | 0.2452 − 0.0488i | 0.0488 − 0.2452i | 0.2452 − 0.0488i |
| 0 + 0.2500i | 0 − 0.2500i | 0 + 0.2500i | 0 − 0.2500i |
| 0.2079 − 0.1389i | −0.2079 + 0.1389i | 0.1389 − 0.2079i | −0.2079 + 0.1389i |
| −0.2310 − 0.0957i | 0.2310 + 0.0957i | −0.2310 + 0.0957i | 0.2310 + 0.0957i |
| 0.0488 + 0.2452i | −0.0488 − 0.2452i | 0.2452 + 0.0488i | −0.0488 − 0.2452i |

TABLE 2-continued

| ans(:, :, 11, 8) = | | ans(:, :, 11, 16) = | |
|---|---|---|---|
| 0.2500 | 0.2500 | 0.2500 | 0.2500 |
| −0.0488 − 0.2452i | −0.0488 − 0.2452i | −0.1389 − 0.2079i | −0.0488 − 0.2452i |
| −0.2310 + 0.0957i | −0.2310 + 0.0957i | −0.0957 + 0.2310i | −0.2310 + 0.0957i |
| 0.1389 + 0.2079i | 0.1389 + 0.2079i | 0.2452 − 0.0488i | 0.1389 + 0.2079i |
| 0 + 0.2500i | 0 − 0.2500i | 0 + 0.2500i | 0 − 0.2500i |
| 0.2452 − 0.0488i | −0.2452 + 0.0488i | 0.2079 − 0.1389i | −0.2452 + 0.0488i |
| −0.0957 − 0.2310i | 0.0957 + 0.2310i | −0.2310 − 0.0957i | 0.0957 + 0.2310i |
| −0.2079 + 0.1389i | 0.2079 − 0.1389i | 0.0488 + 0.2452i | 0.2079 − 0.1389i |
| **ans(:, :, 12, 8) =** | | **ans(:, :, 12, 16) =** | |
| 0.2500 | 0.2500 | 0.2500 | 0.2500 |
| 0.0488 − 0.2452i | 0.0488 − 0.2452i | −0.0488 − 0.2452i | 0.0488 − 0.2452i |
| −0.2310 − 0.0957i | −0.2310 − 0.0957i | −0.2310 + 0.0957i | −0.2310 − 0.0957i |
| −0.1389 + 0.2079i | −0.1389 + 0.2079i | 0.1389 + 0.2079i | −0.1389 + 0.2079i |
| 0 + 0.2500i | 0 − 0.2500i | 0 + 0.2500i | 0 − 0.2500i |
| 0.2452 + 0.0488i | −0.2452 − 0.0488i | 0.2452 − 0.0488i | −0.2452 − 0.0488i |
| 0.0957 − 0.2310i | −0.0957 + 0.2310i | −0.0957 − 0.2310i | −0.0957 + 0.2310i |
| −0.2079 − 0.1389i | 0.2079 + 0.1389i | −0.2079 + 0.1389i | 0.2079 + 0.1389i |
| **ans(:, :, 13, 8) =** | | **ans(:, :, 13, 16) =** | |
| 0.2500 | 0.2500 | 0.2500 | 0.2500 |
| 0.1389 − 0.2079i | 0.1389 − 0.2079i | 0.0488 − 0.2452i | 0.1389 − 0.2079i |
| −0.0957 − 0.2310i | −0.0957 − 0.2310i | −0.2310 − 0.0957i | −0.0957 − 0.2310i |
| −0.2452 − 0.0488i | −0.2452 − 0.0488i | −0.1389 + 0.2079i | −0.2452 − 0.0488i |
| 0 + 0.2500i | 0 − 0.2500i | 0 + 0.2500i | 0 − 0.2500i |
| 0.2079 + 0.1389i | −0.2079 − 0.1389i | 0.2452 + 0.0488i | −0.2079 − 0.1389i |
| 0.2310 − 0.0957i | −0.2310 + 0.0957i | 0.0957 − 0.2310i | −0.2310 + 0.0957i |
| 0.0488 − 0.2452i | −0.0488 + 0.2452i | −0.2079 − 0.1389i | −0.0488 + 0.2452i |
| **ans(:, :, 14, 8) =** | | **ans(:, :, 14, 16) =** | |
| 0.2500 | 0.2500 | 0.2500 | 0.2500 |
| 0.2079 − 0.1389i | 0.2079 − 0.1389i | 0.1389 − 0.2079i | 0.2079 − 0.1389i |
| 0.0957 − 0.2310i | 0.0957 − 0.2310i | −0.0957 − 0.2310i | 0.0957 − 0.2310i |
| −0.0488 − 0.2452i | −0.0488 − 0.2452i | −0.2452 − 0.0488i | −0.0488 − 0.2452i |
| 0 + 0.2500i | 0 − 0.2500i | 0 + 0.2500i | 0 − 0.2500i |
| 0.1389 + 0.2079i | −0.1389 − 0.2079i | 0.2079 + 0.1389i | −0.1389 − 0.2079i |
| 0.2310 + 0.0957i | −0.2310 − 0.0957i | 0.2310 − 0.0957i | −0.2310 − 0.0957i |
| 0.2452 − 0.0488i | −0.2452 + 0.0488i | 0.0488 − 0.2452i | −0.2452 + 0.0488i |
| **ans(:, :, 15, 8) =** | | **ans(:, :, 15, 16) =** | |
| 0.2500 | 0.2500 | 0.2500 | 0.2500 |
| 0.2452 − 0.0488i | 0.2452 − 0.0488i | 0.2079 − 0.1389i | 0.2452 − 0.0488i |
| 0.2310 − 0.0957i | 0.2310 − 0.0957i | 0.0957 − 0.2310i | 0.2310 − 0.0957i |
| 0.2079 − 0.1389i | 0.2079 − 0.1389i | −0.0488 − 0.2452i | 0.2079 − 0.1389i |
| 0 + 0.2500i | 0 − 0.2500i | 0 + 0.2500i | 0 − 0.2500i |
| 0.0488 + 0.2452i | −0.0488 − 0.2452i | 0.1389 + 0.2079i | −0.0488 − 0.2452i |
| 0.0957 + 0.2310i | −0.0957 − 0.2310i | 0.2310 + 0.0957i | −0.0957 − 0.2310i |
| 0.1389 + 0.2079i | −0.1389 − 0.2079i | 0.2452 − 0.0488i | −0.1389 − 0.2079i |
| **ans(:, :, 16, 8) =** | | **ans(:, :, 16, 16) =** | |
| 0.2500 | 0.2500 | 0.2500 | 0.2500 |
| 0.2452 + 0.0488i | 0.2452 + 0.0488i | 0.2452 − 0.0488i | 0.2452 + 0.0488i |
| 0.2310 + 0.0957i | 0.2310 + 0.0957i | 0.2310 − 0.0957i | 0.2310 + 0.0957i |
| 0.2079 + 0.1389i | 0.2079 + 0.1389i | 0.2079 − 0.1389i | 0.2079 + 0.1389i |
| 0 + 0.2500i | 0 − 0.2500i | 0 + 0.2500i | 0 − 0.2500i |
| −0.0488 + 0.2452i | 0.0488 − 0.2452i | 0.0488 + 0.2452i | 0.0488 − 0.2452i |
| −0.0957 + 0.2310i | 0.0957 − 0.2310i | 0.0957 + 0.2310i | 0.0957 − 0.2310i |
| −0.1389 + 0.2079i | 0.1389 − 0.2079i | 0.1389 + 0.2079i | 0.1389 − 0.2079i. |

3. A communication method of a receiver, the communication method comprising:

extracting a first precoding matrix indicator corresponding to a first codeword included in a first codebook and a second precoding matrix indicator corresponding to a second codeword included in a second codeword; and transmitting, to a transmitter, the first precoding matrix indicator and the second precoding matrix indicator, wherein a combination of the first precoding matrix indicator and the second precoding matrix indicator indicates one of precoding matrix candidates disclosed in the following Table 3, wherein in Table 3, ans(;,;,n) corresponds to an $n^{th}$ codeword in the first codebook, and i denotes an imaginary unit:

TABLE 3

| | | | | |
|---|---|---|---|---|
| ans(:, :, 1) = | | | | |
| 0.1581 | 0.1581 | 0.1581 | 0.1581 | |
| 0.1581 | 0.1581 | 0 + 0.1581i | 0 + 0.1581i | |
| 0.1581 | 0.1581 | −0.1581 | −0.1581 | |
| 0.1581 | 0.1581 | 0 − 0.1581i | 0 − 0.1581i | |
| 0.1581 | −0.1581 | 0.1581 | −0.1581 | |
| 0.1581 | −0.1581 | 0 + 0.1581i | 0 − 0.1581i | |
| 0.1581 | −0.1581 | −0.1581 | 0.1581 | |
| 0.1581 | −0.1581 | 0 − 0.1581i | 0 + 0.1581i | |
| ans(:, :, 2) = | | | | |
| 0.1581 | 0.1581 | 0.1581 | 0.1581 | 0.1581 |
| 0.1118 + 0.1118i | 0.1118 + 0.1118i | −0.1118 + 0.1118i | −0.1118 + 0.1118i | −0.1118 |
| 0.0000 + 0.1581i | 0.0000 + 0.1581i | −0.0000 − 0.1581i | −0.0000 − 0.1581i | 0.0000 |
| −0.1118 + 0.1118i | −0.1118 + 0.1118i | 0.1118 + 0.1118i | 0.1118 + 0.1118i | 0.1118 |
| 0.1581 | −0.1581 | 0.1581 | −0.1581 | 0.1581 |
| 0.1118 + 0.1118i | −0.1118 − 0.1118i | −0.1118 + 0.1118i | 0.1118 − 0.1118i | −0.1118 |
| 0.0000 + 0.1581i | −0.0000 − 0.1581i | −0.0000 − 0.1581i | 0.0000 + 0.1581i | 0.0000 |
| −0.1118 + 0.1118i | 0.1118 − 0.1118i | 0.1118 + 0.1118i | −0.1118 − 0.1118i | 0.1118 |
| ans(:, :, 3) = | | | | |
| 0.1581 | 0.1581 | 0.1581 | 0.1581 | 0.1581 |
| 0.1461 + 0.0605i | 0.1461 + 0.0605i | −0.0605 + 0.1461i | −0.0605 + 0.1461i | −0.1461 |
| 0.1118 + 0.1118i | 0.1118 + 0.1118i | −0.1118 − 0.1118i | −0.1118 − 0.1118i | 0.1118 |
| 0.0605 + 0.1461i | 0.0605 + 0.1461i | 0.1461 − 0.0605i | 0.1461 − 0.0605i | −0.0605 |
| 0.1581 | −0.1581 | 0.1581 | −0.1581 | 0.1581 |
| 0.1461 + 0.0605i | −0.1461 − 0.0605i | −0.0605 + 0.1461i | 0.0605 − 0.1461i | −0.1461 |
| 0.1118 + 0.1118i | −0.1118 − 0.1118i | −0.1118 − 0.1118i | 0.1118 + 0.1118i | 0.1118 |
| 0.0605 + 0.1461i | −0.0605 − 0.1461i | 0.1461 − 0.0605i | −0.1461 + 0.0605i | −0.0605 |
| ans(:, :, 4) = | | | | |
| 0.1581 | 0.1581 | 0.1581 | 0.1581 | 0.1581 |
| 0.0605 + 0.1461i | 0.0605 + 0.1461i | −0.1461 + 0.0605i | −0.1461 + 0.0605i | −0.0605 |
| −0.1118 + 0.1118i | −0.1118 + 0.1118i | 0.1118 − 0.1118i | 0.1118 − 0.1118i | −0.1118 |
| −0.1461 − 0.0605i | −0.1461 − 0.0605i | −0.0605 + 0.1461i | −0.0605 + 0.1461i | 0.1461 |
| 0.1581 | −0.1581 | 0.1581 | −0.1581 | 0.1581 |
| 0.0605 + 0.1461i | −0.0605 − 0.1461i | −0.1461 + 0.0605i | 0.1461 − 0.0605i | −0.0605 |
| −0.1118 + 0.1118i | 0.1118 − 0.1118i | 0.1118 − 0.1118i | −0.1118 + 0.1118i | −0.1118 |
| −0.1461 − 0.0605i | 0.1461 + 0.0605i | −0.0605 + 0.1461i | 0.0605 − 0.1461i | 0.1461. |

4. A communication method of a receiver, the communication method comprising:

extracting a first precoding matrix indicator corresponding to a first codeword included in a first codebook and a second precoding matrix indicator corresponding to a second codeword included in a second codeword; and transmitting, to a transmitter, the first precoding matrix indicator and the second precoding matrix indicator, wherein a combination of the first precoding matrix indicator and the second precoding matrix indicator indicates one of precoding matrix candidates disclosed in the following Table 4, wherein in Table 4, ans(:,:,n) corresponds to an $n^{th}$ codeword in the first codebook, and i denotes an imaginary unit:

TABLE 4

| | | | | | |
|---|---|---|---|---|---|
| ans(:, :, 1) = | | | | | |
| 0.1443 | 0.1443 | 0.1443 | 0.1443 | 0.1443 | |
| 0.1443 | 0.1443 | 0 + 0.1443i | 0 + 0.1443i | −0.1443 | |
| 0.1443 | 0.1443 | −0.1443 | −0.1443 | 0.1443 | |
| 0.1443 | 0.1443 | 0 − 0.1443i | 0 − 0.1443i | −0.1443 | |
| 0.1443 | −0.1443 | 0.1443 | −0.1443 | 0.1443 | |
| 0.1443 | −0.1443 | 0 + 0.1443i | 0 − 0.1443i | −0.1443 | |
| 0.1443 | −0.1443 | −0.1443 | 0.1443 | 0.1443 | |
| 0.1443 | −0.1443 | 0 − 0.1443i | 0 + 0.1443i | −0.1443 | |
| ans(:, :, 2) = | | | | | |
| 0.1443 | 0.1443 | 0.1443 | 0.1443 | 0.1443 | 0.144 |
| 0.1021 + 0.1021i | 0.1021 + 0.1021i | −0.1021 + 0.1021i | −0.1021 + 0.1021i | −0.1021 − 0.1021i | −0.10 |
| 0.0000 + 0.1443i | 0.0000 + 0.1443i | −0.0000 − 0.1443i | −0.0000 − 0.1443i | 0.0000 + 0.1443i | 0.000 |
| −0.1021 + 0.1021i | −0.1021 + 0.1021i | 0.1021 + 0.1021i | 0.1021 + 0.1021i | 0.1021 − 0.1021i | 0.102 |
| 0.1443 | −0.1443 | 0.1443 | −0.1443 | 0.1443 | −0.14 |
| 0.1021 + 0.1021i | −0.1021 − 0.1021i | −0.1021 + 0.1021i | 0.1021 − 0.1021i | −0.1021 − 0.1021i | 0.102 |
| 0.0000 + 0.1443i | −0.0000 − 0.1443i | −0.0000 − 0.1443i | 0.0000 + 0.1443i | 0.0000 + 0.1443i | −0.000 |
| −0.1021 + 0.1021i | 0.1021 − 0.1021i | 0.1021 + 0.1021i | −0.1021 − 0.1021i | 0.1021 − 0.1021i | −0.102 |
| ans(:, :, 3) = | | | | | |
| 0.1443 | 0.1443 | 0.1443 | 0.1443 | 0.1443 | 0.1443 |
| 0.1334 + 0.0552i | 0.1334 + 0.0552i | −0.0552 + 0.1334i | −0.0552 + 0.1334i | −0.1334 − 0.0552i | −0.133 |

TABLE 4-continued

| | | | | | |
|---|---|---|---|---|---|
| 0.1021 + 0.1021i | 0.1021 + 0.1021i | −0.1021 − 0.1021i | −0.1021 − 0.1021i | 0.1021 + 0.1021i | 0.1021 |
| 0.0552 + 0.1334i | 0.0552 + 0.1334i | 0.1334 − 0.0552i | 0.1334 − 0.0552i | −0.0552 − 0.1334i | −0.0552 |
| 0.1443 | −0.1443 | 0.1443 | −0.1443 | 0.1443 | −0.144 |
| 0.1334 + 0.0552i | −0.1334 − 0.0552i | −0.0552 + 0.1334i | 0.0552 − 0.1334i | −0.1334 − 0.0552i | 0.1334 |
| 0.1021 + 0.1021i | −0.1021 − 0.1021i | −0.1021 − 0.1021i | 0.1021 + 0.1021i | 0.1021 + 0.1021i | −0.102 |
| 0.0552 + 0.1334i | −0.0552 − 0.1334i | 0.1334 − 0.0552i | −0.1334 + 0.0552i | −0.0552 − 0.1334i | 0.0552 |
| ans(:, :, 4) = | | | | | |
| 0.1443 | 0.1443 | 0.1443 | 0.1443 | 0.1443 | 0.144 |
| 0.0552 + 0.1334i | 0.0552 + 0.1334i | −0.1334 + 0.0552i | −0.1334 + 0.0552i | −0.0552 − 0.1334i | −0.05 |
| −0.1021 + 0.1021i | −0.1021 + 0.1021i | 0.1021 − 0.1021i | 0.1021 − 0.1021i | −0.1021 + 0.1021i | −0.102 |
| −0.1334 − 0.0552i | −0.1334 − 0.0552i | −0.0552 + 0.1334i | −0.0552 + 0.1334i | 0.1334 + 0.0552i | 0.133 |
| 0.1443 | −0.1443 | 0.1443 | −0.1443 | 0.1443 | −0.144 |
| 0.0552 + 0.1334i | −0.0552 − 0.1334i | −0.1334 + 0.0552i | 0.1334 − 0.0552i | −0.0552 − 0.1334i | 0.055 |
| −0.1021 + 0.1021i | 0.1021 − 0.1021i | 0.1021 − 0.1021i | −0.1021 + 0.1021i | −0.1021 + 0.1021i | 0.102 |
| −0.1334 − 0.0552i | 0.1334 + 0.0552i | −0.0552 + 0.1334i | 0.0552 − 0.1334i | 0.1334 + 0.0552i | −0.133. |

5. A communication method of a receiver, the communication method comprising:

extracting a first precoding matrix indicator corresponding to a first codeword included in a first codebook and a second precoding matrix indicator corresponding to a second codeword included in a second codeword; and transmitting, to a transmitter, the first precoding matrix indicator and the second precoding matrix indicator, wherein a combination of the first precoding matrix indicator and the second precoding matrix indicator indicates one of precoding matrix candidates disclosed in the following Table 5, wherein in Table 5, ans(;,;,n) corresponds to an $n^{th}$ codeword in the first codebook, and i denotes an imaginary unit:

TABLE 5

| | | | | | | |
|---|---|---|---|---|---|---|
| ans(:, :, 1) = | | | | | | |
| 0.1336 | 0.1336 | 0.1336 | 0.1336 | 0.1336 | 0.1336 | 0.13 |
| 0.1336 | 0.1336 | 0 + 0.1336i | 0 + 0.1336i | −0.1336 | −0.1336 | |
| 0.1336 | 0.1336 | −0.1336 | −0.1336 | 0.1336 | 0.1336 | −0.1 |
| 0.1336 | 0.1336 | 0 − 0.1336i | 0 − 0.1336i | −0.1336 | −0.1336 | |
| 0.1336 | −0.1336 | 0.1336 | −0.1336 | 0.1336 | −0.1336 | 0.13 |
| 0.1336 | −0.1336 | 0 + 0.1336i | 0 − 0.1336i | −0.1336 | 0.1336 | |
| 0.1336 | −0.1336 | −0.1336 | 0.1336 | 0.1336 | −0.1336 | −0.1 |
| 0.1336 | −0.1336 | 0 − 0.1336i | 0 + 0.1336i | −0.1336 | 0.1336 | |
| ans(:, :, 2) = | | | | | | |
| 0.1336 | 0.1336 | 0.1336 | 0.1336 | 0.1336 | 0.1336 | 0.13 |
| 0.0945 + 0.0945i | 0.0945 + 0.0945i | −0.0945 + 0.0945i | −0.0945 + 0.0945i | −0.0945 − 0.0945i | −0.0945 − 0.0945i | 0.0 |
| 0.0000 + 0.1336i | 0.0000 + 0.1336i | −0.0000 − 0.1336i | −0.0000 − 0.1336i | 0.0000 + 0.1336i | 0.0000 + 0.1336i | −0.00 |
| −0.0945 + 0.0945i | −0.0945 + 0.0945i | 0.0945 + 0.0945i | 0.0945 + 0.0945i | 0.0945 − 0.0945i | 0.0945 − 0.0945i | −0.09 |
| 0.1336 | −0.1336 | 0.1336 | −0.1336 | 0.1336 | −0.1336 | 0.13 |
| 0.0945 + 0.0945i | −0.0945 − 0.0945i | −0.0945 + 0.0945i | 0.0945 − 0.0945i | −0.0945 − 0.0945i | 0.0945 + 0.0945i | 0.09 |
| 0.0000 + 0.1336i | −0.0000 − 0.1336i | −0.0000 − 0.1336i | 0.0000 + 0.1336i | 0.0000 + 0.1336i | −0.0000 − 0.1336i | −0.00 |
| −0.0945 + 0.0945i | 0.0945 − 0.0945i | 0.0945 + 0.0945i | −0.0945 − 0.0945i | 0.0945 − 0.0945i | −0.0945 + 0.0945i | −0.09 |
| ans(:, :, 3) = | | | | | | |
| 0.1336 | 0.1336 | 0.1336 | 0.1336 | 0.1336 | 0.1336 | 0.13 |
| 0.1235 + 0.0511i | 0.1235 + 0.0511i | −0.0511 + 0.1235i | −0.0511 + 0.1235i | −0.1235 − 0.0511i | −0.1235 − 0.051i | 0.0 |
| 0.0945 + 0.0945i | 0.0945 + 0.0945i | −0.0945 − 0.0945i | −0.0945 − 0.0945i | 0.0945 + 0.0945i | 0.0945 + 0.0945i | −0.0 |
| 0.0511 + 0.1235i | 0.0511 + 0.1235i | 0.1235 − 0.0511i | 0.1235 − 0.0511i | −0.0511 − 0.1235i | −0.0511 − 0.1235i | −0.12 |
| 0.1336 | −0.1336 | 0.1336 | −0.1336 | 0.1336 | −0.1336 | 0.1 |
| 0.1235 + 0.0511i | −0.1235 − 0.0511i | −0.0511 + 0.1235i | 0.0511 − 0.1235i | −0.1235 − 0.0511i | 0.1235 + 0.0511i | 0.05 |
| 0.0945 + 0.0945i | −0.0945 − 0.0945i | −0.0945 − 0.0945i | 0.0945 + 0.0945i | 0.0945 + 0.0945i | −0.0945 − 0.0945i | −0.09 |
| 0.0511 + 0.1235i | −0.0511 − 0.1235i | 0.1235 − 0.0511i | −0.1235 + 0.0511i | −0.0511 − 0.1235i | 0.0511 + 0.1235i | −0.12 |
| ans(:, :, 4) = | | | | | | |
| 0.1336 | 0.1336 | 0.1336 | 0.1336 | 0.1336 | 0.1336 | 0.13 |
| 0.0511 + 0.1235i | 0.0511 + 0.1235i | −0.1235 + 0.0511i | −0.1235 + 0.0511i | −0.0511 − 0.1235i | −0.0511 − 0.1235i | 0.1 |
| −0.0945 + 0.0945i | −0.0945 + 0. 0945i | 0.0945 − 0.0945i | 0.0945 − 0.0945i | −0.0945 + 0.0945i | −0.0945 + 0.0945i | 0.0 |
| −0.1235 − 0.0511i | −0.1235 − 0.0511i | −0.0511 + 0.1235i | −0.0511 + 0.1235i | 0.1235 + 0.0511i | 0.1235 + 0.0511i | 0.0 |
| 0.1336 | −0.1336 | 0.1336 | −0.1336 | 0.1336 | −0.1336 | 0.1 |
| 0.0511 + 0.1235i | −0.0511 − 0.1235i | −0.1235 + 0.0511i | 0.1235 − 0.0511i | −0.0511 − 0.1235i | 0.0511 + 0.1235i | 0.12 |
| −0.0945 + 0.0945i | 0.0945 − 0.0945i | 0.0945 − 0.0945i | −0.0945 + 0.0945i | −0.0945 + 0.0945i | 0.0945 − 0.0945i | 0.09 |
| −0.1235 − 0.0511i | 0.1235 + 0.0511i | −0.0511 + 0.1235i | 0.0511 − 0.1235i | 0.1235 + 0.0511i | −0.1235 − 0.0511i | 0.05. |

6. A communication method of a transmitter, the communication method comprising:

receiving, from a receiver, a first precoding matrix indicator corresponding to a first codeword included in a first codebook and a second precoding matrix indicator corresponding to a second codeword included in a second codeword; and determining a precoding matrix based on the first precoding matrix indicator and the second precoding matrix indicator, wherein the precoding matrix corresponds to one of precoding matrix candidates disclosed in Table 1, wherein in Table 1, ans(;,;m,n) indicates an inter product between ans(;,;m) in the first codebook and (;,;,n) in the second codebook, ans(;,;,m) corresponds to an $m^{th}$ codeword in the first codebook, ans(;,;,n) corresponds to an $n^{th}$ codeword in the second codebook, and i denotes an imaginary unit:

TABLE 1

| ans(:, :, 1, 1) = | ans(:, :, 1, 6) = | ans(:, :, 1, 11) = |
|---|---|---|
| 0.3536 | 0.3536 | 0.3536 |
| 0.3536 | 0.3468 + 0.0690i | 0.3266 + 0.1353i |
| 0.3536 | 0.3266 + 0.1353i | 0.2500 + 0.2500i |
| 0.3536 | 0.2940 + 0.1964i | 0.1353 + 0.3266i |
| 0.3536 | 0 + 0.3536i | −0.3536 |
| 0.3536 | −0.0690 + 0.3468i | −0.3266 − 0.1353i |
| 0.3536 | −0.1353 + 0.3266i | −0.2500 − 0.2500i |
| 0.3536 | −0.1964 + 0.2940i | −0.1353 − 0.3266i |

| ans(:, :, 2, 1) = | ans(:, :, 2, 6) = | ans(:, :, 2, 11) = |
|---|---|---|
| 0.3536 | 0.3536 | 0.3536 |
| 0.3266 + 0.1353i | 0.2940 + 0.1964i | 0.2500 + 0.2500i |
| 0.2500 + 0.2500i | 0.1353 + 0.3266i | 0.0000 + 0.3536i |
| 0.1353 + 0.3266i | −0.0690 + 0.3468i | −0.2500 + 0.2500i |
| 0.3536 | 0 + 0.3536i | −0.3536 |
| 0.3266 + 0.1353i | −0.1964 + 0.2940i | −0.2500 − 0.2500i |
| 0.2500 + 0.2500i | −0.3266 + 0.1353i | −0.0000 − 0.3536i |
| 0.1353 + 0.3266i | −0.3468 − 0.0690i | 0.2500 − 0.2500i |

| ans(:, :, 3, 1) = | ans(:, :, 3, 6) = | ans(:, :, 3, 11) = |
|---|---|---|
| 0.3536 | 0.3536 | 0.3536 |
| 0.2500 + 0.2500i | 0.1964 + 0.2940i | 0.1353 + 0.3266i |
| 0.0000 + 0.3536i | −0.1353 + 0.3266i | −0.2500 + 0.2500i |
| −0.2500 + 0.2500i | −0.3468 + 0.0690i | −0.3266 − 0.1353i |
| 0.3536 | 0 + 0.3536i | −0.3536 |
| 0.2500 + 0.2500i | −0.2940 + 0.1964i | −0.1353 − 0.3266i |
| 0.0000 + 0.3536i | −0.3266 − 0.1353i | 0.2500 − 0.2500i |
| −0.2500 + 0.2500i | −0.0690 − 0.3468i | 0.3266 + 0.1353i |

| ans(:, :, 4, 1) = | ans(:, :, 4, 6) = | ans(:, :, 4, 11) = |
|---|---|---|
| 0.3536 | 0.3536 | 0.3536 |
| 0.1353 + 0.3266i | 0.0690 + 0.3468i | 0.0000 + 0.3536i |
| −0.2500 + 0.2500i | −0.3266 + 0.1353i | −0.3536 + 0.0000i |
| −0.3266 − 0.1353i | −0.1964 − 0.2940i | −0.0000 − 0.3536i |
| 0.3536 | 0 + 0.3536i | −0.3536 |
| 0.1353 + 0.3266i | −0.3468 + 0.0690i | −0.0000 − 0.3536i |
| −0.2500 + 0.2500i | −0.1353 − 0.3266i | 0.3536 − 0.0000i |
| −0.3266 − 0.1353i | 0.2940 − 0.1964i | 0.0000 + 0.3536i |

| ans(:, :, 5, 1) = | ans(:, :, 5, 6) = | ans(:, :, 5, 11) = |
|---|---|---|
| 0.3536 | 0.3536 | 0.3536 |
| 0.0000 + 0.3536i | −0.0690 + 0.3468i | −0.1353 + 0.3266i |
| −0.3536 + 0.0000i | −0.3266 − 0.1353i | −0.2500 − 0.2500i |
| −0.0000 − 0.3536i | 0.1964 − 0.2940i | 0.3266 − 0.1353i |
| 0.3536 | 0 + 0.3536i | −0.3536 |
| 0.0000 + 0.3536i | −0.3468 − 0.0690i | 0.1353 − 0.3266i |
| −0.3536 + 0.0000i | 0.1353 − 0.3266i | 0.2500 + 0.2500i |
| −0.0000 − 0.3536i | 0.2940 + 0.1964i | −0.3266 + 0.1353i |

TABLE 1-continued

| ans(:, :, 6, 1) = | ans(:, :, 6, 6) = | ans(:, :, 6, 11) = |
|---|---|---|
| 0.3536 | 0.3536 | 0.3536 |
| −0.1353 + 0.3266i | −0.1964 + 0.2940i | −0.2500 + 0.2500i |
| −0.2500 − 0.2500i | −0.1353 − 0.3266i | −0.0000 − 0.3536i |
| 0.3266 − 0.1353i | 0.3468 + 0.0690i | 0.2500 + 0.2500i |
| 0.3536 | 0 + 0.3536i | −0.3536 |
| −0.1353 + 0.3266i | −0.2940 − 0.1964i | 0.2500 − 0.2500i |
| −0.2500 − 0.2500i | 0.3266 − 0.1353i | 0.0000 + 0.3536i |
| 0.3266 − 0.1353i | −0.0690 + 0.3468i | −0.2500 − 0.2500i |

| ans(:, :, 7, 1) = | ans(:, :, 7, 6) = | ans(:, :, 7, 11) = |
|---|---|---|
| 0.3536 | 0.3536 | 0.3536 |
| −0.2500 + 0.2500i | −0.2940 + 0.1964i | −0.3266 + 0.1353i |
| −0.0000 − 0.3536i | 0.1353 − 0.3266i | 0.2500 − 0.2500i |
| 0.2500 + 0.2500i | 0.0690 + 0.3468i | −0.1353 + 0.3266i |
| 0.3536 | 0 + 0.3536i | −0.3536 |
| −0.2500 + 0.2500i | −0.1964 − 0.2940i | 0.3266 − 0.1353i |
| −0.0000 − 0.3536i | 0.3266 + 0.1353i | −0.2500 + 0.2500i |
| 0.2500 + 0.2500i | −0.3468 + 0.0690i | 0.1353 − 0.3266i |

| ans(:, :, 8, 1) = | ans(:, :, 8, 6) = | ans(:, :, 8, 11) = |
|---|---|---|
| 0.3536 | 0.3536 | 0.3536 |
| −0.3266 + 0.1353i | −0.3468 + 0.0690i | −0.3536 + 0.0000i |
| 0.2500 − 0.2500i | 0.3266 − 0.1353i | 0.3536 − 0.0000i |
| −0.1353 + 0.3266i | −0.2940 + 0.1964i | −0.3536 + 0.0000i |
| 0.3536 | 0 + 0.3536i | −0.3536 |
| −0.3266 + 0.1353i | −0.0690 − 0.3468i | 0.3536 − 0.0000i |
| 0.2500 − 0.2500i | 0.1353 + 0.3266i | −0.3536 + 0.0000i |
| −0.1353 + 0.3266i | −0.1964 − 0.2940i | 0.3536 − 0.0000i |

| ans(:, :, 9, 1) = | ans(:, :, 9, 6) = | ans(:, :, 9, 11) = |
|---|---|---|
| 0.3536 | 0.3536 | 0.3536 |
| −0.3536 + 0.0000i | −0.3468 − 0.0690i | −0.3266 − 0.1353i |
| 0.3536 − 0.0000i | 0.3266 + 0.1353i | 0.2500 + 0.2500i |
| −0.3536 + 0.0000i | −0.2940 − 0.1964i | −0.1353 − 0.3266i |
| 0.3536 | 0 + 0.3536i | −0.3536 |
| −0.3536 + 0.0000i | 0.0690 − 0.3468i | 0.3266 + 0.1353i |
| 0.3536 − 0.0000i | −0.1353 + 0.3266i | −0.2500 − 0.2500i |
| −0.3536 + 0.0000i | 0.1964 − 0.2940i | 0.1353 + 0.3266i |

| ans(:, :, 10, 1) = | ans(:, :, 10, 6) = | ans(:, :, 10, 11) = |
|---|---|---|
| 0.3536 | 0.3536 | 0.3536 |
| −0.3266 − 0.1353i | −0.2940 − 0.1964i | −0.2500 − 0.2500i |
| 0.2500 + 0.2500i | 0.1353 + 0.3266i | 0.0000 + 0.3536i |
| −0.1353 − 0.3266i | 0.0690 − 0.3468i | 0.2500 − 0.2500i |
| 0.3536 | 0 + 0.3536i | −0.3536 |
| −0.3266 − 0.1353i | 0.1964 − 0.2940i | 0.2500 + 0.2500i |
| 0.2500 + 0.2500i | −0.3266 + 0.1353i | −0.0000 − 0.3536i |
| −0.1353 − 0.3266i | 0.3468 + 0.0690i | −0.2500 + 0.2500i |

| ans(:, :, 11, 1) = | ans(:, :, 11, 6) = | ans(:, :, 11, 11) = |
|---|---|---|
| 0.3536 | 0.3536 | 0.3536 |
| −0.2500 − 0.2500i | −0.1964 − 0.2940i | −0.1353 − 0.3266i |
| 0.0000 + 0.3536i | −0.1353 + 0.3266i | −0.2500 + 0.2500i |
| 0.2500 − 0.2500i | 0.3468 − 0.0690i | 0.3266 + 0.1353i |
| 0.3536 | 0 + 0.3536i | −0.3536 |
| −0.2500 − 0.2500i | 0.2940 − 0.1964i | 0.1353 + 0.3266i |
| 0.0000 + 0.3536i | −0.3266 − 0.1353i | 0.2500 − 0.2500i |
| 0.2500 − 0.2500i | 0.0690 + 0.3468i | −0.3266 − 0.1353i |

| ans(:, :, 12, 1) = | ans(:, :, 12, 6) = | ans(:, :, 12, 11) = |
|---|---|---|
| 0.3536 | 0.3536 | 0.3536 |
| −0.1353 − 0.3266i | −0.0690 − 0.3468i | −0.0000 − 0.3536i |
| −0.2500 + 0.2500i | −0.3266 + 0.1353i | −0.3536 + 0.0000i |
| 0.3266 + 0.1353i | 0.1964 + 0.2940i | 0.0000 + 0.3536i |
| 0.3536 | 0 + 0.3536i | −0.3536 |
| −0.1353 − 0.3266i | 0.3468 − 0.0690i | 0.0000 + 0.3536i |
| −0.2500 + 0.2500i | −0.1353 − 0.3266i | 0.3536 − 0.0000i |
| 0.3266 + 0.1353i | −0.2940 + 0.1964i | −0.0000 − 0.3536i |

TABLE 1-continued

| ans(:, :, 13, 1) = | ans(:, :, 13, 6) = | ans(:, :, 13, 11) = |
|---|---|---|
| 0.3536 | 0.3536 | 0.3536 |
| −0.0000 − 0.3536i | 0.0690 − 0.3468i | 0.1353 − 0.3266i |
| −0.3536 + 0.0000i | −0.3266 − 0.1353i | −0.2500 − 0.2500i |
| 0.0000 + 0.3536i | −0.1964 + 0.2940i | −0.3266 + 0.1353i |
| 0.3536 | 0 + 0.3536i | −0.3536 |
| −0.0000 − 0.3536i | 0.3468 + 0.0690i | −0.1353 + 0.3266i |
| −0.3536 + 0.0000i | 0.1353 − 0.3266i | 0.2500 + 0.2500i |
| 0.0000 + 0.3536i | −0.2940 − 0.1964i | 0.3266 − 0.1353i |

| ans(:, :, 14, 1) = | ans(:, :, 14, 6) = | ans(:, :, 14, 11) = |
|---|---|---|
| 0.3536 | 0.3536 | 0.3536 |
| 0.1353 − 0.3266i | 0.1964 − 0.2940i | 0.2500 − 0.2500i |
| −0.2500 − 0.2500i | −0.1353 − 0.3266i | −0.0000 − 0.3536i |
| −0.3266 + 0.1353i | −0.3468 − 0.0690i | −0.2500 − 0.2500i |
| 0.3536 | 0 + 0.3536i | −0.3536 |
| 0.1353 − 0.3266i | 0.2940 + 0.1964i | −0.2500 + 0.2500i |
| −0.2500 − 0.2500i | 0.3266 − 0.1353i | 0.0000 + 0.3536i |
| −0.3266 + 0.1353i | 0.0690 − 0.3468i | 0.2500 + 0.2500i |

| ans(:, :, 15, 1) = | ans(:, :, 15, 6) = | ans(:, :, 15, 11) = |
|---|---|---|
| 0.3536 | 0.3536 | 0.3536 |
| 0.2500 − 0.2500i | 0.2940 − 0.1964i | 0.3266 − 0.1353i |
| −0.0000 − 0.3536i | 0.1353 − 0.3266i | 0.2500 − 0.2500i |
| −0.2500 − 0.2500i | −0.0690 − 0.3468i | 0.1353 − 0.3266i |
| 0.3536 | 0 + 0.3536i | −0.3536 |
| 0.2500 − 0.2500i | 0.1964 + 0.2940i | −0.3266 + 0.1353i |
| −0.0000 − 0.3536i | 0.3266 + 0.1353i | −0.2500 + 0.2500i |
| −0.2500 − 0.2500i | 0.3468 − 0.0690i | −0.1353 + 0.3266i |

| ans(:, :, 16, 1) = | ans(:, :, 16, 6) = | ans(:, :, 16, 11) = |
|---|---|---|
| 0.3536 | 0.3536 | 0.3536 |
| 0.3266 − 0.1353i | 0.3468 − 0.0690i | 0.3536 |
| 0.2500 − 0.2500i | 0.3266 − 0.1353i | 0.3536 |
| 0.1353 − 0.3266i | 0.2940 − 0.1964i | 0.3536 |
| 0.3536 | 0 + 0.3536i | −0.3536 |
| 0.3266 − 0.1353i | 0.0690 + 0.3468i | −0.3536 |
| 0.2500 − 0.2500i | 0.1353 + 0.3266i | −0.3536 |
| 0.1353 − 0.3266i | 0.1964 + 0.2940i | −0.3536 |

| ans(:, :, 1, 2) = | ans(:, :, 1, 7) = | ans(:, :, 1, 12) = |
|---|---|---|
| 0.3536 | 0.3536 | 0.3536 |
| 0.3536 | 0.3468 + 0.0690i | 0.3266 + 0.1353i |
| 0.3536 | 0.3266 + 0.1353i | 0.2500 + 0.2500i |
| 0.3536 | 0.2940 + 0.1964i | 0.1353 + 0.3266i |
| 0 + 0.3536i | −0.3536 | 0 − 0.3536i |
| 0 + 0.3536i | −0.3468 − 0.0690i | 0.1353 − 0.3266i |
| 0 + 0.3536i | −0.3266 − 0.1353i | 0.2500 − 0.2500i |
| 0 + 0.3536i | −0.2940 − 0.1964i | 0.3266 − 0.1353i |

| ans(:, :, 2, 2) = | ans(:, :, 2, 7) = | ans(:, :, 2, 12) = |
|---|---|---|
| 0.3536 | 0.3536 | 0.3536 |
| 0.3266 + 0.1353i | 0.2940 + 0.1964i | 0.2500 + 0.2500i |
| 0.2500 + 0.2500i | 0.1353 + 0.3266i | 0.0000 + 0.3536i |
| 0.1353 + 0.3266i | −0.0690 + 0.3468i | −0.2500 + 0.2500i |
| 0 + 0.3536i | −0.3536 | 0 − 0.3536i |
| −0.1353 + 0.3266i | −0.2940 − 0.1964i | 0.2500 − 0.2500i |
| −0.2500 + 0.2500i | −0.1353 − 0.3266i | 0.3536 − 0.0000i |
| −0.3266 + 0.1353i | 0.0690 − 0.3468i | 0.2500 + 0.2500i |

| ans(:, :, 3, 2) = | ans(:, :, 3, 7) = | ans(:, :, 3, 12) = |
|---|---|---|
| 0.3536 | 0.3536 | 0.3536 |
| 0.2500 + 0.2500i | 0.1964 + 0.2940i | 0.1353 + 0.3266i |
| 0.0000 + 0.3536i | −0.1353 + 0.3266i | −0.2500 + 0.2500i |
| −0.2500 + 0.2500i | −0.3468 + 0.0690i | −0.3266 − 0.1353i |
| 0 + 0.3536i | −0.3536 | 0 − 0.3536i |
| −0.2500 + 0.2500i | −0.1964 − 0.2940i | 0.3266 − 0.1353i |
| −0.3536 + 0.0000i | 0.1353 − 0.3266i | 0.2500 + 0.2500i |
| −0.2500 − 0.2500i | 0.3468 − 0.0690i | −0.1353 + 0.3266i |

TABLE 1-continued

| ans(:, :, 4, 2) = | ans(:, :, 4, 7) = | ans(:, :, 4, 12) = |
|---|---|---|
| 0.3536 | 0.3536 | 0.3536 |
| 0.1353 + 0.3266i | 0.0690 + 0.3468i | 0.0000 + 0.3536i |
| −0.2500 + 0.2500i | −0.3266 + 0.1353i | −0.3536 + 0.0000i |
| −0.3266 − 0.1353i | −0.1964 − 0.2940i | −0.0000 − 0.3536i |
| 0 + 0.3536i | −0.3536 | 0 − 0.3536i |
| −0.3266 + 0.1353i | −0.0690 − 0.3468i | 0.3536 − 0.0000i |
| −0.2500 − 0.2500i | 0.3266 − 0.1353i | 0.0000 + 0.3536i |
| 0.1353 − 0.3266i | 0.1964 + 0.2940i | −0.3536 + 0.0000i |

| ans(:, :, 5, 2) = | ans(:, :, 5, 7) = | ans(:, :, 5, 12) = |
|---|---|---|
| 0.3536 | 0.3536 | 0.3536 |
| 0.0000 + 0.3536i | −0.0690 + 0.3468i | −0.1353 + 0.3266i |
| −0.3536 + 0.0000i | −0.3266 − 0.1353i | −0.2500 − 0.2500i |
| −0.0000 − 0.3536i | 0.1964 − 0.2940i | 0.3266 − 0.1353i |
| 0 + 0.3536i | −0.3536 | 0 − 0.3536i |
| −0.3536 + 0.0000i | 0.0690 − 0.3468i | 0.3266 + 0.1353i |
| −0.0000 − 0.3536i | 0.3266 + 0.1353i | −0.2500 + 0.2500i |
| 0.3536 − 0.0000i | −0.1964 + 0.2940i | −0.1353 − 0.3266i |

| ans(:, :, 6, 2) = | ans(:, :, 6, 7) = | ans(:, :, 6, 12) = |
|---|---|---|
| 0.3536 | 0.3536 | 0.3536 |
| −0.1353 + 0.3266i | −0.1964 + 0.2940i | −0.2500 + 0.2500i |
| −0.2500 − 0.2500i | −0.1353 − 0.3266i | −0.0000 − 0.3536i |
| 0.3266 − 0.1353i | 0.3468 + 0.0690i | 0.2500 + 0.2500i |
| 0 + 0.3536i | −0.3536 | 0 − 0.3536i |
| −0.3266 − 0.1353i | 0.1964 − 0.2940i | 0.2500 + 0.2500i |
| 0.2500 − 0.2500i | 0.1353 + 0.3266i | −0.3536 + 0.0000i |
| 0.1353 + 0.3266i | −0.3468 − 0.0690i | 0.2500 − 0.2500i |

| ans(:, :, 7, 2) = | ans(:, :, 7, 7) = | ans(:, :, 7, 12) = |
|---|---|---|
| 0.3536 | 0.3536 | 0.3536 |
| −0.2500 + 0.2500i | −0.2940 + 0.1964i | −0.3266 + 0.1353i |
| −0.0000 − 0.3536i | 0.1353 − 0.3266i | 0.2500 − 0.2500i |
| 0.2500 + 0.2500i | 0.0690 + 0.3468i | −0.1353 + 0.3266i |
| 0 + 0.3536i | −0.3536 | 0 − 0.3536i |
| −0.2500 − 0.2500i | 0.2940 − 0.1964i | 0.1353 + 0.3266i |
| 0.3536 − 0.0000i | −0.1353 + 0.3266i | −0.2500 − 0.2500i |
| −0.2500 + 0.2500i | −0.0690 − 0.3468i | 0.3266 + 0.1353i |

| ans(:, :, 8, 2) = | ans(:, :, 8, 7) = | ans(:, :, 8, 12) = |
|---|---|---|
| 0.3536 | 0.3536 | 0.3536 |
| −0.3266 + 0.1353i | −0.3468 + 0.0690i | −0.3536 + 0.0000i |
| 0.2500 − 0.2500i | 0.3266 − 0.1353i | 0.3536 − 0.0000i |
| −0.1353 + 0.3266i | −0.2940 + 0.1964i | −0.3536 + 0.0000i |
| 0 + 0.3536i | −0.3536 | 0 − 0.3536i |
| −0.1353 − 0.3266i | 0.3468 − 0.0690i | 0.0000 + 0.3536i |
| 0.2500 + 0.2500i | −0.3266 + 0.1353i | −0.0000 − 0.3536i |
| −0.3266 − 0.1353i | 0.2940 − 0.1964i | 0.0000 + 0.3536i |

| ans(:, :, 9, 2) = | ans(:, :, 9, 7) = | ans(:, :, 9, 12) = |
|---|---|---|
| 0.3536 | 0.3536 | 0.3536 |
| −0.3536 + 0.0000i | −0.3468 − 0.0690i | −0.3266 − 0.1353i |
| 0.3536 − 0.0000i | 0.3266 + 0.1353i | 0.2500 + 0.2500i |
| −0.3536 + 0.0000i | −0.2940 − 0.1964i | −0.1353 − 0.3266i |
| 0 + 0.3536i | −0.3536 | 0 − 0.3536i |
| −0.0000 − 0.3536i | 0.3468 + 0.0690i | −0.1353 + 0.3266i |
| 0.0000 + 0.3536i | −0.3266 − 0.1353i | 0.2500 − 0.2500i |
| −0.0000 − 0.3536i | 0.2940 + 0.1964i | −0.3266 + 0.1353i |

| ans(:, :, 10, 2) = | ans(:, :, 10, 7) = | ans(:, :, 10, 12) = |
|---|---|---|
| 0.3536 | 0.3536 | 0.3536 |
| −0.3266 − 0.1353i | −0.2940 − 0.1964i | −0.2500 − 0.2500i |
| 0.2500 + 0.2500i | 0.1353 + 0.3266i | 0.0000 + 0.3536i |
| −0.1353 − 0.3266i | 0.0690 − 0.3468i | 0.2500 − 0.2500i |
| 0 + 0.3536i | −0.3536 | 0 − 0.3536i |
| 0.1353 − 0.3266i | 0.2940 + 0.1964i | −0.2500 + 0.2500i |
| −0.2500 + 0.2500i | −0.1353 − 0.3266i | 0.3536 − 0.0000i |
| 0.3266 − 0.1353i | −0.0690 + 0.3468i | −0.2500 − 0.2500i |

TABLE 1-continued

| ans(:, :, 11, 2) = | ans(:, :, 11, 7) = | ans(:, :, 11, 12) = |
|---|---|---|
| 0.3536 | 0.3536 | 0.3536 |
| −0.2500 − 0.2500i | −0.1964 − 0.2940i | −0.1353 − 0.3266i |
| 0.0000 + 0.3536i | −0.1353 + 0.3266i | −0.2500 + 0.2500i |
| 0.2500 − 0.2500i | 0.3468 − 0.0690i | 0.3266 + 0.1353i |
| 0 + 0.3536i | −0.3536 | 0 − 0.3536i |
| 0.2500 − 0.2500i | 0.1964 + 0.2940i | −0.3266 + 0.1353i |
| −0.3536 + 0.0000i | 0.1353 − 0.3266i | 0.2500 + 0.2500i |
| 0.2500 + 0.2500i | −0.3468 + 0.0690i | 0.1353 − 0.3266i |
| ans(:, :, 12, 2) = | ans(:, :, 12, 7) = | ans(:, :, 12, 12) = |
| 0.3536 | 0.3536 | 0.3536 |
| −0.1353 − 0.3266i | −0.0690 − 0.3468i | −0.0000 − 0.3536i |
| −0.2500 + 0.2500i | −0.3266 + 0.1353i | −0.3536 + 0.0000i |
| 0.3266 + 0.1353i | 0.1964 + 0.2940i | 0.0000 + 0.3536i |
| 0 + 0.3536i | −0.3536 | 0 − 0.3536i |
| 0.3266 − 0.1353i | 0.0690 + 0.3468i | −0.3536 + 0.0000i |
| −0.2500 − 0.2500i | 0.3266 − 0.1353i | 0.0000 + 0.3536i |
| −0.1353 + 0.3266i | −0.1964 − 0.2940i | 0.3536 − 0.0000i |
| ans(:, :, 13, 2) = | ans(:, :, 13, 7) = | ans(:, :, 13, 12) = |
| 0.3536 | 0.3536 | 0.3536 |
| −0.0000 − 0.3536i | 0.0690 − 0.3468i | 0.1353 − 0.3266i |
| −0.3536 + 0.0000i | −0.3266 − 0.1353i | −0.2500 − 0.2500i |
| 0.0000 + 0.3536i | −0.1964 + 0.2940i | −0.3266 + 0.1353i |
| 0 + 0.3536i | −0.3536 | 0 − 0.3536i |
| 0.3536 − 0.0000i | −0.0690 + 0.3468i | −0.3266 − 0.1353i |
| −0.0000 − 0.3536i | 0.3266 + 0.1353i | −0.2500 + 0.2500i |
| −0.3536 + 0.0000i | 0.1964 − 0.2940i | 0.1353 + 0.3266i |
| ans(:, :, 14, 2) = | ans(:, :, 14, 7) = | ans(:, :, 14, 12) = |
| 0.3536 | 0.3536 | 0.3536 |
| 0.1353 − 0.3266i | 0.1964 − 0.2940i | 0.2500 − 0.2500i |
| −0.2500 − 0.2500i | −0.1353 − 0.3266i | −0.0000 − 0.3536i |
| −0.3266 + 0.1353i | −0.3468 − 0.0690i | −0.2500 − 0.2500i |
| 0 + 0.3536i | −0.3536 | 0 − 0.3536i |
| 0.3266 + 0.1353i | −0.1964 + 0.2940i | −0.2500 − 0.2500i |
| 0.2500 − 0.2500i | 0.1353 + 0.3266i | −0.3536 + 0.0000i |
| −0.1353 − 0.3266i | 0.3468 + 0.0690i | −0.2500 + 0.2500i |
| ans(:, :, 15, 2) = | ans(:, :, 15, 7) = | ans(:, :, 15, 12) = |
| 0.3536 | 0.3536 | 0.3536 |
| 0.2500 − 0.2500i | 0.2940 − 0.1964i | 0.3266 − 0.1353i |
| −0.0000 − 0.3536i | 0.1353 − 0.3266i | 0.2500 − 0.2500i |
| −0.2500 − 0.2500i | −0.0690 − 0.3468i | 0.1353 − 0.3266i |
| 0 + 0.3536i | −0.3536 | 0 − 0.3536i |
| 0.2500 + 0.2500i | −0.2940 + 0.1964i | −0.1353 − 0.3266i |
| 0.3536 − 0.0000i | −0.1353 + 0.3266i | −0.2500 − 0.2500i |
| 0.2500 − 0.2500i | 0.0690 + 0.3468i | −0.3266 − 0.1353i |
| ans(:, :, 16, 2) = | ans(:, :, 16, 7) = | ans(:, :, 16, 12) = |
| 0.3536 | 0.3536 | 0.3536 |
| 0.3266 − 0.1353i | 0.3468 − 0.0690i | 0.3536 |
| 0.2500 − 0.2500i | 0.3266 − 0.1353i | 0.3536 |
| 0.1353 − 0.3266i | 0.2940 − 0.1964i | 0.3536 |
| 0 + 0.3536i | −0.3536 | 0 − 0.3536i |
| 0.1353 + 0.3266i | −0.3468 + 0.0690i | 0 − 0.3536i |
| 0.2500 + 0.2500i | −0.3266 + 0.1353i | 0 − 0.3536i |
| 0.3266 + 0.1353i | −0.2940 + 0.1964i | 0 − 0.3536i |
| ans(:, :, 1, 3) = | ans(:, :, 1, 8) = | ans(:, :, 1, 13) = |
| 0.3536 | 0.3536 | 0.3536 |
| 0.3536 | 0.3468 + 0.0690i | 0.2940 + 0.1964i |
| 0.3536 | 0.3266 + 0.1353i | 0.1353 + 0.3266i |
| 0.3536 | 0.2940 + 0.1964i | −0.0690 + 0.3468i |
| −0.3536 | 0 − 0.3536i | 0.3536 |
| −0.3536 | 0.0690 − 0.3468i | 0.2940 + 0.1964i |
| −0.3536 | 0.1353 − 0.3266i | 0.1353 + 0.3266i |
| −0.3536 | 0.1964 − 0.2940i | −0.0690 + 0.3468i |

TABLE 1-continued

| ans(:, :, 2, 3) = | ans(:, :, 2, 8) = | ans(:, :, 2, 13) = |
|---|---|---|
| 0.3536 | 0.3536 | 0.3536 |
| 0.3266 + 0.1353i | 0.2940 + 0.1964i | 0.1964 + 0.2940i |
| 0.2500 + 0.2500i | 0.1353 + 0.3266i | −0.1353 + 0.3266i |
| 0.1353 + 0.3266i | −0.0690 + 0.3468i | −0.3468 + 0.0690i |
| −0.3536 | 0 − 0.3536i | 0.3536 |
| −0.3266 − 0.1353i | 0.1964 − 0.2940i | 0.1964 + 0.2940i |
| −0.2500 − 0.2500i | 0.3266 − 0.1353i | −0.1353 + 0.3266i |
| −0.1353 − 0.3266i | 0.3468 + 0.0690i | −0.3468 + 0.0690i |
| ans(:, :, 3, 3) = | ans(:, :, 3, 8) = | ans(:, :, 3, 13) = |
| 0.3536 | 0.3536 | 0.3536 |
| 0.2500 + 0.2500i | 0.1964 + 0.2940i | 0.0690 + 0.3468i |
| 0.0000 + 0.3536i | −0.1353 + 0.3266i | −0.3266 + 0.1353i |
| −0.2500 + 0.2500i | −0.3468 + 0.0690i | −0.1964 − 0.2940i |
| −0.3536 | 0 − 0.3536i | 0.3536 |
| −0.2500 − 0.2500i | 0.2940 − 0.1964i | 0.0690 + 0.3468i |
| −0.0000 − 0.3536i | 0.3266 + 0.1353i | −0.3266 + 0.1353i |
| 0.2500 − 0.2500i | 0.0690 + 0.3468i | −0.1964 − 0.2940i |
| ans(:, :, 4, 3) = | ans(:, :, 4, 8) = | ans(:, :, 4, 13) = |
| 0.3536 | 0.3536 | 0.3536 |
| 0.1353 + 0.3266i | 0.0690 + 0.3468i | −0.0690 + 0.3468i |
| −0.2500 + 0.2500i | −0.3266 + 0.1353i | −0.3266 − 0.1353i |
| −0.3266 − 0.1353i | −0.1964 − 0.2940i | 0.1964 − 0.2940i |
| −0.3536 | 0 − 0.3536i | 0.3536 |
| −0.1353 − 0.3266i | 0.3468 − 0.0690i | −0.0690 + 0.3468i |
| 0.2500 − 0.2500i | 0.1353 + 0.3266i | −0.3266 − 0.1353i |
| 0.3266 + 0.1353i | −0.2940 + 0.1964i | 0.1964 − 0.2940i |
| ans(:, :, 5, 3) = | ans(:, :, 5, 8) = | ans(:, :, 5, 13) = |
| 0.3536 | 0.3536 | 0.3536 |
| 0.0000 + 0.3536i | −0.0690 + 0.3468i | −0.1964 + 0.2940i |
| −0.3536 + 0.0000i | −0.3266 − 0.1353i | −0.1353 − 0.3266i |
| −0.0000 − 0.3536i | 0.1964 − 0.2940i | 0.3468 + 0.0690i |
| −0.3536 | 0 − 0.3536i | 0.3536 |
| −0.0000 − 0.3536i | 0.3468 + 0.0690i | −0.1964 + 0.2940i |
| 0.3536 − 0.0000i | −0.1353 + 0.3266i | −0.1353 − 0.3266i |
| 0.0000 + 0.3536i | −0.2940 − 0.1964i | 0.3468 + 0.0690i |
| ans(:, :, 6, 3) = | ans(:, :, 6, 8) = | ans(:, :, 6, 13) = |
| 0.3536 | 0.3536 | 0.3536 |
| −0.1353 + 0.3266i | −0.1964 + 0.2940i | −0.2940 + 0.1964i |
| −0.2500 − 0.2500i | −0.1353 − 0.3266i | 0.1353 − 0.3266i |
| 0.3266 − 0.1353i | 0.3468 + 0.0690i | 0.0690 + 0.3468i |
| −0.3536 | 0 − 0.3536i | 0.3536 |
| 0.1353 − 0.3266i | 0.2940 + 0.1964i | −0.2940 + 0.1964i |
| 0.2500 + 0.2500i | −0.3266 + 0.1353i | 0.1353 − 0.3266i |
| −0.3266 + 0.1353i | 0.0690 − 0.3468i | 0.0690 + 0.3468i |
| ans(:, :, 7, 3) = | ans(:, :, 7, 8) = | ans(:, :, 7, 13) = |
| 0.3536 | 0.3536 | 0.3536 |
| −0.2500 + 0.2500i | −0.2940 + 0.1964i | −0.3468 + 0.0690i |
| −0.0000 − 0.3536i | 0.1353 − 0.3266i | 0.3266 − 0.1353i |
| 0.2500 + 0.2500i | 0.0690 + 0.3468i | −0.2940 + 0.1964i |
| −0.3536 | 0 − 0.3536i | 0.3536 |
| 0.2500 − 0.2500i | 0.1964 + 0.2940i | −0.3468 + 0.0690i |
| 0.0000 + 0.3536i | −0.3266 − 0.1353i | 0.3266 − 0.1353i |
| −0.2500 − 0.2500i | 0.3468 − 0.0690i | −0.2940 + 0.1964i |
| ans(:, :, 8, 3) = | ans(:, :, 8, 8) = | ans(:, :, 8, 13) = |
| 0.3536 | 0.3536 | 0.3536 |
| −0.3266 + 0.1353i | −0.3468 + 0.0690i | −0.3468 − 0.0690i |
| 0.2500 − 0.2500i | 0.3266 − 0.1353i | 0.3266 + 0.1353i |
| −0.1353 + 0.3266i | −0.2940 + 0.1964i | −0.2940 − 0.1964i |
| −0.3536 | 0 − 0.3536i | 0.3536 |
| 0.3266 − 0.1353i | 0.0690 + 0.3468i | −0.3468 − 0.0690i |
| −0.2500 + 0.2500i | −0.1353 − 0.3266i | 0.3266 + 0.1353i |
| 0.1353 − 0.3266i | 0.1964 + 0.2940i | −0.2940 − 0.1964i |

TABLE 1-continued

| ans(:, :, 9, 3) = | ans(:, :, 9, 8) = | ans(:, :, 9, 13) = |
|---|---|---|
| 0.3536 | 0.3536 | 0.3536 |
| −0.3536 + 0.0000i | −0.3468 − 0.0690i | −0.2940 − 0.1964i |
| 0.3536 − 0.0000i | 0.3266 + 0.1353i | 0.1353 + 0.3266i |
| −0.3536 + 0.0000i | −0.2940 − 0.1964i | 0.0690 − 0.3468i |
| −0.3536 | 0 − 0.3536i | 0.3536 |
| 0.3536 − 0.0000i | −0.0690 + 0.3468i | −0.2940 − 0.1964i |
| −0.3536 + 0.0000i | 0.1353 − 0.3266i | 0.1353 + 0.3266i |
| 0.3536 − 0.0000i | −0.1964 + 0.2940i | 0.0690 − 0.3468i |

| ans(:, :, 10, 3) = | ans(:, :, 10, 8) = | ans(:, :, 10, 13) = |
|---|---|---|
| 0.3536 | 0.3536 | 0.3536 |
| −0.3266 − 0.1353i | −0.2940 − 0.1964i | −0.1964 − 0.2940i |
| 0.2500 + 0.2500i | 0.1353 + 0.3266i | −0.1353 + 0.3266i |
| −0.1353 − 0.3266i | 0.0690 − 0.3468i | 0.3468 − 0.0690i |
| −0.3536 | 0 − 0.3536i | 0.3536 |
| 0.3266 + 0.1353i | −0.1964 + 0.2940i | −0.1964 − 0.2940i |
| −0.2500 − 0.2500i | 0.3266 − 0.1353i | −0.1353 + 0.3266i |
| 0.1353 + 0.3266i | −0.3468 − 0.0690i | 0.3468 − 0.0690i |

| ans(:, :, 11, 3) = | ans(:, :, 11, 8) = | ans(:, :, 11, 13) = |
|---|---|---|
| 0.3536 | 0.3536 | 0.3536 |
| −0.2500 − 0.2500i | −0.1964 − 0.2940i | −0.0690 − 0.3468i |
| 0.0000 + 0.3536i | −0.1353 + 0.3266i | −0.3266 + 0.1353i |
| 0.2500 − 0.2500i | 0.3468 − 0.0690i | 0.1964 + 0.2940i |
| −0.3536 | 0 − 0.3536i | 0.3536 |
| 0.2500 + 0.2500i | −0.2940 + 0.1964i | −0.0690 − 0.3468i |
| −0.0000 − 0.3536i | 0.3266 + 0.1353i | −0.3266 + 0.1353i |
| −0.2500 + 0.2500i | −0.0690 − 0.3468i | 0.1964 + 0.2940i |

| ans(:, :, 12, 3) = | ans(:, :, 12, 8) = | ans(:, :, 12, 13) = |
|---|---|---|
| 0.3536 | 0.3536 | 0.3536 |
| −0.1353 − 0.3266i | −0.0690 − 0.3468i | 0.0690 − 0.3468i |
| −0.2500 + 0.2500i | −0.3266 + 0.1353i | −0.3266 − 0.1353i |
| 0.3266 + 0.1353i | 0.1964 + 0.2940i | −0.1964 + 0.2940i |
| −0.3536 | 0 − 0.3536i | 0.3536 |
| 0.1353 + 0.3266i | −0.3468 + 0.0690i | 0.0690 − 0.3468i |
| 0.2500 − 0.2500i | 0.1353 + 0.3266i | −0.3266 − 0.1353i |
| −0.3266 − 0.1353i | 0.2940 − 0.1964i | −0.1964 + 0.2940i |

| ans(:, :, 13, 3) = | ans(:, :, 13, 8) = | ans(:, :, 13, 13) = |
|---|---|---|
| 0.3536 | 0.3536 | 0.3536 |
| −0.0000 − 0.3536i | 0.0690 − 0.3468i | 0.1964 − 0.2940i |
| −0.3536 + 0.0000i | −0.3266 − 0.1353i | −0.1353 − 0.3266i |
| 0.0000 + 0.3536i | −0.1964 + 0.2940i | −0.3468 − 0.0690i |
| −0.3536 | 0 − 0.3536i | 0.3536 |
| 0.0000 + 0.3536i | −0.3468 − 0.0690i | 0.1964 − 0.2940i |
| 0.3536 − 0.0000i | −0.1353 + 0.3266i | −0.1353 − 0.3266i |
| −0.0000 − 0.3536i | 0.2940 + 0.1964i | −0.3468 − 0.0690i |

| ans(:, :, 14, 3) = | ans(:, :, 14, 8) = | ans(:, :, 14, 13) = |
|---|---|---|
| 0.3536 | 0.3536 | 0.3536 |
| 0.1353 − 0.3266i | 0.1964 − 0.2940i | 0.2940 − 0.1964i |
| −0.2500 − 0.2500i | −0.1353 − 0.3266i | 0.1353 − 0.3266i |
| −0.3266 + 0.1353i | −0.3468 − 0.0690i | −0.0690 − 0.3468i |
| −0.3536 | 0 − 0.3536i | 0.3536 |
| −0.1353 + 0.3266i | −0.2940 − 0.1964i | 0.2940 − 0.1964i |
| 0.2500 + 0.2500i | −0.3266 + 0.1353i | 0.1353 − 0.3266i |
| 0.3266 − 0.1353i | −0.0690 + 0.3468i | −0.0690 − 0.3468i |

| ans(:, :, 15, 3) = | ans(:, :, 15, 8) = | ans(:, :, 15, 13) = |
|---|---|---|
| 0.3536 | 0.3536 | 0.3536 |
| 0.2500 − 0.2500i | 0.2940 − 0.1964i | 0.3468 − 0.0690i |
| −0.0000 − 0.3536i | 0.1353 − 0.3266i | 0.3266 − 0.1353i |
| −0.2500 − 0.2500i | −0.0690 − 0.3468i | 0.2940 − 0.1964i |
| −0.3536 | 0 − 0.3536i | 0.3536 |
| −0.2500 + 0.2500i | −0.1964 − 0.2940i | 0.3468 − 0.0690i |
| 0.0000 + 0.3536i | −0.3266 − 0.1353i | 0.3266 − 0.1353i |
| 0.2500 + 0.2500i | −0.3468 + 0.0690i | 0.2940 − 0.1964i |

TABLE 1-continued

| ans(:, :, 16, 3) = | ans(:, :, 16, 8) = | ans(:, :, 16, 13) = |
|---|---|---|
| 0.3536 | 0.3536 | 0.3536 |
| 0.3266 − 0.1353i | 0.3468 − 0.0690i | 0.3468 + 0.0690i |
| 0.2500 − 0.2500i | 0.3266 − 0.1353i | 0.3266 + 0.1353i |
| 0.1353 − 0.3266i | 0.2940 − 0.1964i | 0.2940 + 0.1964i |
| −0.3536 | 0 − 0.3536i | 0.3536 |
| −0.3266 + 0.1353i | −0.0690 − 0.3468i | 0.3468 + 0.0690i |
| −0.2500 + 0.2500i | −0.1353 − 0.3266i | 0.3266 + 0.1353i |
| −0.1353 + 0.3266i | −0.1964 − 0.2940i | 0.2940 + 0.1964i |

| ans(:, :, 1, 4) = | ans(:, :, 1, 9) = | ans(:, :, 1, 14) = |
|---|---|---|
| 0.3536 | 0.3536 | 0.3536 |
| 0.3536 | 0.3266 + 0.1353i | 0.2940 + 0.1964i |
| 0.3536 | 0.2500 + 0.2500i | 0.1353 + 0.3266i |
| 0.3536 | 0.1353 + 0.3266i | −0.0690 + 0.3468i |
| 0 − 0.3536i | 0.3536 | 0 + 0.3536i |
| 0 − 0.3536i | 0.3266 + 0.1353i | −0.1964 + 0.2940i |
| 0 − 0.3536i | 0.2500 + 0.2500i | −0.3266 + 0.1353i |
| 0 − 0.3536i | 0.1353 + 0.3266i | −0.3468 − 0.0690i |

| ans(:, :, 2, 4) = | ans(:, :, 2, 9) = | ans(:, :, 2, 14) = |
|---|---|---|
| 0.3536 | 0.3536 | 0.3536 |
| 0.3266 + 0.1353i | 0.2500 + 0.2500i | 0.1964 + 0.2940i |
| 0.2500 + 0.2500i | 0.0000 + 0.3536i | −0.1353 + 0.3266i |
| 0.1353 + 0.3266i | −0.2500 + 0.2500i | −0.3468 + 0.0690i |
| 0 − 0.3536i | 0.3536 | 0 + 0.3536i |
| 0.1353 − 0.3266i | 0.2500 + 0.2500i | −0.2940 + 0.1964i |
| 0.2500 − 0.2500i | 0.0000 + 0.3536i | −0.3266 − 0.1353i |
| 0.3266 − 0.1353i | −0.2500 + 0.2500i | −0.0690 − 0.3468i |

| ans(:, :, 3, 4) = | ans(:, :, 3, 9) = | ans(:, :, 3, 14) = |
|---|---|---|
| 0.3536 | 0.3536 | 0.3536 |
| 0.2500 + 0.2500i | 0.1353 + 0.3266i | 0.0690 + 0.3468i |
| 0.0000 + 0.3536i | −0.2500 + 0.2500i | −0.3266 + 0.1353i |
| −0.2500 + 0.2500i | −0.3266 − 0.1353i | −0.1964 − 0.2940i |
| 0 − 0.3536i | 0.3536 | 0 + 0.3536i |
| 0.2500 − 0.2500i | 0.1353 + 0.3266i | −0.3468 + 0.0690i |
| 0.3536 − 0.0000i | −0.2500 + 0.2500i | −0.1353 − 0.3266i |
| 0.2500 + 0.2500i | −0.3266 − 0.1353i | 0.2940 − 0.1964i |

| ans(:, :, 4, 4) = | ans(:, :, 4, 9) = | ans(:, :, 4, 14) = |
|---|---|---|
| 0.3536 | 0.3536 | 0.3536 |
| 0.1353 + 0.3266i | 0.0000 + 0.3536i | −0.0690 + 0.3468i |
| −0.2500 + 0.2500i | −0.3536 + 0.0000i | −0.3266 − 0.1353i |
| −0.3266 − 0.1353i | −0.0000 − 0.3536i | 0.1964 − 0.2940i |
| 0 − 0.3536i | 0.3536 | 0 + 0.3536i |
| 0.3266 − 0.1353i | 0.0000 + 0.3536i | −0.3468 − 0.0690i |
| 0.2500 + 0.2500i | −0.3536 + 0.0000i | 0.1353 − 0.3266i |
| −0.1353 + 0.3266i | −0.0000 − 0.3536i | 0.2940 + 0.1964i |

| ans(:, :, 5, 4) = | ans(:, :, 5, 9) = | ans(:, :, 5, 14) = |
|---|---|---|
| 0.3536 | 0.3536 | 0.3536 |
| 0.0000 + 0.3536i | −0.1353 + 0.3266i | −0.1964 + 0.2940i |
| −0.3536 + 0.0000i | −0.2500 − 0.2500i | −0.1353 − 0.3266i |
| −0.0000 − 0.3536i | 0.3266 − 0.1353i | 0.3468 + 0.0690i |
| 0 − 0.3536i | 0.3536 | 0 + 0.3536i |
| 0.3536 − 0.0000i | −0.1353 + 0.3266i | −0.2940 − 0.1964i |
| 0.0000 + 0.3536i | −0.2500 − 0.2500i | 0.3266 − 0.1353i |
| −0.3536 + 0.0000i | 0.3266 − 0.1353i | −0.0690 + 0.3468i |

| ans(:, :, 6, 4) = | ans(:, :, 6, 9) = | ans(:, :, 6, 14) = |
|---|---|---|
| 0.3536 | 0.3536 | 0.3536 |
| −0.1353 + 0.3266i | −0.2500 + 0.2500i | −0.2940 + 0.1964i |
| −0.2500 − 0.2500i | −0.0000 − 0.3536i | 0.1353 − 0.3266i |
| 0.3266 − 0.1353i | 0.2500 + 0.2500i | 0.0690 + 0.3468i |
| 0 − 0.3536i | 0.3536 | 0 + 0.3536i |
| 0.3266 + 0.1353i | −0.2500 + 0.2500i | −0.1964 − 0.2940i |
| −0.2500 + 0.2500i | −0.0000 − 0.3536i | 0.3266 + 0.1353i |
| −0.1353 − 0.3266i | 0.2500 + 0.2500i | −0.3468 + 0.0690i |

TABLE 1-continued

| ans(:, :, 7, 4) = | ans(:, :, 7, 9) = | ans(:, :, 7, 14) = |
|---|---|---|
| 0.3536 | 0.3536 | 0.3536 |
| −0.2500 + 0.2500i | −0.3266 + 0.1353i | −0.3468 + 0.0690i |
| −0.0000 − 0.3536i | 0.2500 − 0.2500i | 0.3266 − 0.1353i |
| 0.2500 + 0.2500i | −0.1353 + 0.3266i | −0.2940 + 0.1964i |
| 0 − 0.3536i | 0.3536 | 0 + 0.3536i |
| 0.2500 + 0.2500i | −0.3266 + 0.1353i | −0.0690 − 0.3468i |
| −0.3536 + 0.0000i | 0.2500 − 0.2500i | 0.1353 + 0.3266i |
| 0.2500 − 0.2500i | −0.1353 + 0.3266i | −0.1964 − 0.2940i |

| ans(:, :, 8, 4) = | ans(:, :, 8, 9) = | ans(:, :, 8, 14) = |
|---|---|---|
| 0.3536 | 0.3536 | 0.3536 |
| −0.3266 + 0.1353i | −0.3536 + 0.0000i | −0.3468 − 0.0690i |
| 0.2500 − 0.2500i | 0.3536 − 0.0000i | 0.3266 + 0.1353i |
| −0.1353 + 0.3266i | −0.3536 + 0.0000i | −0.2940 − 0.1964i |
| 0 − 0.3536i | 0.3536 | 0 + 0.3536i |
| 0.1353 + 0.3266i | −0.3536 + 0.0000i | 0.0690 − 0.3468i |
| −0.2500 − 0.2500i | 0.3536 − 0.0000i | −0.1353 + 0.3266i |
| 0.3266 + 0.1353i | −0.3536 + 0.0000i | 0.1964 − 0.2940i |

| ans(:, :, 9, 4) = | ans(:, :, 9, 9) = | ans(:, :, 9, 14) = |
|---|---|---|
| 0.3536 | 0.3536 | 0.3536 |
| −0.3536 + 0.0000i | −0.3266 − 0.1353i | −0.2940 − 0.1964i |
| 0.3536 − 0.0000i | 0.2500 + 0.2500i | 0.1353 + 0.3266i |
| −0.3536 + 0.0000i | −0.1353 − 0.3266i | 0.0690 − 0.3468i |
| 0 − 0.3536i | 0.3536 | 0 + 0.3536i |
| 0.0000 + 0.3536i | −0.3266 − 0.1353i | 0.1964 − 0.2940i |
| −0.0000 − 0.3536i | 0.2500 + 0.2500i | −0.3266 + 0.1353i |
| 0.0000 + 0.3536i | −0.1353 − 0.3266i | 0.3468 + 0.0690i |

| ans(:, :, 10, 4) = | ans(:, :, 10, 9) = | ans(:, :, 10, 14) = |
|---|---|---|
| 0.3536 | 0.3536 | 0.3536 |
| −0.3266 − 0.1353i | −0.2500 − 0.2500i | −0.1964 − 0.2940i |
| 0.2500 + 0.2500i | 0.0000 + 0.3536i | −0.1353 + 0.3266i |
| −0.1353 − 0.3266i | 0.2500 − 0.2500i | 0.3468 − 0.0690i |
| 0 − 0.3536i | 0.3536 | 0 + 0.3536i |
| −0.1353 + 0.3266i | −0.2500 − 0.2500i | 0.2940 − 0.1964i |
| 0.2500 − 0.2500i | 0.0000 + 0.3536i | −0.3266 − 0.1353i |
| −0.3266 + 0.1353i | 0.2500 − 0.2500i | 0.0690 + 0.3468i |

| ans(:, :, 11, 4) = | ans(:, :, 11, 9) = | ans(:, :, 11, 14) = |
|---|---|---|
| 0.3536 | 0.3536 | 0.3536 |
| −0.2500 − 0.2500i | −0.1353 − 0.3266i | −0.0690 − 0.3468i |
| 0.0000 + 0.3536i | −0.2500 + 0.2500i | −0.3266 + 0.1353i |
| 0.2500 − 0.2500i | 0.3266 + 0.1353i | 0.1964 + 0.2940i |
| 0 − 0.3536i | 0.3536 | 0 + 0.3536i |
| −0.2500 + 0.2500i | −0.1353 − 0.3266i | 0.3468 − 0.0690i |
| 0.3536 − 0.0000i | −0.2500 + 0.2500i | −0.1353 − 0.3266i |
| −0.2500 − 0.2500i | 0.3266 + 0.1353i | −0.2940 + 0.1964i |

| ans(:, :, 12, 4) = | ans(:, :, 12, 9) = | ans(:, :, 12, 14) = |
|---|---|---|
| 0.3536 | 0.3536 | 0.3536 |
| −0.1353 − 0.3266i | −0.0000 − 0.3536i | 0.0690 − 0.3468i |
| −0.2500 + 0.2500i | −0.3536 + 0.0000i | −0.3266 − 0.1353i |
| 0.3266 + 0.1353i | 0.0000 + 0.3536i | −0.1964 + 0.2940i |
| 0 − 0.3536i | 0.3536 | 0 + 0.3536i |
| −0.3266 + 0.1353i | −0.0000 − 0.3536i | 0.3468 + 0.0690i |
| 0.2500 + 0.2500i | −0.3536 + 0.0000i | 0.1353 − 0.3266i |
| 0.1353 − 0.3266i | 0.0000 + 0.3536i | −0.2940 − 0.1964i |

| ans(:, :, 13, 4) = | ans(:, :, 13, 9) = | ans(:, :, 13, 14) = |
|---|---|---|
| 0.3536 | 0.3536 | 0.3536 |
| −0.0000 − 0.3536i | 0.1353 − 0.3266i | 0.1964 − 0.2940i |
| −0.3536 + 0.0000i | −0.2500 − 0.2500i | −0.1353 − 0.3266i |
| 0.0000 + 0.3536i | −0.3266 + 0.1353i | −0.3468 − 0.0690i |
| 0 − 0.3536i | 0.3536 | 0 + 0.3536i |
| −0.3536 + 0.0000i | 0.1353 − 0.3266i | 0.2940 + 0.1964i |
| 0.0000 + 0.3536i | −0.2500 − 0.2500i | 0.3266 − 0.1353i |
| 0.3536 − 0.0000i | −0.3266 + 0.1353i | 0.0690 − 0.3468i |

TABLE 1-continued

| ans(:, :, 14, 4) = | ans(:, :, 14, 9) = | ans(:, :, 14, 14) = |
|---|---|---|
| 0.3536 | 0.3536 | 0.3536 |
| 0.1353 − 0.3266i | 0.2500 − 0.2500i | 0.2940 − 0.1964i |
| −0.2500 − 0.2500i | −0.0000 − 0.3536i | 0.1353 − 0.3266i |
| −0.3266 + 0.1353i | −0.2500 − 0.2500i | −0.0690 − 0.3468i |
| 0 − 0.3536i | 0.3536 | 0 + 0.3536i |
| −0.3266 − 0.1353i | 0.2500 − 0.2500i | 0.1964 + 0.2940i |
| −0.2500 + 0.2500i | −0.0000 − 0.3536i | 0.3266 + 0.1353i |
| 0.1353 + 0.3266i | −0.2500 − 0.2500i | 0.3468 − 0.0690i |

| ans(:, :, 15, 4) = | ans(:, :, 15, 9) = | ans(:, :, 15, 14) = |
|---|---|---|
| 0.3536 | 0.3536 | 0.3536 |
| 0.2500 − 0.2500i | 0.3266 − 0.1353i | 0.3468 − 0.0690i |
| −0.0000 − 0.3536i | 0.2500 − 0.2500i | 0.3266 − 0.1353i |
| −0.2500 − 0.2500i | 0.1353 − 0.3266i | 0.2940 − 0.1964i |
| 0 − 0.3536i | 0.3536 | 0 + 0.3536i |
| −0.2500 − 0.2500i | 0.3266 − 0.1353i | 0.0690 + 0.3468i |
| −0.3536 + 0.0000i | 0.2500 − 0.2500i | 0.1353 + 0.3266i |
| −0.2500 + 0.2500i | 0.1353 − 0.3266i | 0.1964 + 0.2940i |

| ans(:, :, 16, 4) = | ans(:, :, 16, 9) = | ans(:, :, 16, 14) = |
|---|---|---|
| 0.3536 | 0.3536 | 0.3536 |
| 0.3266 − 0.1353i | 0.3536 | 0.3468 + 0.0690i |
| 0.2500 − 0.2500i | 0.3536 | 0.3266 + 0.1353i |
| 0.1353 − 0.3266i | 0.3536 | 0.2940 + 0.1964i |
| 0 − 0.3536i | 0.3536 | 0 + 0.3536i |
| −0.1353 − 0.3266i | 0.3536 | −0.0690 + 0.3468i |
| −0.2500 − 0.2500i | 0.3536 | −0.1353 + 0.3266i |
| −0.3266 − 0.1353i | 0.3536 | −0.1964 + 0.2940i |

| ans(:, :, 1, 5) = | ans(:, :, 1, 10) = | ans(:, :, 1, 15) = |
|---|---|---|
| 0.3536 | 0.3536 | 0.3536 |
| 0.3468 + 0.0690i | 0.3266 + 0.1353i | 0.2940 + 0.1964i |
| 0.3266 + 0.1353i | 0.2500 + 0.2500i | 0.1353 + 0.3266i |
| 0.2940 + 0.1964i | 0.1353 + 0.3266i | −0.0690 + 0.3468i |
| 0.3536 | 0 + 0.3536i | −0.3536 |
| 0.3468 + 0.0690i | −0.1353 + 0.3266i | −0.2940 − 0.1964i |
| 0.3266 + 0.1353i | −0.2500 + 0.2500i | −0.1353 − 0.3266i |
| 0.2940 + 0.1964i | −0.3266 + 0.1353i | 0.0690 − 0.3468i |

| ans(:, :, 2, 5) = | ans(:, :, 2, 10) = | ans(:, :, 2, 15) = |
|---|---|---|
| 0.3536 | 0.3536 | 0.3536 |
| 0.2940 + 0.1964i | 0.2500 + 0.2500i | 0.1964 + 0.2940i |
| 0.1353 + 0.3266i | 0.0000 + 0.3536i | −0.1353 + 0.3266i |
| −0.0690 + 0.3468i | −0.2500 + 0.2500i | −0.3468 + 0.0690i |
| 0.3536 | 0 + 0.3536i | −0.3536 |
| 0.2940 + 0.1964i | −0.2500 + 0.2500i | −0.1964 − 0.2940i |
| 0.1353 + 0.3266i | −0.3536 + 0.0000i | 0.1353 − 0.3266i |
| −0.0690 + 0.3468i | −0.2500 − 0.2500i | 0.3468 − 0.0690i |

| ans(:, :, 3, 5) = | ans(:, :, 3, 10) = | ans(:, :, 3, 15) = |
|---|---|---|
| 0.3536 | 0.3536 | 0.3536 |
| 0.1964 + 0.2940i | 0.1353 + 0.3266i | 0.0690 + 0.3468i |
| −0.1353 + 0.3266i | −0.2500 + 0.2500i | −0.3266 + 0.1353i |
| −0.3468 + 0.0690i | −0.3266 − 0.1353i | −0.1964 − 0.2940i |
| 0.3536 | 0 + 0.3536i | −0.3536 |
| 0.1964 + 0.2940i | −0.3266 + 0.1353i | −0.0690 − 0.3468i |
| −0.1353 + 0.3266i | −0.2500 − 0.2500i | 0.3266 − 0.1353i |
| −0.3468 + 0.0690i | 0.1353 − 0.3266i | 0.1964 + 0.2940i |

| ans(:, :, 4, 5) = | ans(:, :, 4, 10) = | ans(:, :, 4, 15) = |
|---|---|---|
| 0.3536 | 0.3536 | 0.3536 |
| 0.0690 + 0.3468i | 0.0000 + 0.3536i | −0.0690 + 0.3468i |
| −0.3266 + 0.1353i | −0.3536 + 0.0000i | −0.3266 − 0.1353i |
| −0.1964 − 0.2940i | −0.0000 − 0.3536i | 0.1964 − 0.2940i |
| 0.3536 | 0 + 0.3536i | −0.3536 |
| 0.0690 + 0.3468i | −0.3536 + 0.0000i | 0.0690 − 0.3468i |
| −0.3266 + 0.1353i | −0.0000 − 0.3536i | 0.3266 + 0.1353i |
| −0.1964 − 0.2940i | 0.3536 − 0.0000i | −0.1964 + 0.2940i |

TABLE 1-continued

| ans(:, :, 5, 5) = | ans(:, :, 5, 10) = | ans(:, :, 5, 15) = |
|---|---|---|
| 0.3536 | 0.3536 | 0.3536 |
| −0.0690 + 0.3468i | −0.1353 + 0.3266i | −0.1964 + 0.2940i |
| −0.3266 − 0.1353i | −0.2500 − 0.2500i | −0.1353 − 0.3266i |
| 0.1964 − 0.2940i | 0.3266 − 0.1353i | 0.3468 + 0.0690i |
| 0.3536 | 0 + 0.3536i | −0.3536 |
| −0.0690 + 0.3468i | −0.3266 − 0.1353i | 0.1964 − 0.2940i |
| −0.3266 − 0.1353i | 0.2500 − 0.2500i | 0.1353 + 0.3266i |
| 0.1964 − 0.2940i | 0.1353 + 0.3266i | −0.3468 − 0.0690i |

| ans(:, :, 6, 5) = | ans(:, :, 6, 10) = | ans(:, :, 6, 15) = |
|---|---|---|
| 0.3536 | 0.3536 | 0.3536 |
| −0.1964 + 0.2940i | −0.2500 + 0.2500i | −0.2940 + 0.1964i |
| −0.1353 − 0.3266i | −0.0000 − 0.3536i | 0.1353 − 0.3266i |
| 0.3468 + 0.0690i | 0.2500 + 0.2500i | 0.0690 + 0.3468i |
| 0.3536 | 0 + 0.3536i | −0.3536 |
| −0.1964 + 0.2940i | −0.2500 − 0.2500i | 0.2940 − 0.1964i |
| −0.1353 − 0.3266i | 0.3536 − 0.0000i | −0.1353 + 0.3266i |
| 0.3468 + 0.0690i | −0.2500 + 0.2500i | −0.0690 − 0.3468i |

| ans(:, :, 7, 5) = | ans(:, :, 7, 10) = | ans(:, :, 7, 15) = |
|---|---|---|
| 0.3536 | 0.3536 | 0.3536 |
| −0.2940 + 0.1964i | −0.3266 + 0.1353i | −0.3468 + 0.0690i |
| 0.1353 − 0.3266i | 0.2500 − 0.2500i | 0.3266 − 0.1353i |
| 0.0690 + 0.3468i | −0.1353 + 0.3266i | −0.2940 + 0.1964i |
| 0.3536 | 0 + 0.3536i | −0.3536 |
| −0.2940 + 0.1964i | −0.1353 − 0.3266i | 0.3468 − 0.0690i |
| 0.1353 − 0.3266i | 0.2500 + 0.2500i | −0.3266 + 0.1353i |
| 0.0690 + 0.3468i | −0.3266 − 0.1353i | 0.2940 − 0.1964i |

| ans(:, :, 8, 5) = | ans(:, :, 8, 10) = | ans(:, :, 8, 15) = |
|---|---|---|
| 0.3536 | 0.3536 | 0.3536 |
| −0.3468 + 0.0690i | −0.3536 + 0.0000i | −0.3468 − 0.0690i |
| 0.3266 − 0.1353i | 0.3536 − 0.0000i | 0.3266 + 0.1353i |
| −0.2940 + 0.1964i | −0.3536 + 0.0000i | −0.2940 − 0.1964i |
| 0.3536 | 0 + 0.3536i | −0.3536 |
| −0.3468 + 0.0690i | −0.0000 − 0.3536i | 0.3468 + 0.0690i |
| 0.3266 − 0.1353i | 0.0000 + 0.3536i | −0.3266 − 0.1353i |
| −0.2940 + 0.1964i | −0.0000 − 0.3536i | 0.2940 + 0.1964i |

| ans(:, :, 9, 5) = | ans(:, :, 9, 10) = | ans(:, :, 9, 15) = |
|---|---|---|
| 0.3536 | 0.3536 | 0.3536 |
| −0.3468 − 0.0690i | −0.3266 − 0.1353i | −0.2940 − 0.1964i |
| 0.3266 + 0.1353i | 0.2500 + 0.2500i | 0.1353 + 0.3266i |
| −0.2940 − 0.1964i | −0.1353 − 0.3266i | 0.0690 − 0.3468i |
| 0.3536 | 0 + 0.3536i | −0.3536 |
| −0.3468 − 0.0690i | 0.1353 − 0.3266i | 0.2940 + 0.1964i |
| 0.3266 + 0.1353i | −0.2500 + 0.2500i | −0.1353 − 0.3266i |
| −0.2940 − 0.1964i | 0.3266 − 0.1353i | −0.0690 + 0.3468i |

| ans(:, :, 10, 5) = | ans(:, :, 10, 10) = | ans(:, :, 10, 15) = |
|---|---|---|
| 0.3536 | 0.3536 | 0.3536 |
| −0.2940 − 0.1964i | −0.2500 − 0.2500i | −0.1964 − 0.2940i |
| 0.1353 + 0.3266i | 0.0000 + 0.3536i | −0.1353 + 0.3266i |
| 0.0690 − 0.3468i | 0.2500 − 0.2500i | 0.3468 − 0.0690i |
| 0.3536 | 0 + 0.3536i | −0.3536 |
| −0.2940 − 0.1964i | 0.2500 − 0.2500i | 0.1964 + 0.2940i |
| 0.1353 + 0.3266i | −0.3536 + 0.0000i | 0.1353 − 0.3266i |
| 0.0690 − 0.3468i | 0.2500 + 0.2500i | −0.3468 + 0.0690i |

| ans(:, :, 11, 5) = | ans(:, :, 11, 10) = | ans(:, :, 11, 15) = |
|---|---|---|
| 0.3536 | 0.3536 | 0.3536 |
| −0.1964 − 0.2940i | −0.1353 − 0.3266i | −0.0690 − 0.3468i |
| −0.1353 + 0.3266i | −0.2500 + 0.2500i | −0.3266 + 0.1353i |
| 0.3468 − 0.0690i | 0.3266 + 0.1353i | 0.1964 + 0.2940i |
| 0.3536 | 0 + 0.3536i | −0.3536 |
| −0.1964 − 0.2940i | 0.3266 − 0.1353i | 0.0690 + 0.3468i |
| −0.1353 + 0.3266i | −0.2500 − 0.2500i | 0.3266 − 0.1353i |
| 0.3468 − 0.0690i | −0.1353 + 0.3266i | −0.1964 − 0.2940i |

TABLE 1-continued

| ans(:, :, 12, 5) = | ans(:, :, 12, 10) = | ans(:, :, 12, 15) = |
|---|---|---|
| 0.3536 | 0.3536 | 0.3536 |
| −0.0690 − 0.3468i | −0.0000 − 0.3536i | 0.0690 − 0.3468i |
| −0.3266 + 0.1353i | −0.3536 + 0.0000i | −0.3266 − 0.1353i |
| 0.1964 + 0.2940i | 0.0000 + 0.3536i | −0.1964 + 0.2940i |
| 0.3536 | 0 + 0.3536i | −0.3536 |
| −0.0690 − 0.3468i | 0.3536 − 0.0000i | −0.0690 + 0.3468i |
| −0.3266 + 0.1353i | −0.0000 − 0.3536i | 0.3266 + 0.1353i |
| 0.1964 + 0.2940i | −0.3536 + 0.0000i | 0.1964 − 0.2940i |

| ans(:, :, 13, 5) = | ans(:, :, 13, 10) = | ans(:, :, 13, 15) = |
|---|---|---|
| 0.3536 | 0.3536 | 0.3536 |
| 0.0690 − 0.3468i | 0.1353 − 0.3266i | 0.1964 − 0.2940i |
| −0.3266 − 0.1353i | −0.2500 − 0.2500i | −0.1353 − 0.3266i |
| −0.1964 + 0.2940i | −0.3266 + 0.1353i | −0.3468 − 0.0690i |
| 0.3536 | 0 + 0.3536i | −0.3536 |
| 0.0690 − 0.3468i | 0.3266 + 0.1353i | −0.1964 + 0.2940i |
| −0.3266 − 0.1353i | 0.2500 − 0.2500i | 0.1353 + 0.3266i |
| −0.1964 + 0.2940i | −0.1353 − 0.3266i | 0.3468 + 0.0690i |

| ans(:, :, 14, 5) = | ans(:, :, 14, 10) = | ans(:, :, 14, 15) = |
|---|---|---|
| 0.3536 | 0.3536 | 0.3536 |
| 0.1964 − 0.2940i | 0.2500 − 0.2500i | 0.2940 − 0.1964i |
| −0.1353 − 0.3266i | −0.0000 − 0.3536i | 0.1353 − 0.3266i |
| −0.3468 − 0.0690i | −0.2500 − 0.2500i | −0.0690 − 0.3468i |
| 0.3536 | 0 + 0.3536i | −0.3536 |
| 0.1964 − 0.2940i | 0.2500 + 0.2500i | −0.2940 + 0.1964i |
| −0.1353 − 0.3266i | 0.3536 − 0.0000i | −0.1353 + 0.3266i |
| −0.3468 − 0.0690i | 0.2500 − 0.2500i | 0.0690 + 0.3468i |

| ans(:, :, 15, 5) = | ans(:, :, 15, 10) = | ans(:, :, 15, 15) = |
|---|---|---|
| 0.3536 | 0.3536 | 0.3536 |
| 0.2940 − 0.1964i | 0.3266 − 0.1353i | 0.3468 − 0.0690i |
| 0.1353 − 0.3266i | 0.2500 − 0.2500i | 0.3266 − 0.1353i |
| −0.0690 − 0.3468i | 0.1353 − 0.3266i | 0.2940 − 0.1964i |
| 0.3536 | 0 + 0.3536i | −0.3536 |
| 0.2940 − 0.1964i | 0.1353 + 0.3266i | −0.3468 + 0.0690i |
| 0.1353 − 0.3266i | 0.2500 + 0.2500i | −0.3266 + 0.1353i |
| −0.0690 − 0.3468i | 0.3266 + 0.1353i | −0.2940 + 0.1964i |

| ans(:, :, 16, 5) = | ans(:, :, 16, 10) = | ans(:, :, 16, 15) = |
|---|---|---|
| 0.3536 | 0.3536 | 0.3536 |
| 0.3468 − 0.0690i | 0.3536 | 0.3468 + 0.0690i |
| 0.3266 − 0.1353i | 0.3536 | 0.3266 + 0.1353i |
| 0.2940 − 0.1964i | 0.3536 | 0.2940 + 0.1964i |
| 0.3536 | 0 + 0.3536i | −0.3536 |
| 0.3468 − 0.0690i | 0 + 0.3536i | −0.3468 − 0.0690i |
| 0.3266 − 0.1353i | 0 + 0.3536i | −0.3266 − 0.1353i |
| 0.2940 − 0.1964i | 0 + 0.3536i | −0.2940 − 0.1964i |

| | | ans(:, :, 1, 16) = |
|---|---|---|
| | | 0.3536 |
| | | 0.2940 + 0.1964i |
| | | 0.1353 + 0.3266i |
| | | −0.0690 + 0.3468i |
| | | 0 − 0.3536i |
| | | 0.1964 − 0.2940i |
| | | 0.3266 − 0.1353i |
| | | 0.3468 + 0.0690i |

| | | ans(:, :, 2, 16) = |
|---|---|---|
| | | 0.3536 |
| | | 0.1964 + 0.2940i |
| | | −0.1353 + 0.3266i |
| | | −0.3468 + 0.0690i |
| | | 0 − 0.3536i |
| | | 0.2940 − 0.1964i |
| | | 0.3266 + 0.1353i |
| | | 0.0690 + 0.3468i |

TABLE 1-continued

| ans(:, :, 3, 16) = |
|---|
| 0.3536 |
| 0.0690 + 0.3468i |
| −0.3266 + 0.1353i |
| −0.1964 − 0.2940i |
| 0 − 0.3536i |
| 0.3468 − 0.0690i |
| 0.1353 + 0.3266i |
| −0.2940 + 0.1964i |

| ans(:, :, 4, 16) = |
|---|
| 0.3536 |
| −0.0690 + 0.3468i |
| −0.3266 − 0.1353i |
| 0.1964 − 0.2940i |
| 0 − 0.3536i |
| 0.3468 + 0.0690i |
| −0.1353 + 0.3266i |
| −0.2940 − 0.1964i |

| ans(:, :, 5, 16) = |
|---|
| 0.3536 |
| −0.1964 + 0.2940i |
| −0.1353 − 0.3266i |
| 0.3468 + 0.0690i |
| 0 − 0.3536i |
| 0.2940 + 0.1964i |
| −0.3266 + 0.1353i |
| 0.0690 − 0.3468i |

| ans(:, :, 6, 16) = |
|---|
| 0.3536 |
| −0.2940 + 0.1964i |
| 0.1353 − 0.3266i |
| 0.0690 + 0.3468i |
| 0 − 0.3536i |
| 0.1964 + 0.2940i |
| −0.3266 − 0.1353i |
| 0.3468 − 0.0690i |

| ans(:, :, 7, 16) = |
|---|
| 0.3536 |
| −0.3468 + 0.0690i |
| 0.3266 − 0.1353i |
| −0.2940 + 0.1964i |
| 0 − 0.3536i |
| 0.0690 + 0.3468i |
| −0.1353 − 0.3266i |
| 0.1964 + 0.2940i |

| ans(:, :, 8, 16) = |
|---|
| 0.3536 |
| −0.3468 − 0.0690i |
| 0.3266 + 0.1353i |
| −0.2940 − 0.1964i |
| 0 − 0.3536i |
| −0.0690 + 0.3468i |
| 0.1353 − 0.3266i |
| −0.1964 + 0.2940i |

| ans(:, :, 9, 16) = |
|---|
| 0.3536 |
| −0.2940 − 0.1964i |
| 0.1353 + 0.3266i |
| 0.0690 − 0.3468i |
| 0 − 0.3536i |
| −0.1964 + 0.2940i |
| 0.3266 − 0.1353i |
| −0.3468 − 0.0690i |

TABLE 1-continued

| ans(:, :, 10, 16) = |
|---|
| 0.3536 |
| −0.1964 − 0.2940i |
| −0.1353 + 0.3266i |
| 0.3468 − 0.0690i |
| 0 − 0.3536i |
| −0.2940 + 0.1964i |
| 0.3266 + 0.1353i |
| −0.0690 − 0.3468i |

| ans(:, :, 11, 16) = |
|---|
| 0.3536 |
| −0.0690 − 0.3468i |
| −0.3266 + 0.1353i |
| 0.1964 + 0.2940i |
| 0 − 0.3536i |
| −0.3468 + 0.0690i |
| 0.1353 + 0.3266i |
| 0.2940 − 0.1964i |

| ans(:, :, 12, 16) = |
|---|
| 0.3536 |
| 0.0690 − 0.3468i |
| −0.3266 − 0.1353i |
| −0.1964 + 0.2940i |
| 0 − 0.3536i |
| −0.3468 − 0.0690i |
| −0.1353 + 0.3266i |
| 0.2940 + 0.1964i |

| ans(:, :, 13, 16) = |
|---|
| 0.3536 |
| 0.1964 − 0.2940i |
| −0.1353 − 0.3266i |
| −0.3468 − 0.0690i |
| 0 − 0.3536i |
| −0.2940 − 0.1964i |
| −0.3266 + 0.1353i |
| −0.0690 + 0.3468i |

| ans(:, :, 14, 16) = |
|---|
| 0.3536 |
| 0.2940 − 0.1964i |
| 0.1353 − 0.3266i |
| −0.0690 − 0.3468i |
| 0 − 0.3536i |
| −0.1964 − 0.2940i |
| −0.3266 − 0.1353i |
| −0.3468 + 0.0690i |

| ans(:, :, 15, 16) = |
|---|
| 0.3536 |
| 0.3468 − 0.0690i |
| 0.3266 − 0.1353i |
| 0.2940 − 0.1964i |
| 0 − 0.3536i |
| −0.0690 − 0.3468i |
| −0.1353 − 0.3266i |
| −0.1964 − 0.2940i |

| ans(:, :, 16, 16) = |
|---|
| 0.3536 |
| 0.3468 + 0.0690i |
| 0.3266 + 0.1353i |
| 0.2940 + 0.1964i |
| 0 − 0.3536i |
| 0.0690 − 0.3468i |
| 0.1353 − 0.3266i |
| 0.1964 − 0.2940i. |

7. The communication method of claim 6, wherein the determining comprises determining the precoding matrix by extracting the first codeword from the first codebook and extracting the second codeword from the second codebook.

8. The communication method of claim 6, wherein the precoding matrix candidates are stored in the transmitter.

9. The communication method of claim 8, wherein the determining comprises determining the precoding matrix with a candidate corresponding to the first precoding matrix indicator and the second precoding matrix indicator among the stored precoding matrix candidates.

10. A communication method of a transmitter, the communication method comprising:

receiving, from a receiver, a first precoding matrix indicator corresponding to a first codeword included in a first codebook and a second precoding matrix indicator corresponding to a second codeword included in a second codeword; and determining a precoding matrix based on the first precoding matrix indicator and the second precoding matrix indicator, wherein the precoding matrix corresponds to one of precoding matrix candidates disclosed in Table 2, wherein in Table 2, ans(;,;m,n) indicates an inter product between ans(;,;m) in the first codebook and (;,;,n) in the second codebook, ans(;,;,m) corresponds to an $m^{th}$ codeword in the first codebook, ans(;,;,n) corresponds to an $n^{th}$ codeword in the second codebook, and i denotes an imaginary unit:

TABLE 2

| ans(:, :, 1, 1) = | | ans(:, :, 1, 9) = | |
|---|---|---|---|
| 0.2500 | 0.2500 | 0.2500 | 0.2500 |
| 0.2500 | 0.2500 | 0.2500 | 0.2452 + 0.0488i |
| 0.2500 | 0.2500 | 0.2500 | 0.2310 + 0.0957i |
| 0.2500 | 0.2500 | 0.2500 | 0.2079 + 0.1389i |
| 0.2500 | −0.2500 | 0.2500 | −0.2500 |
| 0.2500 | −0.2500 | 0.2500 | −0.2452 − 0.0488i |
| 0.2500 | −0.2500 | 0.2500 | −0.2310 − 0.0957i |
| 0.2500 | −0.2500 | 0.2500 | −0.2079 − 0.1389i |
| ans(:, :, 2, 1) = | | ans(:, :, 2, 9) = | |
| 0.2500 | 0.2500 | 0.2500 | 0.2500 |
| 0.2310 + 0.0957i | 0.2310 + 0.0957i | 0.2310 + 0.0957i | 0.2079 + 0.1389i |
| 0.1768 + 0.1768i | 0.1768 + 0.1768i | 0.1768 + 0.1768i | 0.0957 + 0.2310i |
| 0.0957 + 0.2310i | 0.0957 + 0.2310i | 0.0957 + 0.2310i | −0.0488 + 0.2452i |
| 0.2500 | −0.2500 | 0.2500 | −0.2500 |
| 0.2310 + 0.0957i | −0.2310 − 0.0957i | 0.2310 + 0.0957i | −0.2079 − 0.1389i |
| 0.1768 + 0.1768i | −0.1768 − 0.1768i | 0.1768 + 0.1768i | −0.0957 − 0.2310i |
| 0.0957 + 0.2310i | −0.0957 − 0.2310i | 0.0957 + 0.2310i | 0.0488 − 0.2452i |
| ans(:, :, 3, 1) = | | ans(:, :, 3, 9) = | |
| 0.2500 | 0.2500 | 0.2500 | 0.2500 |
| 0.1768 + 0.1768i | 0.1768 + 0.1768i | 0.1768 + 0.1768i | 0.1389 + 0.2079i |
| 0.0000 + 0.2500i | 0.0000 + 0.2500i | 0.0000 + 0.2500i | −0.0957 + 0.2310i |
| −0.1768 + 0.1768i | −0.1768 + 0.1768i | −0.1768 + 0.1768i | −0.2452 + 0.0488i |
| 0.2500 | −0.2500 | 0.2500 | −0.2500 |
| 0.1768 + 0.1768i | −0.1768 − 0.1768i | 0.1768 + 0.1768i | −0.1389 − 0.2079i |
| 0.0000 + 0.2500i | −0.0000 − 0.2500i | 0.0000 + 0.2500i | 0.0957 − 0.2310i |
| −0.1768 + 0.1768i | 0.1768 − 0.1768i | −0.1768 + 0.1768i | 0.2452 − 0.0488i |
| ans(:, :, 4, 1) = | | ans(:, :, 4, 9) = | |
| 0.2500 | 0.2500 | 0.2500 | 0.2500 |
| 0.0957 + 0.2310i | 0.0957 + 0.2310i | 0.0957 + 0.2310i | 0.0488 + 0.2452i |
| −0.1768 + 0.1768i | −0.1768 + 0.1768i | −0.1768 + 0.1768i | −0.2310 + 0.0957i |
| −0.2310 − 0.0957i | −0.2310 − 0.0957i | −0.2310 − 0.0957i | −0.1389 − 0.2079i |
| 0.2500 | −0.2500 | 0.2500 | −0.2500 |
| 0.0957 + 0.2310i | −0.0957 − 0.2310i | 0.0957 + 0.2310i | −0.0488 − 0.2452i |
| −0.1768 + 0.1768i | 0.1768 − 0.1768i | −0.1768 + 0.1768i | 0.2310 − 0.0957i |
| −0.2310 − 0.0957i | 0.2310 + 0.0957i | −0.2310 − 0.0957i | 0.1389 + 0.2079i |
| ans(:, :, 5, 1) = | | ans(:, :, 5, 9) = | |
| 0.2500 | 0.2500 | 0.2500 | 0.2500 |
| 0.0000 + 0.2500i | 0.0000 + 0.2500i | 0.0000 + 0.2500i | −0.0488 + 0.2452i |
| −0.2500 + 0.0000i | −0.2500 + 0.0000i | −0.2500 + 0.0000i | −0.2310 − 0.0957i |
| −0.0000 − 0.2500i | −0.0000 − 0.2500i | −0.0000 − 0.2500i | 0.1389 − 0.2079i |
| 0.2500 | −0.2500 | 0.2500 | −0.2500 |
| 0.0000 + 0.2500i | −0.0000 − 0.2500i | 0.0000 + 0.2500i | 0.0488 − 0.2452i |
| −0.2500 + 0.0000i | 0.2500 − 0.0000i | −0.2500 + 0.0000i | 0.2310 + 0.0957i |
| −0.0000 − 0.2500i | 0.0000 + 0.2500i | −0.0000 − 0.2500i | −0.1389 + 0.2079i |
| ans(:, :, 6, 1) = | | ans(:, :, 6, 9) = | |
| 0.2500 | 0.2500 | 0.2500 | 0.2500 |
| −0.0957 + 0.2310i | −0.0957 + 0.2310i | −0.0957 + 0.2310i | −0.1389 + 0.2079i |
| −0.1768 − 0.1768i | −0.1768 − 0.1768i | −0.1768 − 0.1768i | −0.0957 − 0.2310i |
| 0.2310 − 0.0957i | 0.2310 − 0.0957i | 0.2310 − 0.0957i | 0.2452 + 0.0488i |

TABLE 2-continued

| | | | |
|---|---|---|---|
| 0.2500 | −0.2500 | 0.2500 | −0.2500 |
| −0.0957 + 0.2310i | 0.0957 − 0.2310i | −0.0957 + 0.2310i | 0.1389 − 0.2079i |
| −0.1768 − 0.1768i | 0.1768 + 0.1768i | −0.1768 − 0.1768i | 0.0957 + 0.2310i |
| 0.2310 − 0.0957i | −0.2310 + 0.0957i | 0.2310 − 0.0957i | −0.2452 − 0.0488i |
| ans(:, :, 7, 1) = | | ans(:, :, 7, 9) = | |
| 0.2500 | 0.2500 | 0.2500 | 0.2500 |
| −0.1768 + 0.1768i | −0.1768 + 0.1768i | −0.1768 + 0.1768i | −0.2079 + 0.1389i |
| −0.0000 − 0.2500i | −0.0000 − 0.2500i | −0.0000 − 0.2500i | 0.0957 − 0.2310i |
| 0.1768 + 0.1768i | 0.1768 + 0.1768i | 0.1768 + 0.1768i | 0.0488 + 0.2452i |
| 0.2500 | −0.2500 | 0.2500 | −0.2500 |
| −0.1768 + 0.1768i | 0.1768 − 0.1768i | −0.1768 + 0.1768i | 0.2079 − 0.1389i |
| −0.0000 − 0.2500i | 0.0000 + 0.2500i | −0.0000 − 0.2500i | −0.0957 + 0.2310i |
| 0.1768 + 0.1768i | −0.1768 − 0.1768i | 0.1768 + 0.1768i | −0.0488 − 0.2452i |
| ans(:, :, 8, 1) = | | ans(:, :, 8, 9) = | |
| 0.2500 | 0.2500 | 0.2500 | 0.2500 |
| −0.2310 + 0.0957i | −0.2310 + 0.0957i | −0.2310 + 0.0957i | −0.2452 + 0.0488i |
| 0.1768 − 0.1768i | 0.1768 − 0.1768i | 0.1768 − 0.1768i | 0.2310 − 0.0957i |
| −0.0957 + 0.2310i | −0.0957 + 0.2310i | −0.0957 + 0.2310i | −0.2079 + 0.1389i |
| 0.2500 | −0.2500 | 0.2500 | −0.2500 |
| −0.2310 + 0.0957i | 0.2310 − 0.0957i | −0.2310 + 0.0957i | 0.2452 − 0.0488i |
| 0.1768 − 0.1768i | −0.1768 + 0.1768i | 0.1768 − 0.1768i | −0.2310 + 0.0957i |
| −0.0957 + 0.2310i | 0.0957 − 0.2310i | −0.0957 + 0.2310i | 0.2079 − 0.1389i |
| ans(:, :, 9, 1) = | | ans(:, :, 9, 9) = | |
| 0.2500 | 0.2500 | 0.2500 | 0.2500 |
| −0.2500 + 0.0000i | −0.2500 + 0.0000i | −0.2500 + 0.0000i | −0.2452 − 0.0488i |
| 0.2500 − 0.0000i | 0.2500 − 0.0000i | 0.2500 − 0.0000i | 0.2310 + 0.0957i |
| −0.2500 + 0.0000i | −0.2500 + 0.0000i | −0.2500 + 0.0000i | −0.2079 − 0.1389i |
| 0.2500 | −0.2500 | 0.2500 | −0.2500 |
| −0.2500 + 0.0000i | 0.2500 − 0.0000i | −0.2500 + 0.0000i | 0.2452 + 0.0488i |
| 0.2500 − 0.0000i | −0.2500 + 0.0000i | 0.2500 − 0.0000i | −0.2310 − 0.0957i |
| −0.2500 + 0.0000i | 0.2500 − 0.0000i | −0.2500 + 0.0000i | 0.2079 + 0.1389i |
| ans(:, :, 10, 1) = | | ans(:, :, 10, 9) = | |
| 0.2500 | 0.2500 | 0.2500 | 0.2500 |
| −0.2310 − 0.0957i | −0.2310 − 0.0957i | −0.2310 − 0.0957i | −0.2079 − 0.1389i |
| 0.1768 + 0.1768i | 0.1768 + 0.1768i | 0.1768 + 0.1768i | 0.0957 + 0.2310i |
| −0.0957 − 0.2310i | −0.0957 − 0.2310i | −0.0957 − 0.2310i | 0.0488 − 0.2452i |
| 0.2500 | −0.2500 | 0.2500 | −0.2500 |
| −0.2310 − 0.0957i | 0.2310 + 0.0957i | −0.2310 − 0.0957i | 0.2079 + 0.1389i |
| 0.1768 + 0.1768i | −0.1768 − 0.1768i | 0.1768 + 0.1768i | −0.0957 − 0.2310i |
| −0.0957 − 0.2310i | 0.0957 + 0.2310i | −0.0957 − 0.2310i | −0.0488 + 0.2452i |
| ans(:, :, 11, 1) = | | ans(:, :, 11, 9) = | |
| 0.2500 | 0.2500 | 0.2500 | 0.2500 |
| −0.1768 − 0.1768i | −0.1768 − 0.1768i | −0.1768 − 0.1768i | −0.1389 − 0.2079i |
| 0.0000 + 0.2500i | 0.0000 + 0.2500i | 0.0000 + 0.2500i | −0.0957 + 0.2310i |
| 0.1768 − 0.1768i | 0.1768 − 0.1768i | 0.1768 − 0.1768i | 0.2452 − 0.0488i |
| 0.2500 | −0.2500 | 0.2500 | −0.2500 |
| −0.1768 − 0.1768i | 0.1768 + 0.1768i | −0.1768 − 0.1768i | 0.1389 + 0.2079i |
| 0.0000 + 0.2500i | −0.0000 − 0.2500i | 0.0000 + 0.2500i | 0.0957 − 0.2310i |
| 0.1768 − 0.1768i | −0.1768 + 0.1768i | 0.1768 − 0.1768i | −0.2452 + 0.0488i |
| ans(:, :, 12, 1) = | | ans(:, :, 12, 9) = | |
| 0.2500 | 0.2500 | 0.2500 | 0.2500 |
| −0.0957 − 0.2310i | −0.0957 − 0.2310i | −0.0957 − 0.2310i | −0.0488 − 0.2452i |
| −0.1768 + 0.1768i | −0.1768 + 0.1768i | −0.1768 + 0.1768i | −0.2310 + 0.0957i |
| 0.2310 + 0.0957i | 0.2310 + 0.0957i | 0.2310 + 0.0957i | 0.1389 + 0.2079i |
| 0.2500 | −0.2500 | 0.2500 | −0.2500 |
| −0.0957 − 0.2310i | 0.0957 + 0.2310i | −0.0957 − 0.2310i | 0.0488 + 0.2452i |
| −0.1768 + 0.1768i | 0.1768 − 0.1768i | −0.1768 + 0.1768i | 0.2310 − 0.0957i |
| 0.2310 + 0.0957i | −0.2310 − 0.0957i | 0.2310 + 0.0957i | −0.1389 − 0.2079i |
| ans(:, :, 13, 1) = | | ans(:, :, 13, 9) = | |
| 0.2500 | 0.2500 | 0.2500 | 0.2500 |
| −0.0000 − 0.2500i | −0.0000 − 0.2500i | −0.0000 − 0.2500i | 0.0488 − 0.2452i |
| −0.2500 + 0.0000i | −0.2500 + 0.0000i | −0.2500 + 0.0000i | −0.2310 − 0.0957i |
| 0.0000 + 0.2500i | 0.0000 + 0.2500i | 0.0000 + 0.2500i | −0.1389 + 0.2079i |
| 0.2500 | −0.2500 | 0.2500 | −0.2500 |
| −0.0000 − 0.2500i | 0.0000 + 0.2500i | −0.0000 − 0.2500i | −0.0488 + 0.2452i |

TABLE 2-continued

| | | | |
|---|---|---|---|
| −0.2500 + 0.0000i | 0.2500 − 0.0000i | −0.2500 + 0.0000i | 0.2310 + 0.0957i |
| 0.0000 + 0.2500i | −0.0000 − 0.2500i | 0.0000 + 0.2500i | 0.1389 − 0.2079i |
| ans(:, :, 14, 1) = | | ans(:, :, 14, 9) = | |
| 0.2500 | 0.2500 | 0.2500 | 0.2500 |
| 0.0957 − 0.2310i | 0.0957 − 0.2310i | 0.0957 − 0.2310i | 0.1389 − 0.2079i |
| −0.1768 − 0.1768i | −0.1768 − 0.1768i | −0.1768 − 0.1768i | −0.0957 − 0.2310i |
| −0.2310 + 0.0957i | −0.2310 + 0.0957i | −0.2310 + 0.0957i | −0.2452 − 0.0488i |
| 0.2500 | −0.2500 | 0.2500 | −0.2500 |
| 0.0957 − 0.2310i | −0.0957 + 0.2310i | 0.0957 − 0.2310i | −0.1389 + 0.2079i |
| −0.1768 − 0.1768i | 0.1768 + 0.1768i | −0.1768 − 0.1768i | 0.0957 + 0.2310i |
| −0.2310 + 0.0957i | 0.2310 − 0.0957i | −0.2310 + 0.0957i | 0.2452 + 0.0488i |
| ans(:, :, 15, 1) = | | ans(:, :, 15, 9) = | |
| 0.2500 | 0.2500 | 0.2500 | 0.2500 |
| 0.1768 − 0.1768i | 0.1768 − 0.1768i | 0.1768 − 0.1768i | 0.2079 − 0.1389i |
| −0.0000 − 0.2500i | −0.0000 − 0.2500i | −0.0000 − 0.2500i | 0.0957 − 0.2310i |
| −0.1768 − 0.1768i | −0.1768 − 0.1768i | −0.1768 − 0.1768i | −0.0488 − 0.2452i |
| 0.2500 | −0.2500 | 0.2500 | −0.2500 |
| 0.1768 − 0.1768i | −0.1768 + 0.1768i | 0.1768 − 0.1768i | −0.2079 + 0.1389i |
| −0.0000 − 0.2500i | 0.0000 + 0.2500i | −0.0000 − 0.2500i | −0.0957 + 0.2310i |
| −0.1768 − 0.1768i | 0.1768 + 0.1768i | −0.1768 − 0.1768i | 0.0488 + 0.2452i |
| ans(:, :, 16, 1) = | | ans(:, :, 16, 9) = | |
| 0.2500 | 0.2500 | 0.2500 | 0.2500 |
| 0.2310 − 0.0957i | 0.2310 − 0.0957i | 0.2310 − 0.0957i | 0.2452 − 0.0488i |
| 0.1768 − 0.1768i | 0.1768 − 0.1768i | 0.1768 − 0.1768i | 0.2310 − 0.0957i |
| 0.0957 − 0.2310i | 0.0957 − 0.2310i | 0.0957 − 0.2310i | 0.2079 − 0.1389i |
| 0.2500 | −0.2500 | 0.2500 | −0.2500 |
| 0.2310 − 0.0957i | −0.2310 + 0.0957i | 0.2310 − 0.0957i | −0.2452 + 0.0488i |
| 0.1768 − 0.1768i | −0.1768 + 0.1768i | 0.1768 − 0.1768i | −0.2310 + 0.0957i |
| 0.0957 − 0.2310i | −0.0957 + 0.2310i | 0.0957 − 0.2310i | −0.2079 + 0.1389i |
| ans(:, :, 1, 2) = | | ans(:, :, 1, 10) = | |
| 0.2500 | 0.2500 | 0.2500 | 0.2500 |
| 0.2500 | 0.2500 | 0.2500 | 0.2452 + 0.0488i |
| 0.2500 | 0.2500 | 0.2500 | 0.2310 + 0.0957i |
| 0.2500 | 0.2500 | 0.2500 | 0.2079 + 0.1389i |
| 0 + 0.2500i | 0 − 0.2500i | 0 + 0.2500i | 0 − 0.2500i |
| 0 + 0.2500i | 0 − 0.2500i | 0 + 0.2500i | 0.0488 − 0.2452i |
| 0 + 0.2500i | 0 − 0.2500i | 0 + 0.2500i | 0.0957 − 0.2310i |
| 0 + 0.2500i | 0 − 0.2500i | 0 + 0.2500i | 0.1389 − 0.2079i |
| ans(:, :, 2, 2) = | | ans(:, :, 2, 10) = | |
| 0.2500 | 0.2500 | 0.2500 | 0.2500 |
| 0.2310 + 0.0957i | 0.2310 + 0.0957i | 0.2310 + 0.0957i | 0.2079 + 0.1389i |
| 0.1768 + 0.1768i | 0.1768 + 0.1768i | 0.1768 + 0.1768i | 0.0957 + 0.2310i |
| 0.0957 + 0.2310i | 0.0957 + 0.2310i | 0.0957 + 0.2310i | −0.0488 + 0.2452i |
| 0 + 0.2500i | 0 − 0.2500i | 0 + 0.2500i | 0 − 0.2500i |
| −0.0957 + 0.2310i | 0.0957 − 0.2310i | −0.0957 + 0.2310i | 0.1389 − 0.2079i |
| −0.1768 + 0.1768i | 0.1768 − 0.1768i | −0.1768 + 0.1768i | 0.2310 − 0.0957i |
| −0.2310 + 0.0957i | 0.2310 − 0.0957i | −0.2310 + 0.0957i | 0.2452 + 0.0488i |
| ans(:, :, 3, 2) = | | ans(:, :, 3, 10) = | |
| 0.2500 | 0.2500 | 0.2500 | 0.2500 |
| 0.1768 + 0.1768i | 0.1768 + 0.1768i | 0.1768 + 0.1768i | 0.1389 + 0.2079i |
| 0.0000 + 0.2500i | 0.0000 + 0.2500i | 0.0000 + 0.2500i | −0.0957 + 0.2310i |
| −0.1768 + 0.1768i | −0.1768 + 0.1768i | −0.1768 + 0.1768i | −0.2452 + 0.0488i |
| 0 + 0.2500i | 0 − 0.2500i | 0 + 0.2500i | 0 − 0.2500i |
| −0.1768 + 0.1768i | 0.1768 − 0.1768i | −0.1768 + 0.1768i | 0.2079 − 0.1389i |
| −0.2500 + 0.0000i | 0.2500 − 0.0000i | −0.2500 + 0.0000i | 0.2310 + 0.0957i |
| −0.1768 − 0.1768i | 0.1768 + 0.1768i | −0.1768 − 0.1768i | 0.0488 + 0.2452i |
| ans(:, :, 4, 2) = | | ans(:, :, 4, 10) = | |
| 0.2500 | 0.2500 | 0.2500 | 0.2500 |
| 0.0957 + 0.2310i | 0.0957 + 0.2310i | 0.0957 + 0.2310i | 0.0488 + 0.2452i |
| −0.1768 + 0.1768i | −0.1768 + 0.1768i | −0.1768 + 0.1768i | −0.2310 + 0.0957i |
| −0.2310 − 0.0957i | −0.2310 − 0.0957i | −0.2310 − 0.0957i | −0.1389 − 0.2079i |
| 0 + 0.2500i | 0 − 0.2500i | 0 + 0.2500i | 0 − 0.2500i |
| −0.2310 + 0.0957i | 0.2310 − 0.0957i | −0.2310 + 0.0957i | 0.2452 − 0.0488i |
| −0.1768 − 0.1768i | 0.1768 + 0.1768i | −0.1768 − 0.1768i | 0.0957 + 0.2310i |
| 0.0957 − 0.2310i | −0.0957 + 0.2310i | 0.0957 − 0.2310i | −0.2079 + 0.1389i |

TABLE 2-continued

| ans(:, :, 5, 2) = | | ans(:, :, 5, 10) = | |
|---|---|---|---|
| 0.2500 | 0.2500 | 0.2500 | 0.2500 |
| 0.0000 + 0.2500i | 0.0000 + 0.2500i | 0.0000 + 0.2500i | −0.0488 + 0.2452i |
| −0.2500 + 0.0000i | −0.2500 + 0.0000i | −0.2500 + 0.0000i | −0.2310 − 0.0957i |
| −0.0000 − 0.2500i | −0.0000 − 0.2500i | −0.0000 − 0.2500i | 0.1389 − 0.2079i |
| 0 + 0.2500i | 0 − 0.2500i | 0 + 0.2500i | 0 − 0.2500i |
| −0.2500 + 0.0000i | 0.2500 − 0.0000i | −0.2500 + 0.0000i | 0.2452 + 0.0488i |
| −0.0000 − 0.2500i | 0.0000 + 0.2500i | −0.0000 − 0.2500i | −0.0957 + 0.2310i |
| 0.2500 − 0.0000i | −0.2500 + 0.0000i | 0.2500 − 0.0000i | −0.2079 − 0.1389i |
| ans(:, :, 6, 2) = | | ans(:, :, 6, 10) = | |
| 0.2500 | 0.2500 | 0.2500 | 0.2500 |
| −0.0957 + 0.2310i | −0.0957 + 0.2310i | −0.0957 + 0.2310i | −0.1389 + 0.2079i |
| −0.1768 − 0.1768i | −0.1768 − 0.1768i | −0.1768 − 0.1768i | −0.0957 − 0.2310i |
| 0.2310 − 0.0957i | 0.2310 − 0.0957i | 0.2310 − 0.0957i | 0.2452 + 0.0488i |
| 0 + 0.2500i | 0 − 0.2500i | 0 + 0.2500i | 0 − 0.2500i |
| −0.2310 − 0.0957i | 0.2310 + 0.0957i | −0.2310 − 0.0957i | 0.2079 + 0.1389i |
| 0.1768 − 0.1768i | −0.1768 + 0.1768i | 0.1768 − 0.1768i | −0.2310 + 0.0957i |
| 0.0957 + 0.2310i | −0.0957 − 0.2310i | 0.0957 + 0.2310i | 0.0488 − 0.2452i |
| ans(:, :, 7, 2) = | | ans(:, :, 7, 10) = | |
| 0.2500 | 0.2500 | 0.2500 | 0.2500 |
| −0.1768 + 0.1768i | −0.1768 + 0.1768i | −0.1768 + 0.1768i | −0.2079 + 0.1389i |
| −0.0000 − 0.2500i | −0.0000 − 0.2500i | −0.0000 − 0.2500i | 0.0957 − 0.2310i |
| 0.1768 + 0.1768i | 0.1768 + 0.1768i | 0.1768 + 0.1768i | 0.0488 + 0.2452i |
| 0 + 0.2500i | 0 − 0.2500i | 0 + 0.2500i | 0 − 0.2500i |
| −0.1768 − 0.1768i | 0.1768 + 0.1768i | −0.1768 − 0.1768i | 0.1389 + 0.2079i |
| 0.2500 − 0.0000i | −0.2500 + 0.0000i | 0.2500 − 0.0000i | −0.2310 − 0.0957i |
| −0.1768 + 0.1768i | 0.1768 − 0.1768i | −0.1768 + 0.1768i | 0.2452 − 0.0488i |
| ans(:, :, 8, 2) = | | ans(:, :, 8, 10) = | |
| 0.2500 | 0.2500 | 0.2500 | 0.2500 |
| −0.2310 + 0.0957i | −0.2310 + 0.0957i | −0.2310 + 0.0957i | −0.2452 + 0.0488i |
| 0.1768 − 0.1768i | 0.1768 − 0.1768i | 0.1768 − 0.1768i | 0.2310 − 0.0957i |
| −0.0957 + 0.2310i | −0.0957 + 0.2310i | −0.0957 + 0.2310i | −0.2079 + 0.1389i |
| 0 + 0.2500i | 0 − 0.2500i | 0 + 0.2500i | 0 − 0.2500i |
| −0.0957 − 0.2310i | 0.0957 + 0.2310i | −0.0957 − 0.2310i | 0.0488 + 0.2452i |
| 0.1768 + 0.1768i | −0.1768 − 0.1768i | 0.1768 + 0.1768i | −0.0957 − 0.2310i |
| −0.2310 − 0.0957i | 0.2310 + 0.0957i | −0.2310 − 0.0957i | 0.1389 + 0.2079i |
| ans(:, :, 9, 2) = | | ans(:, :, 9, 10) = | |
| 0.2500 | 0.2500 | 0.2500 | 0.2500 |
| −0.2500 + 0.0000i | −0.2500 + 0.0000i | −0.2500 + 0.0000i | −0.2452 − 0.0488i |
| 0.2500 − 0.0000i | 0.2500 − 0.0000i | 0.2500 − 0.0000i | 0.2310 + 0.0957i |
| −0.2500 + 0.0000i | −0.2500 + 0.0000i | −0.2500 + 0.0000i | −0.2079 − 0.1389i |
| 0 + 0.2500i | 0 − 0.2500i | 0 + 0.2500i | 0 − 0.2500i |
| −0.0000 − 0.2500i | 0.0000 + 0.2500i | −0.0000 − 0.2500i | −0.0488 + 0.2452i |
| 0.0000 + 0.2500i | −0.0000 − 0.2500i | 0.0000 + 0.2500i | 0.0957 − 0.2310i |
| −0.0000 − 0.2500i | 0.0000 + 0.2500i | −0.0000 − 0.2500i | −0.1389 + 0.2079i |
| ans(:, :, 10, 2) = | | ans(:, :, 10, 10) = | |
| 0.2500 | 0.2500 | 0.2500 | 0.2500 |
| −0.2310 − 0.0957i | −0.2310 − 0.0957i | −0.2310 − 0.0957i | −0.2079 − 0.1389i |
| 0.1768 + 0.1768i | 0.1768 + 0.1768i | 0.1768 + 0.1768i | 0.0957 + 0.2310i |
| −0.0957 − 0.2310i | −0.0957 − 0.2310i | −0.0957 − 0.2310i | 0.0488 − 0.2452i |
| 0 + 0.2500i | 0 − 0.2500i | 0 + 0.2500i | 0 − 0.2500i |
| 0.0957 − 0.2310i | −0.0957 + 0.2310i | 0.0957 − 0.2310i | −0.1389 + 0.2079i |
| −0.1768 + 0.1768i | 0.1768 − 0.1768i | −0.1768 + 0.1768i | 0.2310 − 0.0957i |
| 0.2310 − 0.0957i | −0.2310 + 0.0957i | 0.2310 − 0.0957i | −0.2452 − 0.0488i |
| ans(:, :, 11, 2) = | | ans(:, :, 11, 10) = | |
| 0.2500 | 0.2500 | 0.2500 | 0.2500 |
| −0.1768 − 0.1768i | −0.1768 − 0.1768i | −0.1768 − 0.1768i | −0.1389 − 0.2079i |
| 0.0000 + 0.2500i | 0.0000 + 0.2500i | 0.0000 + 0.2500i | −0.0957 + 0.2310i |
| 0.1768 − 0.1768i | 0.1768 − 0.1768i | 0.1768 − 0.1768i | 0.2452 − 0.0488i |
| 0 + 0.2500i | 0 − 0.2500i | 0 + 0.2500i | 0 − 0.2500i |
| 0.1768 − 0.1768i | −0.1768 + 0.1768i | 0.1768 − 0.1768i | −0.2079 + 0.1389i |
| −0.2500 + 0.0000i | 0.2500 − 0.0000i | −0.2500 + 0.0000i | 0.2310 + 0.0957i |
| 0.1768 + 0.1768i | −0.1768 − 0.1768i | 0.1768 + 0.1768i | −0.0488 − 0.2452i |

TABLE 2-continued

| ans(:, :, 12, 2) = | | ans(:, :, 12, 10) = | |
|---|---|---|---|
| 0.2500 | 0.2500 | 0.2500 | 0.2500 |
| −0.0957 − 0.2310i | −0.0957 − 0.2310i | −0.0957 − 0.2310i | −0.0488 − 0.2452i |
| −0.1768 + 0.1768i | −0.1768 + 0.1768i | −0.1768 + 0.1768i | −0.2310 + 0.0957i |
| 0.2310 + 0.0957i | 0.2310 + 0.0957i | 0.2310 + 0.0957i | 0.1389 + 0.2079i |
| 0 + 0.2500i | 0 − 0.2500i | 0 + 0.2500i | 0 − 0.2500i |
| 0.2310 − 0.0957i | −0.2310 + 0.0957i | 0.2310 − 0.0957i | −0.2452 + 0.0488i |
| −0.1768 − 0.1768i | 0.1768 + 0.1768i | −0.1768 − 0.1768i | 0.0957 + 0.2310i |
| −0.0957 + 0.2310i | 0.0957 − 0.2310i | −0.0957 + 0.2310i | 0.2079 − 0.1389i |
| **ans(:, :, 13, 2) =** | | **ans(:, :, 13, 10) =** | |
| 0.2500 | 0.2500 | 0.2500 | 0.2500 |
| −0.0000 − 0.2500i | −0.0000 − 0.2500i | −0.0000 − 0.2500i | 0.0488 − 0.2452i |
| −0.2500 + 0.0000i | −0.2500 + 0.0000i | −0.2500 + 0.0000i | −0.2310 − 0.0957i |
| 0.0000 + 0.2500i | 0.0000 + 0.2500i | 0.0000 + 0.2500i | −0.1389 + 0.2079i |
| 0 + 0.2500i | 0 − 0.2500i | 0 + 0.2500i | 0 − 0.2500i |
| 0.2500 − 0.0000i | −0.2500 + 0.0000i | 0.2500 − 0.0000i | −0.2452 − 0.0488i |
| −0.0000 − 0.2500i | 0.0000 + 0.2500i | −0.0000 − 0.2500i | −0.0957 + 0.2310i |
| −0.2500 + 0.0000i | 0.2500 − 0.0000i | −0.2500 + 0.0000i | 0.2079 + 0.1389i |
| **ans(:, :, 14, 2) =** | | **ans(:, :, 14, 10) =** | |
| 0.2500 | 0.2500 | 0.2500 | 0.2500 |
| 0.0957 − 0.2310i | 0.0957 − 0.2310i | 0.0957 − 0.2310i | 0.1389 − 0.2079i |
| −0.1768 − 0.1768i | −0.1768 − 0.1768i | −0.1768 − 0.1768i | −0.0957 − 0.2310i |
| −0.2310 + 0.0957i | −0.2310 + 0.0957i | −0.2310 + 0.0957i | −0.2452 − 0.0488i |
| 0 + 0.2500i | 0 − 0.2500i | 0 + 0.2500i | 0 − 0.2500i |
| 0.2310 + 0.0957i | −0.2310 − 0.0957i | 0.2310 + 0.0957i | −0.2079 − 0.1389i |
| 0.1768 − 0.1768i | −0.1768 + 0.1768i | 0.1768 − 0.1768i | −0.2310 + 0.0957i |
| −0.0957 − 0.2310i | 0.0957 + 0.2310i | −0.0957 − 0.2310i | −0.0488 + 0.2452i |
| **ans(:, :, 15, 2) =** | | **ans(:, :, 15, 10) =** | |
| 0.2500 | 0.2500 | 0.2500 | 0.2500 |
| 0.1768 − 0.1768i | 0.1768 − 0.1768i | 0.1768 − 0.1768i | 0.2079 − 0.1389i |
| −0.0000 − 0.2500i | −0.0000 − 0.2500i | −0.0000 − 0.2500i | 0.0957 − 0.2310i |
| −0.1768 − 0.1768i | −0.1768 − 0.1768i | −0.1768 − 0.1768i | −0.0488 − 0.2452i |
| 0 + 0.2500i | 0 − 0.2500i | 0 + 0.2500i | 0 − 0.2500i |
| 0.1768 + 0.1768i | −0.1768 − 0.1768i | 0.1768 + 0.1768i | −0.1389 − 0.2079i |
| 0.2500 − 0.0000i | −0.2500 + 0.0000i | 0.2500 − 0.0000i | −0.2310 − 0.0957i |
| 0.1768 − 0.1768i | −0.1768 + 0.1768i | 0.1768 − 0.1768i | −0.2452 + 0.0488i |
| **ans(:, :, 16, 2) =** | | **ans(:, :, 16, 10) =** | |
| 0.2500 | 0.2500 | 0.2500 | 0.2500 |
| 0.2310 − 0.0957i | 0.2310 − 0.0957i | 0.2310 − 0.0957i | 0.2452 − 0.0488i |
| 0.1768 − 0.1768i | 0.1768 − 0.1768i | 0.1768 − 0.1768i | 0.2310 − 0.0957i |
| 0.0957 − 0.2310i | 0.0957 − 0.2310i | 0.0957 − 0.2310i | 0.2079 − 0.1389i |
| 0 + 0.2500i | 0 − 0.2500i | 0 + 0.2500i | 0 − 0.2500i |
| 0.0957 + 0.2310i | −0.0957 − 0.2310i | 0.0957 + 0.2310i | −0.0488 − 0.2452i |
| 0.1768 + 0.1768i | −0.1768 − 0.1768i | 0.1768 + 0.1768i | −0.0957 − 0.2310i |
| 0.2310 + 0.0957i | −0.2310 − 0.0957i | 0.2310 + 0.0957i | −0.1389 − 0.2079i |
| **ans(:, :, 1, 3) =** | | **ans(:, :, 1, 11) =** | |
| 0.2500 | 0.2500 | 0.2500 | 0.2500 |
| 0.2452 + 0.0488i | 0.2452 + 0.0488i | 0.2452 + 0.0488i | 0.2310 + 0.0957i |
| 0.2310 + 0.0957i | 0.2310 + 0.0957i | 0.2310 + 0.0957i | 0.1768 + 0.1768i |
| 0.2079 + 0.1389i | 0.2079 + 0.1389i | 0.2079 + 0.1389i | 0.0957 + 0.2310i |
| 0.2500 | −0.2500 | 0.2500 | −0.2500 |
| 0.2452 + 0.0488i | −0.2452 − 0.0488i | 0.2452 + 0.0488i | −0.2310 − 0.0957i |
| 0.2310 + 0.0957i | −0.2310 − 0.0957i | 0.2310 + 0.0957i | −0.1768 − 0.1768i |
| 0.2079 + 0.1389i | −0.2079 − 0.1389i | 0.2079 + 0.1389i | −0.0957 − 0.2310i |
| **ans(:, :, 2, 3) =** | | **ans(:, :, 2, 11) =** | |
| 0.2500 | 0.2500 | 0.2500 | 0.2500 |
| 0.2079 + 0.1389i | 0.2079 + 0.1389i | 0.2079 + 0.1389i | 0.1768 + 0.1768i |
| 0.0957 + 0.2310i | 0.0957 + 0.2310i | 0.0957 + 0.2310i | 0.0000 + 0.2500i |
| −0.0488 + 0.2452i | −0.0488 + 0.2452i | −0.0488 + 0.2452i | −0.1768 + 0.1768i |
| 0.2500 | −0.2500 | 0.2500 | −0.2500 |
| 0.2079 + 0.1389i | −0.2079 − 0.1389i | 0.2079 + 0.1389i | −0.1768 − 0.1768i |
| 0.0957 + 0.2310i | −0.0957 − 0.2310i | 0.0957 + 0.2310i | −0.0000 − 0.2500i |
| −0.0488 + 0.2452i | 0.0488 − 0.2452i | −0.0488 + 0.2452i | 0.1768 − 0.1768i |

TABLE 2-continued

| ans(:, :, 3, 3) = | | ans(:, :, 3, 11) = | |
|---|---|---|---|
| 0.2500 | 0.2500 | 0.2500 | 0.2500 |
| 0.1389 + 0.2079i | 0.1389 + 0.2079i | 0.1389 + 0.2079i | 0.0957 + 0.2310i |
| −0.0957 + 0.2310i | −0.0957 + 0.2310i | −0.0957 + 0.2310i | −0.1768 + 0.1768i |
| −0.2452 + 0.0488i | −0.2452 + 0.0488i | −0.2452 + 0.0488i | −0.2310 − 0.0957i |
| 0.2500 | −0.2500 | 0.2500 | −0.2500 |
| 0.1389 + 0.2079i | −0.1389 − 0.2079i | 0.1389 + 0.2079i | −0.0957 − 0.2310i |
| −0.0957 + 0.2310i | 0.0957 − 0.2310i | −0.0957 + 0.2310i | 0.1768 − 0.1768i |
| −0.2452 + 0.0488i | 0.2452 − 0.0488i | −0.2452 + 0.0488i | 0.2310 + 0.0957i |
| ans(:, :, 4, 3) = | | ans(:, :, 4, 11) = | |
| 0.2500 | 0.2500 | 0.2500 | 0.2500 |
| 0.0488 + 0.2452i | 0.0488 + 0.2452i | 0.0488 + 0.2452i | 0.0000 + 0.2500i |
| −0.2310 + 0.0957i | −0.2310 + 0.0957i | −0.2310 + 0.0957i | −0.2500 + 0.0000i |
| −0.1389 − 0.2079i | −0.1389 − 0.2079i | −0.1389 − 0.2079i | −0.0000 − 0.2500i |
| 0.2500 | −0.2500 | 0.2500 | −0.2500 |
| 0.0488 + 0.2452i | −0.0488 − 0.2452i | 0.0488 + 0.2452i | −0.0000 − 0.2500i |
| −0.2310 + 0.0957i | 0.2310 − 0.0957i | −0.2310 + 0.0957i | 0.2500 − 0.0000i |
| −0.1389 − 0.2079i | 0.1389 + 0.2079i | −0.1389 − 0.2079i | 0.0000 + 0.2500i |
| ans(:, :, 5, 3) = | | ans(:, :, 5, 11) = | |
| 0.2500 | 0.2500 | 0.2500 | 0.2500 |
| −0.0488 + 0.2452i | −0.0488 + 0.2452i | −0.0488 + 0.2452i | −0.0957 + 0.2310i |
| −0.2310 − 0.0957i | −0.2310 − 0.0957i | −0.2310 − 0.0957i | −0.1768 − 0.1768i |
| 0.1389 − 0.2079i | 0.1389 − 0.2079i | 0.1389 − 0.2079i | 0.2310 − 0.0957i |
| 0.2500 | −0.2500 | 0.2500 | −0.2500 |
| −0.0488 + 0.2452i | 0.0488 − 0.2452i | −0.0488 + 0.2452i | 0.0957 − 0.2310i |
| −0.2310 − 0.0957i | 0.2310 + 0.0957i | −0.2310 − 0.0957i | 0.1768 + 0.1768i |
| 0.1389 − 0.2079i | −0.1389 + 0.2079i | 0.1389 − 0.2079i | −0.2310 + 0.0957i |
| ans(:, :, 6, 3) = | | ans(:, :, 6, 11) = | |
| 0.2500 | 0.2500 | 0.2500 | 0.2500 |
| −0.1389 + 0.2079i | −0.1389 + 0.2079i | −0.1389 + 0.2079i | −0.1768 + 0.1768i |
| −0.0957 − 0.2310i | −0.0957 − 0.2310i | −0.0957 − 0.2310i | −0.0000 − 0.2500i |
| 0.2452 + 0.0488i | 0.2452 + 0.0488i | 0.2452 + 0.0488i | 0.1768 + 0.1768i |
| 0.2500 | −0.2500 | 0.2500 | −0.2500 |
| −0.1389 + 0.2079i | 0.1389 − 0.2079i | −0.1389 + 0.2079i | 0.1768 − 0.1768i |
| −0.0957 − 0.2310i | 0.0957 + 0.2310i | −0.0957 − 0.2310i | 0.0000 + 0.2500i |
| 0.2452 + 0.0488i | −0.2452 − 0.0488i | 0.2452 + 0.0488i | −0.1768 − 0.1768i |
| ans(:, :, 7, 3) = | | ans(:, :, 7, 11) = | |
| 0.2500 | 0.2500 | 0.2500 | 0.2500 |
| −0.2079 + 0.1389i | −0.2079 + 0.1389i | −0.2079 + 0.1389i | −0.2310 + 0.0957i |
| 0.0957 − 0.2310i | 0.0957 − 0.2310i | 0.0957 − 0.2310i | 0.1768 − 0.1768i |
| 0.0488 + 0.2452i | 0.0488 + 0.2452i | 0.0488 + 0.2452i | −0.0957 + 0.2310i |
| 0.2500 | −0.2500 | 0.2500 | −0.2500 |
| −0.2079 + 0.1389i | 0.2079 − 0.1389i | −0.2079 + 0.1389i | 0.2310 − 0.0957i |
| 0.0957 − 0.2310i | −0.0957 + 0.2310i | 0.0957 − 0.2310i | −0.1768 + 0.1768i |
| 0.0488 + 0.2452i | −0.0488 − 0.2452i | 0.0488 + 0.2452i | 0.0957 − 0.2310i |
| ans(:, :, 8, 3) = | | ans(:, :, 8, 11) = | |
| 0.2500 | 0.2500 | 0.2500 | 0.2500 |
| −0.2452 + 0.0488i | −0.2452 + 0.0488i | −0.2452 + 0.0488i | −0.2500 + 0.0000i |
| 0.2310 − 0.0957i | 0.2310 − 0.0957i | 0.2310 − 0.0957i | 0.2500 − 0.0000i |
| −0.2079 + 0.1389i | −0.2079 + 0.1389i | −0.2079 + 0.1389i | −0.2500 + 0.0000i |
| 0.2500 | −0.2500 | 0.2500 | −0.2500 |
| −0.2452 + 0.0488i | 0.2452 − 0.0488i | −0.2452 + 0.0488i | 0.2500 − 0.0000i |
| 0.2310 − 0.0957i | −0.2310 + 0.0957i | 0.2310 − 0.0957i | −0.2500 + 0.0000i |
| −0.2079 + 0.1389i | 0.2079 − 0.1389i | −0.2079 + 0.1389i | 0.2500 − 0.0000i |
| ans(:, :, 9, 3) = | | ans(:, :, 9, 11) = | |
| 0.2500 | 0.2500 | 0.2500 | 0.2500 |
| −0.2452 − 0.0488i | −0.2452 − 0.0488i | −0.2452 − 0.0488i | −0.2310 − 0.0957i |
| 0.2310 + 0.0957i | 0.2310 + 0.0957i | 0.2310 + 0.0957i | 0.1768 + 0.1768i |
| −0.2079 − 0.1389i | −0.2079 − 0.1389i | −0.2079 − 0.1389i | −0.0957 − 0.2310i |
| 0.2500 | −0.2500 | 0.2500 | −0.2500 |
| −0.2452 − 0.0488i | 0.2452 + 0.0488i | −0.2452 − 0.0488i | 0.2310 + 0.0957i |
| 0.2310 + 0.0957i | −0.2310 − 0.0957i | 0.2310 + 0.0957i | −0.1768 − 0.1768i |
| −0.2079 − 0.1389i | 0.2079 + 0.1389i | −0.2079 − 0.1389i | 0.0957 + 0.2310i |

TABLE 2-continued

| ans(:, :, 10, 3) = | | ans(:, :, 10, 11) = | |
|---|---|---|---|
| 0.2500 | 0.2500 | 0.2500 | 0.2500 |
| −0.2079 − 0.1389i | −0.2079 − 0.1389i | −0.2079 − 0.1389i | −0.1768 − 0.1768i |
| 0.0957 + 0.2310i | 0.0957 + 0.2310i | 0.0957 + 0.2310i | 0.0000 + 0.2500i |
| 0.0488 − 0.2452i | 0.0488 − 0.2452i | 0.0488 − 0.2452i | 0.1768 − 0.1768i |
| 0.2500 | −0.2500 | 0.2500 | −0.2500 |
| −0.2079 − 0.1389i | 0.2079 + 0.1389i | −0.2079 − 0.1389i | 0.1768 + 0.1768i |
| 0.0957 + 0.2310i | −0.0957 − 0.2310i | 0.0957 + 0.2310i | −0.0000 − 0.2500i |
| 0.0488 − 0.2452i | −0.0488 + 0.2452i | 0.0488 − 0.2452i | −0.1768 + 0.1768i |
| ans(:, :, 11, 3) = | | ans(:, :, 11, 11) = | |
| 0.2500 | 0.2500 | 0.2500 | 0.2500 |
| −0.1389 − 0.2079i | −0.1389 − 0.2079i | −0.1389 − 0.2079i | −0.0957 − 0.2310i |
| −0.0957 + 0.2310i | −0.0957 + 0.2310i | −0.0957 + 0.2310i | −0.1768 + 0.1768i |
| 0.2452 − 0.0488i | 0.2452 − 0.0488i | 0.2452 − 0.0488i | 0.2310 + 0.0957i |
| 0.2500 | −0.2500 | 0.2500 | −0.2500 |
| −0.1389 − 0.2079i | 0.1389 + 0.2079i | −0.1389 − 0.2079i | 0.0957 + 0.2310i |
| −0.0957 + 0.2310i | 0.0957 − 0.2310i | −0.0957 + 0.2310i | 0.1768 − 0.1768i |
| 0.2452 − 0.0488i | −0.2452 + 0.0488i | 0.2452 − 0.0488i | −0.2310 − 0.0957i |
| ans(:, :, 12, 3) = | | ans(:, :, 12, 11) = | |
| 0.2500 | 0.2500 | 0.2500 | 0.2500 |
| −0.0488 − 0.2452i | −0.0488 − 0.2452i | −0.0488 − 0.2452i | −0.0000 − 0.2500i |
| −0.2310 + 0.0957i | −0.2310 + 0.0957i | −0.2310 + 0.0957i | −0.2500 + 0.0000i |
| 0.1389 + 0.2079i | 0.1389 + 0.2079i | 0.1389 + 0.2079i | 0.0000 + 0.2500i |
| 0.2500 | −0.2500 | 0.2500 | −0.2500 |
| −0.0488 − 0.2452i | 0.0488 + 0.2452i | −0.0488 − 0.2452i | 0.0000 + 0.2500i |
| −0.2310 + 0.0957i | 0.2310 − 0.0957i | −0.2310 + 0.0957i | 0.2500 − 0.0000i |
| 0.1389 + 0.2079i | −0.1389 − 0.2079i | 0.1389 + 0.2079i | −0.0000 − 0.2500i |
| ans(:, :, 13, 3) = | | ans(:, :, 13, 11) = | |
| 0.2500 | 0.2500 | 0.2500 | 0.2500 |
| 0.0488 − 0.2452i | 0.0488 − 0.2452i | 0.0488 − 0.2452i | 0.0957 − 0.2310i |
| −0.2310 − 0.0957i | −0.2310 − 0.0957i | −0.2310 − 0.0957i | −0.1768 − 0.1768i |
| −0.1389 + 0.2079i | −0.1389 + 0.2079i | −0.1389 + 0.2079i | −0.2310 + 0.0957i |
| 0.2500 | −0.2500 | 0.2500 | −0.2500 |
| 0.0488 − 0.2452i | −0.0488 + 0.2452i | 0.0488 − 0.2452i | −0.0957 + 0.2310i |
| −0.2310 − 0.0957i | 0.2310 + 0.0957i | −0.2310 − 0.0957i | 0.1768 + 0.1768i |
| −0.1389 + 0.2079i | 0.1389 − 0.2079i | −0.1389 + 0.2079i | 0.2310 − 0.0957i |
| ans(:, :, 14, 3) = | | ans(:, :, 14, 11) = | |
| 0.2500 | 0.2500 | 0.2500 | 0.2500 |
| 0.1389 − 0.2079i | 0.1389 − 0.2079i | 0.1389 − 0.2079i | 0.1768 − 0.1768i |
| −0.0957 − 0.2310i | −0.0957 − 0.2310i | −0.0957 − 0.2310i | −0.0000 − 0.2500i |
| −0.2452 − 0.0488i | −0.2452 − 0.0488i | −0.2452 − 0.0488i | −0.1768 − 0.1768i |
| 0.2500 | −0.2500 | 0.2500 | −0.2500 |
| 0.1389 − 0.2079i | −0.1389 + 0.2079i | 0.1389 − 0.2079i | −0.1768 + 0.1768i |
| −0.0957 − 0.2310i | 0.0957 + 0.2310i | −0.0957 − 0.2310i | 0.0000 + 0.2500i |
| −0.2452 − 0.0488i | 0.2452 + 0.0488i | −0.2452 − 0.0488i | 0.1768 + 0.1768i |
| ans(:, :, 15, 3) = | | ans(:, :, 15, 11) = | |
| 0.2500 | 0.2500 | 0.2500 | 0.2500 |
| 0.2079 − 0.1389i | 0.2079 − 0.1389i | 0.2079 − 0.1389i | 0.2310 − 0.0957i |
| 0.0957 − 0.2310i | 0.0957 − 0.2310i | 0.0957 − 0.2310i | 0.1768 − 0.1768i |
| −0.0488 − 0.2452i | −0.0488 − 0.2452i | −0.0488 − 0.2452i | 0.0957 − 0.2310i |
| 0.2500 | −0.2500 | 0.2500 | −0.2500 |
| 0.2079 − 0.1389i | −0.2079 + 0.1389i | 0.2079 − 0.1389i | −0.2310 + 0.0957i |
| 0.0957 − 0.2310i | −0.0957 + 0.2310i | 0.0957 − 0.2310i | −0.1768 + 0.1768i |
| −0.0488 − 0.2452i | 0.0488 + 0.2452i | −0.0488 − 0.2452i | −0.0957 + 0.2310i |
| ans(:, :, 16, 3) = | | ans(:, :, 16, 11) = | |
| 0.2500 | 0.2500 | 0.2500 | 0.2500 |
| 0.2452 − 0.0488i | 0.2452 − 0.0488i | 0.2452 − 0.0488i | 0.2500 |
| 0.2310 − 0.0957i | 0.2310 − 0.0957i | 0.2310 − 0.0957i | 0.2500 |
| 0.2079 − 0.1389i | 0.2079 − 0.1389i | 0.2079 − 0.1389i | 0.2500 |
| 0.2500 | −0.2500 | 0.2500 | −0.2500 |
| 0.2452 − 0.0488i | −0.2452 + 0.0488i | 0.2452 − 0.0488i | −0.2500 |
| 0.2310 − 0.0957i | −0.2310 + 0.0957i | 0.2310 − 0.0957i | −0.2500 |
| 0.2079 − 0.1389i | −0.2079 + 0.1389i | 0.2079 − 0.1389i | −0.2500 |

TABLE 2-continued

| ans(:, :, 1, 4) = | | ans(:, :, 1, 12) = | |
|---|---|---|---|
| 0.2500 | 0.2500 | 0.2500 | 0.2500 |
| 0.2452 + 0.0488i | 0.2452 + 0.0488i | 0.2452 + 0.0488i | 0.2310 + 0.0957i |
| 0.2310 + 0.0957i | 0.2310 + 0.0957i | 0.2310 + 0.0957i | 0.1768 + 0.1768i |
| 0.2079 + 0.1389i | 0.2079 + 0.1389i | 0.2079 + 0.1389i | 0.0957 + 0.2310i |
| 0 + 0.2500i | 0 − 0.2500i | 0 + 0.2500i | 0 − 0.2500i |
| −0.0488 + 0.2452i | 0.0488 − 0.2452i | −0.0488 + 0.2452i | 0.0957 − 0.2310i |
| −0.0957 + 0.2310i | 0.0957 − 0.2310i | −0.0957 + 0.2310i | 0.1768 − 0.1768i |
| −0.1389 + 0.2079i | 0.1389 − 0.2079i | −0.1389 + 0.2079i | 0.2310 − 0.0957i |
| ans(:, :, 2, 4) = | | ans(:, :, 2, 12) = | |
| 0.2500 | 0.2500 | 0.2500 | 0.2500 |
| 0.2079 + 0.1389i | 0.2079 + 0.1389i | 0.2079 + 0.1389i | 0.1768 + 0.1768i |
| 0.0957 + 0.2310i | 0.0957 + 0.2310i | 0.0957 + 0.2310i | 0.0000 + 0.2500i |
| −0.0488 + 0.2452i | −0.0488 + 0.2452i | −0.0488 + 0.2452i | −0.1768 + 0.1768i |
| 0 + 0.2500i | 0 − 0.2500i | 0 + 0.2500i | 0 − 0.2500i |
| −0.1389 + 0.2079i | 0.1389 − 0.2079i | −0.1389 + 0.2079i | 0.1768 − 0.1768i |
| −0.2310 + 0.0957i | 0.2310 − 0.0957i | −0.2310 + 0.0957i | 0.2500 − 0.0000i |
| −0.2452 − 0.0488i | 0.2452 + 0.0488i | −0.2452 − 0.0488i | 0.1768 + 0.1768i |
| ans(:, :, 3, 4) = | | ans(:, :, 3, 12) = | |
| 0.2500 | 0.2500 | 0.2500 | 0.2500 |
| 0.1389 + 0.2079i | 0.1389 + 0.2079i | 0.1389 + 0.2079i | 0.0957 + 0.2310i |
| −0.0957 + 0.2310i | −0.0957 + 0.2310i | −0.0957 + 0.2310i | −0.1768 + 0.1768i |
| −0.2452 + 0.0488i | −0.2452 + 0.0488i | −0.2452 + 0.0488i | −0.2310 − 0.0957i |
| 0 + 0.2500i | 0 − 0.2500i | 0 + 0.2500i | 0 − 0.2500i |
| −0.2079 + 0.1389i | 0.2079 − 0.1389i | −0.2079 + 0.1389i | 0.2310 − 0.0957i |
| −0.2310 − 0.0957i | 0.2310 + 0.0957i | −0.2310 − 0.0957i | 0.1768 + 0.1768i |
| −0.0488 − 0.2452i | 0.0488 + 0.2452i | −0.0488 − 0.2452i | −0.0957 + 0.2310i |
| ans(:, :, 4, 4) = | | ans(:, :, 4, 12) = | |
| 0.2500 | 0.2500 | 0.2500 | 0.2500 |
| 0.0488 + 0.2452i | 0.0488 + 0.2452i | 0.0488 + 0.2452i | 0.0000 + 0.2500i |
| −0.2310 + 0.0957i | −0.2310 + 0.0957i | −0.2310 + 0.0957i | −0.2500 + 0.0000i |
| −0.1389 − 0.2079i | −0.1389 − 0.2079i | −0.1389 − 0.2079i | −0.0000 − 0.2500i |
| 0 + 0.2500i | 0 − 0.2500i | 0 + 0.2500i | 0 − 0.2500i |
| −0.2452 + 0.0488i | 0.2452 − 0.0488i | −0.2452 + 0.0488i | 0.2500 − 0.0000i |
| −0.0957 − 0.2310i | 0.0957 + 0.2310i | −0.0957 − 0.2310i | 0.0000 + 0.2500i |
| 0.2079 − 0.1389i | −0.2079 + 0.1389i | 0.2079 − 0.1389i | −0.2500 + 0.0000i |
| ans(:, :, 5, 4) = | | ans(:, :, 5, 12) = | |
| 0.2500 | 0.2500 | 0.2500 | 0.2500 |
| −0.0488 + 0.2452i | −0.0488 + 0.2452i | −0.0488 + 0.2452i | −0.0957 + 0.2310i |
| −0.2310 − 0.0957i | −0.2310 − 0.0957i | −0.2310 − 0.0957i | −0.1768 − 0.1768i |
| 0.1389 − 0.2079i | 0.1389 − 0.2079i | 0.1389 − 0.2079i | 0.2310 − 0.0957i |
| 0 + 0.2500i | 0 − 0.2500i | 0 + 0.2500i | 0 − 0.2500i |
| −0.2452 − 0.0488i | 0.2452 + 0.0488i | −0.2452 − 0.0488i | 0.2310 + 0.0957i |
| 0.0957 − 0.2310i | −0.0957 + 0.2310i | 0.0957 − 0.2310i | −0.1768 + 0.1768i |
| 0.2079 + 0.1389i | −0.2079 − 0.1389i | 0.2079 + 0.1389i | −0.0957 − 0.2310i |
| ans(:, :, 6, 4) = | | ans(:, :, 6, 12) = | |
| 0.2500 | 0.2500 | 0.2500 | 0.2500 |
| −0.1389 + 0.2079i | −0.1389 + 0.2079i | −0.1389 + 0.2079i | −0.1768 + 0.1768i |
| −0.0957 − 0.2310i | −0.0957 − 0.2310i | −0.0957 − 0.2310i | −0.0000 − 0.2500i |
| 0.2452 + 0.0488i | 0.2452 + 0.0488i | 0.2452 + 0.0488i | 0.1768 + 0.1768i |
| 0 + 0.2500i | 0 − 0.2500i | 0 + 0.2500i | 0 − 0.2500i |
| −0.2079 − 0.1389i | 0.2079 + 0.1389i | −0.2079 − 0.1389i | 0.1768 + 0.1768i |
| 0.2310 − 0.0957i | −0.2310 + 0.0957i | 0.2310 − 0.0957i | −0.2500 + 0.0000i |
| −0.0488 + 0.2452i | 0.0488 − 0.2452i | −0.0488 + 0.2452i | 0.1768 − 0.1768i |
| ans(:, :, 7, 4) = | | ans(:, :, 7, 12) = | |
| 0.2500 | 0.2500 | 0.2500 | 0.2500 |
| −0.2079 + 0.1389i | −0.2079 + 0.1389i | −0.2079 + 0.1389i | −0.2310 + 0.0957i |
| 0.0957 − 0.2310i | 0.0957 − 0.2310i | 0.0957 − 0.2310i | 0.1768 − 0.1768i |
| 0.0488 + 0.2452i | 0.0488 + 0.2452i | 0.0488 + 0.2452i | −0.0957 + 0.2310i |
| 0 + 0.2500i | 0 − 0.2500i | 0 + 0.2500i | 0 − 0.2500i |
| −0.1389 − 0.2079i | 0.1389 + 0.2079i | −0.1389 − 0.2079i | 0.0957 + 0.2310i |
| 0.2310 + 0.0957i | −0.2310 − 0.0957i | 0.2310 + 0.0957i | −0.1768 − 0.1768i |
| −0.2452 + 0.0488i | 0.2452 − 0.0488i | −0.2452 + 0.0488i | 0.2310 + 0.0957i |

TABLE 2-continued

| ans(:, :, 8, 4) = | | ans(:, :, 8, 12) = | |
|---|---|---|---|
| 0.2500 | 0.2500 | 0.2500 | 0.2500 |
| −0.2452 + 0.0488i | −0.2452 + 0.0488i | −0.2452 + 0.0488i | −0.2500 + 0.0000i |
| 0.2310 − 0.0957i | 0.2310 − 0.0957i | 0.2310 − 0.0957i | 0.2500 − 0.0000i |
| −0.2079 + 0.1389i | −0.2079 + 0.1389i | −0.2079 + 0.1389i | −0.2500 + 0.0000i |
| 0 + 0.2500i | 0 − 0.2500i | 0 + 0.2500i | 0 − 0.2500i |
| −0.0488 − 0.2452i | 0.0488 + 0.2452i | −0.0488 − 0.2452i | 0.0000 + 0.2500i |
| 0.0957 + 0.2310i | −0.0957 − 0.2310i | 0.0957 + 0.2310i | −0.0000 − 0.2500i |
| −0.1389 − 0.2079i | 0.1389 + 0.2079i | −0.1389 − 0.2079i | 0.0000 + 0.2500i |
| ans(:, :, 9, 4) = | | ans(:, :, 9, 12) = | |
| 0.2500 | 0.2500 | 0.2500 | 0.2500 |
| −0.2452 − 0.0488i | −0.2452 − 0.0488i | −0.2452 − 0.0488i | −0.2310 − 0.0957i |
| 0.2310 + 0.0957i | 0.2310 + 0.0957i | 0.2310 + 0.0957i | 0.1768 + 0.1768i |
| −0.2079 − 0.1389i | −0.2079 − 0.1389i | −0.2079 − 0.1389i | −0.0957 − 0.2310i |
| 0 + 0.2500i | 0 − 0.2500i | 0 + 0.2500i | 0 − 0.2500i |
| 0.0488 − 0.2452i | −0.0488 + 0.2452i | 0.0488 − 0.2452i | −0.0957 + 0.2310i |
| −0.0957 + 0.2310i | 0.0957 − 0.2310i | −0.0957 + 0.2310i | 0.1768 − 0.1768i |
| 0.1389 − 0.2079i | −0.1389 + 0.2079i | 0.1389 − 0.2079i | −0.2310 + 0.0957i |
| ans(:, :, 10, 4) = | | ans(:, :, 10, 12) = | |
| 0.2500 | 0.2500 | 0.2500 | 0.2500 |
| −0.2079 − 0.1389i | −0.2079 − 0.1389i | −0.2079 − 0.1389i | −0.1768 − 0.1768i |
| 0.0957 + 0.2310i | 0.0957 + 0.2310i | 0.0957 + 0.2310i | 0.0000 + 0.2500i |
| 0.0488 − 0.2452i | 0.0488 − 0.2452i | 0.0488 − 0.2452i | 0.1768 − 0.1768i |
| 0 + 0.2500i | 0 − 0.2500i | 0 + 0.2500i | 0 − 0.2500i |
| 0.1389 − 0.2079i | −0.1389 + 0.2079i | 0.1389 − 0.2079i | −0.1768 + 0.1768i |
| −0.2310 + 0.0957i | 0.2310 − 0.0957i | −0.2310 + 0.0957i | 0.2500 − 0.0000i |
| 0.2452 + 0.0488i | −0.2452 − 0.0488i | 0.2452 + 0.0488i | −0.1768 − 0.1768i |
| ans(:, :, 11, 4) = | | ans(:, :, 11, 12) = | |
| 0.2500 | 0.2500 | 0.2500 | 0.2500 |
| −0.1389 − 0.2079i | −0.1389 − 0.2079i | −0.1389 − 0.2079i | −0.0957 − 0.2310i |
| −0.0957 + 0.2310i | −0.0957 + 0.2310i | −0.0957 + 0.2310i | −0.1768 + 0.1768i |
| 0.2452 − 0.0488i | 0.2452 − 0.0488i | 0.2452 − 0.0488i | 0.2310 + 0.0957i |
| 0 + 0.2500i | 0 − 0.2500i | 0 + 0.2500i | 0 − 0.2500i |
| 0.2079 − 0.1389i | −0.2079 + 0.1389i | 0.2079 − 0.1389i | −0.2310 + 0.0957i |
| −0.2310 − 0.0957i | 0.2310 + 0.0957i | −0.2310 − 0.0957i | 0.1768 + 0.1768i |
| 0.0488 + 0.2452i | −0.0488 − 0.2452i | 0.0488 + 0.2452i | 0.0957 − 0.2310i |
| ans(:, :, 12, 4) = | | ans(:, :, 12, 12) = | |
| 0.2500 | 0.2500 | 0.2500 | 0.2500 |
| −0.0488 − 0.2452i | −0.0488 − 0.2452i | −0.0488 − 0.2452i | −0.0000 − 0.2500i |
| −0.2310 + 0.0957i | −0.2310 + 0.0957i | −0.2310 + 0.0957i | −0.2500 + 0.0000i |
| 0.1389 + 0.2079i | 0.1389 + 0.2079i | 0.1389 + 0.2079i | 0.0000 + 0.2500i |
| 0 + 0.2500i | 0 − 0.2500i | 0 + 0.2500i | 0 − 0.2500i |
| 0.2452 − 0.0488i | −0.2452 + 0.0488i | 0.2452 − 0.0488i | −0.2500 + 0.0000i |
| −0.0957 − 0.2310i | 0.0957 + 0.2310i | −0.0957 − 0.2310i | 0.0000 + 0.2500i |
| −0.2079 + 0.1389i | 0.2079 − 0.1389i | −0.2079 + 0.1389i | 0.2500 − 0.0000i |
| ans(:, :, 13, 4) = | | ans(:, :, 13, 12) = | |
| 0.2500 | 0.2500 | 0.2500 | 0.2500 |
| 0.0488 − 0.2452i | 0.0488 − 0.2452i | 0.0488 − 0.2452i | 0.0957 − 0.2310i |
| −0.2310 − 0.0957i | −0.2310 − 0.0957i | −0.2310 − 0.0957i | −0.1768 − 0.1768i |
| −0.1389 + 0.2079i | −0.1389 + 0.2079i | −0.1389 + 0.2079i | −0.2310 + 0.0957i |
| 0 + 0.2500i | 0 − 0.2500i | 0 + 0.2500i | 0 − 0.2500i |
| 0.2452 + 0.0488i | −0.2452 − 0.0488i | 0.2452 + 0.0488i | −0.2310 − 0.0957i |
| 0.0957 − 0.2310i | −0.0957 + 0.2310i | 0.0957 − 0.2310i | −0.1768 + 0.1768i |
| −0.2079 − 0.1389i | 0.2079 + 0.1389i | −0.2079 − 0.1389i | 0.0957 + 0.2310i |
| ans(:, :, 14, 4) = | | ans(:, :, 14, 12) = | |
| 0.2500 | 0.2500 | 0.2500 | 0.2500 |
| 0.1389 − 0.2079i | 0.1389 − 0.2079i | 0.1389 − 0.2079i | 0.1768 − 0.1768i |
| −0.0957 − 0.2310i | −0.0957 − 0.2310i | −0.0957 − 0.2310i | −0.0000 − 0.2500i |
| −0.2452 − 0.0488i | −0.2452 − 0.0488i | −0.2452 − 0.0488i | −0.1768 − 0.1768i |
| 0 + 0.2500i | 0 − 0.2500i | 0 + 0.2500i | 0 − 0.2500i |
| 0.2079 + 0.1389i | −0.2079 − 0.1389i | 0.2079 + 0.1389i | −0.1768 − 0.1768i |
| 0.2310 − 0.0957i | −0.2310 + 0.0957i | 0.2310 − 0.0957i | −0.2500 + 0.0000i |
| 0.0488 − 0.2452i | −0.0488 + 0.2452i | 0.0488 − 0.2452i | −0.1768 + 0.1768i |

TABLE 2-continued

| ans(:, :, 15, 4) = | | ans(:, :, 15, 12) = | |
|---|---|---|---|
| 0.2500 | 0.2500 | 0.2500 | 0.2500 |
| 0.2079 − 0.1389i | 0.2079 − 0.1389i | 0.2079 − 0.1389i | 0.2310 − 0.0957i |
| 0.0957 − 0.2310i | 0.0957 − 0.2310i | 0.0957 − 0.2310i | 0.1768 − 0.1768i |
| −0.0488 − 0.2452i | −0.0488 − 0.2452i | −0.0488 − 0.2452i | 0.0957 − 0.2310i |
| 0 + 0.2500i | 0 − 0.2500i | 0 + 0.2500i | 0 − 0.2500i |
| 0.1389 + 0.2079i | −0.1389 − 0.2079i | 0.1389 + 0.2079i | −0.0957 − 0.2310i |
| 0.2310 + 0.0957i | −0.2310 − 0.0957i | 0.2310 + 0.0957i | −0.1768 − 0.1768i |
| 0.2452 − 0.0488i | −0.2452 + 0.0488i | 0.2452 − 0.0488i | −0.2310 − 0.0957i |
| ans(:, :, 16, 4) = | | ans(:, :, 16, 12) = | |
| 0.2500 | 0.2500 | 0.2500 | 0.2500 |
| 0.2452 − 0.0488i | 0.2452 − 0.0488i | 0.2452 − 0.0488i | 0.2500 |
| 0.2310 − 0.0957i | 0.2310 − 0.0957i | 0.2310 − 0.0957i | 0.2500 |
| 0.2079 − 0.1389i | 0.2079 − 0.1389i | 0.2079 − 0.1389i | 0.2500 |
| 0 + 0.2500i | 0 − 0.2500i | 0 + 0.2500i | 0 − 0.2500i |
| 0.0488 + 0.2452i | −0.0488 − 0.2452i | 0.0488 + 0.2452i | 0 − 0.2500i |
| 0.0957 + 0.2310i | −0.0957 − 0.2310i | 0.0957 + 0.2310i | 0 − 0.2500i |
| 0.1389 + 0.2079i | −0.1389 − 0.2079i | 0.1389 + 0.2079i | 0 − 0.2500i |
| ans(:, :, 1, 5) = | | ans(:, :, 1, 13) = | |
| 0.2500 | 0.2500 | 0.2500 | 0.2500 |
| 0.2310 + 0.0957i | 0.2310 + 0.0957i | 0.2500 | 0.2079 + 0.1389i |
| 0.1768 + 0.1768i | 0.1768 + 0.1768i | 0.2500 | 0.0957 + 0.2310i |
| 0.0957 + 0.2310i | 0.0957 + 0.2310i | 0.2500 | −0.0488 + 0.2452i |
| 0.2500 | −0.2500 | 0.2500 | −0.2500 |
| 0.2310 + 0.0957i | −0.2310 − 0.0957i | 0.2500 | −0.2079 − 0.1389i |
| 0.1768 + 0.1768i | −0.1768 − 0.1768i | 0.2500 | −0.0957 − 0.2310i |
| 0.0957 + 0.2310i | −0.0957 − 0.2310i | 0.2500 | 0.0488 − 0.2452i |
| ans(:, :, 2, 5) = | | ans(:, :, 2, 13) = | |
| 0.2500 | 0.2500 | 0.2500 | 0.2500 |
| 0.1768 + 0.1768i | 0.1768 + 0.1768i | 0.2310 + 0.0957i | 0.1389 + 0.2079i |
| 0.0000 + 0.2500i | 0.0000 + 0.2500i | 0.1768 + 0.1768i | −0.0957 + 0.2310i |
| −0.1768 + 0.1768i | −0.1768 + 0.1768i | 0.0957 + 0.2310i | −0.2452 + 0.0488i |
| 0.2500 | −0.2500 | 0.2500 | −0.2500 |
| 0.1768 + 0.1768i | −0.1768 − 0.1768i | 0.2310 + 0.0957i | −0.1389 − 0.2079i |
| 0.0000 + 0.2500i | −0.0000 − 0.2500i | 0.1768 + 0.1768i | 0.0957 − 0.2310i |
| −0.1768 + 0.1768i | 0.1768 − 0.1768i | 0.0957 + 0.2310i | 0.2452 − 0.0488i |
| ans(:, :, 3, 5) = | | ans(:, :, 3, 13) = | |
| 0.2500 | 0.2500 | 0.2500 | 0.2500 |
| 0.0957 + 0.2310i | 0.0957 + 0.2310i | 0.1768 + 0.1768i | 0.0488 + 0.2452i |
| −0.1768 + 0.1768i | −0.1768 + 0.1768i | 0.0000 + 0.2500i | −0.2310 + 0.0957i |
| −0.2310 − 0.0957i | −0.2310 − 0.0957i | −0.1768 + 0.1768i | −0.1389 − 0.2079i |
| 0.2500 | −0.2500 | 0.2500 | −0.2500 |
| 0.0957 + 0.2310i | −0.0957 − 0.2310i | 0.1768 + 0.1768i | −0.0488 − 0.2452i |
| −0.1768 + 0.1768i | 0.1768 − 0.1768i | 0.0000 + 0.2500i | 0.2310 − 0.0957i |
| −0.2310 − 0.0957i | 0.2310 + 0.0957i | −0.1768 + 0.1768i | 0.1389 + 0.2079i |
| ans(:, :, 4, 5) = | | ans(:, :, 4, 13) = | |
| 0.2500 | 0.2500 | 0.2500 | 0.2500 |
| 0.0000 + 0.2500i | 0.0000 + 0.2500i | 0.0957 + 0.2310i | −0.0488 + 0.2452i |
| −0.2500 + 0.0000i | −0.2500 + 0.0000i | −0.1768 + 0.1768i | −0.2310 − 0.0957i |
| −0.0000 − 0.2500i | −0.0000 − 0.2500i | −0.2310 − 0.0957i | 0.1389 − 0.2079i |
| 0.2500 | −0.2500 | 0.2500 | −0.2500 |
| 0.0000 + 0.2500i | −0.0000 − 0.2500i | 0.0957 + 0.2310i | 0.0488 − 0.2452i |
| −0.2500 + 0.0000i | 0.2500 − 0.0000i | −0.1768 + 0.1768i | 0.2310 + 0.0957i |
| −0.0000 − 0.2500i | 0.0000 + 0.2500i | −0.2310 − 0.0957i | −0.1389 + 0.2079i |
| ans(:, :, 5, 5) = | | ans(:, :, 5, 13) = | |
| 0.2500 | 0.2500 | 0.2500 | 0.2500 |
| −0.0957 + 0.2310i | −0.0957 + 0.2310i | 0.0000 + 0.2500i | −0.1389 + 0.2079i |
| −0.1768 − 0.1768i | −0.1768 − 0.1768i | −0.2500 + 0.0000i | −0.0957 − 0.2310i |
| 0.2310 − 0.0957i | 0.2310 − 0.0957i | −0.0000 − 0.2500i | 0.2452 + 0.0488i |
| 0.2500 | −0.2500 | 0.2500 | −0.2500 |
| −0.0957 + 0.2310i | 0.0957 − 0.2310i | 0.0000 + 0.2500i | 0.1389 − 0.2079i |
| −0.1768 − 0.1768i | 0.1768 + 0.1768i | −0.2500 + 0.0000i | 0.0957 + 0.2310i |
| 0.2310 − 0.0957i | −0.2310 + 0.0957i | −0.0000 − 0.2500i | −0.2452 − 0.0488i |

TABLE 2-continued

| ans(:, :, 6, 5) = | | ans(:, :, 6, 13) = | |
|---|---|---|---|
| 0.2500 | 0.2500 | 0.2500 | 0.2500 |
| −0.1768 + 0.1768i | −0.1768 + 0.1768i | −0.0957 + 0.2310i | −0.2079 + 0.1389i |
| −0.0000 − 0.2500i | −0.0000 − 0.2500i | −0.1768 − 0.1768i | 0.0957 − 0.2310i |
| 0.1768 + 0.1768i | 0.1768 + 0.1768i | 0.2310 − 0.0957i | 0.0488 + 0.2452i |
| 0.2500 | −0.2500 | 0.2500 | −0.2500 |
| −0.1768 + 0.1768i | 0.1768 − 0.1768i | −0.0957 + 0.2310i | 0.2079 − 0.1389i |
| −0.0000 − 0.2500i | 0.0000 + 0.2500i | −0.1768 − 0.1768i | −0.0957 + 0.2310i |
| 0.1768 + 0.1768i | −0.1768 − 0.1768i | 0.2310 − 0.0957i | −0.0488 − 0.2452i |

| ans(:, :, 7, 5) = | | ans(:, :, 7, 13) = | |
|---|---|---|---|
| 0.2500 | 0.2500 | 0.2500 | 0.2500 |
| −0.2310 + 0.0957i | −0.2310 + 0.0957i | −0.1768 + 0.1768i | −0.2452 + 0.0488i |
| 0.1768 − 0.1768i | 0.1768 − 0.1768i | −0.0000 − 0.2500i | 0.2310 − 0.0957i |
| −0.0957 + 0.2310i | −0.0957 + 0.2310i | 0.1768 + 0.1768i | −0.2079 + 0.1389i |
| 0.2500 | −0.2500 | 0.2500 | −0.2500 |
| −0.2310 + 0.0957i | 0.2310 − 0.0957i | −0.1768 + 0.1768i | 0.2452 − 0.0488i |
| 0.1768 − 0.1768i | −0.1768 + 0.1768i | −0.0000 − 0.2500i | −0.2310 + 0.0957i |
| −0.0957 + 0.2310i | 0.0957 − 0.2310i | 0.1768 + 0.1768i | 0.2079 − 0.1389i |

| ans(:, :, 8, 5) = | | ans(:, :, 8, 13) = | |
|---|---|---|---|
| 0.2500 | 0.2500 | 0.2500 | 0.2500 |
| −0.2500 + 0.0000i | −0.2500 + 0.0000i | −0.2310 + 0.0957i | −0.2452 − 0.0488i |
| 0.2500 − 0.0000i | 0.2500 − 0.0000i | 0.1768 − 0.1768i | 0.2310 + 0.0957i |
| −0.2500 + 0.0000i | −0.2500 + 0.0000i | −0.0957 + 0.2310i | −0.2079 − 0.1389i |
| 0.2500 | −0.2500 | 0.2500 | −0.2500 |
| −0.2500 + 0.0000i | 0.2500 − 0.0000i | −0.2310 + 0.0957i | 0.2452 + 0.0488i |
| 0.2500 − 0.0000i | −0.2500 + 0.0000i | 0.1768 − 0.1768i | −0.2310 − 0.0957i |
| −0.2500 + 0.0000i | 0.2500 − 0.0000i | −0.0957 + 0.2310i | 0.2079 + 0.1389i |

| ans(:, :, 9, 5) = | | ans(:, :, 9, 13) = | |
|---|---|---|---|
| 0.2500 | 0.2500 | 0.2500 | 0.2500 |
| −0.2310 − 0.0957i | −0.2310 − 0.0957i | −0.2500 + 0.0000i | −0.2079 − 0.1389i |
| 0.1768 + 0.1768i | 0.1768 + 0.1768i | 0.2500 − 0.0000i | 0.0957 + 0.2310i |
| −0.0957 − 0.2310i | −0.0957 − 0.2310i | −0.2500 + 0.0000i | 0.0488 − 0.2452i |
| 0.2500 | −0.2500 | 0.2500 | −0.2500 |
| −0.2310 − 0.0957i | 0.2310 + 0.0957i | −0.2500 + 0.0000i | 0.2079 + 0.1389i |
| 0.1768 + 0.1768i | −0.1768 − 0.1768i | 0.2500 − 0.0000i | −0.0957 − 0.2310i |
| −0.0957 − 0.2310i | 0.0957 + 0.2310i | −0.2500 + 0.0000i | −0.0488 + 0.2452i |

| ans(:, :, 10, 5) = | | ans(:, :, 10, 13) = | |
|---|---|---|---|
| 0.2500 | 0.2500 | 0.2500 | 0.2500 |
| −0.1768 − 0.1768i | −0.1768 − 0.1768i | −0.2310 − 0.0957i | −0.1389 − 0.2079i |
| 0.0000 + 0.2500i | 0.0000 + 0.2500i | 0.1768 + 0.1768i | −0.0957 + 0.2310i |
| 0.1768 − 0.1768i | 0.1768 − 0.1768i | −0.0957 − 0.2310i | 0.2452 − 0.0488i |
| 0.2500 | −0.2500 | 0.2500 | −0.2500 |
| −0.1768 − 0.1768i | 0.1768 + 0.1768i | −0.2310 − 0.0957i | 0.1389 + 0.2079i |
| 0.0000 + 0.2500i | −0.0000 − 0.2500i | 0.1768 + 0.1768i | 0.0957 − 0.2310i |
| 0.1768 − 0.1768i | −0.1768 + 0.1768i | −0.0957 − 0.2310i | −0.2452 + 0.0488i |

| ans(:, :, 11, 5) = | | ans(:, :, 11, 13) = | |
|---|---|---|---|
| 0.2500 | 0.2500 | 0.2500 | 0.2500 |
| −0.0957 − 0.2310i | −0.0957 − 0.2310i | −0.1768 − 0.1768i | −0.0488 − 0.2452i |
| −0.1768 + 0.1768i | −0.1768 + 0.1768i | 0.0000 + 0.2500i | −0.2310 + 0.0957i |
| 0.2310 + 0.0957i | 0.2310 + 0.0957i | 0.1768 − 0.1768i | 0.1389 + 0.2079i |
| 0.2500 | −0.2500 | 0.2500 | −0.2500 |
| −0.0957 − 0.2310i | 0.0957 + 0.2310i | −0.1768 − 0.1768i | 0.0488 + 0.2452i |
| −0.1768 + 0.1768i | 0.1768 − 0.1768i | 0.0000 + 0.2500i | 0.2310 − 0.0957i |
| 0.2310 + 0.0957i | −0.2310 − 0.0957i | 0.1768 − 0.1768i | −0.1389 − 0.2079i |

| ans(:, :, 12, 5) = | | ans(:, :, 12, 13) = | |
|---|---|---|---|
| 0.2500 | 0.2500 | 0.2500 | 0.2500 |
| −0.0000 − 0.2500i | −0.0000 − 0.2500i | −0.0957 − 0.2310i | 0.0488 − 0.2452i |
| −0.2500 + 0.0000i | −0.2500 + 0.0000i | −0.1768 + 0.1768i | −0.2310 − 0.0957i |
| 0.0000 + 0.2500i | 0.0000 + 0.2500i | 0.2310 + 0.0957i | −0.1389 + 0.2079i |
| 0.2500 | −0.2500 | 0.2500 | −0.2500 |
| −0.0000 − 0.2500i | 0.0000 + 0.2500i | −0.0957 − 0.2310i | −0.0488 + 0.2452i |
| −0.2500 + 0.0000i | 0.2500 − 0.0000i | −0.1768 + 0.1768i | 0.2310 + 0.0957i |
| 0.0000 + 0.2500i | −0.0000 − 0.2500i | 0.2310 + 0.0957i | 0.1389 − 0.2079i |

TABLE 2-continued

| ans(:, :, 13, 5) = | | ans(:, :, 13, 13) = | |
|---|---|---|---|
| 0.2500 | 0.2500 | 0.2500 | 0.2500 |
| 0.0957 − 0.2310i | 0.0957 − 0.2310i | −0.0000 − 0.2500i | 0.1389 − 0.2079i |
| −0.1768 − 0.1768i | −0.1768 − 0.1768i | −0.2500 + 0.0000i | −0.0957 − 0.2310i |
| −0.2310 + 0.0957i | −0.2310 + 0.0957i | 0.0000 + 0.2500i | −0.2452 − 0.0488i |
| 0.2500 | −0.2500 | 0.2500 | −0.2500 |
| 0.0957 − 0.2310i | −0.0957 + 0.2310i | −0.0000 − 0.2500i | −0.1389 + 0.2079i |
| −0.1768 − 0.1768i | 0.1768 + 0.1768i | −0.2500 + 0.0000i | 0.0957 + 0.2310i |
| −0.2310 + 0.0957i | 0.2310 − 0.0957i | 0.0000 + 0.2500i | 0.2452 + 0.0488i |
| **ans(:, :, 14, 5) =** | | **ans(:, :, 14, 13) =** | |
| 0.2500 | 0.2500 | 0.2500 | 0.2500 |
| 0.1768 − 0.1768i | 0.1768 − 0.1768i | 0.0957 − 0.2310i | 0.2079 − 0.1389i |
| −0.0000 − 0.2500i | −0.0000 − 0.2500i | −0.1768 − 0.1768i | 0.0957 − 0.2310i |
| −0.1768 − 0.1768i | −0.1768 − 0.1768i | −0.2310 + 0.0957i | −0.0488 − 0.2452i |
| 0.2500 | −0.2500 | 0.2500 | −0.2500 |
| 0.1768 − 0.1768i | −0.1768 + 0.1768i | 0.0957 − 0.2310i | −0.2079 + 0.1389i |
| −0.0000 − 0.2500i | 0.0000 + 0.2500i | −0.1768 − 0.1768i | −0.0957 + 0.2310i |
| −0.1768 − 0.1768i | 0.1768 + 0.1768i | −0.2310 + 0.0957i | 0.0488 + 0.2452i |
| **ans(:, :, 15, 5) =** | | **ans(:, :, 15, 13) =** | |
| 0.2500 | 0.2500 | 0.2500 | 0.2500 |
| 0.2310 − 0.0957i | 0.2310 − 0.0957i | 0.1768 − 0.1768i | 0.2452 − 0.0488i |
| 0.1768 − 0.1768i | 0.1768 − 0.1768i | −0.0000 − 0.2500i | 0.2310 − 0.0957i |
| 0.0957 − 0.2310i | 0.0957 − 0.2310i | −0.1768 − 0.1768i | 0.2079 − 0.1389i |
| 0.2500 | −0.2500 | 0.2500 | −0.2500 |
| 0.2310 − 0.0957i | −0.2310 + 0.0957i | 0.1768 − 0.1768i | −0.2452 + 0.0488i |
| 0.1768 − 0.1768i | −0.1768 + 0.1768i | −0.0000 − 0.2500i | −0.2310 + 0.0957i |
| 0.0957 − 0.2310i | −0.0957 + 0.2310i | −0.1768 − 0.1768i | −0.2079 + 0.1389i |
| **ans(:, :, 16, 5) =** | | **ans(:, :, 16, 13) =** | |
| 0.2500 | 0.2500 | 0.2500 | 0.2500 |
| 0.2500 | 0.2500 | 0.2310 − 0.0957i | 0.2452 + 0.0488i |
| 0.2500 | 0.2500 | 0.1768 − 0.1768i | 0.2310 + 0.0957i |
| 0.2500 | 0.2500 | 0.0957 − 0.2310i | 0.2079 + 0.1389i |
| 0.2500 | −0.2500 | 0.2500 | −0.2500 |
| 0.2500 | −0.2500 | 0.2310 − 0.0957i | −0.2452 − 0.0488i |
| 0.2500 | −0.2500 | 0.1768 − 0.1768i | −0.2310 − 0.0957i |
| 0.2500 | −0.2500 | 0.0957 − 0.2310i | −0.2079 − 0.1389i |
| **ans(:, :, 1, 6) =** | | **ans(:, :, 1, 14) =** | |
| 0.2500 | 0.2500 | 0.2500 | 0.2500 |
| 0.2310 + 0.0957i | 0.2310 + 0.0957i | 0.2500 | 0.2079 + 0.1389i |
| 0.1768 + 0.1768i | 0.1768 + 0.1768i | 0.2500 | 0.0957 + 0.2310i |
| 0.0957 + 0.2310i | 0.0957 + 0.2310i | 0.2500 | −0.0488 + 0.2452i |
| 0 + 0.2500i | 0 − 0.2500i | 0 + 0.2500i | 0 − 0.2500i |
| −0.0957 + 0.2310i | 0.0957 − 0.2310i | 0 + 0.2500i | 0.1389 − 0.2079i |
| −0.1768 + 0.1768i | 0.1768 − 0.1768i | 0 + 0.2500i | 0.2310 − 0.0957i |
| −0.2310 + 0.0957i | 0.2310 − 0.0957i | 0 + 0.2500i | 0.2452 + 0.0488i |
| **ans(:, :, 2, 6) =** | | **ans(:, :, 2, 14) =** | |
| 0.2500 | 0.2500 | 0.2500 | 0.2500 |
| 0.1768 + 0.1768i | 0.1768 + 0.1768i | 0.2310 + 0.0957i | 0.1389 + 0.2079i |
| 0.0000 + 0.2500i | 0.0000 + 0.2500i | 0.1768 + 0.1768i | −0.0957 + 0.2310i |
| −0.1768 + 0.1768i | −0.1768 + 0.1768i | 0.0957 + 0.2310i | −0.2452 + 0.0488i |
| 0 + 0.2500i | 0 − 0.2500i | 0 + 0.2500i | 0 − 0.2500i |
| −0.1768 + 0.1768i | 0.1768 − 0.1768i | −0.0957 + 0.2310i | 0.2079 − 0.1389i |
| −0.2500 + 0.0000i | 0.2500 − 0.0000i | −0.1768 + 0.1768i | 0.2310 + 0.0957i |
| −0.1768 − 0.1768i | 0.1768 + 0.1768i | −0.2310 + 0.0957i | 0.0488 + 0.2452i |
| **ans(:, :, 3, 6) =** | | **ans(:, :, 3, 14) =** | |
| 0.2500 | 0.2500 | 0.2500 | 0.2500 |
| 0.0957 + 0.2310i | 0.0957 + 0.2310i | 0.1768 + 0.1768i | 0.0488 + 0.2452i |
| −0.1768 + 0.1768i | −0.1768 + 0.1768i | 0.0000 + 0.2500i | −0.2310 + 0.0957i |
| −0.2310 − 0.0957i | −0.2310 − 0.0957i | −0.1768 + 0.1768i | −0.1389 − 0.2079i |
| 0 + 0.2500i | 0 − 0.2500i | 0 + 0.2500i | 0 − 0.2500i |
| −0.2310 + 0.0957i | 0.2310 − 0.0957i | −0.1768 + 0.1768i | 0.2452 − 0.0488i |
| −0.1768 − 0.1768i | 0.1768 + 0.1768i | −0.2500 + 0.0000i | 0.0957 + 0.2310i |
| 0.0957 − 0.2310i | −0.0957 + 0.2310i | −0.1768 − 0.1768i | −0.2079 + 0.1389i |

TABLE 2-continued

| ans(:, :, 4, 6) = | | ans(:, :, 4, 14) = | |
|---|---|---|---|
| 0.2500 | 0.2500 | 0.2500 | 0.2500 |
| 0.0000 + 0.2500i | 0.0000 + 0.2500i | 0.0957 + 0.2310i | −0.0488 + 0.2452i |
| −0.2500 + 0.0000i | −0.2500 + 0.0000i | −0.1768 + 0.1768i | −0.2310 − 0.0957i |
| −0.0000 − 0.2500i | −0.0000 − 0.2500i | −0.2310 − 0.0957i | 0.1389 − 0.2079i |
| 0 + 0.2500i | 0 − 0.2500i | 0 + 0.2500i | 0 − 0.2500i |
| −0.2500 + 0.0000i | 0.2500 − 0.0000i | −0.2310 + 0.0957i | 0.2452 + 0.0488i |
| −0.0000 − 0.2500i | 0.0000 + 0.2500i | −0.1768 − 0.1768i | −0.0957 + 0.2310i |
| 0.2500 − 0.0000i | −0.2500 + 0.0000i | 0.0957 − 0.2310i | −0.2079 − 0.1389i |
| ans(:, :, 5, 6) = | | ans(:, :, 5, 14) = | |
| 0.2500 | 0.2500 | 0.2500 | 0.2500 |
| −0.0957 + 0.2310i | −0.0957 + 0.2310i | 0.0000 + 0.2500i | −0.1389 + 0.2079i |
| −0.1768 − 0.1768i | −0.1768 − 0.1768i | −0.2500 + 0.0000i | −0.0957 − 0.2310i |
| 0.2310 − 0.0957i | 0.2310 − 0.0957i | −0.0000 − 0.2500i | 0.2452 + 0.0488i |
| 0 + 0.2500i | 0 − 0.2500i | 0 + 0.2500i | 0 − 0.2500i |
| −0.2310 − 0.0957i | 0.2310 + 0.0957i | −0.2500 + 0.0000i | 0.2079 + 0.1389i |
| 0.1768 − 0.1768i | −0.1768 + 0.1768i | −0.0000 − 0.2500i | −0.2310 + 0.0957i |
| 0.0957 + 0.2310i | −0.0957 − 0.2310i | 0.2500 − 0.0000i | 0.0488 − 0.2452i |
| ans(:, :, 6, 6) = | | ans(:, :, 6, 14) = | |
| 0.2500 | 0.2500 | 0.2500 | 0.2500 |
| −0.1768 + 0.1768i | −0.1768 + 0.1768i | −0.0957 + 0.2310i | −0.2079 + 0.1389i |
| −0.0000 − 0.2500i | −0.0000 − 0.2500i | −0.1768 − 0.1768i | 0.0957 − 0.2310i |
| 0.1768 + 0.1768i | 0.1768 + 0.1768i | 0.2310 − 0.0957i | 0.0488 + 0.2452i |
| 0 + 0.2500i | 0 − 0.2500i | 0 + 0.2500i | 0 − 0.2500i |
| −0.1768 − 0.1768i | 0.1768 + 0.1768i | −0.2310 − 0.0957i | 0.1389 + 0.2079i |
| 0.2500 − 0.0000i | −0.2500 + 0.0000i | 0.1768 − 0.1768i | −0.2310 − 0.0957i |
| −0.1768 + 0.1768i | 0.1768 − 0.1768i | 0.0957 + 0.2310i | 0.2452 − 0.0488i |
| ans(:, :, 7, 6) = | | ans(:, :, 7, 14) = | |
| 0.2500 | 0.2500 | 0.2500 | 0.2500 |
| −0.2310 + 0.0957i | −0.2310 + 0.0957i | −0.1768 + 0.1768i | −0.2452 + 0.0488i |
| 0.1768 − 0.1768i | 0.1768 − 0.1768i | −0.0000 − 0.2500i | 0.2310 − 0.0957i |
| −0.0957 + 0.2310i | −0.0957 + 0.2310i | 0.1768 + 0.1768i | −0.2079 + 0.1389i |
| 0 + 0.2500i | 0 − 0.2500i | 0 + 0.2500i | 0 − 0.2500i |
| −0.0957 − 0.2310i | 0.0957 + 0.2310i | −0.1768 − 0.1768i | 0.0488 + 0.2452i |
| 0.1768 + 0.1768i | −0.1768 − 0.1768i | 0.2500 − 0.0000i | −0.0957 − 0.2310i |
| −0.2310 − 0.0957i | 0.2310 + 0.0957i | −0.1768 + 0.1768i | 0.1389 + 0.2079i |
| ans(:, :, 8, 6) = | | ans(:, :, 8, 14) = | |
| 0.2500 | 0.2500 | 0.2500 | 0.2500 |
| −0.2500 + 0.0000i | −0.2500 + 0.0000i | −0.2310 + 0.0957i | −0.2452 − 0.0488i |
| 0.2500 − 0.0000i | 0.2500 − 0.0000i | 0.1768 − 0.1768i | 0.2310 + 0.0957i |
| −0.2500 + 0.0000i | −0.2500 + 0.0000i | −0.0957 + 0.2310i | −0.2079 − 0.1389i |
| 0 + 0.2500i | 0 − 0.2500i | 0 + 0.2500i | 0 − 0.2500i |
| −0.0000 − 0.2500i | 0.0000 + 0.2500i | −0.0957 − 0.2310i | −0.0488 + 0.2452i |
| 0.0000 + 0.2500i | −0.0000 − 0.2500i | 0.1768 + 0.1768i | 0.0957 − 0.2310i |
| −0.0000 − 0.2500i | 0.0000 + 0.2500i | −0.2310 − 0.0957i | −0.1389 + 0.2079i |
| ans(:, :, 9, 6) = | | ans(:, :, 9, 14) = | |
| 0.2500 | 0.2500 | 0.2500 | 0.2500 |
| −0.2310 − 0.0957i | −0.2310 − 0.0957i | −0.2500 + 0.0000i | −0.2079 − 0.1389i |
| 0.1768 + 0.1768i | 0.1768 + 0.1768i | 0.2500 − 0.0000i | 0.0957 + 0.2310i |
| −0.0957 − 0.2310i | −0.0957 − 0.2310i | −0.2500 + 0.0000i | 0.0488 − 0.2452i |
| 0 + 0.2500i | 0 − 0.2500i | 0 + 0.2500i | 0 − 0.2500i |
| 0.0957 − 0.2310i | −0.0957 + 0.2310i | −0.0000 − 0.2500i | −0.1389 + 0.2079i |
| −0.1768 + 0.1768i | 0.1768 − 0.1768i | 0.0000 + 0.2500i | 0.2310 − 0.0957i |
| 0.2310 − 0.0957i | −0.2310 + 0.0957i | −0.0000 − 0.2500i | −0.2452 − 0.0488i |
| ans(:, :, 10, 6) = | | ans(:, :, 10, 14) = | |
| 0.2500 | 0.2500 | 0.2500 | 0.2500 |
| −0.1768 − 0.1768i | −0.1768 − 0.1768i | −0.2310 − 0.0957i | −0.1389 − 0.2079i |
| 0.0000 + 0.2500i | 0.0000 + 0.2500i | 0.1768 + 0.1768i | −0.0957 + 0.2310i |
| 0.1768 − 0.1768i | 0.1768 − 0.1768i | −0.0957 − 0.2310i | 0.2452 − 0.0488i |
| 0 + 0.2500i | 0 − 0.2500i | 0 + 0.2500i | 0 − 0.2500i |
| 0.1768 − 0.1768i | −0.1768 + 0.1768i | 0.0957 − 0.2310i | −0.2079 + 0.1389i |
| −0.2500 + 0.0000i | 0.2500 − 0.0000i | −0.1768 + 0.1768i | 0.2310 + 0.0957i |
| 0.1768 + 0.1768i | −0.1768 − 0.1768i | 0.2310 − 0.0957i | −0.0488 − 0.2452i |

TABLE 2-continued

| ans(:, :, 11, 6) = | | ans(:, :, 11, 14) = | |
|---|---|---|---|
| 0.2500 | 0.2500 | 0.2500 | 0.2500 |
| −0.0957 − 0.2310i | −0.0957 − 0.2310i | −0.1768 − 0.1768i | −0.0488 − 0.2452i |
| −0.1768 + 0.1768i | −0.1768 + 0.1768i | 0.0000 + 0.2500i | −0.2310 + 0.0957i |
| 0.2310 + 0.0957i | 0.2310 + 0.0957i | 0.1768 − 0.1768i | 0.1389 + 0.2079i |
| 0 + 0.2500i | 0 − 0.2500i | 0 + 0.2500i | 0 − 0.2500i |
| 0.2310 − 0.0957i | −0.2310 + 0.0957i | 0.1768 − 0.1768i | −0.2452 + 0.0488i |
| −0.1768 − 0.1768i | 0.1768 + 0.1768i | −0.2500 + 0.0000i | 0.0957 + 0.2310i |
| −0.0957 + 0.2310i | 0.0957 − 0.2310i | 0.1768 + 0.1768i | 0.2079 − 0.1389i |
| **ans(:, :, 12, 6) =** | | **ans(:, :, 12, 14) =** | |
| 0.2500 | 0.2500 | 0.2500 | 0.2500 |
| −0.0000 − 0.2500i | −0.0000 − 0.2500i | −0.0957 − 0.2310i | 0.0488 − 0.2452i |
| −0.2500 + 0.0000i | −0.2500 + 0.0000i | −0.1768 + 0.1768i | −0.2310 − 0.0957i |
| 0.0000 + 0.2500i | 0.0000 + 0.2500i | 0.2310 + 0.0957i | −0.1389 + 0.2079i |
| 0 + 0.2500i | 0 − 0.2500i | 0 + 0.2500i | 0 − 0.2500i |
| 0.2500 − 0.0000i | −0.2500 + 0.0000i | 0.2310 − 0.0957i | −0.2452 − 0.0488i |
| −0.0000 − 0.2500i | 0.0000 + 0.2500i | −0.1768 − 0.1768i | −0.0957 + 0.2310i |
| −0.2500 + 0.0000i | 0.2500 − 0.0000i | −0.0957 + 0.2310i | 0.2079 + 0.1389i |
| **ans(:, :, 13, 6) =** | | **ans(:, :, 13, 14) =** | |
| 0.2500 | 0.2500 | 0.2500 | 0.2500 |
| 0.0957 − 0.2310i | 0.0957 − 0.2310i | −0.0000 − 0.2500i | 0.1389 − 0.2079i |
| −0.1768 − 0.1768i | −0.1768 − 0.1768i | −0.2500 + 0.0000i | −0.0957 − 0.2310i |
| −0.2310 + 0.0957i | −0.2310 + 0.0957i | 0.0000 + 0.2500i | −0.2452 − 0.0488i |
| 0 + 0.2500i | 0 − 0.2500i | 0 + 0.2500i | 0 − 0.2500i |
| 0.2310 + 0.0957i | −0.2310 − 0.0957i | 0.2500 − 0.0000i | −0.2079 − 0.1389i |
| 0.1768 − 0.1768i | −0.1768 + 0.1768i | −0.0000 − 0.2500i | −0.2310 + 0.0957i |
| −0.0957 − 0.2310i | 0.0957 + 0.2310i | −0.2500 + 0.0000i | −0.0488 + 0.2452i |
| **ans(:, :, 14, 6) =** | | **ans(:, :, 14, 14) =** | |
| 0.2500 | 0.2500 | 0.2500 | 0.2500 |
| 0.1768 − 0.1768i | 0.1768 − 0.1768i | 0.0957 − 0.2310i | 0.2079 − 0.1389i |
| −0.0000 − 0.2500i | −0.0000 − 0.2500i | −0.1768 − 0.1768i | 0.0957 − 0.2310i |
| −0.1768 − 0.1768i | −0.1768 − 0.1768i | −0.2310 + 0.0957i | −0.0488 − 0.2452i |
| 0 + 0.2500i | 0 − 0.2500i | 0 + 0.2500i | 0 − 0.2500i |
| 0.1768 + 0.1768i | −0.1768 − 0.1768i | 0.2310 + 0.0957i | −0.1389 − 0.2079i |
| 0.2500 − 0.0000i | −0.2500 + 0.0000i | 0.1768 − 0.1768i | −0.2310 − 0.0957i |
| 0.1768 − 0.1768i | −0.1768 + 0.1768i | −0.0957 − 0.2310i | −0.2452 + 0.0488i |
| **ans(:, :, 15, 6) =** | | **ans(:, :, 15, 14) =** | |
| 0.2500 | 0.2500 | 0.2500 | 0.2500 |
| 0.2310 − 0.0957i | 0.2310 − 0.0957i | 0.1768 − 0.1768i | 0.2452 − 0.0488i |
| 0.1768 − 0.1768i | 0.1768 − 0.1768i | −0.0000 − 0.2500i | 0.2310 − 0.0957i |
| 0.0957 − 0.2310i | 0.0957 − 0.2310i | −0.1768 − 0.1768i | 0.2079 − 0.1389i |
| 0 + 0.2500i | 0 − 0.2500i | 0 + 0.2500i | 0 − 0.2500i |
| 0.0957 + 0.2310i | −0.0957 − 0.2310i | 0.1768 + 0.1768i | −0.0488 − 0.2452i |
| 0.1768 + 0.1768i | −0.1768 − 0.1768i | 0.2500 − 0.0000i | −0.0957 − 0.2310i |
| 0.2310 + 0.0957i | −0.2310 − 0.0957i | 0.1768 − 0.1768i | −0.1389 − 0.2079i |
| **ans(:, :, 16, 6) =** | | **ans(:, :, 16, 14) =** | |
| 0.2500 | 0.2500 | 0.2500 | 0.2500 |
| 0.2500 | 0.2500 | 0.2310 − 0.0957i | 0.2452 + 0.0488i |
| 0.2500 | 0.2500 | 0.1768 − 0.1768i | 0.2310 + 0.0957i |
| 0.2500 | 0.2500 | 0.0957 − 0.2310i | 0.2079 + 0.1389i |
| 0 + 0.2500i | 0 − 0.2500i | 0 + 0.2500i | 0 − 0.2500i |
| 0 + 0.2500i | 0 − 0.2500i | 0.0957 + 0.2310i | 0.0488 − 0.2452i |
| 0 + 0.2500i | 0 − 0.2500i | 0.1768 + 0.1768i | 0.0957 − 0.2310i |
| 0 + 0.2500i | 0 − 0.2500i | 0.2310 + 0.0957i | 0.1389 − 0.2079i |
| **ans(:, :, 1, 7) =** | | **ans(:, :, 1, 15) =** | |
| 0.2500 | 0.2500 | 0.2500 | 0.2500 |
| 0.2079 + 0.1389i | 0.2079 + 0.1389i | 0.2452 + 0.0488i | 0.2079 + 0.1389i |
| 0.0957 + 0.2310i | 0.0957 + 0.2310i | 0.2310 + 0.0957i | 0.0957 + 0.2310i |
| −0.0488 + 0.2452i | −0.0488 + 0.2452i | 0.2079 + 0.1389i | −0.0488 + 0.2452i |
| 0.2500 | −0.2500 | 0.2500 | −0.2500 |
| 0.2079 + 0.1389i | −0.2079 − 0.1389i | 0.2452 + 0.0488i | −0.2079 − 0.1389i |
| 0.0957 + 0.2310i | −0.0957 − 0.2310i | 0.2310 + 0.0957i | −0.0957 − 0.2310i |
| −0.0488 + 0.2452i | 0.0488 − 0.2452i | 0.2079 + 0.1389i | 0.0488 − 0.2452i |

TABLE 2-continued

| ans(:, :, 2, 7) = | | ans(:, :, 2, 15) = | |
|---|---|---|---|
| 0.2500 | 0.2500 | 0.2500 | 0.2500 |
| 0.1389 + 0.2079i | 0.1389 + 0.2079i | 0.2079 + 0.1389i | 0.1389 + 0.2079i |
| −0.0957 + 0.2310i | −0.0957 + 0.2310i | 0.0957 + 0.2310i | −0.0957 + 0.2310i |
| −0.2452 + 0.0488i | −0.2452 + 0.0488i | −0.0488 + 0.2452i | −0.2452 + 0.0488i |
| 0.2500 | −0.2500 | 0.2500 | −0.2500 |
| 0.1389 + 0.2079i | −0.1389 − 0.2079i | 0.2079 + 0.1389i | −0.1389 − 0.2079i |
| −0.0957 + 0.2310i | 0.0957 − 0.2310i | 0.0957 + 0.2310i | 0.0957 − 0.2310i |
| −0.2452 + 0.0488i | 0.2452 − 0.0488i | −0.0488 + 0.2452i | 0.2452 − 0.0488i |
| ans(:, :, 3, 7) = | | ans(:, :, 3, 15) = | |
| 0.2500 | 0.2500 | 0.2500 | 0.2500 |
| 0.0488 + 0.2452i | 0.0488 + 0.2452i | 0.1389 + 0.2079i | 0.0488 + 0.2452i |
| −0.2310 + 0.0957i | −0.2310 + 0.0957i | −0.0957 + 0.2310i | −0.2310 + 0.0957i |
| −0.1389 − 0.2079i | −0.1389 − 0.2079i | −0.2452 + 0.0488i | −0.1389 − 0.2079i |
| 0.2500 | −0.2500 | 0.2500 | −0.2500 |
| 0.0488 + 0.2452i | −0.0488 − 0.2452i | 0.1389 + 0.2079i | −0.0488 − 0.2452i |
| −0.2310 + 0.0957i | 0.2310 − 0.0957i | −0.0957 + 0.2310i | 0.2310 − 0.0957i |
| −0.1389 − 0.2079i | 0.1389 + 0.2079i | −0.2452 + 0.0488i | 0.1389 + 0.2079i |
| ans(:, :, 4, 7) = | | ans(:, :, 4, 15) = | |
| 0.2500 | 0.2500 | 0.2500 | 0.2500 |
| −0.0488 + 0.2452i | −0.0488 + 0.2452i | 0.0488 + 0.2452i | −0.0488 + 0.2452i |
| −0.2310 − 0.0957i | −0.2310 − 0.0957i | −0.2310 + 0.0957i | −0.2310 − 0.0957i |
| 0.1389 − 0.2079i | 0.1389 − 0.2079i | −0.1389 − 0.2079i | 0.1389 − 0.2079i |
| 0.2500 | −0.2500 | 0.2500 | −0.2500 |
| −0.0488 + 0.2452i | 0.0488 − 0.2452i | 0.0488 + 0.2452i | 0.0488 − 0.2452i |
| −0.2310 − 0.0957i | 0.2310 + 0.0957i | −0.2310 + 0.0957i | 0.2310 + 0.0957i |
| 0.1389 − 0.2079i | −0.1389 + 0.2079i | −0.1389 − 0.2079i | −0.1389 + 0.2079i |
| ans(:, :, 5, 7) = | | ans(:, :, 5, 15) = | |
| 0.2500 | 0.2500 | 0.2500 | 0.2500 |
| −0.1389 + 0.2079i | −0.1389 + 0.2079i | −0.0488 + 0.2452i | −0.1389 + 0.2079i |
| −0.0957 − 0.2310i | −0.0957 − 0.2310i | −0.2310 − 0.0957i | −0.0957 − 0.2310i |
| 0.2452 + 0.0488i | 0.2452 + 0.0488i | 0.1389 − 0.2079i | 0.2452 + 0.0488i |
| 0.2500 | −0.2500 | 0.2500 | −0.2500 |
| −0.1389 + 0.2079i | 0.1389 − 0.2079i | −0.0488 + 0.2452i | 0.1389 − 0.2079i |
| −0.0957 − 0.2310i | 0.0957 + 0.2310i | −0.2310 − 0.0957i | 0.0957 + 0.2310i |
| 0.2452 + 0.0488i | −0.2452 − 0.0488i | 0.1389 − 0.2079i | −0.2452 − 0.0488i |
| ans(:, :, 6, 7) = | | ans(:, :, 6, 15) = | |
| 0.2500 | 0.2500 | 0.2500 | 0.2500 |
| −0.2079 + 0.1389i | −0.2079 + 0.1389i | −0.1389 + 0.2079i | −0.2079 + 0.1389i |
| 0.0957 − 0.2310i | 0.0957 − 0.2310i | −0.0957 − 0.2310i | 0.0957 − 0.2310i |
| 0.0488 + 0.2452i | 0.0488 + 0.2452i | 0.2452 + 0.0488i | 0.0488 + 0.2452i |
| 0.2500 | −0.2500 | 0.2500 | −0.2500 |
| −0.2079 + 0.1389i | 0.2079 − 0.1389i | −0.1389 + 0.2079i | 0.2079 − 0.1389i |
| 0.0957 − 0.2310i | −0.0957 + 0.2310i | −0.0957 − 0.2310i | −0.0957 + 0.2310i |
| 0.0488 + 0.2452i | −0.0488 − 0.2452i | 0.2452 + 0.0488i | −0.0488 − 0.2452i |
| ans(:, :, 7, 7) = | | ans(:, :, 7, 15) = | |
| 0.2500 | 0.2500 | 0.2500 | 0.2500 |
| −0.2452 + 0.0488i | −0.2452 + 0.0488i | −0.2079 + 0.1389i | −0.2452 + 0.0488i |
| 0.2310 − 0.0957i | 0.2310 − 0.0957i | 0.0957 − 0.2310i | 0.2310 − 0.0957i |
| −0.2079 + 0.1389i | −0.2079 + 0.1389i | 0.0488 + 0.2452i | −0.2079 + 0.1389i |
| 0.2500 | −0.2500 | 0.2500 | −0.2500 |
| −0.2452 + 0.0488i | 0.2452 − 0.0488i | −0.2079 + 0.1389i | 0.2452 − 0.0488i |
| 0.2310 − 0.0957i | −0.2310 + 0.0957i | 0.0957 − 0.2310i | −0.2310 + 0.0957i |
| −0.2079 + 0.1389i | 0.2079 − 0.1389i | 0.0488 + 0.2452i | 0.2079 − 0.1389i |
| ans(:, :, 8, 7) = | | ans(:, :, 8, 15) = | |
| 0.2500 | 0.2500 | 0.2500 | 0.2500 |
| −0.2452 − 0.0488i | −0.2452 − 0.0488i | −0.2452 + 0.0488i | −0.2452 − 0.0488i |
| 0.2310 + 0.0957i | 0.2310 + 0.0957i | 0.2310 − 0.0957i | 0.2310 + 0.0957i |
| −0.2079 − 0.1389i | −0.2079 − 0.1389i | −0.2079 + 0.1389i | −0.2079 − 0.1389i |
| 0.2500 | −0.2500 | 0.2500 | −0.2500 |
| −0.2452 − 0.0488i | 0.2452 + 0.0488i | −0.2452 + 0.0488i | 0.2452 + 0.0488i |
| 0.2310 + 0.0957i | −0.2310 − 0.0957i | 0.2310 − 0.0957i | −0.2310 − 0.0957i |
| −0.2079 − 0.1389i | 0.2079 + 0.1389i | −0.2079 + 0.1389i | 0.2079 + 0.1389i |

TABLE 2-continued

| ans(:, :, 9, 7) = | | ans(:, :, 9, 15) = | |
|---|---|---|---|
| 0.2500 | 0.2500 | 0.2500 | 0.2500 |
| −0.2079 − 0.1389i | −0.2079 − 0.1389i | −0.2452 − 0.0488i | −0.2079 − 0.1389i |
| 0.0957 + 0.2310i | 0.0957 + 0.2310i | 0.2310 + 0.0957i | 0.0957 + 0.2310i |
| 0.0488 − 0.2452i | 0.0488 − 0.2452i | −0.2079 − 0.1389i | 0.0488 − 0.2452i |
| 0.2500 | −0.2500 | 0.2500 | −0.2500 |
| −0.2079 − 0.1389i | 0.2079 + 0.1389i | −0.2452 − 0.0488i | 0.2079 + 0.1389i |
| 0.0957 + 0.2310i | −0.0957 − 0.2310i | 0.2310 + 0.0957i | −0.0957 − 0.2310i |
| 0.0488 − 0.2452i | −0.0488 + 0.2452i | −0.2079 − 0.1389i | −0.0488 + 0.2452i |
| ans(:, :, 10, 7) = | | ans(:, :, 10, 15) = | |
| 0.2500 | 0.2500 | 0.2500 | 0.2500 |
| −0.1389 − 0.2079i | −0.1389 − 0.2079i | −0.2079 − 0.1389i | −0.1389 − 0.2079i |
| −0.0957 + 0.2310i | −0.0957 + 0.2310i | 0.0957 + 0.2310i | −0.0957 + 0.2310i |
| 0.2452 − 0.0488i | 0.2452 − 0.0488i | 0.0488 − 0.2452i | 0.2452 − 0.0488i |
| 0.2500 | −0.2500 | 0.2500 | −0.2500 |
| −0.1389 − 0.2079i | 0.1389 + 0.2079i | −0.2079 − 0.1389i | 0.1389 + 0.2079i |
| −0.0957 + 0.2310i | 0.0957 − 0.2310i | 0.0957 + 0.2310i | 0.0957 − 0.2310i |
| 0.2452 − 0.0488i | −0.2452 + 0.0488i | 0.0488 − 0.2452i | −0.2452 + 0.0488i |
| ans(:, :, 11, 7) = | | ans(:, :, 11, 15) = | |
| 0.2500 | 0.2500 | 0.2500 | 0.2500 |
| −0.0488 − 0.2452i | −0.0488 − 0.2452i | −0.1389 − 0.2079i | −0.0488 − 0.2452i |
| −0.2310 + 0.0957i | −0.2310 + 0.0957i | −0.0957 + 0.2310i | −0.2310 + 0.0957i |
| 0.1389 + 0.2079i | 0.1389 + 0.2079i | 0.2452 − 0.0488i | 0.1389 + 0.2079i |
| 0.2500 | −0.2500 | 0.2500 | −0.2500 |
| −0.0488 − 0.2452i | 0.0488 + 0.2452i | −0.1389 − 0.2079i | 0.0488 + 0.2452i |
| −0.2310 + 0.0957i | 0.2310 − 0.0957i | −0.0957 + 0.2310i | 0.2310 − 0.0957i |
| 0.1389 + 0.2079i | −0.1389 − 0.2079i | 0.2452 − 0.0488i | −0.1389 − 0.2079i |
| ans(:, :, 12, 7) = | | ans(:, :, 12, 15) = | |
| 0.2500 | 0.2500 | 0.2500 | 0.2500 |
| 0.0488 − 0.2452i | 0.0488 − 0.2452i | −0.0488 − 0.2452i | 0.0488 − 0.2452i |
| −0.2310 − 0.0957i | −0.2310 − 0.0957i | −0.2310 + 0.0957i | −0.2310 − 0.0957i |
| −0.1389 + 0.2079i | −0.1389 + 0.2079i | 0.1389 + 0.2079i | −0.1389 + 0.2079i |
| 0.2500 | −0.2500 | 0.2500 | −0.2500 |
| 0.0488 − 0.2452i | −0.0488 + 0.2452i | −0.0488 − 0.2452i | −0.0488 + 0.2452i |
| −0.2310 − 0.0957i | 0.2310 + 0.0957i | −0.2310 + 0.0957i | 0.2310 + 0.0957i |
| −0.1389 + 0.2079i | 0.1389 − 0.2079i | 0.1389 + 0.2079i | 0.1389 − 0.2079i |
| ans(:, :, 13, 7) = | | ans(:, :, 13, 15) = | |
| 0.2500 | 0.2500 | 0.2500 | 0.2500 |
| 0.1389 − 0.2079i | 0.1389 − 0.2079i | 0.0488 − 0.2452i | 0.1389 − 0.2079i |
| −0.0957 − 0.2310i | −0.0957 − 0.2310i | −0.2310 − 0.0957i | −0.0957 − 0.2310i |
| −0.2452 − 0.0488i | −0.2452 − 0.0488i | −0.1389 + 0.2079i | −0.2452 − 0.0488i |
| 0.2500 | −0.2500 | 0.2500 | −0.2500 |
| 0.1389 − 0.2079i | −0.1389 + 0.2079i | 0.0488 − 0.2452i | −0.1389 + 0.2079i |
| −0.0957 − 0.2310i | 0.0957 + 0.2310i | −0.2310 − 0.0957i | 0.0957 + 0.2310i |
| −0.2452 − 0.0488i | 0.2452 + 0.0488i | −0.1389 + 0.2079i | 0.2452 + 0.0488i |
| ans(:, :, 14, 7) = | | ans(:, :, 14, 15) = | |
| 0.2500 | 0.2500 | 0.2500 | 0.2500 |
| 0.2079 − 0.1389i | 0.2079 − 0.1389i | 0.1389 − 0.2079i | 0.2079 − 0.1389i |
| 0.0957 − 0.2310i | 0.0957 − 0.2310i | −0.0957 − 0.2310i | 0.0957 − 0.2310i |
| −0.0488 − 0.2452i | −0.0488 − 0.2452i | −0.2452 − 0.0488i | −0.0488 − 0.2452i |
| 0.2500 | −0.2500 | 0.2500 | −0.2500 |
| 0.2079 − 0.1389i | −0.2079 + 0.1389i | 0.1389 − 0.2079i | −0.2079 + 0.1389i |
| 0.0957 − 0.2310i | −0.0957 + 0.2310i | −0.0957 − 0.2310i | −0.0957 + 0.2310i |
| −0.0488 − 0.2452i | 0.0488 + 0.2452i | −0.2452 − 0.0488i | 0.0488 + 0.2452i |
| ans(:, :, 15, 7) = | | ans(:, :, 15, 15) = | |
| 0.2500 | 0.2500 | 0.2500 | 0.2500 |
| 0.2452 − 0.0488i | 0.2452 − 0.0488i | 0.2079 − 0.1389i | 0.2452 − 0.0488i |
| 0.2310 − 0.0957i | 0.2310 − 0.0957i | 0.0957 − 0.2310i | 0.2310 − 0.0957i |
| 0.2079 − 0.1389i | 0.2079 − 0.1389i | −0.0488 − 0.2452i | 0.2079 − 0.1389i |
| 0.2500 | −0.2500 | 0.2500 | −0.2500 |
| 0.2452 − 0.0488i | −0.2452 + 0.0488i | 0.2079 − 0.1389i | −0.2452 + 0.0488i |
| 0.2310 − 0.0957i | −0.2310 + 0.0957i | 0.0957 − 0.2310i | −0.2310 + 0.0957i |
| 0.2079 − 0.1389i | −0.2079 + 0.1389i | −0.0488 − 0.2452i | −0.2079 + 0.1389i |

TABLE 2-continued

| ans(:, :, 16, 7) = | | ans(:, :, 16, 15) = | |
|---|---|---|---|
| 0.2500 | 0.2500 | 0.2500 | 0.2500 |
| 0.2452 + 0.0488i | 0.2452 + 0.0488i | 0.2452 − 0.0488i | 0.2452 + 0.0488i |
| 0.2310 + 0.0957i | 0.2310 + 0.0957i | 0.2310 − 0.0957i | 0.2310 + 0.0957i |
| 0.2079 + 0.1389i | 0.2079 + 0.1389i | 0.2079 − 0.1389i | 0.2079 + 0.1389i |
| 0.2500 | −0.2500 | 0.2500 | −0.2500 |
| 0.2452 + 0.0488i | −0.2452 − 0.0488i | 0.2452 − 0.0488i | −0.2452 − 0.0488i |
| 0.2310 + 0.0957i | −0.2310 − 0.0957i | 0.2310 − 0.0957i | −0.2310 − 0.0957i |
| 0.2079 + 0.1389i | −0.2079 − 0.1389i | 0.2079 − 0.1389i | −0.2079 − 0.1389i |

| ans(:, :, 1, 8) = | | ans(:, :, 1, 16) = | |
|---|---|---|---|
| 0.2500 | 0.2500 | 0.2500 | 0.2500 |
| 0.2079 + 0.1389i | 0.2079 + 0.1389i | 0.2452 + 0.0488i | 0.2079 + 0.1389i |
| 0.0957 + 0.2310i | 0.0957 + 0.2310i | 0.2310 + 0.0957i | 0.0957 + 0.2310i |
| −0.0488 + 0.2452i | −0.0488 + 0.2452i | 0.2079 + 0.1389i | −0.0488 + 0.2452i |
| 0 + 0.2500i | 0 − 0.2500i | 0 + 0.2500i | 0 − 0.2500i |
| −0.1389 + 0.2079i | 0.1389 − 0.2079i | −0.0488 + 0.2452i | 0.1389 − 0.2079i |
| −0.2310 + 0.0957i | 0.2310 − 0.0957i | −0.0957 + 0.2310i | 0.2310 − 0.0957i |
| −0.2452 − 0.0488i | 0.2452 + 0.0488i | −0.1389 + 0.2079i | 0.2452 + 0.0488i |

| ans(:, :, 2, 8) = | | ans(:, :, 2, 16) = | |
|---|---|---|---|
| 0.2500 | 0.2500 | 0.2500 | 0.2500 |
| 0.1389 + 0.2079i | 0.1389 + 0.2079i | 0.2079 + 0.1389i | 0.1389 + 0.2079i |
| −0.0957 + 0.2310i | −0.0957 + 0.2310i | 0.0957 + 0.2310i | −0.0957 + 0.2310i |
| −0.2452 + 0.0488i | −0.2452 + 0.0488i | −0.0488 + 0.2452i | −0.2452 + 0.0488i |
| 0 + 0.2500i | 0 − 0.2500i | 0 + 0.2500i | 0 − 0.2500i |
| −0.2079 + 0.1389i | 0.2079 − 0.1389i | −0.1389 + 0.2079i | 0.2079 − 0.1389i |
| −0.2310 − 0.0957i | 0.2310 + 0.0957i | −0.2310 + 0.0957i | 0.2310 + 0.0957i |
| −0.0488 − 0.2452i | 0.0488 + 0.2452i | −0.2452 − 0.0488i | 0.0488 + 0.2452i |

| ans(:, :, 3, 8) = | | ans(:, :, 3, 16) = | |
|---|---|---|---|
| 0.2500 | 0.2500 | 0.2500 | 0.2500 |
| 0.0488 + 0.2452i | 0.0488 + 0.2452i | 0.1389 + 0.2079i | 0.0488 + 0.2452i |
| −0.2310 + 0.0957i | −0.2310 + 0.0957i | −0.0957 + 0.2310i | −0.2310 + 0.0957i |
| −0.1389 − 0.2079i | −0.1389 − 0.2079i | −0.2452 + 0.0488i | −0.1389 − 0.2079i |
| 0 + 0.2500i | 0 − 0.2500i | 0 + 0.2500i | 0 − 0.2500i |
| −0.2452 + 0.0488i | 0.2452 − 0.0488i | −0.2079 + 0.1389i | 0.2452 − 0.0488i |
| −0.0957 − 0.2310i | 0.0957 + 0.2310i | −0.2310 − 0.0957i | 0.0957 + 0.2310i |
| 0.2079 − 0.1389i | −0.2079 + 0.1389i | −0.0488 − 0.2452i | −0.2079 + 0.1389i |

| ans(:, :, 4, 8) = | | ans(:, :, 4, 16) = | |
|---|---|---|---|
| 0.2500 | 0.2500 | 0.2500 | 0.2500 |
| −0.0488 + 0.2452i | −0.0488 + 0.2452i | 0.0488 + 0.2452i | −0.0488 + 0.2452i |
| −0.2310 − 0.0957i | −0.2310 − 0.0957i | −0.2310 + 0.0957i | −0.2310 − 0.0957i |
| 0.1389 − 0.2079i | 0.1389 − 0.2079i | −0.1389 − 0.2079i | 0.1389 − 0.2079i |
| 0 + 0.2500i | 0 − 0.2500i | 0 + 0.2500i | 0 − 0.2500i |
| −0.2452 − 0.0488i | 0.2452 + 0.0488i | −0.2452 + 0.0488i | 0.2452 + 0.0488i |
| 0.0957 − 0.2310i | −0.0957 + 0.2310i | −0.0957 − 0.2310i | −0.0957 + 0.2310i |
| 0.2079 + 0.1389i | −0.2079 − 0.1389i | 0.2079 − 0.1389i | −0.2079 − 0.1389i |

| ans(:, :, 5, 8) = | | ans(:, :, 5, 16) = | |
|---|---|---|---|
| 0.2500 | 0.2500 | 0.2500 | 0.2500 |
| −0.1389 + 0.2079i | −0.1389 + 0.2079i | −0.0488 + 0.2452i | −0.1389 + 0.2079i |
| −0.0957 − 0.2310i | −0.0957 − 0.2310i | −0.2310 − 0.0957i | −0.0957 − 0.2310i |
| 0.2452 + 0.0488i | 0.2452 + 0.0488i | 0.1389 − 0.2079i | 0.2452 + 0.0488i |
| 0 + 0.2500i | 0 − 0.2500i | 0 + 0.2500i | 0 − 0.2500i |
| −0.2079 − 0.1389i | 0.2079 + 0.1389i | −0.2452 − 0.0488i | 0.2079 + 0.1389i |
| 0.2310 − 0.0957i | −0.2310 + 0.0957i | 0.0957 − 0.2310i | −0.2310 + 0.0957i |
| −0.0488 + 0.2452i | 0.0488 − 0.2452i | 0.2079 + 0.1389i | 0.0488 − 0.2452i |

| ans(:, :, 6, 8) = | | ans(:, :, 6, 16) = | |
|---|---|---|---|
| 0.2500 | 0.2500 | 0.2500 | 0.2500 |
| −0.2079 + 0.1389i | −0.2079 + 0.1389i | −0.1389 + 0.2079i | −0.2079 + 0.1389i |
| 0.0957 − 0.2310i | 0.0957 − 0.2310i | −0.0957 − 0.2310i | 0.0957 − 0.2310i |
| 0.0488 + 0.2452i | 0.0488 + 0.2452i | 0.2452 + 0.0488i | 0.0488 + 0.2452i |
| 0 + 0.2500i | 0 − 0.2500i | 0 + 0.2500i | 0 − 0.2500i |
| −0.1389 − 0.2079i | 0.1389 + 0.2079i | −0.2079 − 0.1389i | 0.1389 + 0.2079i |
| 0.2310 + 0.0957i | −0.2310 − 0.0957i | 0.2310 − 0.0957i | −0.2310 − 0.0957i |
| −0.2452 + 0.0488i | 0.2452 − 0.0488i | −0.0488 + 0.2452i | 0.2452 − 0.0488i |

TABLE 2-continued

| ans(:, :, 7, 8) = | | ans(:, :, 7, 16) = | |
|---|---|---|---|
| 0.2500 | 0.2500 | 0.2500 | 0.2500 |
| −0.2452 + 0.0488i | −0.2452 + 0.0488i | −0.2079 + 0.1389i | −0.2452 + 0.0488i |
| 0.2310 − 0.0957i | 0.2310 − 0.0957i | 0.0957 − 0.2310i | 0.2310 − 0.0957i |
| −0.2079 + 0.1389i | −0.2079 + 0.1389i | 0.0488 + 0.2452i | −0.2079 + 0.1389i |
| 0 + 0.2500i | 0 − 0.2500i | 0 + 0.2500i | 0 − 0.2500i |
| −0.0488 − 0.2452i | 0.0488 + 0.2452i | −0.1389 − 0.2079i | 0.0488 + 0.2452i |
| 0.0957 + 0.2310i | −0.0957 − 0.2310i | 0.2310 + 0.0957i | −0.0957 − 0.2310i |
| −0.1389 − 0.2079i | 0.1389 + 0.2079i | −0.2452 + 0.0488i | 0.1389 + 0.2079i |
| **ans(:, :, 8, 8) =** | | **ans(:, :, 8, 16) =** | |
| 0.2500 | 0.2500 | 0.2500 | 0.2500 |
| −0.2452 − 0.0488i | −0.2452 − 0.0488i | −0.2452 + 0.0488i | −0.2452 − 0.0488i |
| 0.2310 + 0.0957i | 0.2310 + 0.0957i | 0.2310 − 0.0957i | 0.2310 + 0.0957i |
| −0.2079 − 0.1389i | −0.2079 − 0.1389i | −0.2079 + 0.1389i | −0.2079 − 0.1389i |
| 0 + 0.2500i | 0 − 0.2500i | 0 + 0.2500i | 0 − 0.2500i |
| 0.0488 − 0.2452i | −0.0488 + 0.2452i | −0.0488 − 0.2452i | −0.0488 + 0.2452i |
| −0.0957 + 0.2310i | 0.0957 − 0.2310i | 0.0957 + 0.2310i | 0.0957 − 0.2310i |
| 0.1389 − 0.2079i | −0.1389 + 0.2079i | −0.1389 − 0.2079i | −0.1389 + 0.2079i |
| **ans(:, :, 9, 8) =** | | **ans(:, :, 9, 16) =** | |
| 0.2500 | 0.2500 | 0.2500 | 0.2500 |
| −0.2079 − 0.1389i | −0.2079 − 0.1389i | −0.2452 − 0.0488i | −0.2079 − 0.1389i |
| 0.0957 + 0.2310i | 0.0957 + 0.2310i | 0.2310 + 0.0957i | 0.0957 + 0.2310i |
| 0.0488 − 0.2452i | 0.0488 − 0.2452i | −0.2079 − 0.1389i | 0.0488 − 0.2452i |
| 0 + 0.2500i | 0 − 0.2500i | 0 + 0.2500i | 0 − 0.2500i |
| 0.1389 − 0.2079i | −0.1389 + 0.2079i | 0.0488 − 0.2452i | −0.1389 + 0.2079i |
| −0.2310 + 0.0957i | 0.2310 − 0.0957i | −0.0957 + 0.2310i | 0.2310 − 0.0957i |
| 0.2452 + 0.0488i | −0.2452 − 0.0488i | 0.1389 − 0.2079i | −0.2452 − 0.0488i |
| **ans(:, :, 10, 8) =** | | **ans(:, :, 10, 16) =** | |
| 0.2500 | 0.2500 | 0.2500 | 0.2500 |
| −0.1389 − 0.2079i | −0.1389 − 0.2079i | −0.2079 − 0.1389i | −0.1389 − 0.2079i |
| −0.0957 + 0.2310i | −0.0957 + 0.2310i | 0.0957 + 0.2310i | −0.0957 + 0.2310i |
| 0.2452 − 0.0488i | 0.2452 − 0.0488i | 0.0488 − 0.2452i | 0.2452 − 0.0488i |
| 0 + 0.2500i | 0 − 0.2500i | 0 + 0.2500i | 0 − 0.2500i |
| 0.2079 − 0.1389i | −0.2079 + 0.1389i | 0.1389 − 0.2079i | −0.2079 + 0.1389i |
| −0.2310 − 0.0957i | 0.2310 + 0.0957i | −0.2310 + 0.0957i | 0.2310 + 0.0957i |
| 0.0488 + 0.2452i | −0.0488 − 0.2452i | 0.2452 + 0.0488i | −0.0488 − 0.2452i |
| **ans(:, :, 11, 8) =** | | **ans(:, :, 11, 16) =** | |
| 0.2500 | 0.2500 | 0.2500 | 0.2500 |
| −0.0488 − 0.2452i | −0.0488 − 0.2452i | −0.1389 − 0.2079i | −0.0488 − 0.2452i |
| −0.2310 + 0.0957i | −0.2310 + 0.0957i | −0.0957 + 0.2310i | −0.2310 + 0.0957i |
| 0.1389 + 0.2079i | 0.1389 + 0.2079i | 0.2452 − 0.0488i | 0.1389 + 0.2079i |
| 0 + 0.2500i | 0 − 0.2500i | 0 + 0.2500i | 0 − 0.2500i |
| 0.2452 − 0.0488i | −0.2452 + 0.0488i | 0.2079 − 0.1389i | −0.2452 + 0.0488i |
| −0.0957 − 0.2310i | 0.0957 + 0.2310i | −0.2310 − 0.0957i | 0.0957 + 0.2310i |
| −0.2079 + 0.1389i | 0.2079 − 0.1389i | 0.0488 + 0.2452i | 0.2079 − 0.1389i |
| **ans(:, :, 12, 8) =** | | **ans(:, :, 12, 16) =** | |
| 0.2500 | 0.2500 | 0.2500 | 0.2500 |
| 0.0488 − 0.2452i | 0.0488 − 0.2452i | −0.0488 − 0.2452i | 0.0488 − 0.2452i |
| −0.2310 − 0.0957i | −0.2310 − 0.0957i | −0.2310 + 0.0957i | −0.2310 − 0.0957i |
| −0.1389 + 0.2079i | −0.1389 + 0.2079i | 0.1389 + 0.2079i | −0.1389 + 0.2079i |
| 0 + 0.2500i | 0 − 0.2500i | 0 + 0.2500i | 0 − 0.2500i |
| 0.2452 + 0.0488i | −0.2452 − 0.0488i | 0.2452 − 0.0488i | −0.2452 − 0.0488i |
| 0.0957 − 0.2310i | −0.0957 + 0.2310i | −0.0957 − 0.2310i | −0.0957 + 0.2310i |
| −0.2079 − 0.1389i | 0.2079 + 0.1389i | −0.2079 + 0.1389i | 0.2079 + 0.1389i |
| **ans(:, :, 13, 8) =** | | **ans(:, :, 13, 16) =** | |
| 0.2500 | 0.2500 | 0.2500 | 0.2500 |
| 0.1389 − 0.2079i | 0.1389 − 0.2079i | 0.0488 − 0.2452i | 0.1389 − 0.2079i |
| −0.0957 − 0.2310i | −0.0957 − 0.2310i | −0.2310 − 0.0957i | −0.0957 − 0.2310i |
| −0.2452 − 0.0488i | −0.2452 − 0.0488i | −0.1389 + 0.2079i | −0.2452 − 0.0488i |
| 0 + 0.2500i | 0 − 0.2500i | 0 + 0.2500i | 0 − 0.2500i |
| 0.2079 + 0.1389i | −0.2079 − 0.1389i | 0.2452 + 0.0488i | −0.2079 − 0.1389i |
| 0.2310 − 0.0957i | −0.2310 + 0.0957i | 0.0957 − 0.2310i | −0.2310 + 0.0957i |
| 0.0488 − 0.2452i | −0.0488 + 0.2452i | −0.2079 − 0.1389i | −0.0488 + 0.2452i |

TABLE 2-continued

| ans(:, :, 14, 8) = | | ans(:, :, 14, 16) = | |
|---|---|---|---|
| 0.2500 | 0.2500 | 0.2500 | 0.2500 |
| 0.2079 − 0.1389i | 0.2079 − 0.1389i | 0.1389 − 0.2079i | 0.2079 − 0.1389i |
| 0.0957 − 0.2310i | 0.0957 − 0.2310i | −0.0957 − 0.2310i | 0.0957 − 0.2310i |
| −0.0488 − 0.2452i | −0.0488 − 0.2452i | −0.2452 − 0.0488i | −0.0488 − 0.2452i |
| 0 + 0.2500i | 0 − 0.2500i | 0 + 0.2500i | 0 − 0.2500i |
| 0.1389 + 0.2079i | −0.1389 − 0.2079i | 0.2079 + 0.1389i | −0.1389 − 0.2079i |
| 0.2310 + 0.0957i | −0.2310 − 0.0957i | 0.2310 − 0.0957i | −0.2310 − 0.0957i |
| 0.2452 − 0.0488i | −0.2452 + 0.0488i | 0.0488 − 0.2452i | −0.2452 + 0.0488i |
| **ans(:, :, 15, 8) =** | | **ans(:, :, 15, 16) =** | |
| 0.2500 | 0.2500 | 0.2500 | 0.2500 |
| 0.2452 − 0.0488i | 0.2452 − 0.0488i | 0.2079 − 0.1389i | 0.2452 − 0.0488i |
| 0.2310 − 0.0957i | 0.2310 − 0.0957i | 0.0957 − 0.2310i | 0.2310 − 0.0957i |
| 0.2079 − 0.1389i | 0.2079 − 0.1389i | −0.0488 − 0.2452i | 0.2079 − 0.1389i |
| 0 + 0.2500i | 0 − 0.2500i | 0 + 0.2500i | 0 − 0.2500i |
| 0.0488 + 0.2452i | −0.0488 − 0.2452i | 0.1389 + 0.2079i | −0.0488 − 0.2452i |
| 0.0957 + 0.2310i | −0.0957 − 0.2310i | 0.2310 + 0.0957i | −0.0957 − 0.2310i |
| 0.1389 + 0.2079i | −0.1389 − 0.2079i | 0.2452 − 0.0488i | −0.1389 − 0.2079i |
| **ans(:, :, 16, 8) =** | | **ans(:, :, 16, 16) =** | |
| 0.2500 | 0.2500 | 0.2500 | 0.2500 |
| 0.2452 + 0.0488i | 0.2452 + 0.0488i | 0.2452 − 0.0488i | 0.2452 + 0.0488i |
| 0.2310 + 0.0957i | 0.2310 + 0.0957i | 0.2310 − 0.0957i | 0.2310 + 0.0957i |
| 0.2079 + 0.1389i | 0.2079 + 0.1389i | 0.2079 − 0.1389i | 0.2079 + 0.1389i |
| 0 + 0.2500i | 0 − 0.2500i | 0 + 0.2500i | 0 − 0.2500i |
| −0.0488 + 0.2452i | 0.0488 − 0.2452i | 0.0488 + 0.2452i | 0.0488 − 0.2452i |
| −0.0957 + 0.2310i | 0.0957 − 0.2310i | 0.0957 + 0.2310i | 0.0957 − 0.2310i |
| −0.1389 + 0.2079i | 0.1389 − 0.2079i | 0.1389 + 0.2079i | 0.1389 − 0.2079i. |

11. The communication method of claim 10, wherein the determining comprises determining the precoding matrix by extracting the first codeword from the first codebook and extracting the second codeword from the second codebook.

12. The communication method of claim 10, wherein the precoding matrix candidates are stored in the transmitter.

13. The communication method of claim 12, wherein the determining comprises determining the precoding matrix with a candidate corresponding to the first precoding matrix indicator and the second precoding matrix indicator among the stored precoding matrix candidates.

14. A communication method of a transmitter, the communication method comprising:

receiving, from a receiver, a first precoding matrix indicator corresponding to a first codeword included in a first codebook and a second precoding matrix indicator corresponding to a second codeword included in a second codeword; and determining a precoding matrix based on the first precoding matrix indicator and the second precoding matrix indicator, wherein the precoding matrix corresponds to one of precoding matrix candidates disclosed in Table 3, wherein in Table 3, ans(;,;m,n) indicates an inter product between ans(;,;m) in the first codebook and (;,;,n) in the second codebook, ans(;,;,m) corresponds to an $m^{th}$ codeword in the first codebook, ans(;,;,n) corresponds to an $n^{th}$ codeword in the second codebook, and i denotes an imaginary unit:

TABLE 3

| ans(:, :, 1) = | | | | |
|---|---|---|---|---|
| 0.1581 | 0.1581 | 0.1581 | 0.1581 | 0.1581 |
| 0.1581 | 0.1581 | 0 + 0.1581i | 0 + 0.1581i | −0.1581 |
| 0.1581 | 0.1581 | −0.1581 | −0.1581 | 0.1581 |
| 0.1581 | 0.1581 | 0 − 0.1581i | 0 − 0.1581i | −0.1581 |
| 0.1581 | −0.1581 | 0.1581 | −0.1581 | 0.1581 |
| 0.1581 | −0.1581 | 0 + 0.1581i | 0 − 0.1581i | −0.1581 |
| 0.1581 | −0.1581 | −0.1581 | 0.1581 | 0.1581 |
| 0.1581 | −0.1581 | 0 − 0.1581i | 0 + 0.1581i | −0.1581 |
| **ans(:, :, 2) =** | | | | |
| 0.1581 | 0.1581 | 0.1581 | 0.1581 | 0.1581 |
| 0.1118 + 0.1118i | 0.1118 + 0.1118i | −0.1118 + 0.1118i | −0.1118 + 0.1118i | −0.1118 − 0.1118i |
| 0.0000 + 0.1581i | 0.0000 + 0.1581i | −0.0000 − 0.1581i | −0.0000 − 0.1581i | 0.0000 + 0.1581i |
| −0.1118 + 0.1118i | −0.1118 + 0.1118i | 0.1118 + 0.1118i | 0.1118 + 0.1118i | 0.1118 − 0.1118i |
| 0.1581 | −0.1581 | 0.1581 | −0.1581 | 0.1581 |
| 0.1118 + 0.1118i | −0.1118 − 0.1118i | −0.1118 + 0.1118i | 0.1118 − 0.1118i | −0.1118 − 0.1118i |
| 0.0000 + 0.1581i | −0.0000 − 0.1581i | −0.0000 − 0.1581i | 0.0000 + 0.1581i | 0.0000 + 0.1581i |
| −0.1118 + 0.1118i | 0.1118 − 0.1118i | 0.1118 + 0.1118i | −0.1118 − 0.1118i | 0.1118 − 0.1118i |

TABLE 3-continued

| | | | | |
|---|---|---|---|---|
| ans(:, :, 3) = | | | | |
| 0.1581 | 0.1581 | 0.1581 | 0.1581 | 0.1581 |
| 0.1461 + 0.0605i | 0.1461 + 0.0605i | −0.0605 + 0.1461i | −0.0605 + 0.1461i | −0.1461 − 0.0605i |
| 0.1118 + 0.1118i | 0.1118 + 0.1118i | −0.1118 − 0.1118i | −0.1118 − 0.1118i | 0.1118 + 0.1118i |
| 0.0605 + 0.1461i | 0.0605 + 0.1461i | 0.1461 − 0.0605i | 0.1461 − 0.0605i | −0.0605 − 0.1461i |
| 0.1581 | −0.1581 | 0.1581 | −0.1581 | 0.1581 |
| 0.1461 + 0.0605i | −0.1461 − 0.0605i | −0.0605 + 0.1461i | 0.0605 − 0.1461i | −0.1461 − 0.0605i |
| 0.1118 + 0.1118i | −0.1118 − 0.1118i | −0.1118 − 0.1118i | 0.1118 + 0.1118i | 0.1118 + 0.1118i |
| 0.0605 + 0.1461i | −0.0605 − 0.1461i | 0.1461 − 0.0605i | −0.1461 + 0.0605i | −0.0605 − 0.1461i |
| ans(:, :, 4) = | | | | |
| 0.1581 | 0.1581 | 0.1581 | 0.1581 | 0.1581 |
| 0.0605 + 0.1461i | 0.0605 + 0.1461i | −0.1461 + 0.0605i | −0.1461 + 0.0605i | −0.0605 − 0.1461i |
| −0.1118 + 0.1118i | −0.1118 + 0.1118i | 0.1118 − 0.1118i | 0.1118 − 0.1118i | −0.1118 + 0.1118i |
| −0.1461 − 0.0605i | −0.1461 − 0.0605i | −0.0605 + 0.1461i | −0.0605 + 0.1461i | 0.1461 + 0.0605i |
| 0.1581 | −0.1581 | 0.1581 | −0.1581 | 0.1581 |
| 0.0605 + 0.1461i | −0.0605 − 0.1461i | −0.1461 + 0.0605i | 0.1461 − 0.0605i | −0.0605 − 0.1461i |
| −0.1118 + 0.1118i | 0.1118 − 0.1118i | 0.1118 − 0.1118i | −0.1118 + 0.1118i | −0.1118 + 0.1118i |
| −0.1461 − 0.0605i | 0.1461 + 0.0605i | −0.0605 + 0.1461i | 0.0605 − 0.1461i | 0.1461 + 0.0605i. |

15. The communication method of claim 14, wherein the determining comprises determining the precoding matrix by extracting the first codeword from the first codebook and extracting the second codeword from the second codebook.

16. The communication method of claim 14, wherein the precoding matrix candidates are stored in the transmitter.

17. The communication method of claim 16, wherein the determining comprises determining the precoding matrix with a candidate corresponding to the first precoding matrix indicator and the second precoding matrix indicator among the stored precoding matrix candidates.

18. A communication method of a transmitter, the communication method comprising:

receiving, from a receiver, a first precoding matrix indicator corresponding to a first codeword included in a first codebook and a second precoding matrix indicator corresponding to a second codeword included in a second codeword; and determining a precoding matrix based on the first precoding matrix indicator and the second precoding matrix indicator, wherein the precoding matrix corresponds to one of precoding matrix candidates disclosed in Table 4, wherein in Table 4, ans(;,;m,n) indicates an inter product between ans(;,;m) in the first codebook and (;,;,n) in the second codebook, ans(;,;,m) corresponds to an $m^{th}$ codeword in the first codebook, ans(;,;,n) corresponds to an $n^{th}$ codeword in the second codebook, and i denotes an imaginary unit:

TABLE 4

| | | | | | |
|---|---|---|---|---|---|
| ans(:, :, 1) = | | | | | |
| 0.1443 | 0.1443 | 0.1443 | 0.1443 | 0.1443 | 0.1443 |
| 0.1443 | 0.1443 | 0 + 0.1443i | 0 + 0.1443i | −0.1443 | −0.1443 |
| 0.1443 | 0.1443 | −0.1443 | −0.1443 | 0.1443 | 0.1443 |
| 0.1443 | 0.1443 | 0 − 0.1443i | 0 − 0.1443i | −0.1443 | −0.1443 |
| 0.1443 | −0.1443 | 0.1443 | −0.1443 | 0.1443 | −0.1443 |
| 0.1443 | −0.1443 | 0 + 0.1443i | 0 − 0.1443i | −0.1443 | 0.1443 |
| 0.1443 | −0.1443 | −0.1443 | 0.1443 | 0.1443 | −0.1443 |
| 0.1443 | −0.1443 | 0 − 0.1443i | 0 + 0.1443i | −0.1443 | 0.1443 |
| ans(:, :, 2) = | | | | | |
| 0.1443 | 0.1443 | 0.1443 | 0.1443 | 0.1443 | 0.1443 |
| 0.1021 + 0.1021i | 0.1021 + 0.1021i | −0.1021 + 0.1021i | −0.1021 + 0.1021i | −0.1021 − 0.1021i | −0.1021 − 0.1021i |
| 0.0000 + 0.1443i | 0.0000 + 0.1443i | −0.0000 − 0.1443i | −0.0000 − 0.1443i | 0.0000 + 0.1443i | 0.0000 + 0.1443i |
| −0.1021 + 0.1021i | −0.1021 + 0.1021i | 0.1021 + 0.1021i | 0.1021 + 0.1021i | 0.1021 − 0.1021i | 0.1021 − 0.1021i |
| 0.1443 | −0.1443 | 0.1443 | −0.1443 | 0.1443 | −0.1443 |
| 0.1021 + 0.1021i | −0.1021 − 0.1021i | −0.1021 + 0.1021i | 0.1021 − 0.1021i | −0.1021 − 0.1021i | 0.1021 + 0.1021i |
| 0.0000 + 0.1443i | −0.0000 − 0.1443i | −0.0000 − 0.1443i | 0.0000 + 0.1443i | 0.0000 + 0.1443i | −0.0000 − 0.1443i |
| −0.1021 + 0.1021i | 0.1021 − 0.1021i | 0.1021 + 0.1021i | −0.1021 − 0.1021i | 0.1021 − 0.1021i | −0.1021 + 0.1021i |
| ans(:, :, 3) = | | | | | |
| 0.1443 | 0.1443 | 0.1443 | 0.1443 | 0.1443 | 0.1443 |
| 0.1334 + 0.0552i | 0.1334 + 0.0552i | −0.0552 + 0.1334i | −0.0552 + 0.1334i | −0.1334 − 0.0552i | −0.1334 − 0.0552i |
| 0.1021 + 0.1021i | 0.1021 + 0.1021i | −0.1021 − 0.1021i | −0.1021 − 0.1021i | 0.1021 + 0.1021i | 0.1021 + 0.1021i |
| 0.0552 + 0.1334i | 0.0552 + 0.1334i | 0.1334 − 0.0552i | 0.1334 − 0.0552i | −0.0552 − 0.1334i | −0.0552 − 0.1334i |
| 0.1443 | −0.1443 | 0.1443 | −0.1443 | 0.1443 | −0.1443 |
| 0.1334 + 0.0552i | −0.1334 − 0.0552i | −0.0552 + 0.1334i | 0.0552 − 0.1334i | −0.1334 − 0.0552i | 0.1334 + 0.0552i |
| 0.1021 + 0.1021i | −0.1021 − 0.1021i | −0.1021 − 0.1021i | 0.1021 + 0.1021i | 0.1021 + 0.1021i | −0.1021 − 0.1021i |
| 0.0552 + 0.1334i | −0.0552 − 0.1334i | 0.1334 − 0.0552i | −0.1334 + 0.0552i | −0.0552 − 0.1334i | 0.0552 + 0.1334i |
| ans(:, :, 4) = | | | | | |
| 0.1443 | 0.1443 | 0.1443 | 0.1443 | 0.1443 | 0.1443 |
| 0.0552 + 0.1334i | 0.0552 + 0.1334i | −0.1334 + 0.0552i | −0.1334 + 0.0552i | −0.0552 − 0.1334i | −0.0552 − 0.1334i |
| −0.1021 + 0.1021i | −0.1021 + 0.1021i | 0.1021 − 0.1021i | 0.1021 − 0.1021i | −0.1021 + 0.1021i | −0.1021 + 0.1021i |

TABLE 4-continued

| | | | | | |
|---|---|---|---|---|---|
| −0.1334 − 0.0552i | −0.1334 − 0.0552i | −0.0552 + 0.1334i | −0.0552 + 0.1334i | 0.1334 + 0.0552i | 0.1334 + 0.0552i |
| 0.1443 | −0.1443 | 0.1443 | −0.1443 | 0.1443 | −0.1443 |
| 0.0552 + 0.1334i | −0.0552 − 0.1334i | −0.1334 + 0.0552i | 0.1334 − 0.0552i | −0.0552 − 0.1334i | 0.0552 + 0.1334i |
| −0.1021 + 0.1021i | 0.1021 − 0.1021i | 0.1021 − 0.1021i | −0.1021 + 0.1021i | −0.1021 + 0.1021i | 0.1021 − 0.1021i |
| −0.1334 − 0.0552i | 0.1334 + 0.0552i | −0.0552 + 0.1334i | 0.0552 − 0.1334i | 0.1334 + 0.0552i | −0.1334 − 0.0552i. |

19. The communication method of claim 18, wherein the determining comprises determining the precoding matrix by extracting the first codeword from the first codebook and extracting the second codeword from the second codebook.

20. The communication method of claim 18, wherein the precoding matrix candidates are stored in the transmitter.

21. The communication method of claim 20, wherein the determining comprises determining the precoding matrix with a candidate corresponding to the first precoding matrix indicator and the second precoding matrix indicator among the stored precoding matrix candidates.

22. A communication method of a transmitter, the communication method comprising:

receiving, from a receiver, a first precoding matrix indicator corresponding to a first codeword included in a first codebook and a second precoding matrix indicator corresponding to a second codeword included in a second codeword; and determining a precoding matrix based on the first precoding matrix indicator and the second precoding matrix indicator, wherein the precoding matrix corresponds to one of precoding matrix candidates disclosed in Table 5, wherein in Table 5, ans(;,;,n) corresponds to an $n^{th}$ codeword in the first codebook, and i denotes an imaginary unit:

TABLE 5

| | | | | | | |
|---|---|---|---|---|---|---|
| | | | ans(:, :, 1) – | | | |
| 0.1336 | 0.1336 | 0.1336 | 0.1336 | 0.1336 | 0.1336 | 0.1336 |
| 0.1336 | 0.1336 | 0 + 0.1336i | 0 + 0.1336i | −0.1336 | −0.1336 | 0 − 0.1336i |
| 0.1336 | 0.1336 | −0.1336 | −0.1336 | 0.1336 | 0.1336 | −0.1336 |
| 0.1336 | 0.1336 | 0 − 0.1336i | 0 − 0.1336i | −0.1336 | −0.1336 | 0 + 0.1336i |
| 0.1336 | −0.1336 | 0.1336 | −0.1336 | 0.1336 | −0.1336 | 0.1336 |
| 0.1336 | −0.1336 | 0 + 0.1336i | 0 − 0.1336i | −0.1336 | 0.1336 | 0 − 0.1336i |
| 0.1336 | −0.1336 | −0.1336 | 0.1336 | 0.1336 | −0.1336 | −0.1336 |
| 0.1336 | −0.1336 | 0 − 0.1336i | 0 + 0.1336i | −0.1336 | 0.1336 | 0 + 0.1336i |
| | | | ans(:, :, 2) = | | | |
| 0.1336 | 0.1336 | 0.1336 | 0.1336 | 0.1336 | 0.1336 | 0.1336 |
| 0.0945 + 0.0945i | 0.0945 + 0.0945i | −0.0945 + 0.0945i | −0.0945 + 0.0945i | −0.0945 − 0.0945i | −0.0945 − 0.0945i | 0.0945 − 0.0945i |
| 0.0000 + 0.1336i | 0.0000 + 0.1336i | −0.0000 − 0.1336i | −0.0000 − 0.1336i | 0.0000 + 0.1336i | 0.0000 + 0.1336i | −0.0000 − 0.1336i |
| −0.0945 + 0.0945i | −0.0945 + 0.0945i | 0.0945 + 0.0945i | 0.0945 + 0.0945i | 0.0945 − 0.0945i | 0.0945 − 0.0945i | −0.0945 − 0.0945i |
| 0.1336 | −0.1336 | 0.1336 | −0.1336 | 0.1336 | −0.1336 | 0.1336 |
| 0.0945 + 0.0945i | −0.0945 − 0.0945i | −0.0945 + 0.0945i | 0.0945 − 0.0945i | −0.0945 − 0.0945i | 0.0945 + 0.0945i | 0.0945 − 0.0945i |
| 0.0000 + 0.1336i | −0.0000 − 0.1336i | −0.0000 − 0.1336i | 0.0000 + 0.1336i | 0.0000 + 0.1336i | −0.0000 − 0.1336i | −0.0000 − 0.1336i |
| −0.0945 + 0.0945i | 0.0945 − 0.0945i | 0.0945 + 0.0945i | −0.0945 − 0.0945i | 0.0945 0.0945i | −0.0945 + 0.0945i | −0.0945 − 0.0945i |
| | | | ans(:, :, 3) = | | | |
| 0.1336 | 0.1336 | 0.1336 | 0.1336 | 0.1336 | 0.1336 | 0.1336 |
| 0.1235 + 0.0511i | 0.1235 + 0.0511i | −0.0511 + 0.1235i | −0.0511 + 0.1235i | −0.1235 − 0.0511i | −0.1235 − 0.0511i | 0.0511 − 0.1235i |
| 0.0945 + 0.0945i | 0.0945 + 0.0945i | −0.0945 − 0.0945i | −0.0945 − 0.0945i | 0.0945 + 0.0945i | 0.0945 + 0.0945i | −0.0945 − 0.0945i |
| 0.0511 + 0.1235i | 0.0511 + 0.1235i | 0.1235 − 0.0511i | 0.1235 − 0.0511i | −0.0511 − 0.1235i | −0.0511 − 0.1235i | −0.1235 + 0.0511i |
| 0.1336 | −0.1336 | 0.1336 | −0.1336 | 0.1336 | −0.1336 | 0.1336 |
| 0.1235 + 0.0511i | −0.1235 − 0.0511i | −0.0511 + 0.1235i | 0.0511 − 0.1235i | −0.1235 − 0.0511i | 0.1235 + 0.0511i | 0.0511 − 0.1235i |
| 0.0945 + 0.0945i | −0.0945 − 0.0945i | −0.0945 − 0.0945i | 0.0945 + 0.0945i | 0.0945 + 0.0945i | −0.0945 − 0.0945i | −0.0945 − 0.0945i |
| 0.0511 + 0.1235i | −0.0511 − 0.1235i | 0.1235 − 0.0511i | −0.1235 + 0.0511i | −0.0511 − 0.1235i | 0.0511 + 0.1235i | −0.1235 + 0.0511i |
| | | | ans(:, :, 4) = | | | |
| 0.1336 | 0.1336 | 0.1336 | 0.1336 | 0.1336 | 0.1336 | 0.1336 |
| 0.0511 + 0.1235i | 0.0511 + 0.1235i | −0.1235 + 0.0511i | −0.1235 + 0.0511i | −0.0511 − 0.1235i | −0.0511 − 0.1235i | 0.1235 − 0.0511i |
| −0.0945 + 0.0945i | −0.0945 + 0.0945i | 0.0945 − 0.0945i | 0.0945 − 0.0945i | −0.0945 + 0.0945i | −0.0945 + 0.0945i | 0.0945 − 0.0945i |
| −0.1235 − 0.0511i | −0.1235 − 0.0511i | −0.0511 + 0.1235i | −0.0511 + 0.1235i | 0.1235 + 0.0511i | 0.1235 + 0.0511i | 0.0511 − 0.1235i |
| 0.1336 | −0.1336 | 0.1336 | −0.1336 | 0.1336 | −0.1336 | 0.1336 |
| 0.0511 + 0.1235i | −0.0511 − 0.1235i | −0.1235 + 0.0511i | 0.1235 − 0.0511i | −0.0511 − 0.1235i | 0.0511 + 0.1235i | 0.1235 − 0.0511i |
| −0.0945 + 0.0945i | 0.0945 − 0.0945i | 0.0945 − 0.0945i | −0.0945 + 0.0945i | −0.0945 + 0.0945i | 0.0945 − 0.0945i | 0.0945 − 0.0945i |
| −0.1235 − 0.0511i | 0.1235 + 0.0511i | −0.0511 + 0.1235i | 0.0511 − 0.1235i | 0.1235 + 0.0511i | −0.1235 − 0.0511i | 0.0511 − 0.1235i. |

23. The communication method of claim 22, wherein the determining comprises determining the precoding matrix by extracting the first codeword from the first codebook and extracting the second codeword from the second codebook.

24. The communication method of claim 22, wherein the precoding matrix candidates are stored in the transmitter.

25. The communication method of claim 24, wherein the determining comprises determining the precoding matrix with a candidate corresponding to the first precoding matrix indicator and the second precoding matrix indicator among the stored precoding matrix candidates.

* * * * *